US009698607B2

(12) United States Patent
Kesler et al.

(10) Patent No.: US 9,698,607 B2
(45) Date of Patent: Jul. 4, 2017

(54) SECURE WIRELESS ENERGY TRANSFER

(71) Applicant: WiTricity Corporation, Watertown, MA (US)

(72) Inventors: Morris P. Kesler, Bedford, MA (US); Andre B. Kurs, Chestnut Hill, MA (US); Aristeidis Karalis, Boston, MA (US); Marin Soljacic, Belmont, MA (US); Katherine L. Hall, Arlington, MA (US); Andrew J. Campanella, Somerville, MA (US); Konrad J. Kulikowski, Pine, CO (US)

(73) Assignee: WiTricity Corporation, Watertown, MA (US)

( * ) Notice: Subject to any disclaimer, the term of this patent is extended or adjusted under 35 U.S.C. 154(b) by 246 days.

(21) Appl. No.: 14/546,055

(22) Filed: Nov. 18, 2014

(65) Prior Publication Data
US 2015/0069831 A1 Mar. 12, 2015

Related U.S. Application Data

(63) Continuation of application No. 13/288,589, filed on Nov. 3, 2011, now Pat. No. 8,912,687, which is a
(Continued)

(51) Int. Cl.
*H01F 37/00* (2006.01)
*H01F 38/00* (2006.01)
(Continued)

(52) U.S. Cl.
CPC ............ *H02J 5/005* (2013.01); *B60L 11/182* (2013.01); *B60R 16/03* (2013.01); *H02J 17/00* (2013.01);
(Continued)

(58) Field of Classification Search
CPC ... H02J 5/005; H02J 17/00; H02J 7/35; B60L 11/182; B60L 2200/26; B60R 16/03;
(Continued)

(56) References Cited

U.S. PATENT DOCUMENTS

| 645,576 A | 3/1900 | Telsa |
|---|---|---|
| 649,621 A | 5/1900 | Tesla |

(Continued)

FOREIGN PATENT DOCUMENTS

| CA | 142352 | 8/1912 |
|---|---|---|
| CN | 102239633 | 11/2011 |

(Continued)

OTHER PUBLICATIONS

"Intel CTO Says Gap between Humans, Machines Will Close by 2050", *Intel News Release*, (See intel.com/.../20080821comp. htm?iid=S . . .) (Printed Nov. 6, 2009).
(Continued)

*Primary Examiner* — Hal Kaplan
(74) *Attorney, Agent, or Firm* — Fish & Richardson P.C.

(57) ABSTRACT

A wireless receiver for use with a first electromagnetic resonator coupled to a power supply, the first electromagnetic resonator having a mode with a resonant frequency $\omega_1$, an intrinsic loss rate $\Gamma_1$, and a first Q-factor $Q_1=\omega_1/2\Gamma_1$, and the wireless receiver includes a load configured to power a system using electrical power, a second electromagnetic resonator configured to be coupled to the load and having a mode with a resonant frequency $\omega_2$, an intrinsic loss rate $\Gamma_2$, and a second Q-factor $Q_2=\omega_2/2\Gamma_2$, wherein the second electromagnetic resonator is configured to be wirelessly coupled to the first electromagnetic resonator to provide resonant, non-radiative wireless power to the second electromagnetic resonator from the first electromagnetic resonator; and a communication facility to confirm compatibility
(Continued)

of the first and second resonators and provide authorization for initiation of transfer of power.

22 Claims, 168 Drawing Sheets

Related U.S. Application Data continuation-in-part of application No. 13/232,868, filed on Sep. 14, 2011, and a continuation-in-part of application No. 12/899,281, filed on Oct. 6, 2010, now abandoned, which is a continuation-in-part of application No. 12/770,137, filed on Apr. 29, 2010, and a continuation-in-part of application No. 12/721,118, filed on Mar. 10, 2010, now Pat. No. 8,723,366, and a continuation-in-part of application No. 12/613,686, filed on Nov. 6, 2009, now Pat. No. 8,035,255, which is a continuation of application No. 12/567,716, filed on Sep. 25, 2009, now Pat. No. 8,461,719, said application No. 13/232,868 is a continuation-in-part of application No. 13/222,915, filed on Aug. 31, 2011, which is a continuation-in-part of application No. 13/154,131, filed on Jun. 6, 2011, which is a continuation-in-part of application No. 13/090,369, filed on Apr. 20, 2011, now Pat. No. 8,937,408, which is a continuation-in-part of application No. 13/021,965, filed on Feb. 7, 2011, now Pat. No. 8,947,186, which is a continuation-in-part of application No. 12/986,018, filed on Jan. 6, 2011, now Pat. No. 8,643,326, said application No. 13/154,131 is a continuation-in-part of application No. 12/986,018, filed on Jan. 6, 2011, now Pat. No. 8,643,326, which is a continuation-in-part of application No. 12/789,611, filed on May 28, 2010, now Pat. No. 8,598,743, which is a continuation-in-part of application No. 12/770,137, filed on Apr. 29, 2010, which is a continuation-in-part of application No. 12/767,633, filed on Apr. 26, 2010, now Pat. No. 8,497,601, which is a continuation-in-part of application No. 12/759,047, filed on Apr. 13, 2010, which is a continuation-in-part of application No. 12/757,716, filed on Apr. 9, 2010, which is a continuation-in-part of application No. 12/749,571, filed on Mar. 30, 2010, now Pat. No. 8,692,412, which is a continuation-in-part of application No. 12/639,489, filed on Dec. 16, 2009, now Pat. No. 8,410,636, and a continuation-in-part of application No. 12/647,705, filed on Dec. 28, 2009, now Pat. No. 8,482,158, and a continuation-in-part of application No. 12/567,716, filed on Sep. 25, 2009, now Pat. No. 8,461,719, said application No. 12/770,137 is a continuation-in-part of application No. 12/721,118, filed on Mar. 10, 2010, now Pat. No. 8,723,366, which is a continuation-in-part of application No. 12/705,582, filed on Feb. 13, 2010, said application No. 13/288,589 is a continuation-in-part of application No. 12/860,375, filed on Aug. 20, 2010, now Pat. No. 8,772,973, which is a continuation-in-part of application No. 12/759,047, filed on Apr. 13, 2010, said application No. 13/288,589 is a continuation-in-part of application No. 12/722,050, filed on Mar. 11, 2010, now Pat. No. 8,106,539, and a continuation-in-part of application No. 12/612,880, filed on Nov. 5, 2009, now Pat. No. 8,400,017, said application No. 12/722,050 is a continuation-in-part of application No. 12/698,523, filed on Feb. 2, 2010, now Pat. No. 8,552,592, which is a continuation-in-part of application No. 12/567,716, filed on Sep. 25, 2009, now Pat. No. 8,461,719, said application No. 12/612,880 is a continuation-in-part of application No. 12/567,716, filed on Sep. 25, 2009, now Pat. No. 8,461,719.

(60) Provisional application No. 61/382,806, filed on Sep. 14, 2010, provisional application No. 61/378,600, filed on Aug. 31, 2010, provisional application No. 61/411,490, filed on Nov. 9, 2010, provisional application No. 61/351,492, filed on Jun. 4, 2010, provisional application No. 61/326,051, filed on Apr. 20, 2010, provisional application No. 61/292,768, filed on Jan. 6, 2010, provisional application No. 61/173,747, filed on Apr. 29, 2009, provisional application No. 61/172,633, filed on Apr. 24, 2009, provisional application No. 61/100,721, filed on Sep. 27, 2008, provisional application No. 61/108,743, filed on Oct. 27, 2008, provisional application No. 61/147,386, filed on Jan. 26, 2009, provisional application No. 61/152,086, filed on Feb. 12, 2009, provisional application No. 61/178,508, filed on May 15, 2009, provisional application No. 61/182,768, filed on Jun. 1, 2009, provisional application No. 61/121,159, filed on Dec. 9, 2008, provisional application No. 61/142,977, filed on Jan. 7, 2009, provisional application No. 61/142,885, filed on Jan. 6, 2009, provisional application No. 61/142,796, filed on Jan. 6, 2009, provisional application No. 61/142,889, filed on Jan. 6, 2009, provisional application No. 61/142,880, filed on Jan. 6, 2009, provisional application No. 61/142,818, filed on Jan. 6, 2009, provisional application No. 61/142,887, filed on Jan. 6, 2009, provisional application No. 61/156,764, filed on Mar. 2, 2009, provisional application No. 61/143,058, filed on Jan. 7, 2009, provisional application No. 61/163,695, filed on Mar. 26, 2009, provisional application No. 61/169,240, filed on Apr. 14, 2009, provisional application No. 61/152,390, filed on Feb. 13, 2009, provisional application No. 61/523,998, filed on Aug. 16, 2011, provisional application No. 61/254,559, filed on Oct. 23, 2009.

(51) Int. Cl.
*H02J 17/00* (2006.01)
*H02J 5/00* (2016.01)
*B60L 11/18* (2006.01)
*H03H 7/40* (2006.01)
*B60R 16/03* (2006.01)
*H02J 7/35* (2006.01)

(52) U.S. Cl.
CPC ............ *H03H 7/40* (2013.01); *B60L 2200/26* (2013.01); *H02J 7/35* (2013.01); *Y02T 10/7005* (2013.01); *Y02T 10/7055* (2013.01); *Y02T 10/7072* (2013.01); *Y02T 10/7094* (2013.01); *Y02T 90/122* (2013.01); *Y02T 90/14* (2013.01); *Y02T 90/16* (2013.01)

(58) Field of Classification Search
CPC ... H03H 7/40; Y02T 10/7005; Y02T 10/7055; Y02T 10/7072; Y02T 10/7094; Y02T 90/122; Y02T 90/14; Y02T 90/16
USPC .......................................... 307/104; 320/108
See application file for complete search history.

(56) References Cited

U.S. PATENT DOCUMENTS

| | | |
|---|---|---|
| 787,412 A | 4/1905 | Tesla |
| 1,119,732 A | 12/1914 | Tesla |
| 2,133,494 A | 10/1938 | Waters |
| 3,517,350 A | 6/1970 | Beaver |
| 3,535,543 A | 10/1970 | Dailey |
| 3,780,425 A | 12/1973 | Penn et al. |
| 3,871,176 A | 3/1975 | Schukei |
| 4,088,999 A | 5/1978 | Fletcher et al. |
| 4,095,998 A | 6/1978 | Hanson |
| 4,180,795 A | 12/1979 | Matsuda et al. |
| 4,280,129 A | 7/1981 | Wells |
| 4,450,431 A | 5/1984 | Hochstein |
| 4,588,978 A | 5/1986 | Allen |
| 5,027,709 A | 7/1991 | Slagle |
| 5,033,295 A | 7/1991 | Schmid et al. |
| 5,034,658 A | 7/1991 | Hierig et al. |
| 5,053,774 A | 10/1991 | Schuermann et al. |
| 5,070,293 A | 12/1991 | Ishii et al. |
| 5,118,997 A | 6/1992 | El-Hamamsy |
| 5,216,402 A | 6/1993 | Carosa |
| 5,229,652 A | 7/1993 | Hough |
| 5,287,112 A | 2/1994 | Schuermann |
| 5,341,083 A | 8/1994 | Klontz et al. |
| 5,367,242 A | 11/1994 | Hulman |
| 5,374,930 A | 12/1994 | Schuermann |
| 5,408,209 A | 4/1995 | Tanzer et al. |
| 5,437,057 A | 7/1995 | Richley et al. |
| 5,455,467 A | 10/1995 | Young et al. |
| 5,493,691 A | 2/1996 | Barrett |
| 5,522,856 A | 6/1996 | Reineman |
| 5,528,113 A | 6/1996 | Boys et al. |
| 5,541,604 A | 7/1996 | Meier |
| 5,550,452 A | 8/1996 | Shirai et al. |
| 5,565,763 A | 10/1996 | Arrendale et al. |
| 5,630,835 A | 5/1997 | Brownlee |
| 5,697,956 A | 12/1997 | Bornzin |
| 5,703,461 A | 12/1997 | Minoshima et al. |
| 5,703,573 A | 12/1997 | Fujimoto et al. |
| 5,710,413 A | 1/1998 | King et al. |
| 5,742,471 A | 4/1998 | Barbee, Jr. et al. |
| 5,821,728 A | 10/1998 | Sshwind |
| 5,821,731 A | 10/1998 | Kuki et al. |
| 5,864,323 A | 1/1999 | Berthon |
| 5,898,579 A | 4/1999 | Boys et al. |
| 5,903,134 A | 5/1999 | Takeuchi |
| 5,923,544 A | 7/1999 | Urano |
| 5,940,509 A | 8/1999 | Jovanovich et al. |
| 5,957,956 A | 9/1999 | Kroll et al. |
| 5,959,245 A | 9/1999 | Moe et al. |
| 5,986,895 A | 11/1999 | Stewart et al. |
| 5,993,996 A | 11/1999 | Firsich |
| 5,999,308 A | 12/1999 | Nelson et al. |
| 6,012,659 A | 1/2000 | Nakazawa et al. |
| 6,047,214 A | 4/2000 | Mueller et al. |
| 6,066,163 A | 5/2000 | John |
| 6,067,473 A | 5/2000 | Greeninger et al. |
| 6,108,579 A | 8/2000 | Snell et al. |
| 6,127,799 A | 10/2000 | Krishnan |
| 6,176,433 B1 | 1/2001 | Uesaka et al. |
| 6,184,651 B1 | 2/2001 | Fernandez et al. |
| 6,207,887 B1 | 3/2001 | Bass et al. |
| 6,232,841 B1 | 5/2001 | Bartlett et al. |
| 6,238,387 B1 | 5/2001 | Miller, III |
| 6,252,762 B1 | 6/2001 | Amatucci |
| 6,436,299 B1 | 8/2002 | Baarman et al. |
| 6,450,946 B1 | 9/2002 | Forsell |
| 6,452,465 B1 | 9/2002 | Brown et al. |
| 6,459,218 B2 | 10/2002 | Boys et al. |
| 6,473,028 B1 | 10/2002 | Luc |
| 6,483,202 B1 | 11/2002 | Boys |
| 6,515,878 B1 | 2/2003 | Meins et al. |
| 6,535,133 B2 | 3/2003 | Gohara |
| 6,561,975 B1 | 5/2003 | Pool et al. |
| 6,563,425 B2 | 5/2003 | Nicholson et al. |
| 6,597,076 B2 | 7/2003 | Scheible et al. |
| 6,609,023 B1 | 8/2003 | Fischell et al. |
| 6,631,072 B1 | 10/2003 | Paul et al. |
| 6,650,227 B1 | 11/2003 | Bradin |
| 6,664,770 B1 | 12/2003 | Bartels |
| 6,673,250 B2 | 1/2004 | Kuennen et al. |
| 6,683,256 B2 | 1/2004 | Kao |
| 6,696,647 B2 | 2/2004 | Ono et al. |
| 6,703,921 B1 | 3/2004 | Wuidart et al. |
| 6,731,071 B2 | 5/2004 | Baarman |
| 6,747,573 B1 | 6/2004 | Gerlach et al. |
| 6,749,119 B2 | 6/2004 | Scheible et al. |
| 6,772,011 B2 | 8/2004 | Dolgin |
| 6,798,716 B1 | 9/2004 | Charych |
| 6,803,744 B1 | 10/2004 | Sabo |
| 6,806,649 B2 | 10/2004 | Mollema et al. |
| 6,812,645 B2 | 11/2004 | Baarman |
| 6,825,620 B2 | 11/2004 | Kuennen et al. |
| 6,831,417 B2 | 12/2004 | Baarman |
| 6,839,035 B1 | 1/2005 | Addonisio et al. |
| 6,844,702 B2 | 1/2005 | Giannopoulos et al. |
| 6,856,291 B2 | 2/2005 | Mickle et al. |
| 6,858,970 B2 | 2/2005 | Malkin et al. |
| 6,906,495 B2 | 6/2005 | Cheng et al. |
| 6,917,163 B2 | 7/2005 | Baarman |
| 6,917,431 B2 | 7/2005 | Soljacic et al. |
| 6,937,130 B2 | 8/2005 | Scheible et al. |
| 6,960,968 B2 | 11/2005 | Odendaal et al. |
| 6,961,619 B2 | 11/2005 | Casey |
| 6,963,579 B2 | 11/2005 | Suri |
| 6,967,462 B1 | 11/2005 | Landis |
| 6,975,198 B2 | 12/2005 | Baarman et al. |
| 6,988,026 B2 | 1/2006 | Breed et al. |
| 7,027,311 B2 | 4/2006 | Vanderelli et al. |
| 7,035,076 B1 | 4/2006 | Stevenson |
| 7,042,196 B2 | 5/2006 | Ka-Lai et al. |
| 7,069,064 B2 | 6/2006 | Gevorgian et al. |
| 7,084,605 B2 | 8/2006 | Mickle et al. |
| 7,116,200 B2 | 10/2006 | Baarman et al. |
| 7,118,240 B2 | 10/2006 | Baarman et al. |
| 7,126,450 B2 | 10/2006 | Baarman et al. |
| 7,127,293 B2 | 10/2006 | MacDonald |
| 7,132,918 B2 | 11/2006 | Baarman et al. |
| 7,147,604 B1 | 12/2006 | Allen et al. |
| 7,180,248 B2 | 2/2007 | Kuennen et al. |
| 7,191,007 B2 | 3/2007 | Desai et al. |
| 7,193,418 B2 | 3/2007 | Freytag |
| D541,322 S | 4/2007 | Garrett et al. |
| 7,212,414 B2 | 5/2007 | Baarman |
| 7,233,137 B2 | 6/2007 | Nakamura et al. |
| D545,855 S | 7/2007 | Garrett et al. |
| 7,239,110 B2 | 7/2007 | Cheng et al. |
| 7,248,017 B2 | 7/2007 | Cheng et al. |
| 7,251,527 B2 | 7/2007 | Lyden |
| 7,288,918 B2 | 10/2007 | DiStefano |
| 7,340,304 B2 | 3/2008 | MacDonald |
| 7,375,492 B2 | 5/2008 | Calhoon et al. |
| 7,375,493 B2 | 5/2008 | Calhoon et al. |
| 7,378,817 B2 | 5/2008 | Calhoon et al. |
| 7,382,636 B2 | 6/2008 | Baarman et al. |
| 7,385,357 B2 | 6/2008 | Kuennen et al. |
| 7,443,135 B2 | 10/2008 | Cho |
| 7,462,951 B1 | 12/2008 | Baarman |
| 7,466,213 B2 | 12/2008 | Lobl et al. |
| 7,471,062 B2 | 12/2008 | Bruning |
| 7,474,058 B2 | 1/2009 | Baarman |
| 7,492,247 B2 | 2/2009 | Schmidt et al. |
| 7,514,818 B2 | 4/2009 | Abe et al. |
| 7,518,267 B2 | 4/2009 | Baarman |
| 7,521,890 B2 | 4/2009 | Lee et al. |
| 7,525,283 B2 | 4/2009 | Cheng et al. |
| 7,545,337 B2 | 6/2009 | Guenther |
| 7,554,316 B2 | 6/2009 | Stevens et al. |
| 7,599,743 B2 | 10/2009 | Hassler, Jr. et al. |
| 7,615,936 B2 | 11/2009 | Baarman et al. |
| 7,639,514 B2 | 12/2009 | Baarman |
| 7,741,734 B2 | 6/2010 | Joannopoulos et al. |
| 7,795,708 B2 | 9/2010 | Katti |
| 7,825,543 B2 | 11/2010 | Karalis et al. |
| 7,825,544 B2 | 11/2010 | Jansen et al. |

(56) References Cited

U.S. PATENT DOCUMENTS

| | | |
|---|---|---|
| 7,835,417 B2 | 11/2010 | Heideman et al. |
| 7,843,288 B2 | 11/2010 | Lee et al. |
| 7,844,306 B2 | 11/2010 | Shearer et al. |
| 7,863,859 B2 | 1/2011 | Soar |
| 7,880,337 B2 | 2/2011 | Farkas |
| 7,884,697 B2 | 2/2011 | Wei et al. |
| 7,885,050 B2 | 2/2011 | Lee |
| 7,919,886 B2 | 4/2011 | Tanaka |
| 7,923,870 B2 | 4/2011 | Jin |
| 7,932,798 B2 | 4/2011 | Tolle et al. |
| 7,948,209 B2 | 5/2011 | Jung |
| 7,952,322 B2 | 5/2011 | Partovi et al. |
| 7,963,941 B2 | 6/2011 | Wilk |
| 7,969,045 B2 | 6/2011 | Schmidt et al. |
| 7,994,880 B2 | 8/2011 | Chen et al. |
| 7,999,506 B1 | 8/2011 | Hollar et al. |
| 8,022,576 B2 | 9/2011 | Joannopoulos et al. |
| 8,035,255 B2 | 10/2011 | Kurs et al. |
| 8,076,800 B2 | 12/2011 | Joannopoulos et al. |
| 8,076,801 B2 | 12/2011 | Karalis et al. |
| 8,084,889 B2 | 12/2011 | Joannopoulos et al. |
| 8,097,983 B2 | 1/2012 | Karalis et al. |
| 8,106,539 B2 | 1/2012 | Schatz et al. |
| 8,115,448 B2 | 2/2012 | John |
| 8,131,378 B2 | 3/2012 | Greenberg et al. |
| 8,178,995 B2 | 5/2012 | Amano et al. |
| 8,193,769 B2 | 6/2012 | Azancot et al. |
| 8,212,414 B2 | 7/2012 | Howard et al. |
| 8,260,200 B2 | 9/2012 | Shimizu et al. |
| 8,304,935 B2 | 11/2012 | Karalis et al. |
| 8,324,759 B2 | 12/2012 | Karalis et al. |
| 8,334,620 B2 | 12/2012 | Park et al. |
| 8,362,651 B2 | 1/2013 | Hamam et al. |
| 8,395,282 B2 | 3/2013 | Joannopoulos et al. |
| 8,395,283 B2 | 3/2013 | Joannopoulos et al. |
| 8,400,017 B2 | 3/2013 | Kurs et al. |
| 8,400,018 B2 | 3/2013 | Joannopoulos et al. |
| 8,400,019 B2 | 3/2013 | Joannopoulos et al. |
| 8,400,020 B2 | 3/2013 | Joannopoulos et al. |
| 8,400,021 B2 | 3/2013 | Joannopoulos et al. |
| 8,400,022 B2 | 3/2013 | Joannopoulos et al. |
| 8,400,023 B2 | 3/2013 | Joannopoulos et al. |
| 8,400,024 B2 | 3/2013 | Joannopoulos et al. |
| 8,410,636 B2 | 4/2013 | Kurs et al. |
| 8,441,154 B2 | 5/2013 | Karalis et al. |
| 8,457,547 B2 | 6/2013 | Meskens |
| 8,461,719 B2 | 6/2013 | Kesler et al. |
| 8,461,720 B2 | 6/2013 | Kurs et al. |
| 8,461,721 B2 | 6/2013 | Karalis et al. |
| 8,461,722 B2 | 6/2013 | Kurs et al. |
| 8,461,817 B2 | 6/2013 | Martin et al. |
| 8,466,583 B2 | 6/2013 | Karalis et al. |
| 8,471,410 B2 | 6/2013 | Karalis et al. |
| 8,476,788 B2 | 7/2013 | Karalis et al. |
| 8,482,157 B2 | 7/2013 | Cook et al. |
| 8,482,158 B2 | 7/2013 | Kurs et al. |
| 8,487,480 B1 | 7/2013 | Kesler et al. |
| 8,497,601 B2 | 7/2013 | Hall et al. |
| 8,552,592 B2 | 10/2013 | Schatz et al. |
| 8,569,914 B2 | 10/2013 | Karalis et al. |
| 8,587,153 B2 | 11/2013 | Schatz et al. |
| 8,587,155 B2 | 11/2013 | Giler et al. |
| 8,598,743 B2 | 12/2013 | Hall et al. |
| 8,618,696 B2 | 12/2013 | Karalis et al. |
| 8,629,578 B2 | 1/2014 | Kurs et al. |
| 8,643,326 B2 | 2/2014 | Campanella et al. |
| 8,912,687 B2 * | 12/2014 | Kesler ............... B60L 11/182 307/10.1 |
| 9,106,203 B2 | 8/2015 | Kesler et al. |
| 9,237,211 B2 | 1/2016 | Tabe |
| 2002/0032471 A1 | 3/2002 | Loftin et al. |
| 2002/0105343 A1 | 8/2002 | Scheible et al. |
| 2002/0118004 A1 | 8/2002 | Scheible et al. |
| 2002/0130642 A1 | 9/2002 | Ettes et al. |
| 2002/0167294 A1 | 11/2002 | Odaohhara |
| 2003/0038641 A1 | 2/2003 | Scheible |
| 2003/0062794 A1 | 4/2003 | Scheible et al. |
| 2003/0062980 A1 | 4/2003 | Scheible et al. |
| 2003/0071034 A1 | 4/2003 | Thompson et al. |
| 2003/0124050 A1 | 7/2003 | Yadav et al. |
| 2003/0126948 A1 | 7/2003 | Yadav et al. |
| 2003/0160590 A1 | 8/2003 | Schaefer et al. |
| 2003/0199778 A1 | 10/2003 | Mickle et al. |
| 2003/0214255 A1 | 11/2003 | Baarman et al. |
| 2004/0000974 A1 | 1/2004 | Odenaal et al. |
| 2004/0026998 A1 | 2/2004 | Henriott et al. |
| 2004/0039423 A1 | 2/2004 | Dolgin |
| 2004/0100338 A1 | 5/2004 | Clark |
| 2004/0113847 A1 | 6/2004 | Qi et al. |
| 2004/0130425 A1 | 7/2004 | Dayan et al. |
| 2004/0130915 A1 | 7/2004 | Baarman |
| 2004/0130916 A1 | 7/2004 | Baarman |
| 2004/0142733 A1 | 7/2004 | Parise |
| 2004/0150934 A1 | 8/2004 | Baarman |
| 2004/0189246 A1 | 9/2004 | Bulai et al. |
| 2004/0201361 A1 | 10/2004 | Koh et al. |
| 2004/0222751 A1 | 11/2004 | Mollema et al. |
| 2004/0227057 A1 | 11/2004 | Tuominen et al. |
| 2004/0228631 A1 | 11/2004 | Mantin et al. |
| 2004/0232845 A1 | 11/2004 | Baarman et al. |
| 2004/0233043 A1 | 11/2004 | Yazawa et al. |
| 2004/0267501 A1 | 12/2004 | Freed et al. |
| 2005/0007067 A1 | 1/2005 | Baarman et al. |
| 2005/0021134 A1 | 1/2005 | Opie |
| 2005/0027192 A1 | 2/2005 | Govari et al. |
| 2005/0033382 A1 | 2/2005 | Single |
| 2005/0085873 A1 | 4/2005 | Gord et al. |
| 2005/0093475 A1 | 5/2005 | Kuennen et al. |
| 2005/0104064 A1 | 5/2005 | Hegarty et al. |
| 2005/0104453 A1 | 5/2005 | Vanderelli et al. |
| 2005/0116650 A1 | 6/2005 | Baarman |
| 2005/0116683 A1 | 6/2005 | Cheng et al. |
| 2005/0122058 A1 | 6/2005 | Baarman et al. |
| 2005/0122059 A1 | 6/2005 | Baarman et al. |
| 2005/0125093 A1 | 6/2005 | Kikuchi et al. |
| 2005/0127849 A1 | 6/2005 | Baarman et al. |
| 2005/0127850 A1 | 6/2005 | Baarman et al. |
| 2005/0127866 A1 | 6/2005 | Hamilton et al. |
| 2005/0135122 A1 | 6/2005 | Cheng et al. |
| 2005/0140482 A1 | 6/2005 | Cheng et al. |
| 2005/0151511 A1 | 7/2005 | Chary |
| 2005/0156560 A1 | 7/2005 | Shimaoka et al. |
| 2005/0189945 A1 | 9/2005 | Reiderman |
| 2005/0194926 A1 | 9/2005 | DiStefano |
| 2005/0253152 A1 | 11/2005 | Klimov et al. |
| 2005/0288739 A1 | 12/2005 | Hassler, Jr. et al. |
| 2005/0288740 A1 | 12/2005 | Hassler, Jr. et al. |
| 2005/0288741 A1 | 12/2005 | Hassler, Jr. et al. |
| 2005/0288742 A1 | 12/2005 | Giordano et al. |
| 2006/0001509 A1 | 1/2006 | Gibbs |
| 2006/0010902 A1 | 1/2006 | Trinh et al. |
| 2006/0022636 A1 | 2/2006 | Xian et al. |
| 2006/0053296 A1 | 3/2006 | Busboom et al. |
| 2006/0061323 A1 | 3/2006 | Cheng et al. |
| 2006/0066443 A1 | 3/2006 | Hall |
| 2006/0090956 A1 | 5/2006 | Peshkovskiy et al. |
| 2006/0132045 A1 | 6/2006 | Baarman |
| 2006/0164866 A1 | 7/2006 | Vanderelli et al. |
| 2006/0181242 A1 | 8/2006 | Freed et al. |
| 2006/0184209 A1 | 8/2006 | John et al. |
| 2006/0184210 A1 | 8/2006 | Singhal et al. |
| 2006/0185809 A1 | 8/2006 | Elfrink et al. |
| 2006/0199620 A1 | 9/2006 | Greene et al. |
| 2006/0202665 A1 | 9/2006 | Hsu |
| 2006/0205381 A1 | 9/2006 | Beart et al. |
| 2006/0214626 A1 | 9/2006 | Nilson et al. |
| 2006/0219448 A1 | 10/2006 | Grieve et al. |
| 2006/0238365 A1 | 10/2006 | Vecchione et al. |
| 2006/0270440 A1 | 11/2006 | Shearer et al. |
| 2006/0281435 A1 | 12/2006 | Shearer et al. |
| 2007/0010295 A1 | 1/2007 | Greene et al. |
| 2007/0013483 A1 | 1/2007 | Stewart |
| 2007/0016089 A1 | 1/2007 | Fischell et al. |
| 2007/0021140 A1 | 1/2007 | Keyes, IV et al. |

(56) References Cited

U.S. PATENT DOCUMENTS

| | | |
|---|---|---|
| 2007/0024246 A1 | 2/2007 | Flaugher |
| 2007/0064406 A1 | 3/2007 | Beart |
| 2007/0069687 A1 | 3/2007 | Suzuki |
| 2007/0096875 A1 | 5/2007 | Waterhouse et al. |
| 2007/0105429 A1 | 5/2007 | Kohl et al. |
| 2007/0117596 A1 | 5/2007 | Greene et al. |
| 2007/0126650 A1 | 6/2007 | Guenther |
| 2007/0145830 A1 | 6/2007 | Lee et al. |
| 2007/0164839 A1 | 7/2007 | Naito |
| 2007/0171681 A1 | 7/2007 | Baarman |
| 2007/0176840 A1 | 8/2007 | Pristas et al. |
| 2007/0178945 A1 | 8/2007 | Cook et al. |
| 2007/0182367 A1 | 8/2007 | Partovi |
| 2007/0208263 A1 | 9/2007 | John et al. |
| 2007/0222542 A1 | 9/2007 | Joannopoulos et al. |
| 2007/0257636 A1 | 11/2007 | Phillips et al. |
| 2007/0267918 A1 | 11/2007 | Gyland |
| 2007/0276538 A1 | 11/2007 | Kjellsson et al. |
| 2008/0012569 A1 | 1/2008 | Hall et al. |
| 2008/0014897 A1 | 1/2008 | Cook et al. |
| 2008/0030415 A1 | 2/2008 | Homan et al. |
| 2008/0036588 A1 | 2/2008 | Iverson et al. |
| 2008/0047727 A1 | 2/2008 | Sexton et al. |
| 2008/0051854 A1 | 2/2008 | Bulkes et al. |
| 2008/0067874 A1 | 3/2008 | Tseng |
| 2008/0132909 A1 | 6/2008 | Jascob et al. |
| 2008/0154331 A1 | 6/2008 | John et al. |
| 2008/0176521 A1 | 7/2008 | Singh et al. |
| 2008/0191638 A1 | 8/2008 | Kuennen et al. |
| 2008/0197710 A1 | 8/2008 | Kreitz et al. |
| 2008/0197802 A1 | 8/2008 | Onishi et al. |
| 2008/0211320 A1 | 9/2008 | Cook et al. |
| 2008/0238364 A1 | 10/2008 | Weber et al. |
| 2008/0255901 A1 | 10/2008 | Carroll et al. |
| 2008/0265684 A1 | 10/2008 | Farkas |
| 2008/0266748 A1 | 10/2008 | Lee |
| 2008/0272860 A1 | 11/2008 | Pance |
| 2008/0273242 A1 | 11/2008 | Woodgate et al. |
| 2008/0278264 A1 | 11/2008 | Karalis et al. |
| 2008/0291277 A1 | 11/2008 | Jacobsen et al. |
| 2008/0300657 A1 | 12/2008 | Stultz |
| 2008/0300660 A1 | 12/2008 | John |
| 2009/0010028 A1 | 1/2009 | Baarmen et al. |
| 2009/0015075 A1 | 1/2009 | Cook et al. |
| 2009/0033280 A1 | 2/2009 | Choi et al. |
| 2009/0033564 A1 | 2/2009 | Cook et al. |
| 2009/0038623 A1 | 2/2009 | Farbarik et al. |
| 2009/0045772 A1 | 2/2009 | Cook et al. |
| 2009/0051224 A1 | 2/2009 | Cook et al. |
| 2009/0058189 A1 | 3/2009 | Cook et al. |
| 2009/0058361 A1 | 3/2009 | John |
| 2009/0067198 A1 | 3/2009 | Graham et al. |
| 2009/0072627 A1 | 3/2009 | Cook et al. |
| 2009/0072628 A1 | 3/2009 | Cook et al. |
| 2009/0072629 A1 | 3/2009 | Cook et al. |
| 2009/0072782 A1 | 3/2009 | Randall |
| 2009/0079268 A1 | 3/2009 | Cook et al. |
| 2009/0079387 A1 | 3/2009 | Jin et al. |
| 2009/0085408 A1 | 4/2009 | Bruhn |
| 2009/0085706 A1 | 4/2009 | Baarman et al. |
| 2009/0096413 A1 | 4/2009 | Partovi et al. |
| 2009/0102292 A1 | 4/2009 | Cook et al. |
| 2009/0108679 A1 | 4/2009 | Porwal |
| 2009/0108997 A1 | 4/2009 | Petterson et al. |
| 2009/0115628 A1 | 5/2009 | Dicks et al. |
| 2009/0127937 A1 | 5/2009 | Widmer et al. |
| 2009/0134712 A1 | 5/2009 | Cook et al. |
| 2009/0146892 A1 | 6/2009 | Shimizu et al. |
| 2009/0153273 A1 | 6/2009 | Chen |
| 2009/0160261 A1 | 6/2009 | Elo |
| 2009/0161078 A1 | 6/2009 | Wu et al. |
| 2009/0167449 A1 | 7/2009 | Cook et al. |
| 2009/0174263 A1 | 7/2009 | Baarman et al. |
| 2009/0179502 A1 | 7/2009 | Cook et al. |
| 2009/0188396 A1 | 7/2009 | Hofmann et al. |
| 2009/0189458 A1 | 7/2009 | Kawasaki |
| 2009/0195332 A1 | 8/2009 | Joannopoulos et al. |
| 2009/0195333 A1 | 8/2009 | Joannopoulos et al. |
| 2009/0212636 A1 | 8/2009 | Cook et al. |
| 2009/0213028 A1 | 8/2009 | Cook et al. |
| 2009/0218884 A1 | 9/2009 | Soar |
| 2009/0224608 A1 | 9/2009 | Cook et al. |
| 2009/0224609 A1 | 9/2009 | Cook et al. |
| 2009/0224723 A1 | 9/2009 | Tanabe |
| 2009/0224856 A1 | 9/2009 | Karalis et al. |
| 2009/0230777 A1 | 9/2009 | Baarman et al. |
| 2009/0237194 A1 | 9/2009 | Waffenschmidt et al. |
| 2009/0243394 A1 | 10/2009 | Levine |
| 2009/0243397 A1 | 10/2009 | Cook et al. |
| 2009/0251008 A1 | 10/2009 | Sugaya |
| 2009/0261778 A1 | 10/2009 | Kook |
| 2009/0267558 A1 | 10/2009 | Jung |
| 2009/0267709 A1 | 10/2009 | Joannopoulos et al. |
| 2009/0267710 A1 | 10/2009 | Joannopoulos et al. |
| 2009/0271047 A1 | 10/2009 | Wakamatsu |
| 2009/0271048 A1 | 10/2009 | Wakamatsu |
| 2009/0273242 A1 | 11/2009 | Cook |
| 2009/0273318 A1 | 11/2009 | Rondoni et al. |
| 2009/0281678 A1 | 11/2009 | Wakamatsu |
| 2009/0284082 A1 | 11/2009 | Mohammadian |
| 2009/0284083 A1 | 11/2009 | Karalis et al. |
| 2009/0284218 A1 | 11/2009 | Mohammadian et al. |
| 2009/0284220 A1 | 11/2009 | Toncich et al. |
| 2009/0284227 A1 | 11/2009 | Mohammadian et al. |
| 2009/0284245 A1 | 11/2009 | Kirby et al. |
| 2009/0284369 A1 | 11/2009 | Toncich et al. |
| 2009/0286470 A1 | 11/2009 | Mohammadian et al. |
| 2009/0286475 A1 | 11/2009 | Toncich et al. |
| 2009/0286476 A1 | 11/2009 | Toncich et al. |
| 2009/0289595 A1 | 11/2009 | Chen et al. |
| 2009/0299918 A1 | 12/2009 | Cook et al. |
| 2009/0322158 A1 | 12/2009 | Stevens et al. |
| 2009/0322280 A1 | 12/2009 | Kamijo et al. |
| 2010/0015918 A1 | 1/2010 | Liu et al. |
| 2010/0017249 A1 | 1/2010 | Fincham et al. |
| 2010/0033021 A1 | 2/2010 | Bennett |
| 2010/0034238 A1 | 2/2010 | Bennett |
| 2010/0036773 A1 | 2/2010 | Bennett |
| 2010/0038970 A1 | 2/2010 | Cook et al. |
| 2010/0045114 A1 | 2/2010 | Sample et al. |
| 2010/0052431 A1 | 3/2010 | Mita |
| 2010/0052811 A1 | 3/2010 | Smith et al. |
| 2010/0060077 A1 | 3/2010 | Paulus et al. |
| 2010/0065352 A1 | 3/2010 | Ichikawa |
| 2010/0066349 A1 | 3/2010 | Lin et al. |
| 2010/0076524 A1 | 3/2010 | Forsberg et al. |
| 2010/0081379 A1 | 4/2010 | Cooper et al. |
| 2010/0094381 A1 | 4/2010 | Kim et al. |
| 2010/0096934 A1 | 4/2010 | Joannopoulos et al. |
| 2010/0102639 A1 | 4/2010 | Joannopoulos et al. |
| 2010/0102640 A1 | 4/2010 | Joannopoulos et al. |
| 2010/0102641 A1 | 4/2010 | Joannopoulos et al. |
| 2010/0104031 A1 | 4/2010 | Lacour |
| 2010/0109443 A1 | 5/2010 | Cook et al. |
| 2010/0109445 A1 | 5/2010 | Kurs et al. |
| 2010/0109604 A1 | 5/2010 | Boys et al. |
| 2010/0115474 A1 | 5/2010 | Takada et al. |
| 2010/0117454 A1 | 5/2010 | Cook et al. |
| 2010/0117455 A1 | 5/2010 | Joannopoulos et al. |
| 2010/0117456 A1 | 5/2010 | Karalis et al. |
| 2010/0117596 A1 | 5/2010 | Cook et al. |
| 2010/0123353 A1 | 5/2010 | Joannopoulos et al. |
| 2010/0123354 A1 | 5/2010 | Joannopoulos et al. |
| 2010/0123355 A1 | 5/2010 | Joannopoulos et al. |
| 2010/0123452 A1 | 5/2010 | Amano et al. |
| 2010/0123530 A1 | 5/2010 | Park et al. |
| 2010/0127573 A1 | 5/2010 | Joannopoulos et al. |
| 2010/0127574 A1 | 5/2010 | Joannopoulos et al. |
| 2010/0127575 A1 | 5/2010 | Joannopoulos et al. |
| 2010/0127660 A1 | 5/2010 | Cook et al. |
| 2010/0133918 A1 | 6/2010 | Joannopoulos et al. |
| 2010/0133919 A1 | 6/2010 | Joannopoulos et al. |
| 2010/0133920 A1 | 6/2010 | Joannopoulos et al. |
| 2010/0141042 A1 | 6/2010 | Kesler et al. |

(56) References Cited

U.S. PATENT DOCUMENTS

| | | |
|---|---|---|
| 2010/0148589 A1 | 6/2010 | Hamam et al. |
| 2010/0148723 A1 | 6/2010 | Cook et al. |
| 2010/0151808 A1 | 6/2010 | Toncich et al. |
| 2010/0156346 A1 | 6/2010 | Takada et al. |
| 2010/0156355 A1 | 6/2010 | Bauerle et al. |
| 2010/0156570 A1 | 6/2010 | Hong et al. |
| 2010/0164295 A1 | 7/2010 | Ichikawa et al. |
| 2010/0164296 A1 | 7/2010 | Kurs |
| 2010/0164297 A1 | 7/2010 | Kurs et al. |
| 2010/0164298 A1 | 7/2010 | Karalis et al. |
| 2010/0171368 A1 | 7/2010 | Schatz et al. |
| 2010/0171370 A1 | 7/2010 | Karalis et al. |
| 2010/0179384 A1 | 7/2010 | Hoeg et al. |
| 2010/0181843 A1 | 7/2010 | Schatz et al. |
| 2010/0181844 A1 | 7/2010 | Karalis et al. |
| 2010/0181845 A1 | 7/2010 | Fiorello et al. |
| 2010/0181961 A1 | 7/2010 | Novak et al. |
| 2010/0181964 A1 | 7/2010 | Huggins et al. |
| 2010/0184371 A1 | 7/2010 | Cook et al. |
| 2010/0187911 A1 | 7/2010 | Joannopoulos et al. |
| 2010/0187913 A1 | 7/2010 | Sample |
| 2010/0188183 A1 | 7/2010 | Shpiro |
| 2010/0190435 A1 | 7/2010 | Cook et al. |
| 2010/0190436 A1 | 7/2010 | Cook et al. |
| 2010/0194206 A1 | 8/2010 | Burdo et al. |
| 2010/0194207 A1 | 8/2010 | Graham |
| 2010/0194334 A1 | 8/2010 | Kirby et al. |
| 2010/0194335 A1 | 8/2010 | Kirby et al. |
| 2010/0201189 A1 | 8/2010 | Kirby et al. |
| 2010/0201201 A1 | 8/2010 | Mobarhan et al. |
| 2010/0201202 A1 | 8/2010 | Kirby et al. |
| 2010/0201203 A1 | 8/2010 | Schatz et al. |
| 2010/0201204 A1 | 8/2010 | Sakoda et al. |
| 2010/0201205 A1 | 8/2010 | Karalis et al. |
| 2010/0201310 A1 | 8/2010 | Vorenkamp et al. |
| 2010/0201312 A1 | 8/2010 | Kirby et al. |
| 2010/0201313 A1 | 8/2010 | Vorenkamp et al. |
| 2010/0201316 A1 | 8/2010 | Takada et al. |
| 2010/0201513 A1 | 8/2010 | Vorenkamp et al. |
| 2010/0207458 A1 | 8/2010 | Joannopoulos et al. |
| 2010/0210233 A1 | 8/2010 | Cook et al. |
| 2010/0213770 A1 | 8/2010 | Kikuchi |
| 2010/0213895 A1 | 8/2010 | Keating et al. |
| 2010/0217553 A1 | 8/2010 | Von Novak et al. |
| 2010/0219694 A1 | 9/2010 | Kurs et al. |
| 2010/0219695 A1 | 9/2010 | Komiyama et al. |
| 2010/0219696 A1 | 9/2010 | Kojima |
| 2010/0222010 A1 | 9/2010 | Ozaki et al. |
| 2010/0225175 A1 | 9/2010 | Karalis et al. |
| 2010/0225270 A1 | 9/2010 | Jacobs et al. |
| 2010/0225271 A1 | 9/2010 | Oyobe et al. |
| 2010/0225272 A1 | 9/2010 | Kirby et al. |
| 2010/0231053 A1 | 9/2010 | Karalis et al. |
| 2010/0231163 A1 | 9/2010 | Mashinsky |
| 2010/0231340 A1 | 9/2010 | Fiorello et al. |
| 2010/0234922 A1 | 9/2010 | Forsell |
| 2010/0235006 A1 | 9/2010 | Brown |
| 2010/0237706 A1 | 9/2010 | Karalis et al. |
| 2010/0237707 A1 | 9/2010 | Karalis et al. |
| 2010/0237708 A1 | 9/2010 | Karalis et al. |
| 2010/0237709 A1 | 9/2010 | Hall et al. |
| 2010/0244576 A1 | 9/2010 | Hillan et al. |
| 2010/0244577 A1 | 9/2010 | Shimokawa |
| 2010/0244578 A1 | 9/2010 | Yoshikawa |
| 2010/0244579 A1 | 9/2010 | Sogabe et al. |
| 2010/0244580 A1 | 9/2010 | Uchida et al. |
| 2010/0244581 A1 | 9/2010 | Uchida |
| 2010/0244582 A1 | 9/2010 | Yoshikawa |
| 2010/0244583 A1 | 9/2010 | Shimokawa |
| 2010/0244767 A1 | 9/2010 | Turner et al. |
| 2010/0244839 A1 | 9/2010 | Yoshikawa |
| 2010/0248622 A1 | 9/2010 | Lyell Kirby et al. |
| 2010/0253152 A1 | 10/2010 | Karalis et al. |
| 2010/0253281 A1 | 10/2010 | Li |
| 2010/0256481 A1 | 10/2010 | Mareci et al. |
| 2010/0256831 A1 | 10/2010 | Abramo et al. |
| 2010/0259108 A1 | 10/2010 | Giler et al. |
| 2010/0259109 A1 | 10/2010 | Sato |
| 2010/0259110 A1 | 10/2010 | Kurs et al. |
| 2010/0264745 A1 | 10/2010 | Karalis et al. |
| 2010/0264746 A1 | 10/2010 | Kazama et al. |
| 2010/0264747 A1 | 10/2010 | Hall et al. |
| 2010/0276995 A1 | 11/2010 | Marzetta et al. |
| 2010/0277003 A1 | 11/2010 | Von Novak et al. |
| 2010/0277004 A1 | 11/2010 | Suzuki et al. |
| 2010/0277005 A1 | 11/2010 | Karalis et al. |
| 2010/0277120 A1 | 11/2010 | Cook et al. |
| 2010/0277121 A1 | 11/2010 | Hall et al. |
| 2010/0289341 A1 | 11/2010 | Ozaki et al. |
| 2010/0289449 A1 | 11/2010 | Elo |
| 2010/0295505 A1 | 11/2010 | Jung et al. |
| 2010/0295506 A1 | 11/2010 | Ichikawa |
| 2010/0308939 A1 | 12/2010 | Kurs |
| 2010/0314946 A1 | 12/2010 | Budde et al. |
| 2010/0327660 A1 | 12/2010 | Karalis et al. |
| 2010/0327661 A1 | 12/2010 | Karalis et al. |
| 2010/0328044 A1 | 12/2010 | Waffenschmidt et al. |
| 2011/0004269 A1 | 1/2011 | Strother et al. |
| 2011/0012431 A1 | 1/2011 | Karalis et al. |
| 2011/0018361 A1 | 1/2011 | Karalis et al. |
| 2011/0025131 A1 | 2/2011 | Karalis et al. |
| 2011/0031928 A1 | 2/2011 | Soar |
| 2011/0043046 A1 | 2/2011 | Joannopoulos et al. |
| 2011/0043047 A1 | 2/2011 | Karalis et al. |
| 2011/0043048 A1 | 2/2011 | Karalis et al. |
| 2011/0043049 A1 | 2/2011 | Karalis et al. |
| 2011/0049995 A1 | 3/2011 | Hashiguchi |
| 2011/0049996 A1 | 3/2011 | Karalis et al. |
| 2011/0049998 A1 | 3/2011 | Karalis et al. |
| 2011/0074218 A1 | 3/2011 | Karalis et al. |
| 2011/0074346 A1 | 3/2011 | Hall et al. |
| 2011/0074347 A1 | 3/2011 | Karalis et al. |
| 2011/0089895 A1 | 4/2011 | Karalis et al. |
| 2011/0095618 A1 | 4/2011 | Schatz et al. |
| 2011/0109263 A1* | 5/2011 | Sakoda ............... B60L 11/182 320/108 |
| 2011/0115303 A1 | 5/2011 | Baarman et al. |
| 2011/0115431 A1 | 5/2011 | Dunworth et al. |
| 2011/0121658 A1* | 5/2011 | Fukada ................ H02J 17/00 307/104 |
| 2011/0121920 A1 | 5/2011 | Kurs et al. |
| 2011/0128015 A1 | 6/2011 | Dorairaj et al. |
| 2011/0140544 A1 | 6/2011 | Karalis et al. |
| 2011/0148219 A1 | 6/2011 | Karalis et al. |
| 2011/0162895 A1 | 7/2011 | Karalis et al. |
| 2011/0169339 A1 | 7/2011 | Karalis et al. |
| 2011/0181122 A1 | 7/2011 | Karalis et al. |
| 2011/0193416 A1 | 8/2011 | Campanella et al. |
| 2011/0193417 A1* | 8/2011 | Hirasaka ............... H02J 5/005 307/104 |
| 2011/0193419 A1 | 8/2011 | Karalis et al. |
| 2011/0195666 A1 | 8/2011 | Forsell |
| 2011/0198939 A1 | 8/2011 | Karalis et al. |
| 2011/0215086 A1 | 9/2011 | Yeh |
| 2011/0221278 A1 | 9/2011 | Karalis et al. |
| 2011/0227528 A1 | 9/2011 | Karalis et al. |
| 2011/0227530 A1 | 9/2011 | Karalis et al. |
| 2011/0241618 A1 | 10/2011 | Karalis et al. |
| 2011/0248573 A1 | 10/2011 | Kanno et al. |
| 2011/0254377 A1 | 10/2011 | Wildmer et al. |
| 2011/0254503 A1 | 10/2011 | Widmer et al. |
| 2011/0266878 A9 | 11/2011 | Cook et al. |
| 2011/0278943 A1 | 11/2011 | Eckhoff et al. |
| 2012/0001492 A9 | 1/2012 | Cook et al. |
| 2012/0001593 A1 | 1/2012 | DiGuardo |
| 2012/0007435 A1 | 1/2012 | Sada et al. |
| 2012/0007441 A1 | 1/2012 | John et al. |
| 2012/0025602 A1 | 2/2012 | Boys et al. |
| 2012/0032522 A1 | 2/2012 | Schatz et al. |
| 2012/0038525 A1 | 2/2012 | Monsalve Carcelen et al. |
| 2012/0062345 A1 | 3/2012 | Kurs et al. |
| 2012/0068549 A1 | 3/2012 | Karalis et al. |
| 2012/0086284 A1 | 4/2012 | Capanella et al. |
| 2012/0086867 A1 | 4/2012 | Kesler et al. |

(56) References Cited

U.S. PATENT DOCUMENTS

| | | |
|---|---|---|
| 2012/0091794 A1 | 4/2012 | Campanella et al. |
| 2012/0091795 A1 | 4/2012 | Fiorello et al. |
| 2012/0091796 A1 | 4/2012 | Kesler et al. |
| 2012/0091797 A1 | 4/2012 | Kesler et al. |
| 2012/0091819 A1 | 4/2012 | Kulikowski et al. |
| 2012/0091820 A1 | 4/2012 | Campanella et al. |
| 2012/0091949 A1 | 4/2012 | Campanella et al. |
| 2012/0091950 A1 | 4/2012 | Campanella et al. |
| 2012/0098350 A1 | 4/2012 | Campanella et al. |
| 2012/0112531 A1 | 5/2012 | Kesler et al. |
| 2012/0112532 A1 | 5/2012 | Kesler et al. |
| 2012/0112534 A1 | 5/2012 | Kesler et al. |
| 2012/0112535 A1 | 5/2012 | Karalis et al. |
| 2012/0112536 A1 | 5/2012 | Karalis et al. |
| 2012/0112538 A1 | 5/2012 | Kesler et al. |
| 2012/0112691 A1 | 5/2012 | Kurs et al. |
| 2012/0119569 A1 | 5/2012 | Karalis et al. |
| 2012/0119575 A1 | 5/2012 | Kurs et al. |
| 2012/0119576 A1 | 5/2012 | Kesler et al. |
| 2012/0119698 A1 | 5/2012 | Karalis et al. |
| 2012/0139355 A1 | 6/2012 | Ganem et al. |
| 2012/0146575 A1 | 6/2012 | Armstrong et al. |
| 2012/0153732 A1 | 6/2012 | Kurs et al. |
| 2012/0153733 A1 | 6/2012 | Schatz et al. |
| 2012/0153734 A1 | 6/2012 | Kurs et al. |
| 2012/0153735 A1 | 6/2012 | Karalis et al. |
| 2012/0153736 A1 | 6/2012 | Karalis et al. |
| 2012/0153737 A1 | 6/2012 | Karalis et al. |
| 2012/0153738 A1 | 6/2012 | Karalis et al. |
| 2012/0153893 A1 | 6/2012 | Schatz et al. |
| 2012/0184338 A1 | 7/2012 | Kesler et al. |
| 2012/0206096 A1 | 8/2012 | John |
| 2012/0223573 A1 | 9/2012 | Schatz et al. |
| 2012/0228952 A1 | 9/2012 | Hall et al. |
| 2012/0228953 A1 | 9/2012 | Kesler et al. |
| 2012/0228954 A1 | 9/2012 | Kesler et al. |
| 2012/0235500 A1 | 9/2012 | Ganem et al. |
| 2012/0235501 A1 | 9/2012 | Kesler et al. |
| 2012/0235502 A1 | 9/2012 | Kesler et al. |
| 2012/0235503 A1 | 9/2012 | Kesler et al. |
| 2012/0235504 A1 | 9/2012 | Kesler et al. |
| 2012/0235505 A1 | 9/2012 | Schatz et al. |
| 2012/0235566 A1 | 9/2012 | Karalis et al. |
| 2012/0235567 A1 | 9/2012 | Karalis et al. |
| 2012/0235633 A1 | 9/2012 | Kesler et al. |
| 2012/0235634 A1 | 9/2012 | Hall et al. |
| 2012/0239117 A1 | 9/2012 | Kesler et al. |
| 2012/0242159 A1 | 9/2012 | Lou et al. |
| 2012/0242225 A1 | 9/2012 | Karalis et al. |
| 2012/0248884 A1 | 10/2012 | Karalis et al. |
| 2012/0248886 A1 | 10/2012 | Kesler et al. |
| 2012/0248887 A1 | 10/2012 | Kesler et al. |
| 2012/0248888 A1 | 10/2012 | Kesler et al. |
| 2012/0248981 A1 | 10/2012 | Karalis et al. |
| 2012/0256494 A1 | 10/2012 | Kesler et al. |
| 2012/0267960 A1 | 10/2012 | Low et al. |
| 2012/0280765 A1 | 11/2012 | Kurs et al. |
| 2012/0313449 A1 | 12/2012 | Kurs et al. |
| 2012/0313742 A1 | 12/2012 | Kurs et al. |
| 2013/0007949 A1 | 1/2013 | Kurs et al. |
| 2013/0020878 A1 | 1/2013 | Karalis et al. |
| 2013/0033118 A1 | 2/2013 | Karalis et al. |
| 2013/0038402 A1 | 2/2013 | Karalis et al. |
| 2013/0057364 A1 | 3/2013 | Kesler et al. |
| 2013/0062966 A1 | 3/2013 | Verghese et al. |
| 2013/0069441 A1 | 3/2013 | Verghese et al. |
| 2013/0069753 A1 | 3/2013 | Kurs et al. |
| 2013/0099587 A1 | 4/2013 | Lou |
| 2013/0154383 A1 | 6/2013 | Kasturi et al. |
| 2013/0154389 A1 | 6/2013 | Kurs et al. |
| 2013/0159956 A1 | 6/2013 | Verghese et al. |
| 2013/0175874 A1 | 7/2013 | Lou et al. |
| 2013/0175875 A1 | 7/2013 | Kurs et al. |
| 2013/0200716 A1 | 8/2013 | Kesler et al. |
| 2013/0200721 A1 | 8/2013 | Kurs et al. |
| 2013/0221744 A1 | 8/2013 | Hall et al. |
| 2013/0278073 A1 | 10/2013 | Kurs et al. |
| 2013/0278074 A1 | 10/2013 | Kurs et al. |
| 2013/0278075 A1 | 10/2013 | Kurs et al. |
| 2013/0300353 A1 | 11/2013 | Kurs et al. |
| 2013/0307349 A1 | 11/2013 | Hall et al. |
| 2013/0320773 A1 | 12/2013 | Schatz et al. |
| 2013/0334892 A1 | 12/2013 | Hall et al. |
| 2014/0002012 A1 | 1/2014 | McCauley et al. |
| 2014/0070764 A1 | 3/2014 | Keeling |

FOREIGN PATENT DOCUMENTS

| | | |
|---|---|---|
| CN | 102439669 | 5/2012 |
| CN | 103329397 | 9/2013 |
| DE | 38 24 972 | 1/1989 |
| DE | 100 29147 | 12/2001 |
| DE | 200 16 655 | 3/2002 |
| DE | 102 21 484 | 11/2003 |
| DE | 103 04 584 | 8/2004 |
| DE | 10 2005 036290 | 2/2007 |
| DE | 102006044057 | 4/2008 |
| EP | 1335477 | 8/2003 |
| EP | 1 521 206 | 4/2005 |
| EP | 1 524 010 | 4/2005 |
| EP | 2340611 | 7/2011 |
| EP | 2357716 | 8/2011 |
| EP | 2396796 | 12/2011 |
| IN | 1734/KOLNP/2011 | 9/2011 |
| JP | 02-097005 | 4/1990 |
| JP | 4-265875 | 9/1992 |
| JP | 6-341410 | 12/1994 |
| JP | 9-182323 | 7/1997 |
| JP | 9-298847 | 11/1997 |
| JP | 10-164837 | 6/1998 |
| JP | 11-75329 | 3/1999 |
| JP | 11-188113 | 7/1999 |
| JP | 2001-309580 | 11/2001 |
| JP | 2002-010535 | 1/2002 |
| JP | 2003-179526 | 6/2003 |
| JP | 2004-166459 | 6/2004 |
| JP | 2004-201458 | 7/2004 |
| JP | 2004-229144 | 8/2004 |
| JP | 2005-57444 | 3/2005 |
| JP | 2005-149238 | 6/2005 |
| JP | 2006-074848 | 3/2006 |
| JP | 2007-505480 | 3/2007 |
| JP | 2007-266892 | 10/2007 |
| JP | 2007-537637 | 12/2007 |
| JP | 2008-508842 | 3/2008 |
| JP | 2008-206231 | 9/2008 |
| JP | 2008-206327 | 9/2008 |
| JP | 2011-072074 | 4/2011 |
| JP | 2012-504387 | 2/2012 |
| JP | 2013-543718 | 12/2013 |
| KR | 10-2007-0017804 | 2/2007 |
| KR | 10-2008-0007635 | 1/2008 |
| KR | 10-2009-0122072 | 11/2009 |
| KR | 10-2011-0050920 | 5/2011 |
| SG | 112842 | 7/2005 |
| WO | WO 92/17929 | 10/1992 |
| WO | WO 93/23908 | 11/1993 |
| WO | WO 94/28560 | 12/1994 |
| WO | WO 95/11545 | 4/1995 |
| WO | WO 96/02970 | 2/1996 |
| WO | WO 98/50993 | 11/1998 |
| WO | WO 00/77910 | 12/2000 |
| WO | WO 03/092329 | 11/2003 |
| WO | WO 03/096361 | 11/2003 |
| WO | WO 03/096512 | 11/2003 |
| WO | WO 2004/015885 | 2/2004 |
| WO | WO 2004/038888 | 5/2004 |
| WO | WO 2004/055654 | 7/2004 |
| WO | WO 2004/073150 | 8/2004 |
| WO | WO 2004/073166 | 8/2004 |
| WO | WO 2004/073176 | 8/2004 |
| WO | WO 2004/073177 | 8/2004 |
| WO | WO 2004/112216 | 12/2004 |
| WO | WO 2005/024865 | 3/2005 |

(56) References Cited

FOREIGN PATENT DOCUMENTS

| | | |
|---|---|---|
| WO | WO 2005/060068 | 6/2005 |
| WO | WO 2005/109597 | 11/2005 |
| WO | WO 2005/109598 | 11/2005 |
| WO | WO 2006/011769 | 2/2006 |
| WO | WO 2007/008646 | 1/2007 |
| WO | WO 2007/020583 | 2/2007 |
| WO | WO 2007/042952 | 4/2007 |
| WO | WO 2007/084716 | 7/2007 |
| WO | WO 2007/084717 | 7/2007 |
| WO | WO 2008/109489 | 9/2008 |
| WO | WO 2008/118178 | 10/2008 |
| WO | WO 2009/009559 | 1/2009 |
| WO | WO 2009/018568 | 2/2009 |
| WO | WO 2009/023155 | 2/2009 |
| WO | WO 2009/023646 | 2/2009 |
| WO | WO 2009/033043 | 3/2009 |
| WO | WO 2009/062438 | 5/2009 |
| WO | WO 2009/070730 | 6/2009 |
| WO | WO 2009/126963 | 10/2009 |
| WO | WO 2009/140506 | 11/2009 |
| WO | WO 2009/149464 | 12/2009 |
| WO | WO 2009/155000 | 12/2009 |
| WO | WO 2010/030977 | 3/2010 |
| WO | WO 2010/036980 | 4/2010 |
| WO | WO 2010/039967 | 4/2010 |
| WO | WO 2010/090538 | 8/2010 |
| WO | WO 2010/090539 | 8/2010 |
| WO | WO 2010/093997 | 8/2010 |
| WO | WO 2010/104569 | 9/2010 |
| WO | WO 2011/061388 | 5/2011 |
| WO | WO 2011/061821 | 5/2011 |
| WO | WO 2011/062827 | 5/2011 |
| WO | WO 2011/112795 | 9/2011 |
| WO | WO 2012/037279 | 3/2012 |
| WO | WO 2012/170278 | 12/2012 |
| WO | WO 2013/013235 | 1/2013 |
| WO | WO 2013/020138 | 2/2013 |
| WO | WO 2013/036947 | 3/2013 |
| WO | WO 2013/059441 | 4/2013 |
| WO | WO 2013/067484 | 5/2013 |
| WO | WO 2013/113017 | 8/2013 |
| WO | WO 2013/142840 | 9/2013 |
| WO | WO 2014/004843 | 1/2014 |

OTHER PUBLICATIONS

"Physics Update, Unwired Energy", *Physics Today*, pp. 26, (Jan. 2007) (See http://arxiv.org/abs/physics/0611063.).
"In pictures: A year in technology", *BBC News*, (Dec. 28, 2007).
"Next Little Thing 2010 Electricity without wires", CNN Money (See money.cnn.com/galleries/2009/smallbusiness/0911/gallery.next_little_thing_2010.smb/) (dated Nov. 30, 2009).
11184066.6, "Extended European Search Report for 11184066.6 mailed Mar. 28, 2013",Massachusetts Institute of Technology,7 pages.
12/613,686, ,"U.S. Appl. No. 12/613,686, Notice of Allowance mailed Jan. 6, 2011",Jan. 6, 2011,10 pages.
12/613,686, ,"U.S. Appl. No. 12/613,686, Notice of Allowance mailed Mar. 7, 2011",Mar. 7, 2011,8 pages.
2006269374"Australian Application Serial No. 200626937 4, Examination Report mailed Sep. 18, 2008",Sep. 18, 2008,5 pages.
60/698,442, ,U.S. Appl. No. 60/698,442, "Wireless Non-Radiative Energy Transfer, filed Jul. 12, 2005",14 pages.
60/908.666, ,U.S. Appl. No. 60/908,666, "Wireless Energy Transfer", filed Mar. 28, 2007,108 pages.
Abe et al. "A Noncontact Charger Using a Resonant Converter with Parallel Capacitor of the Secondary Coil". IEEE, 36(2):444-451, Mar./Apr. 2000.
Ahmadian, M. et al., "Miniature Transmitter for Implantable Micro Systems", *Proceedings of the 25th Annual International Conference of the IEEE EMBS Cancun*, Mexico, pp. 3028-3031 (Sep. 17-21, 2003).

Valtchev et al. "Efficient Resonant Inductive Coupling Energy Transfer Using New Magnetic and Design Criteria". IEEE, pp. 1293-1298, 2005.
Aoki, T. et al., "Observation of strong coupling between one atom and a monolithic microresonator", Nature, vol. 443:671-674 (2006).
Apneseth et al. "Introducing wireless proximity switches" ABB Review Apr. 2002.
Aristeidis Karalis et al., "Efficient Wireless non-radiative mid-range energy transfer", *Annals of Physics*, vol. 323, pp. 34-48 (2008).
Baker et al., "Feedback Analysis and Design of RF Power Links for Low-Power Bionic Systems," *IEEE Transactions on Biomedical Circuits and Systems*, vol. 1(1):28-38 (Mar. 2007).
Balanis, C.A., "Antenna Theory: Analysis and Design," 3rd Edition, Sections 4.2, 4.3, 5.2, 5.3 (Wiley, New Jersey, 2005).
Berardelli, P., "Outlets Are Out", ScienceNOW Daily News, Science Now, http://sciencenow.sciencemag.org/ cgi/content/full/2006/1114/2, (Nov. 14, 2006) 2 pages.
Biever, C., "Evanescent coupling' could power gadgets wirelessly", NewScientistsTech.com, http://www. newscientisttech.com/article.ns?id=dn1 0575&print=true, (Nov. 15, 2006) 2 pages.
Borenstein, S., "Man tries wirelessly boosting batteries", (The Associated Press), USA Today, (Nov. 16, 2006) 1 page.
Borenstein, S., "Man tries wirelessly boosting batteries", AP Science Writer, Boston.com, (See http://www.boston.com/business/technology/articles/2006/11/15/man_tries_wirelessly_b . . . ) (Nov. 15, 2006).
Boyle, A., "Electro-nirvana? Not so fast", MSNBC, http://lcosmiclog.msnbc.msn.com/_news/2007/06/08/4350760- electro-nirvana-not-so-fast, (Jun. 8, 2007) 1 page.
Budhia, M. et al., "A New IPT Magnetic Coupler for Electric Vehicle Charging Systems", IECON 2010—36th Annual Conference on IEEE Industrial Electronics Society, Glendale, AZ, pp. 2487-2492 (Nov. 7-10, 2010).
Budhia, M. et al., "Development and evaluation of single sided flux couplers for contactless electric vehicle charging", 2011 IEEE Energy Conversion Congress and Exposition (ECCE), Phoenix, AZ, pp. 614-621 (Sep. 17-22, 2011).
Budhia, M. et al.,"Development of a Single-Sided Flux Magnetic Coupler for Electric Vehicle IPT", *IEEE Transactions on Industrial Electronics*, vol. 60:318-328 (Jan. 2013).
Bulkeley, W. M., "MIT Scientists Pave the Way for Wireless Battery Charging", The Wall Street Journal (See http://online.wsj.com/article/SB118123955549228045.html?mod=googlenews_wsj), (Jun. 8, 2007) 2 pages.
Burri et al., "Invention Description", (Feb. 5, 2008).
Cass, S., "Air Power—Wireless data connections are common—now scientists are working on wireless power", Sponsored by IEEE Spectrum, http://spectrum.ieee.org/computing/hardware/air-power, (Nov. 2006) 2 pages.
Castelvecchi, Davide, "The Power of Induction—Cutting the last cord could resonate with our increasingly gadget dependent lives", *Science News Online*, vol. 172, No. 3, Jul. 21, 2007, 6 pages.
Chang, A., "Recharging the Wireless Way—Even physicists forget to recharge their cell phones sometimes.", PC Magazine, ABC News Internet Ventures, (Dec. 12, 2006) 1 page.
Chinaview, "Scientists light bulb with wireless electricity", www. Chinaview.cn, http://news.xinhuanet.com/english/2007-06/08/content_6215681.htm, Jun. 2007, 1 page.
Cooks, G., "The vision of an MIT physicist: Getting rid of pesky rechargers", Boston.com, (Dec. 11, 2006) 1 page.
International Preliminary Report on Patentability for International Application No. PCT/US2006/026480, dated Jan. 29, 2008.
International Preliminary Report on Patentability with regard to International Application No. PCT/US2007/070892 dated Oct. 8, 2009.
International Search Report and Written Opinion for International Application No. PCT/US09/43970, dated Jul. 14, 2009.
International Search Report and Written Opinion for International Application No. PCT/US2006/026480, dated Dec. 21, 2007.
International Search Report and Written Opinion for International Application No. PCT/US2007/070892, dated Mar. 3, 2008.

(56) References Cited

OTHER PUBLICATIONS

International Search Report and Written Opinion of the International Searching Authority for International Application No. PCT/US2011/027868 dated Jul. 5, 2011.
International Search Report for International Application No. PCT/US2009/058499 dated Dec. 10, 2009.
PCT International Search Report and Written Opinion for PCT/US2009/059244, Dec. 7, 2009, 12 pages.
U.S. Appl. No. 60/908,383, filed Mar. 27, 2007.
Derbyshire, D., "The end of the plug? Scientists invent wireless device that beams electricity through your home", Daily Mail, http://www.dailymail.co.uk/pages/live/articles/technology/technology.html?in_article_id=4 . . . ), (Jun. 7, 2007) 3 pages.
Eisenberg, Anne, "Automatic Recharging, From a Distance", The New York Times, (see www.nytimes.com/2012/03/11/business/built-in-wireless-chargeing-for-electronic-devices.html?_r=0) (published on Mar. 10, 2012).
Esser et al., "A New Approach to Power Supplies for Robots", IEEE, vol. 27(5):872-875, (Sep./Oct. 1991).
European Examination Report dated Jan. 15, 2009 in connection with Application No. 06 786 588.1-1242.
Fan, Shanhui et al., "Rate-Equation Analysis of Output Efficiency and Modulation Rate of Photomic-Crystal Light-Emitting Diodes", IEEE Journal of Quantum Electronics, vol. 36(10):1123-1130 (Oct. 2000).
Fenske et al., "Dielectric Materials at Microwave Frequencies", Applied Microwave & Wireless, pp. 92-100 (2000).
Fernandez, C. et al., "A simple dc-dc converter for the power supply of a cochlear implant", *IEEE*, pp. 1965-1970 (2003).
Ferris, David, "How Wireless Charging Will Make Life Simpler (and Greener)", Forbes (See forbes.com/sites/davidferris/2012/07/24/how-wireless-charging-will-make-life-simpler-and-greener/print/) (dated Jul. 24, 2012).
Fildes, J., "Physics Promises Wireless Power", (Science and Technology Reporter), BBC News, (Nov. 15, 2006) 3 pages.
Fildes, J., "The technology with impact 2007", BBC News, (Dec. 27, 2007) 3 pages.
Fildes, J., "Wireless energy promise powers up", BBC News, http://news.bbc.co.uk/2/hi/technology/6725955.stm, (Jun. 7, 2007) 3 pages.
Finkenzeller, Klaus, "RFID Handbook—Fundamentals and Applications in Contactless Smart Cards", Nikkan Kohgyo-sya, Kanno Taihei, first version, pp. 32-37, 253 (Aug. 21, 2001).
Finkenzeller, Klaus, "RFID Handbook (2nd Edition)", The Nikkan Kogyo Shimbun, Ltd., pp. 19, 20, 38, 39, 43, 44, 62, 63, 67, 68, 87, 88, 291, 292 (Published on May 31, 2004).
Freedman, D.H., "Power on a Chip", MIT Technology Review, (Nov. 2004).
Gary Peterson, "MIT WiTricity Not So Original After All", *Feed Line No. 9*, (See http://www.tfcbooks.com/articles/witricity.htm) printed Nov. 12, 2009.
Hadley, F., "Goodbye Wires—MIT Team Experimentally Demonstrates Wireless Power Transfer, Potentially Useful for Power Laptops, Cell-Phones Without Cords", Massachusetts Institute of Technology, Institute for Soldier D Nanotechnologies, http://web.mit.edu/newsoffice/2007/wireless-0607.html, (Jun. 7, 2007) 3 pages.
Haus, H.A., "Waves and Fields in Optoelectronics," Chapter 7 "Coupling of Modes—Reasonators and Couplers" (Prentice-Hall, New Jersey, 1984).
Heikkinen et al., "Performance and Efficiency of Planar Rectennas for Short-Range Wireless Power Transfer at 2.45 GHz", Microwave Optical Technology Letters, vol. 31(2):86-91, (Oct. 20, 2001).
Highfield, R., "Wireless revolution could spell end of plugs",(Science Editor), Telegraph.co.uk, http://www.telegraph.co.uk/news/main.jhtml?xml=/news/2007/06/07/nwireless1 07.xml, (Jun. 7, 2007) 3 pages.
Hirai et al., "Integral Motor with Driver and Wireless Transmission of Power and Information for Autonomous Subspindle Drive", IEEE, vol. 15(1):13-20, (Jan. 2000).

Hirai et al., "Practical Study on Wireless Transmission of Power and Information for Autonomous Decentralized Manufacturing System", IEEE, vol. 46(2):349-359, Apr. 1999.
Hirai et al., "Study on Intelligent Battery Charging Using Inductive Transmission of Power and Information", IEEE, vol. 15(2):335-345, (Mar. 2000).
Hirai et al., "Wireless Transmission of Power and Information and Information for Cableless Linear Motor Drive", IEEE, vol. 15(1):21-27, (Jan. 2000).
Hirayama, M., "Splashpower—World Leaders in Wireless Power", PowerPoint presentation, Splashpower Japan, (Sep. 3, 2007) 30 pages.
Ho, S. L. et al., "A Comparative Study Between Novel Witricity and Traditional Inductive Magnetic Coupling in Wireless Charging", IEEE Transactions on Magnetics, vol. 47(5):1522-1525 (May 2011).
Infotech Online, "Recharging gadgets without cables", infotech.indiatimes.com, (Nov. 17, 2006) 1 page.
Jackson, J. D., "Classical Electrodynamics", 3rd Edition, Wiley, New York, 1999, pp. 201-203.
Jackson, J.D., "Classical Electrodynamics," 3rd Edition, Sections 1.11, 5.5, 5.17, 6.9, 8.1, 8.8, 9.2, 9.3 (Wiley, New York, 1999).
Jacob, M. V. et al., "Lithium Tantalate—A High Permittivity Dielectric Material for Microwave Communication Systems", *Proceedings of IEEE TENCON—Poster Papers*, pp. 1362-1366, 2003.
Karalis, Aristeidis, "Electricity Unplugged", Feature: Wireless Energy Physics World, physicsworld.com, pp. 23-25 (Feb. 2009).
Kawamura et al., "Wireless Transmission of Power and Information Through One High-Frequency Resonant AC Link Inverter for Robot Manipulator Applications", IEEE, vol. 32(3):503-508, (May/Jun. 1996).
Kurs, A. et al., "Wireless Power Transfer via Strongly Coupled Magnetic Resonances", *Science* vol. 317, pp. 83-86 (Jul. 6, 2007).
Kurs, A. et al., "Simultaneous mid-range power transfer to multiple devices", *Applied Physics Letters*, vol. 96, No. 044102 (2010).
Kurs, A. et al.,"Optimized design of a low-resistance electrical conductor for the multimegahertz range", *Applied Physics Letters*, vol. 98:172504-172504-3 (Apr. 2011).
Lamb, Gregory M. ,"Look Ma—no wires!—Electricity broadcast through the air may someday run your home",The Christian Science Monitor,http://www.csmonitor.com/2006/1116/p14s01-stct.html,Nov. 15, 2006,2 pages.
Lee, "Antenna Circuit Design for RFID Applications," Microchip Technology Inc., AN710, 50 pages (2003).
Lee, "RFID Coil Design," Microchip Technology Inc., AN678, 21 pages (1998).
Liang et al., "Silicon waveguide two-photon absorption detector at 1.5 μm wavelength for autocorrelation measurements," Applied Physics Letters, 81(7):1323-1325 (Aug. 12, 2002).
Markoff, J. ,"Intel Moves to Free Gadgets of Their Recharging Cords", The New York Times—nytimes.com, Aug. 21, 2008, 2 pages.
Mediano, A. et al. "Design of class E amplifier with nonlinear and linear shunt capacitances for any duty cycle", IEEE Trans. Microwave Theor. Tech., vol. 55, No. 3, pp. 484-492, (2007).
Microchip Technology Inc., "microID 13.56 MHz Design Guide—MCRF355/360 Reader Reference Design," 24 pages (2001).
Minkel, J R., "Wireless Energy Lights Bulb from Seven Feet Away—Physicists vow to cut the cord between your laptop battery and the wall socket—with just a simple loop of wire", Scientific American,http://www.scientificamerican.com/article.cfm?id=wireless-energy-lights-bulb-from-seven-feet-away, Jun. 7, 2007, 1 page.
Minkel, J. R., "Wireless Energy Transfer May Power Devices at a Distance", Scientific American, Nov. 14, 2006, 1 page.
Morgan, J., "Lab report: Pull the plug for a positive charge", The Herald, Web Issue 2680, (Nov. 16, 2006) 3 pages.
Moskvitch, Katia, "Wireless charging—rhe future for electric cars?", BBC News Technology (See www.bbc.co.uk/news/technology-14183409) (dated Jul. 21, 2011).
O'Brien et al., "Analysis of Wireless Power Supplies for Industrial Automation Systems", IEEE, pp. 367-372 (Nov. 2-6, 2003).

(56) References Cited

OTHER PUBLICATIONS

O'Brien et al., "Design of Large Air-Gap Transformers for Wireless Power Supplies", IEEE, pp. 1557-1562 (Jun. 15-19, 2003).
PCT/US2009/058499"International Application Serial No. PCT/US2009/058499, International Preliminary Report on Patentability mailed Mar. 29, 2011",5 pages.
PCT/US2010/024199, ,"International Application Serial No. PCT/US2010/024199, International Preliminary Report on Patentability mailed Aug. 25, 2011",8 pages.
PCT/US2010/024199, ,"International Application Serial No. PCT/US2010/024199, Search Report and Written Opinion mailed May 14, 2010",12 pages.
PCT/US2011/027868, ,"International Application Serial No. PCT/US2011/027868, International Preliminary Report on Patentability mailed Sep. 20, 2012",8 pages.
PCT/US2011/051634, ,"International Application Serial No. PCT/US2011/051634 , International Search Report and Written Opinion mailed Jan. 6, 2012",11 pages.
PCT/US2011/051634, ,"International Application Serial No. PCT/US2011/051634, International Preliminary Report on Patentability mailed Mar. 28, 2013",Witricity Corporation et al,8.
PCT/US2012/040184, ,"International Application Serial No. PCT/US2012/040184, International Search Report and Written Opinion mailed Nov. 28, 2012",Witricity Corporation et al.,8 pages.
PCT/US2012/049777, ,"International Application Serial No. PCT/US2012/049777, International Search Report and Written Opinion mailed Jan. 23, 2013",10 pages.
PCT/US2012/060793, ,"International Application Serial No. PCT/US2012/060793, International Search Report and Written Opinion mailed Mar. 8, 2013",Witricity Corporation,13.
PCT/US2012/063530, ,"International Application Serial No. PCT/US2012/063530, International Search Report and Written Opinion mailed Mar. 13, 2013",Witricity Corporation,16.
PCT/US2013/023478, ,"International Application Serial No. PCT/US2013/023478, International Search Report and Written Opinion mailed Jun. 25, 2013",Witricity Corporation,15 pages.
PCT/US2013/033599, ,"International Application Serial No. PCT/US2013/033599, International Search Report and Written Opinion mailed Jul. 25, 2013",Witricity Corporation,13 pages.
Pendry, J. B., "A Chiral Route to Negative Refraction", Science, vol. 306:1353-1355 (2004).
Physics Today, "Unwired energy questions asked answered", Sep. 2007, pp. 16-17.
Powercast LLC. "White Paper" Powercast simply wire free, 2003.
PR News Wire, "The Big Story for CES 2007: The public debut of eCoupled Intelligent Wireless Power", Press Release, Fulton Innovation LLC, Las Vegas, NV, (Dec. 27, 2006) 3 pages.
Press Release, "The world's first sheet-type wireless power transmission system: Will a socket be replaced by e-wall?",Public Relations Office, School of Engineering, University of Tokyo, Japan,Dec. 12, 2006,4 pages.
Presstv, "Wireless power transfer possible", http://edition.presstv.ir/detail/12754.html, Jun. 11, 2007, 1 page.
Reidy, C. (Globe Staff), "MIT discovery could unplug your iPod forever", Boston.com, http://www.boston.com/_business/ticker/2007/06/mit_discovery_c.html, (Jun. 7, 2007) 3 pages.
Risen, C., "Wireless Energy", The New York Times, (Dec. 9, 2007) 1 page.
Sakamoto et al., "A Novel Circuit for Non-Contact Charging Through Electro-Magnetic Coupling", IEEE, pp. 168-174 (1992).
Scheible, G. et al., "Novel Wireless Power Supply System for Wireless Communication Devices in Industrial Automation Systems", IEEE, pp. 1358-1363, (Nov. 5-8, 2002).
Schneider, D. "A Critical Look at Wireless Power", *IEEE Spectrum*, pp. 35-39 (May 2010).
Schneider, David, "Electrons Unplugged. Wireless power at a distance is still far away", *IEEE Spectrum*, pp. 35-39 (May 2010).

Schuder, J. C. et al., "An Inductively Coupled RF System for the Transmission of 1 kW of Power Through the Skin", *IEEE Transactions on Bio-Medical Engineering*, vol. BME-18, No. 4, pp. 265-273 (Jul. 1971).
Schuder, J. C., "Powering an Artificial Heart: Birth of the Inductively Coupled-Radio Frequency System in 1960", *Artificial Organs*, vol. 26:909-915 (2002).
Schuder, J.C. et al., "Energy Transport Into the Closed Chest From a Set of Very-Large Mutually Orthogonal Coils", Communication Electronics, vol. 64:527-534 (Jan. 1963).
Schutz, J. et al., "Load Adaptive Medium Frequency Resonant Power Supply", IEEE, pp. 282-287 (Nov. 2002).
Sekitani et al. "A large-area wireless power-transmission sheet using printed organic transistors and plastic MEMS switches" www.nature.corn/naturematerials. Published online Apr. 29, 2007.
Sekitani et al., "A large-area flexible wireless power transmission sheet using printed plastic MEMS switches and organic field-effect transistors", IEDM '06, International Electron Devices Meeting, (Dec. 11-13, 2006) 4 pages.
Sekiya, H. et al., "FM/PWM control scheme in class DE inverter", IEEE Trans. Circuits Syst. I, vol. 51(7) (Jul. 2004).
Senge, M., "MIT's wireless electricity for mobile phones", Vanguard, http://www.vanguardngr.corn/articles/2002/features/gsm/gsm211062007.htm, (Jun. 11, 2007) 1 page.
Sensiper, S., "Electromagnetic wave propogation on helical conductors", Technical Report No. 194 (based on PhD Thesis), Massachusetts Institute of Technology, (May 16, 1951) 126 pages.
Soljacic, M. , "Wireless Non-Radiative Energy Transfer—PowerPoint presentation". Massachusetts Institute of Technology, (Oct. 6, 2005).
Soljacic, M. et al., "Wireless Energy Transfer Can Potentially Recharge Laptops Cell Phones Without Cords", (Nov. 14, 2006) 3 pages.
Soljacic, M. et al., "Photonic-crystal slow-light enhancement of nonlinear phase sensitivity", *J. Opt. Soc. Am B*, vol. 19, No. 9, pp. 2052-2059 (Sep. 2002).
Soljacic, M., "Wireless nonradiative energy transfer", *Visions of Discovery New Light on Physics, Cosmology, and Consciousness*, Cambridge University Press, New York, NY pp. 530-542 (2011).
Someya, Takao. "The world's first sheet-type wireless power transmission system". University of Tokyo, (Dec. 12, 2006).
Staelin, David H. et al., Electromagnetic Waves, Chapters 2, 3, 4, and 8, pp. 46-176 and 336-405 (Prentice Hall Upper Saddle River, New Jersey 1998).
Stark III, Joseph C., "Wireless Power Transmission Utilizing a Phased Array of Tesla Coils", Master Thesis, Massachusetts Institute of Technology (2004).
Stewart, W., "The Power to Set you Free", Science, vol. 317:55-56 (Jul. 6, 2007).
Tang, S.C. et al., "Evaluation of the Shielding Effects on Printed-Circuit-Board Transformers Using Ferrite Plates and Copper Sheets", *IEEE Transactions on Power Electronics*, vol. 17:1080-1088 (Nov. 2002).
Tesla, Nikola, "High Frequency Oscillators for Electro-Therapeutic and Other Purposes", *Proceedings of the IEEE*, vol. 87:1282-1292 (Jul. 1999).
Tesla, Nikola, "High Frequency Oscillators for Electro-Therapeutic and Other Purposes", *The Electrical Engineer*, vol. XXVI, No. 50 (Nov. 17, 1898).
Texas Instruments, "HF Antenna Design Notes—Technical Application Report," Literature No. 11-08-26-003, 47 pages (Sep. 2003).
Thomsen et al., "Ultrahigh speed all-optical demultiplexing based on two-photon absorption in a laser diode," Electronics Letters, 34(19):1871-1872 (Sep. 17, 1998).
UPM Rafsec, "Tutorial overview of inductively coupled RFID Systems," 7 pages (May 2003).
Vandevoorde et al., "Wireless energy transfer for stand-alone systems: a comparison between low and high power applicability", Sensors and Actuators, vol. 92:305-311 (2001).
Vilkomerson, David et al., "Implantable Doppler System for Self-Monitoring Vascular Grafts", *IEEE Ultrasonics Symposium*, pp. 461-465 (2004).

(56) References Cited

OTHER PUBLICATIONS

Villeneuve, Pierre R. et al., "Microcavities in photonic crystals: Mode symmetry, tunability, and coupling efficiency", *Physical Review B*, vol. 54:7837-7842 (Sep. 15, 1996).
Geyi, Wen, "A Method for the Evaluation of Small Antenna Q", IEEE Transactions on Antennas and Propagation, vol. 51(8):2124-2129 (Aug. 2003).
Yariv, Amnon et al., "Coupled-resonator optical waveguide: a proposal and analysis", *Optics Letters*, vol. 24(11):711-713 (Jun. 1, 1999).
Yates, David C. et al., "Optimal Transmission Frequency for Ultralow-Power Short-Range Radio Links", IEEE Transactions on Circuits and Systems—1, Regular Papers, vol. 51:1405-1413 (Jul. 2004).
Yoshihiro Konishi, *Microwave Electronic Circuit Technology*, Chapter 4, pp. 145-197 (Marcel Dekker, Inc., New York, NY 1998).
Ziaie, Babak et al., "A Low-Power Miniature Transmitter Using a Low-Loss Silicon Platform for Biotelemetry", *Proceedings—19th International Conference IEEE/EMBS*, pp. 2221-2224, (Oct. 30-Nov. 2, 1997) 4 pages.
Zierhofer, Clemens M. et al., "High-Efficiency Coupling-Insensitive Transcutaneous Power and Data Transmission Via an Inductive Link", *IEEE Transactions on Biomedical Engineering*, vol. 37, No. 7, pp. 716-722 (Jul. 1990).
Fish & Richardson P.C., "Reply to Action of Apr. 22, 2014", U.S. Appl. No. 13/290,983, 15 pages (Jun. 23, 2014).
U.S. Patent and Trademark Office, "Final Office Action", U.S. Appl. No. 13/290,983, 14 pages (Apr. 22, 2014).
Fish & Richardson P.C., "Reply to Action of Nov. 12, 2013", U.S. Appl. No. 13/290,983, 10 pages (Mar. 11, 2014).
U.S. Patent and Trademark Office, "Office Action", U.S. Appl. No. 13/290,983, 12 pages (Nov. 12, 2013).

\* cited by examiner

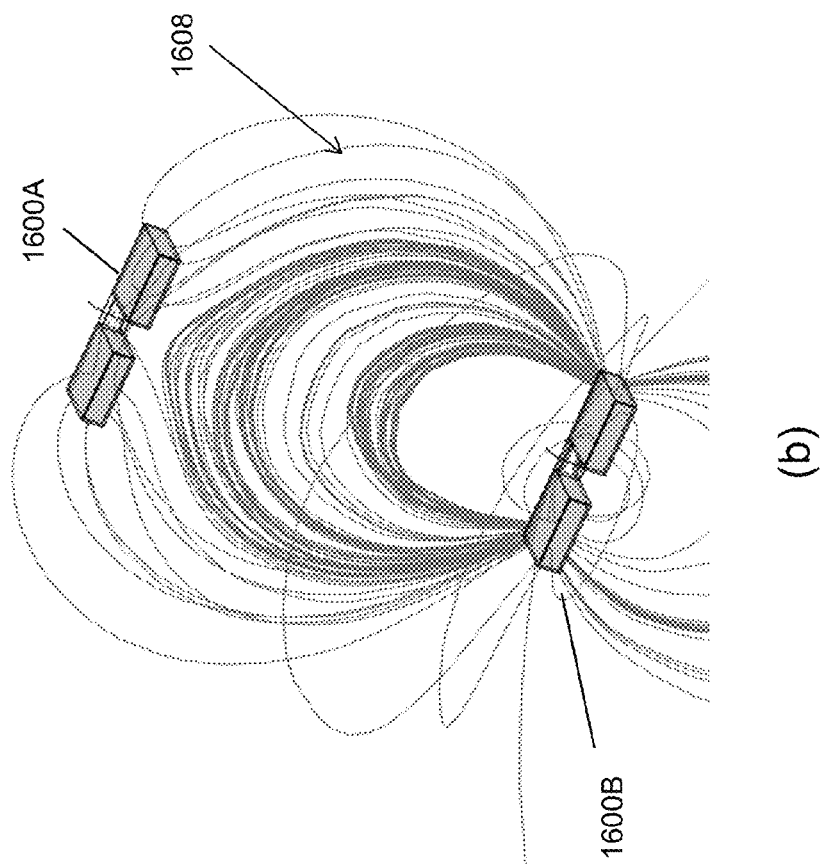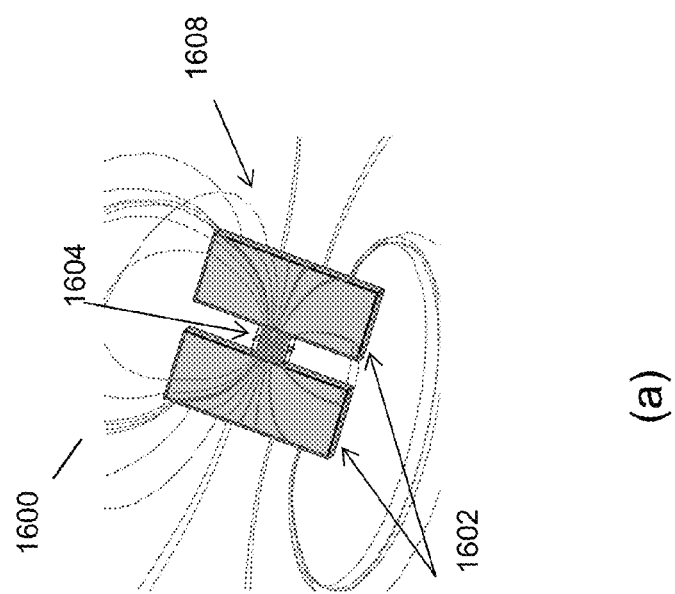
Fig. 16

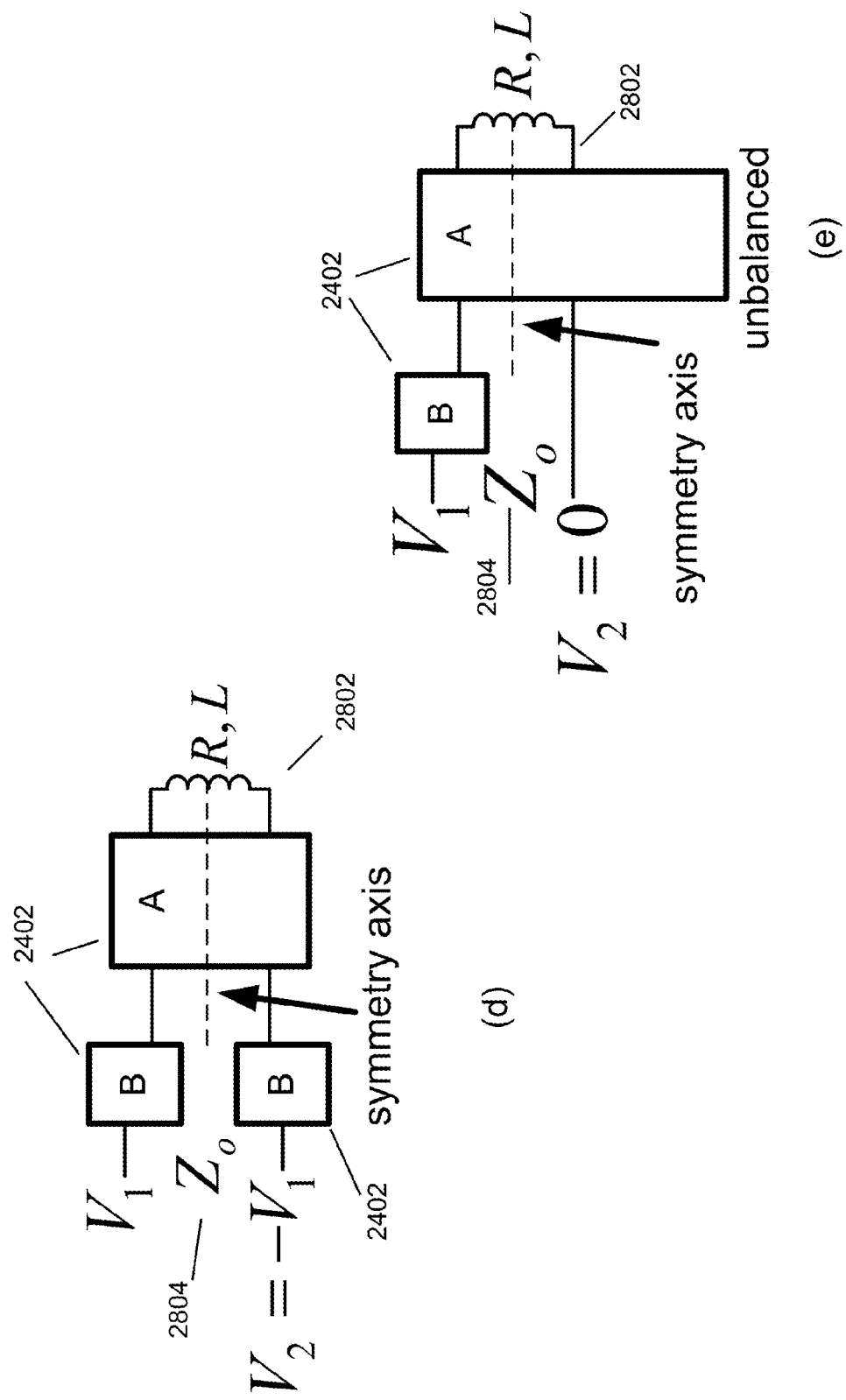

Fig. 30
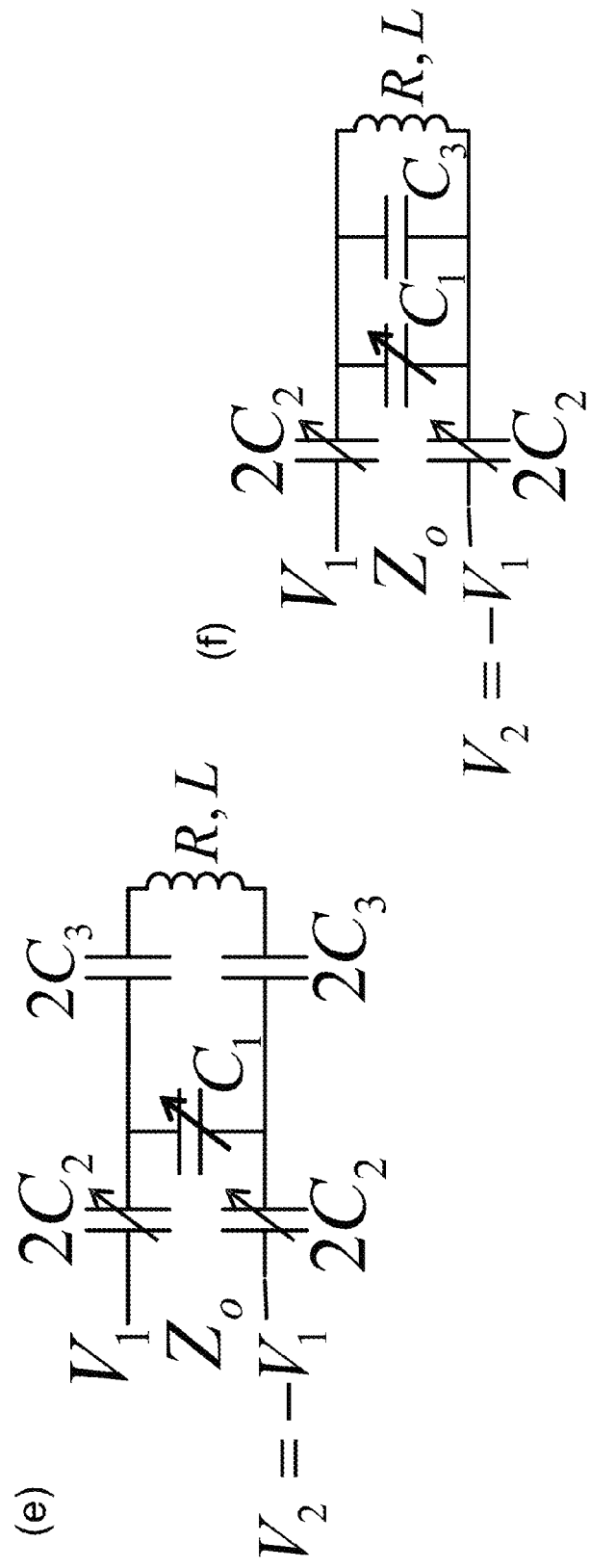
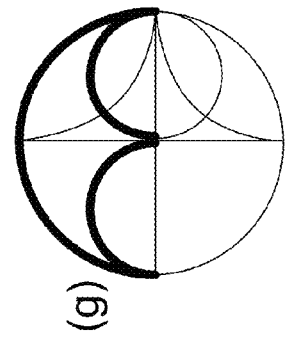

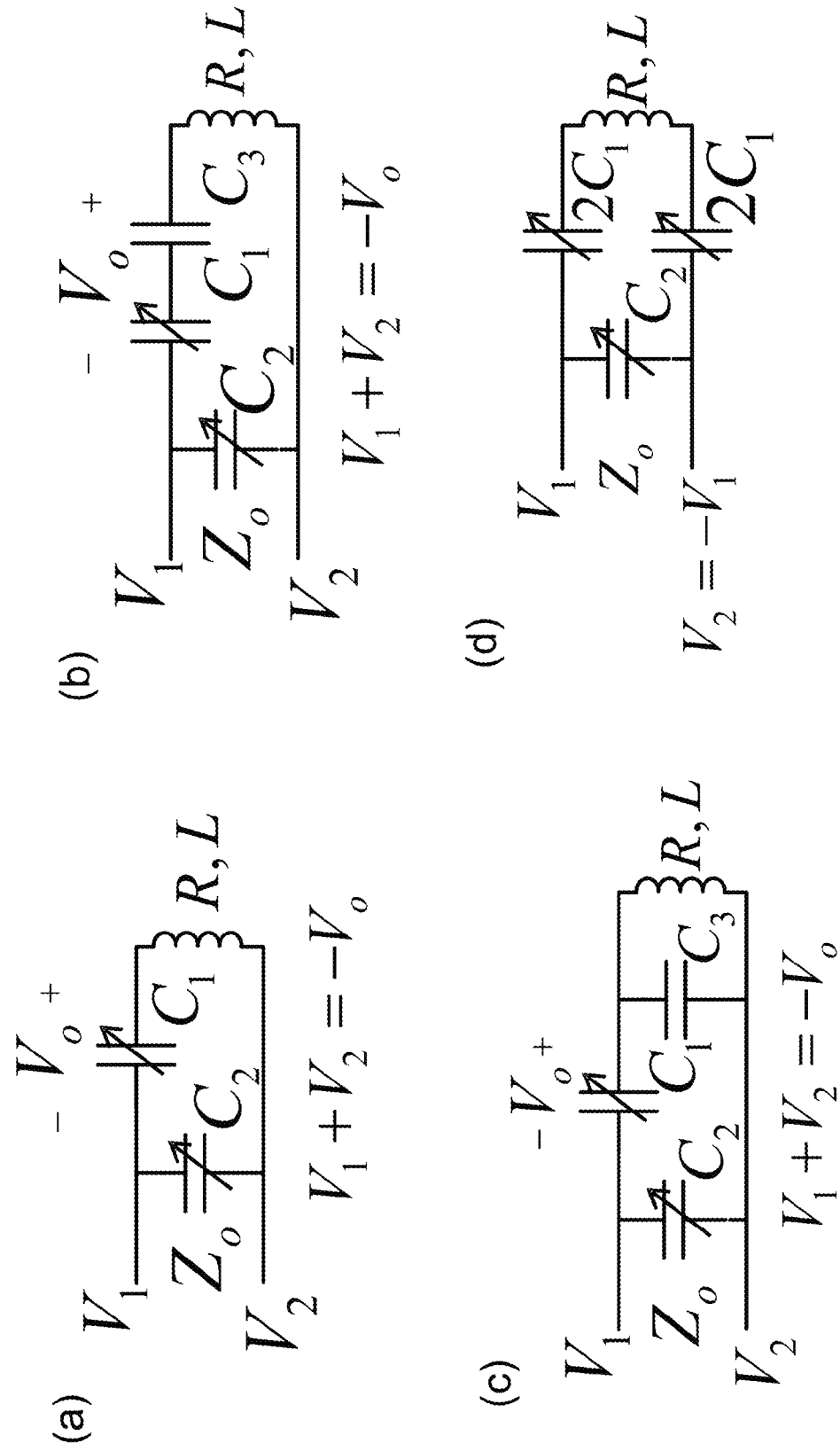

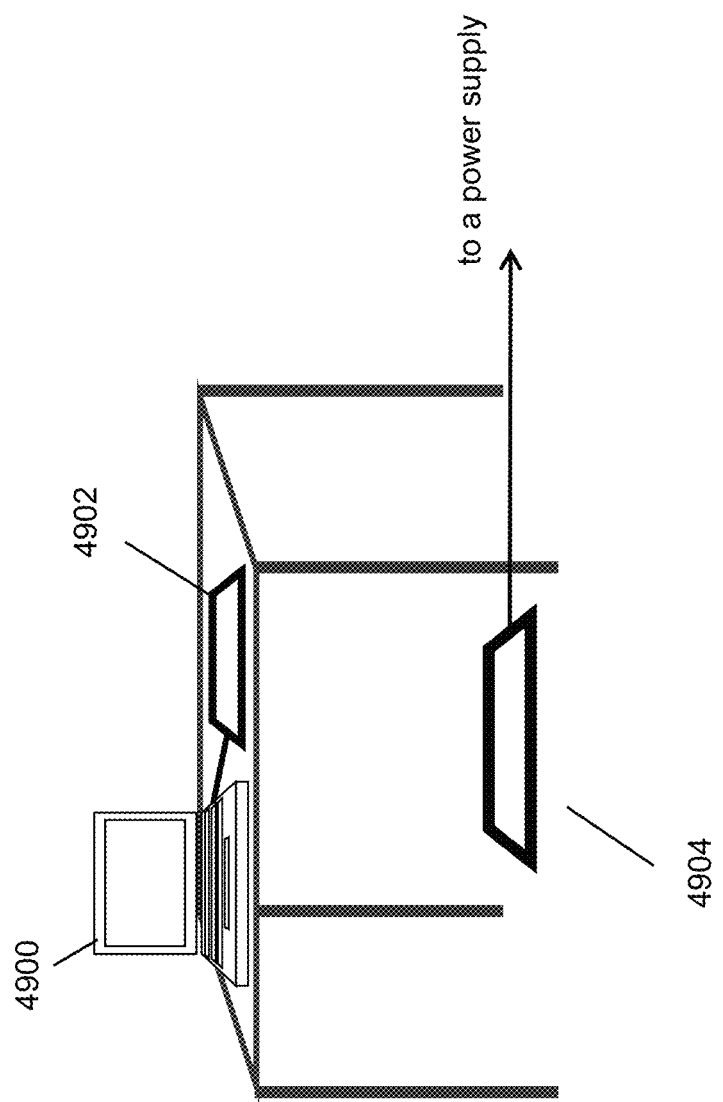

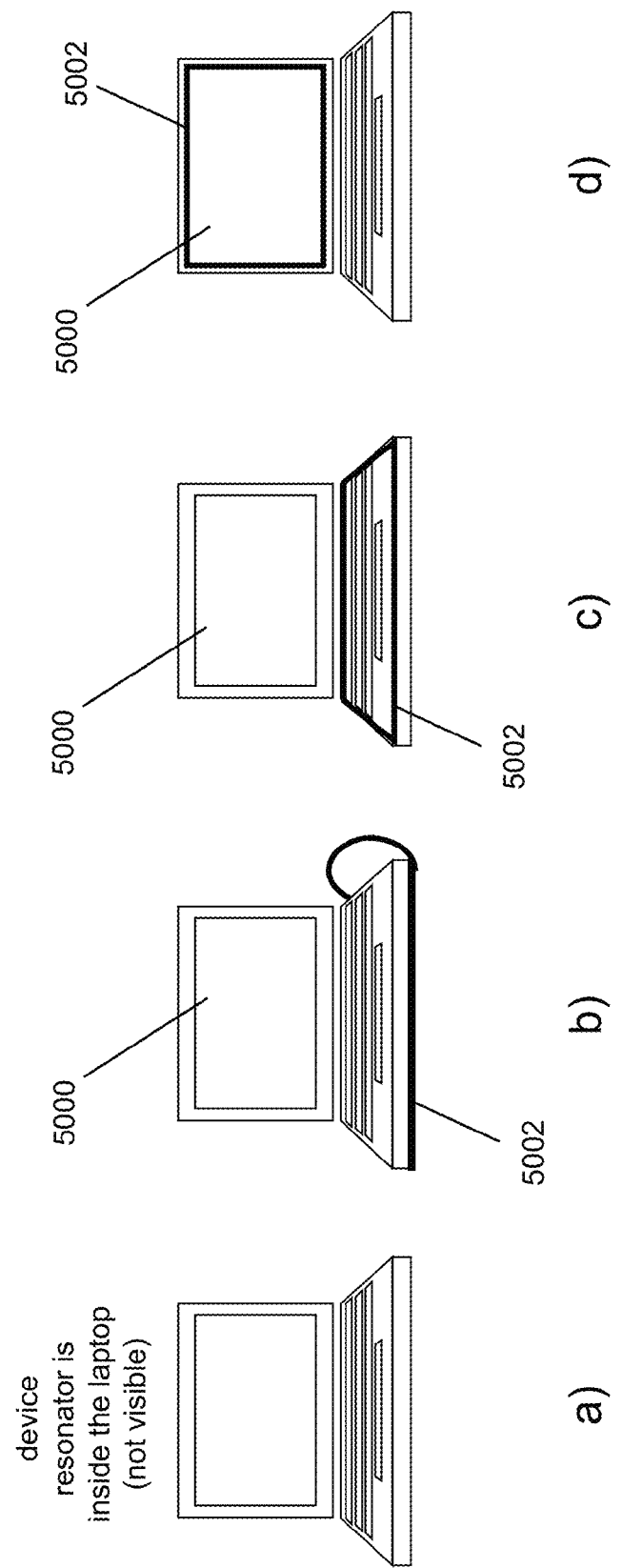

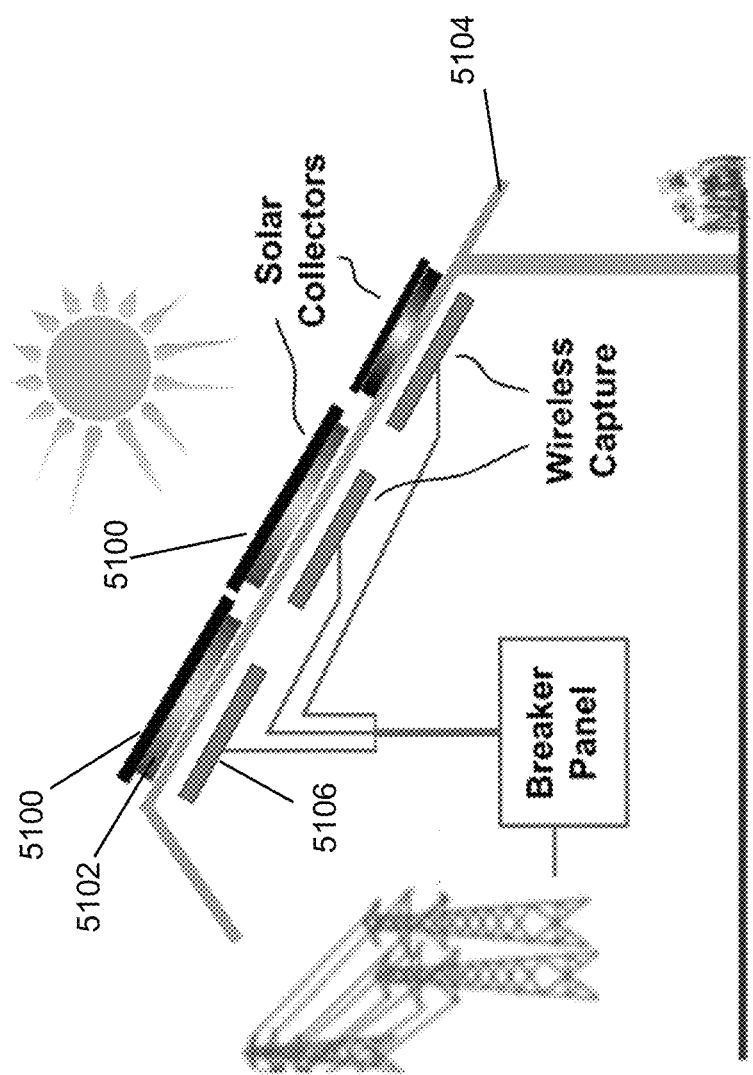

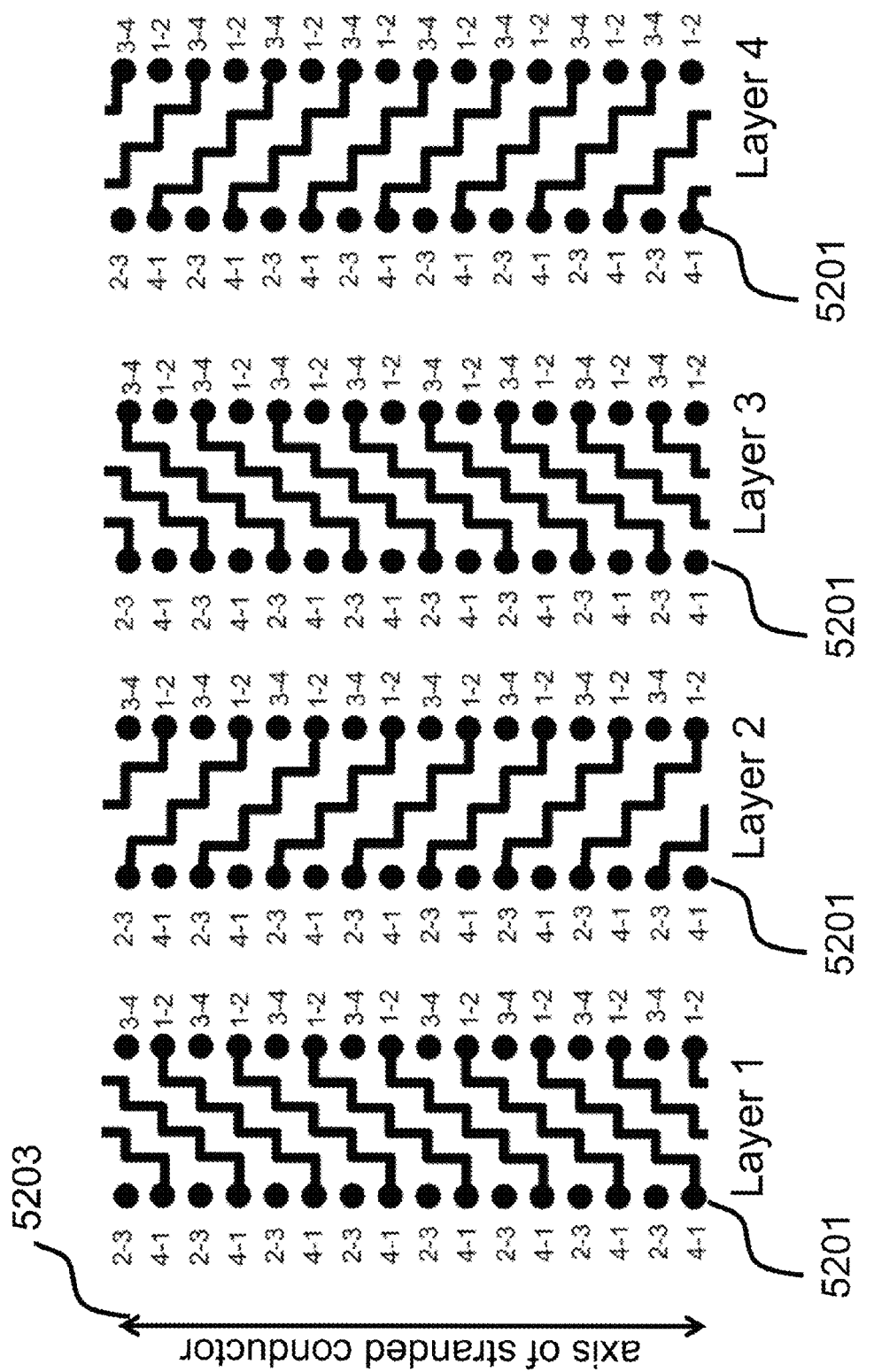

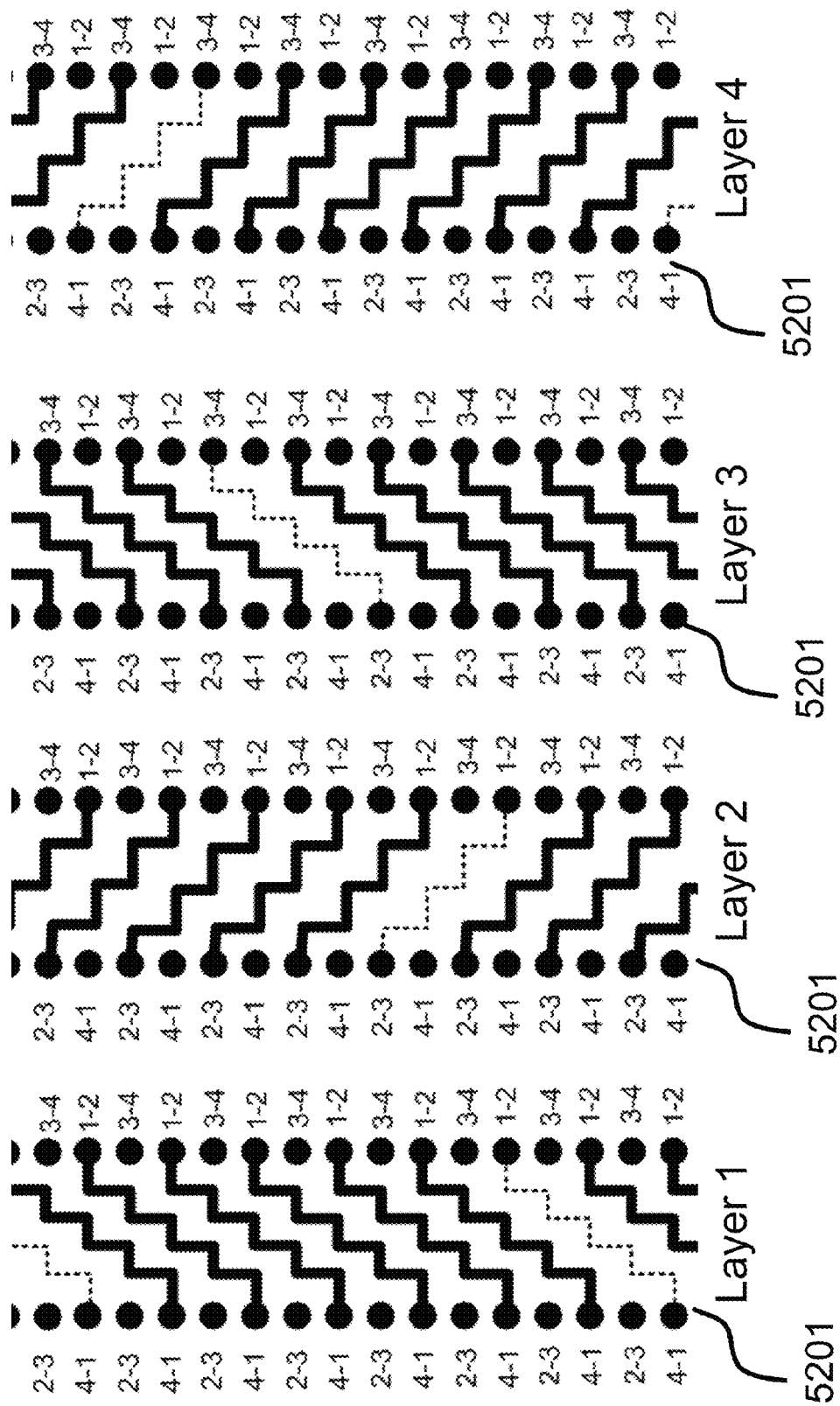

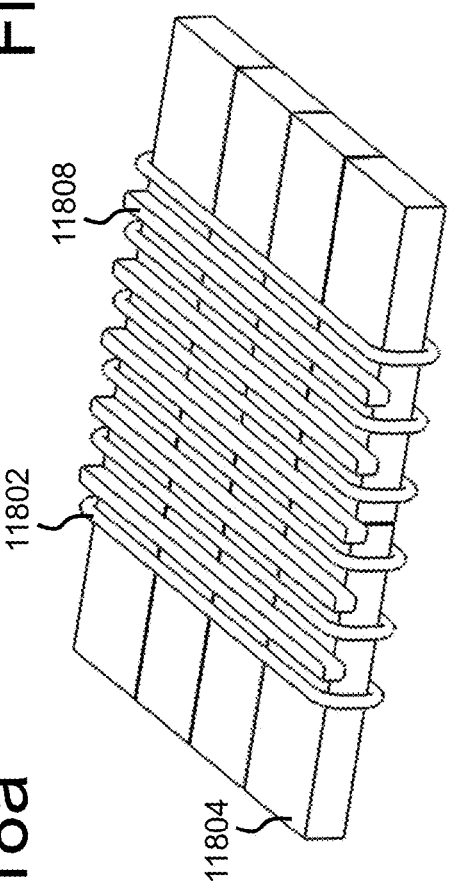
Fig. 118b
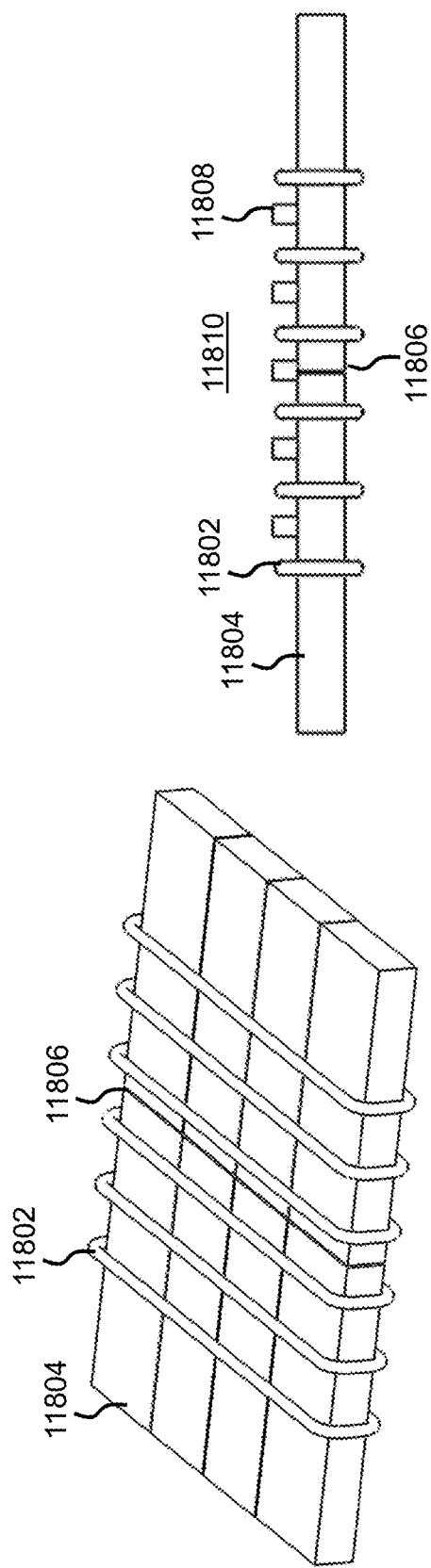
Fig. 118c
Fig. 118a

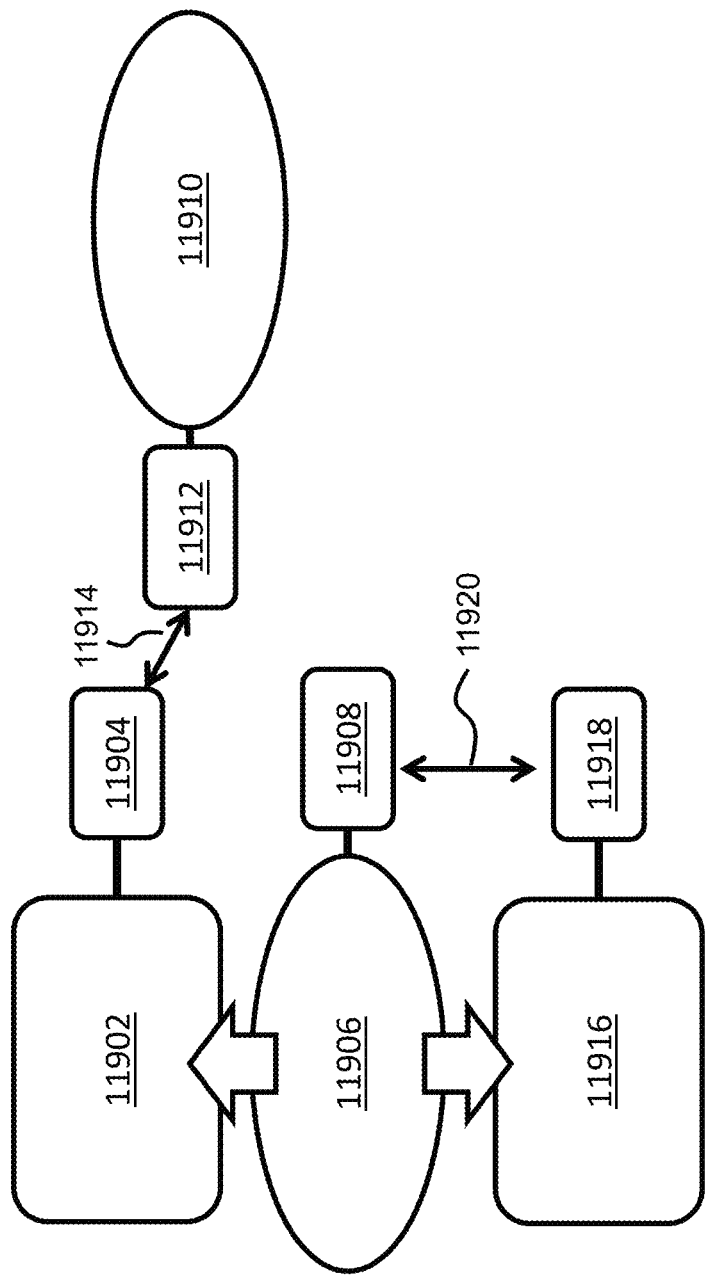

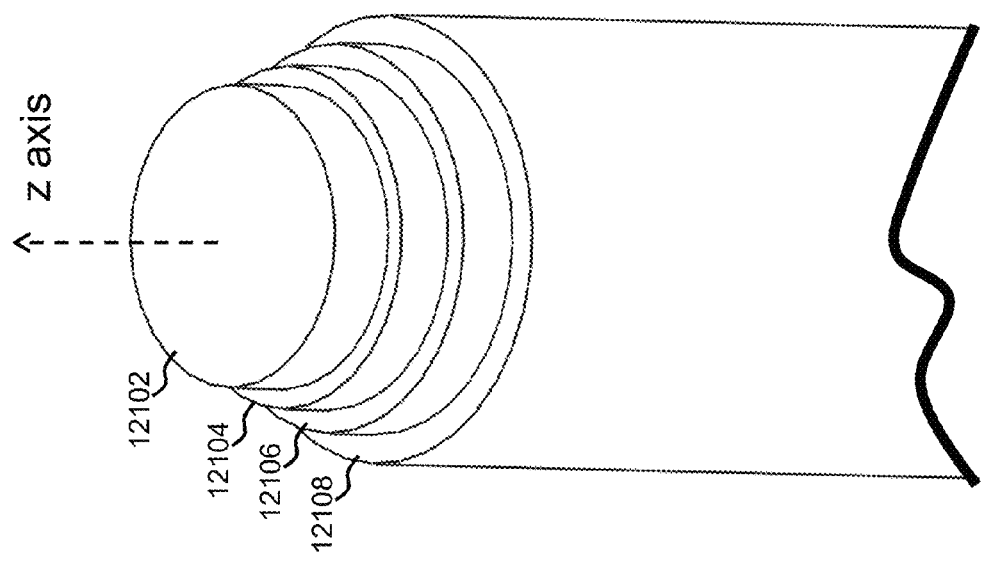

SECURE WIRELESS ENERGY TRANSFER

CROSS-REFERENCE TO RELATED APPLICATIONS

This application is a continuation application of (and claims the benefit of priority to) U.S. Ser. No. 13/288,589, which is a continuation-in-part of U.S. Ser. No. 13/232,868 filed Sep. 14, 2011.

The U.S. Ser. No. 13/288,589 application is a continuation-in-part of U.S. Ser. No. 12/899,281 filed Oct. 6, 2010.

The U.S. Ser. No. 13/288,589 application is a continuation-in-part of U.S. Ser. No. 12/860,375 filed Oct. 20, 2010.

The U.S. Ser. No. 13/288,589 application is a continuation-in-part of U.S. Ser. No. 12/722,050 filed Mar. 11, 2010.

The U.S. Ser. No. 13/288,589 application is a continuation-in-part of U.S. Ser. No. 12/612,880 filed Nov. 5, 2009.

The U.S. Ser. No. 13/288,589 application claims the benefit of U.S. Provisional patent application 61/523,998 filed Aug. 16, 2011.

The Ser. No. 12/722,050 application is a continuation-in-part of U.S. Ser. No. 12/698,523 filed Feb. 2, 2010 which claims the benefit of U.S. Provisional patent application 61/254,559 filed Oct. 23, 2009. The Ser. No. 12/698,523 application is a continuation-in-part of U.S. Ser. No. 12/567,716 filed Sep. 25, 2009.

The Ser. No. 12/612,880 application is a continuation-in-part of U.S. Ser. No. 12/567,716 filed Sep. 25, 2009 and claims the benefit of U.S. Provisional App. No. 61/254,559 filed Oct. 23, 2009.

The Ser. No. 12/899,281 application is a continuation-in-part of U.S. Ser. No. 12/770,137 filed Apr. 29, 2010, a continuation-in-part of U.S. Ser. No. 12/721,118 filed, Mar. 10, 2010, a continuation-in-part of U.S. Ser. No. 12/613,686 filed Nov. 6, 2009.

The Ser. No. 12/613,686 application is a continuation of U.S. application Ser. No. 12/567,716 filed Sep. 25, 2009.

The Ser. No. 13/232,868 application claims the benefit of U.S. Provisional Appl. No. 61/382,806 filed Sep. 14, 2010.

The Ser. No. 13/232,868 application is a continuation-in-part of U.S. Ser. No. 13/222,915 filed Aug. 31, 2011 which claims the benefit of U.S. Provisional Appl. No. 61/378,600 filed Aug. 31, 2010 and U.S. Provisional Appl. No. 61/411,490 filed Nov. 9, 2010.

The Ser. No. 13/222,915 application is a continuation-in-part of U.S. Ser. No. 13/154,131 filed Jun. 6, 2011 which claims the benefit of U.S. Provisional Appl. No. 61/351,492 filed Jun. 4, 2010.

The Ser. No. 13/154,131 application is a continuation-in-part of U.S. Ser. No. 13/090,369 filed Apr. 20, 2011 which claims the benefit of U.S. Provisional Appl. No. 61/326,051 filed Apr. 20, 2010.

The Ser. No. 13/090,369 application is a continuation-in-part of U.S. patent application Ser. No. 13/021,965 filed Feb. 7, 2011 which is a continuation-in-part of U.S. patent application Ser. No. 12/986,018 filed Jan. 6, 2011, which claims the benefit of U.S. Provisional Appl. No. 61/292,768 filed Jan. 6, 2010.

The Ser. No. 13/154,131 application is also a continuation-in-part of U.S. patent application Ser. No. 12/986,018 filed Jan. 6, 2011 which claims the benefit of U.S. Provisional Appl. No. U.S. 61/292,768 filed Jan. 6, 2010.

The Ser. No. 12/986,018 application is a continuation-in-part of U.S. patent application Ser. No. 12/789,611 filed May 28, 2010.

The Ser. No. 12/789,611 application is a continuation-in-part of U.S. patent application Ser. No. 12/770,137 filed Apr. 29, 2010 which claims the benefit of U.S. Provisional Application No. 61/173,747 filed Apr. 29, 2009.

The Ser. No. 12/770,137 application is a continuation-in-part of U.S. application Ser. No. 12/767,633 filed Apr. 26, 2010, which claims the benefit of U.S. Provisional Application No. 61/172,633 filed Apr. 24, 2009.

Application Ser. No. 12/767,633 is a continuation-in-part of U.S. application Ser. No. 12/759,047 filed Apr. 13, 2010.

Application Ser. No. 12/860,375 is a continuation-in-part of U.S. application Ser. No. 12/759,047 filed Apr. 13, 2010.

Application Ser. No. 12/759,047 is a continuation-in-part of U.S. application Ser. No. 12/757,716 filed Apr. 9, 2010, which is a continuation-in-part of U.S. application Ser. No. 12/749,571 filed Mar. 30, 2010.

The Ser. No. 12/749,571 application is a continuation-in-part of the following U.S. applications: U.S. application Ser. No. 12/639,489 filed Dec. 16, 2009; U.S. application Ser. No. 12/647,705 filed Dec. 28, 2009, and U.S. application Ser. No. 12/567,716 filed Sep. 25, 2009.

U.S. application Ser. No. 12/567,716 claims the benefit of the following U.S. Provisional patent applications: U.S. App. No. 61/100,721 filed Sep. 27, 2008; U.S. App. No. 61/108,743 filed Oct. 27, 2008; U.S. App. No. 61/147,386 filed Jan. 26, 2009; U.S. App. No. 61/152,086 filed Feb. 12, 2009; U.S. App. No. 61/178,508 filed May 15, 2009; U.S. App. No. 61/182,768 filed Jun. 1, 2009; U.S. App. No. 61/121,159 filed Dec. 9, 2008; U.S. App. No. 61/142,977 filed Jan. 7, 2009; U.S. App. No. 61/142,885 filed Jan. 6, 2009; U.S. App. No. 61/142,796 filed Jan. 6, 2009; U.S. App. No. 61/142,889 filed Jan. 6, 2009; U.S. App. No. 61/142,880 filed Jan. 6, 2009; U.S. App. No. 61/142,818 filed Jan. 6, 2009; U.S. App. No. 61/142,887 filed Jan. 6, 2009; U.S. Provisional Application No. 61/152,390 filed Feb. 13, 2009; U.S. App. No. 61/156,764 filed Mar. 2, 2009; U.S. App. No. 61/143,058 filed Jan. 7, 2009; U.S. App. No. 61/163,695 filed Mar. 26, 2009; U.S. App. No. 61/172,633 filed Apr. 24, 2009; U.S. App. No. 61/169,240 filed Apr. 14, 2009, U.S. App. No. 61/173,747 filed Apr. 29, 2009.

The Ser. No. 12/757,716 application is a continuation-in-part of U.S. application Ser. No. 12/721,118 filed Mar. 10, 2010.

The Ser. No. 12/721,118 application is a continuation-in-part of U.S. application Ser. No. 12/705,582 filed Feb. 13, 2010.

The Ser. No. 12/705,582 application claims the benefit of U.S. Provisional Application No. 61/152,390 filed Feb. 13, 2009.

Each of the foregoing applications is incorporated herein by reference in its entirety.

BACKGROUND

Field

This disclosure relates to wireless energy transfer, also referred to as wireless power transmission.

Description of the Related Art

Energy or power may be transferred wirelessly using a variety of known radiative, or far-field, and non-radiative, or near-field, techniques. For example, radiative wireless information transfer using low-directionality antennas, such as those used in radio and cellular communications systems and home computer networks, may be considered wireless energy transfer. However, this type of radiative transfer is very inefficient because only a tiny portion of the supplied or radiated power, namely, that portion in the direction of, and overlapping with, the receiver is picked up. The vast majority of the power is radiated away in all the other directions and lost in free space. Such inefficient power transfer may be acceptable for data transmission, but is not practical for transferring useful amounts of electrical energy for the purpose of doing work, such as for powering or charging electrical devices. One way to improve the transfer efficiency of some radiative energy transfer schemes is to use directional antennas to confine and preferentially direct the radiated energy towards a receiver. However, these directed radiation schemes may require an uninterruptible line-of-sight and potentially complicated tracking and steering mechanisms in the case of mobile transmitters and/or receivers. In addition, such schemes may pose hazards to objects or people that cross or intersect the beam when modest to high amounts of power are being transmitted. A known non-radiative, or near-field, wireless energy transfer scheme, often referred to as either induction or traditional induction, does not (intentionally) radiate power, but uses an oscillating current passing through a primary coil, to generate an oscillating magnetic near-field that induces currents in a near-by receiving or secondary coil. Traditional induction schemes have demonstrated the transmission of modest to large amounts of power, however only over very short distances, and with very small offset tolerances between the primary power supply unit and the secondary receiver unit. Electric transformers and proximity chargers are examples of devices that utilize this known short range, near-field energy transfer scheme.

Therefore a need exists for a wireless power transfer scheme that is capable of transferring useful amounts of electrical power over mid-range distances or alignment offsets. Such a wireless power transfer scheme should enable useful energy transfer over greater distances and alignment offsets than those realized with traditional induction schemes, but without the limitations and risks inherent in radiative transmission schemes.

SUMMARY

There is disclosed herein a non-radiative or near-field wireless energy transfer scheme that is capable of transmitting useful amounts of power over mid-range distances and alignment offsets. This inventive technique uses coupled electromagnetic resonators with long-lived oscillatory resonant modes to transfer power from a power supply to a power drain. The technique is general and may be applied to a wide range of resonators, even where the specific examples disclosed herein relate to electromagnetic resonators. If the resonators are designed such that the energy stored by the electric field is primarily confined within the structure and that the energy stored by the magnetic field is primarily in the region surrounding the resonator. Then, the energy exchange is mediated primarily by the resonant magnetic near-field. These types of resonators may be referred to as magnetic resonators. If the resonators are designed such that the energy stored by the magnetic field is primarily confined within the structure and that the energy stored by the electric field is primarily in the region surrounding the resonator. Then, the energy exchange is mediated primarily by the resonant electric near-field. These types of resonators may be referred to as electric resonators. Either type of resonator may also be referred to as an electromagnetic resonator. Both types of resonators are disclosed herein.

The omni-directional but stationary (non-lossy) nature of the near-fields of the resonators we disclose enables efficient wireless energy transfer over mid-range distances, over a wide range of directions and resonator orientations, suitable for charging, powering, or simultaneously powering and charging a variety of electronic devices. As a result, a system may have a wide variety of possible applications where a first resonator, connected to a power source, is in one location, and a second resonator, potentially connected to electrical/electronic devices, batteries, powering or charging circuits, and the like, is at a second location, and where the distance from the first resonator to the second resonator is on the order of centimeters to meters. For example, a first resonator connected to the wired electricity grid could be placed on the ceiling of a room, while other resonators connected to devices, such as robots, vehicles, computers, communication devices, medical devices, and the like, move about within the room, and where these devices are constantly or intermittently receiving power wirelessly from the source resonator. From this one example, one can imagine many applications where the systems and methods disclosed herein could provide wireless power across mid-range distances, including consumer electronics, industrial applications, infrastructure power and lighting, transportation vehicles, electronic games, military applications, and the like.

Energy exchange between two electromagnetic resonators can be optimized when the resonators are tuned to substantially the same frequency and when the losses in the system are minimal. Wireless energy transfer systems may be designed so that the "coupling-time" between resonators is much shorter than the resonators' "loss-times". Therefore, the systems and methods described herein may utilize high quality factor (high-Q) resonators with low intrinsic-loss rates. In addition, the systems and methods described herein may use sub-wavelength resonators with near-fields that extend significantly longer than the characteristic sizes of the resonators, so that the near-fields of the resonators that exchange energy overlap at mid-range distances. This is a regime of operation that has not been practiced before and that differs significantly from traditional induction designs.

It is important to appreciate the difference between the high-magnetic resonator scheme disclosed here and the known close-range or proximity inductive schemes, namely, that those known schemes do not conventionally utilize high-Q resonators. Using coupled-mode theory (CMT), (see, for example, *Waves and Fields in Optoelectronics*, H. A. Haus, Prentice Hall, 1984), one may show that a high-Q resonator-coupling mechanism can enable orders of magnitude more efficient power delivery between resonators spaced by mid-range distances than is enabled by traditional inductive schemes. Coupled high-Q resonators have demonstrated efficient energy transfer over mid-range distances and improved efficiencies and offset tolerances in short range energy transfer applications.

The systems and methods described herein may provide for near-field wireless energy transfer via strongly coupled high-Q resonators, a technique with the potential to transfer power levels from picowatts to kilowatts, safely, and over distances much larger than have been achieved using traditional induction techniques. Efficient energy transfer may be realized for a variety of general systems of strongly coupled resonators, such as systems of strongly coupled acoustic resonators, nuclear resonators, mechanical resonators, and the like, as originally described by researchers at M.I.T. in their publications, "Efficient wireless non-radiative mid-range energy transfer", *Annals of Physics*, vol. 323, Issue 1, p. 34 (2008) and "Wireless Power Transfer via Strongly Coupled Magnetic Resonances", *Science*, vol. 317, no. 5834, p. 83, (2007). Disclosed herein are electromagnetic resonators and systems of coupled electromagnetic resonators, also referred to more specifically as coupled magnetic resonators and coupled electric resonators, with operating frequencies below 10 GHz.

This disclosure describes wireless energy transfer technologies, also referred to as wireless power transmission technologies. Throughout this disclosure, we may use the terms wireless energy transfer, wireless power transfer, wireless power transmission, and the like, interchangeably. We may refer to supplying energy or power from a source, an AC or DC source, a battery, a source resonator, a power supply, a generator, a solar panel, and thermal collector, and the like, to a device, a remote device, to multiple remote devices, to a device resonator or resonators, and the like. We may describe intermediate resonators that extend the range of the wireless energy transfer system by allowing energy to hop, transfer through, be temporarily stored, be partially dissipated, or for the transfer to be mediated in any way, from a source resonator to any combination of other device and intermediate resonators, so that energy transfer networks, or strings, or extended paths may be realized. Device resonators may receive energy from a source resonator, convert a portion of that energy to electric power for powering or charging a device, and simultaneously pass a portion of the received energy onto other device or mobile device resonators. Energy may be transferred from a source resonator to multiple device resonators, significantly extending the distance over which energy may be wirelessly transferred. The wireless power transmission systems may be implemented using a variety of system architectures and resonator designs. The systems may include a single source or multiple sources transmitting power to a single device or multiple devices. The resonators may be designed to be source or device resonators, or they may be designed to be repeaters. In some cases, a resonator may be a device and source resonator simultaneously, or it may be switched from operating as a source to operating as a device or a repeater. One skilled in the art will understand that a variety of system architectures may be supported by the wide range of resonator designs and functionalities described in this application.

In the wireless energy transfer systems we describe, remote devices may be powered directly, using the wirelessly supplied power or energy, or the devices may be coupled to an energy storage unit such as a battery, a super-capacitor, an ultra-capacitor, or the like (or other kind of power drain), where the energy storage unit may be charged or re-charged wirelessly, and/or where the wireless power transfer mechanism is simply supplementary to the main power source of the device. The devices may be powered by hybrid battery/energy storage devices such as batteries with integrated storage capacitors and the like. Furthermore, novel battery and energy storage devices may be designed to take advantage of the operational improvements enabled by wireless power transmission systems.

Other power management scenarios include using wirelessly supplied power to recharge batteries or charge energy storage units while the devices they power are turned off, in an idle state, in a sleep mode, and the like. Batteries or energy storage units may be charged or recharged at high (fast) or low (slow) rates. Batteries or energy storage units may be trickle charged or float charged. Multiple devices may be charged or powered simultaneously in parallel or power delivery to multiple devices may be serialized such that one or more devices receive power for a period of time after which power delivery is switched to other devices. Multiple devices may share power from one or more sources with one or more other devices either simultaneously, or in a time multiplexed manner, or in a frequency multiplexed manner, or in a spatially multiplexed manner, or in an orientation multiplexed manner, or in any combination of time and frequency and spatial and orientation multiplexing. Multiple devices may share power with each other, with at least one device being reconfigured continuously, intermittently, periodically, occasionally, or temporarily, to operate as wireless power sources. It would be understood by one of ordinary skill in the art that there are a variety of ways to power and/or charge devices, and the variety of ways could be applied to the technologies and applications described herein.

Wireless energy transfer has a variety of possible applications including for example, placing a source (e.g. one connected to the wired electricity grid) on the ceiling, under the floor, or in the walls of a room, while devices such as robots, vehicles, computers, PDAs or similar are placed or move freely within the room. Other applications may include powering or recharging electric-engine vehicles, such as buses and/or hybrid cars and medical devices, such as wearable or implantable devices. Additional example applications include the ability to power or recharge autonomous electronics (e.g. laptops, cell-phones, portable music players, household robots, GPS navigation systems, displays, etc), sensors, industrial and manufacturing equipment, medical devices and monitors, home appliances and tools (e.g. lights, fans, drills, saws, heaters, displays, televisions, counter-top appliances, etc.), military devices, heated or illuminated clothing, communications and navigation equipment, including equipment built into vehicles, clothing and protective-wear such as helmets, body armor and vests, and the like, and the ability to transmit power to physically isolated devices such as to implanted medical devices, to hidden, buried, implanted or embedded sensors or tags, to and/or from roof-top solar panels to indoor distribution panels, and the like.

In one aspect, disclosed herein is a system including a source resonator having a Q-factor $Q_1$ and a characteristic size $x_1$, coupled to a power generator with direct electrical connections; and a second resonator having a Q-factor $Q_2$ and a characteristic size $x_2$, coupled to a load with direct electrical connections, and located a distance D from the source resonator, wherein the source resonator and the second resonator are coupled to exchange energy wirelessly among the source resonator and the second resonator in order to transmit power from the power generator to the load, and wherein $\sqrt{Q_1 Q_2}$ is greater than 100.

$Q_1$ may be greater than 100 and $Q_2$ may be less than 100. $Q_1$ may be greater than 100 and $Q_2$ may be greater than 100. A useful energy exchange may be maintained over an operating distance from 0 to D, where D is larger than the smaller of $x_1$ and $x_2$. At least one of the source resonator and the second resonator may be a coil of at least one turn of a conducting material connected to a first network of capacitors. The first network of capacitors may include at least one tunable capacitor. The direct electrical connections of at least one of the source resonator to the ground terminal of the power generator and the second resonator to the ground terminal of the load may be made at a point on an axis of electrical symmetry of the first network of capacitors. The first network of capacitors may include at least one tunable butterfly-type capacitor, wherein the direct electrical connection to the ground terminal is made on a center terminal of the at least one tunable butterfly-type capacitor. The direct electrical connection of at least one of the source resonator to the power generator and the second resonator to the load may be made via a second network of capacitors, wherein the first network of capacitors and the second network of capacitors form an impedance matching network. The impedance matching network may be designed to match the coil to a characteristic impedance of the power generator or the load at a driving frequency of the power generator.

At least one of the first network of capacitors and the second network of capacitors may include at least one tunable capacitor. The first network of capacitors and the second network of capacitors may be adjustable to change an impedance of the impedance matching network at a driving frequency of the power generator. The first network of capacitors and the second network of capacitors may be adjustable to match the coil to the characteristic impedance of the power generator or the load at a driving frequency of the power generator. At least one of the first network of capacitors and the second network of capacitors may include at least one fixed capacitor that reduces a voltage across the at least one tunable capacitor. The direct electrical connections of at least one of the source resonator to the power generator and the second resonator to the load may be configured to substantially preserve a resonant mode. At least one of the source resonator and the second resonator may be a tunable resonator. The source resonator may be physically separated from the power generator and the second resonator may be physically separated from the load. The second resonator may be coupled to a power conversion circuit to deliver DC power to the load. The second resonator may be coupled to a power conversion circuit to deliver AC power to the load. The second resonator may be coupled to a power conversion circuit to deliver both AC and DC power to the load. The second resonator may be coupled to a power conversion circuit to deliver power to a plurality of loads.

In another aspect, a system disclosed herein includes a source resonator having a Q-factor $Q_1$ and a characteristic size $x_1$, and a second resonator having a Q-factor $Q_2$ and a characteristic size $x_2$, and located a distance D from the source resonator; wherein the source resonator and the second resonator are coupled to exchange energy wirelessly among the source resonator and the second resonator; and wherein $\sqrt{Q_1 Q_2}$ is greater than 100, and wherein at least one of the resonators is enclosed in a low loss tangent material.

In another aspect, a system disclosed herein includes a source resonator having a Q-factor $Q_1$ and a characteristic size $x_1$, and a second resonator having a Q-factor $Q_2$ and a characteristic size $x_2$, and located a distance D from the source resonator; wherein the source resonator and the second resonator are coupled to exchange energy wirelessly among the source resonator and the second resonator, and wherein $\sqrt{Q_1 Q_2}$ is greater than 100; and wherein at least one of the resonators includes a coil of a plurality of turns of a conducting material connected to a network of capacitors, wherein the plurality of turns are in a common plane, and wherein a characteristic thickness of the at least one of the resonators is much less than a characteristic size of the at least one of the resonators.

Throughout this disclosure we may refer to the certain circuit components such as capacitors, inductors, resistors, diodes, switches and the like as circuit components or elements. We may also refer to series and parallel combinations of these components as elements, networks, topologies, circuits, and the like. We may describe combinations of capacitors, diodes, varactors, transistors, and/or switches as adjustable impedance networks, tuning networks, matching networks, adjusting elements, and the like. We may also refer to "self-resonant" objects that have both capacitance, and inductance distributed (or partially distributed, as opposed to solely lumped) throughout the entire object. It would be understood by one of ordinary skill in the art that adjusting and controlling variable components within a circuit or network may adjust the performance of that circuit or network and that those adjustments may be described generally as tuning, adjusting, matching, correcting, and the like. Other methods to tune or adjust the operating point of the wireless power transfer system may be used alone, or in addition to adjusting tunable components such as inductors and capacitors, or banks of inductors and capacitors.

Unless otherwise defined, all technical and scientific terms used herein have the same meaning as commonly understood by one of ordinary skill in the art to which this disclosure belongs. In case of conflict with publications, patent applications, patents, and other references mentioned or incorporated herein by reference, the present specification, including definitions, will control.

Any of the features described above may be used, alone or in combination, without departing from the scope of this disclosure. Other features, objects, and advantages of the systems and methods disclosed herein will be apparent from the following detailed description and figures.

BRIEF DESCRIPTION OF FIGURES

FIG. 16(a) shows a 3D finite element model of a copper and magnetic material structure driven by a square loop of current around the choke point at its center. In this example, a structure may be composed of two boxes made of a conducting material such as copper, covered by a layer of magnetic material, and connected by a block of magnetic material. The inside of the two conducting boxes in this example would be shielded from AC electromagnetic fields generated outside the boxes and may house lossy objects that might lower the Q of the resonator or sensitive components that might be adversely affected by the AC electromagnetic fields. Also shown are the calculated magnetic field streamlines generated by this structure, indicating that the magnetic field lines tend to follow the lower reluctance path in the magnetic material. FIG. 16(b) shows interaction, as indicated by the calculated magnetic field streamlines, between two identical structures as shown in (a). Because of symmetry, and to reduce computational complexity, only one half of the system is modeled (but the computation assumes the symmetrical arrangement of the other half).

FIG. 26(a) shows an axially symmetric FEM simulation of a thin conducting (copper) cylinder or disk (20 cm in diameter, 2 cm in height) exposed to an initially uniform, externally applied magnetic field (gray flux lines) along the z-axis. The axis of symmetry is at r=0. The magnetic streamlines shown originate at z=−∞, where they are spaced from r=3 cm to r=10 cm in intervals of 1 cm. The axes scales are in meters.

FIG. 28 (b) shows a block diagram of a magnetic resonator that includes a conductor loop inductor and a tunable impedance network. Physical electrical connections to this resonator may be made to the terminal connections.

FIG. 28 (c) depicts a general topology of a matching circuit directly coupled to a high-Q inductive element.

FIG. 28 (d) depicts a general topology of a symmetric matching circuit directly coupled to a high-Q inductive element and driven anti-symmetrically (balanced drive).

FIG. 28 (e) depicts a general topology of a matching circuit directly coupled to a high-Q inductive element and connected to ground at a point of symmetry of the main resonator (unbalanced drive).

FIG. 49 shows a device (laptop computer) being wirelessly powered or charged by a source, where both the source and device resonator are physically separated from, but electrically connected to, the source and device.

FIG. 50 (a) is an illustration of a wirelessly powered or charged laptop application where the device resonator is inside the laptop case and is not visible.

FIG. 50 (b) is an illustration of a wirelessly powered or charged laptop application where the resonator is underneath the laptop base and is electrically connected to the laptop power input by an electrical cable.

FIG. 50 (c) is an illustration of a wirelessly powered or charged laptop application where the resonator is attached to the laptop base.

FIG. 50 (d) is an illustration of a wirelessly powered or charged laptop application where the resonator is attached to the laptop display.

FIG. 51 is a diagram of rooftop PV panels with wireless power transfer.

FIG. 113 shows plots of the effects of changes of parameters of a wireless power source.

FIG. 114 is a simplified circuit diagram of a wireless energy transfer system comprising a wireless power source with a switching amplifier and a wireless power device.

FIG. 115 shows plots of the effects of changes of parameters of a wireless power source.

FIG. 116 is a diagram of a resonator showing possible nonuniform magnetic field distributions due to irregular spacing between tiles of magnetic material.

FIG. 117 is a resonator with an arrangement of tiles in a block of magnetic material that may reduce hotspots in the magnetic material block.

FIG. 118a is a resonator with a block of magnetic material comprising smaller individual tiles and 118b and 118c is the resonator with additional strips of thermally conductive material used for thermal management.

FIG. 119 is block diagram of a wireless energy transfer system with in-band and out-of-band communication channels.

FIG. 120a and FIG. 120b are steps that may be used to verify the energy transfer channel using an out-of-band communication channel.

FIG. 121 is an isometric view of a conductor wire comprising multiple conductor shells.

FIG. 122 is an isometric view of a conductor wire comprising multiple conductor shells.

FIG. 123 is a plot showing the current distributions for a solid conductor wire.

FIG. 124 is a plot showing the current distributions for a conductor wire comprising 25 conductor shells.

Figure 125:
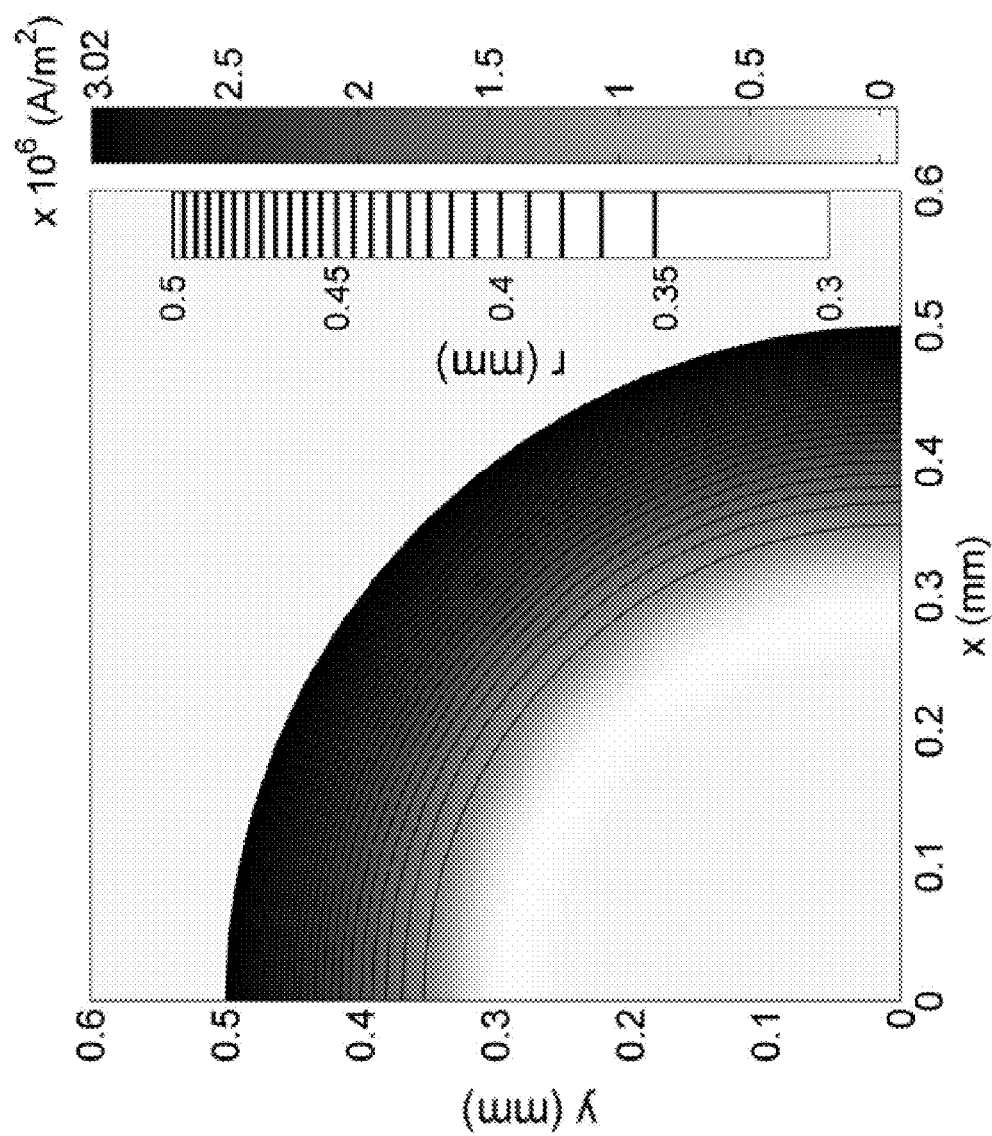

FIG. 125 is a plot showing the current distributions for a conductor wire comprising 25 conductor shells.

Figure 126:
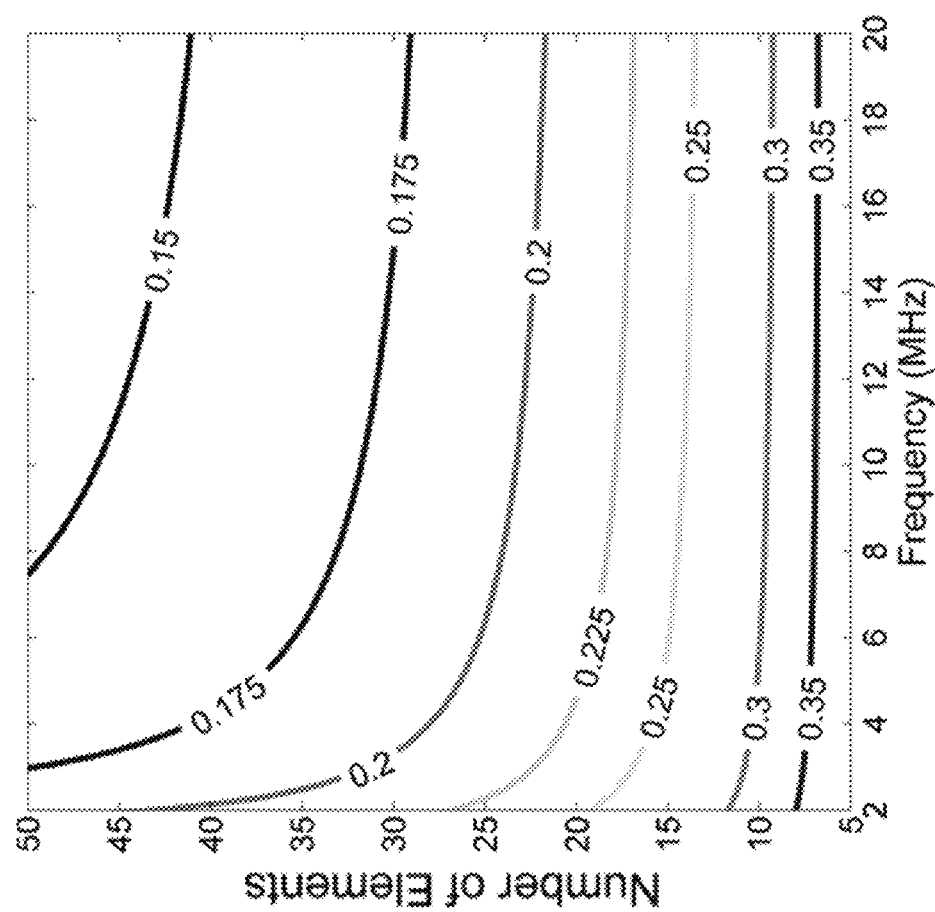

FIG. 126 is plot showing the ratio of the resistance of an optimized conducting-shell structure with overall diameter 1 mm to the AC resistance of a solid conductor of the same diameter.

Figure 127:
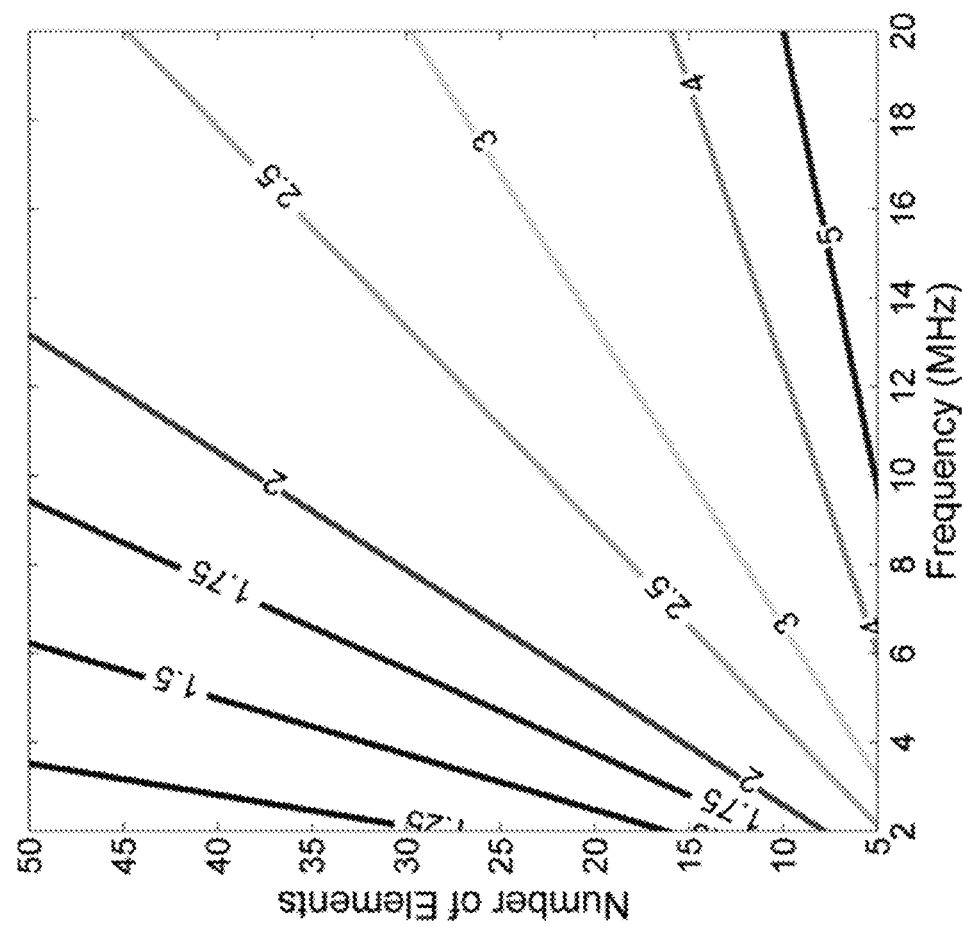

FIG. 127 is plot showing the ratio of the resistance of an optimized conducting-shell structure with overall diameter 1 mm to the DC resistance of the same conductor (21.6 mΩ/m).

Figure 128:
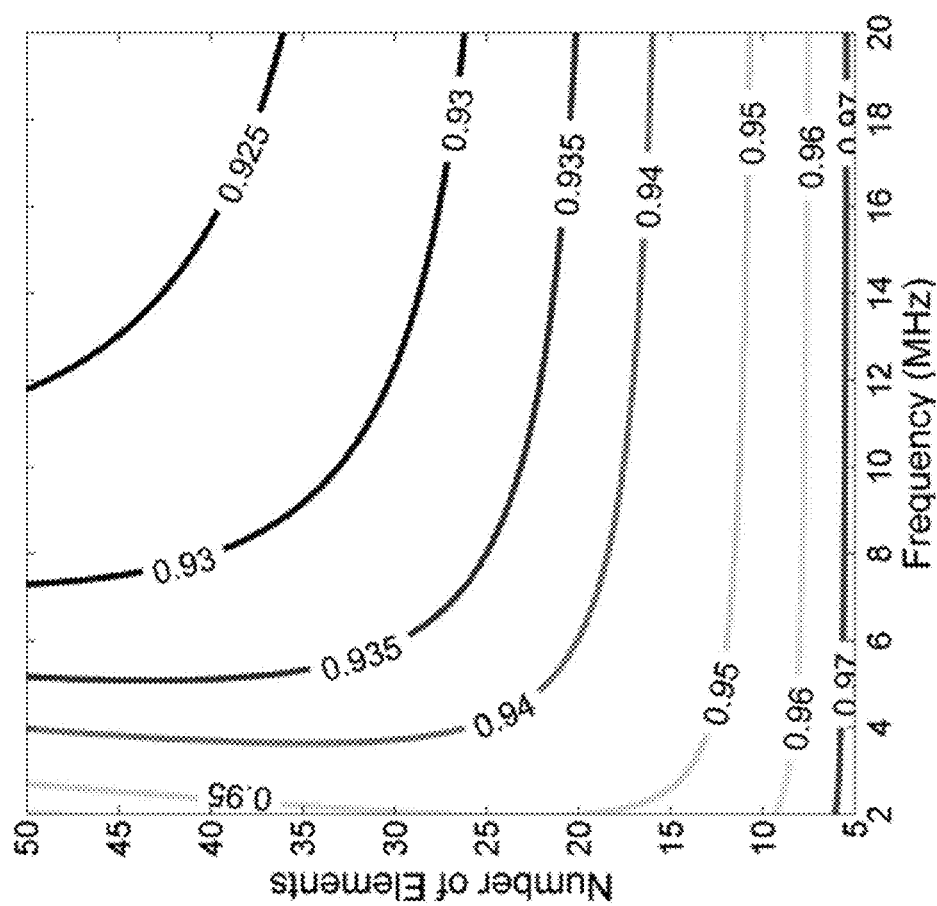

FIG. 128 is plot showing the ratio of the resistance of an optimized conducting-shell structure with overall diameter 1 mm to the resistance with the same number of elements, but with shells of (optimized) uniform thickness around a copper core.

Figure 129B:
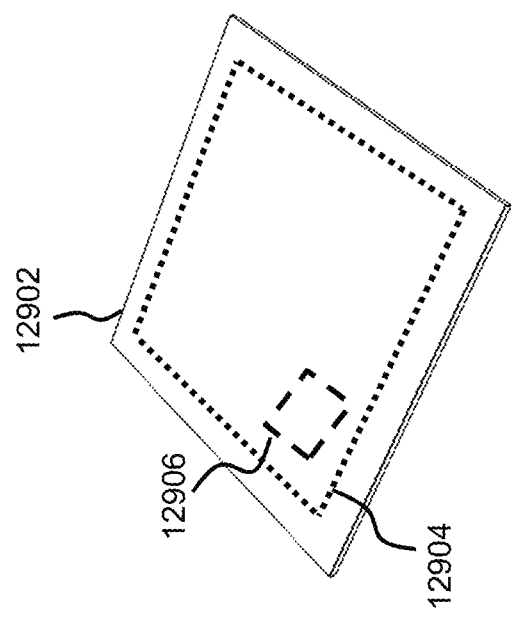
Figure 129A:
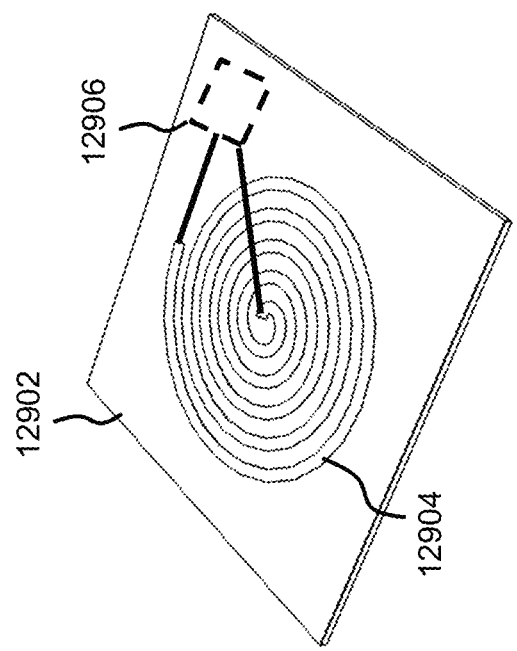

FIG. 129a and FIG. 129b are diagrams of embodiments of a wireless power enabled floor tile.

Figure 130:
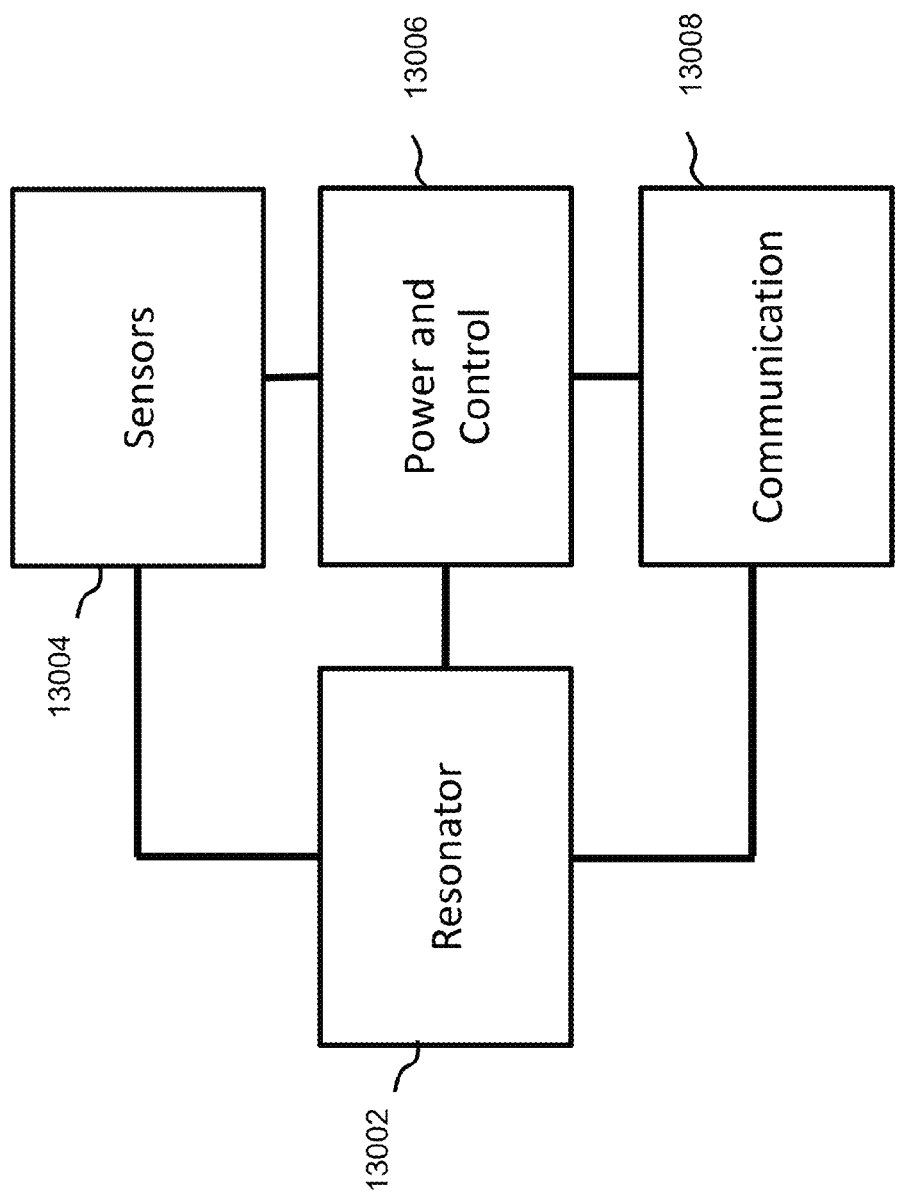

FIG. 130 is a block diagram of an embodiment of a wireless power enabled floor tile.

Figure 131:
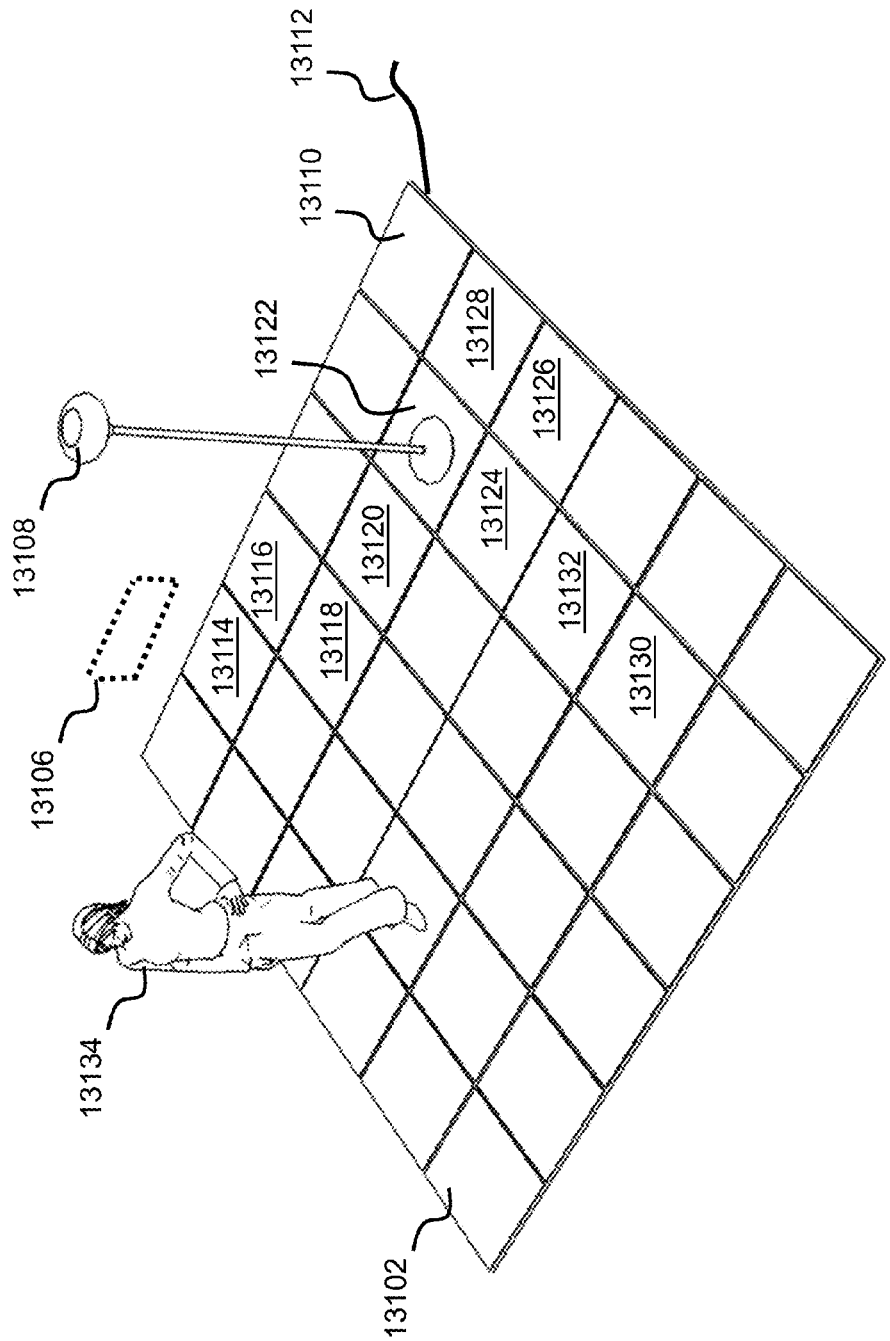

FIG. 131 is diagram of a wireless power enables floor system.

Figure 132:
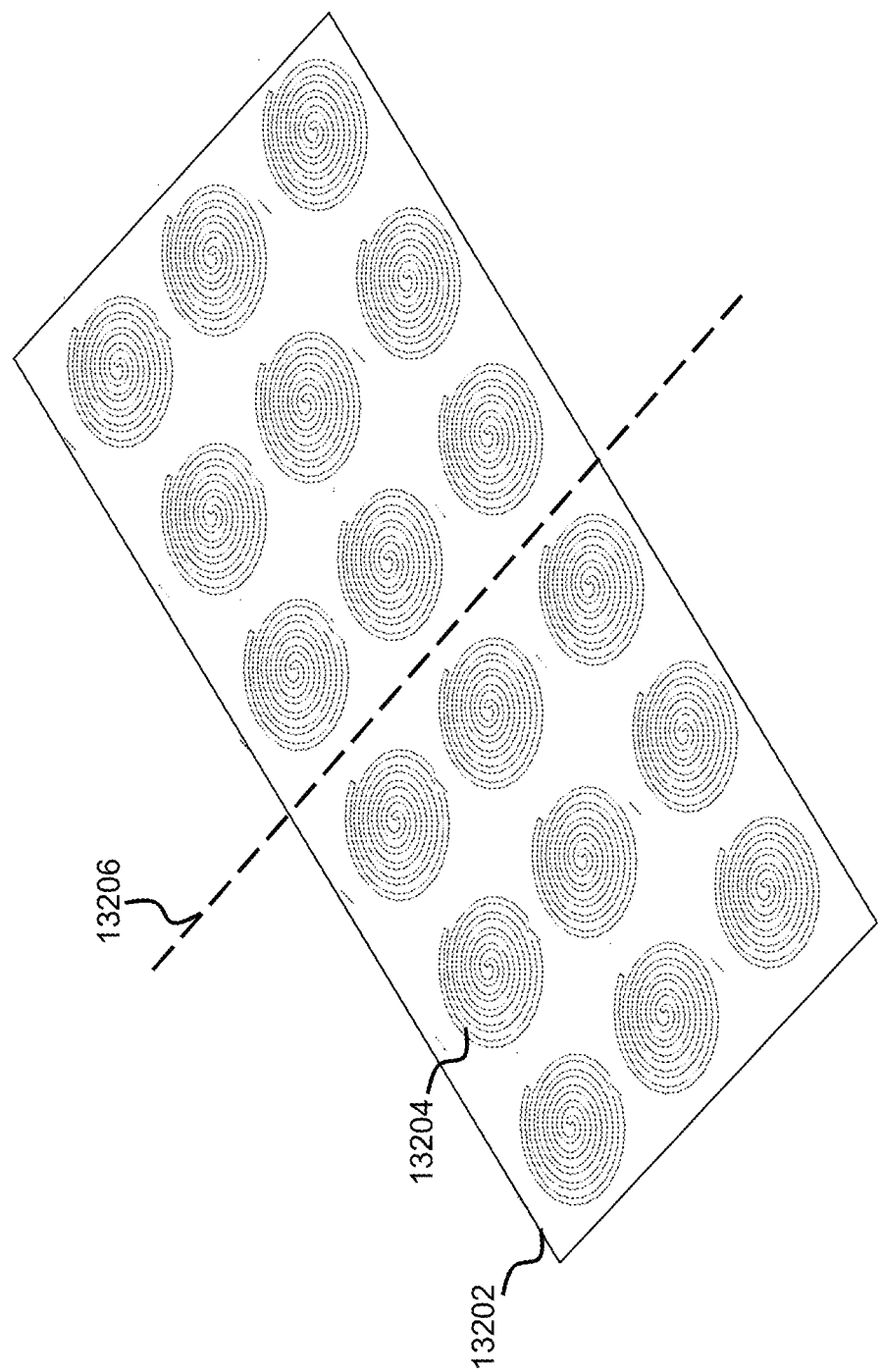

FIG. 132 is diagram of a cuttable sheet of resonators.

Figure 133:
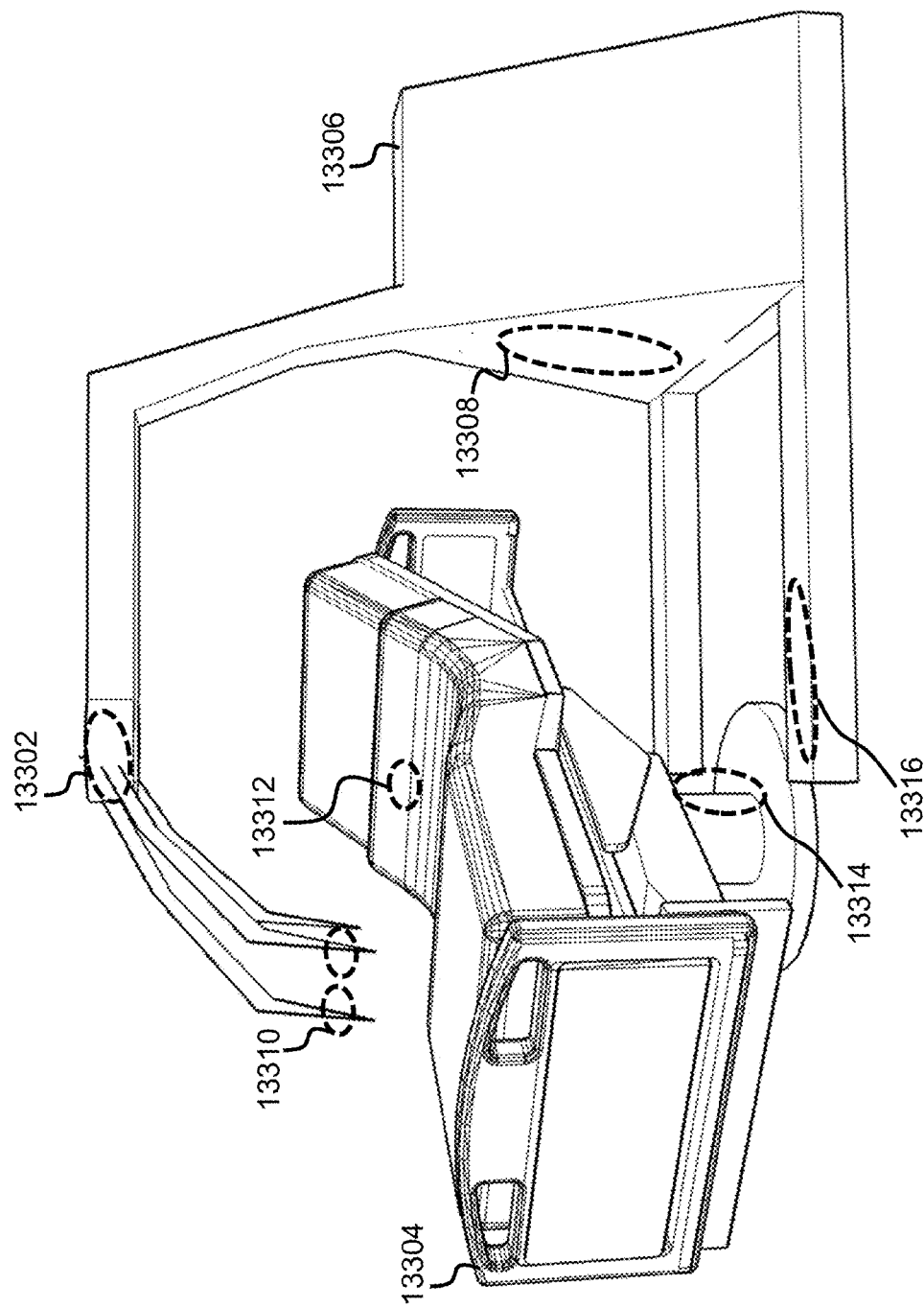

FIG. 133 is an embodiment of a surgical robot and a hospital bed with wireless energy sources and devices.

Figure 134:
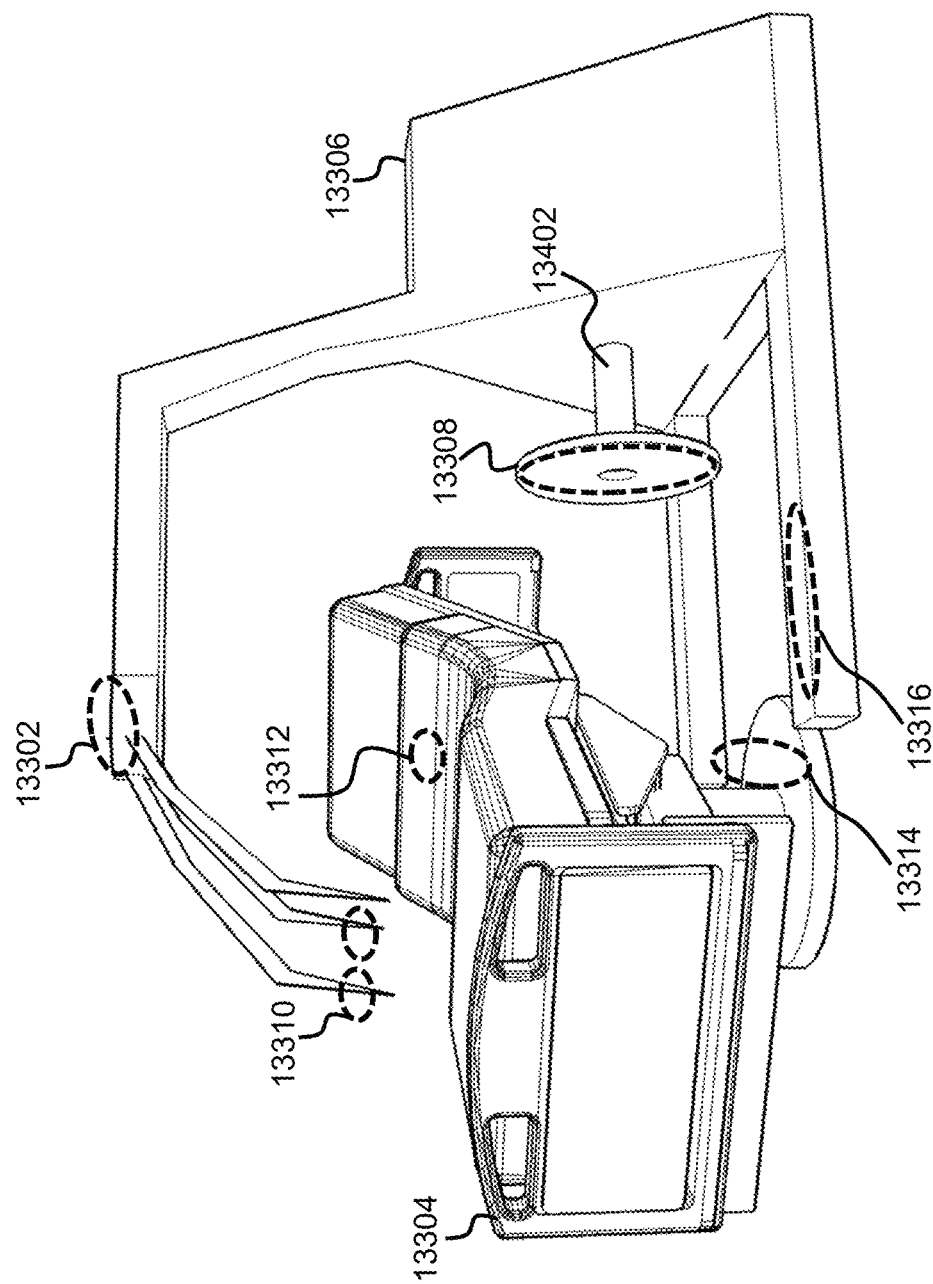

FIG. 134 is an embodiment of a surgical robot and a hospital bed with wireless energy sources and devices.

Figure 135B:
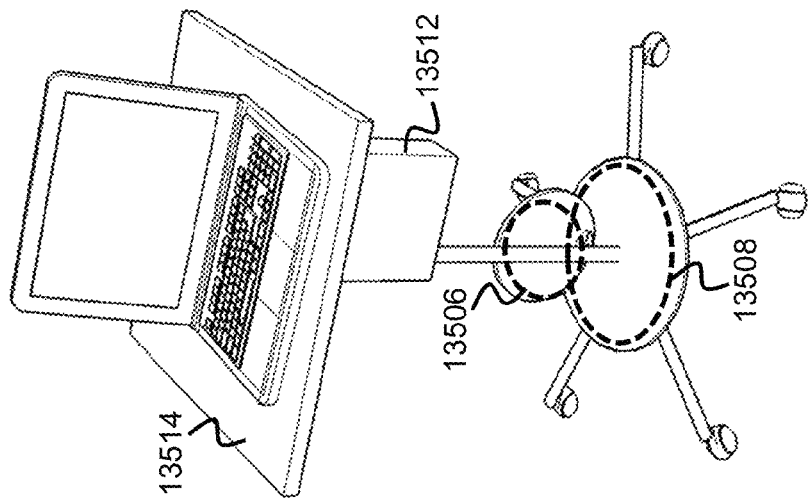
Figure 135A:
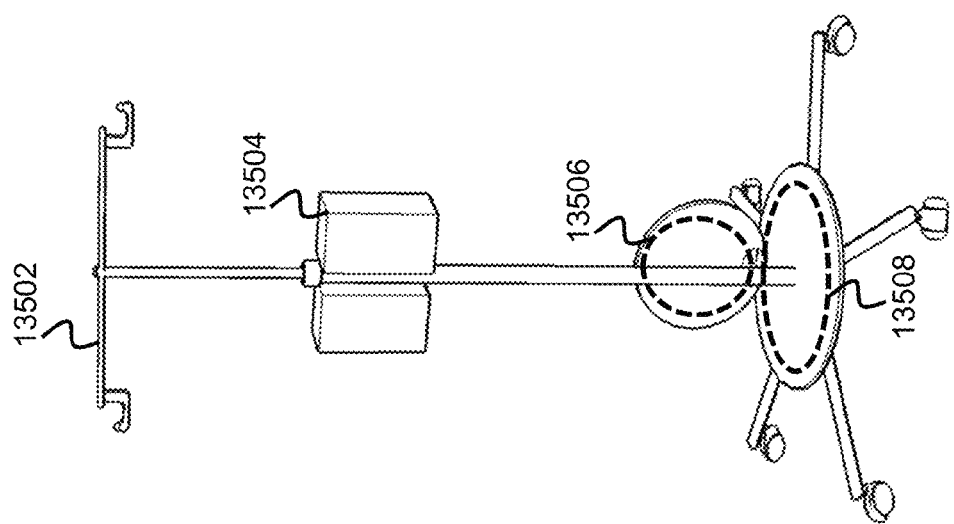

FIG. 135a is a medical cart with a wireless energy transfer resonator. FIG. 135b is a computer cart with a wireless energy transfer resonator.

Figure 136:
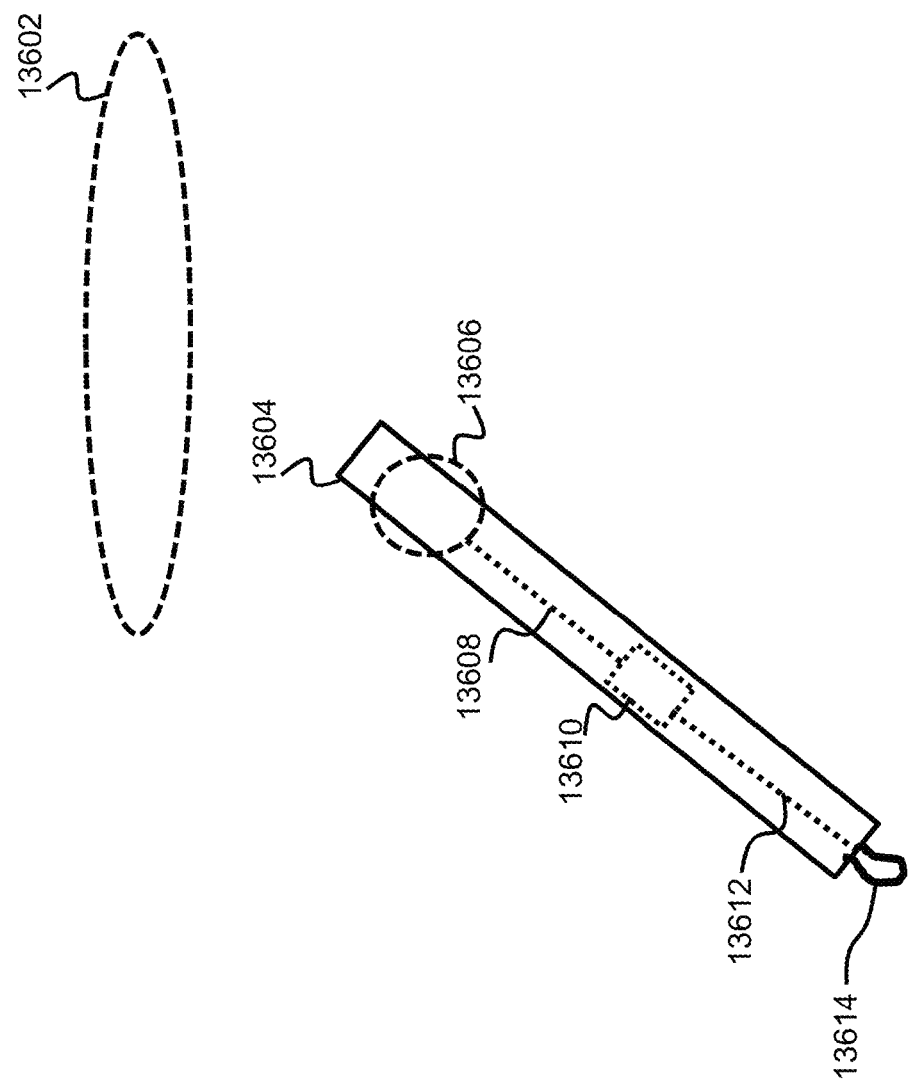

FIG. 136 is block diagrams of a wireless power surgical apparatus.

Figure 137B:
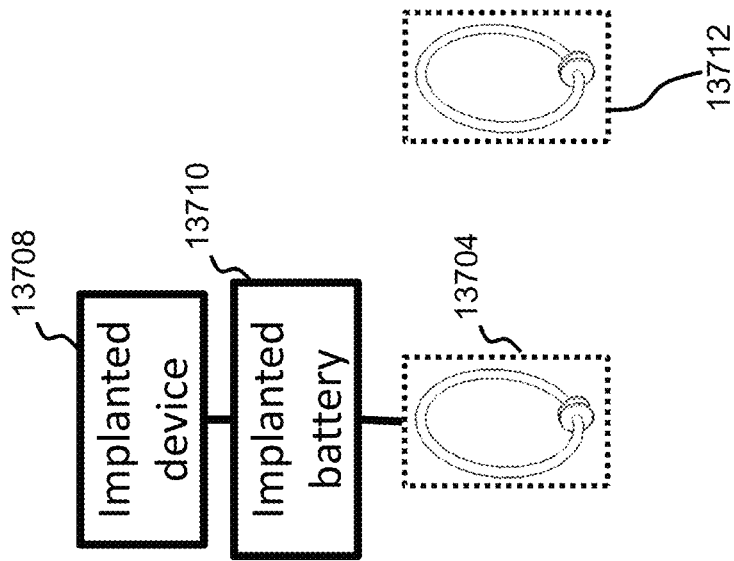
Figure 137A:
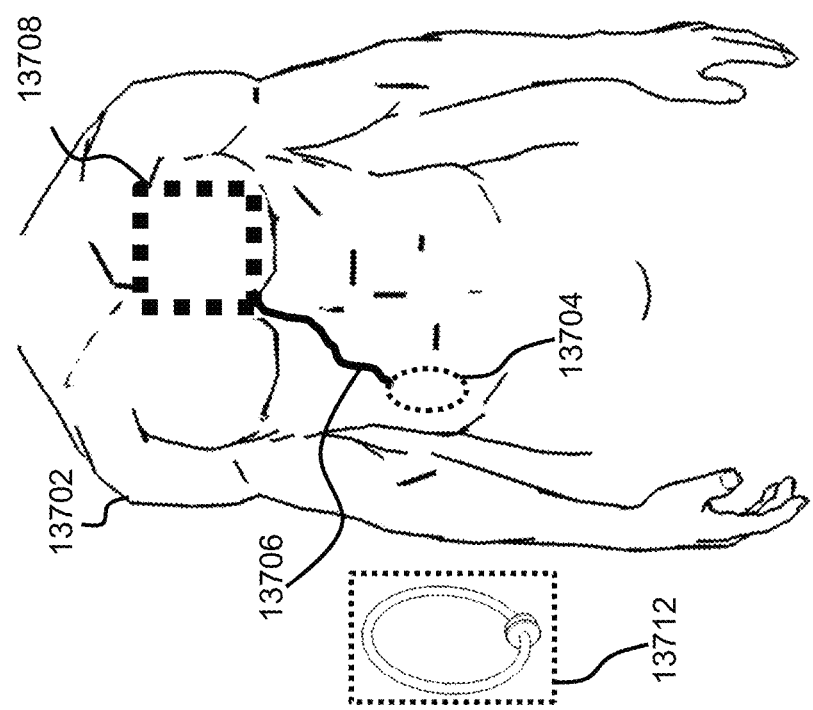
Figure 138D:
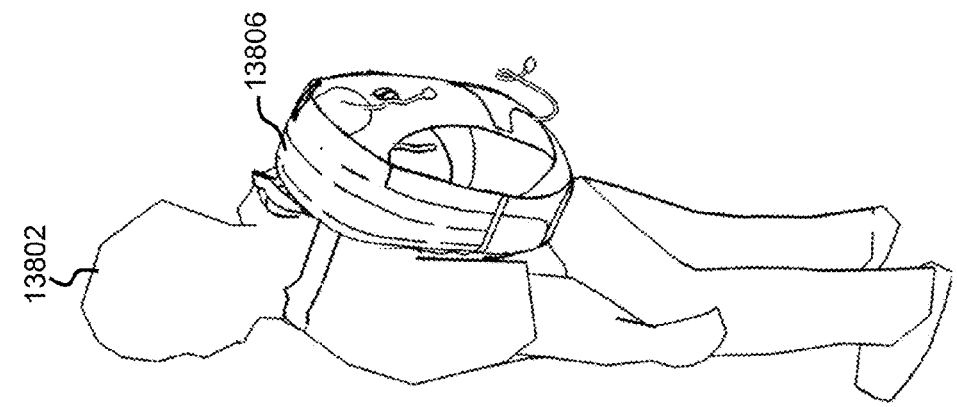
Figure 138B:
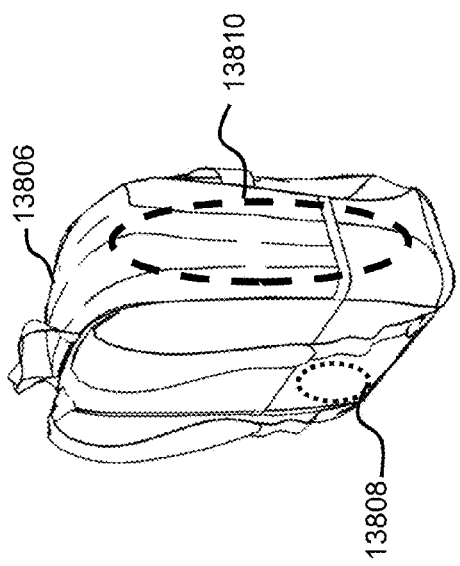
Figure 138C:
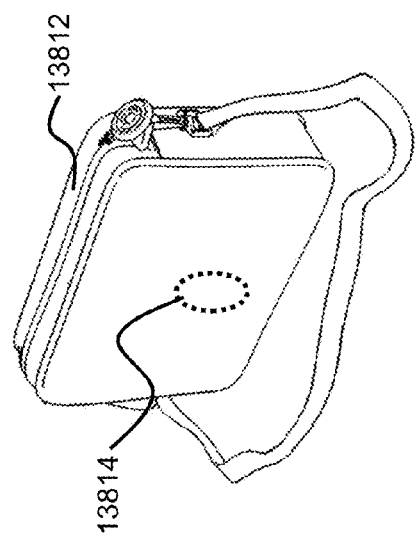
Figure 138A:
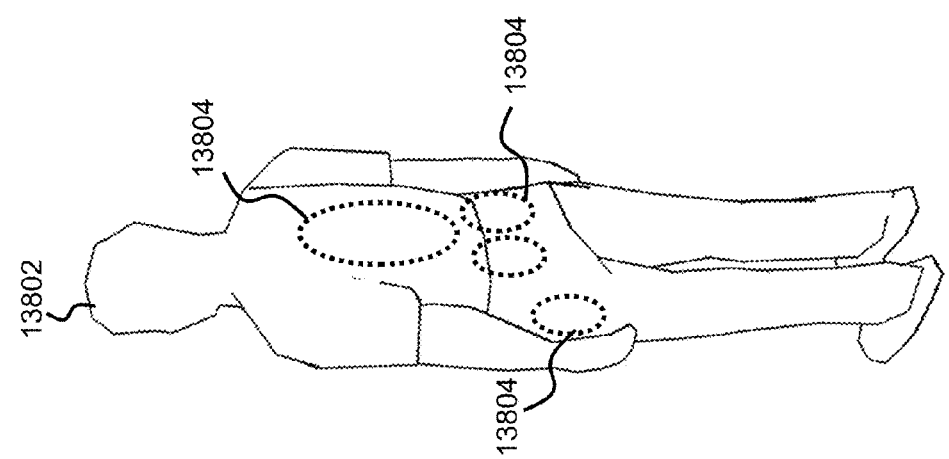

FIGS. 137a and 137b are block diagrams of a wireless power transfer system for implantable devices.

FIGS. 138a, 138b, 138c, and 138d are diagrams depicting source and device configurations of wireless energy transfer for implantable devices.

Figure 139:
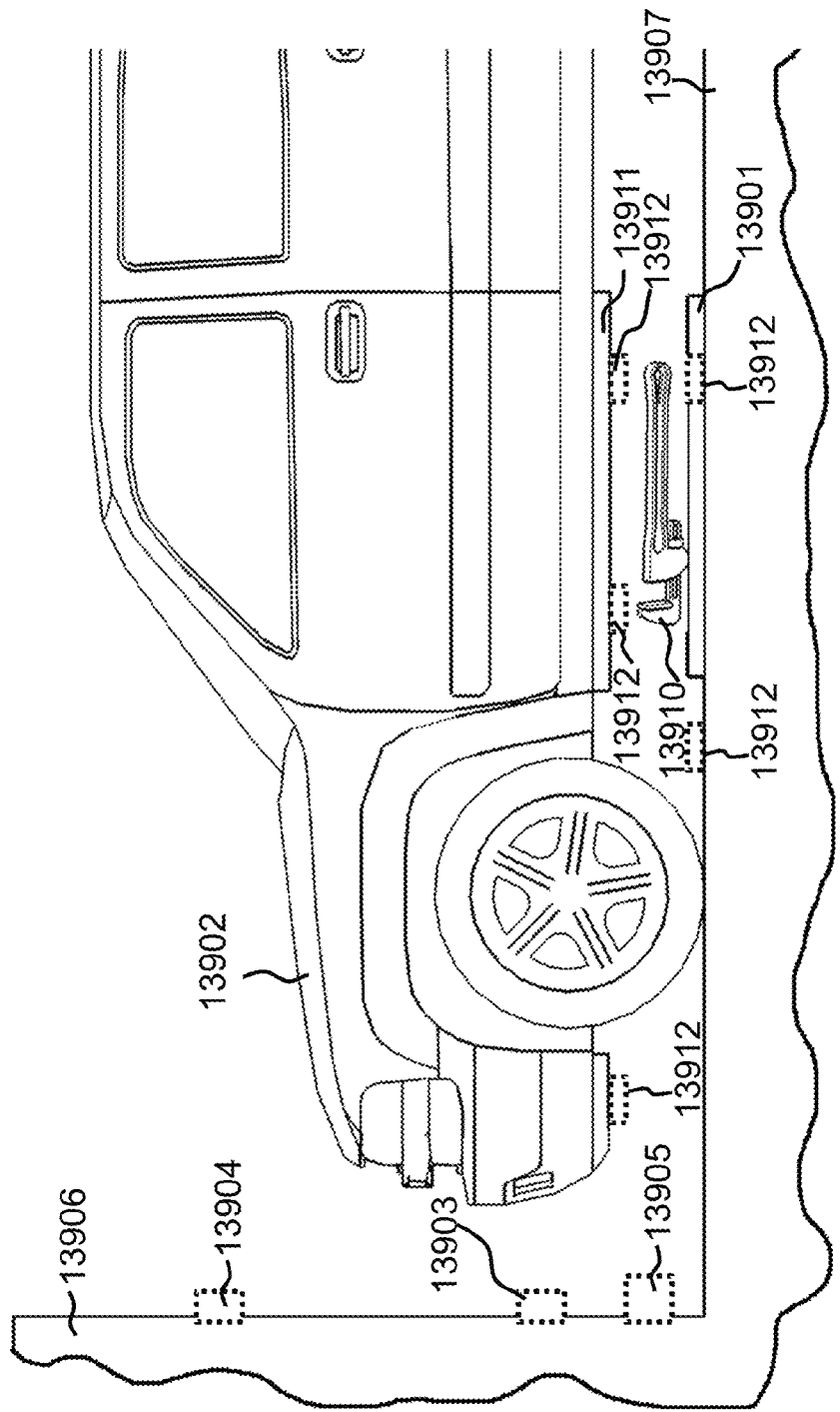

FIG. 139 is a side view of an automobile parked in a parking area equipped with a vehicle charging system and corresponding safety system.

Figure 140B:
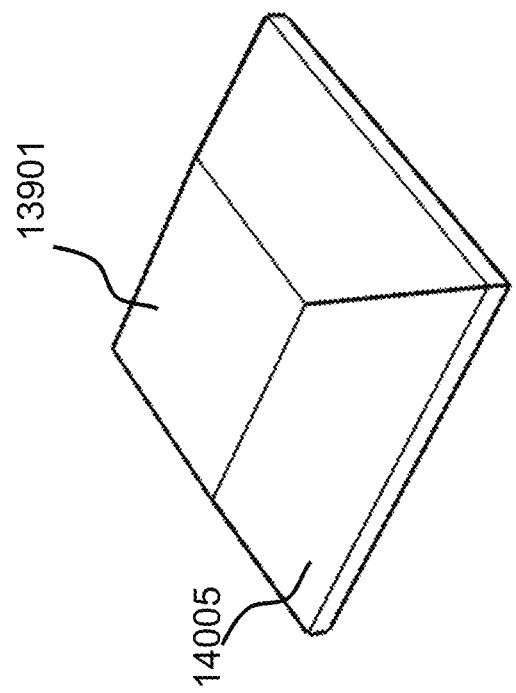
Figure 140A:
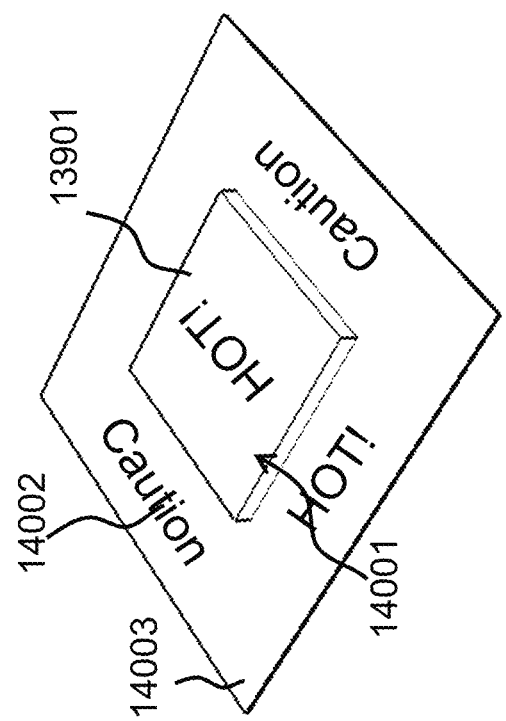

FIG. 140a is an isometric view illustrating use of heat-sensitive paint over a vehicle charging system resonator, and FIG. 140b is an isometric view illustrating the shape of a source resonator enclosure.

Figure 141:
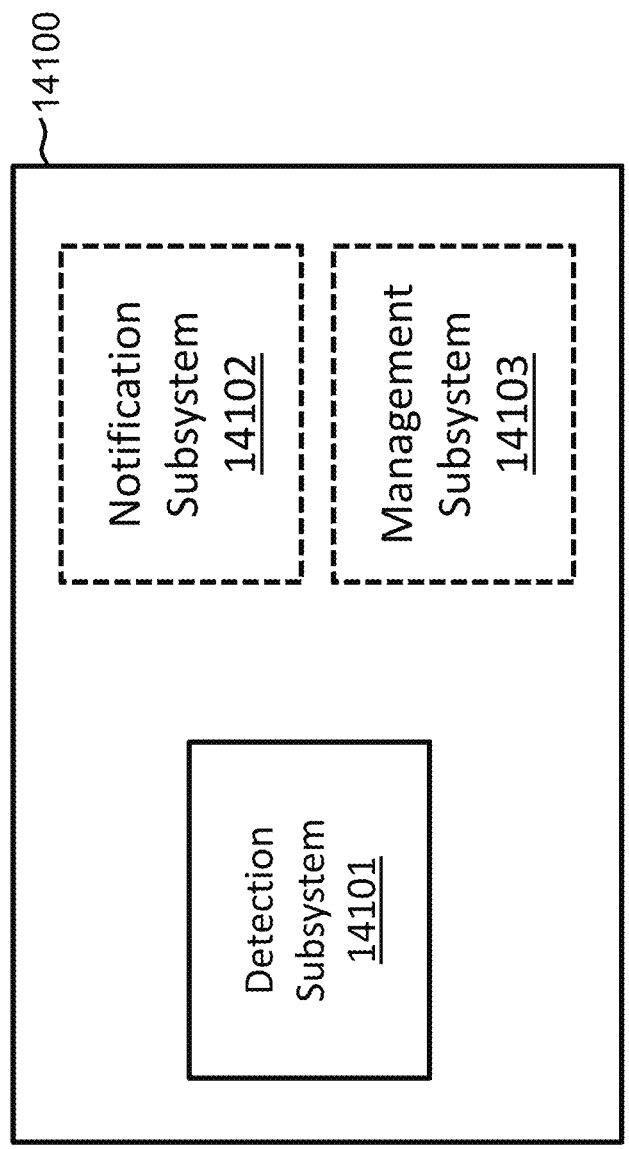

FIG. 141 is a high-level block diagram of a vehicle charger safety system in accordance with an embodiment described herein.

FIG. 142a is an isometric view of an embodiment of a resonator with an array of temperature sensors and indicators, and FIG. 142b is an isometric view of an embodiment of a resonator with strip sensors for detecting heat.

Figure 143:
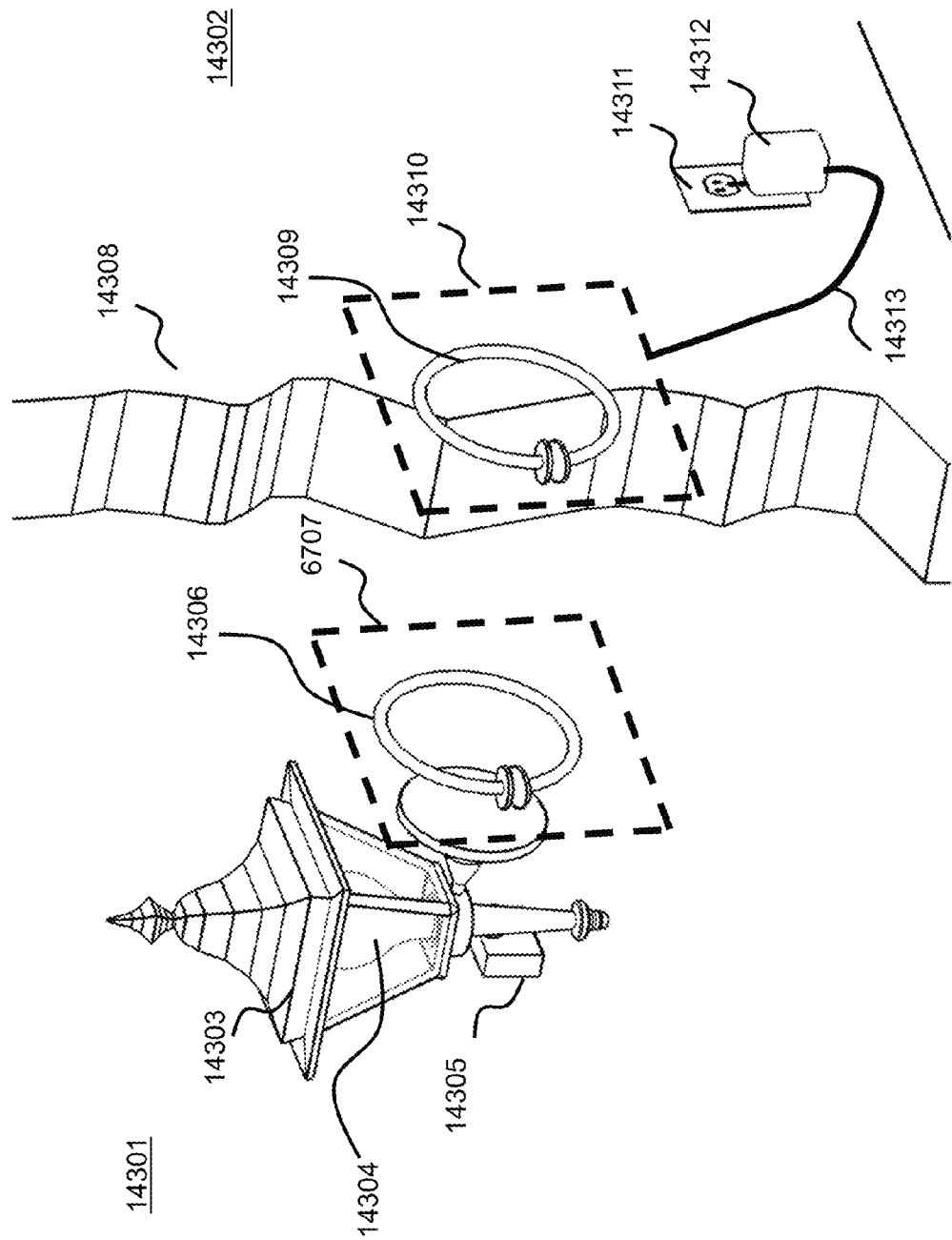

FIG. 143 is a diagram of a wirelessly powered security light.

Figure 144:
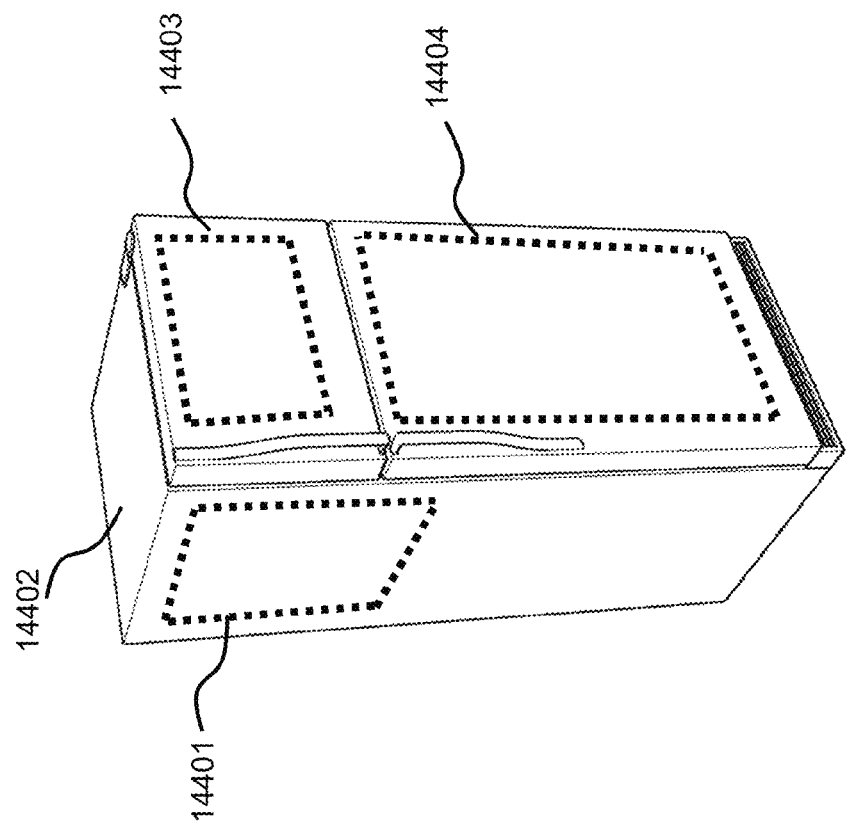

FIG. 144 is a diagram of locations of wireless power transfer sources in a refrigerator.

Figure 145:
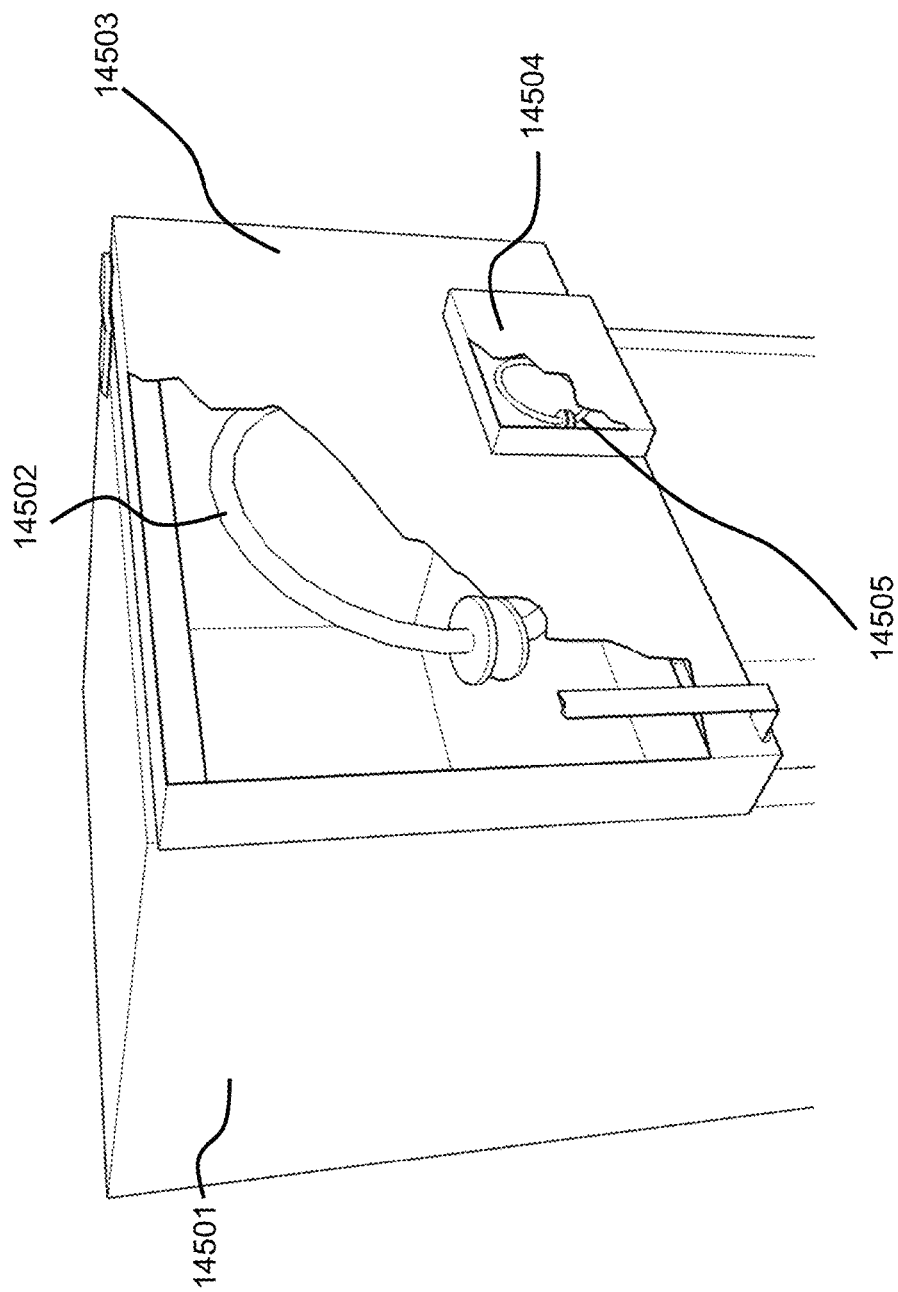

FIG. 145 is a diagram of a refrigerator with a built in wireless power transfer source.

Figure 146:
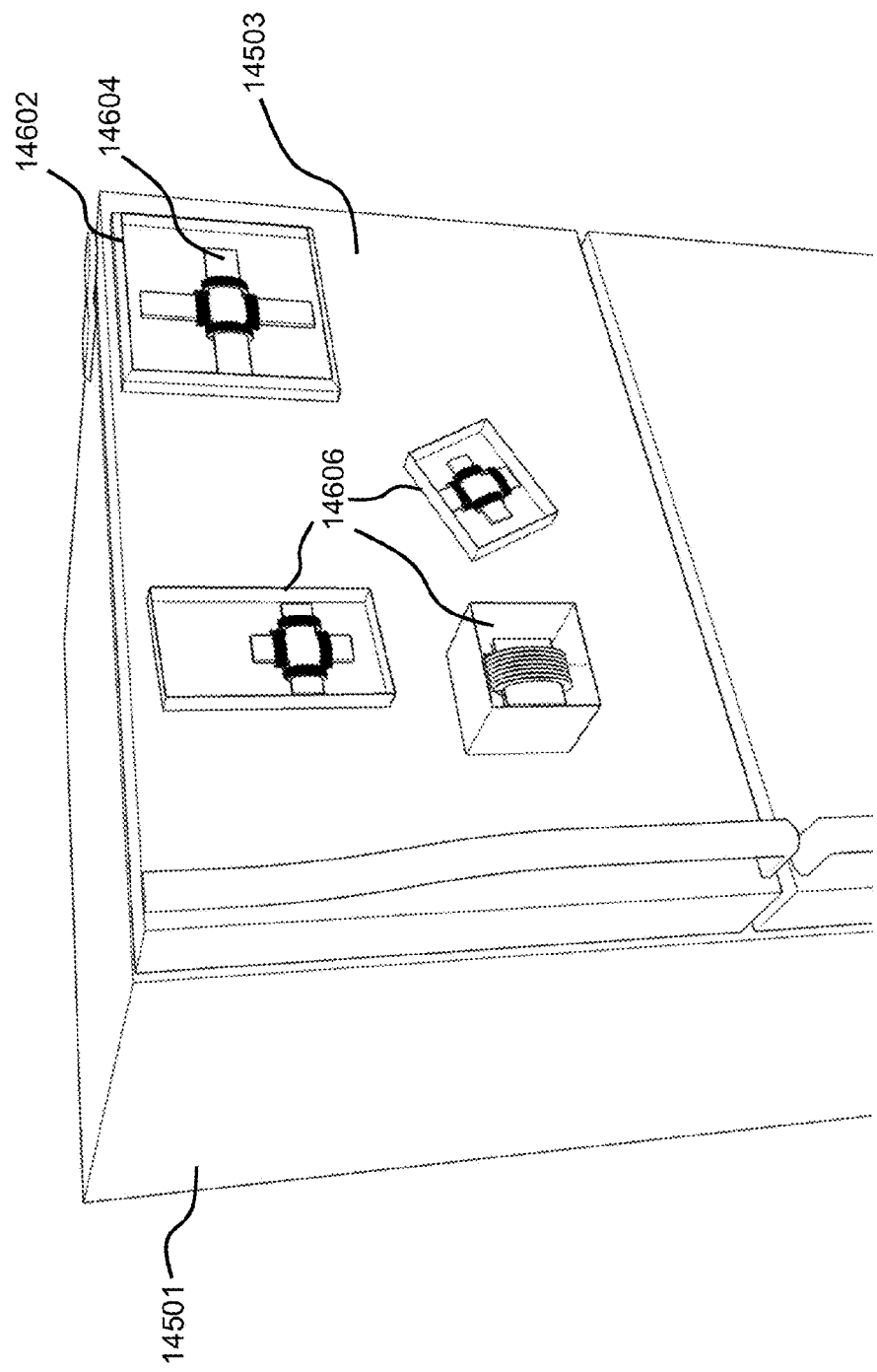

FIG. 146 is a diagram of a refrigerator with external planar source resonators and devices.

Figure 147:
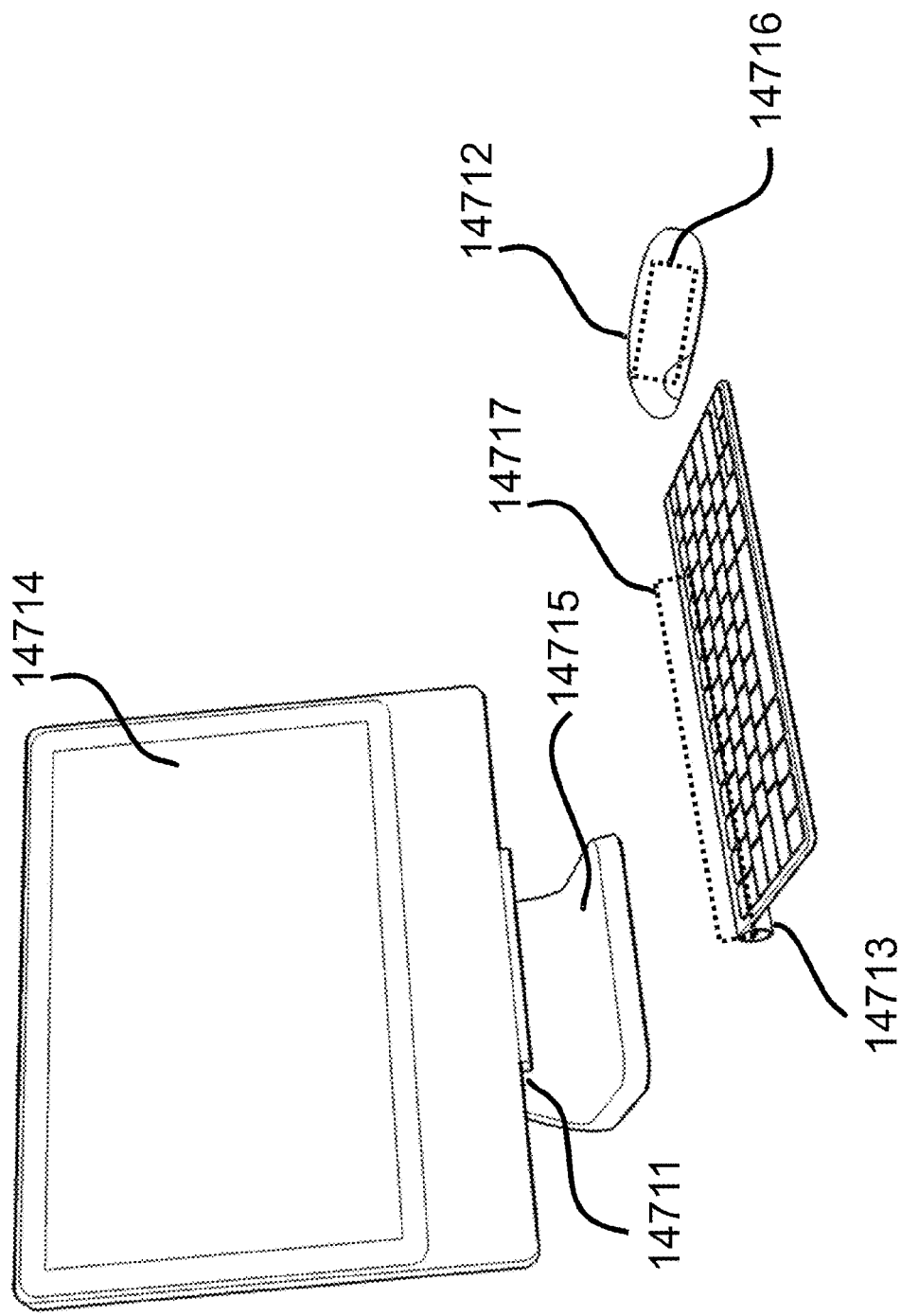

FIG. 147 is a diagram of a computer and wirelessly powered computer peripherals.

Figure 148:
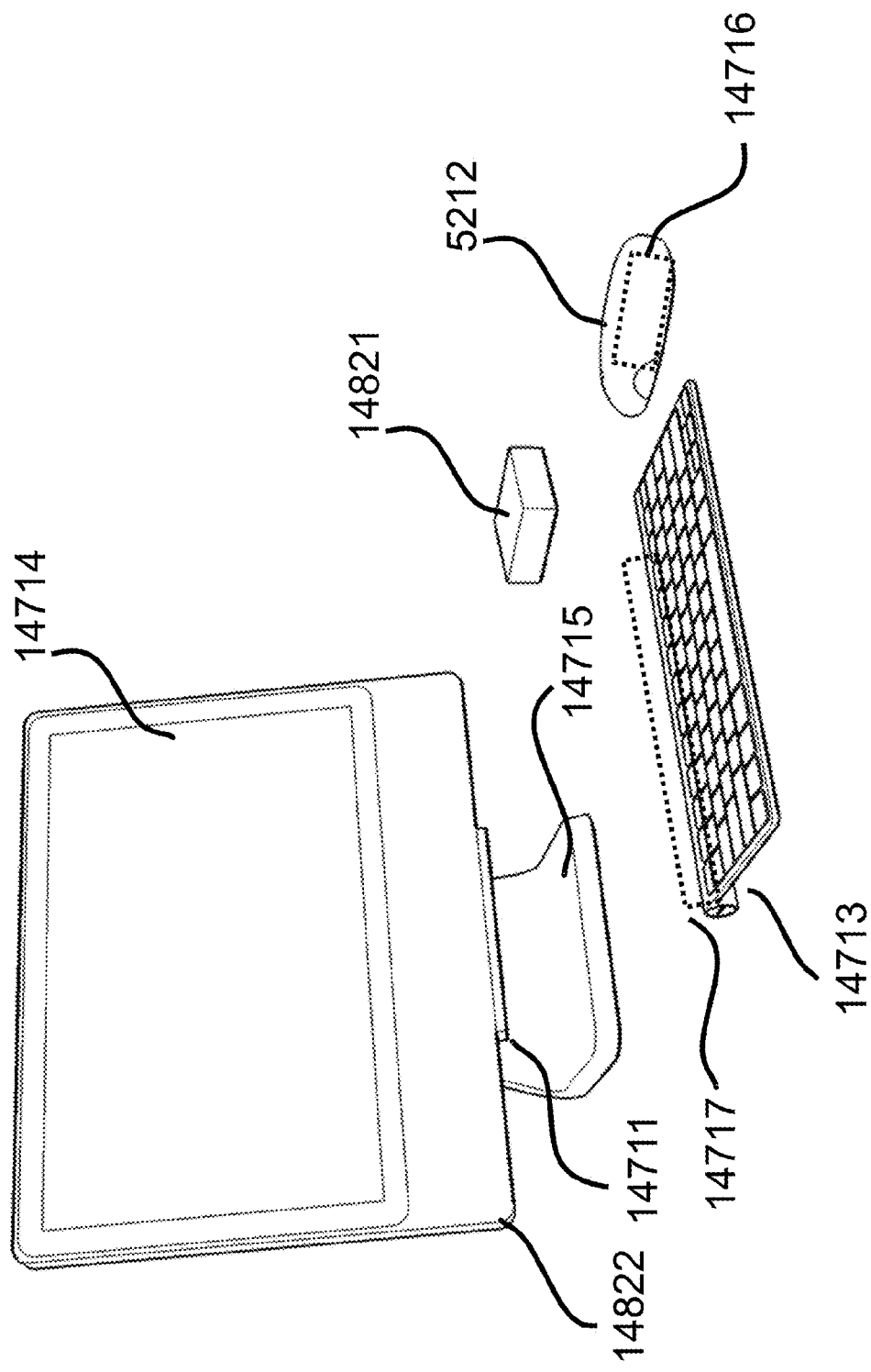

FIG. 148 is a diagram of a computer, wirelessly powered computer peripherals, and a passive repeater resonator.

Figure 149:
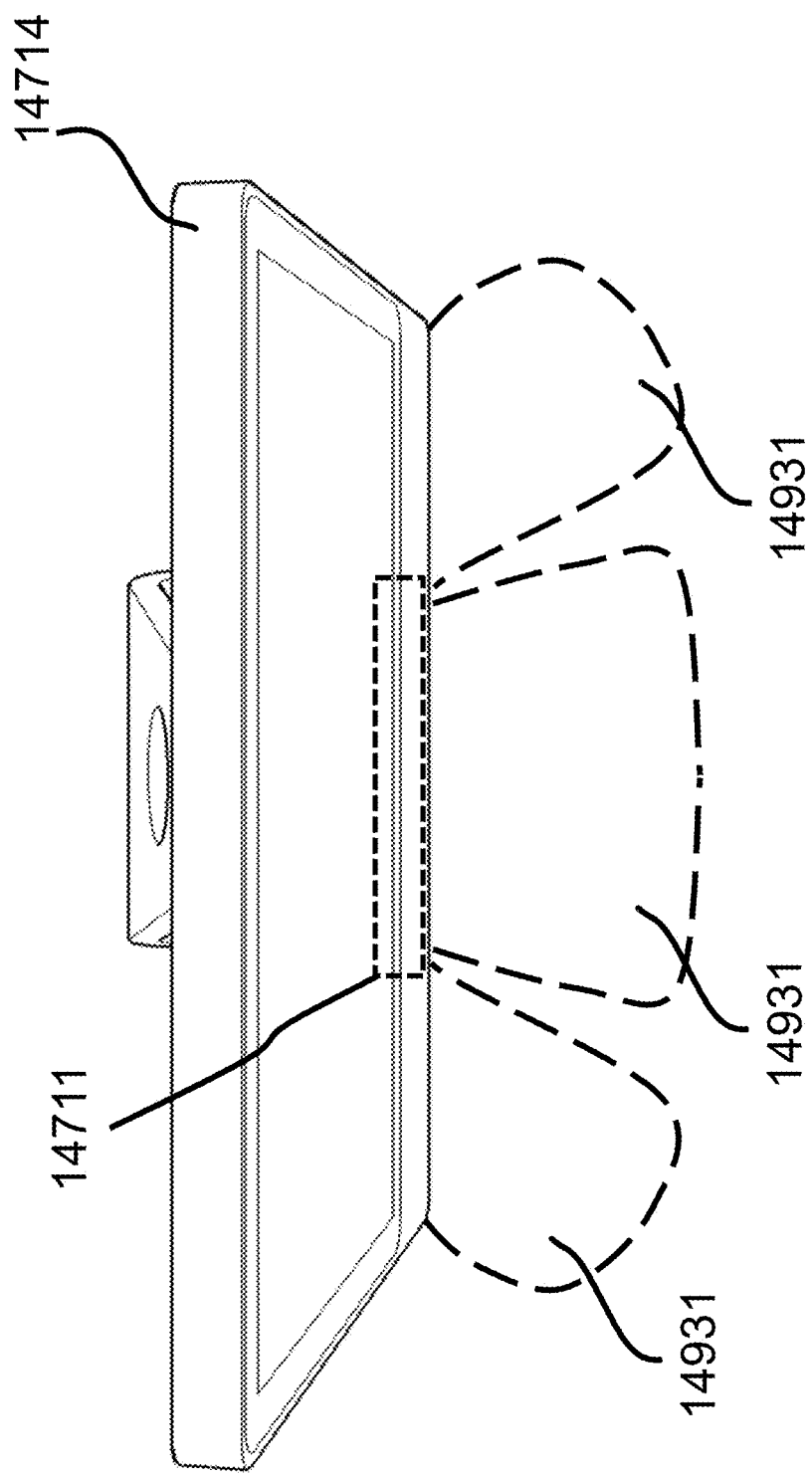

FIG. 149 is a diagram of a computer showing the active area around the computer of a exemplary experimental system configuration.

Figure 150:
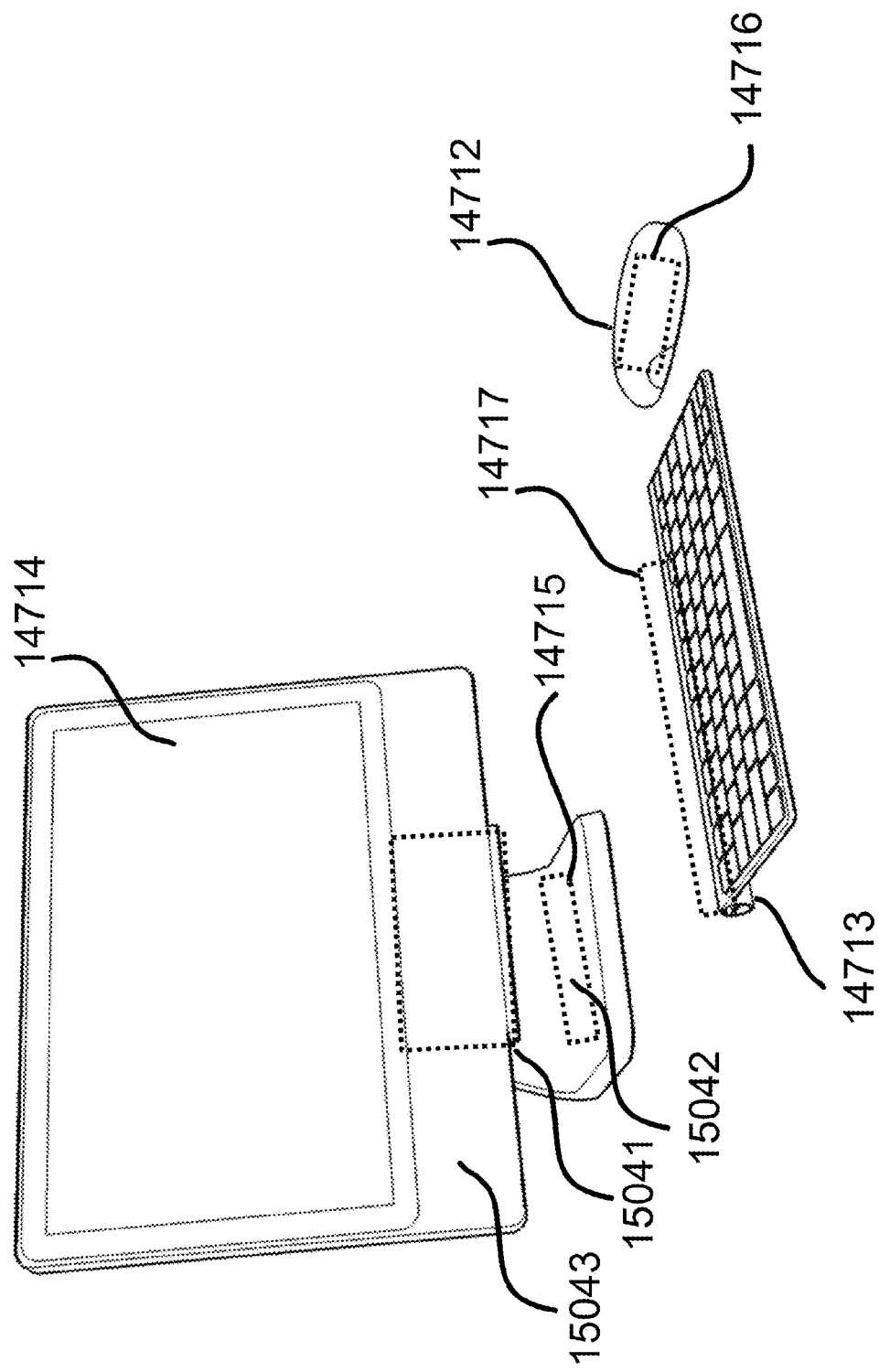

FIG. 150 is a diagram of power transfer system which uses a passive repeater resonator at the base of the computer.

Figure 151:
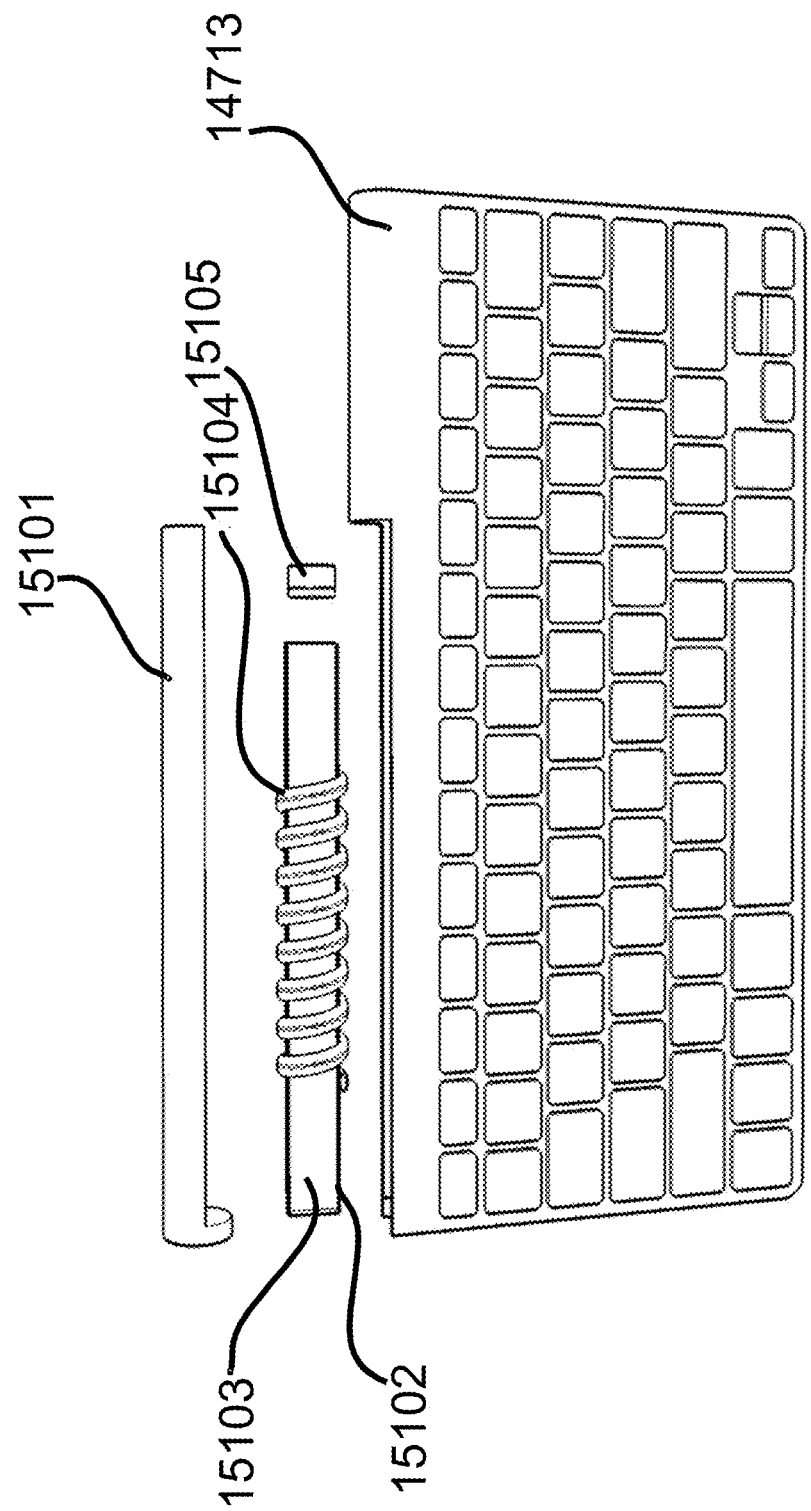

FIG. 151 is an exploded view diagram of a computer keyboard with integrated device magnetic resonator.

Figure 152:
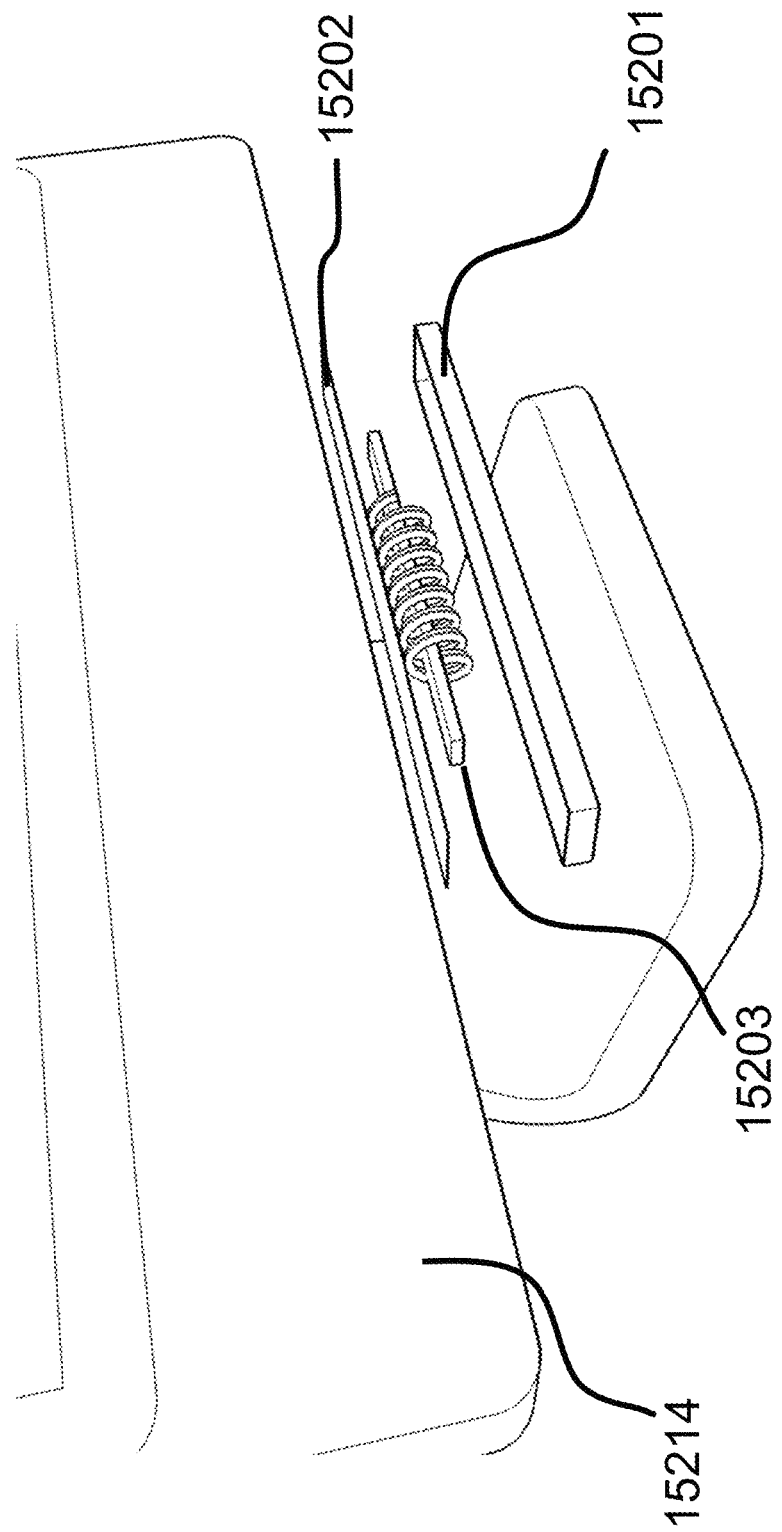

FIG. 152 is an exploded view diagram of a computer with an integrated source magnetic resonator.

Figure 153:
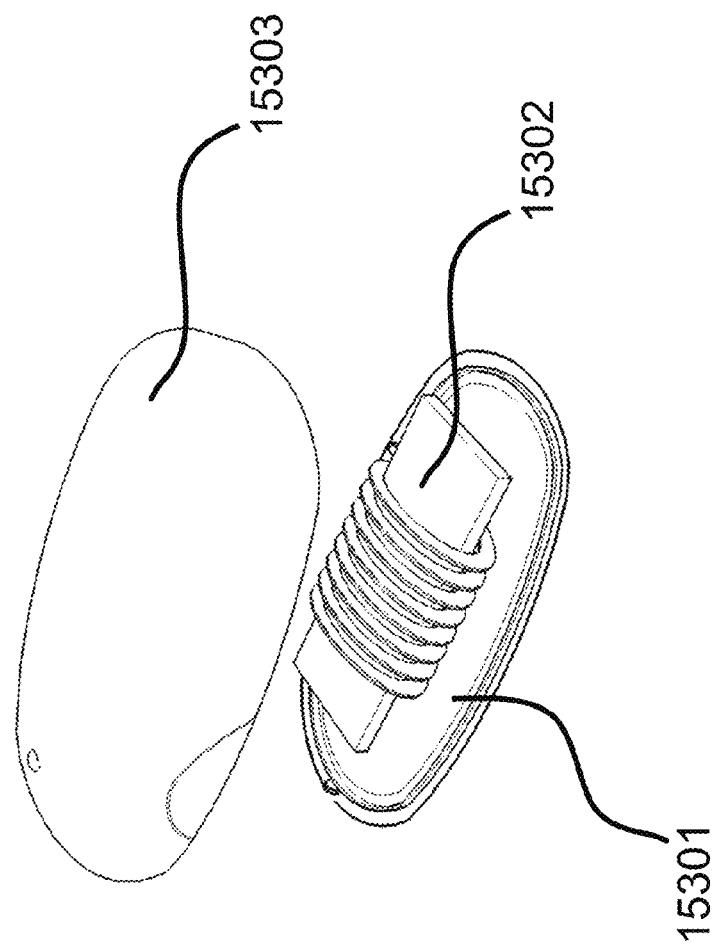

FIG. 153 is an exploded view diagram of a computer mouse with an integrated device magnetic resonator.

DETAILED DESCRIPTION

As described above, this disclosure relates to coupled electromagnetic resonators with long-lived oscillatory resonant modes that may wirelessly transfer power from a power supply to a power drain. However, the technique is not restricted to electromagnetic resonators, but is general and may be applied to a wide variety of resonators and resonant objects. Therefore, we first describe the general technique, and then disclose electromagnetic examples for wireless energy transfer.

Resonators

A resonator may be defined as a system that can store energy in at least two different forms, and where the stored energy is oscillating between the two forms. The resonance has a specific oscillation mode with a resonant (modal) frequency, f, and a resonant (modal) field. The angular resonant frequency, $\omega$, may be defined as $\omega=2\pi f$, the resonant wavelength, $\lambda$, may be defined as $\lambda=c/f$, where c is the speed of light, and the resonant period, T, may be defined as $T=1/f=2\pi/\omega$. In the absence of loss mechanisms, coupling mechanisms or external energy supplying or draining mechanisms, the total resonator stored energy, W, would stay fixed and the two forms of energy would oscillate, wherein one would be maximum when the other is minimum and vice versa.

Figure 1:
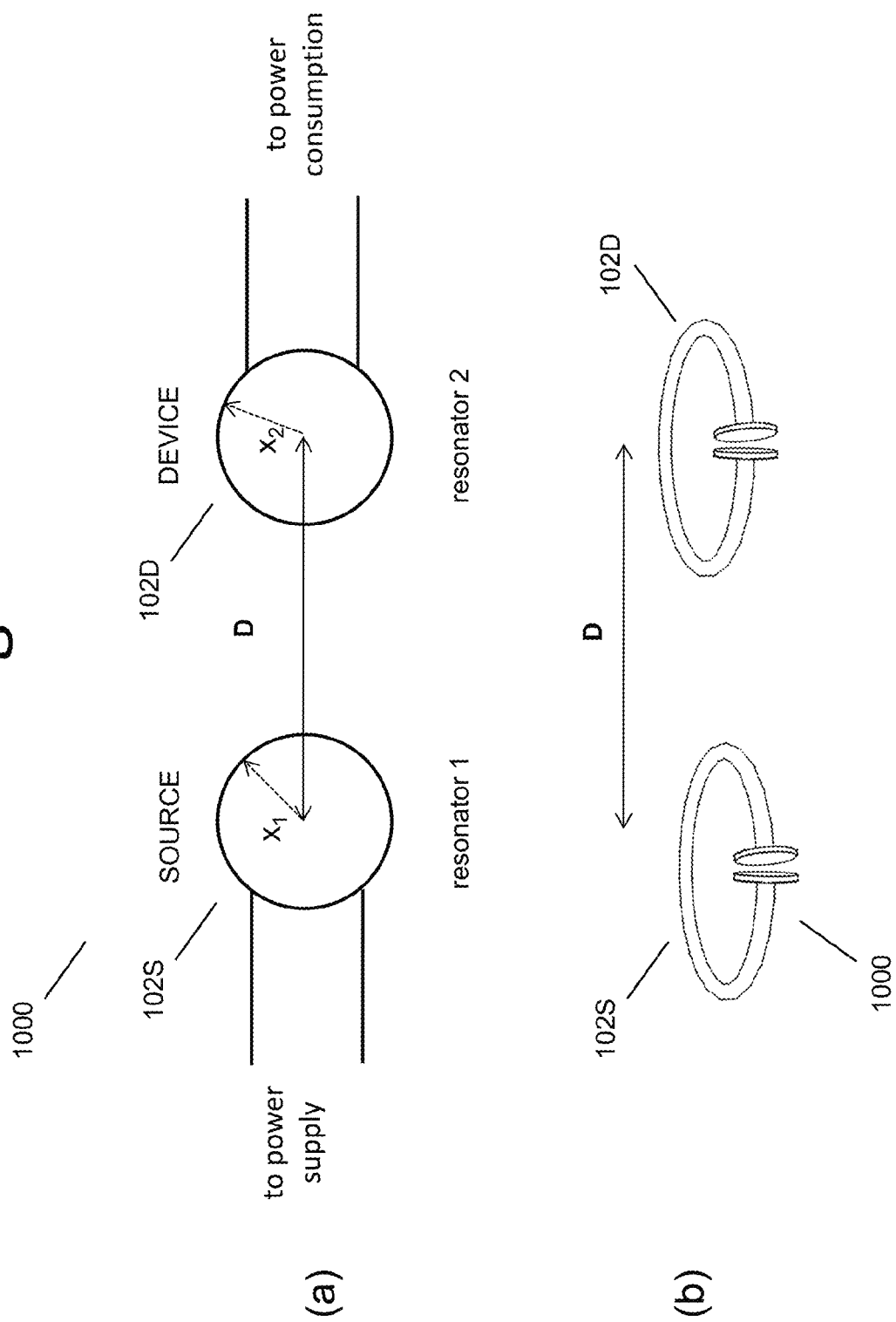
FIGS. 1 (a) and (b) depict exemplary wireless power systems containing a source resonator 1 and device resonator 2 separated by a distance D.

In the absence of extraneous materials or objects, the energy in the resonator 102 shown in FIG. 1 may decay or be lost by intrinsic losses. The resonator fields then obey the following linear equation:

$$\frac{da(t)}{dt} = -i(\omega - i\Gamma)a(t),$$

where the variable a(t) is the resonant field amplitude, defined so that the energy contained within the resonator is given by $|a(t)|^2$. $\Gamma$ is the intrinsic energy decay or loss rate (e.g. due to absorption and radiation losses).

The Quality Factor, or Q-factor, or Q, of the resonator, which characterizes the energy decay, is inversely proportional to these energy losses. It may be defined as $Q=\omega*W/P$, where P is the time-averaged power lost at steady state. That is, a resonator 102 with a high-Q has relatively low intrinsic losses and can store energy for a relatively long time. Since the resonator loses energy at its intrinsic decay rate, $2\Gamma$, its Q, also referred to as its intrinsic Q, is given by $Q=\omega/2\Gamma$. The quality factor also represents the number of oscillation periods, T, it takes for the energy in the resonator to decay by a factor of e.

Figure 2:
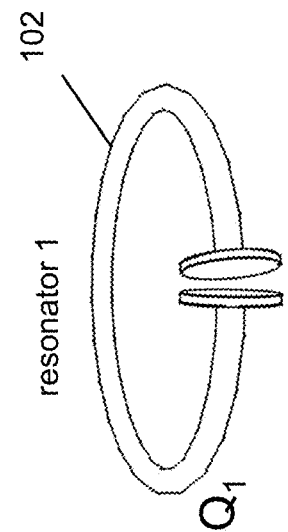
FIG. 2 shows an exemplary resonator labeled according to the labeling convention described in this disclosure. Note that there are no extraneous objects or additional resonators shown in the vicinity of resonator 1.

As described above, we define the quality factor or Q of the resonator as that due only to intrinsic loss mechanisms. A subscript index such as $Q_1$, indicates the resonator (resonator 1 in this case) to which the Q refers. FIG. 2 shows an electromagnetic resonator 102 labeled according to this convention. Note that in this figure, there are no extraneous objects or additional resonators in the vicinity of resonator 1.

Extraneous objects and/or additional resonators in the vicinity of a first resonator may perturb or load the first resonator, thereby perturbing or loading the Q of the first resonator, depending on a variety of factors such as the distance between the resonator and object or other resonator, the material composition of the object or other resonator, the structure of the first resonator, the power in the first resonator, and the like. Unintended external energy losses or coupling mechanisms to extraneous materials and objects in the vicinity of the resonators may be referred to as "perturbing" the Q of a resonator, and may be indicated by a subscript within rounded parentheses, ( ). Intended external energy losses, associated with energy transfer via coupling to other resonators and to generators and loads in the wireless energy transfer system may be referred to as "loading" the Q of the resonator, and may be indicated by a subscript within square brackets, [ ].

Figure 3:
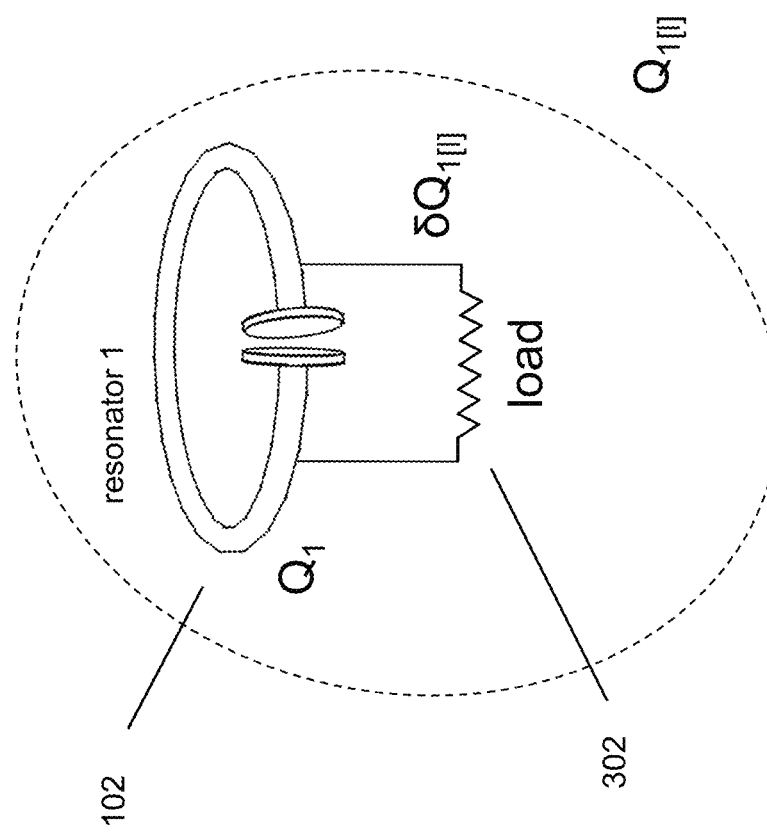
FIG. 3 shows an exemplary resonator in the presence of a "loading" object, labeled according to the labeling convention described in this disclosure.

The Q of a resonator 102 connected or coupled to a power generator, g, or load 302, l, may be called the "loaded quality factor" or the "loaded Q" and may be denoted by $Q_{[g]}$ or $Q_{[l]}$, as illustrated in FIG. 3. In general, there may be more than one generator or load 302 connected to a resonator 102. However, we do not list those generators or loads separately but rather use "g" and "l" to refer to the equivalent circuit loading imposed by the combinations of generators and loads. In general descriptions, we may use the subscript "l" to refer to either generators or loads connected to the resonators.

In some of the discussion herein, we define the "loading quality factor" or the "loading Q" due to a power generator or load connected to the resonator, as $\delta Q_{[l]}$, where, $1/\delta Q_{[l]} \equiv 1/Q_{[l]} - 1/Q$. Note that the larger the loading Q, $\delta Q_{[l]}$, of a generator or load, the less the loaded Q, $Q_{[l]}$, deviates from the unloaded Q of the resonator.

Figure 4:
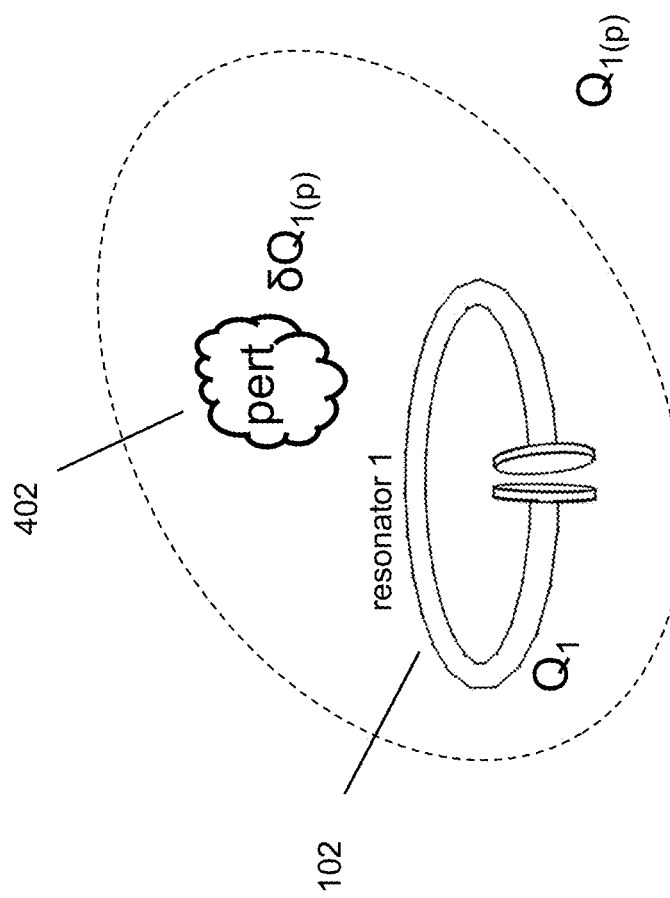
FIG. 4 shows an exemplary resonator in the presence of a "perturbing" object, labeled according to the labeling convention described in this disclosure.

The Q of a resonator in the presence of an extraneous object 402, p, that is not intended to be part of the energy transfer system may be called the "perturbed quality factor" or the "perturbed Q" and may be denoted by $Q_{(p)}$, as illustrated in FIG. 4. In general, there may be many extraneous objects, denoted as p1,p2, etc., or a set of extraneous objects {p}, that perturb the Q of the resonator 102. In this case, the perturbed Q may be denoted $Q_{(p1+p2+\ldots)}$ or $Q_{(\{p\})}$. For example, $Q_{1(brick+wood)}$ may denote the perturbed quality factor of a first resonator in a system for wireless power exchange in the presence of a brick and a piece of wood, and $Q_{2(\{office\})}$ may denote the perturbed quality factor of a second resonator in a system for wireless power exchange in an office environment.

In some of the discussion herein, we define the "perturbing quality factor" or the "perturbing Q" due to an extraneous object, p, as $\delta Q_{(p)}$, where $1/\delta Q_{(p)} \equiv 1/\delta Q_{(p)} - 1/Q$. As stated before, the perturbing quality factor may be due to multiple extraneous objects, p1,p2, etc. or a set of extraneous objects, {p}. The larger the perturbing Q, $\delta Q_{(p)}$, of an object, the less the perturbed Q, $Q_{(p)}$, deviates from the unperturbed Q of the resonator.

In some of the discussion herein, we also define $\Theta_{(p)} \equiv Q_{(p)}/Q$ and call it the "quality factor insensitivity" or the "Q-insensitivity" of the resonator in the presence of an extraneous object. A subscript index, such as $\Theta_{1(p)}$, indicates the resonator to which the perturbed and unperturbed quality factors are referring, namely, $\Theta_{1(p)} \equiv Q_{1(p)}/Q_1$.

Note that the quality factor, Q, may also be characterized as "unperturbed", when necessary to distinguish it from the perturbed quality factor, $Q_{(p)}$, and "unloaded", when necessary to distinguish it from the loaded quality factor, $Q_{[l]}$. Similarly, the perturbed quality factor, $Q_{(p)}$, may also be characterized as "unloaded", when necessary to distinguish them from the loaded perturbed quality factor, $Q_{(p)[l]}$.

Coupled Resonators

Resonators having substantially the same resonant frequency, coupled through any portion of their near-fields may interact and exchange energy. There are a variety of physical pictures and models that may be employed to understand, design, optimize and characterize this energy exchange. One way to describe and model the energy exchange between two coupled resonators is using coupled mode theory (CMT).

In coupled mode theory, the resonator fields obey the following set of linear equations:

$$\frac{da_m(t)}{dt} = -i(\omega_m - i\Gamma_m)a_m(t) + i\sum_{n \neq m} \kappa_{mn} a_n(t)$$

where the indices denote different resonators and $\kappa_{mn}$ are the coupling coefficients between the resonators. For a reciprocal system, the coupling coefficients may obey the relation $\kappa_{mn}=\kappa_{nm}$. Note that, for the purposes of the present specification, far-field radiation interference effects will be ignored and thus the coupling coefficients will be considered real. Furthermore, since in all subsequent calculations of system performance in this specification the coupling coefficients appear only with their square, $\kappa_{mn}^2$, we use $\kappa_{mn}$ to denote the absolute value of the real coupling coefficients.

Note that the coupling coefficient, $\kappa_{mn}$, from the CMT described above is related to the so-called coupling factor, $k_{mn}$, between resonators m and n by $k_{mn}=2\kappa_{mn}/\sqrt{\omega_m \omega_n}$. We define a "strong-coupling factor", $U_{mn}$, as the ratio of the coupling and loss rates between resonators m and n, by $U_{mn}=\kappa_{mn}/\sqrt{\Gamma_m \Gamma_n}=k_{mn}\sqrt{Q_m Q_n}$.

The quality factor of a resonator m, in the presence of a similar frequency resonator n or additional resonators, may be loaded by that resonator n or additional resonators, in a fashion similar to the resonator being loaded by a connected power generating or consuming device. The fact that resonator m may be loaded by resonator n and vice versa is simply a different way to see that the resonators are coupled.

The loaded Q's of the resonators in these cases may be denoted as $Q_{m[n]}$ and $Q_{n[m]}$. For multiple resonators or loading supplies or devices, the total loading of a resonator may be determined by modeling each load as a resistive loss, and adding the multiple loads in the appropriate parallel and/or series combination to determine the equivalent load of the ensemble.

In some of the discussion herein, we define the "loading quality factor" or the "loading $Q_m$" of resonator m due to resonator n as $\delta Q_{m[n]}$, where $1/\delta Q_{m[n]} \equiv 1/Q_{m[n]} - 1/Q_m$. Note that resonator n is also loaded by resonator m and its "loading $Q_n$" is given by $1/\delta Q_{n[m]} \equiv 1/Q_{n[m]} - 1/Q_n$.

When one or more of the resonators are connected to power generators or loads, the set of linear equations is modified to:

$$\frac{da_m(t)}{dt} = -i(\omega_m - i\Gamma_m)a_m(t) + i\sum_{n \neq m} \kappa_{mn} a_n(t) - \kappa_m a_m(t) + \sqrt{2\kappa_m}\, s_{+m}(t)$$

$$s_{-m}(t) = \sqrt{2\kappa_m}\, a_m(t) - s_{+m}(t),$$

where $s_{+m}(t)$ and $s_{-m}(t)$ are respectively the amplitudes of the fields coming from a generator into the resonator m and going out of the resonator m either back towards the generator or into a load, defined so that the power they carry is given by $|s_{+m}(t)|^2$ and $|s_{-m}(t)|^2$. The loading coefficients $\kappa_m$ relate to the rate at which energy is exchanged between the resonator m and the generator or load connected to it.

Note that the loading coefficient, $\kappa_m$, from the CMT described above is related to the loading quality factor, $\delta Q_{m[l]}$, defined earlier, by $\delta Q_{m[l]} = \omega_m / 2\kappa_m$.

We define a "strong-loading factor", $U_{m[l]}$, as the ratio of the loading and loss rates of resonator m, $U_{m[l]} = \kappa_m / \Gamma_m = Q_m / \delta Q_{m[l]}$.

FIG. 1(a) shows an example of two coupled resonators 1000, a first resonator 102S, configured as a source resonator and a second resonator 102D, configured as a device resonator. Energy may be transferred over a distance D between the resonators. The source resonator 102S may be driven by a power supply or generator (not shown). Work may be extracted from the device resonator 102D by a power consuming drain or load (e.g. a load resistor, not shown). Let us use the subscripts "s" for the source, "d" for the device, "g" for the generator, and "l" for the load, and, since in this example there are only two resonators and $\kappa_{sd}=\kappa_{ds}$, let us drop the indices on $\kappa_{sd}$, $k_{sd}$, and $U_{sd}$, and denote them as $\kappa$, k, and U, respectively.

The power generator may be constantly driving the source resonator at a constant driving frequency, f, corresponding to an angular driving frequency, $\omega$, where $\omega=2\pi f$.

In this case, the efficiency, $\eta = |s_{-d}|^2/|s_{+s}|^2$, of the power transmission from the generator to the load (via the source and device resonators) is maximized under the following conditions: The source resonant frequency, the device resonant frequency and the generator driving frequency have to be matched, namely $$\omega_s = \omega_d = \omega.$$

Furthermore, the loading Q of the source resonator due to the generator, $\delta Q_{s[g]}$, has to be matched (equal) to the loaded Q of the source resonator due to the device resonator and the load, $Q_{s[dl]}$, and inversely the loading Q of the device resonator due to the load, $\delta Q_{d[l]}$, has to be matched (equal) to the loaded Q of the device resonator due to the source resonator and the generator, $Q_{d[sg]}$, namely $$\delta Q_{s[g]} = Q_{s[dl]} \text{ and } \delta Q_{d[l]} = Q_{d[sg]}.$$

These equations determine the optimal loading rates of the source resonator by the generator and of the device resonator by the load as $$U_{d[l]} = \kappa_d / \Gamma_d = Q_d / \delta Q_{d[l]} =$$

$$\sqrt{1+U^2} = \sqrt{1 + \left(\kappa/\sqrt{\Gamma_s \Gamma_d}\right)^2} = Q_s/\delta Q_{s[g]} = \kappa_s/\Gamma_s = U_{s[g]}$$

Note that the above frequency matching and Q matching conditions are together known as "impedance matching" in electrical engineering.

Figure 5:
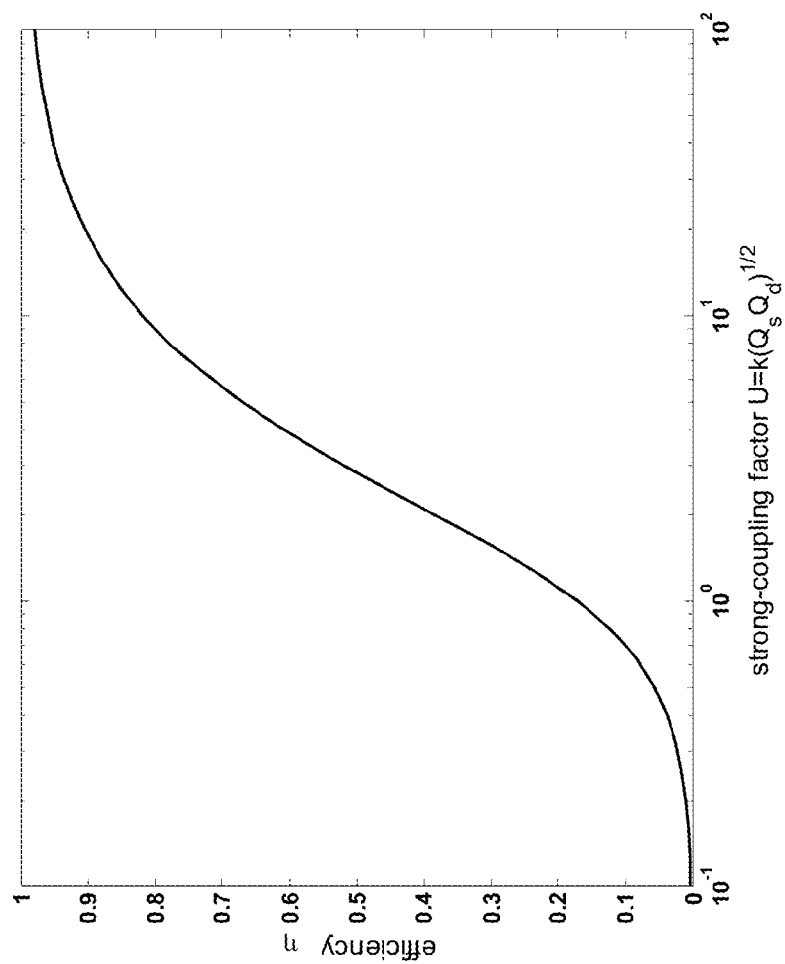
FIG. 5 shows a plot of efficiency, $\eta$, vs. strong coupling factor, $U=\kappa/\sqrt{\Gamma_s \Gamma_d}=k\sqrt{Q_s Q_d}$.

Under the above conditions, the maximized efficiency is a monotonically increasing function of only the strong-coupling factor, $U = \kappa/\sqrt{\Gamma_s \Gamma_d} = k\sqrt{Q_s Q_d}$, between the source and device resonators and is given by, $\eta = U^2/(1+\sqrt{1+U^2})^2$, as shown in FIG. 5. Note that the coupling efficiency, $\eta$, is greater than 1% when U is greater than 0.2, is greater than 10% when U is greater than 0.7, is greater than 17% when U is greater than 1, is greater than 52% when U is greater than 3, is greater than 80% when U is greater than 9, is greater than 90% when U is greater than 19, and is greater than 95% when U is greater than 45. In some applications, the regime of operation where U>1 may be referred to as the "strong-coupling" regime.

Since a large $U = \kappa/\sqrt{\Gamma_s \Gamma_d} = (2\kappa/\sqrt{\omega_s \omega_d})\sqrt{Q_s Q_d}$ is desired in certain circumstances, resonators may be used that are high-Q. The Q of each resonator may be high. The geometric mean of the resonator Q's, $\sqrt{Q_sQ_d}$ may also or instead be high.

The coupling factor, k, is a number between $0 \leq k \leq 1$, and it may be independent (or nearly independent) of the resonant frequencies of the source and device resonators, rather it may determined mostly by their relative geometry and the physical decay-law of the field mediating their coupling. In contrast, the coupling coefficient, $\kappa = k\sqrt{\omega_s\omega_d}/2$, may be a strong function of the resonant frequencies. The resonant frequencies of the resonators may be chosen preferably to achieve a high Q rather than to achieve a low $\Gamma$, as these two goals may be achievable at two separate resonant frequency regimes.

A high-Q resonator may be defined as one with Q>100. Two coupled resonators may be referred to as a system of high-Q resonators when each resonator has a Q greater than 100, $Q_s$>100 and $Q_d$>100. In other implementations, two coupled resonators may be referred to as a system of high-Q resonators when the geometric mean of the resonator Q's is greater than 100, $\sqrt{Q_sQ_d}$>100.

The resonators may be named or numbered. They may be referred to as source resonators, device resonators, first resonators, second resonators, repeater resonators, and the like. It is to be understood that while two resonators are shown in FIG. 1, and in many of the examples below, other implementations may include three (3) or more resonators. For example, a single source resonator 102S may transfer energy to multiple device resonators 102D or multiple devices. Energy may be transferred from a first device to a second, and then from the second device to the third, and so forth. Multiple sources may transfer energy to a single device or to multiple devices connected to a single device resonator or to multiple devices connected to multiple device resonators. Resonators 102 may serve alternately or simultaneously as sources, devices, or they may be used to relay power from a source in one location to a device in another location. Intermediate electromagnetic resonators 102 may be used to extend the distance range of wireless energy transfer systems. Multiple resonators 102 may be daisy chained together, exchanging energy over extended distances and with a wide range of sources and devices. High power levels may be split between multiple sources 102S, transferred to multiple devices and recombined at a distant location.

The analysis of a single source and a single device resonator may be extended to multiple source resonators and/or multiple device resonators and/or multiple intermediate resonators. In such an analysis, the conclusion may be that large strong-coupling factors, $U_{mn}$, between at least some or all of the multiple resonators is preferred for a high system efficiency in the wireless energy transfer. Again, implementations may use source, device and intermediate resonators that have a high Q. The Q of each resonator may be high. The geometric mean $\sqrt{Q_mQ_n}$ of the Q's for pairs of resonators m and n, for which a large $U_{mn}$ is desired, may also or instead be high.

Note that since the strong-coupling factor of two resonators may be determined by the relative magnitudes of the loss mechanisms of each resonator and the coupling mechanism between the two resonators, the strength of any or all of these mechanisms may be perturbed in the presence of extraneous objects in the vicinity of the resonators as described above.

Continuing the conventions for labeling from the previous sections, we describe k as the coupling factor in the absence of extraneous objects or materials. We denote the coupling factor in the presence of an extraneous object, p, as $k_{(p)}$, and call it the "perturbed coupling factor" or the "perturbed k". Note that the coupling factor, k, may also be characterized as "unperturbed", when necessary to distinguish from the perturbed coupling factor $k_{(p)}$.

We define $\delta k_{(p)} \equiv k_{(p)} - k$ and we call it the "perturbation on the coupling factor" or the "perturbation on k" due to an extraneous object, p.

We also define $\beta_{(p)} \equiv k_{(p)}/k$ and we call it the "coupling factor insensitivity" or the "k-insensitivity". Lower indices, such as $\beta_{12(p)}$, indicate the resonators to which the perturbed and unperturbed coupling factor is referred to, namely $\beta_{12(p)} \equiv k_{12(p)}/k_{12}$.

Similarly, we describe U as the strong-coupling factor in the absence of extraneous objects. We denote the strong-coupling factor in the presence of an extraneous object, p, as $U_{(p)}$, $U_{(p)} = k_{(p)}\sqrt{Q_{1(p)}Q_{2(p)}}$, and call it the "perturbed strong-coupling factor" or the "perturbed U". Note that the strong-coupling factor U may also be characterized as "unperturbed", when necessary to distinguish from the perturbed strong-coupling factor $U_{(p)}$. Note that the strong-coupling factor U may also be characterized as "unperturbed", when necessary to distinguish from the perturbed strong-coupling factor $U_{(p)}$.

We define $\delta U_{(p)} \equiv U_{(p)} - U$ and call it the "perturbation on the strong-coupling factor" or the "perturbation on U" due to an extraneous object, p.

We also define $\Xi_{(p)} \equiv U_{(p)}/U$ and call it the "strong-coupling factor insensitivity" or the "U-insensitivity". Lower indices, such as $\Xi_{12(p)}$, indicate the resonators to which the perturbed and unperturbed coupling factor refers, namely $\Xi_{12(p)} \equiv U_{12(p)}/U_{12}$.

The efficiency of the energy exchange in a perturbed system may be given by the same formula giving the efficiency of the unperturbed system, where all parameters such as strong-coupling factors, coupling factors, and quality factors are replaced by their perturbed equivalents. For example, in a system of wireless energy transfer including one source and one device resonator, the optimal efficiency may calculated as $\eta_{(p)} = [U_{(p)}/(1+\sqrt{1+U_{(p)}^2})]^2$. Therefore, in a system of wireless energy exchange which is perturbed by extraneous objects, large perturbed strong-coupling factors, $U_{mn(p)}$, between at least some or all of the multiple resonators may be desired for a high system efficiency in the wireless energy transfer. Source, device and/or intermediate resonators may have a high $Q_{(p)}$.

Some extraneous perturbations may sometimes be detrimental for the perturbed strong-coupling factors (via large perturbations on the coupling factors or the quality factors). Therefore, techniques may be used to reduce the effect of extraneous perturbations on the system and preserve large strong-coupling factor insensitivites.

Efficiency of Energy Exchange

The so-called "useful" energy in a useful energy exchange is the energy or power that must be delivered to a device (or devices) in order to power or charge the device. The transfer efficiency that corresponds to a useful energy exchange may be system or application dependent. For example, high power vehicle charging applications that transfer kilowatts of power may need to be at least 80% efficient in order to supply useful amounts of power resulting in a useful energy exchange sufficient to recharge a vehicle battery, without significantly heating up various components of the transfer system. In some consumer electronics applications, a useful energy exchange may include any energy transfer efficiencies greater than 10%, or any other amount acceptable to keep rechargeable batteries "topped off" and running for long periods of time. For some wireless sensor applications, transfer efficiencies that are much less than 1% may be adequate for powering multiple low power sensors from a single source located a significant distance from the sensors. For still other applications, where wired power transfer is either impossible or impractical, a wide range of transfer efficiencies may be acceptable for a useful energy exchange and may be said to supply useful power to devices in those applications. In general, an operating distance is any distance over which a useful energy exchange is or can be maintained according to the principles disclosed herein.

A useful energy exchange for a wireless energy transfer in a powering or recharging application may be efficient, highly efficient, or efficient enough, as long as the wasted energy levels, heat dissipation, and associated field strengths are within tolerable limits. The tolerable limits may depend on the application, the environment and the system location. Wireless energy transfer for powering or recharging applications may be efficient, highly efficient, or efficient enough, as long as the desired system performance may be attained for the reasonable cost restrictions, weight restrictions, size restrictions, and the like. Efficient energy transfer may be determined relative to that which could be achieved using traditional inductive techniques that are not high-Q systems. Then, the energy transfer may be defined as being efficient, highly efficient, or efficient enough, if more energy is delivered than could be delivered by similarly sized coil structures in traditional inductive schemes over similar distances or alignment offsets.

Note that, even though certain frequency and Q matching conditions may optimize the system efficiency of energy transfer, these conditions may not need to be exactly met in order to have efficient enough energy transfer for a useful energy exchange. Efficient energy exchange may be realized so long as the relative offset of the resonant frequencies $(|\omega_m-\omega_n|/\sqrt{\omega_m\omega_n})$ is less than approximately the maximum among $1/Q_{m(p)}$, $1/Q_{n(p)}$ and $k_{mn(p)}$. The Q matching condition may be less critical than the frequency matching condition for efficient energy exchange. The degree by which the strong-loading factors, $U_{m[l]}$, of the resonators due to generators and/or loads may be away from their optimal values and still have efficient enough energy exchange depends on the particular system, whether all or some of the generators and/or loads are Q-mismatched and so on.

Therefore, the resonant frequencies of the resonators may not be exactly matched, but may be matched within the above tolerances. The strong-loading factors of at least some of the resonators due to generators and/or loads may not be exactly matched to their optimal value. The voltage levels, current levels, impedance values, material parameters, and the like may not be at the exact values described in the disclosure but will be within some acceptable tolerance of those values. The system optimization may include cost, size, weight, complexity, and the like, considerations, in addition to efficiency, Q, frequency, strong coupling factor, and the like, considerations. Some system performance parameters, specifications, and designs may be far from optimal in order to optimize other system performance parameters, specifications and designs.

In some applications, at least some of the system parameters may be varying in time, for example because components, such as sources or devices, may be mobile or aging or because the loads may be variable or because the perturbations or the environmental conditions are changing etc. In these cases, in order to achieve acceptable matching conditions, at least some of the system parameters may need to be dynamically adjustable or tunable. All the system parameters may be dynamically adjustable or tunable to achieve approximately the optimal operating conditions. However, based on the discussion above, efficient enough energy exchange may be realized even if some system parameters are not variable. In some examples, at least some of the devices may not be dynamically adjusted. In some examples, at least some of the sources may not be dynamically adjusted. In some examples, at least some of the intermediate resonators may not be dynamically adjusted. In some examples, none of the system parameters may be dynamically adjusted.

Electromagnetic Resonators

The resonators used to exchange energy may be electromagnetic resonators. In such resonators, the intrinsic energy decay rates, $\Gamma_m$, are given by the absorption (or resistive) losses and the radiation losses of the resonator.

The resonator may be constructed such that the energy stored by the electric field is primarily confined within the structure and that the energy stored by the magnetic field is primarily in the region surrounding the resonator. Then, the energy exchange is mediated primarily by the resonant magnetic near-field. These types of resonators may be referred to as magnetic resonators.

The resonator may be constructed such that the energy stored by the magnetic field is primarily confined within the structure and that the energy stored by the electric field is primarily in the region surrounding the resonator. Then, the energy exchange is mediated primarily by the resonant electric near-field. These types of resonators may be referred to as electric resonators.

Note that the total electric and magnetic energies stored by the resonator have to be equal, but their localizations may be quite different. In some cases, the ratio of the average electric field energy to the average magnetic field energy specified at a distance from a resonator may be used to characterize or describe the resonator.

Electromagnetic resonators may include an inductive element, a distributed inductance, or a combination of inductances with inductance, L, and a capacitive element, a distributed capacitance, or a combination of capacitances, with capacitance, C. A minimal circuit model of an electromagnetic resonator 102 is shown in FIG. 6a. The resonator may include an inductive element 108 and a capacitive element 104. Provided with initial energy, such as electric field energy stored in the capacitor 104, the system will oscillate as the capacitor discharges transferring energy into magnetic field energy stored in the inductor 108 which in turn transfers energy back into electric field energy stored in the capacitor 104.

The resonators 102 shown in FIGS. 6(b)(c)(d) may be referred to as magnetic resonators. Magnetic resonators may be preferred for wireless energy transfer applications in populated environments because most everyday materials including animals, plants, and humans are non-magnetic (i.e., $\mu_r \approx 1$), so their interaction with magnetic fields is minimal and due primarily to eddy currents induced by the time-variation of the magnetic fields, which is a second-order effect. This characteristic is important both for safety reasons and because it reduces the potential for interactions with extraneous environmental objects and materials that could alter system performance.

FIG. 6d shows a simplified drawing of some of the electric and magnetic field lines associated with an exemplary magnetic resonator 102B. The magnetic resonator 102B may include a loop of conductor acting as an inductive element 108 and a capacitive element 104 at the ends of the conductor loop. Note that this drawing depicts most of the energy in the region surrounding the resonator being stored in the magnetic field, and most of the energy in the resonator (between the capacitor plates) stored in the electric field. Some electric field, owing to fringing fields, free charges, and the time varying magnetic field, may be stored in the region around the resonator, but the magnetic resonator may be designed to confine the electric fields to be close to or within the resonator itself, as much as possible.

The inductor 108 and capacitor 104 of an electromagnetic resonator 102 may be bulk circuit elements, or the inductance and capacitance may be distributed and may result from the way the conductors are formed, shaped, or positioned, in the structure. For example, the inductor 108 may be realized by shaping a conductor to enclose a surface area, as shown in FIGS. 6(b)(c)(d). This type of resonator 102 may be referred to as a capacitively-loaded loop inductor. Note that we may use the terms "loop" or "coil" to indicate generally a conducting structure (wire, tube, strip, etc.), enclosing a surface of any shape and dimension, with any number of turns. In FIG. 6b, the enclosed surface area is circular, but the surface may be any of a wide variety of other shapes and sizes and may be designed to achieve certain system performance specifications. As an example to indicate how inductance scales with physical dimensions, the inductance for a length of circular conductor arranged to form a circular single-turn loop is approximately, $$L = \mu_0 x \left( \ln \frac{8x}{a} - 2 \right),$$

where $\mu_0$ is the magnetic permeability of free space, x, is the radius of the enclosed circular surface area and, a, is the radius of the conductor used to form the inductor loop. A more precise value of the inductance of the loop may be calculated analytically or numerically.

The inductance for other cross-section conductors, arranged to form other enclosed surface shapes, areas, sizes, and the like, and of any number of wire turns, may be calculated analytically, numerically or it may be determined by measurement. The inductance may be realized using inductor elements, distributed inductance, networks, arrays, series and parallel combinations of inductors and inductances, and the like. The inductance may be fixed or variable and may be used to vary impedance matching as well as resonant frequency operating conditions.

There are a variety of ways to realize the capacitance required to achieve the desired resonant frequency for a resonator structure. Capacitor plates 110 may be formed and utilized as shown in FIG. 6b, or the capacitance may be distributed and be realized between adjacent windings of a multi-loop conductor 114, as shown in FIG. 6c. The capacitance may be realized using capacitor elements, distributed capacitance, networks, arrays, series and parallel combinations of capacitances, and the like. The capacitance may be fixed or variable and may be used to vary impedance matching as well as resonant frequency operating conditions.

It is to be understood that the inductance and capacitance in an electromagnetic resonator 102 may be lumped, distributed, or a combination of lumped and distributed inductance and capacitance and that electromagnetic resonators may be realized by combinations of the various elements, techniques and effects described herein.

Electromagnetic resonators 102 may be include inductors, inductances, capacitors, capacitances, as well as additional circuit elements such as resistors, diodes, switches, amplifiers, diodes, transistors, transformers, conductors, connectors and the like.

Resonant Frequency of an Electromagnetic Resonator

An electromagnetic resonator 102 may have a characteristic, natural, or resonant frequency determined by its physical properties. This resonant frequency is the frequency at which the energy stored by the resonator oscillates between that stored by the electric field, $W_E$, ($W_E=q^2/2C$, where q is the charge on the capacitor, C) and that stored by the magnetic field, $W_B$, ($W_B=Li^2/2$, where i is the current through the inductor, L) of the resonator. In the absence of any losses in the system, energy would continually be exchanged between the electric field in the capacitor 104 and the magnetic field in the inductor 108. The frequency at which this energy is exchanged may be called the characteristic frequency, the natural frequency, or the resonant frequency of the resonator, and is given by ω, $$\omega = 2\pi f = \sqrt{\frac{1}{LC}}.$$

The resonant frequency of the resonator may be changed by tuning the inductance, L, and/or the capacitance, C, of the resonator. The resonator frequency may be design to operate at the so-called ISM (Industrial, Scientific and Medical) frequencies as specified by the FCC. The resonator frequency may be chosen to meet certain field limit specifications, specific absorption rate (SAR) limit specifications, electromagnetic compatibility (EMC) specifications, electromagnetic interference (EMI) specifications, component size, cost or performance specifications, and the like.

Quality Factor of an Electromagnetic Resonator

Figure 6:
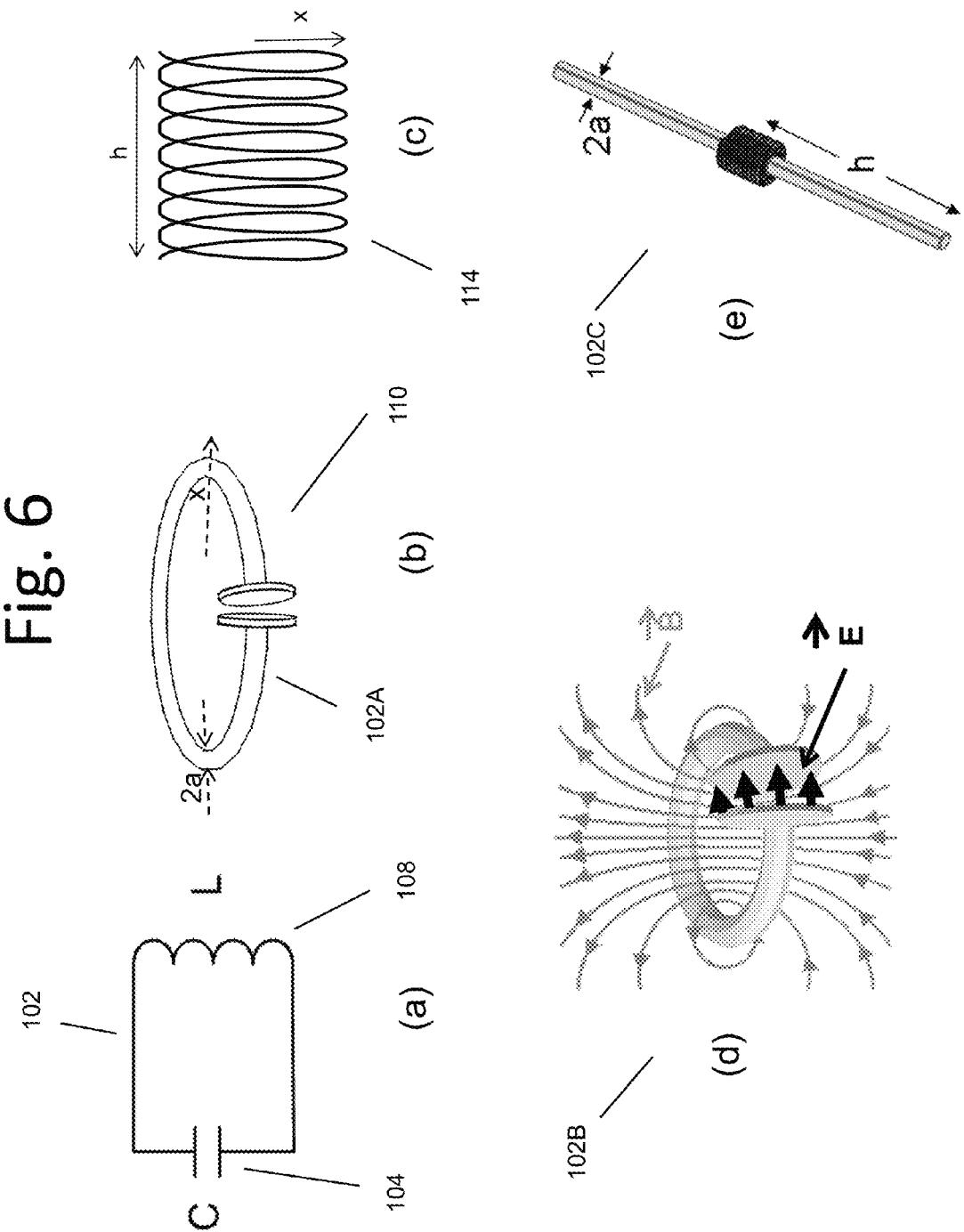
FIG. 6 (a) shows a circuit diagram of one example of a resonator (b) shows a diagram of one example of a capacitively-loaded inductor loop magnetic resonator, (c) shows a drawing of a self-resonant coil with distributed capacitance and inductance, (d) shows a simplified drawing of the electric and magnetic field lines associated with an exemplary magnetic resonator of the current disclosure, and (e) shows a diagram of one example of an electric resonator.

The energy in the resonators 102 shown in FIG. 6 may decay or be lost by intrinsic losses including absorptive losses (also called ohmic or resistive losses) and/or radiative losses. The Quality Factor, or Q, of the resonator, which characterizes the energy decay, is inversely proportional to these losses. Absorptive losses may be caused by the finite conductivity of the conductor used to form the inductor as well as by losses in other elements, components, connectors, and the like, in the resonator. An inductor formed from low loss materials may be referred to as a "high-Q inductive element" and elements, components, connectors and the like with low losses may be referred to as having "high resistive Q's". In general, the total absorptive loss for a resonator may be calculated as the appropriate series and/or parallel combination of resistive losses for the various elements and components that make up the resonator. That is, in the absence of any significant radiative or component/connection losses, the Q of the resonator may be given by, $Q_{abs}$, $$Q_{abs} = \frac{\omega L}{R_{abs}},$$

where ω, is the resonant frequency, L, is the total inductance of the resonator and the resistance for the conductor used to form the inductor, for example, may be given by $R_{abs}=l\rho/A$, (l is the length of the wire, ρ is the resistivity of the conductor material, and A is the cross-sectional area over which current flows in the wire). For alternating currents, the cross-sectional area over which current flows may be less than the physical cross-sectional area of the conductor owing to the skin effect. Therefore, high-Q magnetic resonators may be composed of conductors with high conductivity, relatively large surface areas and/or with specially designed profiles (e.g. Litz wire) to minimize proximity effects and reduce the AC resistance.

The magnetic resonator structures may include high-Q inductive elements composed of high conductivity wire, coated wire, Litz wire, ribbon, strapping or plates, tubing, paint, gels, traces, and the like. The magnetic resonators may be self-resonant, or they may include external coupled elements such as capacitors, inductors, switches, diodes, transistors, transformers, and the like. The magnetic resonators may include distributed and lumped capacitance and inductance. In general, the Q of the resonators will be determined by the Q's of all the individual components of the resonator.

Because Q is proportional to inductance, L, resonators may be designed to increase L, within certain other constraints. One way to increase L, for example, is to use more than one turn of the conductor to form the inductor in the resonator. Design techniques and trade-offs may depend on the application, and a wide variety of structures, conductors, components, and resonant frequencies may be chosen in the design of high-Q magnetic resonators.

In the absence of significant absorption losses, the Q of the resonator may be determined primarily by the radiation losses, and given by, $Q_{rad}=\omega L/R_{rad}$, where $R_{rad}$ is the radiative loss of the resonator and may depend on the size of the resonator relative to the frequency, $\omega$, or wavelength, $\lambda$, of operation. For the magnetic resonators discussed above, radiative losses may scale as $R_{rad} \sim (x/\lambda)^4$ (characteristic of magnetic dipole radiation), where x is a characteristic dimension of the resonator, such as the radius of the inductive element shown in FIG. 6b, and where $\lambda=c/f$, where c is the speed of light and f is as defined above. The size of the magnetic resonator may be much less than the wavelength of operation so radiation losses may be very small. Such structures may be referred to as sub-wavelength resonators. Radiation may be a loss mechanism for non-radiative wireless energy transfer systems and designs may be chosen to reduce or minimize $R_{rad}$. Note that a high-$Q_{rad}$ may be desirable for non-radiative wireless energy transfer schemes.

Note too that the design of resonators for non-radiative wireless energy transfer differs from antennas designed for communication or far-field energy transmission purposes. Specifically, capacitively-loaded conductive loops may be used as resonant antennas (for example in cell phones), but those operate in the far-field regime where the radiation Q's are intentionally designed to be small to make the antenna efficient at radiating energy. Such designs are not appropriate for the efficient near-field wireless energy transfer technique disclosed in this application.

Figure 7:
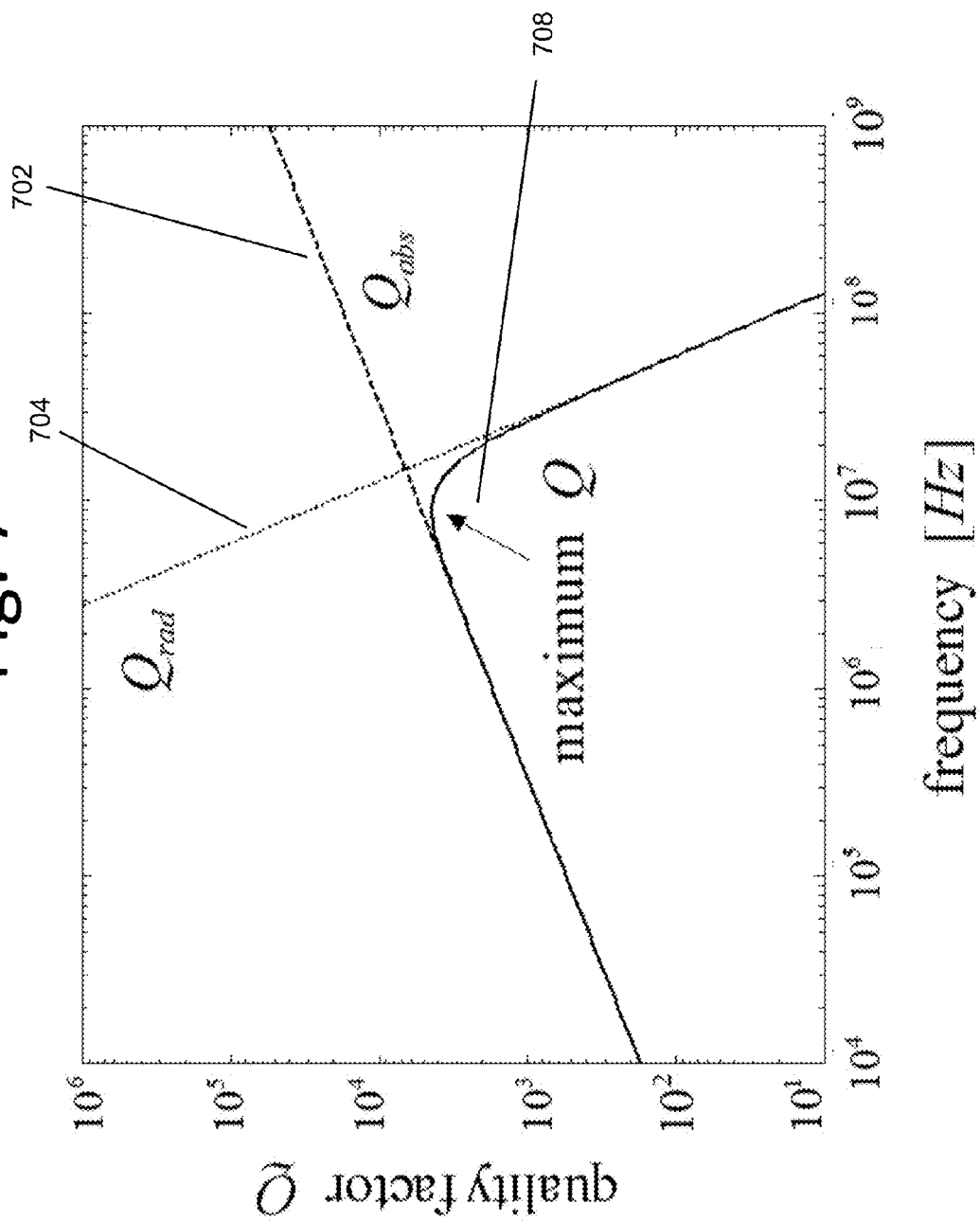
FIG. 7 shows a plot of the "quality factor", Q (solid line), as a function of frequency, of an exemplary resonator that may be used for wireless power transmission at MHz frequencies. The absorptive Q (dashed line) increases with frequency, while the radiative Q (dotted line) decreases with frequency, thus leading the overall Q to peak at a particular frequency.

The quality factor of a resonator including both radiative and absorption losses is $Q=\omega L/(R_{abs}+R_{rad})$. Note that there may be a maximum Q value for a particular resonator and that resonators may be designed with special consideration given to the size of the resonator, the materials and elements used to construct the resonator, the operating frequency, the connection mechanisms, and the like, in order to achieve a high-Q resonator. FIG. 7 shows a plot of Q of an exemplary magnetic resonator (in this case a coil with a diameter of 60 cm made of copper pipe with an outside diameter (OD) of 4 cm) that may be used for wireless power transmission at MHz frequencies. The absorptive Q (dashed line) 702 increases with frequency, while the radiative Q (dotted line) 704 decreases with frequency, thus leading the overall Q to peak 708 at a particular frequency. Note that the Q of this exemplary resonator is greater than 100 over a wide frequency range. Magnetic resonators may be designed to have high-Q over a range of frequencies and system operating frequency may set to any frequency in that range.

When the resonator is being described in terms of loss rates, the Q may be defined using the intrinsic decay rate, $2\Gamma$, as described previously. The intrinsic decay rate is the rate at which an uncoupled and undriven resonator loses energy. For the magnetic resonators described above, the intrinsic loss rate may be given by $\Gamma=(R_{abs}+R_{rad})/2L$, and the quality factor, Q, of the resonator is given by $Q=\omega/2\Gamma$.

Note that a quality factor related only to a specific loss mechanism may be denoted as $Q_{mechanism}$, if the resonator is not specified, or as $Q_{1,mechanism}$, if the resonator is specified (e.g. resonator 1). For example, $Q_{1,rad}$ is the quality factor for resonator 1 related to its radiation losses.

Electromagnetic Resonator Near-Fields

The high-Q electromagnetic resonators used in the near-field wireless energy transfer system disclosed here may be sub-wavelength objects. That is, the physical dimensions of the resonator may be much smaller than the wavelength corresponding to the resonant frequency. Sub-wavelength magnetic resonators may have most of the energy in the region surrounding the resonator stored in their magnetic near-fields, and these fields may also be described as stationary or non-propagating because they do not radiate away from the resonator. The extent of the near-field in the area surrounding the resonator is typically set by the wavelength, so it may extend well beyond the resonator itself for a sub-wavelength resonator. The limiting surface, where the field behavior changes from near-field behavior to far-field behavior may be called the "radiation caustic".

The strength of the near-field is reduced the farther one gets away from the resonator. While the field strength of the resonator near-fields decays away from the resonator, the fields may still interact with objects brought into the general vicinity of the resonator. The degree to which the fields interact depends on a variety of factors, some of which may be controlled and designed, and some of which may not. The wireless energy transfer schemes described herein may be realized when the distance between coupled resonators is such that one resonator lies within the radiation caustic of the other.

The near-field profiles of the electromagnetic resonators may be similar to those commonly associated with dipole resonators or oscillators. Such field profiles may be described as omni-directional, meaning the magnitudes of the fields are non-zero in all directions away from the object.

Characteristic Size of an Electromagnetic Resonator

Spatially separated and/or offset magnetic resonators of sufficient Q may achieve efficient wireless energy transfer over distances that are much larger than have been seen in the prior art, even if the sizes and shapes of the resonator structures are different. Such resonators may also be operated to achieve more efficient energy transfer than was achievable with previous techniques over shorter range distances. We describe such resonators as being capable of mid-range energy transfer.

Mid-range distances may be defined as distances that are larger than the characteristic dimension of the smallest of the resonators involved in the transfer, where the distance is measured from the center of one resonator structure to the center of a spatially separated second resonator structure. In this definition, two-dimensional resonators are spatially separated when the areas circumscribed by their inductive elements do not intersect and three-dimensional resonators are spatially separated when their volumes do not intersect. A two-dimensional resonator is spatially separated from a three-dimensional resonator when the area circumscribed by the former is outside the volume of the latter.

Figure 8:
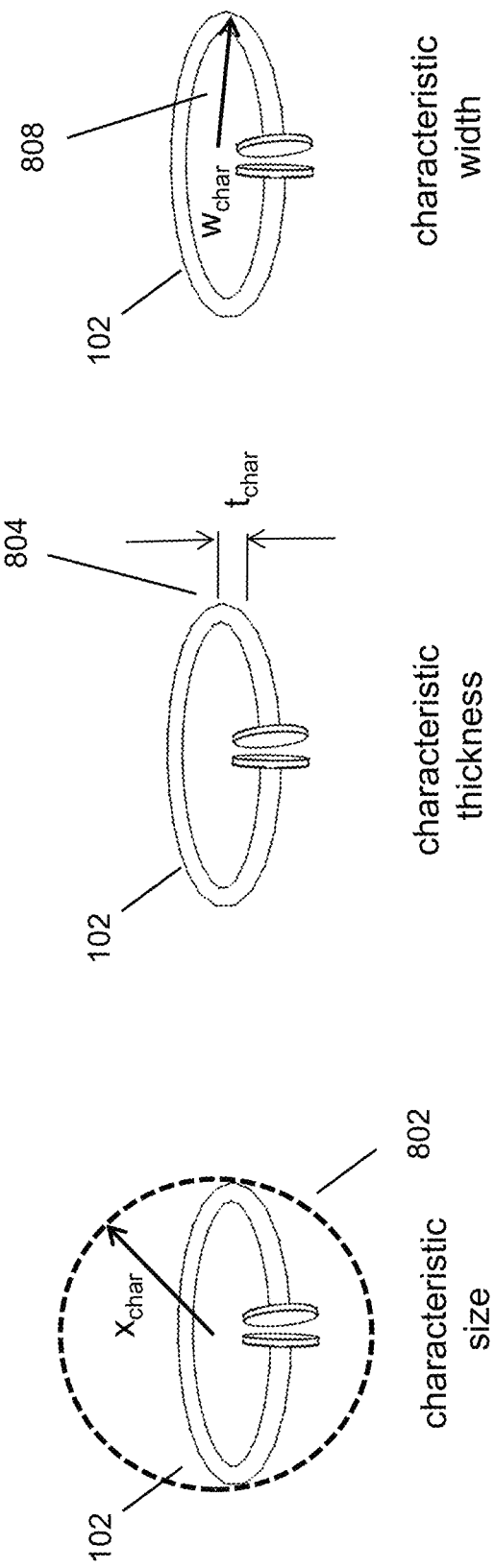
FIG. 8 shows a drawing of a resonator structure with its characteristic size, thickness and width indicated.

FIG. 8 shows some example resonators with their characteristic dimensions labeled. It is to be understood that the characteristic sizes 802 of resonators 102 may be defined in terms of the size of the conductor and the area circumscribed or enclosed by the inductive element in a magnetic resonator and the length of the conductor forming the capacitive element of an electric resonator. Then, the characteristic size 802 of a resonator 102, $x_{char}$, may be equal to the radius of the smallest sphere that can fit around the inductive or capacitive element of the magnetic or electric resonator respectively, and the center of the resonator structure is the center of the sphere. The characteristic thickness 804, $t_{char}$, of a resonator 102 may be the smallest possible height of the highest point of the inductive or capacitive element in the magnetic or capacitive resonator respectively, measured from a flat surface on which it is placed. The characteristic width 808 of a resonator 102, $w_{char}$, may be the radius of the smallest possible circle through which the inductive or capacitive element of the magnetic or electric resonator respectively, may pass while traveling in a straight line. For example, the characteristic width 808 of a cylindrical resonator may be the radius of the cylinder.

In this inventive wireless energy transfer technique, energy may be exchanged efficiently over a wide range of distances, but the technique is distinguished by the ability to exchange useful energy for powering or recharging devices over mid-range distances and between resonators with different physical dimensions, components and orientations. Note that while k may be small in these circumstances, strong coupling and efficient energy transfer may be realized by using high-Q resonators to achieve a high U, $U=k\sqrt{Q_sQ_d}$. That is, increases in Q may be used to at least partially overcome decreases in k, to maintain useful energy transfer efficiencies.

Note too that while the near-field of a single resonator may be described as omni-directional, the efficiency of the energy exchange between two resonators may depend on the relative position and orientation of the resonators. That is, the efficiency of the energy exchange may be maximized for particular relative orientations of the resonators. The sensitivity of the transfer efficiency to the relative position and orientation of two uncompensated resonators may be captured in the calculation of either k or κ. While coupling may be achieved between resonators that are offset and/or rotated relative to each other, the efficiency of the exchange may depend on the details of the positioning and on any feedback, tuning, and compensation techniques implemented during operation.

High-Q Magnetic Resonators

In the near-field regime of a sub-wavelength capacitively-loaded loop magnetic resonator ($x \ll \lambda$), the resistances associated with a circular conducting loop inductor composed of N turns of wire whose radius is larger than the skin depth, are approximately $R_{abs}=\sqrt{\mu_0\rho\omega/2}\cdot Nx/a$ and $R_{rad}=\pi/6\cdot\eta_0N^2(\omega x/c)^4$, where ρ is the resistivity of the conductor material and $\eta_0 120\pi\Omega$ is the impedance of free space. The inductance, L, for such a N-turn loop is approximately $N^2$ times the inductance of a single-turn loop given previously. The quality factor of such a resonator, $Q=\omega L/(R_{abs}+R_{rad})$, is highest for a particular frequency determined by the system parameters (FIG. 4). As described previously, at lower frequencies the Q is determined primarily by absorption losses and at higher frequencies the Q is determined primarily by radiation losses.

Note that the formulas given above are approximate and intended to illustrate the functional dependence of $R_{abs}$, $R_{rad}$ and L on the physical parameters of the structure. More accurate numerical calculations of these parameters that take into account deviations from the strict quasi-static limit, for example a non-uniform current/charge distribution along the conductor, may be useful for the precise design of a resonator structure.

Note that the absorptive losses may be minimized by using low loss conductors to form the inductive elements. The loss of the conductors may be minimized by using large surface area conductors such as conductive tubing, strapping, strips, machined objects, plates, and the like, by using specially designed conductors such as Litz wire, braided wires, wires of any cross-section, and other conductors with low proximity losses, in which case the frequency scaled behavior described above may be different, and by using low resistivity materials such as high-purity copper and silver, for example. One advantage of using conductive tubing as the conductor at higher operating frequencies is that it may be cheaper and lighter than a similar diameter solid conductor, and may have similar resistance because most of the current is traveling along the outer surface of the conductor owing to the skin effect.

To get a rough estimate of achievable resonator designs made from copper wire or copper tubing and appropriate for operation in the microwave regime, one may calculate the optimum Q and resonant frequency for a resonator composed of one circular inductive element (N=1) of copper wire ($\rho=1.69\cdot 10^{-8}$ Ωm) with various cross sections. Then for an inductive element with characteristic size x=1 cm and conductor diameter a=1 mm, appropriate for a cell phone for example, the quality factor peaks at Q=1225 when f=380 MHz. For x=30 cm and a=2 mm, an inductive element size that might be appropriate for a laptop or a household robot, Q=1103 at f=17 MHz. For a larger source inductive element that might be located in the ceiling for example, x=1 m and a=4 mm, Q may be as high as Q=1315 at f=5 MHz. Note that a number of practical examples yield expected quality factors of Q≈1000-1500 at λ/x≈50-80. Measurements of a wider variety of coil shapes, sizes, materials and operating frequencies than described above show that Q's>100 may be realized for a variety of magnetic resonator structures using commonly available materials.

As described above, the rate for energy transfer between two resonators of characteristic size $x_1$ and $x_2$, and separated by a distance D between their centers, may be given by κ. To give an example of how the defined parameters scale, consider the cell phone, laptop, and ceiling resonator examples from above, at three (3) distances; D/x=10, 8, 6. In the examples considered here, the source and device resonators are the same size, $x_1=x_2$, and shape, and are oriented as shown in FIG. 1(b). In the cell phone example, ω/2κ=3033, 1553, 655 respectively. In the laptop example, ω/2κ=7131, 3651, 1540 respectively and for the ceiling resonator example, ω/2κ=6481, 3318, 1400. The corresponding coupling-to-loss ratios peak at the frequency where the inductive element Q peaks and are κ/Γ=0.4, 0.79, 1.97 and 0.15, 0.3, 0.72 and 0.2, 0.4, 0.94 for the three inductive element sizes and distances described above. An example using different sized inductive elements is that of an $x_1=1$ m inductor (e.g. source in the ceiling) and an $x_2=30$ cm inductor (e.g. household robot on the floor) at a distance D=3 m apart (e.g. room height). In this example, the strong-coupling figure of merit, $U=\kappa/\sqrt{\Gamma_1\Gamma_2}=0.88$, for an efficiency of approximately 14%, at the optimal operating frequency of f=6.4 MHz. Here, the optimal system operating frequency lies between the peaks of the individual resonator Q's.

Figure 9:
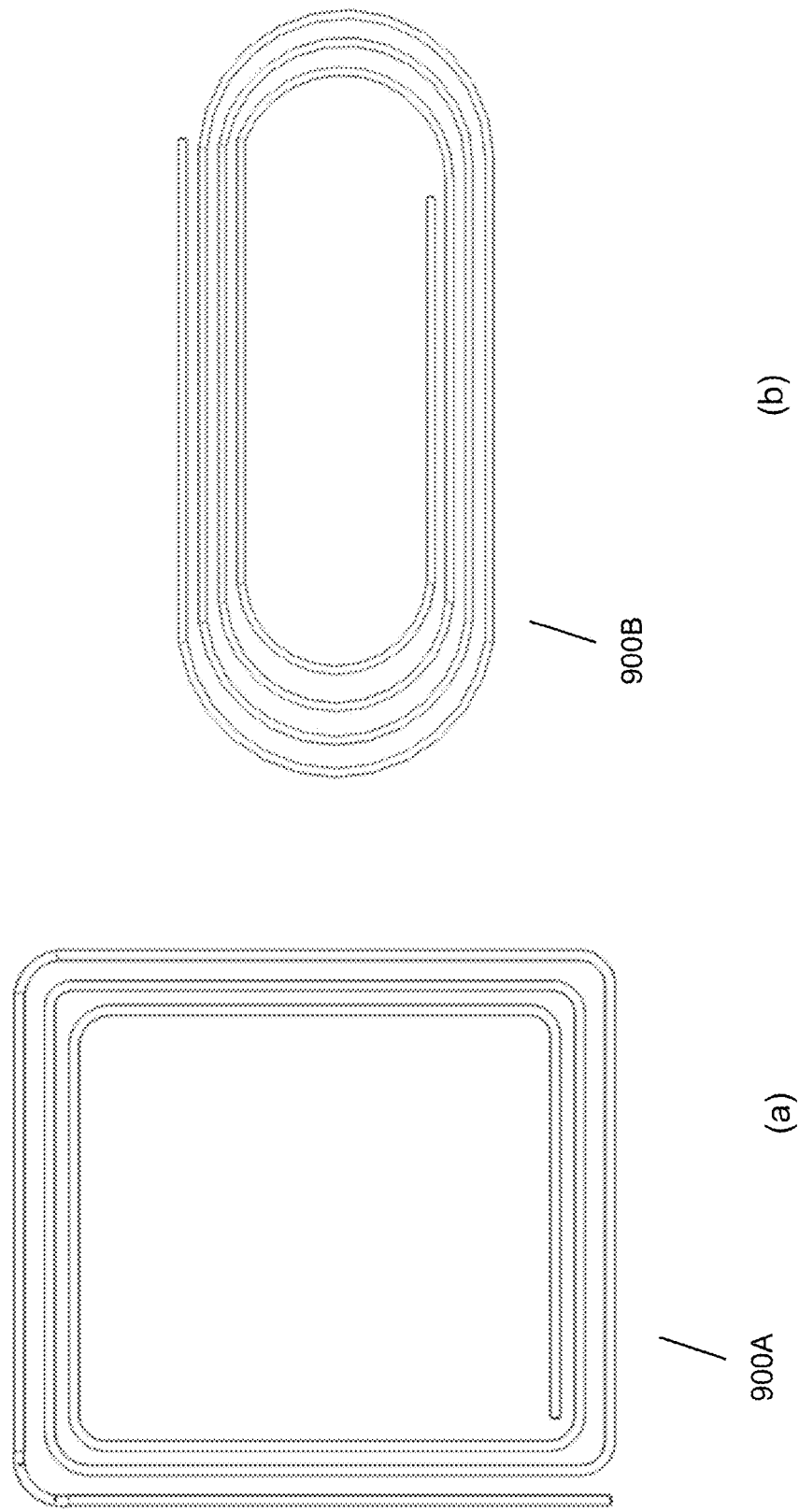
FIGS. 9 (a) and (b) show drawings of exemplary inductive loop elements.

Inductive elements may be formed for use in high-Q magnetic resonators. We have demonstrated a variety of high-Q magnetic resonators based on copper conductors that are formed into inductive elements that enclose a surface. Inductive elements may be formed using a variety of conductors arranged in a variety of shapes, enclosing any size or shaped area, and they may be single turn or multiple turn elements. Drawings of exemplary inductive elements 900A-B are shown in FIG. 9. The inductive elements may be formed to enclose a circle, a rectangle, a square, a triangle, a shape with rounded corners, a shape that follows the contour of a particular structure or device, a shape that follows, fills, or utilizes, a dedicated space within a structure or device, and the like. The designs may be optimized for size, cost, weight, appearance, performance, and the like.

These conductors may be bent or formed into the desired size, shape, and number of turns. However, it may be difficult to accurately reproduce conductor shapes and sizes using manual techniques. In addition, it may be difficult to maintain uniform or desired center-to-center spacings between the conductor segments in adjacent turns of the inductive elements. Accurate or uniform spacing may be important in determining the self capacitance of the structure as well as any proximity effect induced increases in AC resistance, for example.

Molds may be used to replicate inductor elements for high-Q resonator designs. In addition, molds may be used to accurately shape conductors into any kind of shape without creating kinks, buckles or other potentially deleterious effects in the conductor. Molds may be used to form the inductor elements and then the inductor elements may be removed from the forms. Once removed, these inductive elements may be built into enclosures or devices that may house the high-Q magnetic resonator. The formed elements may also or instead remain in the mold used to form them.

The molds may be formed using standard CNC (computer numerical control) routing or milling tools or any other known techniques for cutting or forming grooves in blocks. The molds may also or instead be formed using machining techniques, injection molding techniques, casting techniques, pouring techniques, vacuum techniques, thermoforming techniques, cut-in-place techniques, compression forming techniques and the like.

The formed element may be removed from the mold or it may remain in the mold. The mold may be altered with the inductive element inside. The mold may be covered, machined, attached, painted and the like. The mold and conductor combination may be integrated into another housing, structure or device. The grooves cut into the molds may be any dimension and may be designed to form conducting tubing, wire, strapping, strips, blocks, and the like into the desired inductor shapes and sizes.

The inductive elements used in magnetic resonators may contain more than one loop and may spiral inward or outward or up or down or in some combination of directions. In general, the magnetic resonators may have a variety of shapes, sizes and number of turns and they may be composed of a variety of conducing materials.

The magnetic resonators may be free standing or they may be enclosed in an enclosure, container, sleeve or housing. The magnetic resonators may include the form used to make the inductive element. These various forms and enclosures may be composed of almost any kind of material. Low loss materials such as Teflon, REXOLITE, styrene, and the like may be preferable for some applications. These enclosures may contain fixtures that hold the inductive elements.

Magnetic resonators may be composed of self-resonant coils of copper wire or copper tubing. Magnetic resonators composed of self resonant conductive wire coils may include a wire of length l, and cross section radius a, wound into a helical coil of radius x, height h, and number of turns N, which may for example be characterized as $N=\sqrt{l^2-h^2}/2\pi x$.

A magnetic resonator structure may be configured so that x is about 30 cm, h is about 20 cm, a is about 3 mm and N is about 5.25, and, during operation, a power source coupled to the magnetic resonator may drive the resonator at a resonant frequency, f, where f is about 10.6 MHz. Where x is about 30 cm, h is about 20 cm, a is about 1 cm and N is about 4, the resonator may be driven at a frequency, f, where f is about 13.4 MHz. Where x is about 10 cm, h is about 3 cm, a is about 2 mm and N is about 6, the resonator may be driven at a frequency, f, where f is about 21.4 MHz.

High-Q inductive elements may be designed using printed circuit board traces. Printed circuit board traces may have a variety of advantages compared to mechanically formed inductive elements including that they may be accurately reproduced and easily integrated using established printed circuit board fabrication techniques, that their AC resistance may be lowered using custom designed conductor traces, and that the cost of mass-producing them may be significantly reduced.

High-Q inductive elements may be fabricated using standard PCB techniques on any PCB material such as FR-4 (epoxy E-glass), multi-functional epoxy, high performance epoxy, bismalaimide triazine/epoxy, polyimide, Cyanate Ester, polytetraflouroethylene (Teflon), FR-2, FR-3, CEM-1, CEM-2, Rogers, Resolute, and the like. The conductor traces may be formed on printed circuit board materials with lower loss tangents.

The conducting traces may be composed of copper, silver, gold, aluminum, nickel and the like, and they may be composed of paints, inks, or other cured materials. The circuit board may be flexible and it may be a flex-circuit. The conducting traces may be formed by chemical deposition, etching, lithography, spray deposition, cutting, and the like. The conducting traces may be applied to form the desired patterns and they may be formed using crystal and structure growth techniques.

The dimensions of the conducting traces, as well as the number of layers containing conducting traces, the position, size and shape of those traces and the architecture for interconnecting them may be designed to achieve or optimize certain system specifications such as resonator Q, $Q_{(p)}$, resonator size, resonator material and fabrication costs, U, $U_{(p)}$, and the like.

Figure 10:
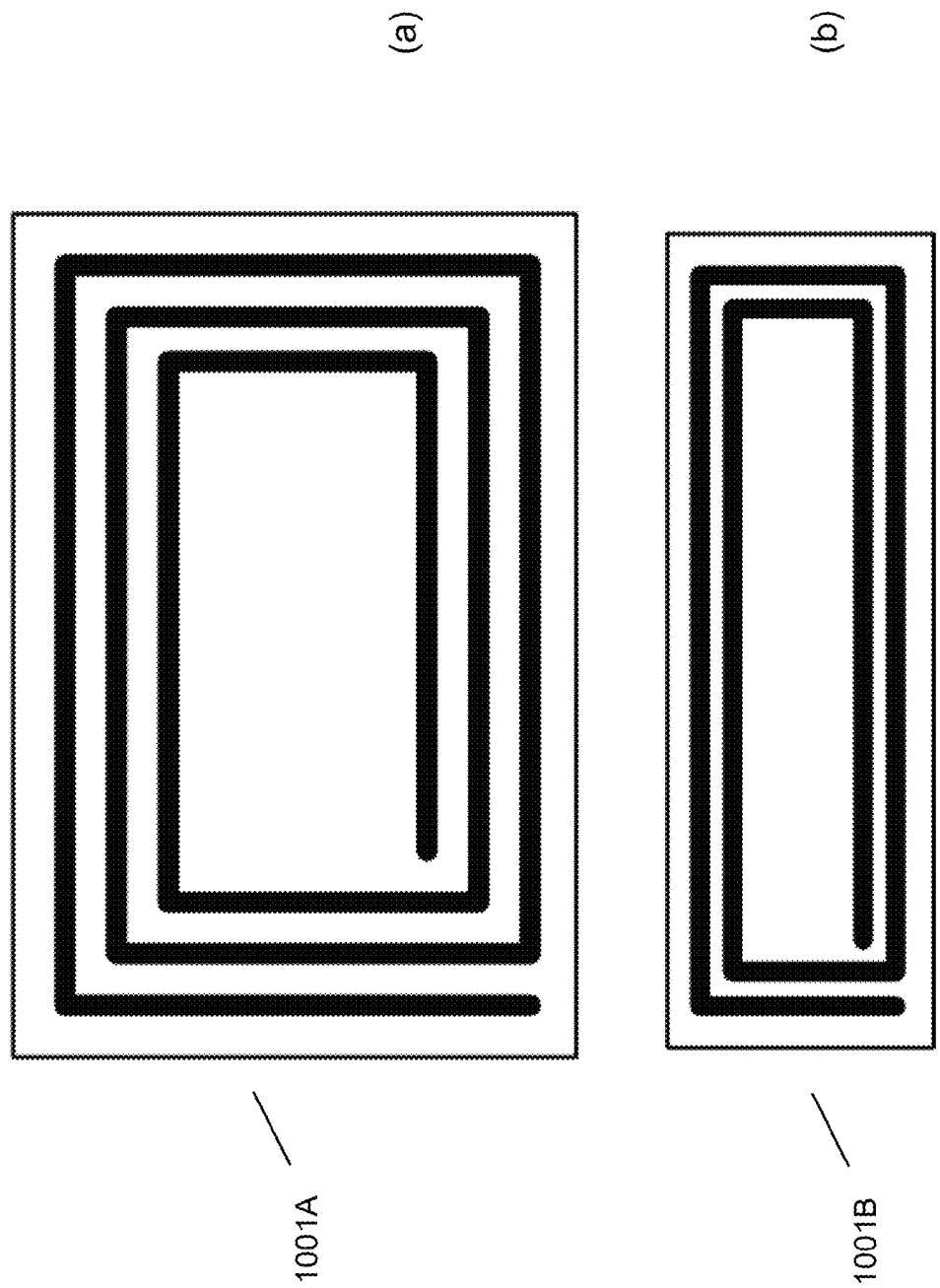
FIGS. 10 (a) and (b) show two examples of trace structures formed on printed circuit boards and used to realize the inductive element in magnetic resonator structures.

As an example, a three-turn high-Q inductive element 1001A was fabricated on a four-layer printed circuit board using the rectangular copper trace pattern as shown in FIG. 10(a). The copper trace is shown in black and the PCB in white. The width and thickness of the copper traces in this example was approximately 1 cm (400 mils) and 43 μm (1.7 mils) respectively. The edge-to-edge spacing between turns of the conducting trace on a single layer was approximately 0.75 cm (300 mils) and each board layer thickness was approximately 100 μm (4 mils). The pattern shown in FIG. 10(a) was repeated on each layer of the board and the conductors were connected in parallel. The outer dimensions of the 3-loop structure were approximately 30 cm by 20 cm. The measured inductance of this PCB loop was 5.3 μH. A magnetic resonator using this inductor element and tunable capacitors had a quality factor, Q, of 550 at its designed resonance frequency of 6.78 MHz. The resonant frequency could be tuned by changing the inductance and capacitance values in the magnetic resonator.

As another example, a two-turn inductor 1001B was fabricated on a four-layer printed circuit board using the rectangular copper trace pattern shown in FIG. 10(b). The copper trace is shown in black and the PCB in white. The width and height of the copper traces in this example were approximately 0.75 cm (300 mils) and 43 μm (1.7 mils) respectively. The edge-to-edge spacing between turns of the conducting trace on a single layer was approximately 0.635 cm (250 mils) and each board layer thickness was approximately 100 μm (4 mils). The pattern shown in FIG. 10(b) was repeated on each layer of the board and the conductors were connected in parallel. The outer dimensions of the two-loop structure were approximately 7.62 cm by 26.7 cm. The measured inductance of this PCB loop was 1.3 μH. Stacking two boards together with a vertical separation of approximately 0.635 cm (250 mils) and connecting the two boards in series produced a PCB inductor with an inductance of approximately 3.4 μH. A magnetic resonator using this stacked inductor loop and tunable capacitors had a quality factor, Q, of 390 at its designed resonance frequency of 6.78 MHz. The resonant frequency could be tuned by changing the inductance and capacitance values in the magnetic resonator.

The inductive elements may be formed using magnetic materials of any size, shape thickness, and the like, and of materials with a wide range of permeability and loss values. These magnetic materials may be solid blocks, they may enclose hollow volumes, they may be formed from many smaller pieces of magnetic material tiled and or stacked together, and they may be integrated with conducting sheets or enclosures made from highly conducting materials. Wires may be wrapped around the magnetic materials to generate the magnetic near-field. These wires may be wrapped around one or more than one axis of the structure. Multiple wires may be wrapped around the magnetic materials and combined in parallel, or in series, or via a switch to form customized near-field patterns.

The magnetic resonator may include 15 turns of Litz wire wound around a 19.2 cm×10 cm×5 mm tiled block of 3F3 ferrite material. The Litz wire may be wound around the ferrite material in any direction or combination of directions to achieve the desire resonator performance. The number of turns of wire, the spacing between the turns, the type of wire, the size and shape of the magnetic materials and the type of magnetic material are all design parameters that may be varied or optimized for different application scenarios.

High-Q Magnetic Resonators Using Magnetic Material Structures

It may be possible to use magnetic materials assembled to form an open magnetic circuit, albeit one with an air gap on the order of the size of the whole structure, to realize a magnetic resonator structure. In these structures, high conductivity materials are wound around a structure made from magnetic material to form the inductive element of the magnetic resonator. Capacitive elements may be connected to the high conductivity materials, with the resonant frequency then determined as described above. These magnetic resonators have their dipole moment in the plane of the two dimensional resonator structures, rather than perpendicular to it, as is the case for the capacitively-loaded inductor loop resonators.

Figure 11:
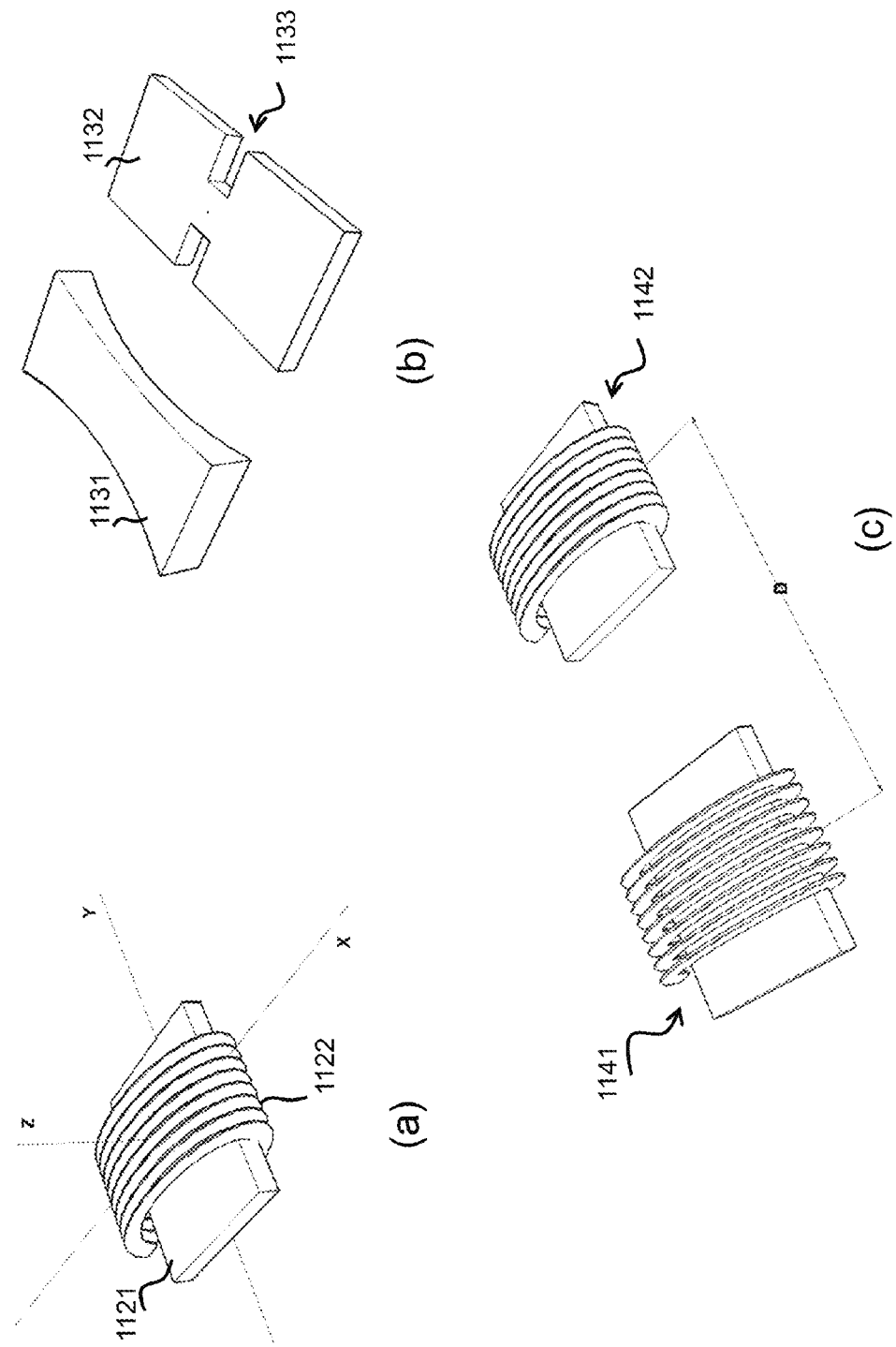
FIG. 11 (a) shows a perspective view diagram of a planar magnetic resonator, (b) shows a perspective view diagram of a two planar magnetic resonator with various geometries, and c) shows is a perspective view diagram of a two planar magnetic resonators separated by a distance D.

A diagram of a single planar resonator structure is shown in FIG. 11(a). The planar resonator structure is constructed of a core of magnetic material 1121, such as ferrite with a loop or loops of conducting material 1122 wrapped around the core 1121. The structure may be used as the source resonator that transfers power and the device resonator that captures energy. When used as a source, the ends of the conductor may be coupled to a power source. Alternating electrical current flowing through the conductor loops excites alternating magnetic fields. When the structure is being used to receive power, the ends of the conductor may be coupled to a power drain or load. Changing magnetic fields induce an electromotive force in the loop or loops of the conductor wound around the core magnetic material. The dipole moment of these types of structures is in the plane of the structures and is, for example, directed along the Y axis for the structure in FIG. 11(a). Two such structures have strong coupling when placed substantially in the same plane (i.e. the X,Y plane of FIG. 11). The structures of FIG. 11(a) have the most favorable orientation when the resonators are aligned in the same plane along their Y axis.

The geometry and the coupling orientations of the described planar resonators may be preferable for some applications. The planar or flat resonator shape may be easier to integrate into many electronic devices that are relatively flat and planar. The planar resonators may be integrated into the whole back or side of a device without requiring a change in geometry of the device. Due to the flat shape of many devices, the natural position of the devices when placed on a surface is to lay with their largest dimension being parallel to the surface they are placed on. A planar resonator integrated into a flat device is naturally parallel to the plane of the surface and is in a favorable coupling orientation relative to the resonators of other devices or planar resonator sources placed on a flat surface.

As mentioned, the geometry of the planar resonators may allow easier integration into devices. Their low profile may allow a resonator to be integrated into or as part of a complete side of a device. When a whole side of a device is covered by the resonator, magnetic flux can flow through the resonator core without being obstructed by lossy material that may be part of the device or device circuitry.

The core of the planar resonator structure may be of a variety of shapes and thicknesses and may be flat or planar such that the minimum dimension does not exceed 30% of the largest dimension of the structure. The core may have complex geometries and may have indentations, notches, ridges, and the like. Geometric enhancements may be used to reduce the coupling dependence on orientation and they may be used to facilitate integration into devices, packaging, packages, enclosures, covers, skins, and the like. Two exemplary variations of core geometries are shown in FIG. 11(b). For example, the planar core 1131 may be shaped such that the ends are substantially wider than the middle of the structure to create an indentation for the conductor winding. The core material may be of varying thickness with ends that are thicker and wider than the middle. The core material 1132 may have any number of notches or cutouts 1133 of various depths, width, and shapes to accommodate conductor loops, housing, packaging, and the like.

The shape and dimensions of the core may be further dictated by the dimensions and characteristics of the device that they are integrated into. The core material may curve to follow the contours of the device, or may require non-symmetric notches or cutouts to allow clearance for parts of the device. The core structure may be a single monolithic piece of magnetic material or may be composed of a plurality of tiles, blocks, or pieces that are arranged together to form the larger structure. The different layers, tiles, blocks, or pieces of the structure may be of similar or may be of different materials. It may be desirable to use materials with different magnetic permeability in different locations of the structure. Core structures with different magnetic permeability may be useful for guiding the magnetic flux, improving coupling, and affecting the shape or extent of the active area of a system.

The conductor of the planar resonator structure may be wound at least once around the core. In certain circumstances, it may be preferred to wind at least three loops. The conductor can be any good conductor including conducting wire, Litz wire, conducting tubing, sheets, strips, gels, inks, traces and the like.

The size, shape, or dimensions of the active area of source may be further enhanced, altered, or modified with the use of materials that block, shield, or guide magnetic fields. To create non-symmetric active area around a source once side of the source may be covered with a magnetic shield to reduce the strength of the magnetic fields in a specific direction. The shield may be a conductor or a layered combination of conductor and magnetic material which can be used to guide magnetic fields away from a specific direction. Structures composed of layers of conductors and magnetic materials may be used to reduce energy losses that may occur due to shielding of the source.

Figure 12:
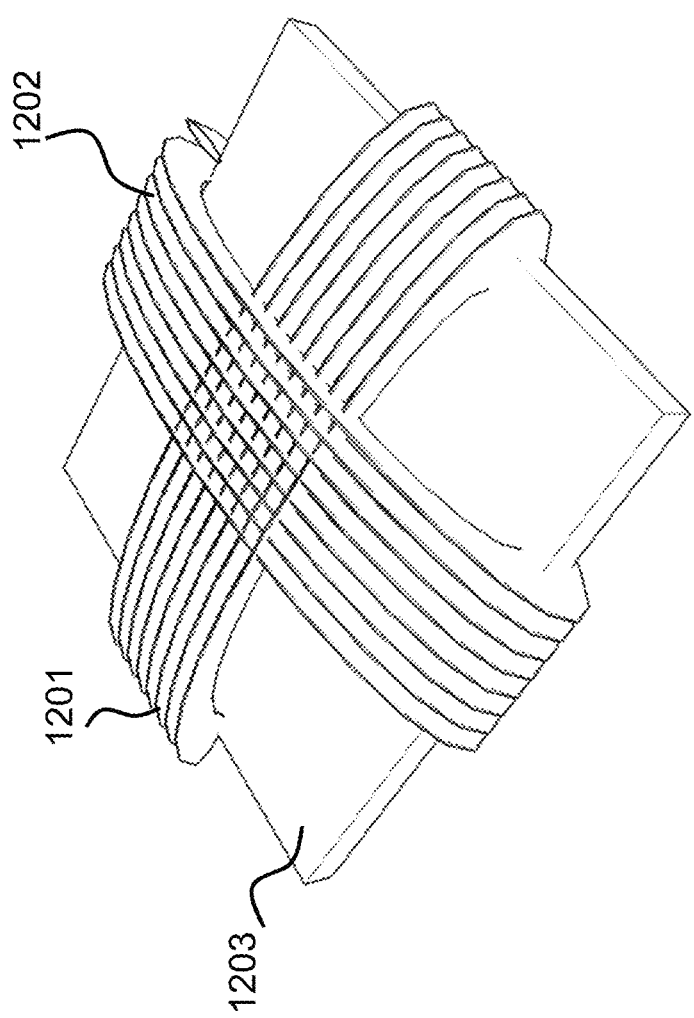
FIG. 12 is a perspective view of an example of a planar magnetic resonator.

The plurality of planar resonators may be integrated or combined into one planar resonator structure. A conductor or conductors may be wound around a core structure such that the loops formed by the two conductors are not coaxial. An example of such a structure is shown in FIG. 12 where two conductors 1201,1202 are wrapped around a planar rectangular core 1203 at orthogonal angles. The core may be rectangular or it may have various geometries with several extensions or protrusions. The protrusions may be useful for wrapping of a conductor, reducing the weight, size, or mass of the core, or may be used to enhance the directionality or omni-directionality of the resonator. A multi wrapped planar resonator with four protrusions is shown by the inner structure 1310 in FIG. 13, where four conductors 1301, 1302, 1303, 1304 are wrapped around the core. The core may have extensions 1305,1306,1307,1308 with one or more conductor loops. A single conductor may be wrapped around a core to form loops that are not coaxial. The four conductor loops of FIG. 13, for example, may be formed with one continuous piece of conductor, or using two conductors where a single conductor is used to make all coaxial loops.

Non-uniform or asymmetric field profiles around the resonator comprising a plurality of conductor loops may be generated by driving some conductor loops with non-identical parameters. Some conductor loops of a source resonator with a plurality of conductor loops may be driven by a power source with a different frequency, voltage, power level, duty cycle, and the like all of which may be used to affect the strength of the magnetic field generated by each conductor.

Figure 13:
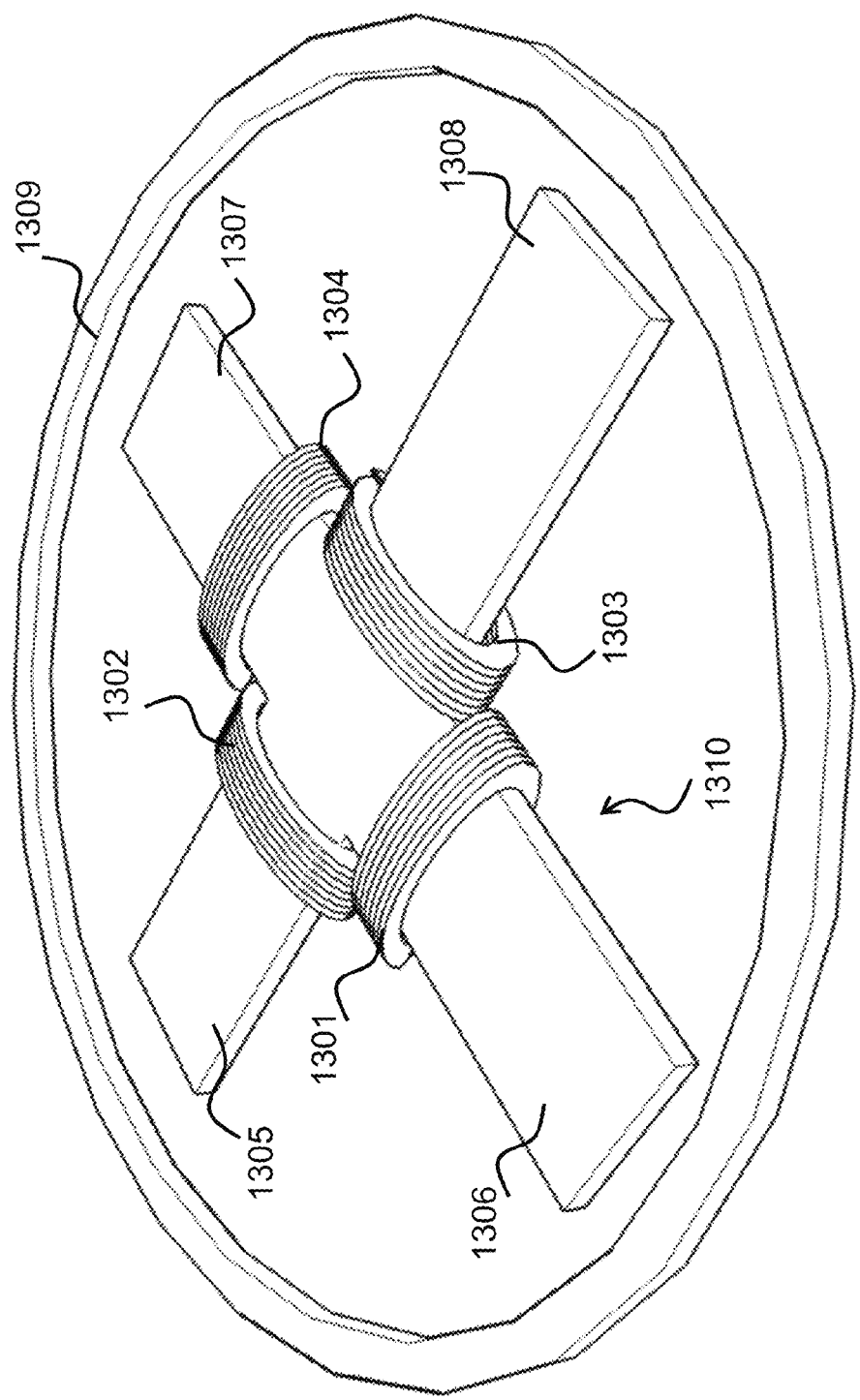
FIG. 13 is a perspective view of a planar magnetic resonator arrangement with a circular resonator coil.

The planar resonator structures may be combined with a capacitively-loaded inductor resonator coil to provide an omni-directional active area all around, including above and below the source while maintaining a flat resonator structure. As shown in FIG. 13, an additional resonator loop coil 1309 comprising of a loop or loops of a conductor, may be placed in a common plane as the planar resonator structure 1310. The outer resonator coil provides an active area that is substantially above and below the source. The resonator coil can be arranged with any number of planar resonator structures and arrangements described herein.

Figure 14:
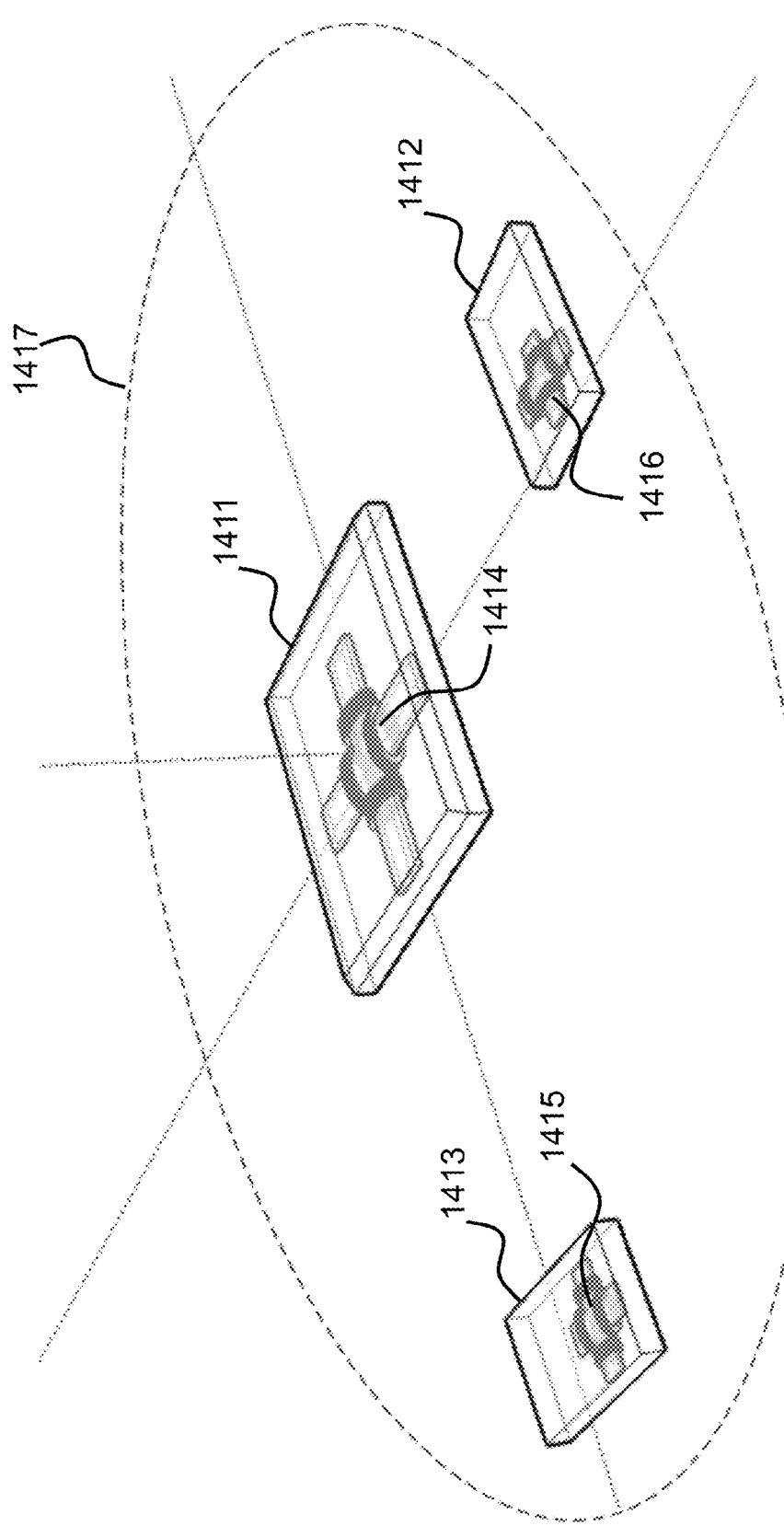
FIG. 14 is a perspective view of an active area of a planar magnetic resonator.

The planar resonator structures may be enclosed in magnetically permeable packaging or integrated into other devices. The planar profile of the resonators within a single, common plane allows packaging and integration into flat devices. A diagram illustrating the application of the resonators is shown in FIG. 14. A flat source 1411 comprising one or more planar resonators 1414 each with one or more conductor loops may transfer power to devices 1412,1413 that are integrated with other planar resonators 1415,1416 and placed within an active area 1417 of the source. The devices may comprise a plurality of planar resonators such that regardless of the orientation of the device with respect to the source the active area of the source does not change. In addition to invariance to rotational misalignment, a flat device comprising of planar resonators may be turned upside down without substantially affecting the active area since the planar resonator is still in the plane of the source.

Figure 15:
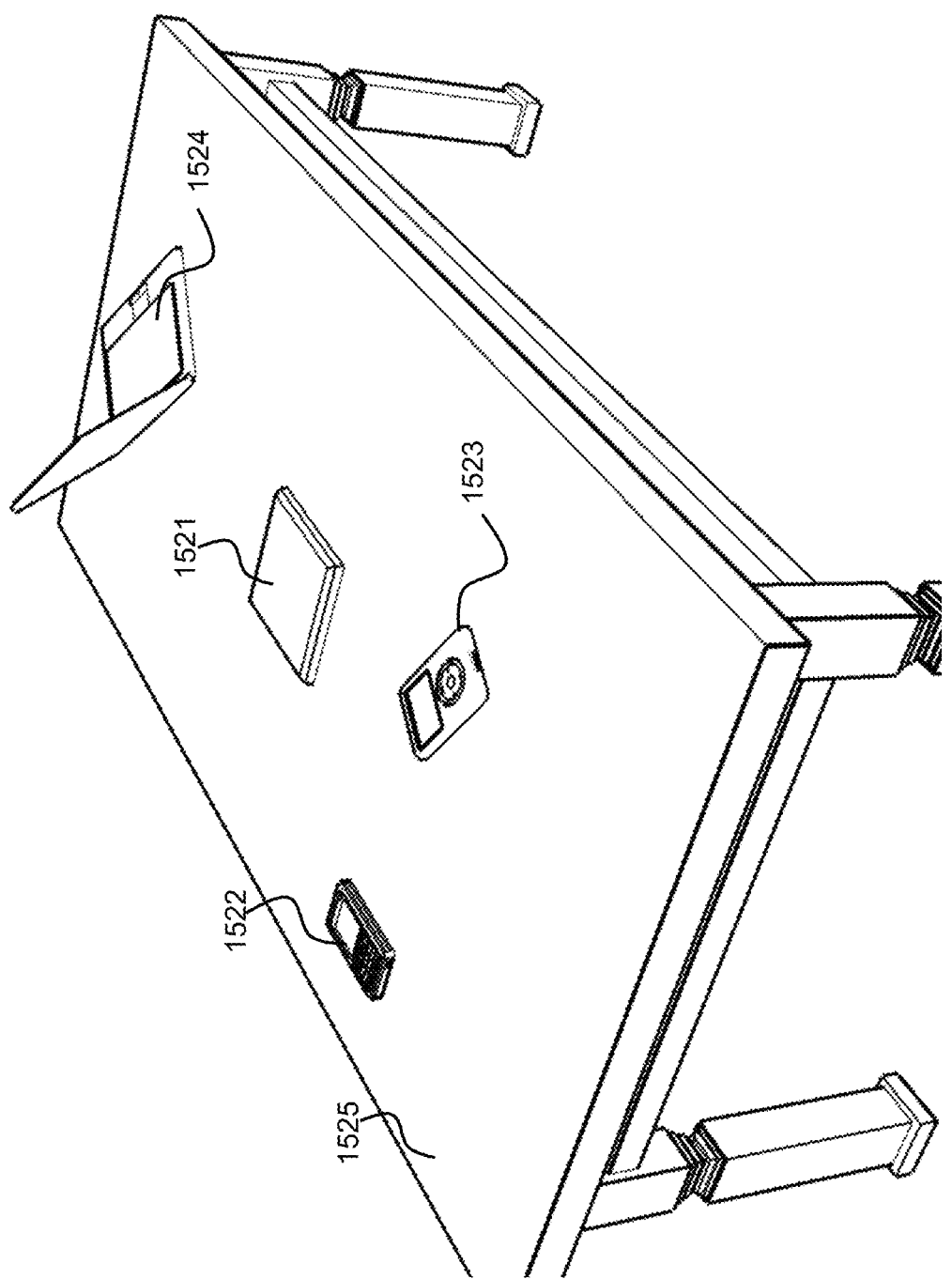
FIG. 15 is a perspective view of an application of the wireless power transfer system with a source at the center of a table powering several devices placed around the source.

Another diagram illustrating a possible use of a power transfer system using the planar resonator structures is shown in FIG. 15. A planar source 1521 placed on top of a surface 1525 may create an active area that covers a substantial surface area creating an "energized surface" area. Devices such as computers 1524, mobile handsets 1522, games, and other electronics 1523 that are coupled to their respective planar device resonators may receive energy from the source when placed within the active area of the source, which may be anywhere on top of the surface. Several devices with different dimensions may be placed in the active area and used normally while charging or being powered from the source without having strict placement or alignment constraints. The source may be placed under the surface of a table, countertop, desk, cabinet, and the like, allowing it to be completely hidden while energizing the top surface of the table, countertop, desk, cabinet and the like, creating an active area on the surface that is much larger than the source.

The source may include a display or other visual, auditory, or vibration indicators to show the direction of charging devices or what devices are being charged, error or problems with charging, power levels, charging time, and the like.

The source resonators and circuitry may be integrated into any number of other devices. The source may be integrated into devices such as clocks, keyboards, monitors, picture frames, and the like. For example, a keyboard integrated with the planar resonators and appropriate power and control circuitry may be used as a source for devices placed around the keyboard such as computer mice, webcams, mobile handsets, and the like without occupying any additional desk space.

While the planar resonator structures have been described in the context of mobile devices it should be clear to those skilled in the art that a flat planar source for wireless power transfer with an active area that extends beyond its physical dimensions has many other consumer and industrial applications. The structures and configuration may be useful for a large number of applications where electronic or electric devices and a power source are typically located, positioned, or manipulated in substantially the same plane and alignment. Some of the possible application scenarios include devices on walls, floor, ceilings or any other substantially planar surfaces.

Flat source resonators may be integrated into a picture frame or hung on a wall thereby providing an active area within the plane of the wall where other electronic devices such as digital picture frames, televisions, lights, and the like can be mounted and powered without wires. Planar resonators may be integrated into a floor resulting in an energized floor or active area on the floor on which devices can be placed to receive power. Audio speakers, lamps, heaters, and the like can be placed within the active are and receive power wirelessly.

The planar resonator may have additional components coupled to the conductor. Components such as capacitors, inductors, resistors, diodes, and the like may be coupled to the conductor and may be used to adjust or tune the resonant frequency and the impedance matching for the resonators.

A planar resonator structure of the type described above and shown in FIG. 11(a), may be created, for example, with a quality factor, Q, of 100 or higher and even Q of 1,000 or higher. Energy may be wirelessly transferred from one planar resonator structure to another over a distance larger than the characteristic size of the resonators, as shown in FIG. 11(c).

In addition to utilizing magnetic materials to realize a structure with properties similar to the inductive element in the magnetic resonators, it may be possible to use a combination of good conductor materials and magnetic material to realize such inductive structures. FIG. 16(a) shows a magnetic resonator structure 1602 that may include one or more enclosures made of high-conductivity materials (the inside of which would be shielded from AC electromagnetic fields generated outside) surrounded by at least one layer of magnetic material and linked by blocks of magnetic material 1604.

A structure may include a high-conductivity sheet of material covered on one side by a layer of magnetic material. The layered structure may instead be applied conformally to an electronic device, so that parts of the device may be covered by the high-conductivity and magnetic material layers, while other parts that need to be easily accessed (such as buttons or screens) may be left uncovered. The structure may also or instead include only layers or bulk pieces of magnetic material. Thus, a magnetic resonator may be incorporated into an existing device without significantly interfering with its existing functions and with little or no need for extensive redesign. Moreover, the layers of good conductor and/or magnetic material may be made thin enough (of the order of a millimeter or less) that they would add little extra weight and volume to the completed device. An oscillating current applied to a length of conductor wound around the structure, as shown by the square loop in the center of the structure in FIG. 16 may be used to excite the electromagnetic fields associated with this structure.

Quality Factor of the Structure

A structure of the type described above may be created with a quality factor, Q, of the order of 1,000 or higher. This high-Q is possible even if the losses in the magnetic material are high, if the fraction of magnetic energy within the magnetic material is small compared to the total magnetic energy associated with the object. For structures composed of layers conducting materials and magnetic materials, the losses in the conducting materials may be reduced by the presence of the magnetic materials as described previously. In structures where the magnetic material layer's thickness is of the order of 1/100 of the largest dimension of the system (e.g., the magnetic material may be of the order of 1 mm thick, while the area of the structure is of the order of 10 cm×10 cm), and the relative permeability is of the order of 1,000, it is possible to make the fraction of magnetic energy contained within the magnetic material only a few hundredths of the total magnetic energy associated with the object or resonator. To see how that comes about, note that the expression for the magnetic energy contained in a volume is $U_m = \int_V dr B(r)^2/(2\mu_r\mu_0)$, so as long as B (rather than H) is the main field conserved across the magnetic material-air interface (which is typically the case in open magnetic circuits), the fraction of magnetic energy contained in the high-$\mu_r$ region may be significantly reduced compared to what it is in air.

If the fraction of magnetic energy in the magnetic material is denoted by frac, and the loss tangent of the material is tan δ, then the Q of the resonator, assuming the magnetic material is the only source of losses, is Q=1/(frac×tan δ). Thus, even for loss tangents as high as 0.1, it is possible to achieve Q's of the order of 1,000 for these types of resonator structures.

Figure 17:
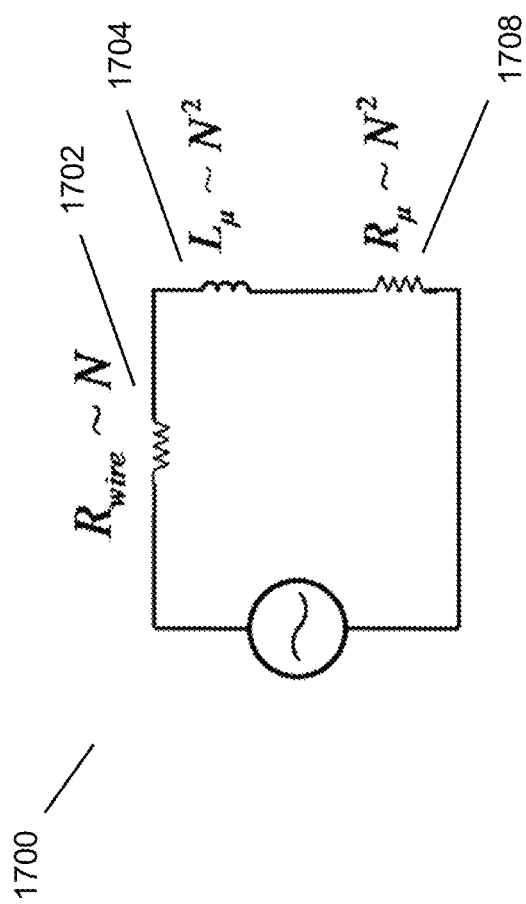
FIG. 17 shows an equivalent circuit representation of a magnetic resonator including a conducting wire wrapped N times around a structure, possibly containing magnetically permeable material. The inductance is realized using conducting loops wrapped around a structure comprising a magnetic material and the resistors represent loss mechanisms in the system ($R_{wire}$ for resistive losses in the loop, $R_\mu$ denoting the equivalent series resistance of the structure surrounded by the loop). Losses may be minimized to realize high-Q resonators.

If the structure is driven with N turns of wire wound around it, the losses in the excitation inductor loop can be ignored if N is sufficiently high. FIG. 17 shows an equivalent circuit 1700 schematic for these structures and the scaling of the loss mechanisms and inductance with the number of turns, N, wound around a structure made of conducting and magnetic material. If proximity effects can be neglected (by using an appropriate winding, or a wire designed to minimize proximity effects, such as Litz wire and the like), the resistance 1702 due to the wire in the looped conductor scales linearly with the length of the loop, which is in turn proportional to the number of turns. On the other hand, both the equivalent resistance 1708 and equivalent inductance 1704 of these special structures are proportional to the square of the magnetic field inside the structure. Since this magnetic field is proportional to N, the equivalent resistance 1708 and equivalent inductance 1704 are both proportional to $N^2$. Thus, for large enough N, the resistance 1702 of the wire is much smaller than the equivalent resistance 1708 of the magnetic structure, and the Q of the resonator asymptotes to $Q_{max}=\omega L_\mu/R_\mu$.

FIG. 16 (a) shows a drawing of a copper and magnetic material structure 1602 driven by a square loop of current around the narrowed segment at the center of the structure 1604 and the magnetic field streamlines generated by this structure 1608. This exemplary structure includes two 20 cm×8 cm×2 cm hollow regions enclosed with copper and then completely covered with a 2 mm layer of magnetic material having the properties $\mu_r'=1,400$, $\mu_r''=5$, and σ=0.5 S/m. These two parallelepipeds are spaced 4 cm apart and are connected by a 2 cm×4 cm×2 cm block of the same magnetic material. The excitation loop is wound around the center of this block. At a frequency of 300 kHz, this structure has a calculated Q of 890. The conductor and magnetic material structure may be shaped to optimize certain system parameters. For example, the size of the structure enclosed by the excitation loop may be small to reduce the resistance of the excitation loop, or it may be large to mitigate losses in the magnetic material associated with large magnetic fields. Note that the magnetic streamlines and Q's associated with the same structure composed of magnetic material only would be similar to the layer conductor and magnetic material design shown here.

Electromagnetic Resonators Interacting with Other Objects

For electromagnetic resonators, extrinsic loss mechanisms that perturb the intrinsic Q may include absorption losses inside the materials of nearby extraneous objects and radiation losses related to scattering of the resonant fields from nearby extraneous objects. Absorption losses may be associated with materials that, over the frequency range of interest, have non-zero, but finite, conductivity, $\sigma$, (or equivalently a non-zero and finite imaginary part of the dielectric permittivity), such that electromagnetic fields can penetrate it and induce currents in it, which then dissipate energy through resistive losses. An object may be described as lossy if it at least partly includes lossy materials.

Consider an object including a homogeneous isotropic material of conductivity, $\sigma$ and magnetic permeability, $\mu$. The penetration depth of electromagnetic fields inside this object is given by the skin depth, $\delta = \sqrt{2/\omega\mu\sigma}$. The power dissipated inside the object, $P_d$, can be determined from $P_d = \int_V dr \sigma |E|^2 = \int_V dr |J|^2/\sigma$ where we made use of Ohm's law, $J = \sigma E$, and where E is the electric field and J is the current density.

If over the frequency range of interest, the conductivity, $\sigma$, of the material that composes the object is low enough that the material's skin depth, $\delta$, may be considered long, (i.e. $\delta$ is longer than the objects' characteristic size, or $\delta$ is longer than the characteristic size of the portion of the object that is lossy) then the electromagnetic fields, E and H, where H is the magnetic field, may penetrate significantly into the object. Then, these finite-valued fields may give rise to a dissipated power that scales as $P_d \sim \sigma V_{ol} \langle |E|^2 \rangle$, where $V_{ol}$ is the volume of the object that is lossy and $\langle |E|^2 \rangle$ is the spatial average of the electric-field squared, in the volume under consideration. Therefore, in the low-conductivity limit, the dissipated power scales proportionally to the conductivity and goes to zero in the limit of a non-conducting (purely dielectric) material.

If over the frequency range of interest, the conductivity, $\sigma$, of the material that composes the object is high enough that the material's skin depth may be considered short, then the electromagnetic fields, E and H, may penetrate only a short distance into the object (namely they stay close to the 'skin' of the material, where $\delta$ is smaller than the characteristic thickness of the portion of the object that is lossy). In this case, the currents induced inside the material may be concentrated very close to the material surface, approximately within a skin depth, and their magnitude may be approximated by the product of a surface current density (mostly determined by the shape of the incident electromagnetic fields and, as long as the thickness of the conductor is much larger than the skin-depth, independent of frequency and conductivity to first order) $K(x, y)$ (where x and y are coordinates parameterizing the surface) and a function decaying exponentially into the surface: $\exp(-z/\delta)/\delta$ (where z denotes the coordinate locally normal to the surface): $J(x,y,z) = K(x,y) \exp(-z/\delta)/\delta$. Then, the dissipated power, $P_d$, may be estimated by, $$P_d = \int_V dr |J(r)|^2/\sigma \approx \left( \int_S dxdy |K(x,y)|^2 \right) \left( \int_0^\infty dz \exp(2z/\delta)/(\sigma\delta^2) \right) = \sqrt{\mu\omega/8\sigma} \left( \int_S dxdy |K(x,y)|^2 \right)$$

Therefore, in the high-conductivity limit, the dissipated power scales inverse proportionally to the square-root of the conductivity and goes to zero in the limit of a perfectly-conducting material.

If over the frequency range of interest, the conductivity, $\sigma$, of the material that composes the object is finite, then the material's skin depth, $\delta$, may penetrate some distance into the object and some amount of power may be dissipated inside the object, depending also on the size of the object and the strength of the electromagnetic fields. This description can be generalized to also describe the general case of an object including multiple different materials with different properties and conductivities, such as an object with an arbitrary inhomogeneous and anisotropic distribution of the conductivity inside the object.

Note that the magnitude of the loss mechanisms described above may depend on the location and orientation of the extraneous objects relative to the resonator fields as well as the material composition of the extraneous objects. For example, high-conductivity materials may shift the resonant frequency of a resonator and detune it from other resonant objects. This frequency shift may be fixed by applying a feedback mechanism to a resonator that corrects its frequency, such as through changes in the inductance and/or capacitance of the resonator. These changes may be realized using variable capacitors and inductors, in some cases achieved by changes in the geometry of components in the resonators. Other novel tuning mechanisms, described below, may also be used to change the resonator frequency.

Where external losses are high, the perturbed Q may be low and steps may be taken to limit the absorption of resonator energy inside such extraneous objects and materials. Because of the functional dependence of the dissipated power on the strength of the electric and magnetic fields, one might optimize system performance by designing a system so that the desired coupling is achieved with shorter evanescent resonant field tails at the source resonator and longer at the device resonator, so that the perturbed Q of the source in the presence of other objects is optimized (or vice versa if the perturbed Q of the device needs to be optimized).

Note that many common extraneous materials and objects such as people, animals, plants, building materials, and the like, may have low conductivities and therefore may have little impact on the wireless energy transfer scheme disclosed here. An important fact related to the magnetic resonator designs we describe is that their electric fields may be confined primarily within the resonator structure itself, so it should be possible to operate within the commonly accepted guidelines for human safety while providing wireless power exchange over mid range distances.

Electromagnetic Resonators with Reduced Interactions

One frequency range of interest for near-field wireless power transmission is between 10 kHz and 100 MHz. In this frequency range, a large variety of ordinary non-metallic materials, such as for example several types of wood and plastic may have relatively low conductivity, such that only small amounts of power may be dissipated inside them. In addition, materials with low loss tangents, tan $\Delta$, where tan $\Delta = \in''/\in'$, and $\in''$ and $\in'$ are the imaginary and real parts of the permittivity respectively, may also have only small amounts of power dissipated inside them. Metallic materials, such as copper, silver, gold, and the like, with relatively high conductivity, may also have little power dissipated in them, because electromagnetic fields are not able to significantly penetrate these materials, as discussed earlier. These very high and very low conductivity materials, and low loss tangent materials and objects may have a negligible impact on the losses of a magnetic resonator.

However, in the frequency range of interest, there are materials and objects such as some electronic circuits and some lower-conductivity metals, which may have moderate (in general inhomogeneous and anisotropic) conductivity, and/or moderate to high loss tangents, and which may have relatively high dissipative losses. Relatively larger amounts of power may be dissipated inside them. These materials and objects may dissipate enough energy to reduce $Q_{(p)}$ by non-trivial amounts, and may be referred to as "lossy objects".

One way to reduce the impact of lossy materials on the $Q_{(p)}$ of a resonator is to use high-conductivity materials to shape the resonator fields such that they avoid the lossy objects. The process of using high-conductivity materials to tailor electromagnetic fields so that they avoid lossy objects in their vicinity may be understood by visualizing high-conductivity materials as materials that deflect or reshape the fields. This picture is qualitatively correct as long as the thickness of the conductor is larger than the skin-depth because the boundary conditions for electromagnetic fields at the surface of a good conductor force the electric field to be nearly completely perpendicular to, and the magnetic field to be nearly completely tangential to, the conductor surface. Therefore, a perpendicular magnetic field or a tangential electric field will be "deflected away" from the conducting surface. Furthermore, even a tangential magnetic field or a perpendicular electric field may be forced to decrease in magnitude on one side and/or in particular locations of the conducting surface, depending on the relative position of the sources of the fields and the conductive surface.

Figure 18:
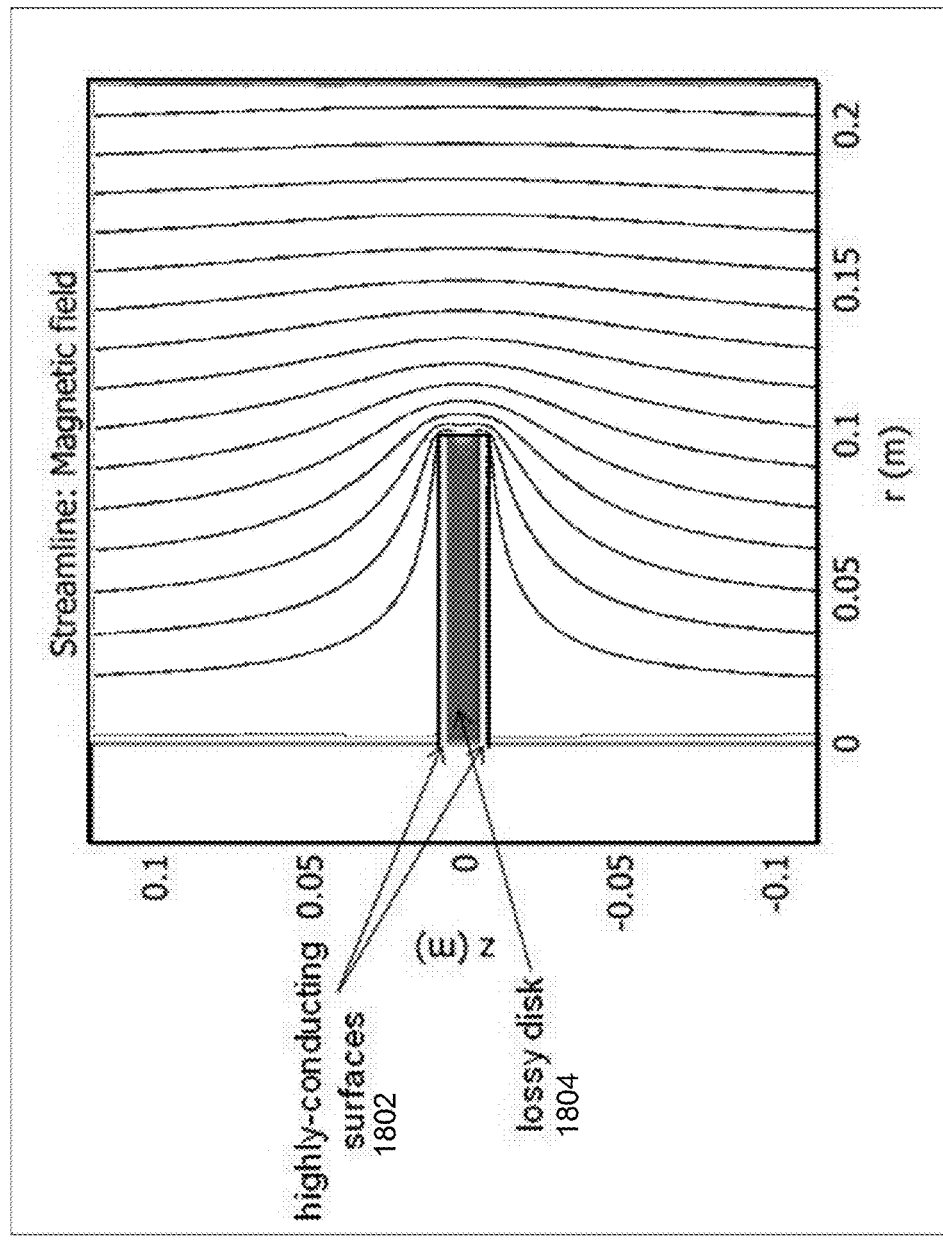
FIG. 18 shows a Finite Element Method (FEM) simulation of two high conductivity surfaces above and below a disk composed of lossy dielectric material, in an external magnetic field of frequency 6.78 MHz. Note that the magnetic field was uniform before the disk and conducting materials were introduced to the simulated environment. This simulation is performed in cylindrical coordinates. The image is azimuthally symmetric around the r=0 axis. The lossy dielectric disk has $\epsilon_r=1$ and $\sigma=10$ S/m.

As an example, FIG. 18 shows a finite element method (FEM) simulation of two high conductivity surfaces 1802 above and below a lossy dielectric material 1804 in an external, initially uniform, magnetic field of frequency f=6.78 MHz. The system is azimuthally symmetric around the r=0 axis. In this simulation, the lossy dielectric material 1804 is sandwiched between two conductors 1802, shown as the white lines at approximately z=±0.01 m. In the absence of the conducting surfaces above and below the dielectric disk, the magnetic field (represented by the drawn magnetic field lines) would have remained essentially uniform (field lines straight and parallel with the z-axis), indicating that the magnetic field would have passed straight through the lossy dielectric material. In this case, power would have been dissipated in the lossy dielectric disk. In the presence of conducting surfaces, however, this simulation shows the magnetic field is reshaped. The magnetic field is forced to be tangential to surface of the conductor and so is deflected around those conducting surfaces 1802, minimizing the amount of power that may be dissipated in the lossy dielectric material 1804 behind or between the conducting surfaces. As used herein, an axis of electrical symmetry refers to any axis about which a fixed or time-varying electrical or magnetic field is substantially symmetric during an exchange of energy as disclosed herein.

A similar effect is observed even if only one conducting surface, above or below, the dielectric disk, is used. If the dielectric disk is thin, the fact that the electric field is essentially zero at the surface, and continuous and smooth close to it, means that the electric field is very low everywhere close to the surface (i.e. within the dielectric disk). A single surface implementation for deflecting resonator fields away from lossy objects may be preferred for applications where one is not allowed to cover both sides of the lossy material or object (e.g. an LCD screen). Note that even a very thin surface of conducting material, on the order of a few skin-depths, may be sufficient (the skin depth in pure copper at 6.78 MHz is ~20 µm, and at 250 kHz is ~100 µm) to significantly improve the $Q_{(p)}$ of a resonator in the presence of lossy materials.

Lossy extraneous materials and objects may be parts of an apparatus, in which a high-Q resonator is to be integrated. The dissipation of energy in these lossy materials and objects may be reduced by a number of techniques including:

- by positioning the lossy materials and objects away from the resonator, or, in special positions and orientations relative to the resonator.
- by using a high conductivity material or structure to partly or entirely cover lossy materials and objects in the vicinity of a resonator
- by placing a closed surface (such as a sheet or a mesh) of high-conductivity material around a lossy object to completely cover the lossy object and shape the resonator fields such that they avoid the lossy object.
- by placing a surface (such as a sheet or a mesh) of a high-conductivity material around only a portion of a lossy object, such as along the top, the bottom, along the side, and the like, of an object or material.
- by placing even a single surface (such as a sheet or a mesh) of high-conductivity material above or below or on one side of a lossy object to reduce the strength of the fields at the location of the lossy object.

Figure 19:
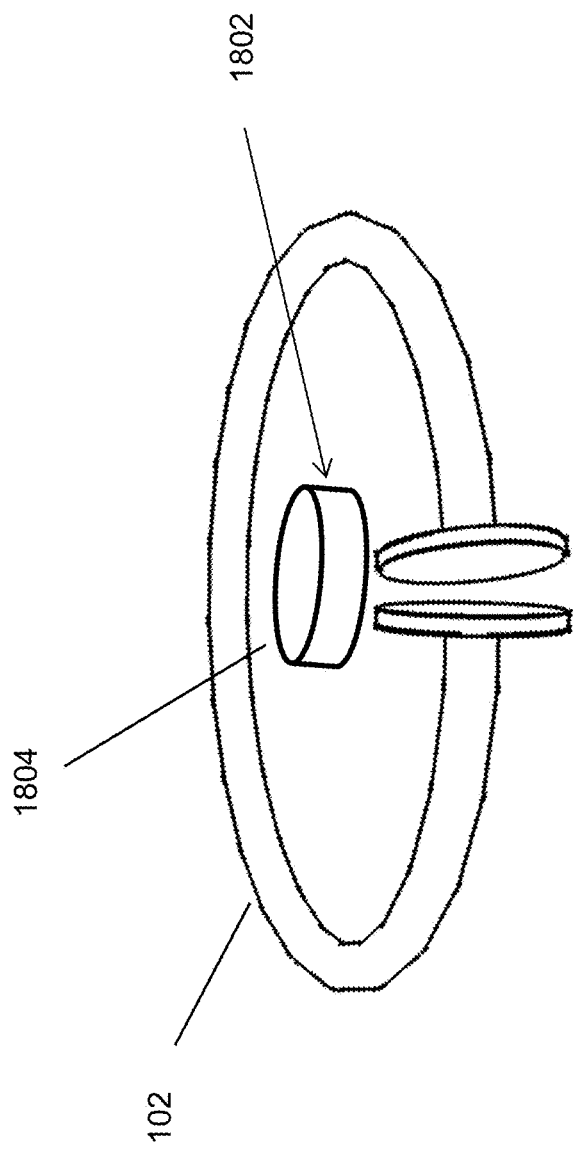
FIG. 19 shows a drawing of a magnetic resonator with a lossy object in its vicinity completely covered by a high-conductivity surface.

FIG. 19 shows a capacitively-loaded loop inductor forming a magnetic resonator 102 and a disk-shaped surface of high-conductivity material 1802 that completely surrounds a lossy object 1804 placed inside the loop inductor. Note that some lossy objects may be components, such as electronic circuits, that may need to interact with, communicate with, or be connected to the outside environment and thus cannot be completely electromagnetically isolated. Partially covering a lossy material with high conductivity materials may still reduce extraneous losses while enabling the lossy material or object to function properly.

Figure 20:
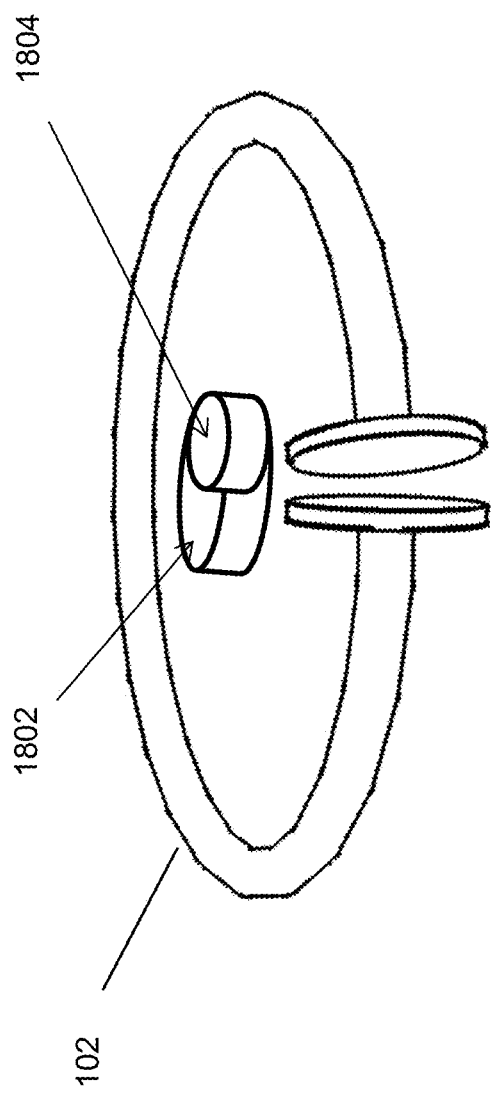
FIG. 20 shows a drawing of a magnetic resonator with a lossy object in its vicinity partially covered by a high-conductivity surface.

FIG. 20 shows a capacitively-loaded loop inductor that is used as the resonator 102 and a surface of high-conductivity material 1802, surrounding only a portion of a lossy object 1804, that is placed inside the inductor loop.

Figure 21:
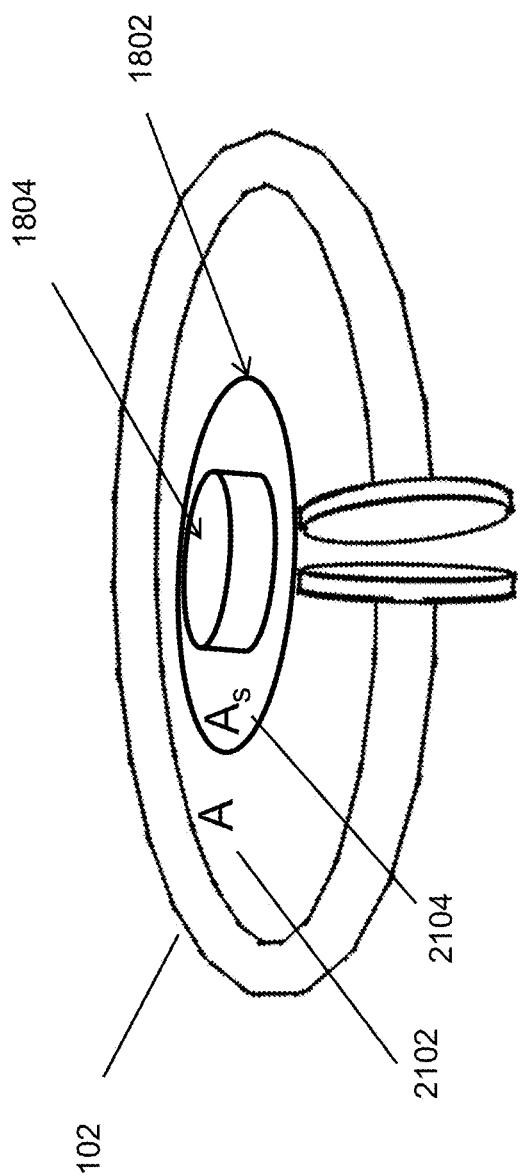
FIG. 21 shows a drawing of a magnetic resonator with a lossy object in its vicinity placed on top of a high-conductivity surface.

Extraneous losses may be reduced, but may not be completely eliminated, by placing a single surface of high-conductivity material above, below, on the side, and the like, of a lossy object or material. An example is shown in FIG. 21, where a capacitively-loaded loop inductor is used as the resonator 102 and a surface of high-conductivity material 1802 is placed inside the inductor loop under a lossy object 1804 to reduce the strength of the fields at the location of the lossy object. It may be preferable to cover only one side of a material or object because of considerations of cost, weight, assembly complications, air flow, visual access, physical access, and the like.

A single surface of high-conductivity material may be used to avoid objects that cannot or should not be covered from both sides (e.g. LCD or plasma screens). Such lossy objects may be avoided using optically transparent conductors. High-conductivity optically opaque materials may instead be placed on only a portion of the lossy object, instead of, or in addition to, optically transparent conductors. The adequacy of single-sided vs. multi-sided covering implementations, and the design trade-offs inherent therein may depend on the details of the wireless energy transfer scenario and the properties of the lossy materials and objects.

Figure 22:
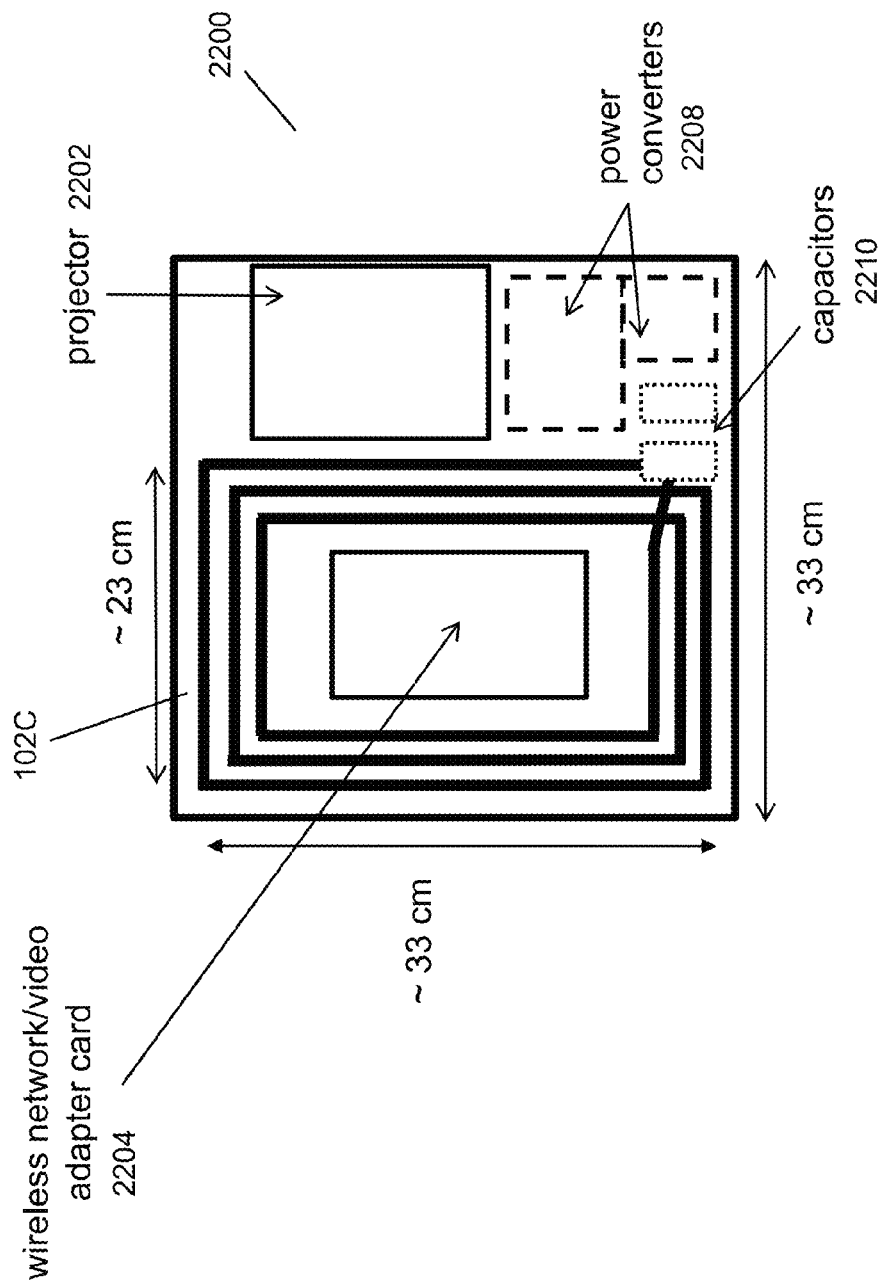
FIG. 22 shows a diagram of a completely wireless projector.

Below we describe an example using high-conductivity surfaces to improve the Q-insensitivity, $\Theta_{(p)}$, of an integrated magnetic resonator used in a wireless energy-transfer system. FIG. 22 shows a wireless projector 2200. The wireless projector may include a device resonator 102C, a projector 2202, a wireless network/video adapter 2204, and power conversion circuits 2208, arranged as shown. The device resonator 102C may include a three-turn conductor loop, arranged to enclose a surface, and a capacitor network 2210. The conductor loop may be designed so that the device resonator 102C has a high Q (e.g., >100) at its operating resonant frequency. Prior to integration in the completely wireless projector 2200, this device resonator 102C has a Q of approximately 477 at the designed operating resonant frequency of 6.78 MHz. Upon integration, and placing the wireless network/video adapter card 2204 in the center of the resonator loop inductor, the resonator $Q_{(integrated)}$) was decreased to approximately 347. At least some of the reduction from Q to $Q_{(integrated)}$ was attributed to losses in the perturbing wireless network/video adapter card. As described above, electromagnetic fields associated with the magnetic resonator 102C may induce currents in and on the wireless network/video adapter card 2204, which may be dissipated in resistive losses in the lossy materials that compose the card. We observed that $Q_{(integrated)}$ of the resonator may be impacted differently depending on the composition, position, and orientation, of objects and materials placed in its vicinity.

In a completely wireless projector example, covering the network/video adapter card with a thin copper pocket (a folded sheet of copper that covered the top and the bottom of the wireless network/video adapter card, but not the communication antenna) improved the $Q_{(integrated)}$ of the magnetic resonator to a $Q_{(integrated+copper\ pocket)}$ of approximately 444. In other words, most of the reduction in $Q_{(integrated)}$ due to the perturbation caused by the extraneous network/video adapter card could be eliminated using a copper pocket to deflect the resonator fields away from the lossy materials.

In another completely wireless projector example, covering the network/video adapter card with a single copper sheet placed beneath the card provided a $Q_{(integrated+copper\ sheet)}$ approximately equal to $Q_{(integrated+copper\ pocket)}$. In that example, the high perturbed Q of the system could be maintained with a single high-conductivity sheet used to deflect the resonator fields away from the lossy adapter card.

It may be advantageous to position or orient lossy materials or objects, which are part of an apparatus including a high-Q electromagnetic resonator, in places where the fields produced by the resonator are relatively weak, so that little or no power may be dissipated in these objects and so that the Q-insensitivity, $\Theta_{(p)}$, may be large. As was shown earlier, materials of different conductivity may respond differently to electric versus magnetic fields. Therefore, according to the conductivity of the extraneous object, the positioning technique may be specialized to one or the other field.

Figure 23:
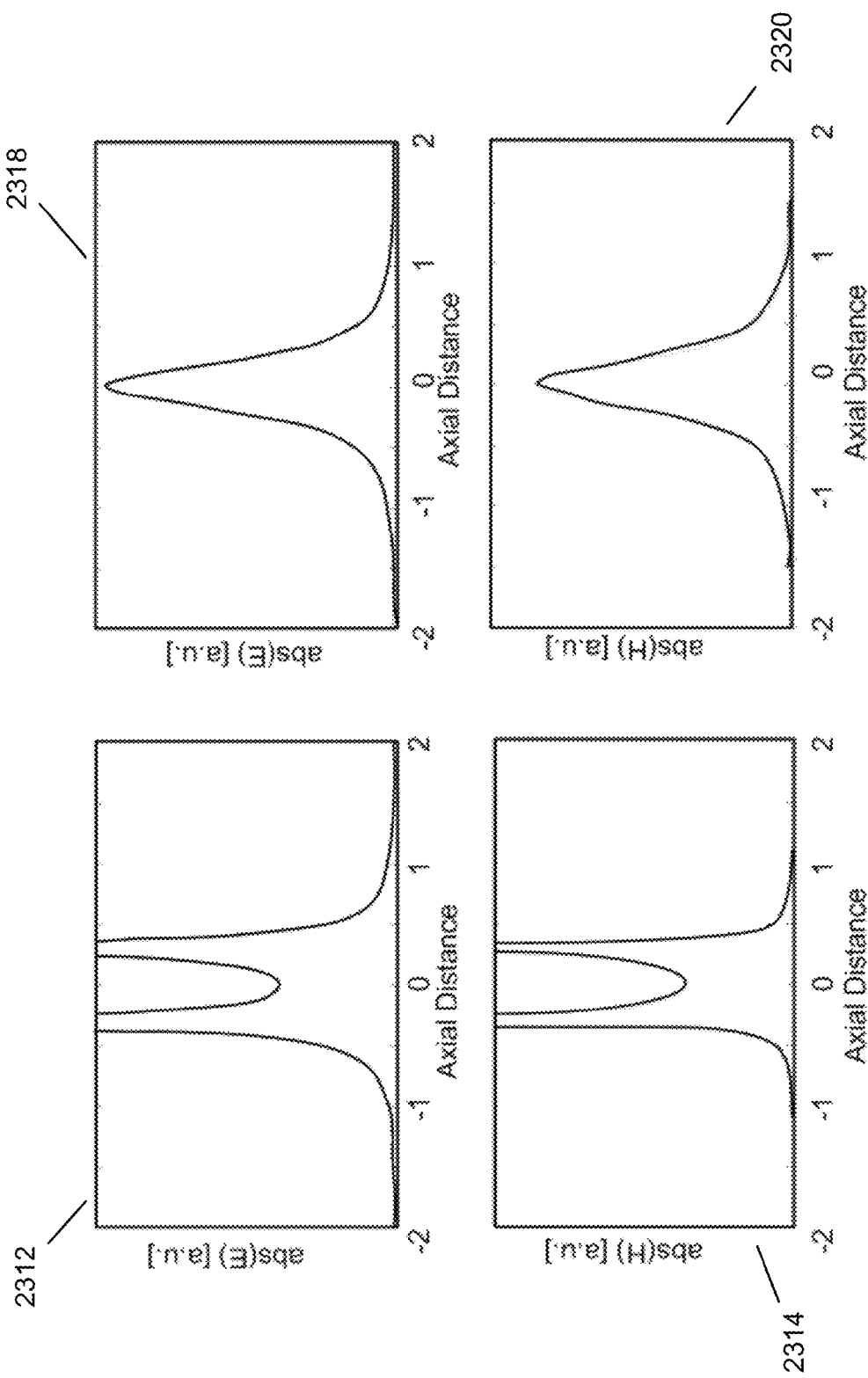
FIG. 23 shows the magnitude of the electric and magnetic fields along a line that contains the diameter of the circular loop inductor and along the axis of the loop inductor.
Figure 24:
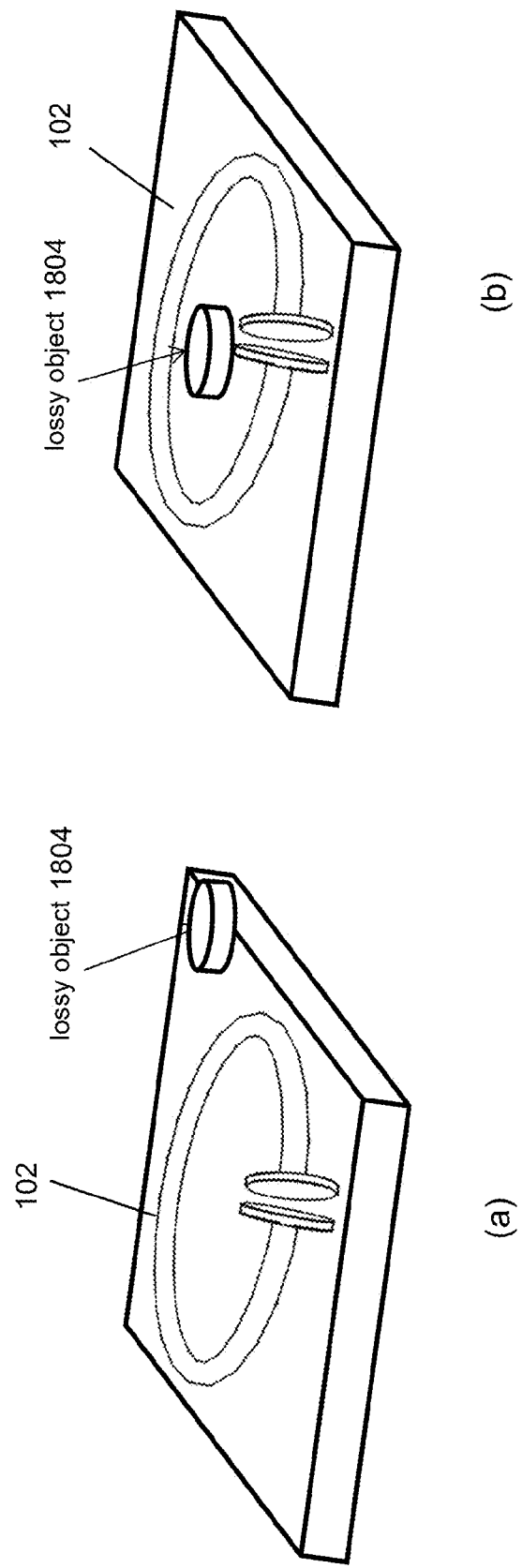
FIG. 24 shows a drawing of a magnetic resonator and its enclosure along with a necessary but lossy object placed either (a) in the corner of the enclosure, as far away from the resonator structure as possible or (b) in the center of the surface enclosed by the inductive element in the magnetic resonator.

FIG. 23 shows the magnitude of the electric 2312 and magnetic fields 2314 along a line that contains the diameter of the circular loop inductor and the electric 2318 and magnetic fields 2320 along the axis of the loop inductor for a capacitively-loaded circular loop inductor of wire of radius 30 cm, resonant at 10 MHz. It can be seen that the amplitude of the resonant near-fields reach their maxima close to the wire and decay away from the loop, 2312, 2314. In the plane of the loop inductor 2318, 2320, the fields reach a local minimum at the center of the loop. Therefore, given the finite size of the apparatus, it may be that the fields are weakest at the extrema of the apparatus or it may be that the field magnitudes have local minima somewhere within the apparatus. This argument holds for any other type of electromagnetic resonator 102 and any type of apparatus. Examples are shown in FIGS. 24a and 24b, where a capacitively-loaded inductor loop forms a magnetic resonator 102 and an extraneous lossy object 1804 is positioned where the electromagnetic fields have minimum magnitude.

In a demonstration example, a magnetic resonator was formed using a three-turn conductor loop, arranged to enclose a square surface (with rounded corners), and a capacitor network. The Q of the resonator was approximately 619 at the designed operating resonant frequency of 6.78 MHz. The perturbed Q of this resonator depended on the placement of the perturbing object, in this case a pocket projector, relative to the resonator. When the perturbing projector was located inside the inductor loop and at its center or on top of the inductor wire turns, $Q_{(projector)}$ was approximately 96, lower than when the perturbing projector was placed outside of the resonator, in which case $Q_{(projector)}$ was approximately 513. These measurements support the analysis that shows the fields inside the inductor loop may be larger than those outside it, so lossy objects placed inside such a loop inductor may yield lower perturbed Q's for the system than when the lossy object is placed outside the loop inductor. Depending on the resonator designs and the material composition and orientation of the lossy object, the arrangement shown in FIG. 24b may yield a higher Q-insensitivity, $\Theta_{(projector)}$, than the arrangement shown in FIG. 24a.

High-Q resonators may be integrated inside an apparatus. Extraneous materials and objects of high dielectric permittivity, magnetic permeability, or electric conductivity may be part of the apparatus into which a high-Q resonator is to be integrated. For these extraneous materials and objects in the vicinity of a high-Q electromagnetic resonator, depending on their size, position and orientation relative to the resonator, the resonator field-profile may be distorted and deviate significantly from the original unperturbed field-profile of the resonator. Such a distortion of the unperturbed fields of the resonator may significantly decrease the Q to a lower $Q_{(p)}$, even if the extraneous objects and materials are lossless.

It may be advantageous to position high-conductivity objects, which are part of an apparatus including a high-Q electromagnetic resonator, at orientations such that the surfaces of these objects are, as much as possible, perpendicular to the electric field lines produced by the unperturbed resonator and parallel to the magnetic field lines produced by the unperturbed resonator, thus distorting the resonant field profiles by the smallest amount possible. Other common objects that may be positioned perpendicular to the plane of a magnetic resonator loop include screens (LCD, plasma, etc), batteries, cases, connectors, radiative antennas, and the like. The Q-insensitivity, $\Theta_{(p)}$, of the resonator may be much larger than if the objects were positioned at a different orientation with respect to the resonator fields.

Figure 25:
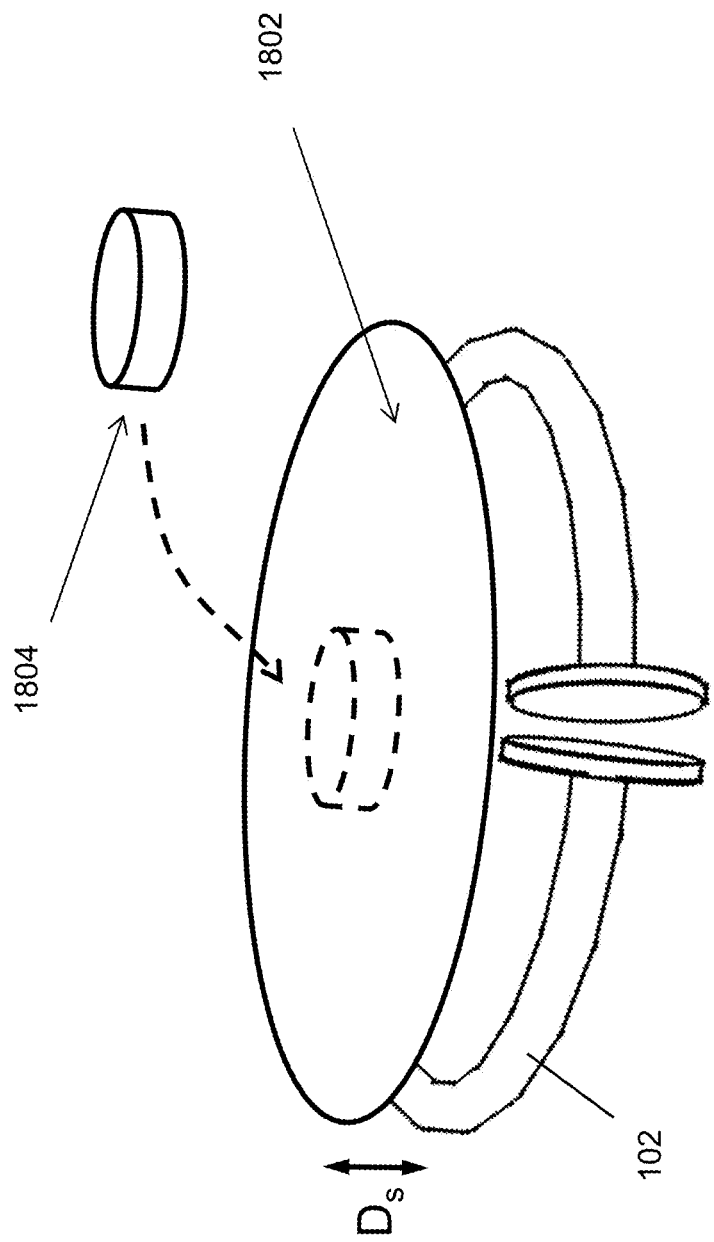
FIG. 25 shows a drawing of a magnetic resonator with a high-conductivity surface above it and a lossy object, which may be brought into the vicinity of the resonator, but above the high-conductivity sheet.

Lossy extraneous materials and objects, which are not part of the integrated apparatus including a high-Q resonator, may be located or brought in the vicinity of the resonator, for example, during the use of the apparatus. It may be advantageous in certain circumstances to use high conductivity materials to tailor the resonator fields so that they avoid the regions where lossy extraneous objects may be located or introduced to reduce power dissipation in these materials and objects and to increase Q-insensitivity, $\Theta_{(p)}$. An example is shown in FIG. 25, where a capacitively-loaded loop inductor and capacitor are used as the resonator 102 and a surface of high-conductivity material 1802 is placed above the inductor loop to reduce the magnitude of the fields in the region above the resonator, where lossy extraneous objects 1804 may be located or introduced.

Note that a high-conductivity surface brought in the vicinity of a resonator to reshape the fields may also lead to $Q_{(cond\ surface)}<Q$. The reduction in the perturbed Q may be due to the dissipation of energy inside the lossy conductor or to the distortion of the unperturbed resonator field profiles associated with matching the field boundary conditions at the surface of the conductor. Therefore, while a high-conductivity surface may be used to reduce the extraneous losses due to dissipation inside an extraneous lossy object, in some cases, especially in some of those where this is achieved by significantly reshaping the electromagnetic fields, using such a high-conductivity surface so that the fields avoid the lossy object may result effectively in $Q_{(p+cond.surface)}<Q_{(p)}$ rather than the desired result $Q_{(p+cond.surface)}>Q_{(p)}$.

As described above, in the presence of loss inducing objects, the perturbed quality factor of a magnetic resonator may be improved if the electromagnetic fields associated with the magnetic resonator are reshaped to avoid the loss inducing objects. Another way to reshape the unperturbed resonator fields is to use high permeability materials to completely or partially enclose or cover the loss inducing objects, thereby reducing the interaction of the magnetic field with the loss inducing objects.

Magnetic field shielding has been described previously, for example in *Electrodynamics* $3^{rd}$ Ed., Jackson, pp. 201-203. There, a spherical shell of magnetically permeable material was shown to shield its interior from external magnetic fields. For example, if a shell of inner radius a, outer radius b, and relative permeability $\mu_r$, is placed in an initially uniform magnetic field $H_0$, then the field inside the shell will have a constant magnitude, $9\mu_r H_0/[(2\mu_r+1)(\mu_r+2)-2(a/b)^3(\mu_r-1)^2]$, which tends to $9H_0/2\mu_r(1-(a/b)^3)$ if $\mu_r\gg1$. This result shows that an incident magnetic field (but not necessarily an incident electric field) may be greatly attenuated inside the shell, even if the shell is quite thin, provided the magnetic permeability is high enough. It may be advantageous in certain circumstances to use high permeability materials to partly or entirely cover lossy materials and objects so that they are avoided by the resonator magnetic fields and so that little or no power is dissipated in these materials and objects. In such an approach, the Q-insensitivity, $\Theta_{(p)}$, may be larger than if the materials and objects were not covered, possibly larger than 1.

It may be desirable to keep both the electric and magnetic fields away from loss inducing objects. As described above, one way to shape the fields in such a manner is to use high-conductivity surfaces to either completely or partially enclose or cover the loss inducing objects. A layer of magnetically permeable material, also referred to as magnetic material, (any material or meta-material having a non-trivial magnetic permeability), may be placed on or around the high-conductivity surfaces. The additional layer of magnetic material may present a lower reluctance path (compared to free space) for the deflected magnetic field to follow and may partially shield the electric conductor underneath it from the incident magnetic flux. This arrangement may reduce the losses due to induced currents in the high-conductivity surface. Under some circumstances the lower reluctance path presented by the magnetic material may improve the perturbed Q of the structure.

FIG. 26a shows an axially symmetric FEM simulation of a thin conducting 2604 (copper) disk (20 cm in diameter, 2 cm in height) exposed to an initially uniform, externally applied magnetic field (gray flux lines) along the z-axis. The axis of symmetry is at r=0. The magnetic streamlines shown originate at z=−∞, where they are spaced from r=3 cm to r=10 cm in intervals of 1 cm. The axes scales are in meters. Imagine, for example, that this conducing cylinder encloses loss-inducing objects within an area circumscribed by a magnetic resonator in a wireless energy transfer system such as shown in FIG. 19.

This high-conductivity enclosure may increase the perturbing Q of the lossy objects and therefore the overall perturbed Q of the system, but the perturbed Q may still be less than the unperturbed Q because of induced losses in the conducting surface and changes to the profile of the electromagnetic fields. Decreases in the perturbed Q associated with the high-conductivity enclosure may be at least partially recovered by including a layer of magnetic material along the outer surface or surfaces of the high-conductivity enclosure. FIG. 26b shows an axially symmetric FEM simulation of the thin conducting 2604A (copper) disk (20 cm in diameter, 2 cm in height) from FIG. 26a, but with an additional layer of magnetic material placed directly on the outer surface of the high-conductivity enclosure. Note that the presence of the magnetic material may provide a lower reluctance path for the magnetic field, thereby at least partially shielding the underlying conductor and reducing losses due to induced eddy currents in the conductor.

Figure 26:
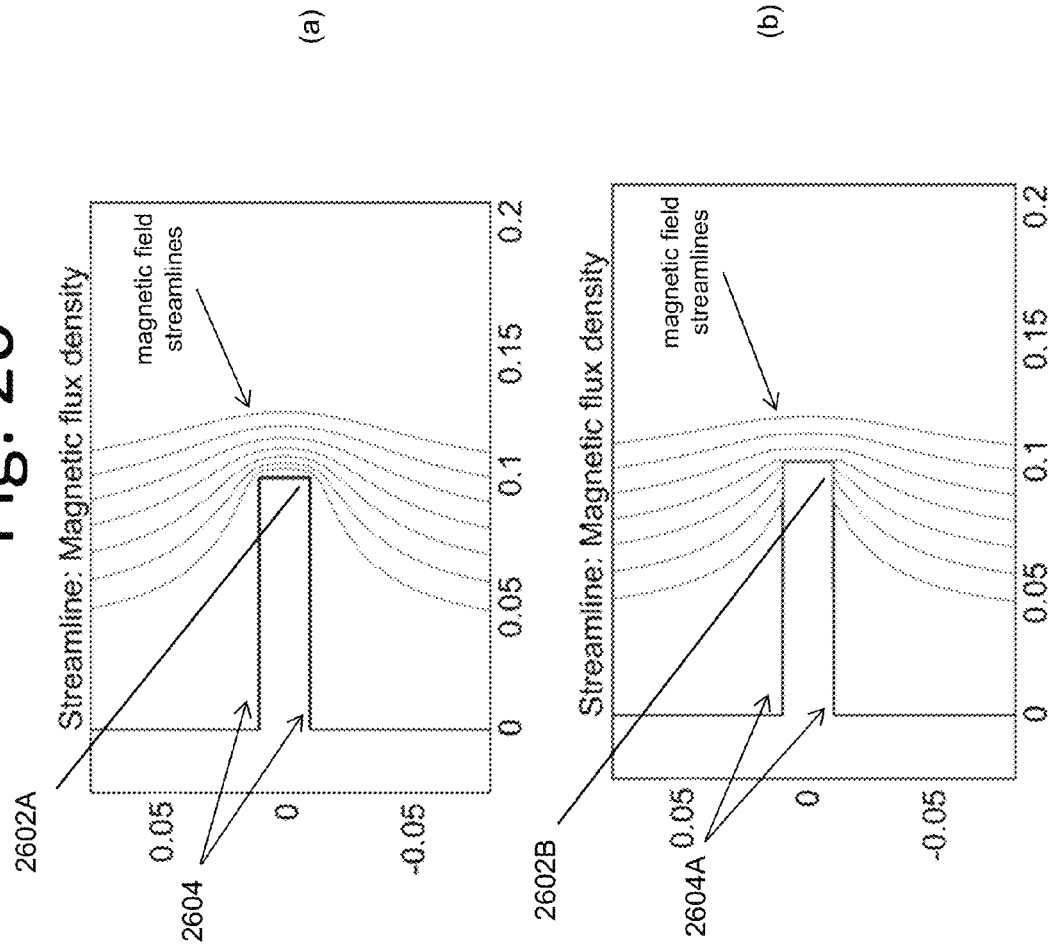
FIG. 26 (b) shows the same structure and externally applied field as in (a), except that the conducting cylinder has been modified to include a 0.25 mm layer of magnetic material (not visible) with $\mu_r'=40$, on its outside surface. Note that the magnetic streamlines are deflected away from the cylinder significantly less than in (a).
Figure 27:
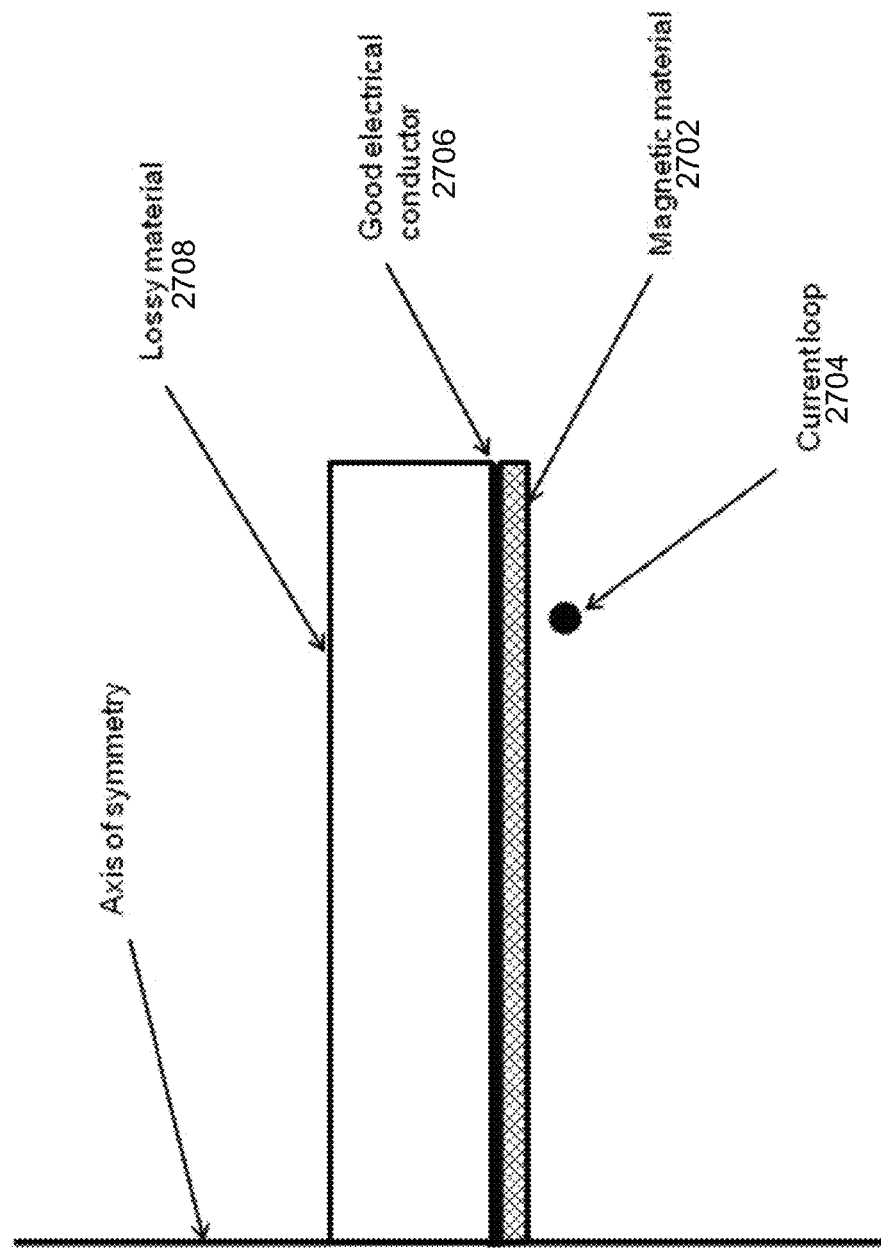
FIG. 27 shows an axi-symmetric view of a variation based on the system shown in FIG. 26. Only one surface of the lossy material is covered by a layered structure of copper and magnetic materials. The inductor loop is placed on the side of the copper and magnetic material structure opposite to the lossy material as shown.

FIG. 27 depicts a variation (in axi-symmetric view) to the system shown in FIG. 26 where not all of the lossy material 2708 may be covered by a high-conductivity surface 2706. In certain circumstances it may be useful to cover only one side of a material or object, such as due to considerations of cost, weight, assembly complications, air flow, visual access, physical access, and the like. In the exemplary arrangement shown in FIG. 27, only one surface of the lossy material 2708 is covered and the resonator inductor loop is placed on the opposite side of the high-conductivity surface.

Mathematical models were used to simulate a high-conductivity enclosure made of copper and shaped like a 20 cm diameter by 2 cm high cylindrical disk placed within an area circumscribed by a magnetic resonator whose inductive element was a single-turn wire loop with loop radius r=11 cm and wire radius a=1 mm. Simulations for an applied 6.78 MHz electromagnetic field suggest that the perturbing quality factor of this high-conductivity enclosure, $\delta Q_{(enclosure)}$, is 1,870. When the high-conductivity enclosure was modified to include a 0.25 cm-thick layer of magnetic material with real relative permeability, $\mu_r'=40$, and imaginary relative permeability, $\mu_r''=10^{-2}$, simulations suggest the perturbing quality factor is increased to $\delta Q_{(enclosure+magnetic\ material)}=5,060$.

The improvement in performance due to the addition of thin layers of magnetic material 2702 may be even more dramatic if the high-conductivity enclosure fills a larger portion of the area circumscribed by the resonator's loop inductor 2704. In the example above, if the radius of the inductor loop 2704 is reduced so that it is only 3 mm away from the surface of the high-conductivity enclosure, the perturbing quality factor may be improved from 670 (conducting enclosure only) to 2,730 (conducting enclosure with a thin layer of magnetic material) by the addition of a thin layer of magnetic material 2702 around the outside of the enclosure.

The resonator structure may be designed to have highly confined electric fields, using shielding, or distributed capacitors, for example, which may yield high, even when the resonator is very close to materials that would typically induce loss.

Coupled Electromagnetic Resonators

The efficiency of energy transfer between two resonators may be determined by the strong-coupling figure-of-merit, $U=\kappa/\sqrt{\Gamma_s\Gamma_d}=(2\kappa/\sqrt{\omega_s\omega_d})\sqrt{Q_sQ_d}$. In magnetic resonator implementations the coupling factor between the two resonators may be related to the inductance of the inductive elements in each of the resonators, $L_1$ and $L_2$, and the mutual inductance, M, between them by $\kappa_{12}=\omega M/2\sqrt{L_1L_2}$. Note that this expression assumes there is negligible coupling through electric-dipole coupling. For capacitively-loaded inductor loop resonators where the inductor loops are formed by circular conducting loops with N turns, separated by a distance D, and oriented as shown in FIG. 1(b), the mutual inductance is $M=\pi/4\cdot\mu_0 N_1N_2(x_1x_2)^2/D^3$ where $x_1$, $N_1$ and $x_2$, $N_2$ are the characteristic size and number of turns of the conductor loop of the first and second resonators respectively. Note that this is a quasi-static result, and so assumes that the resonator's size is much smaller than the wavelength and the resonators' distance is much smaller than the wavelength, but also that their distance is at least a few times their size. For these circular resonators operated in the quasi-static limit and at mid-range distances, as described above, $k=2\kappa/\sqrt{\omega_1\omega_2}\sim(\sqrt{x_1x_2}/D)^3$. Strong coupling (a large U) between resonators at mid-range distances may be established when the quality factors of the resonators are large enough to compensate for the small k at mid-range distances For electromagnetic resonators, if the two resonators include conducting parts, the coupling mechanism may be that currents are induced on one resonator due to electric and magnetic fields generated from the other. The coupling factor may be proportional to the flux of the magnetic field produced from the high-Q inductive element in one resonator crossing a closed area of the high-Q inductive element of the second resonator.

Coupled Electromagnetic Resonators with Reduced Interactions

As described earlier, a high-conductivity material surface may be used to shape resonator fields such that they avoid lossy objects, p, in the vicinity of a resonator, thereby reducing the overall extraneous losses and maintaining a high Q-insensitivity $\Theta_{(p+cond.surface)}$ of the resonator. However, such a surface may also lead to a perturbed coupling factor, $k_{(p+cond.surface)}$, between resonators that is smaller than the perturbed coupling factor, $k_{(p)}$, and depends on the size, position, and orientation of the high-conductivity material relative to the resonators. For example, if high-conductivity materials are placed in the plane and within the area circumscribed by the inductive element of at least one of the magnetic resonators in a wireless energy transfer system, some of the magnetic flux through the area of the resonator, mediating the coupling, may be blocked and k may be reduced.

Consider again the example of FIG. 19. In the absence of the high-conductivity disk enclosure, a certain amount of the external magnetic flux may cross the circumscribed area of the loop. In the presence of the high-conductivity disk enclosure, some of this magnetic flux may be deflected or blocked and may no longer cross the area of the loop, thus leading to a smaller perturbed coupling factor $k_{12(p+cond.surfaces)}$. However, because the deflected magnetic-field lines may follow the edges of the high-conductivity surfaces closely, the reduction in the flux through the loop circumscribing the disk may be less than the ratio of the areas of the face of the disk to the area of the loop.

One may use high-conductivity material structures, either alone, or combined with magnetic materials to optimize perturbed quality factors, perturbed coupling factors, or perturbed efficiencies.

Consider the example of FIG. 21. Let the lossy object have a size equal to the size of the capacitively-loaded inductor loop resonator, thus filling its area A 2102. A high-conductivity surface 1802 may be placed under the lossy object 1804. Let this be resonator 1 in a system of two coupled resonators 1 and 2, and let us consider how $U_{12(object+cond.surface)}$ scales compared to $U_{12}$ as the area $A_s$ 2104 of the conducting surface increases. Without the conducting surface 1802 below the lossy object 1804, the k-insensitivity, $\beta_{12(object)}$, may be approximately one, but the Q-insensitivity, $\Theta_{1(object)}$, may be small, so the U-insensitivity $\Xi_{12(object)}$ may be small.

Where the high-conductivity surface below the lossy object covers the entire area of the inductor loop resonator $(A_s=A)$, $k_{12(object+cond.surface)}$ may approach zero, because little flux is allowed to cross the inductor loop, so $U_{12(object+cond.surface)}$ may approach zero. For intermediate sizes of the high-conductivity surface, the suppression of extrinsic losses and the associated Q-insensitivity, $\Theta_{1(object+cond.surface)}$, may be large enough compared to $\Theta_{1(object)}$, while the reduction in coupling may not be significant and the associated k-insensitivity, $\beta_{12(object+cond.surface)}$, may be not much smaller than $\beta_{12(object)}$, so that the overall $U_{12(object+cond.surface)}$ may be increased compared to $U_{12(object)}$. The optimal degree of avoiding of extraneous lossy objects via high-conductivity surfaces in a system of wireless energy transfer may depend on the details of the system configuration and the application.

We describe using high-conductivity materials to either completely or partially enclose or cover loss inducing objects in the vicinity of high-Q resonators as one potential method to achieve high perturbed Q's for a system. However, using a good conductor alone to cover the objects may reduce the coupling of the resonators as described above, thereby reducing the efficiency of wireless power transfer. As the area of the conducting surface approaches the area of the magnetic resonator, for example, the perturbed coupling factor, $k_{(p)}$, may approach zero, making the use of the conducting surface incompatible with efficient wireless power transfer.

One approach to addressing the aforementioned problem is to place a layer of magnetic material around the high-conductivity materials because the additional layer of permeable material may present a lower reluctance path (compared to free space) for the deflected magnetic field to follow and may partially shield the electric conductor underneath it from incident magnetic flux. Under some circumstances the lower reluctance path presented by the magnetic material may improve the electromagnetic coupling of the resonator to other resonators. Decreases in the perturbed coupling factor associated with using conducting materials to tailor resonator fields so that they avoid lossy objects in and around high-Q magnetic resonators may be at least partially recovered by including a layer of magnetic material along the outer surface or surfaces of the conducting materials. The magnetic materials may increase the perturbed coupling factor relative to its initial unperturbed value.

Note that the simulation results in FIG. 26 show that an incident magnetic field may be deflected less by a layered magnetic material and conducting structure than by a conducting structure alone. If a magnetic resonator loop with a radius only slightly larger than that of the disks shown in FIGS. 26(a) and 26(b) circumscribed the disks, it is clear that more flux lines would be captured in the case illustrated in FIG. 26(b) than in FIG. 26(a), and therefore $k_{(disk)}$ would be larger for the case illustrated in FIG. 26(b). Therefore, including a layer of magnetic material on the conducting material may improve the overall system performance. System analyses may be performed to determine whether these materials should be partially, totally, or minimally integrated into the resonator.

As described above, FIG. 27 depicts a layered conductor 2706 and magnetic material 2702 structure that may be appropriate for use when not all of a lossy material 2708 may be covered by a conductor and/or magnetic material structure. It was shown earlier that for a copper conductor disk with a 20 cm diameter and a 2 cm height, circumscribed by a resonator with an inductor loop radius of 11 cm and a wire radius a=1 mm, the calculated perturbing Q for the copper cylinder was 1,870. If the resonator and the conducting disk shell are placed in a uniform magnetic field (aligned along the axis of symmetry of the inductor loop), we calculate that the copper conductor has an associated coupling factor insensitivity of 0.34. For comparison, we model the same arrangement but include a 0.25 cm-thick layer of magnetic material with a real relative permeability, $\mu_r'=40$, and an imaginary relative permeability, $\mu_r''=10^{-2}$. Using the same model and parameters described above, we find that the coupling factor insensitivity is improved to 0.64 by the addition of the magnetic material to the surface of the conductor.

Magnetic materials may be placed within the area circumscribed by the magnetic resonator to increase the coupling in wireless energy transfer systems. Consider a solid sphere of a magnetic material with relative permeability, $\mu_r$, placed in an initially uniform magnetic field. In this example, the lower reluctance path offered by the magnetic material may cause the magnetic field to concentrate in the volume of the sphere. We find that the magnetic flux through the area circumscribed by the equator of the sphere is enhanced by a factor of $3\mu_r/(\mu_r+2)$, by the addition of the magnetic material. If $\mu_r \gg 1$, this enhancement factor may be close to 3.

One can also show that the dipole moment of a system comprising the magnetic sphere circumscribed by the inductive element in a magnetic resonator would have its magnetic dipole enhanced by the same factor. Thus, the magnetic sphere with high permeability practically triples the dipole magnetic coupling of the resonator. It is possible to keep most of this increase in coupling if we use a spherical shell of magnetic material with inner radius a, and outer radius b, even if this shell is on top of block or enclosure made from highly conducting materials. In this case, the enhancement in the flux through the equator is $$\frac{3\mu_r\left(1-\left(\frac{a}{b}\right)^3\right)}{\mu_r\left(1-\left(\frac{a}{b}\right)^3\right)+2\left(1+\frac{1}{2}\left(\frac{a}{b}\right)^3\right)}.$$

For $\mu_r=1,000$ and $(a/b)=0.99$, this enhancement factor is still 2.73, so it possible to significantly improve the coupling even with thin layers of magnetic material.

As described above, structures containing magnetic materials may be used to realize magnetic resonators. FIG. 16(a) shows a 3 dimensional model of a copper and magnetic material structure 1600 driven by a square loop of current around the choke point at its center. FIG. 16(b) shows the interaction, indicated by magnetic field streamlines, between two identical structures 1600A-B with the same properties as the one shown in FIG. 16(a). Because of symmetry, and to reduce computational complexity, only one half of the system is modeled. If we fix the relative orientation between the two objects and vary their center-to-center distance (the image shown is at a relative separation of 50 cm), we find that, at 300 kHz, the coupling efficiency varies from 87% to 55% as the separation between the structures varies from 30 cm to 60 cm. Each of the example structures shown 1600 A-B includes two 20 cm×8 cm×2 cm parallelepipeds made of copper joined by a 4 cm×4 cm×2 cm block of magnetic material and entirely covered with a 2 mm layer of the same magnetic material (assumed to have $\mu_r=1,400+j5$). Resistive losses in the driving loop are ignored. Each structure has a calculated Q of 815.

Electromagnetic Resonators and Impedance Matching

Impedance Matching Architectures for Low-Loss Inductive Elements

For purposes of the present discussion, an inductive element may be any coil or loop structure (the 'loop') of any conducting material, with or without a (gapped or ungapped) core made of magnetic material, which may also be coupled inductively or in any other contactless way to other systems. The element is inductive because its impedance, including both the impedance of the loop and the so-called 'reflected' impedances of any potentially coupled systems, has positive reactance, X, and resistance, R.

Consider an external circuit, such as a driving circuit or a driven load or a transmission line, to which an inductive element may be connected. The external circuit (e.g. a driving circuit) may be delivering power to the inductive element and the inductive element may be delivering power to the external circuit (e.g. a driven load). The efficiency and amount of power delivered between the inductive element and the external circuit at a desired frequency may depend on the impedance of the inductive element relative to the properties of the external circuit. Impedance-matching networks and external circuit control techniques may be used to regulate the power delivery between the external circuit and the inductive element, at a desired frequency, f.

The external circuit may be a driving circuit configured to form a amplifier of class A, B, C, D, DE, E, F and the like, and may deliver power at maximum efficiency (namely with minimum losses within the driving circuit) when it is driving a resonant network with specific impedance $Z_0^*$, where $Z_0$ may be complex and * denotes complex conjugation. The external circuit may be a driven load configured to form a rectifier of class A, B, C, D, DE, E, F and the like, and may receive power at maximum efficiency (namely with minimum losses within the driven load) when it is driven by a resonant network with specific impedance $Z_0^*$, where $Z_0$ may be complex. The external circuit may be a transmission line with characteristic impedance, $Z_0$, and may exchange power at maximum efficiency (namely with zero reflections) when connected to an impedance $Z_0^*$. We will call the characteristic impedance $Z_0$ of an external circuit the complex conjugate of the impedance that may be connected to it for power exchange at maximum efficiency.

Typically the impedance of an inductive element, R+jX, may be much different from $Z_0^*$. For example, if the inductive element has low loss (a high X/R), its resistance, R, may be much lower than the real part of the characteristic impedance, $Z_0$, of the external circuit. Furthermore, an inductive element by itself may not be a resonant network.

An impedance-matching network connected to an inductive element may typically create a resonant network, whose impedance may be regulated.

Therefore, an impedance-matching network may be designed to maximize the efficiency of the power delivered between the external circuit and the inductive element (including the reflected impedances of any coupled systems). The efficiency of delivered power may be maximized by matching the impedance of the combination of an impedance-matching network and an inductive element to the characteristic impedance of an external circuit (or transmission line) at the desired frequency.

An impedance-matching network may be designed to deliver a specified amount of power between the external circuit and the inductive element (including the reflected impedances of any coupled systems). The delivered power may be determined by adjusting the complex ratio of the impedance of the combination of the impedance-matching network and the inductive element to the impedance of the external circuit (or transmission line) at the desired frequency.

Impedance-matching networks connected to inductive elements may create magnetic resonators. For some applications, such as wireless power transmission using strongly-coupled magnetic resonators, a high Q may be desired for the resonators. Therefore, the inductive element may be chosen to have low losses (high X/R).

Since the matching circuit may typically include additional sources of loss inside the resonator, the components of the matching circuit may also be chosen to have low losses. Furthermore, in high-power applications and/or due to the high resonator Q, large currents may run in parts of the resonator circuit and large voltages may be present across some circuit elements within the resonator. Such currents and voltages may exceed the specified tolerances for particular circuit elements and may be too high for particular components to withstand. In some cases, it may be difficult to find or implement components, such as tunable capacitors for example, with size, cost and performance (loss and current/voltage-rating) specifications sufficient to realize high-Q and high-power resonator designs for certain applications. We disclose matching circuit designs, methods, implementations and techniques that may preserve the high Q for magnetic resonators, while reducing the component requirements for low loss and/or high current/voltage-rating.

Matching-circuit topologies may be designed that minimize the loss and current-rating requirements on some of the elements of the matching circuit. The topology of a circuit matching a low-loss inductive element to an impedance, $Z_0$, may be chosen so that some of its components lie outside the associated high-Q resonator by being in series with the external circuit. The requirements for low series loss or high current-ratings for these components may be reduced. Relieving the low series loss and/or high-current-rating requirement on a circuit element may be particularly useful when the element needs to be variable and/or to have a large voltage-rating and/or low parallel loss.

Matching-circuit topologies may be designed that minimize the voltage rating requirements on some of the elements of the matching circuit. The topology of a circuit matching a low-loss inductive element to an impedance, $Z_0$, may be chosen so that some of its components lie outside the associated high-Q resonator by being in parallel with $Z_0$. The requirements for low parallel loss or high voltage-rating for these components may be reduced. Relieving the low parallel loss and/or high-voltage requirement on a circuit element may be particularly useful when the element needs to be variable and/or to have a large current-rating and/or low series loss.

The topology of the circuit matching a low-loss inductive element to an external characteristic impedance, $Z_0$, may be chosen so that the field pattern of the associated resonant mode and thus its high Q are preserved upon coupling of the resonator to the external impedance. Otherwise inefficient coupling to the desired resonant mode may occur (potentially due to coupling to other undesired resonant modes), resulting in an effective lowering of the resonator Q.

For applications where the low-loss inductive element or the external circuit, may exhibit variations, the matching circuit may need to be adjusted dynamically to match the inductive element to the external circuit impedance, $Z_0$, at the desired frequency, f. Since there may typically be two tuning objectives, matching or controlling both the real and imaginary part of the impedance level, $Z_0$, at the desired frequency, f, there may be two variable elements in the matching circuit. For inductive elements, the matching circuit may need to include at least one variable capacitive element.

A low-loss inductive element may be matched by topologies using two variable capacitors, or two networks of variable capacitors. A variable capacitor may, for example, be a tunable butterfly-type capacitor having, e.g., a center terminal for connection to a ground or other lead of a power source or load, and at least one other terminal across which a capacitance of the tunable butterfly-type capacitor can be varied or tuned, or any other capacitor having a user-configurable, variable capacitance.

A low-loss inductive element may be matched by topologies using one, or a network of, variable capacitor(s) and one, or a network of, variable inductor(s).

A low-loss inductive element may be matched by topologies using one, or a network of, variable capacitor(s) and one, or a network of, variable mutual inductance(s), which transformer-couple the inductive element either to an external circuit or to other systems.

In some cases, it may be difficult to find or implement tunable lumped elements with size, cost and performance specifications sufficient to realize high-Q, high-power, and potentially high-speed, tunable resonator designs. The topology of the circuit matching a variable inductive element to an external circuit may be designed so that some of the variability is assigned to the external circuit by varying the frequency, amplitude, phase, waveform, duty cycle, and the like, of the drive signals applied to transistors, diodes, switches and the like, in the external circuit.

The variations in resistance, R, and inductance, L, of an inductive element at the resonant frequency may be only partially compensated or not compensated at all. Adequate system performance may thus be preserved by tolerances designed into other system components or specifications. Partial adjustments, realized using fewer tunable components or less capable tunable components, may be sufficient.

Matching-circuit architectures may be designed that achieve the desired variability of the impedance matching circuit under high-power conditions, while minimizing the voltage/current rating requirements on its tunable elements and achieving a finer (i.e. more precise, with higher resolution) overall tunability. The topology of the circuit matching a variable inductive element to an impedance, $Z_0$, may include appropriate combinations and placements of fixed and variable elements, so that the voltage/current requirements for the variable components may be reduced and the desired tuning range may be covered with finer tuning resolution. The voltage/current requirements may be reduced on components that are not variable.

The disclosed impedance matching architectures and techniques may be used to achieve the following:

- To maximize the power delivered to, or to minimize impedance mismatches between, the source low-loss inductive elements (and any other systems wirelessly coupled to them) from the power driving generators.
- To maximize the power delivered from, or to minimize impedance mismatches between, the device low-loss inductive elements (and any other systems wirelessly coupled to them) to the power driven loads.
- To deliver a controlled amount of power to, or to achieve a certain impedance relationship between, the source low-loss inductive elements (and any other systems wirelessly coupled to them) from the power driving generators.
- To deliver a controlled amount of power from, or to achieve a certain impedance relationship between, the device low-loss inductive elements (and any other systems wirelessly coupled to them) to the power driven loads.

Topologies for Preservation of Mode Profile (High-Q)

The resonator structure may be designed to be connected to the generator or the load wirelessly (indirectly) or with a hard-wired connection (directly).

Figure 28:
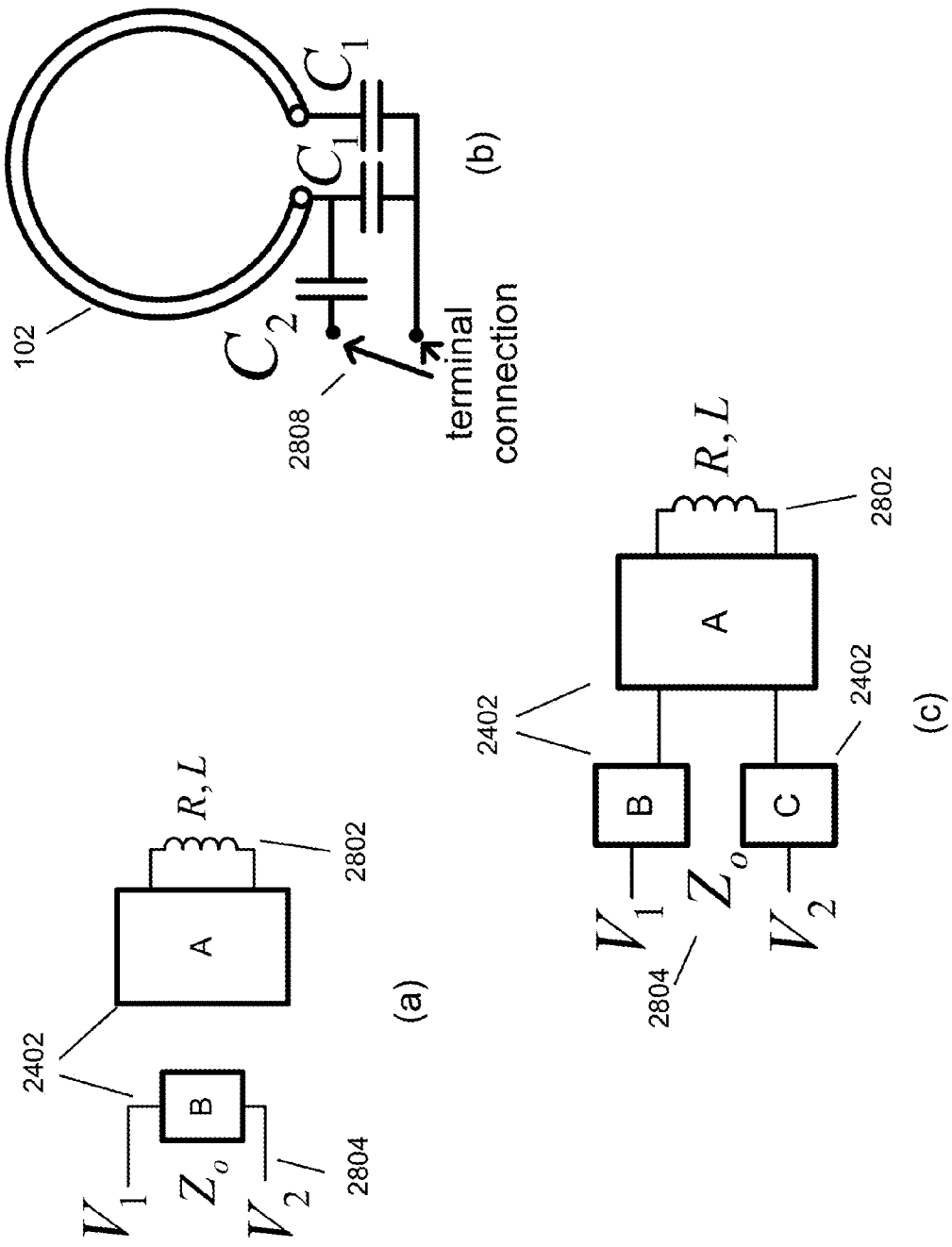
FIG. 28 (a) depicts a general topology of a matching circuit including an indirect coupling to a high-Q inductive element.

Consider a general indirectly coupled matching topology such as that shown by the block diagram in FIG. 28(a). There, an inductive element 2802, labeled as (R,L) and represented by the circuit symbol for an inductor, may be any of the inductive elements discussed in this disclosure or in the references provided herein, and where an impedance-matching circuit 2402 includes or consists of parts A and B. B may be the part of the matching circuit that connects the impedance 2804, $Z_o$, to the rest of the circuit (the combination of A and the inductive element (A+(R,L)) via a wireless connection (an inductive or capacitive coupling mechanism).

The combination of A and the inductive element 2802 may form a resonator 102, which in isolation may support a high-Q resonator electromagnetic mode, with an associated current and charge distribution. The lack of a wired connection between the external circuit, $Z_o$ and B, and the resonator, A+(R,L), may ensure that the high-Q resonator electromagnetic mode and its current/charge distributions may take the form of its intrinsic (in-isolation) profile, so long as the degree of wireless coupling is not too large. That is, the electromagnetic mode, current/charge distributions, and thus the high-Q of the resonator may be automatically maintained using an indirectly coupled matching topology.

This matching topology may be referred to as indirectly coupled, or transformer-coupled, or inductively-coupled, in the case where inductive coupling is used between the external circuit and the inductor loop. This type of coupling scenario was used to couple the power supply to the source resonator and the device resonator to the light bulb in the demonstration of wireless energy transfer over mid-range distances described in the referenced Science article.

Next consider examples in which the inductive element may include the inductive element and any indirectly coupled systems. In this case, as disclosed above, and again because of the lack of a wired connection between the external circuit or the coupled systems and the resonator, the coupled systems may not, with good approximation for not-too-large degree of indirect coupling, affect the resonator electromagnetic mode profile and the current/charge distributions of the resonator. Therefore, an indirectly-coupled matching circuit may work equally well for any general inductive element as part of a resonator as well as for inductive elements wirelessly-coupled to other systems, as defined herein. Throughout this disclosure, the matching topologies we disclose refer to matching topologies for a general inductive element of this type, that is, where any additional systems may be indirectly coupled to the low-loss inductive element, and it is to be understood that those additional systems do not greatly affect the resonator electromagnetic mode profile and the current/charge distributions of the resonator.

Based on the argument above, in a wireless power transmission system of any number of coupled source resonators, device resonators and intermediate resonators the wireless magnetic (inductive) coupling between resonators does not affect the electromagnetic mode profile and the current/charge distributions of each one of the resonators. Therefore, when these resonators have a high (unloaded and unperturbed) Q, their (unloaded and unperturbed) Q may be preserved in the presence of the wireless coupling. (Note that the loaded Q of a resonator may be reduced in the presence of wireless coupling to another resonator, but we may be interested in preserving the unloaded Q, which relates only to loss mechanisms and not to coupling/loading mechanisms.)

Consider a matching topology such as is shown in FIG. 28(b). The capacitors shown in FIG. 28(b) may represent capacitor circuits or networks. The capacitors shown may be used to form the resonator 102 and to adjust the frequency and/or impedance of the source and device resonators. This resonator 102 may be directly coupled to an impedance, $Z_o$, using the ports labeled "terminal connections" 2808. FIG. 28(c) shows a generalized directly coupled matching topology, where the impedance-matching circuit 2602 includes or consists of parts A, B and C. Here, circuit elements in A, B and C may be considered part of the resonator 102 as well as part of the impedance matching 2402 (and frequency tuning) topology. B and C may be the parts of the matching circuit 2402 that connect the impedance $Z_o$ 2804 (or the network terminals) to the rest of the circuit (A and the inductive element) via a single wire connection each. Note that B and C could be empty (short-circuits). If we disconnect or open circuit parts B and C (namely those single wire connections), then, the combination of A and the inductive element (R,L) may form the resonator.

The high-Q resonator electromagnetic mode may be such that the profile of the voltage distribution along the inductive element has nodes, namely positions where the voltage is zero. One node may be approximately at the center of the length of the inductive element, such as the center of the conductor used to form the inductive element, (with or without magnetic materials) and at least one other node may be within A. The voltage distribution may be approximately anti-symmetric along the inductive element with respect to its voltage node. A high Q may be maintained by designing the matching topology (A, B, C) and/or the terminal voltages (V1, V2) so that this high-Q resonator electromagnetic mode distribution may be approximately preserved on the inductive element. This high-Q resonator electromagnetic mode distribution may be approximately preserved on the inductive element by preserving the voltage node (approximately at the center) of the inductive element. Examples that achieve these design goals are provided herein.

A, B, and C may be arbitrary (namely not having any special symmetry), and V1 and V2 may be chosen so that the voltage across the inductive element is symmetric (voltage node at the center inductive). These results may be achieved using simple matching circuits but potentially complicated terminal voltages, because a topology-dependent common-mode signal (V1+V2)/2 may be required on both terminals.

Consider an 'axis' that connects all the voltage nodes of the resonator, where again one node is approximately at the center of the length of the inductive element and the others within A. (Note that the 'axis' is really a set of points (the voltage nodes) within the electric-circuit topology and may not necessarily correspond to a linear axis of the actual physical structure. The 'axis' may align with a physical axis in cases where the physical structure has symmetry.) Two points of the resonator are electrically symmetric with respect to the 'axis', if the impedances seen between each of the two points and a point on the 'axis', namely a voltage-node point of the resonator, are the same.

B and C may be the same (C=B), and the two terminals may be connected to any two points of the resonator (A+(R,L)) that are electrically symmetric with respect to the 'axis' defined above and driven with opposite voltages (V2=−V1) as shown in FIG. 28(d). The two electrically symmetric points of the resonator 102 may be two electrically symmetric points on the inductor loop. The two electrically symmetric points of the resonator may be two electrically symmetric points inside A. If the two electrically symmetric points, (to which each of the equal parts B and C is connected), are inside A, A may need to be designed so that these electrically-symmetric points are accessible as connection points within the circuit. This topology may be referred to as a 'balanced drive' topology. These balanced-drive examples may have the advantage that any common-mode signal that may be present on the ground line, due to perturbations at the external circuitry or the power network, for example, may be automatically rejected (and may not reach the resonator). In some balanced-drive examples, this topology may require more components than other topologies.

In other examples, C may be chosen to be a short-circuit and the corresponding terminal to be connected to ground (V=0) and to any point on the electric-symmetry (zero-voltage) 'axis' of the resonator, and B to be connected to any other point of the resonator not on the electric-symmetry 'axis', as shown in FIG. 28(e). The ground-connected point on the electric-symmetry 'axis' may be the voltage node on the inductive element, approximately at the center of its conductor length. The ground-connected point on the electric-symmetry 'axis' may be inside the circuit A. Where the ground-connected point on the electric-symmetry 'axis' is inside A, A may need to be designed to include one such point on the electrical-symmetric 'axis' that is electrically accessible, namely where connection is possible.

This topology may be referred to as an 'unbalanced drive' topology. The approximately anti-symmetric voltage distribution of the electromagnetic mode along the inductive element may be approximately preserved, even though the resonator may not be driven exactly symmetrically. The reason is that the high Q and the large associated R-vs.-$Z_0$ mismatch necessitate that a small current may run through B and ground, compared to the much larger current that may flow inside the resonator, (A+(R,L)). In this scenario, the perturbation on the resonator mode may be weak and the location of the voltage node may stay at approximately the center location of the inductive element. These unbalanced-drive examples may have the advantage that they may be achieved using simple matching circuits and that there is no restriction on the driving voltage at the V1 terminal. In some unbalanced-drive examples, additional designs may be required to reduce common-mode signals that may appear at the ground terminal.

The directly-coupled impedance-matching circuit, generally including or consisting of parts A, B and C, as shown in FIG. 28(c), may be designed so that the wires and components of the circuit do not perturb the electric and magnetic field profiles of the electromagnetic mode of the inductive element and/or the resonator and thus preserve the high resonator Q. The wires and metallic components of the circuit may be oriented to be perpendicular to the electric field lines of the electromagnetic mode. The wires and components of the circuit may be placed in regions where the electric and magnetic field of the electromagnetic mode are weak.

Topologies for Alleviating Low-Series-Loss and High-Current-Rating Requirements on Elements If the matching circuit used to match a small resistance, R, of a low-loss inductive element to a larger characteristic impedance, $Z_0$, of an external circuit may be considered lossless, then $I_{Z_o}^2 Z_o = I_R^2 R \leftrightarrow I_{Z_o}/I_R = \sqrt{R/Z_o}$ and the current flowing through the terminals is much smaller than the current flowing through the inductive element. Therefore, elements connected immediately in series with the terminals (such as in directly-coupled B, C (FIG. 28(c))) may not carry high currents. Then, even if the matching circuit has lossy elements, the resistive loss present in the elements in series with the terminals may not result in a significant reduction in the high-Q of the resonator. That is, resistive loss in those series elements may not significantly reduce the efficiency of power transmission from $Z_0$ to the inductive element or vice versa. Therefore, strict requirements for low-series-loss and/or high current-ratings may not be necessary for these components. In general, such reduced requirements may lead to a wider selection of components that may be designed into the high-Q and/or high-power impedance matching and resonator topologies. These reduced requirements may be especially helpful in expanding the variety of variable and/or high voltage and/or low-parallel-loss components that may be used in these high-Q and/or high-power impedance-matching circuits.

Topologies for Alleviating Low-Parallel-Loss and High-Voltage-Rating Requirements on Elements If, as above, the matching circuit used to match a small resistance, R, of a low-loss inductive element to a larger characteristic impedance, $Z_0$, of an external circuit is lossless, then using the previous analysis, $$|V_{Z_o}/V_{load}| = |I_{Z_o} Z_o / I_R(R+jX)| \approx \sqrt{R/Z_o} \cdot Z_o/X = \sqrt{Z_o/R}/(X/R),$$

and, for a low-loss (high-X/R) inductive element, the voltage across the terminals may be typically much smaller than the voltage across the inductive element. Therefore, elements connected immediately in parallel to the terminals may not need to withstand high voltages. Then, even if the matching circuit has lossy elements, the resistive loss present in the elements in parallel with the terminals may not result in a significant reduction in the high-Q of the resonator. That is, resistive loss in those parallel elements may not significantly reduce the efficiency of power transmission from $Z_0$ to the inductive element or vice versa. Therefore, strict requirements for low-parallel-loss and/or high voltage-ratings may not be necessary for these components. In general, such reduced requirements may lead to a wider selection of components that may be designed into the high-Q and/or high-power impedance matching and resonator topologies. These reduced requirements may be especially helpful in expanding the variety of variable and/or high current and/or low-series-loss components that may be used in these high-Q and/or high-power impedance-matching and resonator circuits.

Note that the design principles above may reduce currents and voltages on various elements differently, as they variously suggest the use of networks in series with $Z_0$ (such as directly-coupled B, C) or the use of networks in parallel with $Z_0$. The preferred topology for a given application may depend on the availability of low-series-loss/high-current-rating or low-parallel-loss/high-voltage-rating elements.

Combinations of Fixed and Variable Elements for Achieving Fine Tunability and Alleviating High-Rating Requirements on Variable Elements Circuit Topologies Variable circuit elements with satisfactory low-loss and high-voltage or current ratings may be difficult or expensive to obtain. In this disclosure, we describe impedance-matching topologies that may incorporate combinations of fixed and variable elements, such that large voltages or currents may be assigned to fixed elements in the circuit, which may be more likely to have adequate voltage and current ratings, and alleviating the voltage and current rating requirements on the variable elements in the circuit.

Variable circuit elements may have tuning ranges larger than those required by a given impedance-matching application and, in those cases, fine tuning resolution may be difficult to obtain using only such large-range elements. In this disclosure, we describe impedance-matching topologies that incorporate combinations of both fixed and variable elements, such that finer tuning resolution may be accomplished with the same variable elements.

Therefore, topologies using combinations of both fixed and variable elements may bring two kinds of advantages simultaneously: reduced voltage across, or current through, sensitive tuning components in the circuit and finer tuning resolution. Note that the maximum achievable tuning range may be related to the maximum reduction in voltage across, or current through, the tunable components in the circuit designs.

Element Topologies

A single variable circuit-element (as opposed to the network of elements discussed above) may be implemented by a topology using a combination of fixed and variable components, connected in series or in parallel, to achieve a reduction in the rating requirements of the variable components and a finer tuning resolution. This can be demonstrated mathematically by the fact that:

If $x_{|total|} = x_{|fixed|} + x_{|variable|}$, then
then $\Delta x_{|total|}/x_{|total|} = \Delta x_{|variable|}/(x_{|fixed|} + x_{|variable|})$, and $X_{variable}/X_{total} = X_{variable}/(X_{fixed} + X_{variable})$, where $x_{|subscript|}$ is any element value (e.g. capacitance, inductance), X is voltage or current, and the "+ sign" denotes the appropriate (series-addition or parallel-addition) combination of elements. Note that the subscript format for $x_{|subscript|}$, is chosen to easily distinguish it from the radius of the area enclosed by a circular inductive element (e.g. x, $x_1$, etc.).

Furthermore, this principle may be used to implement a variable electric element of a certain type (e.g. a capacitance or inductance) by using a variable element of a different type, if the latter is combined appropriately with other fixed elements.

In conclusion, one may apply a topology optimization algorithm that decides on the required number, placement, type and values of fixed and variable elements with the required tunable range as an optimization constraint and the minimization of the currents and/or voltages on the variable elements as the optimization objective.

EXAMPLES

In the following schematics, we show different specific topology implementations for impedance matching to and resonator designs for a low-loss inductive element. In addition, we indicate for each topology: which of the principles described above are used, the equations giving the values of the variable elements that may be used to achieve the matching, and the range of the complex impedances that may be matched (using both inequalities and a Smith-chart description). For these examples, we assume that $Z_0$ is real, but an extension to a characteristic impedance with a non-zero imaginary part is straightforward, as it implies only a small adjustment in the required values of the components of the matching network. We will use the convention that the subscript, n, on a quantity implies normalization to (division by) $Z_0$.

Figure 29:
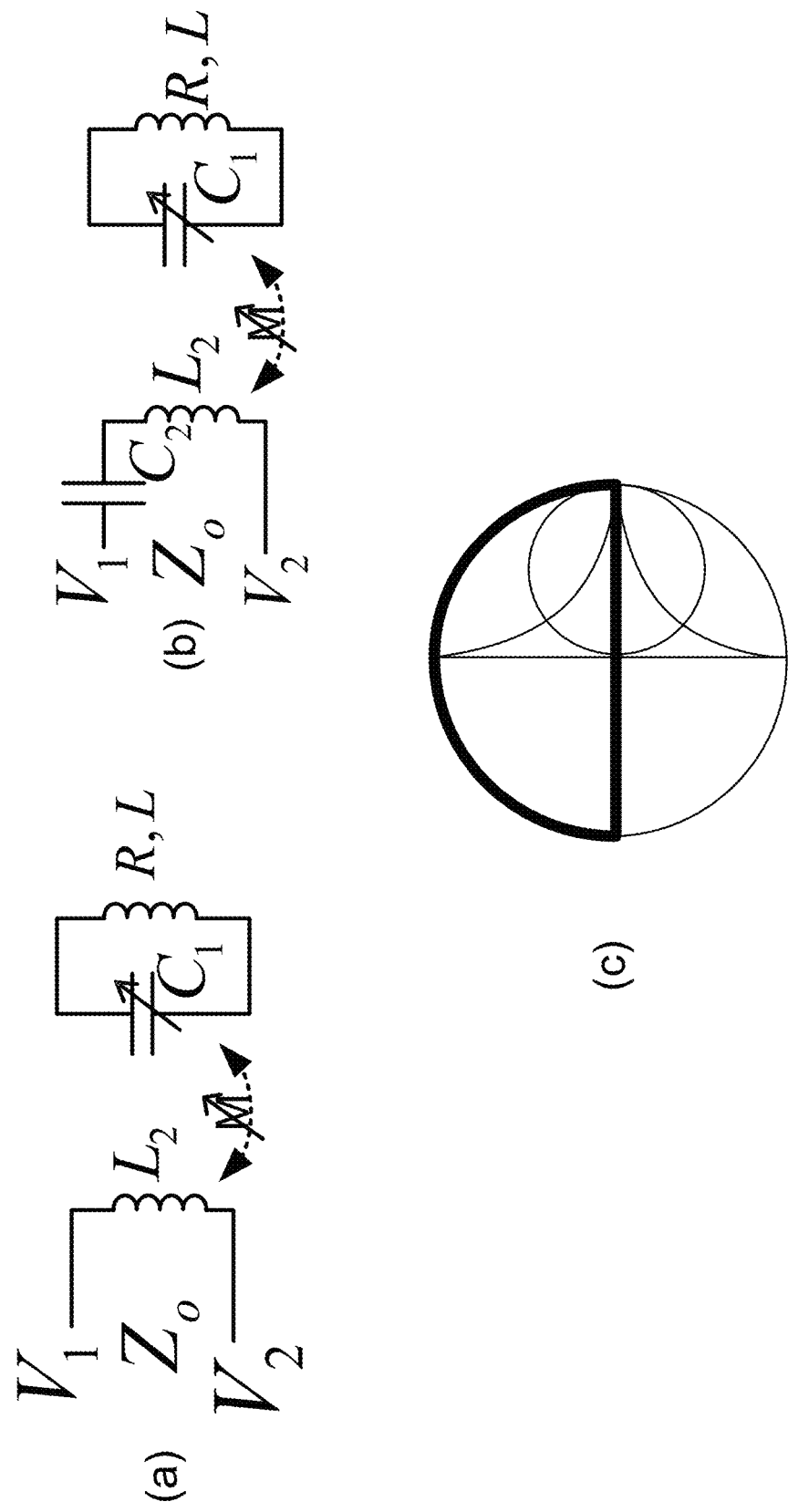
FIGS. 29(a) and 29(b) depict two topologies of matching circuits transformer-coupled (i.e. indirectly or inductively) to a high-Q inductive element. The highlighted portion of the Smith chart in (c) depicts the complex impedances (arising from L and R of the inductive element) that may be matched to an arbitrary real impedance $Z_0$ by the topology of FIG. 31(b) in the case $\omega L_2 = 1/\omega C_2$.

FIG. 29 shows two examples of a transformer-coupled impedance-matching circuit, where the two tunable elements are a capacitor and the mutual inductance between two inductive elements. If we define respectively $X_2 = \omega L_2$ for FIG. 29(a) and $X_2 = \omega L_2 - 1/\omega C_2$ for FIG. 29(b), and $X \equiv \omega L$, then the required values of the tunable elements are:

$$\omega C_1 = \frac{1}{X + RX_{2n}}$$

$$\omega M = \sqrt{Z_o R(1 + X_{2n}^2)}.$$

For the topology of FIG. 29(b), an especially straightforward design may be to choose $X_2 = 0$. In that case, these topologies may match the impedances satisfying the inequalities:

$R_n > 0$, $X_n > 0$, which are shown by the area enclosed by the bold lines on the Smith chart of FIG. 29(c).

Given a well pre-chosen fixed M, one can also use the above matching topologies with a tunable $C_2$ instead.

Figure 30:
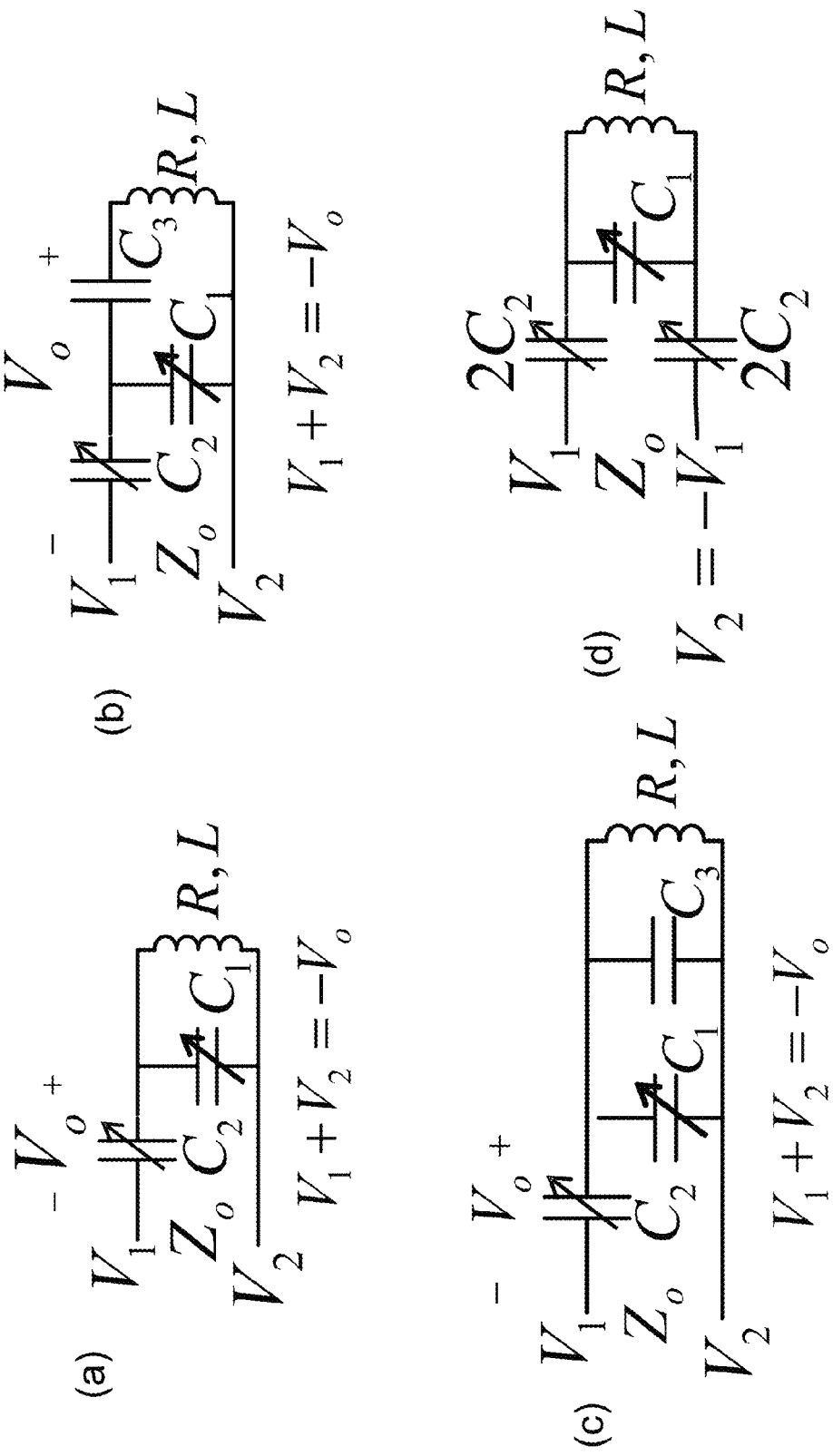
FIGS. 30(a),(b),(c),(d),(e),(f) depict six topologies of matching circuits directly coupled to a high-Q inductive element and including capacitors in series with $Z_0$. The topologies shown in FIGS. 30(a),(b),(c) are driven with a common-mode signal at the input terminals, while the topologies shown in FIGS. 30(d),(e),(f) are symmetric and receive a balanced drive. The highlighted portion of the Smith chart in 30(g) depicts the complex impedances that may be matched by these topologies.
FIGS. 30(h),(i),(j),(k),(l),(m) depict six topologies of matching circuits directly coupled to a high-Q inductive element and including inductors in series with $Z_0$.
Figure 30:
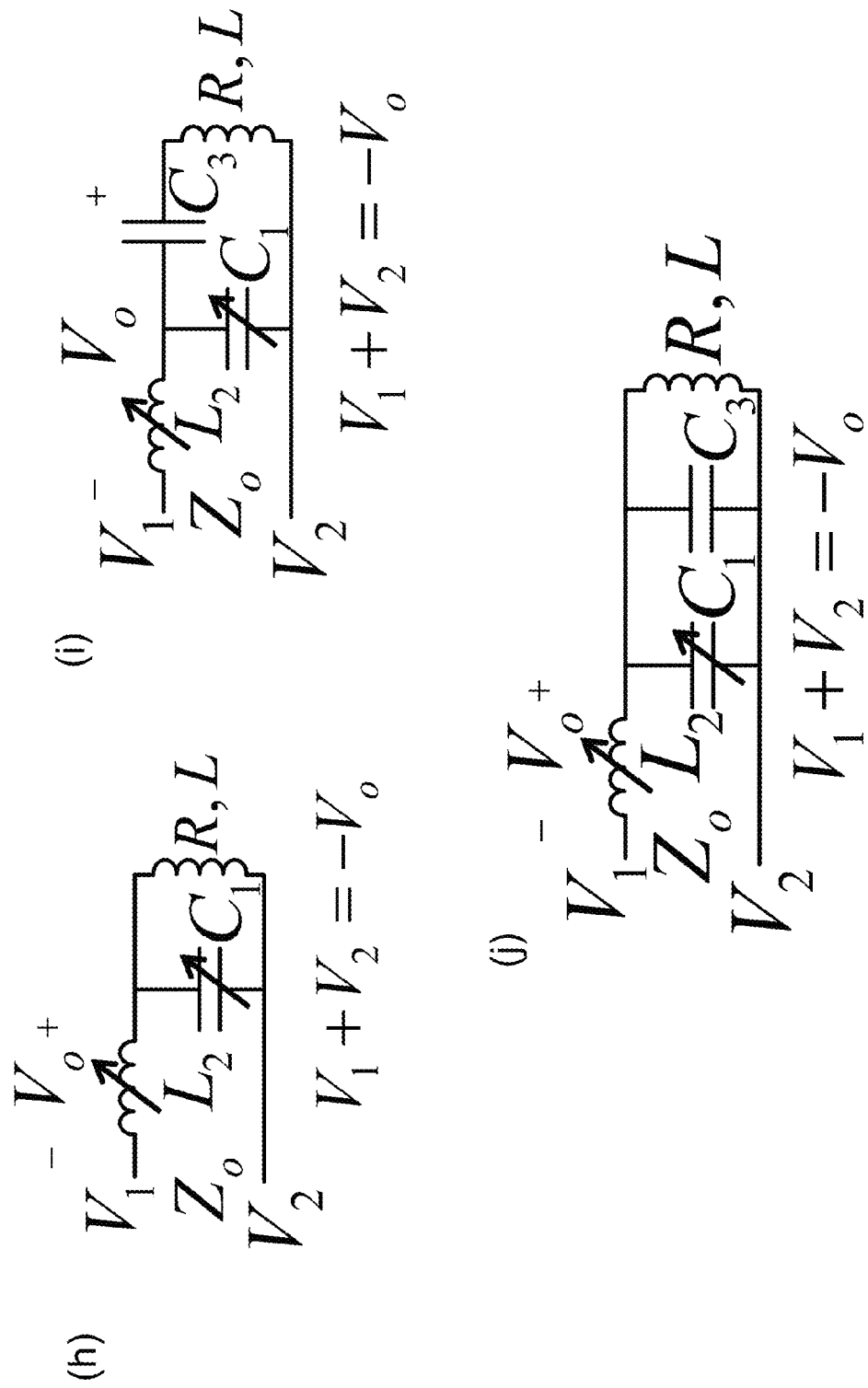
Figure 30:
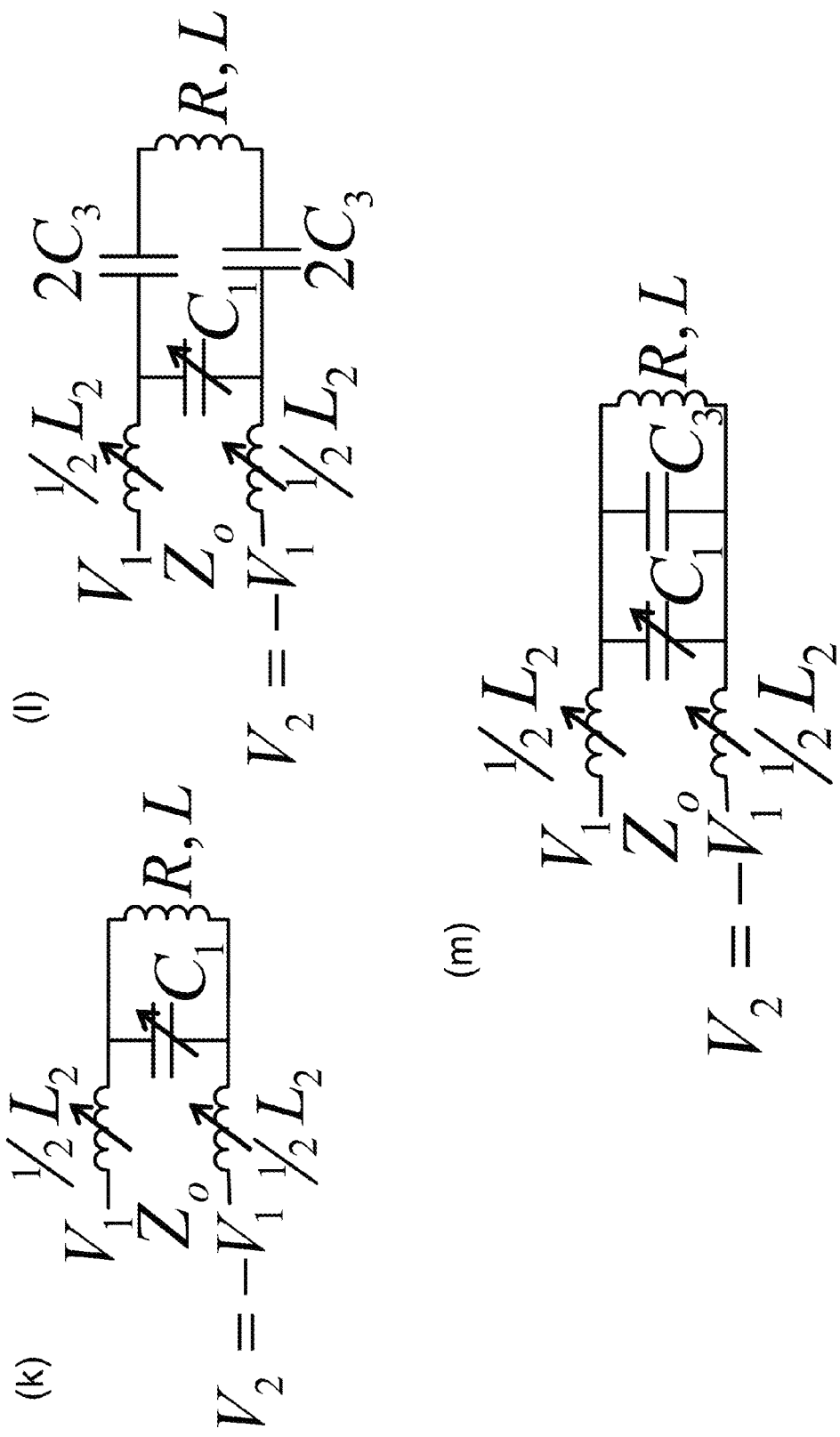

FIG. 30 shows six examples (a)-(f) of directly-coupled impedance-matching circuits, where the two tunable elements are capacitors, and six examples (h)-(m) of directly-coupled impedance-matching circuits, where the two tunable elements are one capacitor and one inductor. For the topologies of FIGS. 30(a),(b),(c),(h),(i),(j), a common-mode signal may be required at the two terminals to preserve the voltage node of the resonator at the center of the inductive element and thus the high Q. Note that these examples may be described as implementations of the general topology shown in FIG. 28(c). For the symmetric topologies of FIGS. 30(d),(e),(f),(k),(l),(m), the two terminals may need to be driven anti-symmetrically (balanced drive) to preserve the voltage node of the resonator at the center of the inductive element and thus the high Q. Note that these examples may be described as implementations of the general topology shown in FIG. 28(d). It will be appreciated that a network of capacitors, as used herein, may in general refer to any circuit topology including one or more capacitors, including without limitation any of the circuits specifically disclosed herein using capacitors, or any other equivalent or different circuit structure(s), unless another meaning is explicitly provided or otherwise clear from the context.

Let us define respectively $Z=R+j\omega L$ for FIGS. 30(a),(d),(h),(k), $Z=R+j\omega L+1/j\omega C_3$ for FIGS. 30(b),(e),(i),(l), and $Z=(R+j\omega L)\|(1/j\omega C_3)$ for FIGS. 30(c),(f),(j),(m), where the symbol "$\|$" means "the parallel combination of", and then $R\equiv\text{Re}\{Z\}$, $X\equiv\text{Im}\{Z\}$. Then, for FIGS. 30(a)-(f) the required values of the tunable elements may be given by:

$$\omega C_1 = \frac{X - \sqrt{X^2 R_n - R^2(1-R_n)}}{X^2 + R^2},$$

$$\omega C_2 = \frac{R_n \omega C_1}{1 - X\omega C_1 - R_n},$$

and these topologies can match the impedances satisfying the inequalities:

$$R_n \leq 1, X_n \geq \sqrt{R_n(1-R_n)}$$

which are shown by the area enclosed by the bold lines on the Smith chart of FIG. 30(g). For FIGS. 30(h)-(m) the required values of the tunable elements may be given by:

$$\omega C_1 = \frac{X + \sqrt{X^2 R_n - R^2(1-R_n)}}{X^2 + R^2},$$

$$\omega L_2 = -\frac{1 - X\omega C_1 - R_n}{R_n \omega C_1}.$$

Figure 31:
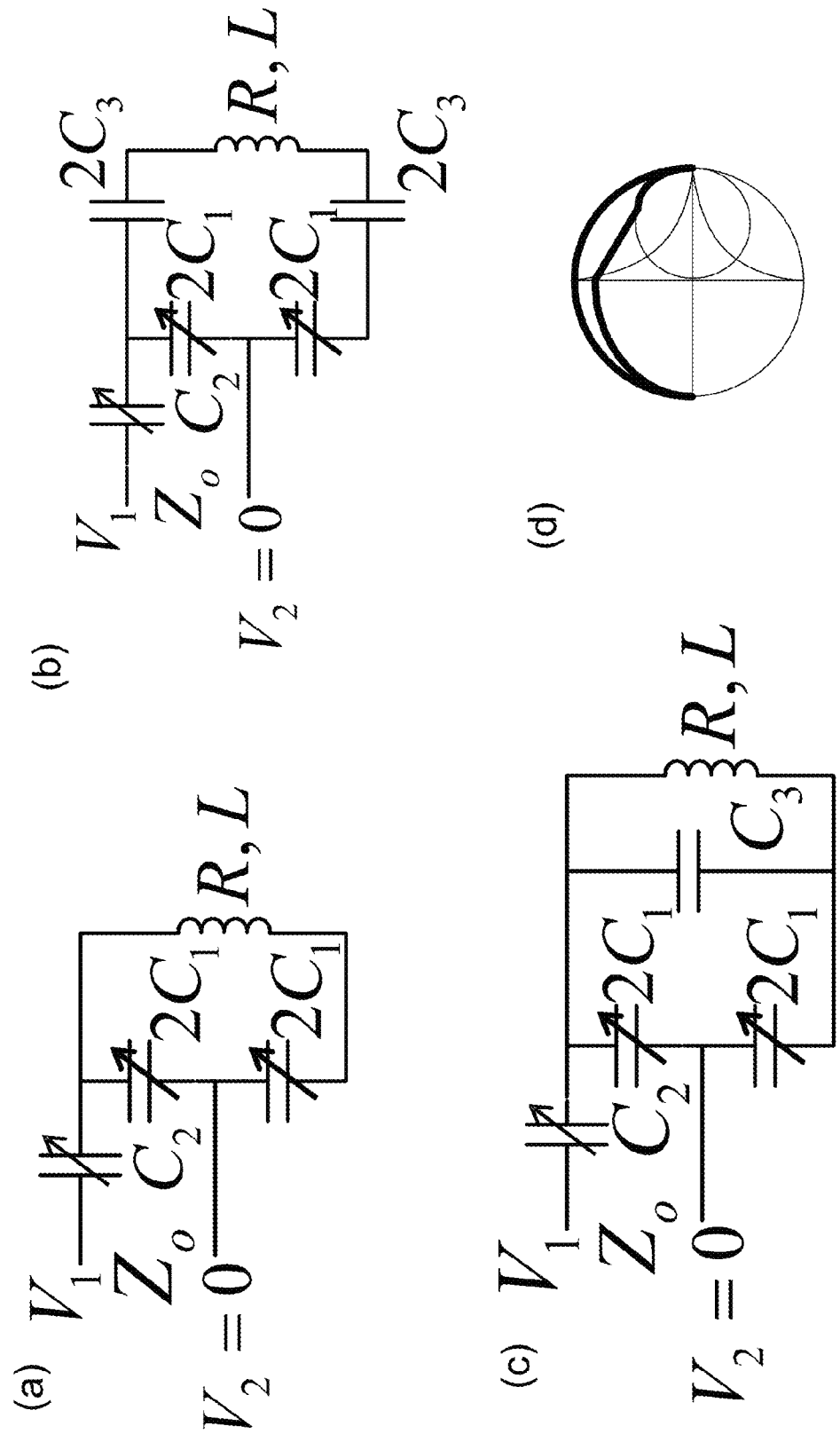
FIGS. 31(a),(b),(c) depict three topologies of matching circuits directly coupled to a high-Q inductive element and including capacitors in series with $Z_0$. They are connected to ground at the center point of a capacitor and receive an unbalanced drive. The highlighted portion of the Smith chart in FIG. 31(d) depicts the complex impedances that may be matched by these topologies.
FIGS. 31(e),(f),(g) depict three topologies of matching circuits directly coupled to a high-Q inductive element and including inductors in series with $Z_0$.
Figure 31:
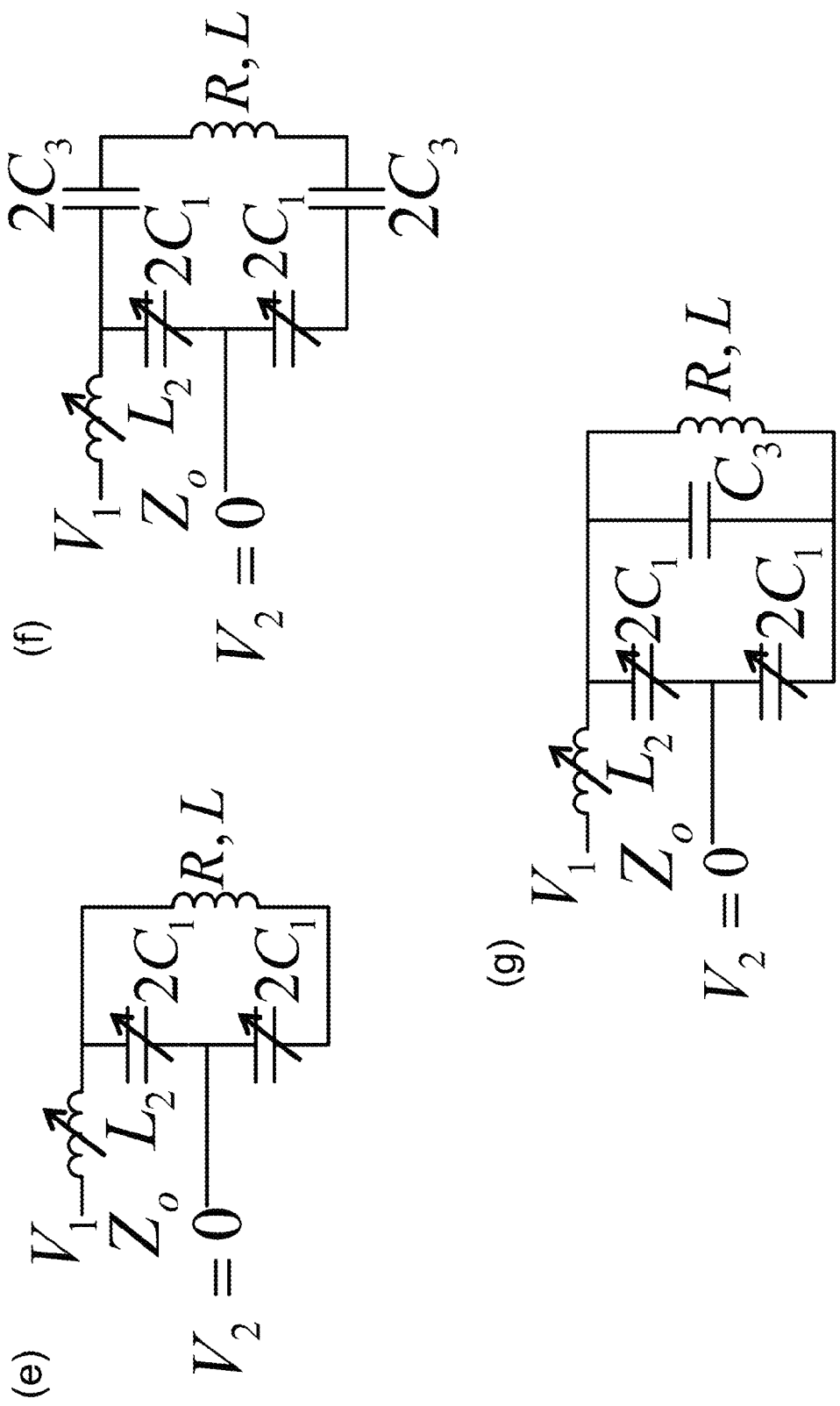

FIG. 31 shows three examples (a)-(c) of directly-coupled impedance-matching circuits, where the two tunable elements are capacitors, and three examples (e)-(g) of directly-coupled impedance-matching circuits, where the two tunable elements are one capacitor and one inductor. For the topologies of FIGS. 31(a),(b),(c),(e),(f),(g), the ground terminal is connected between two equal-value capacitors, $2C_1$, (namely on the axis of symmetry of the main resonator) to preserve the voltage node of the resonator at the center of the inductive element and thus the high Q. Note that these examples may be described as implementations of the general topology shown in FIG. 28(e).

Let us define respectively $Z=R+j\omega L$ for FIGS. 31(a),(e), $Z=R+j\omega L+1/j\omega C_3$ for FIGS. 31(b),(f), and $Z=(R+j\omega L)\|(1/j\omega C_3)$ for FIG. 31(c),(g), and then $R\equiv\text{Re}\{Z\}$, $X\equiv\text{Im}\{Z\}$. Then, for FIGS. 31(a)-(c) the required values of the tunable elements may be given by:

$$\omega C_1 = \frac{X - \frac{1}{2}\sqrt{X^2 R_n - R^2(4-R_n)}}{X^2 + R^2},$$

$$\omega C_2 = \frac{R_n \omega C_1}{1 - X\omega C_1 - \frac{R_n}{2}},$$

and these topologies can match the impedances satisfying the inequalities:

$$R_n \leq 1,\; X_n \geq \sqrt{\frac{R_n}{1-R_n}}(2-R_n)$$

which are shown by the area enclosed by the bold lines on the Smith chart of FIG. 31(d). For FIGS. 31(e)-(g) the required values of the tunable elements may be given by:

$$\omega C_1 = \frac{X + \frac{1}{2}\sqrt{X^2 R_n - R^2(4-R_n)}}{X^2 + R^2},$$

$$\omega L_2 = -\frac{1 - X\omega C_1 - \frac{R_n}{2}}{R_n \omega C_1}.$$

Figure 32:
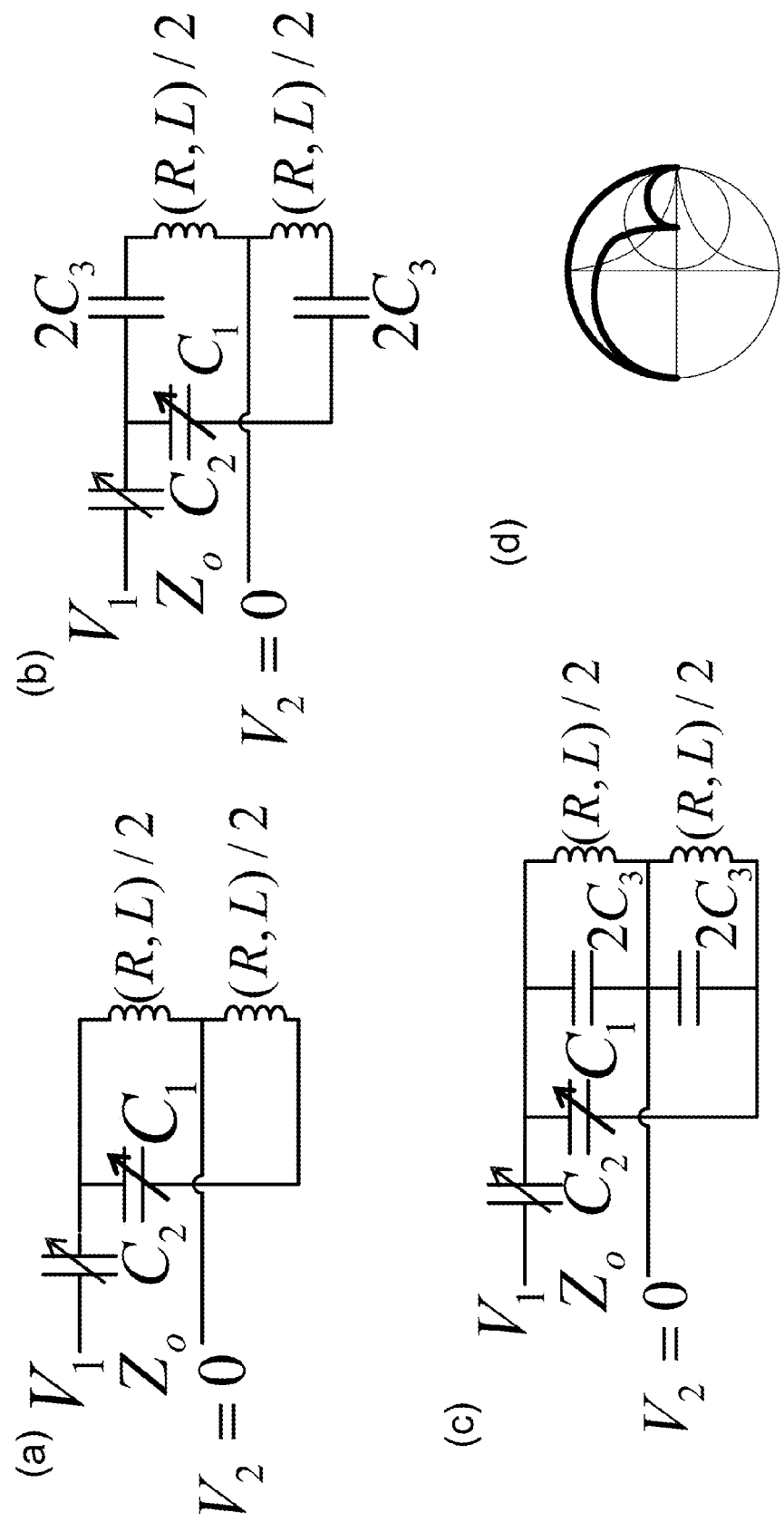
FIGS. 32(a),(b),(c) depict three topologies of matching circuits directly coupled to a high-Q inductive element and including capacitors in series with $Z_0$. They are connected to ground by tapping at the center point of the inductor loop and receive an unbalanced drive. The highlighted portion of the Smith chart in (d) depicts the complex impedances that may be matched by these topologies, (e),(f),(g) depict three topologies of matching circuits directly coupled to a high-Q inductive element and including inductors in series with $Z_0$.
Figure 32:
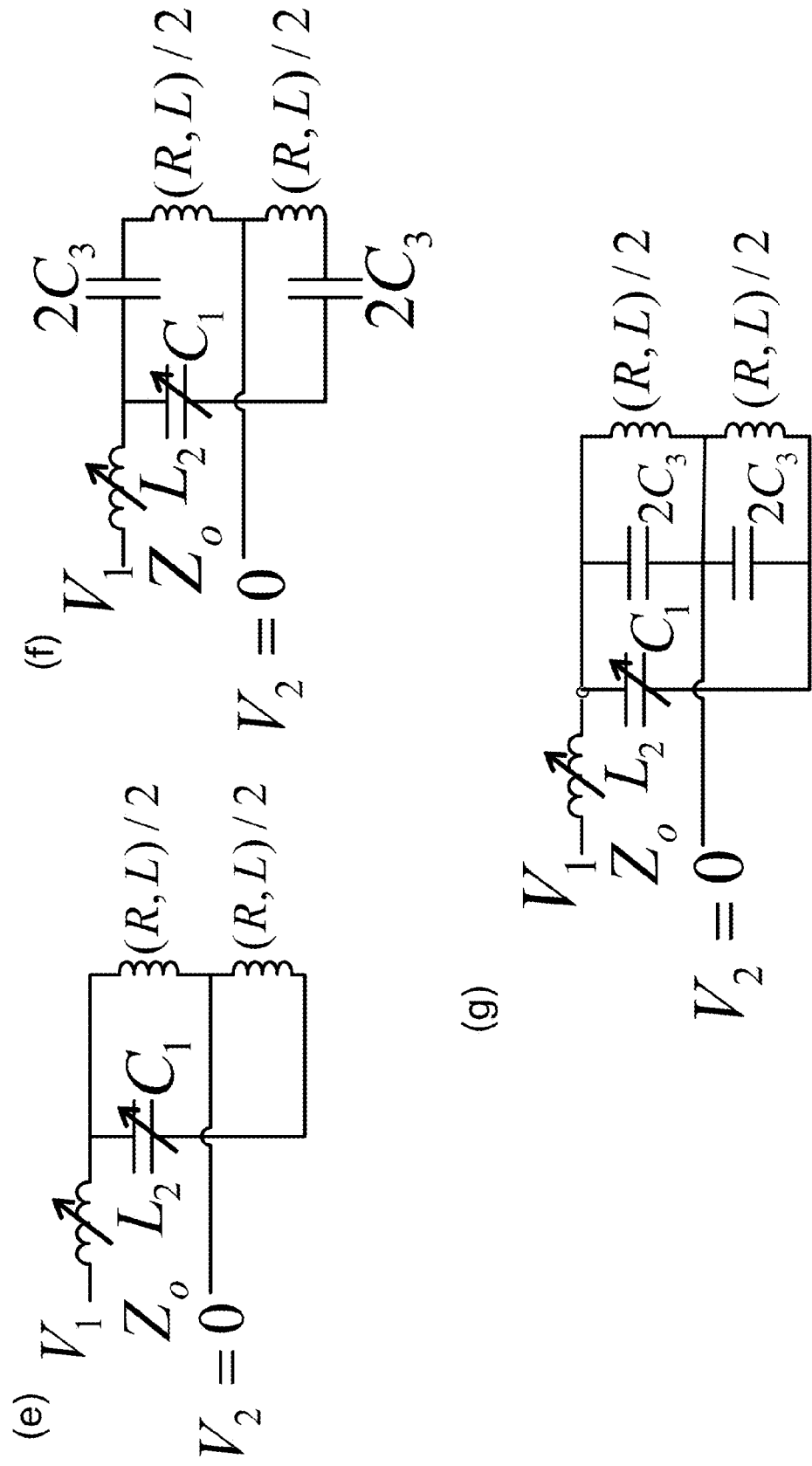

FIG. 32 shows three examples (a)-(c) of directly-coupled impedance-matching circuits, where the two tunable elements are capacitors, and three examples (e)-(g) of directly-coupled impedance-matching circuits, where the two tunable elements are one capacitor and one inductor. For the topologies of FIGS. 32(a),(b),(c),(e),(f),(g), the ground terminal may be connected at the center of the inductive element to preserve the voltage node of the resonator at that point and thus the high Q. Note that these example may be described as implementations of the general topology shown in FIG. 28(e).

Let us define respectively $Z=R+j\omega L$ for FIG. 32(a), $Z=R+j\omega L+1/j\omega C_3$ for FIG. 32(b), and $Z=(R+j\omega L)\|(1/j\omega C_3)$ for FIG. 32(c), and then $R\equiv\text{Re}\{Z\}$, $X\equiv\text{Im}\{Z\}$. Then, for FIGS. 32(a)-(c) the required values of the tunable elements may be given by:

$$\omega C_1 = \frac{X - \sqrt{\frac{X^2 R_n - 2R^2(2-R_n)}{4-R_n}}}{X^2 + R^2},$$

$$\omega C_2 = \frac{R_n \omega C_1}{1 - X\omega C_1 - \frac{R_n}{2} + \frac{R_n X\omega C_1}{2(1+k)}},$$

where k is defined by $M'=-kL'$, where $L'$ is the inductance of each half of the inductor loop and $M'$ is the mutual inductance between the two halves, and these topologies can match the impedances satisfying the inequalities:

$$R_n \leq 2, X_n \geq \sqrt{2R_n(2-R_n)}$$

which are shown by the area enclosed by the bold lines on the Smith chart of FIG. 32(d). For FIGS. 32(e)-(g) the required values of the tunable elements may be given by:

$$\omega C_1 = \frac{X + \sqrt{\frac{X^2 R_n - 2R^2(2-R_n)}{4-R_n}}}{X^2 + R^2},$$

In the circuits of FIGS. 30, 31, 32, the capacitor, $C_2$, or the inductor, $L_2$, is (or the two capacitors, $2C_2$, or the two inductors, $L_2/2$, are) in series with the terminals and may not need to have very low series-loss or withstand a large current.

Figure 33:
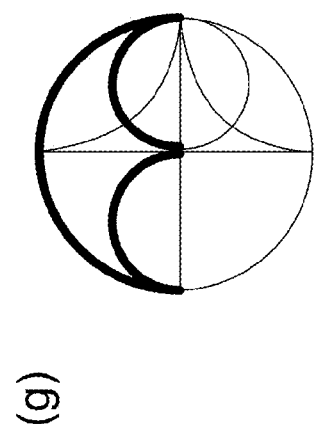
FIGS. 33(a),(b),(c),(d),(e),(f) depict six topologies of matching circuits directly coupled to a high-Q inductive element and including capacitors in parallel with $Z_0$. The topologies shown in FIGS. 33(a),(b),(c) are driven with a common-mode signal at the input terminals, while the topologies shown in FIGS. 33(d),(e),(f) are symmetric and receive a balanced drive. The highlighted portion of the Smith chart in FIG. 33(g) depicts the complex impedances that may be matched by these topologies.
FIGS. 33(h),(i),(j),(k),(l),(m) depict six topologies of matching circuits directly coupled to a high-Q inductive element and including inductors in parallel with $Z_0$.
Figure 33:
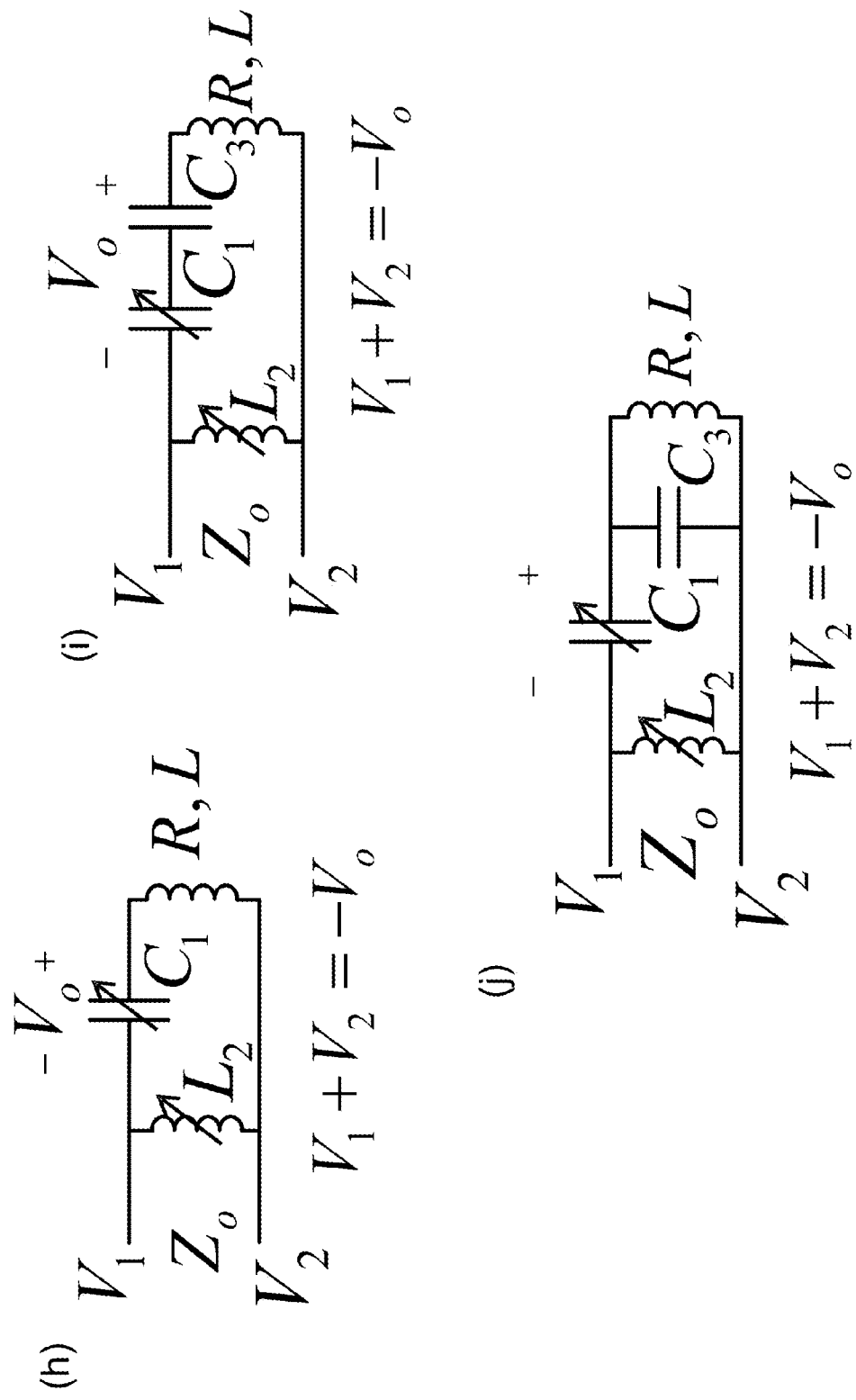
Figure 33:
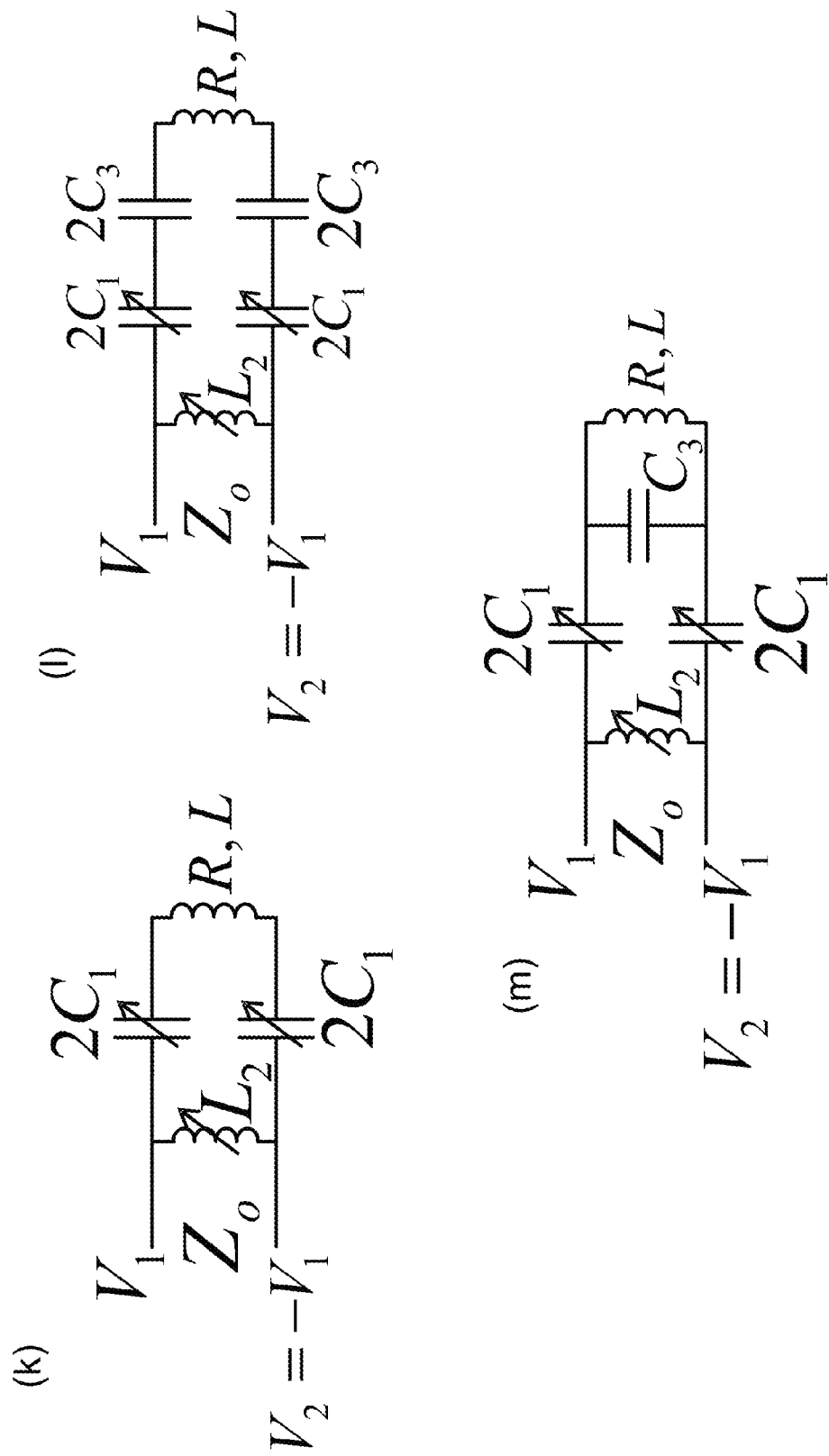

FIG. 33 shows six examples (a)-(f) of directly-coupled impedance-matching circuits, where the two tunable elements are capacitors, and six examples (h)-(m) of directly-coupled impedance-matching circuits, where the two tunable elements are one capacitor and one inductor. For the topologies of FIGS. 33(a),(b),(c),(h),(i),(j), a common-mode signal may be required at the two terminals to preserve the voltage node of the resonator at the center of the inductive element and thus the high Q. Note that these examples may be described as implementations of the general topology shown in FIG. 28(c), where B and C are short-circuits and A is not balanced. For the symmetric topologies of FIGS.

33(d),(e),(f),(k),(l),(m), the two terminals may need to be driven anti-symmetrically (balanced drive) to preserve the voltage node of the resonator at the center of the inductive element and thus the high Q. Note that these examples may be described as implementations of the general topology shown in FIG. 28(d), where B and C are short-circuits and A is balanced.

Let us define respectively Z=R+jωL for FIGS. 33(a),(d), (h),(k), Z=R+jωL+1/jωC$_3$ for FIGS. 33(b),(e),(i),(l), and Z=(R+jωL)∥(1/jωC$_3$) for FIGS. 33(c),(f),(j),(m), and then R≡Re{Z}, X≡Im{Z}. Then, for FIGS. 33(a)-(f) the required values of the tunable elements may be given by:

$$\omega C_1 = \frac{1}{X - Z_o\sqrt{R_n(1-R_n)}},$$

$$\omega C_2 = \frac{1}{Z_o}\sqrt{\frac{1}{R_n} - 1},$$

and these topologies can match the impedances satisfying the inequalities:

$$R_n \leq 1, X_n \geq \sqrt{R_n(1-R_n)}$$

which are shown by the area enclosed by the bold lines on the Smith chart of FIG. 33(g). For FIGS. 35(h)-(m) the required values of the tunable elements may be given by:

$$\omega C_1 = \frac{1}{X + Z_o\sqrt{R_n(1-R_n)}},$$

$$\omega L_2 = \frac{Z_o}{\sqrt{\frac{1}{R_n} - 1}}.$$

Figure 34:
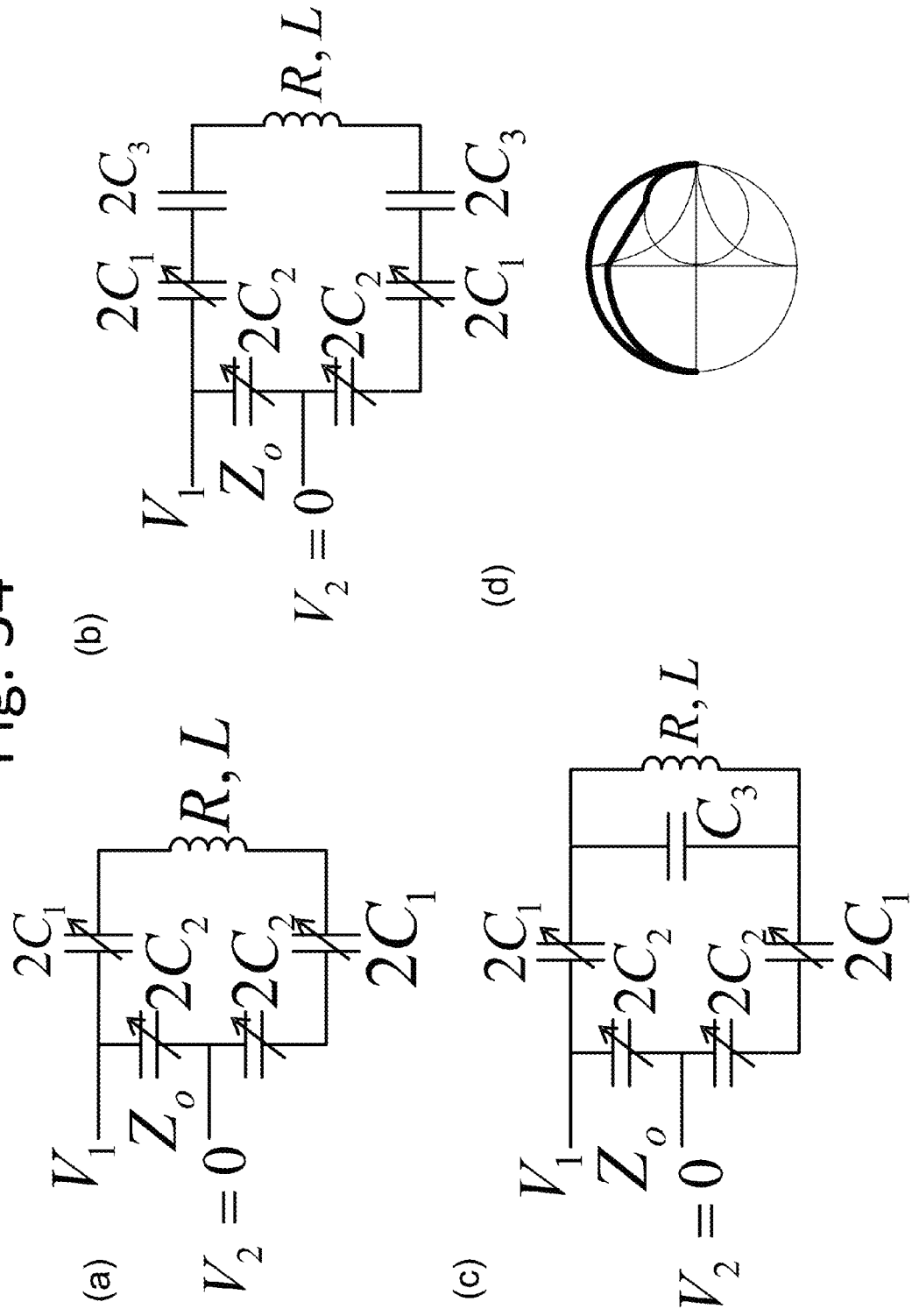
FIGS. 34(a),(b),(c) depict three topologies of matching circuits directly coupled to a high-Q inductive element and including capacitors in parallel with $Z_0$. They are connected to ground at the center point of a capacitor and receive an unbalanced drive. The highlighted portion of the Smith chart in (d) depicts the complex impedances that may be matched by these topologies.
FIGS. 34(e),(f),(g) depict three topologies of matching circuits directly coupled to a high-Q inductive element and including inductors in parallel with $Z_0$.
Figure 34:
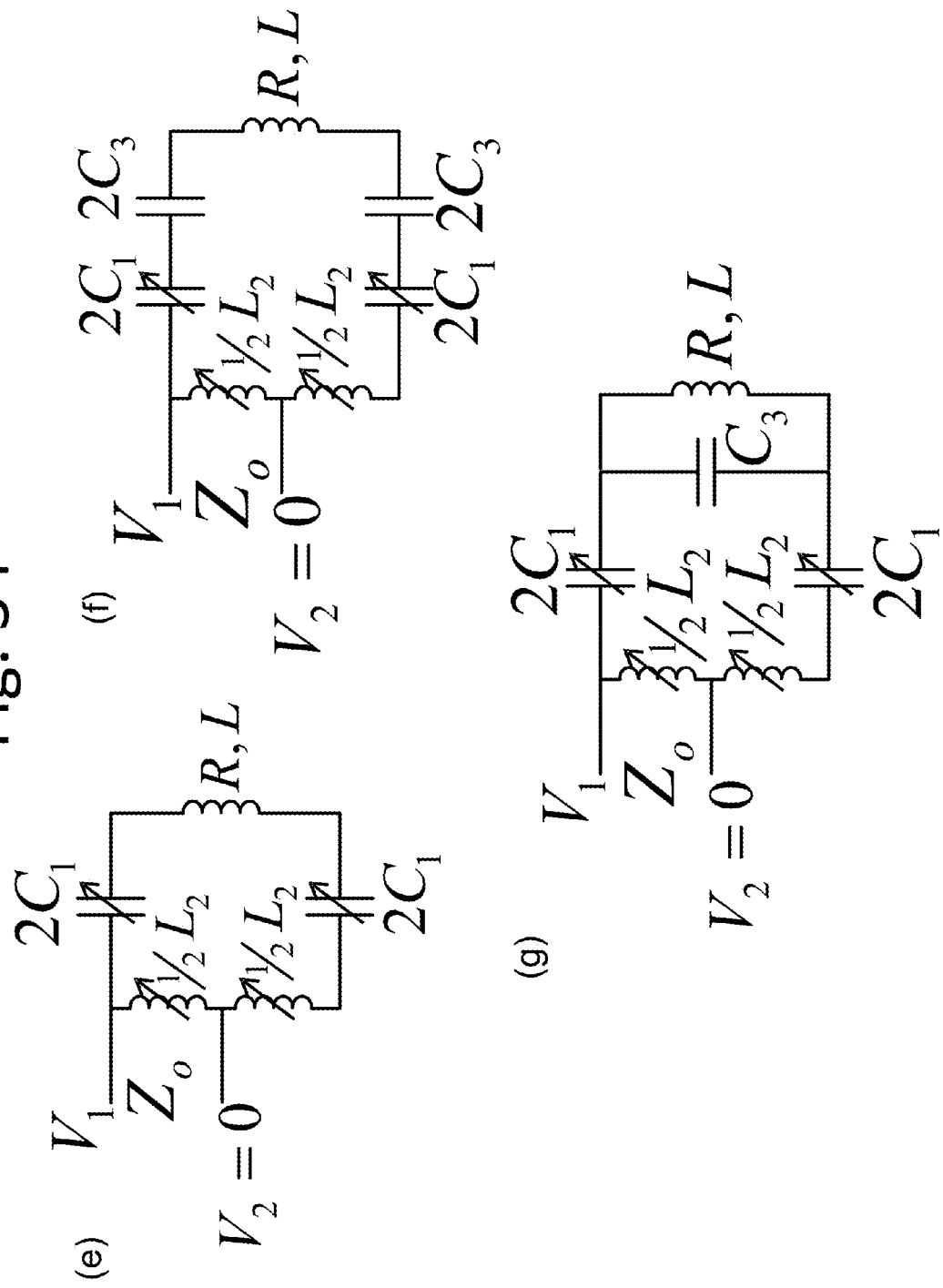

FIG. 34 shows three examples (a)-(c) of directly-coupled impedance-matching circuits, where the two tunable elements are capacitors, and three examples (e)-(g) of directly-coupled impedance-matching circuits, where the two tunable elements are one capacitor and one inductor. For the topologies of FIGS. 34(a),(b),(c),(e),(f),(g), the ground terminal is connected between two equal-value capacitors, 2C$_2$, (namely on the axis of symmetry of the main resonator) to preserve the voltage node of the resonator at the center of the inductive element and thus the high Q. Note that these examples may be described as implementations of the general topology shown in FIG. 28(e).

Let us define respectively Z=R+jωL for FIG. 34(a),(e), Z=R+jωL+1/jωC$_3$ for FIG. 34(b),(f), and Z=(R+jωL)∥(1/jωC$_3$) for FIG. 34(c),(g), and then R≡Re{Z}, X≡Im{Z}. Then, for FIGS. 34(a)-(c) the required values of the tunable elements may be given by:

$$\omega C_1 = \frac{1}{X - Z_o\sqrt{\frac{1-R_n}{R_n}(2-R_n)}},$$

$$\omega C_2 = \frac{1}{2Z_o}\sqrt{\frac{1}{R_n} - 1},$$

and these topologies can match the impedances satisfying the inequalities:

$$R_n \leq 1, X_n \geq \sqrt{\frac{R_n}{1-R_n}(2-R_n)}$$

which are shown by the area enclosed by the bold lines on the Smith chart of FIG. 34(d). For FIGS. 34(e)-(g) the required values of the tunable elements may be given by:

$$\omega C_1 = \frac{1}{X + Z_o\sqrt{\frac{1-R_n}{R_n}(2-R_n)}},$$

$$\omega L_2 = \frac{2Z_o}{\sqrt{\frac{1}{R_n} - 1}}.$$

Figure 35:
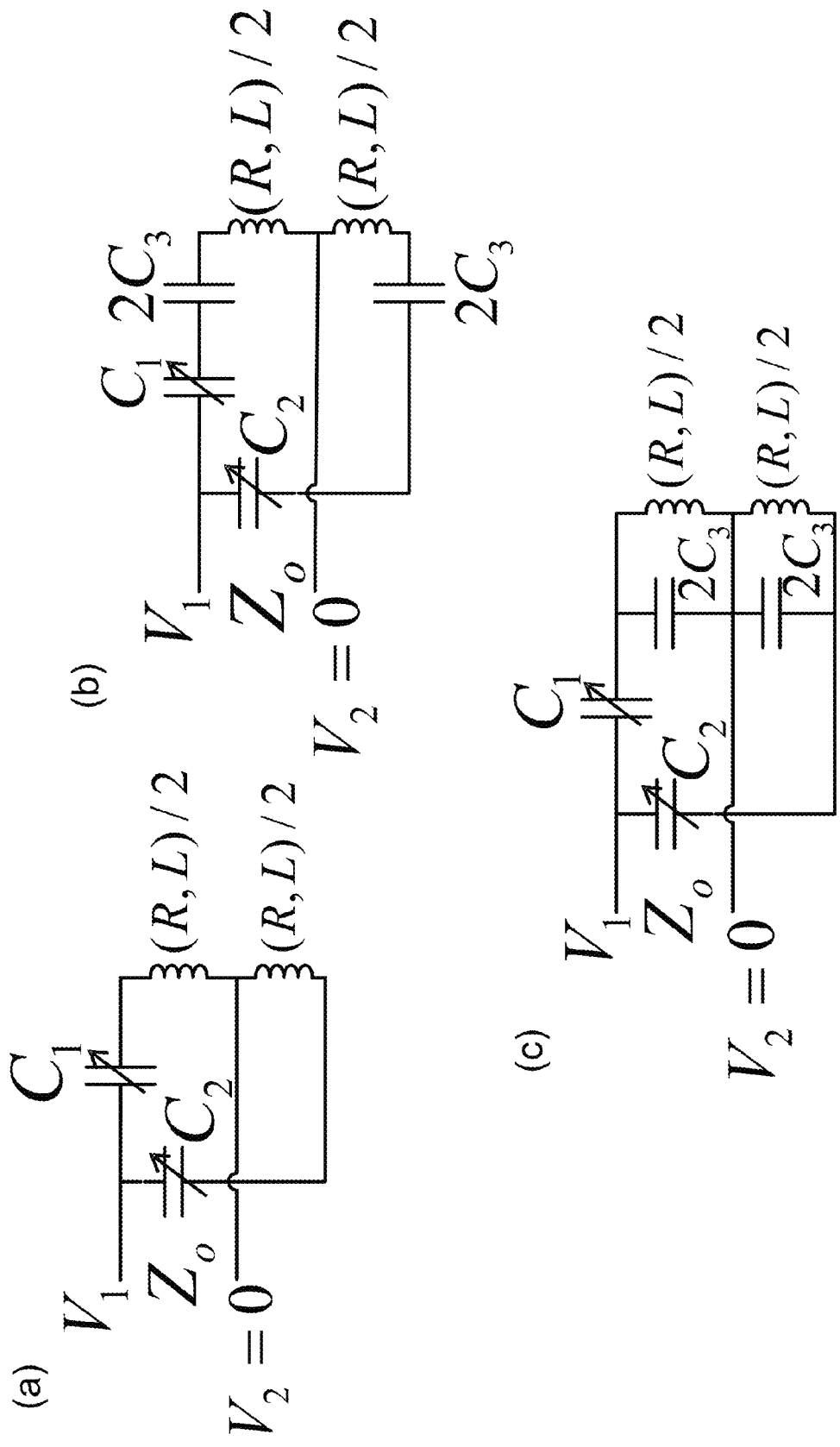
FIGS. 35(a),(b),(c) depict three topologies of matching circuits directly coupled to a high-Q inductive element and including capacitors in parallel with $Z_0$. They are connected to ground by tapping at the center point of the inductor loop and receive an unbalanced drive. The highlighted portion of the Smith chart in FIGS. 35(d),(e), and (f) depict the complex impedances that may be matched by these topologies.
Figure 35:
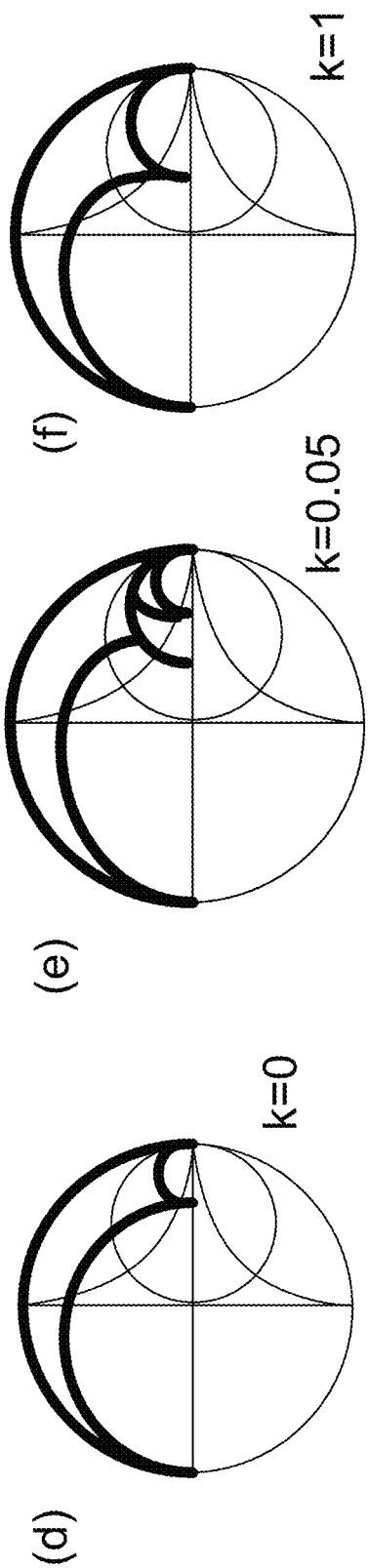

FIG. 35 shows three examples of directly-coupled impedance-matching circuits, where the two tunable elements are capacitors. For the topologies of FIGS. 35, the ground terminal may be connected at the center of the inductive element to preserve the voltage node of the resonator at that point and thus the high Q. Note that these examples may be described as implementations of the general topology shown in FIG. 28(e).

Let us define respectively Z=R+jωL for FIG. 35(a), Z=R+jωL+1/jωC$_3$ for FIG. 35(b), and Z=(R+jωL)∥(1/jωC$_3$) for FIG. 35(c), and then R≡Re{Z}, X≡Im{Z}. Then, the required values of the tunable elements may be given by:

$$\omega C_1 = \frac{2}{X(1+a) - \sqrt{Z_o R(4-R_n)(1+a^2)}},$$

$$\omega C_2 = \frac{2}{X(1+a) + \sqrt{Z_o R(4-R_n)(1+a^2)}},$$

where $$a = \frac{R}{2Z_o - R} \cdot \frac{k}{1+k}$$

and k is defined by M'=−kL', where L' is the inductance of each half of the inductive element and M' is the mutual inductance between the two halves. These topologies can match the impedances satisfying the inequalities:

$$R_n \leq 2 \ \& \ \frac{2}{\gamma} \leq R_n \leq 4,$$

$$X_n \geq \sqrt{\frac{R_n(4-R_n)(2-R_n)}{2-\gamma R_n}},$$

where $$\gamma = \frac{1 - 6k + k^2}{1 + 2k + k^2} \leq 1$$

which are shown by the area enclosed by the bold lines on the three Smith charts shown in FIG. 35(d) for k=0, FIG. 35(e) for k=0.05, and FIG. 35(f) for k=1. Note that for 0<k<1 there are two disconnected regions of the Smith chart that this topology can match.

In the circuits of FIGS. 33, 34, 35, the capacitor, $C_2$, or the inductor, $L_2$, is (or one of the two capacitors, $2C_2$, or one of the two inductors, $2L_2$, are) in parallel with the terminals and thus may not need to have a high voltage-rating. In the case of two capacitors, $2C_2$, or two inductors, $2L_2$, both may not need to have a high voltage-rating, since approximately the same current flows through them and thus they experience approximately the same voltage across them.

For the topologies of FIGS. 30-35, where a capacitor, $C_3$, is used, the use of the capacitor, $C_3$, may lead to finer tuning of the frequency and the impedance. For the topologies of FIGS. 30-35, the use of the fixed capacitor, $C_3$, in series with the inductive element may ensure that a large percentage of the high inductive-element voltage will be across this fixed capacitor, $C_3$, thus potentially alleviating the voltage rating requirements for the other elements of the impedance matching circuit, some of which may be variable. Whether or not such topologies are preferred depends on the availability, cost and specifications of appropriate fixed and tunable components.

In all the above examples, a pair of equal-value variable capacitors without a common terminal may be implemented using ganged-type capacitors or groups or arrays of varactors or diodes biased and controlled to tune their values as an ensemble. A pair of equal-value variable capacitors with one common terminal can be implemented using a tunable butterfly-type capacitor or any other tunable or variable capacitor or group or array of varactors or diodes biased and controlled to tune their capacitance values as an ensemble.

Another criterion which may be considered upon the choice of the impedance matching network is the response of the network to different frequencies than the desired operating frequency. The signals generated in the external circuit, to which the inductive element is coupled, may not be monochromatic at the desired frequency but periodic with the desired frequency, as for example the driving signal of a switching amplifier or the reflected signal of a switching rectifier. In some such cases, it may be desirable to suppress the amount of higher-order harmonics that enter the inductive element (for example, to reduce radiation of these harmonics from this element). Then the choice of impedance matching network may be one that sufficiently suppresses the amount of such harmonics that enters the inductive element.

The impedance matching network may be such that the impedance seen by the external circuit at frequencies higher than the fundamental harmonic is high, when the external periodic signal is a signal that can be considered to behave as a voltage-source signal (such as the driving signal of a class-D amplifier with a series resonant load), so that little current flows through the inductive element at higher frequencies. Among the topologies of FIGS. 30-35, those which use an inductor, $L_2$, may then be preferable, as this inductor presents a high impedance at high frequencies.

The impedance matching network may be such that the impedance seen by the external circuit at frequencies higher than the fundamental harmonic is low, when the external periodic signal is a signal that can be considered to behave as a current-source signal, so that little voltage is induced across the inductive element at higher frequencies. Among the topologies of FIGS. 30-35, those which use a capacitor, $C_2$, are then preferable, as this capacitor presents a low impedance at high frequencies.

Figure 36:
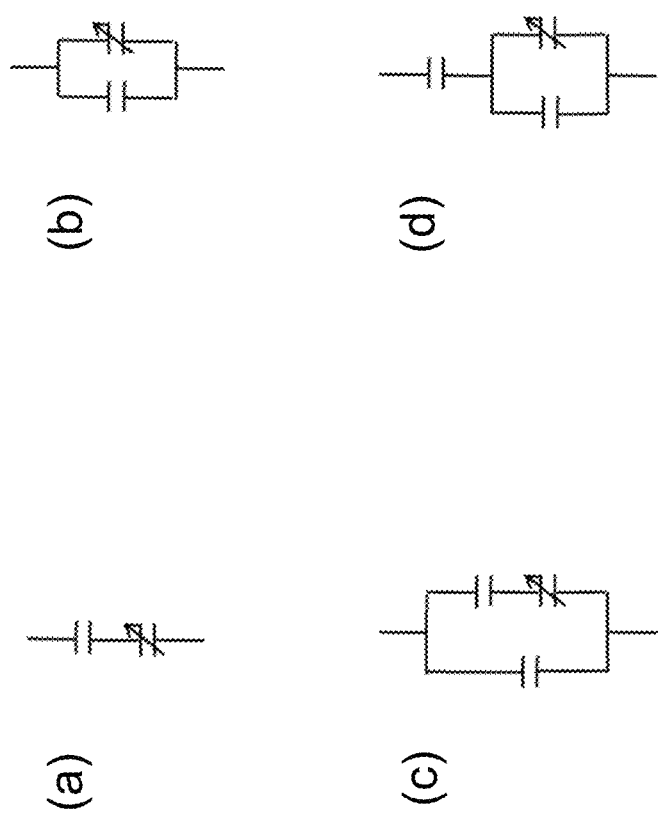
FIGS. 36(a),(b),(c),(d) depict four topologies of networks of fixed and variable capacitors designed to produce an overall variable capacitance with finer tuning resolution and some with reduced voltage on the variable capacitor.

FIG. 36 shows four examples of a variable capacitance, using networks of one variable capacitor and the rest fixed capacitors. Using these network topologies, fine tunability of the total capacitance value may be achieved. Furthermore, the topologies of FIGS. 36(a),(c),(d), may be used to reduce the voltage across the variable capacitor, since most of the voltage may be assigned across the fixed capacitors.

Figure 37:
FIGS. 37(a) and 37(b) depict two topologies of networks of fixed capacitors and a variable inductor designed to produce an overall variable capacitance.

FIG. 37 shows two examples of a variable capacitance, using networks of one variable inductor and fixed capacitors. In particular, these networks may provide implementations for a variable reactance, and, at the frequency of interest, values for the variable inductor may be used such that each network corresponds to a net negative variable reactance, which may be effectively a variable capacitance.

Tunable elements such as tunable capacitors and tunable inductors may be mechanically-tunable, electrically-tunable, thermally-tunable and the like. The tunable elements may be variable capacitors or inductors, varactors, diodes, Schottky diodes, reverse-biased PN diodes, varactor arrays, diode arrays, Schottky diode arrays and the like. The diodes may be Si diodes, GaN diodes, SiC diodes, and the like. GaN and SiC diodes may be particularly attractive for high power applications. The tunable elements may be electrically switched capacitor banks, electrically-switched mechanically-tunable capacitor banks, electrically-switched varactor-array banks, electrically-switched transformer-coupled inductor banks, and the like. The tunable elements may be combinations of the elements listed above.

As described above, the efficiency of the power transmission between coupled high-Q magnetic resonators may be impacted by how closely matched the resonators are in resonant frequency and how well their impedances are matched to the power supplies and power consumers in the system. Because a variety of external factors including the relative position of extraneous objects or other resonators in the system, or the changing of those relative positions, may alter the resonant frequency and/or input impedance of a high-Q magnetic resonator, tunable impedance networks may be required to maintain sufficient levels of power transmission in various environments or operating scenarios.

The capacitance values of the capacitors shown may be adjusted to adjust the resonant frequency and/or the impedance of the magnetic resonator. The capacitors may be adjusted electrically, mechanically, thermally, or by any other known methods. They may be adjusted manually or automatically, such as in response to a feedback signal. They may be adjusted to achieve certain power transmission efficiencies or other operating characteristics between the power supply and the power consumer.

The inductance values of the inductors and inductive elements in the resonator may be adjusted to adjust the frequency and/or impedance of the magnetic resonator. The inductance may be adjusted using coupled circuits that include adjustable components such as tunable capacitors, inductors and switches. The inductance may be adjusted using transformer coupled tuning circuits. The inductance may be adjusted by switching in and out different sections of conductor in the inductive elements and/or using ferromagnetic tuning and/or mu-tuning, and the like.

The resonant frequency of the resonators may be adjusted to or may be allowed to change to lower or higher frequencies. The input impedance of the resonator may be adjusted to or may be allowed to change to lower or higher impedance values. The amount of power delivered by the source and/or received by the devices may be adjusted to or may be allowed to change to lower or higher levels of power. The amount of power delivered to the source and/or received by the devices from the device resonator may be adjusted to or may be allowed to change to lower or higher levels of power. The resonator input impedances, resonant frequencies, and power levels may be adjusted depending on the power consumer or consumers in the system and depending on the objects or materials in the vicinity of the resonators. The resonator input impedances, frequencies, and power levels may be adjusted manually or automatically, and may be adjusted in response to feedback or control signals or algorithms.

Circuit elements may be connected directly to the resonator, that is, by physical electrical contact, for example to the ends of the conductor that forms the inductive element and/or the terminal connectors. The circuit elements may be soldered to, welded to, crimped to, glued to, pinched to, or closely position to the conductor or attached using a variety of electrical components, connectors or connection techniques. The power supplies and the power consumers may be connected to magnetic resonators directly or indirectly or inductively. Electrical signals may be supplied to, or taken from, the resonators through the terminal connections.

It is to be understood by one of ordinary skill in the art that in real implementations of the principles described herein, there may be an associated tolerance, or acceptable variation, to the values of real components (capacitors, inductors, resistors and the like) from the values calculated via the herein stated equations, to the values of real signals (voltages, currents and the like) from the values suggested by symmetry or anti-symmetry or otherwise, and to the values of real geometric locations of points (such as the point of connection of the ground terminal close to the center of the inductive element or the 'axis' points and the like) from the locations suggested by symmetry or otherwise.

Examples

System Block Diagrams

We disclose examples of high-Q resonators for wireless power transmission systems that may wirelessly power or charge devices at mid-range distances. High-Q resonator wireless power transmission systems also may wirelessly power or charge devices with magnetic resonators that are different in size, shape, composition, arrangement, and the like, from any source resonators in the system.

Figure 38:
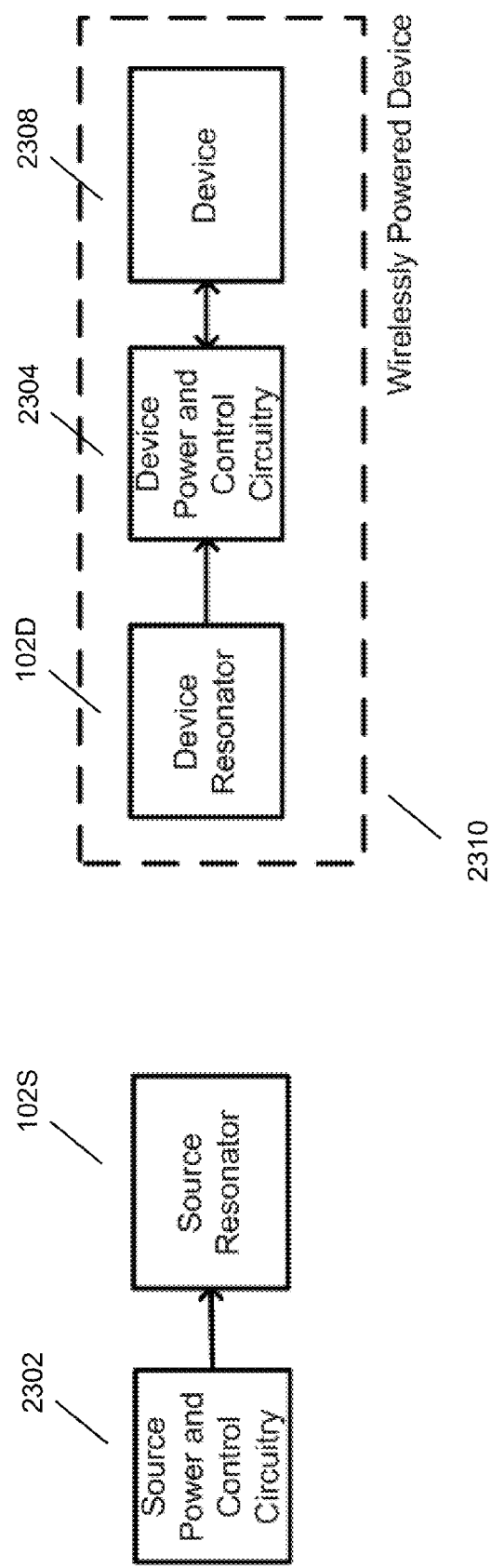
FIG. 38 depicts a high level block diagram of a wireless power transmission system.

FIG. 1(a)(b) shows high level diagrams of two exemplary two-resonator systems. These exemplary systems each have a single source resonator 102S or 104S and a single device resonator 102D or 104D. FIG. 38 shows a high level block diagram of a system with a few more features highlighted. The wirelessly powered or charged device 2310 may include or consist of a device resonator 102D, device power and control circuitry 2304, and the like, along with the device 2308 or devices, to which either DC or AC or both AC and DC power is transferred. The energy or power source for a system may include the source power and control circuitry 2302, a source resonator 102S, and the like. The device 2308 or devices that receive power from the device resonator 102D and power and control circuitry 2304 may be any kind of device 2308 or devices as described previously. The device resonator 102D and circuitry 2304 delivers power to the device/devices 2308 that may be used to recharge the battery of the device/devices, power the device/devices directly, or both when in the vicinity of the source resonator 102S.

The source and device resonators may be separated by many meters or they may be very close to each other or they may be separated by any distance in between. The source and device resonators may be offset from each other laterally or axially. The source and device resonators may be directly aligned (no lateral offset), or they may be offset by meters, or anything in between. The source and device resonators may be oriented so that the surface areas enclosed by their inductive elements are approximately parallel to each other. The source and device resonators may be oriented so that the surface areas enclosed by their inductive elements are approximately perpendicular to each other, or they may be oriented for any relative angle (0 to 360 degrees) between them.

The source and device resonators may be free standing or they may be enclosed in an enclosure, container, sleeve or housing. These various enclosures may be composed of almost any kind of material. Low loss tangent materials such as Teflon, REXOLITE, styrene, and the like may be preferable for some applications. The source and device resonators may be integrated in the power supplies and power consumers. For example, the source and device resonators may be integrated into keyboards, computer mice, displays, cell phones, etc. so that they are not visible outside these devices. The source and device resonators may be separate from the power supplies and power consumers in the system and may be connected by a standard or custom wires, cables, connectors or plugs.

The source 102S may be powered from a number of DC or AC voltage, current or power sources including a USB port of a computer. The source 102S may be powered from the electric grid, from a wall plug, from a battery, from a power supply, from an engine, from a solar cell, from a generator, from another source resonator, and the like. The source power and control circuitry 2302 may include circuits and components to isolate the source electronics from the power source, so that any reflected power or signals are not coupled out through the source input terminals. The source power and control circuits 2302 may include power factor correction circuits and may be configured to monitor power usage for monitoring accounting, billing, control, and like functionalities.

The system may be operated bi-directionally. That is, energy or power that is generated or stored in a device resonator may be fed back to a power source including the electric grid, a battery, any kind of energy storage unit, and the like. The source power and control circuits may include power factor correction circuits and may be configured to monitor power usage for monitoring accounting, billing, control, and like functionalities for bi-directional energy flow. Wireless energy transfer systems may enable or promote vehicle-to-grid (V2G) applications.

The source and the device may have tuning capabilities that allow adjustment of operating points to compensate for changing environmental conditions, perturbations, and loading conditions that can affect the operation of the source and device resonators and the efficiency of the energy exchange. The tuning capability may also be used to multiplex power delivery to multiple devices, from multiple sources, to multiple systems, to multiple repeaters or relays, and the like. The tuning capability may be manually controlled, or automatically controlled and may be performed continuously, periodically, intermittently or at scheduled times or intervals.

The device resonator and the device power and control circuitry may be integrated into any portion of the device, such as a battery compartment, or a device cover or sleeve, or on a mother board, for example, and may be integrated alongside standard rechargeable batteries or other energy storage units. The device resonator may include a device field reshaper which may shield any combination of the device resonator elements and the device power and control electronics from the electromagnetic fields used for the power transfer and which may deflect the resonator fields away from the lossy device resonator elements as well as the device power and control electronics. A magnetic material and/or high-conductivity field reshaper may be used to increase the perturbed quality factor Q of the resonator and increase the perturbed coupling factor of the source and device resonators.

The source resonator and the source power and control circuitry may be integrated into any type of furniture, structure, mat, rug, picture frame (including digital picture frames, electronic frames), plug-in modules, electronic devices, vehicles, and the like. The source resonator may include a source field reshaper which may shield any combination of the source resonator elements and the source power and control electronics from the electromagnetic fields used for the power transfer and which may deflect the resonator fields away from the lossy source resonator elements as well as the source power and control electronics. A magnetic material and/or high-conductivity field reshaper may be used to increase the perturbed quality factor Q of the resonator and increase the perturbed coupling factor of the source and device resonators.

Figure 39:
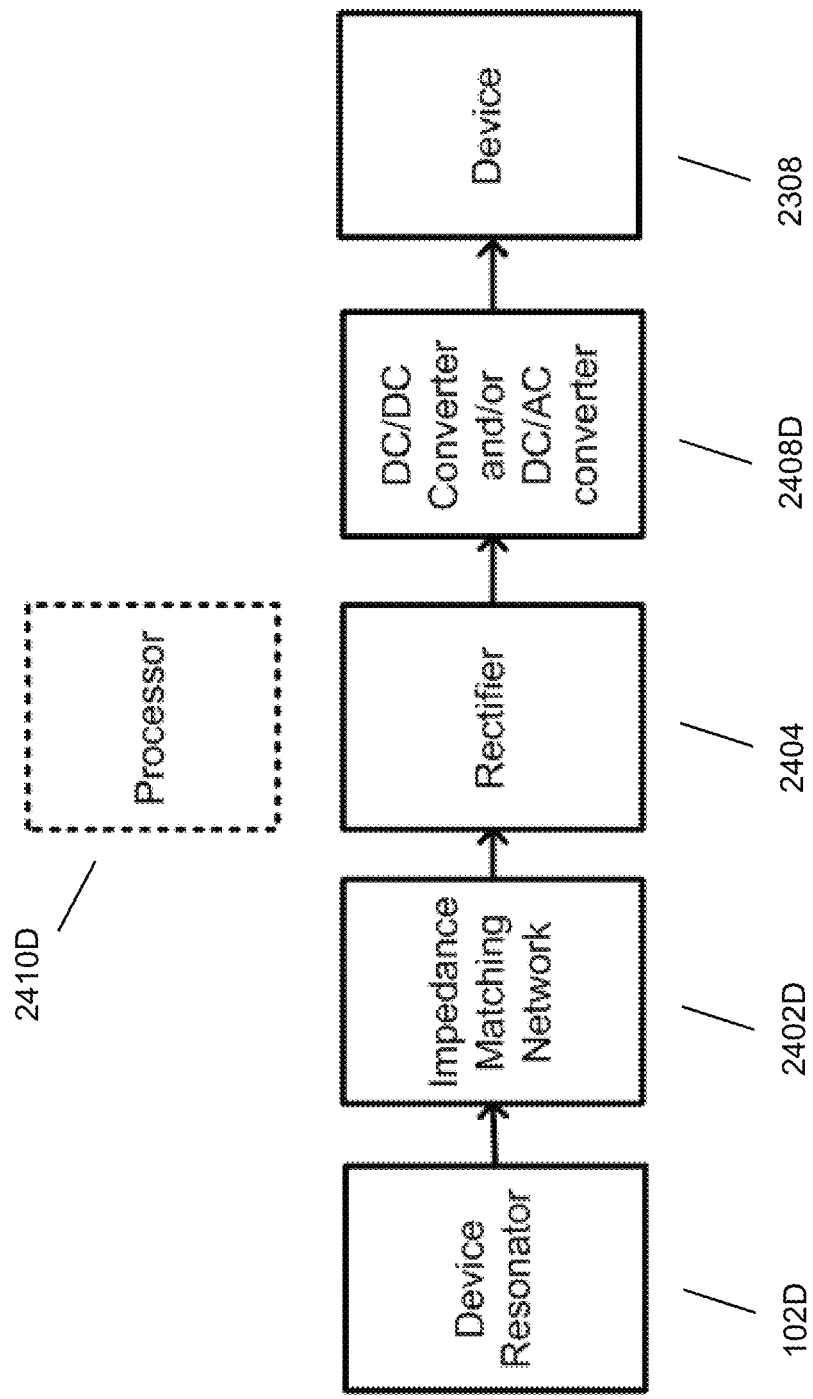
FIG. 39 depicts a block diagram of an exemplary wirelessly powered device.

A block diagram of the subsystems in an example of a wirelessly powered device is shown in FIG. 39. The power and control circuitry may be designed to transform the alternating current power from the device resonator 102D and convert it to stable direct current power suitable for powering or charging a device. The power and control circuitry may be designed to transform an alternating current power at one frequency from the device resonator to alternating current power at a different frequency suitable for powering or charging a device. The power and control circuitry may include or consist of impedance matching circuitry 2402D, rectification circuitry 2404, voltage limiting circuitry (not shown), current limiting circuitry (not shown), AC-to-DC converter 2408 circuitry, DC-to-DC converter 2408 circuitry, DC-to-AC converter 2408 circuitry, AC-to-AC converter 2408 circuitry, battery charge control circuitry (not shown), and the like.

The impedance-matching 2402D network may be designed to maximize the power delivered between the device resonator 102D and the device power and control circuitry 2304 at the desired frequency. The impedance matching elements may be chosen and connected such that the high-Q of the resonators is preserved. Depending on the operating conditions, the impedance matching circuitry 2402D may be varied or tuned to control the power delivered from the source to the device, from the source to the device resonator, between the device resonator and the device power and control circuitry, and the like. The power, current and voltage signals may be monitored at any point in the device circuitry and feedback algorithms circuits, and techniques, may be used to control components to achieve desired signal levels and system operation. The feedback algorithms may be implemented using analog or digital circuit techniques and the circuits may include a microprocessor, a digital signal processor, a field programmable gate array processor and the like.

The third block of FIG. 39 shows a rectifier circuit 2404 that may rectify the AC voltage power from the device resonator into a DC voltage. In this configuration, the output of the rectifier 2404 may be the input to a voltage clamp circuit. The voltage clamp circuit (not shown) may limit the maximum voltage at the input to the DC-to-DC converter 2408D or DC-to-AC converter 2408D. In general, it may be desirable to use a DC-to-DC/AC converter with a large input voltage dynamic range so that large variations in device position and operation may be tolerated while adequate power is delivered to the device. For example, the voltage level at the output of the rectifier may fluctuate and reach high levels as the power input and load characteristics of the device change. As the device performs different tasks it may have varying power demands. The changing power demands can cause high voltages at the output of the rectifier as the load characteristics change. Likewise as the device and the device resonator are brought closer and further away from the source, the power delivered to the device resonator may vary and cause changes in the voltage levels at the output of the rectifier. A voltage clamp circuit may prevent the voltage output from the rectifier circuit from exceeding a predetermined value which is within the operating range of the DC-to-DC/AC converter. The voltage clamp circuitry may be used to extend the operating modes and ranges of a wireless energy transfer system.

The next block of the power and control circuitry of the device is the DC-to-DC converter 2408D that may produce a stable DC output voltage. The DC-to-DC converter may be a boost converter, buck converter, boost-buck converter, single ended primary inductance converter (SEPIC), or any other DC-DC topology that fits the requirements of the particular application. If the device requires AC power, a DC-to-AC converter may be substituted for the DC-to-DC converter, or the DC-to-DC converter may be followed by a DC-to-AC converter. If the device contains a rechargeable battery, the final block of the device power and control circuitry may be a battery charge control unit which may manage the charging and maintenance of the battery in battery powered devices.

The device power and control circuitry 2304 may contain a processor 2410D, such as a microcontroller, a digital signal processor, a field programmable gate array processor, a microprocessor, or any other type of processor. The processor may be used to read or detect the state or the operating point of the power and control circuitry and the device resonator. The processor may implement algorithms to interpret and adjust the operating point of the circuits, elements, components, subsystems and resonator. The processor may be used to adjust the impedance matching, the resonator, the DC to DC converters, the DC to AC converters, the battery charging unit, the rectifier, and the like of the wirelessly powered device.

The processor may have wireless or wired data communication links to other devices or sources and may transmit or receive data that can be used to adjust the operating point of the system. Any combination of power, voltage, and current signals at a single, or over a range of frequencies, may be monitored at any point in the device circuitry. These signals may be monitored using analog or digital or combined analog and digital techniques. These monitored signals may be used in feedback loops or may be reported to the user in a variety of known ways or they may be stored and retrieved at later times. These signals may be used to alert a user of system failures, to indicate performance, or to provide audio, visual, vibrational, and the like, feedback to a user of the system.

Figure 40:
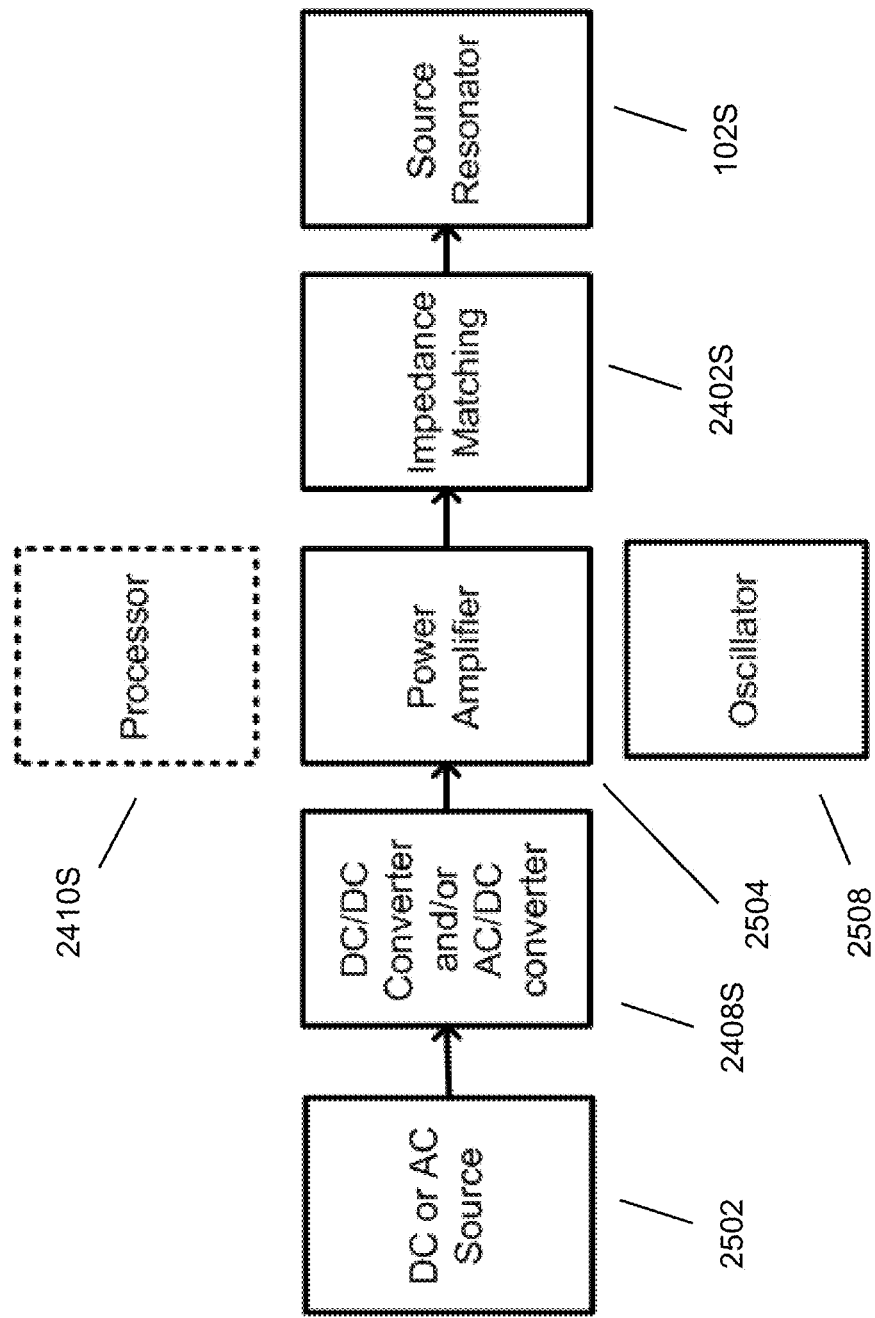
FIG. 40 depicts a block diagram of the source of an exemplary wireless power transfer system.

FIG. 40 shows components of source power and control circuitry 2302 of an exemplary wireless power transfer system configured to supply power to a single or multiple devices. The source power and control circuitry 2302 of the exemplary system may be powered from an AC voltage source 2502 such as a home electrical outlet, a DC voltage source such as a battery, a USB port of a computer, a solar cell, another wireless power source, and the like. The source power and control circuitry 2302 may drive the source resonator 102S with alternating current, such as with a frequency greater than 10 kHz and less than 100 MHz. The source power and control circuitry 2302 may drive the source resonator 102S with alternating current of frequency less than less than 10 GHz. The source power and control circuitry 2302 may include a DC-to-DC converter 2408S, an AC-to-DC converter 2408S, or both an AC-to-DC converter 2408S and a DC-to-DC 2408S converter, an oscillator 2508, a power amplifier 2504, an impedance matching network 2402S, and the like.

The source power and control circuitry 2302 may be powered from multiple AC-or-DC voltage sources 2502 and may contain AC-to-DC and DC-to-DC converters 2408S to provide necessary voltage levels for the circuit components as well as DC voltages for the power amplifiers that may be used to drive the source resonator. The DC voltages may be adjustable and may be used to control the output power level of the power amplifier. The source may contain power factor correction circuitry.

The oscillator 2508 output may be used as the input to a power amplifier 2504 that drives the source resonator 102S. The oscillator frequency may be tunable and the amplitude of the oscillator signal may be varied as one means to control the output power level from the power amplifier. The frequency, amplitude, phase, waveform, and duty cycle of the oscillator signal may be controlled by analog circuitry, by digital circuitry or by a combination of analog and digital circuitry. The control circuitry may include a processor 2410S, such as a microprocessor, a digital signal processor, a field programmable gate array processor, and the like.

The impedance matching blocks 2402 of the source and device resonators may be used to tune the power and control circuits and the source and device resonators. For example, tuning of these circuits may adjust for perturbation of the quality factor Q of the source or device resonators due to extraneous objects or changes in distance between the source and device in a system. Tuning of these circuits may also be used to sense the operating environment, control power flow to one or more devices, to control power to a wireless power network, to reduce power when unsafe or failure mode conditions are detected, and the like.

Any combination of power, voltage, and current signals may be monitored at any point in the source circuitry. These signals may be monitored using analog or digital or combined analog and digital techniques. These monitored signals may be used in feedback circuits or may be reported to the user in a variety of known ways or they may be stored and retrieved at later times. These signals may be used to alert a user to system failures, to alert a user to exceeded safety thresholds, to indicate performance, or to provide audio, visual, vibrational, and the like, feedback to a user of the system.

The source power and control circuitry may contain a processor. The processor may be used to read the state or the operating point of the power and control circuitry and the source resonator. The processor may implement algorithms to interpret and adjust the operating point of the circuits, elements, components, subsystems and resonator. The processor may be used to adjust the impedance matching, the resonator, the DC-to-DC converters, the AC-to-DC converters, the oscillator, the power amplifier of the source, and the like. The processor and adjustable components of the system may be used to implement frequency and/or time power delivery multiplexing schemes. The processor may have wireless or wired data communication links to devices and other sources and may transmit or receive data that can be used to adjust the operating point of the system.

Although detailed and specific designs are shown in these block diagrams, it should be clear to those skilled in the art that many different modifications and rearrangements of the components and building blocks are possible within the spirit of the exemplary system. The division of the circuitry was outlined for illustrative purposes and it should be clear to those skilled in the art that the components of each block may be further divided into smaller blocks or merged or shared. In equivalent examples the power and control circuitry may be composed of individual discrete components or larger integrated circuits. For example, the rectifier circuitry may be composed of discrete diodes, or use diodes integrated on a single chip. A multitude of other circuits and integrated devices can be substituted in the design depending on design criteria such as power or size or cost or application. The whole of the power and control circuitry or any portion of the source or device circuitry may be integrated into one chip.

The impedance matching network of the device and or source may include a capacitor or networks of capacitors, an inductor or networks of inductors, or any combination of capacitors, inductors, diodes, switches, resistors, and the like. The components of the impedance matching network may be adjustable and variable and may be controlled to affect the efficiency and operating point of the system. The impedance matching may be performed by controlling the connection point of the resonator, adjusting the permeability of a magnetic material, controlling a bias field, adjusting the frequency of excitation, and the like. The impedance matching may use or include any number or combination of varactors, varactor arrays, switched elements, capacitor banks, switched and tunable elements, reverse bias diodes, air gap capacitors, compression capacitors, BZT electrically tuned capacitors, MEMS-tunable capacitors, voltage variable dielectrics, transformer coupled tuning circuits, and the like. The variable components may be mechanically tuned, thermally tuned, electrically tuned, piezo-electrically tuned, and the like. Elements of the impedance matching may be silicon devices, gallium nitride devices, silicon carbide devices and the like. The elements may be chosen to withstand high currents, high voltages, high powers, or any combination of current, voltage and power. The elements may be chosen to be high-Q elements.

The matching and tuning calculations of the source may be performed on an external device through a USB port that powers the device. The device may be a computer a PDA or other computational platform.

A demonstration system used a source resonator, coupled to a device resonator, to wirelessly power/recharge multiple electronic consumer devices including, but not limited to, a laptop, a DVD player, a projector, a cell-phone, a display, a television, a projector, a digital picture frame, a light, a TV/DVD player, a portable music player, a circuit breaker, a hand-held tool, a personal digital assistant, an external battery charger, a mouse, a keyboard, a camera, an active load, and the like. A variety of devices may be powered simultaneously from a single device resonator. Device resonators may be operated simultaneously as source resonators. The power supplied to a device resonator may pass through additional resonators before being delivered to its intended device resonator.

Monitoring, Feedback and Control

So-called port parameter measurement circuitry may measure or monitor certain power, voltage, and current, signals in the system and processors or control circuits may adjust certain settings or operating parameters based on those measurements. In addition to these port parameter measurements, the magnitude and phase of voltage and current signals, and the magnitude of the power signals, throughout the system may be accessed to measure or monitor the system performance. The measured signals referred to throughout this disclosure may be any combination of the port parameter signals, as well as voltage signals, current signals, power signals, and the like. These parameters may be measured using analog or digital signals, they may be sampled and processed, and they may be digitized or converted using a number of known analog and digital processing techniques. Measured or monitored signals may be used in feedback circuits or systems to control the operation of the resonators and/or the system. In general, we refer to these monitored or measured signals as reference signals, or port parameter measurements or signals, although they are sometimes also referred to as error signals, monitor signals, feedback signals, and the like. We will refer to the signals that are used to control circuit elements such as the voltages used to drive voltage controlled capacitors as the control signals.

In some cases the circuit elements may be adjusted to achieve a specified or predetermined impedance value for the source and device resonators. In other cases the impedance may be adjusted to achieve a desired impedance value for the source and device resonators when the device resonator is connected to a power consumer or consumers. In other cases the impedance may be adjusted to mitigate changes in the resonant frequency, or impedance or power level changes owing to movement of the source and/or device resonators, or changes in the environment (such as the movement of interacting materials or objects) in the vicinity of the resonators. In other cases the impedance of the source and device resonators may be adjusted to different impedance values.

The coupled resonators may be made of different materials and may include different circuits, components and structural designs or they may be the same. The coupled resonators may include performance monitoring and measurement circuitry, signal processing and control circuitry or a combination of measurement and control circuitry. Some or all of the high-Q magnetic resonators may include tunable impedance circuits. Some or all of the high-Q magnetic resonators may include automatically controlled tunable impedance circuits.

Figure 41:
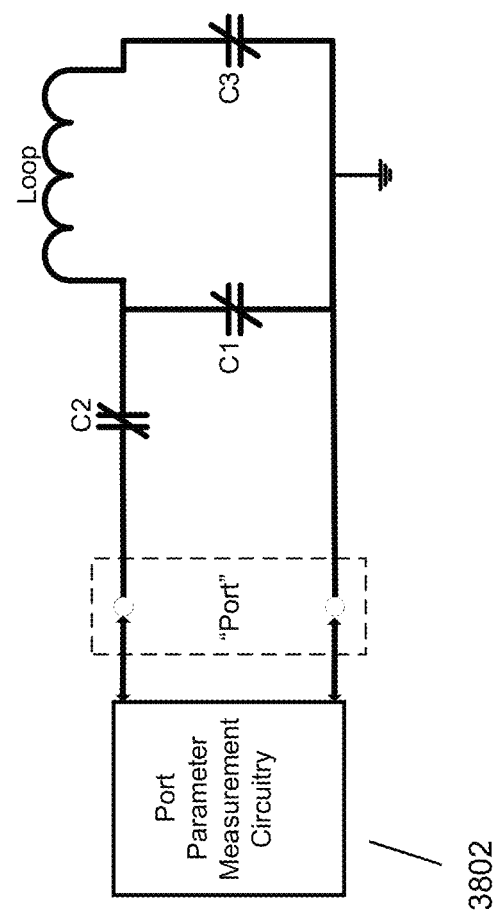
FIG. 41 shows an equivalent circuit diagram of a magnetic resonator. The slash through the capacitor symbol indicates that the represented capacitor may be fixed or variable. The port parameter measurement circuitry may be configured to measure certain electrical signals and may measure the magnitude and phase of signals.

FIG. 41 shows a magnetic resonator with port parameter measurement circuitry 3802 configured to measure certain parameters of the resonator. The port parameter measurement circuitry may measure the input impedance of the structure, or the reflected power. Port parameter measurement circuits may be included in the source and/or device resonator designs and may be used to measure two port circuit parameters such as S-parameters (scattering parameters), Z-parameters (impedance parameters), Y-parameters (admittance parameters), T-parameters (transmission parameters), H-parameters (hybrid parameters), ABCD-parameters (chain, cascade or transmission parameters), and the like. These parameters may be used to describe the electrical behavior of linear electrical networks when various types of signals are applied.

Different parameters may be used to characterize the electrical network under different operating or coupling scenarios. For example, S-parameters may be used to measure matched and unmatched loads. In addition, the magnitude and phase of voltage and current signals within the magnetic resonators and/or within the sources and devices themselves may be monitored at a variety of points to yield system performance information. This information may be presented to users of the system via a user interface such as a light, a read-out, a beep, a noise, a vibration or the like, or it may be presented as a digital signal or it may be provided to a processor in the system and used in the automatic control of the system. This information may be logged, stored, or may be used by higher level monitoring and control systems.

Figure 42:
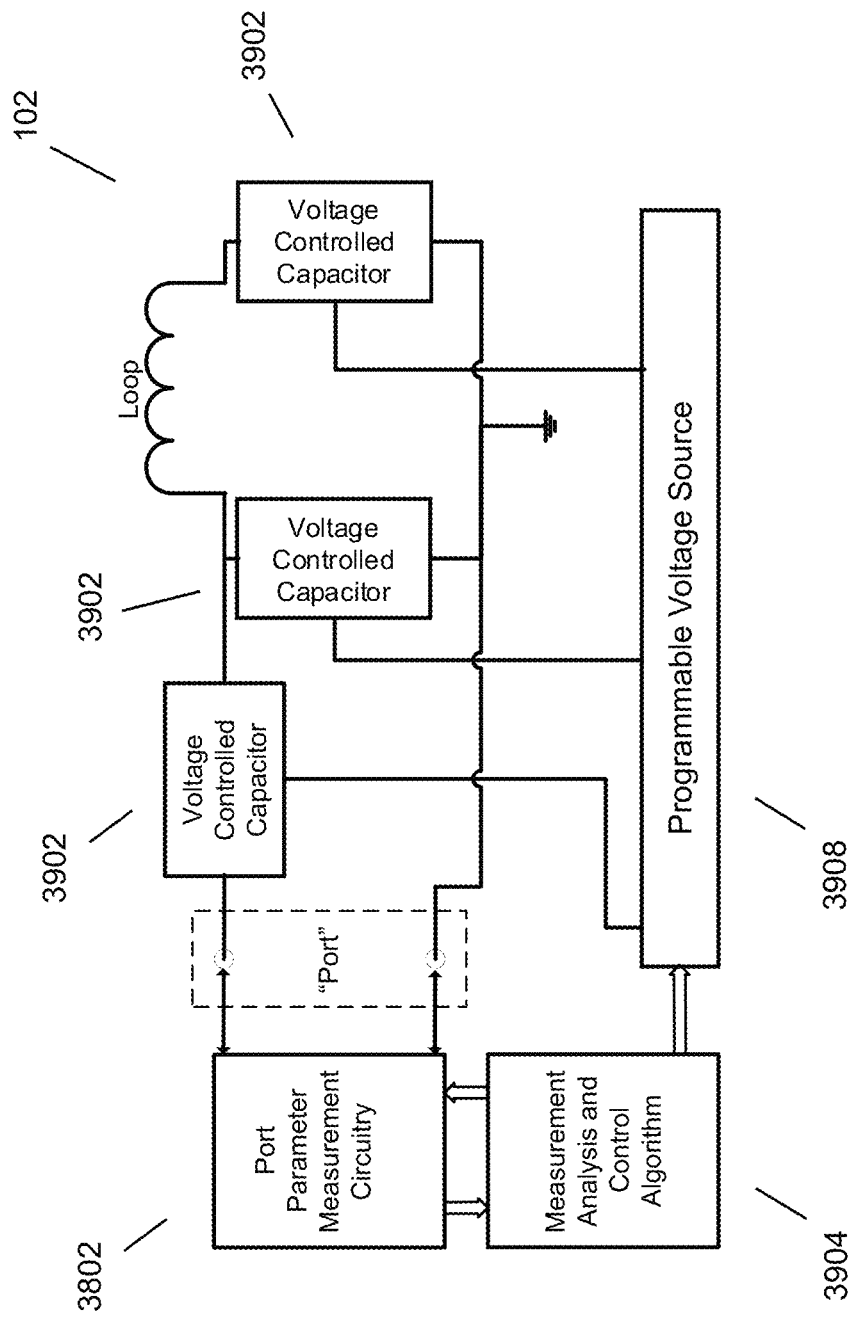
FIG. 42 shows a circuit diagram of a magnetic resonator where the tunable impedance network is realized with voltage controlled capacitors. Such an implementation may be adjusted, tuned or controlled by electrical circuits including programmable or controllable voltage sources and/or computer processors. The voltage controlled capacitors may be adjusted in response to data measured by the port parameter measurement circuitry and processed by measurement analysis and control algorithms and hardware. The voltage controlled capacitors may be a switched bank of capacitors.

FIG. 42 shows a circuit diagram of a magnetic resonator where the tunable impedance network may be realized with voltage controlled capacitors 3902 or capacitor networks. Such an implementation may be adjusted, tuned or controlled by electrical circuits and/or computer processors, such as a programmable voltage source 3908, and the like. For example, the voltage controlled capacitors may be adjusted in response to data acquired by the port parameter measurement circuitry 3802 and processed by a measurement analysis and control algorithm subsystem 3904. Reference signals may be derived from the port parameter measurement circuitry or other monitoring circuitry designed to measure the degree of deviation from a desired system operating point. The measured reference signals may include voltage, current, complex-impedance, reflection coefficient, power levels and the like, at one or several points in the system and at a single frequency or at multiple frequencies.

The reference signals may be fed to measurement analysis and control algorithm subsystem modules that may generate control signals to change the values of various components in a tunable impedance matching network. The control signals may vary the resonant frequency and/or the input impedance of the magnetic resonator, or the power level supplied by the source, or the power level drawn by the device, to achieve the desired power exchange between power supplies/generators and power drains/loads.

Adjustment algorithms may be used to adjust the frequency and/or impedance of the magnetic resonators. The algorithms may take in reference signals related to the degree of deviation from a desired operating point for the system and output correction or control signals related to that deviation that control variable or tunable elements of the system to bring the system back towards the desired operating point or points. The reference signals for the magnetic resonators may be acquired while the resonators are exchanging power in a wireless power transmission system, or they may be switched out of the circuit during system operation. Corrections to the system may be applied or performed continuously, periodically, upon a threshold crossing, digitally, using analog methods, and the like.

Figure 43:
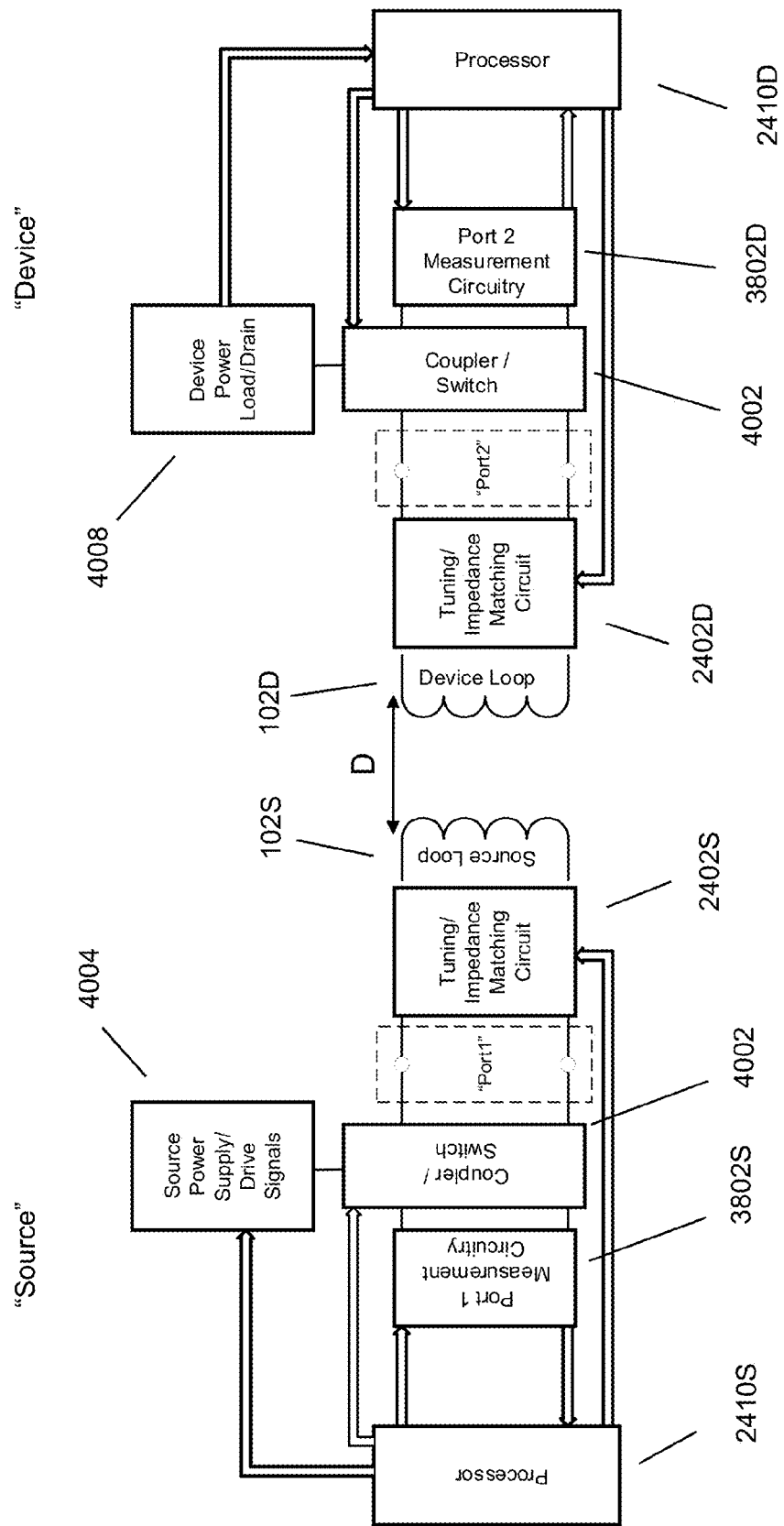
FIG. 43 shows an end-to-end wireless power transmission system. In this example, both the source and the device contain port measurement circuitry and a processor. The box labeled "coupler/switch" indicates that the port measurement circuitry may be connected to the resonator by a directional coupler or a switch, enabling the measurement, adjustment and control of the source and device resonators to take place in conjunction with, or separate from, the power transfer functionality.

FIG. 43 shows an end-to-end wireless power transmission system. Both the source and the device may include port measurement circuitry 3802 and a processor 2410. The box labeled "coupler/switch" 4002 indicates that the port measurement circuitry 3802 may be connected to the resonator 102 by a directional coupler or a switch, enabling the measurement, adjustment and control of the source and device resonators to take place in conjunction with, or separate from, the power transfer functionality.

The port parameter measurement and/or processing circuitry may reside with some, any, or all resonators in a system. The port parameter measurement circuitry may utilize portions of the power transmission signal or may utilize excitation signals over a range of frequencies to measure the source/device resonator response (i.e. transmission and reflection between any two ports in the system), and may contain amplitude and/or phase information. Such measurements may be achieved with a swept single frequency signal or a multi-frequency signal. The signals used to measure and monitor the resonators and the wireless power transmission system may be generated by a processor or processors and standard input/output (I/O) circuitry including digital to analog converters (DACs), analog to digital converters (ADCs), amplifiers, signal generation chips, passive components and the like. Measurements may be achieved using test equipment such as a network analyzer or using customized circuitry. The measured reference signals may be digitized by ADCs and processed using customized algorithms running on a computer, a microprocessor, a DSP chip, an ASIC, and the like. The measured reference signals may be processed in an analog control loop.

The measurement circuitry may measure any set of two port parameters such as S-parameters, Y-parameters, Z-parameters, H-parameters, G-parameters, T-parameters, ABCD-parameters, and the like. Measurement circuitry may be used to characterize current and voltage signals at various points in the drive and resonator circuitry, the impedance and/or admittance of the source and device resonators at opposite ends of the system, i.e. looking into the source resonator matching network ("port 1" in FIG. 43) towards the device and vice versa.

The device may measure relevant signals and/or port parameters, interpret the measurement data, and adjust its matching network to optimize the impedance looking into the coupled system independently of the actions of the source. The source may measure relevant port parameters, interpret the measurement data, and adjust its matching network to optimize the impedance looking into the coupled system independently of the actions of the device.

FIG. 43 shows a block diagram of a source and device in a wireless power transmission system. The system may be configured to execute a control algorithm that actively adjusts the tuning/matching networks in either of or both the source and device resonators to optimize performance in the coupled system. Port measurement circuitry 3802S may measure signals in the source and communicate those signals to a processor 2410. A processor 2410 may use the measured signals in a performance optimization or stabilization algorithm and generate control signals based on the outputs of those algorithms. Control signals may be applied to variable circuit elements in the tuning/impedance matching circuits 2402S to adjust the source's operating characteristics, such as power in the resonator and coupling to devices. Control signals may be applied to the power supply or generator to turn the supply on or off, to increase or decrease the power level, to modulate the supply signal and the like.

The power exchanged between sources and devices may depend on a variety of factors. These factors may include the effective impedance of the sources and devices, the Q's of the sources and devices, the resonant frequencies of the sources and devices, the distances between sources and devices, the interaction of materials and objects in the vicinity of sources and devices and the like. The port measurement circuitry and processing algorithms may work in concert to adjust the resonator parameters to maximize power transfer, to hold the power transfer constant, to controllably adjust the power transfer, and the like, under both dynamic and steady state operating conditions.

Figure 44:
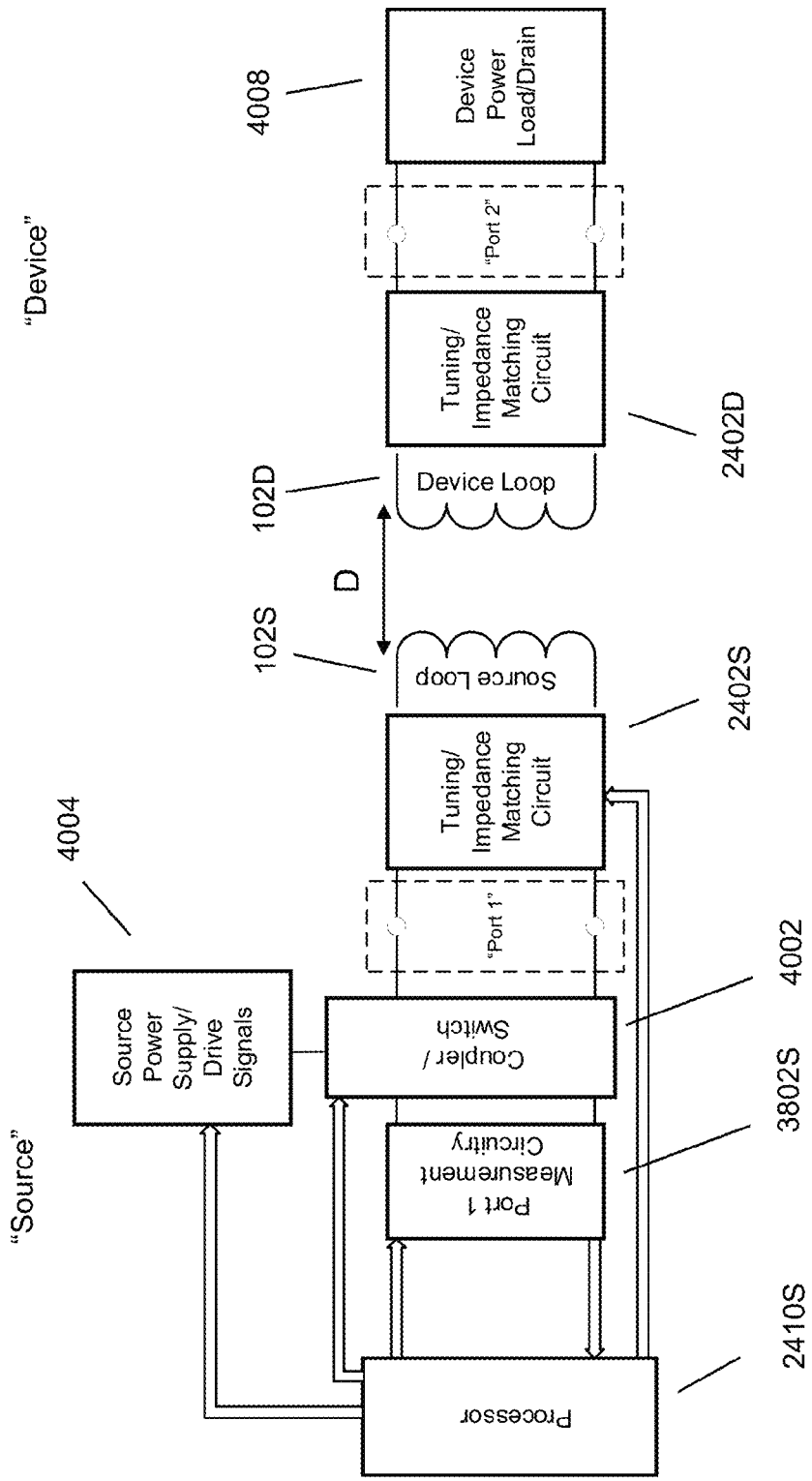
FIG. 44 shows an end-to-end wireless power transmission system. In this example, only the source contains port measurement circuitry and a processor. In this case, the device resonator operating characteristics may be fixed or may be adjusted by analog control circuitry and without the need for control signals generated by a processor.

Some, all or none of the sources and devices in a system implementation may include port measurement circuitry 3802S and processing 2410 capabilities. FIG. 44 shows an end-to-end wireless power transmission system in which only the source 102S contains port measurement circuitry 3802 and a processor 2410S. In this case, the device resonator 102D operating characteristics may be fixed or may be adjusted by analog control circuitry and without the need for control signals generated by a processor.

Figure 45:
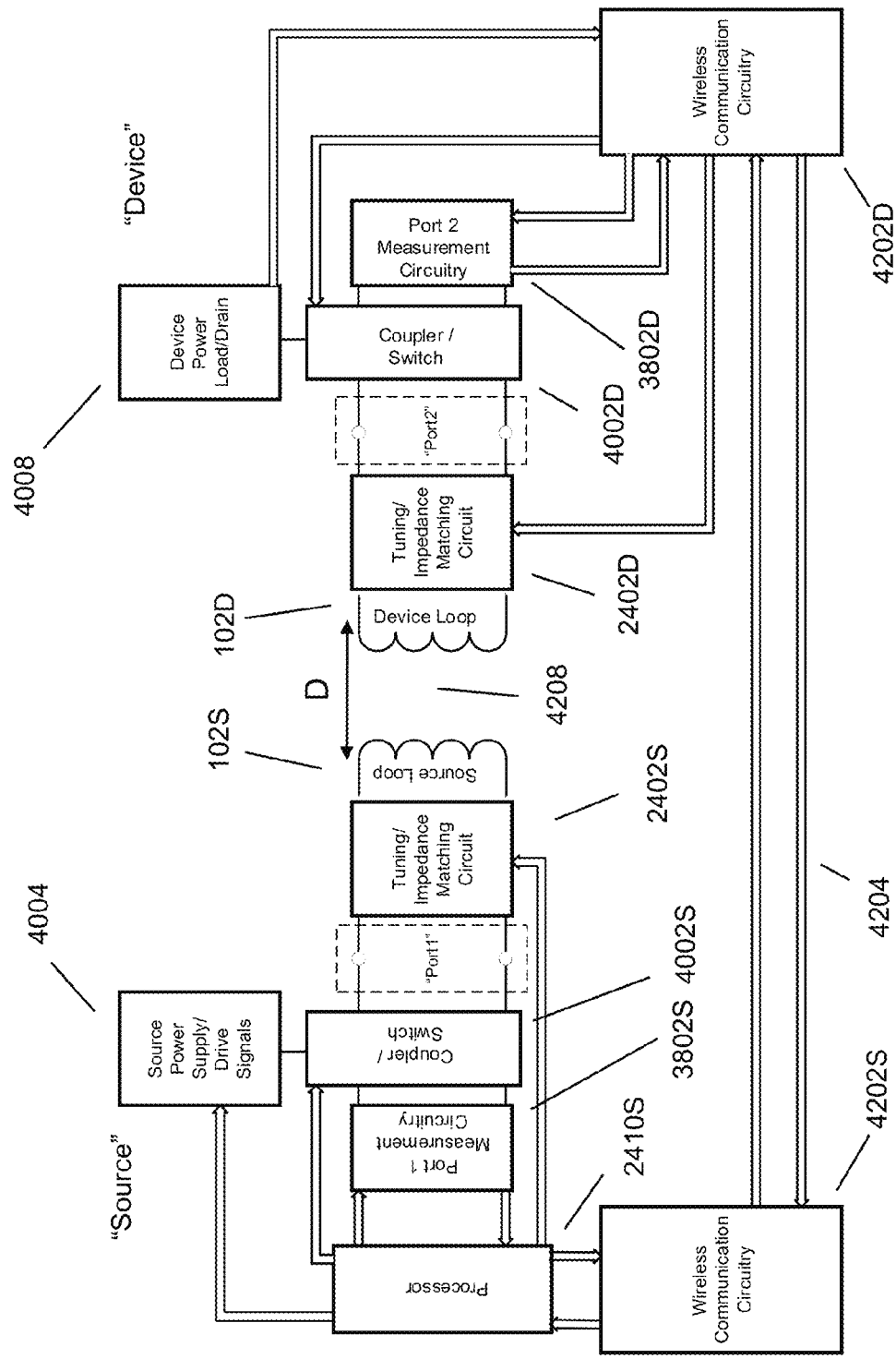
FIG. 45 shows an end-to-end wireless power transmission system. In this example, both the source and the device contain port measurement circuitry but only the source contains a processor. Data from the device is transmitted through a wireless communication channel, which could be implemented either with a separate antenna, or through some modulation of the source drive signal.

FIG. 45 shows an end-to-end wireless power transmission system. Both the source and the device may include port measurement circuitry 3802 but in the system of FIG. 45, only the source contains a processor 2410S. The source and device may be in communication with each other and the adjustment of certain system parameters may be in response to control signals that have been wirelessly communicated, such as though wireless communications circuitry 4202, between the source and the device. The wireless communication channel 4204 may be separate from the wireless power transfer channel 4208, or it may be the same. That is, the resonators 102 used for power exchange may also be used to exchange information. In some cases, information may be exchanged by modulating a component a source or device circuit and sensing that change with port parameter or other monitoring equipment.

Implementations where only the source contains a processor 2410 may be beneficial for multi-device systems where the source can handle all of the tuning and adjustment "decisions" and simply communicate the control signals back to the device(s). This implementation may make the device smaller and cheaper because it may eliminate the need for, or reduce the required functionality of, a processor in the device. A portion of or an entire data set from each port measurement at each device may be sent back to the source microprocessor for analysis, and the control instructions may be sent back to the devices. These communications may be wireless communications.

Figure 46:
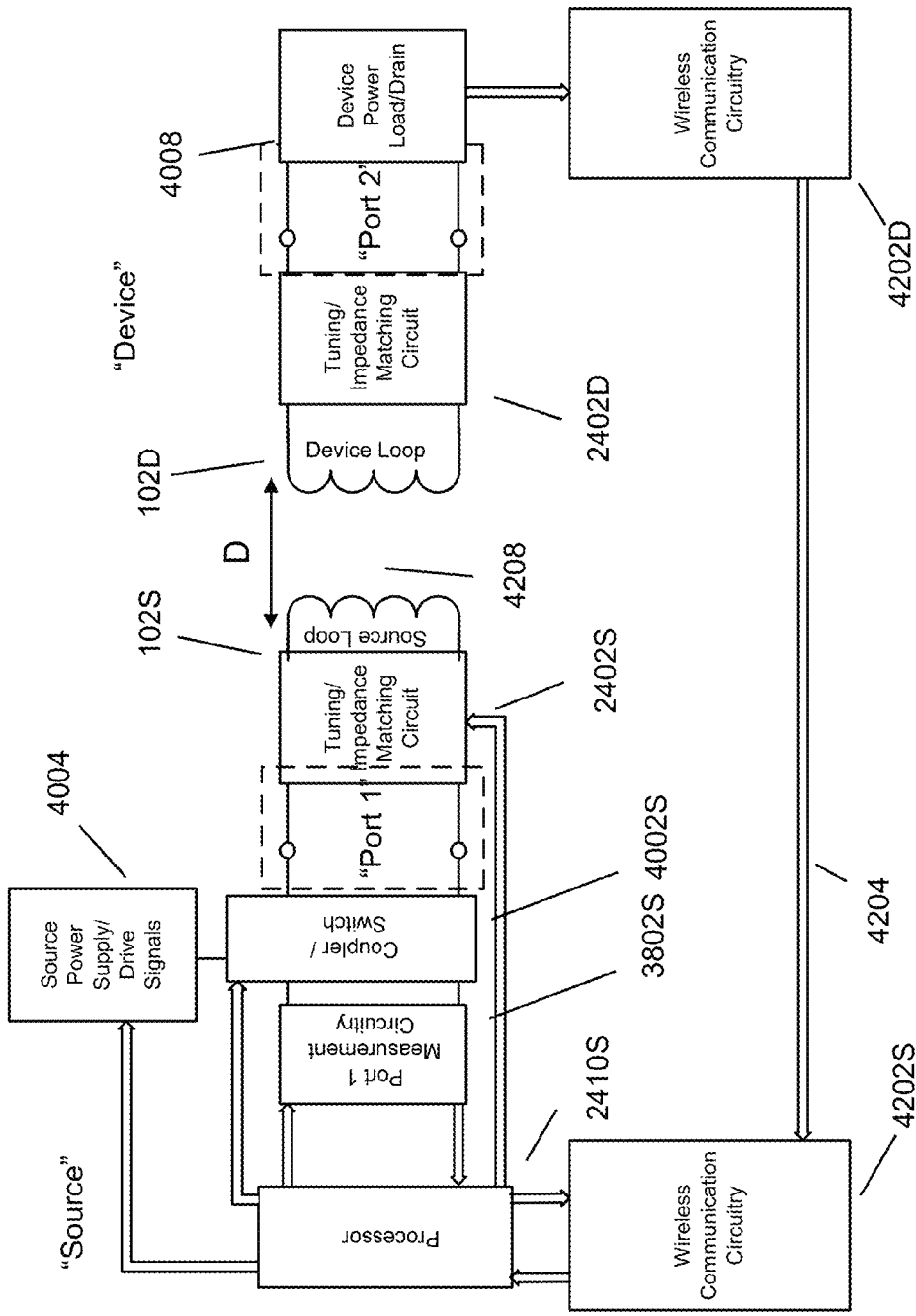
FIG. 46 shows an end-to-end wireless power transmission system. In this example, only the source contains port measurement circuitry and a processor. Data from the device is transmitted through a wireless communication channel, which could be implemented either with a separate antenna, or through some modulation of the source drive signal.

FIG. 46 shows an end-to-end wireless power transmission system. In this example, only the source contains port measurement circuitry 3802 and a processor 2410S. The source and device may be in communication, such as via wireless communication circuitry 4202, with each other and the adjustment of certain system parameters may be in response to control signals that have been wirelessly communicated between the source and the device.

Figure 47:
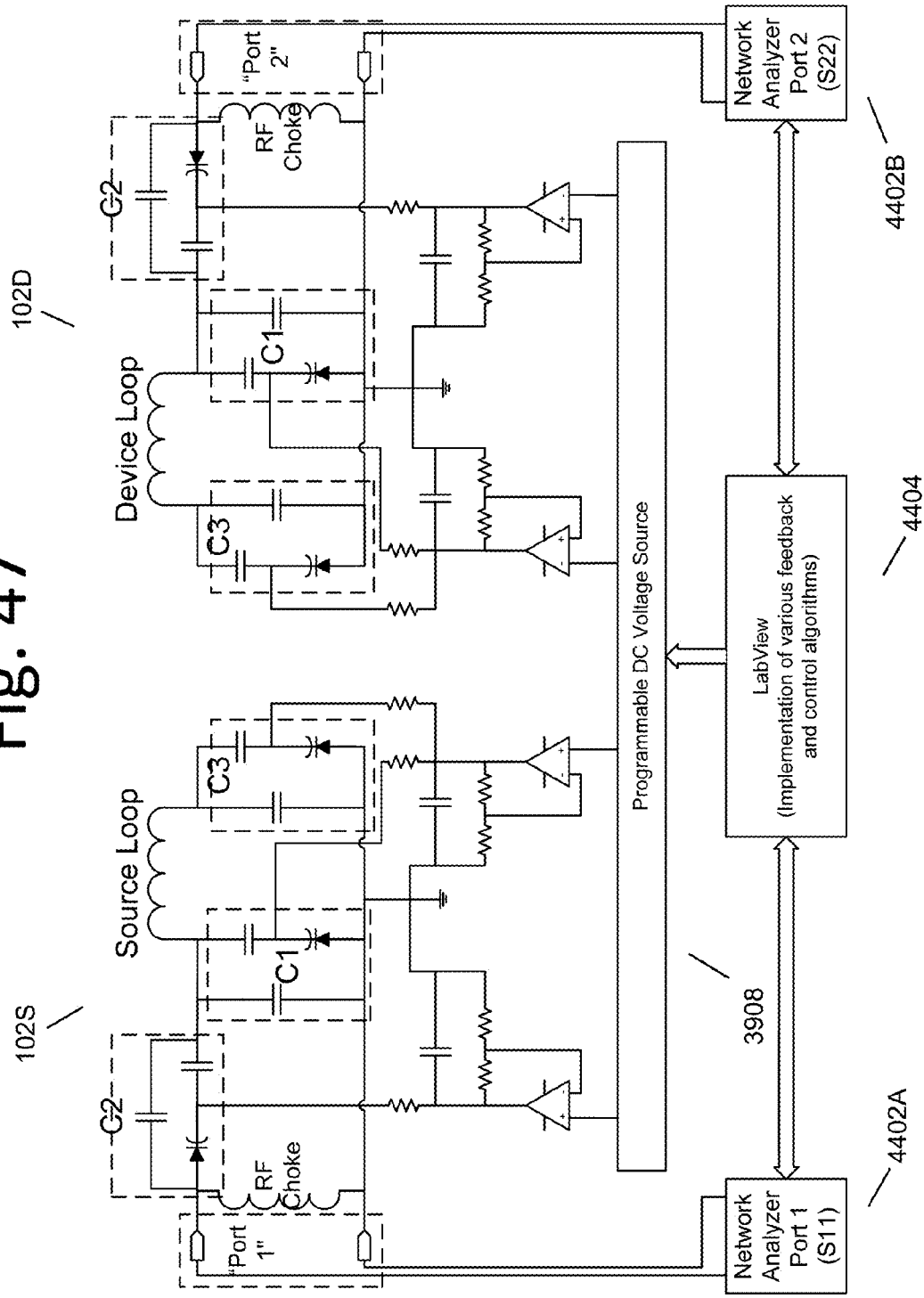
FIG. 47 shows coupled magnetic resonators whose frequency and impedance may be automatically adjusted using algorithms implemented using a processor or a computer.

FIG. 47 shows coupled electromagnetic resonators 102 whose frequency and impedance may be automatically adjusted using a processor or a computer. Resonant frequency tuning and continuous impedance adjustment of the source and device resonators may be implemented with reverse biased diodes, Schottky diodes and/or varactor elements contained within the capacitor networks shown as C1, C2, and C3 in FIG. 47. The circuit topology that was built and demonstrated and is described here is exemplary and is not meant to limit the discussion of automatic system tuning and control in any way. Other circuit topologies could be utilized with the measurement and control architectures discussed in this disclosure.

Device and source resonator impedances and resonant frequencies may be measured with a network analyzer 4402A-B, or by other means described above, and implemented with a controller, such as with Lab View 4404. The measurement circuitry or equipment may output data to a computer or a processor that implements feedback algorithms and dynamically adjusts the frequencies and impedances via a programmable DC voltage source.

In one arrangement, the reverse biased diodes (Schottky, semiconductor junction, and the like) used to realize the tunable capacitance drew very little DC current and could be reverse biased by amplifiers having large series output resistances. This implementation may enable DC control signals to be applied directly to the controllable circuit elements in the resonator circuit while maintaining a very high-Q in the magnetic resonator.

C2 biasing signals may be isolated from C1 and/or C3 biasing signals with a DC blocking capacitor as shown in FIG. 47, if the required DC biasing voltages are different. The output of the biasing amplifiers may be bypassed to circuit ground to isolate RF voltages from the biasing amplifiers, and to keep non-fundamental RF voltages from being injected into the resonator. The reverse bias voltages for some of the capacitors may instead be applied through the inductive element in the resonator itself, because the inductive element acts as a short circuit at DC.

The port parameter measurement circuitry may exchange signals with a processor (including any required ADCs and DACs) as part of a feedback or control system that is used to automatically adjust the resonant frequency, input impedance, energy stored or captured by the resonator or power delivered by a source or to a device load. The processor may also send control signals to tuning or adjustment circuitry in or attached to the magnetic resonator.

When utilizing varactors or diodes as tunable capacitors, it may be beneficial to place fixed capacitors in parallel and in series with the tunable capacitors operating at high reverse bias voltages in the tuning/matching circuits. This arrangement may yield improvements in circuit and system stability and in power handling capability by optimizing the operating voltages on the tunable capacitors.

Figure 48:
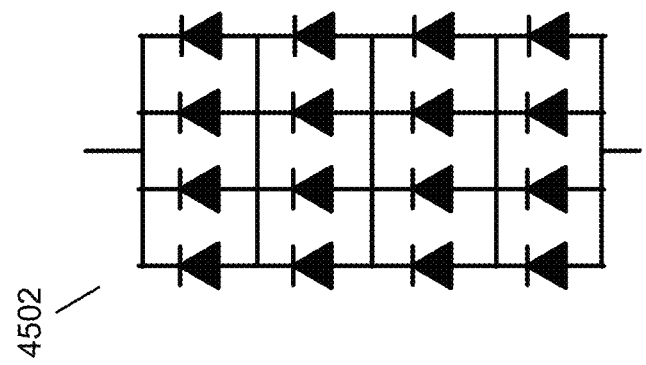
FIG. 48 shows a varactor array.

Varactors or other reverse biased diodes may be used as a voltage controlled capacitor. Arrays of varactors may be used when higher voltage compliance or different capacitance is required than that of a single varactor component. Varactors may be arranged in an N by M array connected serially and in parallel and treated as a single two terminal component with different characteristics than the individual varactors in the array. For example, an N by N array of equal varactors where components in each row are connected in parallel and components in each column are connected in series may be used as a two terminal device with the same capacitance as any single varactor in the array but with a voltage compliance that is N times that of a single varactor in the array. Depending on the variability and differences of parameters of the individual varactors in the array additional biasing circuits composed of resistors, inductors, and the like may be needed. A schematic of a four by four array of unbiased varactors 4502 that may be suitable for magnetic resonator applications is shown in FIG. 48.

Further improvements in system performance may be realized by careful selection of the fixed value capacitor(s) that are placed in parallel and/or in series with the tunable (varactor/diode/capacitor) elements. Multiple fixed capacitors that are switched in or out of the circuit may be able to compensate for changes in resonator Q's, impedances, resonant frequencies, power levels, coupling strengths, and the like, that might be encountered in test, development and operational wireless power transfer systems. Switched capacitor banks and other switched element banks may be used to assure the convergence to the operating frequencies and impedance values required by the system design.

An exemplary control algorithm for isolated and coupled magnetic resonators may be described for the circuit and system elements shown in FIG. 47. One control algorithm first adjusts each of the source and device resonator loops "in isolation", that is, with the other resonators in the system "shorted out" or "removed" from the system. For practical purposes, a resonator can be "shorted out" by making it resonant at a much lower frequency such as by maximizing the value of C1 and/or C3. This step effectively reduces the coupling between the resonators, thereby effectively reducing the system to a single resonator at a particular frequency and impedance.

Tuning a magnetic resonator in isolation includes varying the tunable elements in the tuning and matching circuits until the values measured by the port parameter measurement circuitry are at their predetermined, calculated or measured relative values. The desired values for the quantities measured by the port parameter measurement circuitry may be chosen based on the desired matching impedance, frequency, strong coupling parameter, and the like. For the exemplary algorithms disclosed below, the port parameter measurement circuitry measures S-parameters over a range of frequencies. The range of frequencies used to characterize the resonators may be a compromise between the system performance information obtained and computation/measurement speed. For the algorithms described below the frequency range may be approximately +/−20% of the operating resonant frequency.

Each isolated resonator may be tuned as follows. First, short out the resonator not being adjusted. Next minimize C1, C2, and C3, in the resonator that is being characterized and adjusted. In most cases there will be fixed circuit elements in parallel with C1, C2, and C3, so this step does not reduce the capacitance values to zero. Next, start increasing C2 until the resonator impedance is matched to the "target" real impedance at any frequency in the range of measurement frequencies described above. The initial "target" impedance may be less than the expected operating impedance for the coupled system.

C2 may be adjusted until the initial "target" impedance is realized for a frequency in the measurement range. Then C1 and/or C3 may be adjusted until the loop is resonant at the desired operating frequency.

Each resonator may be adjusted according to the above algorithm. After tuning each resonator in isolation, a second feedback algorithm may be applied to optimize the resonant frequencies and/or input impedances for wirelessly transferring power in the coupled system.

The required adjustments to C1 and/or C2 and/or C3 in each resonator in the coupled system may be determined by measuring and processing the values of the real and imaginary parts of the input impedance from either and/or both "port(s)" shown in FIG. 43. For coupled resonators, changing the input impedance of one resonator may change the input impedance of the other resonator. Control and tracking algorithms may adjust one port to a desired operating point based on measurements at that port, and then adjust the other port based on measurements at that other port. These steps may be repeated until both sides converge to the desired operating point.

S-parameters may be measured at both the source and device ports and the following series of measurements and adjustments may be made. In the description that follows, $Z_0$ is an input impedance and may be the target impedance. In some cases $Z_0$ is 50 ohms or is near 50 ohms. $Z_1$ and $Z_2$ are intermediate impedance values that may be the same value as $Z_0$ or may be different than $Z_0$. Re{value} means the real part of a value and Im{value} means the imaginary part of a value.

An algorithm that may be used to adjust the input impedance and resonant frequency of two coupled resonators is set forth below:

1) Adjust each resonator "in isolation" as described above.
2) Adjust source C1/C3 until, at $\omega_o$, Re{S11}=($Z_1$+/−$\epsilon_{Re}$) as follows:
   If Re{S11@$\omega_o$}>($Z_1$+$\epsilon_{Re}$), decrease C1/C3. If Re{S11@$\omega_o$}<($Z_0$−$\epsilon_{Re}$), increase C1/C3.

3) Adjust source C2 until, at $\omega_o$, $\text{Im}\{S11\}=(+/-\in_{Im})$ as follows:
   If $\text{Im}\{S11@\omega_o\}>\in_{Im}$, decrease C2. If $\text{Im}\{S11@\omega_o\}<-\in_{Im}$, increase C2.
4) Adjust device C1/C3 until, at $\omega_o$, $\text{Re}\{S22\}=(Z_2+/-\in_{Re})$ as follows:
   If $\text{Re}\{S22@\omega_o\}>(Z_2+\in_{Re})$, decrease C1/C3. If $\text{Re}\{S22@\omega_o\}<(Z_0-\in_{Re})$, increase C1/C3.
5) Adjust device C2 until, at $\omega_o$, $\text{Im}\{S22\}=0$ as follows:
   If $\text{Im}\{S22@\omega_o\}>\in_{Im}$, decrease C2. If $\text{Im}\{S22@\omega_o\}<-\in_{Im}$, increase C2.

We have achieved a working system by repeating steps 1-4 until both ($\text{Re}\{S11\}$, $\text{Im}\{S11\}$) and ($\text{Re}\{S22\}$, $\text{Im}\{S22\}$) converge to (($Z_0+/-\in_{Re}$), ($+/-\in_{Im}$)) at $\omega_o$, where $Z_0$ is the desired matching impedance and $\omega_0$ is the desired operating frequency. Here, $\in_{Im}$ represents the maximum deviation of the imaginary part, at $\omega_0$, from the desired value of 0, and $\in_{Re}$ represents the maximum deviation of the real part from the desired value of $Z_0$. It is understood that $\in_{Im}$ and $\in_{Re}$ can be adjusted to increase or decrease the number of steps to convergence at the potential cost of system performance (efficiency). It is also understood that steps 1-4 can be performed in a variety of sequences and a variety of ways other than that outlined above (i.e. first adjust the source imaginary part, then the source real part; or first adjust the device real part, then the device imaginary part, etc.) The intermediate impedances $Z_1$ and $Z_2$ may be adjusted during steps 1-4 to reduce the number of steps required for convergence. The desire or target impedance value may be complex, and may vary in time or under different operating scenarios.

Steps 1-4 may be performed in any order, in any combination and any number of times. Having described the above algorithm, variations to the steps or the described implementation may be apparent to one of ordinary skill in the art. The algorithm outlined above may be implemented with any equivalent linear network port parameter measurements (i.e., Z-parameters, Y-parameters, T-parameters, H-parameters, ABCD-parameters, etc.) or other monitor signals described above, in the same way that impedance or admittance can be alternatively used to analyze a linear circuit to derive the same result.

The resonators may need to be retuned owing to changes in the "loaded" resistances, Rs and Rd, caused by changes in the mutual inductance M (coupling) between the source and device resonators. Changes in the inductances, Ls and Ld, of the inductive elements themselves may be caused by the influence of external objects, as discussed earlier, and may also require compensation. Such variations may be mitigated by the adjustment algorithm described above.

A directional coupler or a switch may be used to connect the port parameter measurement circuitry to the source resonator and tuning/adjustment circuitry. The port parameter measurement circuitry may measure properties of the magnetic resonator while it is exchanging power in a wireless power transmission system, or it may be switched out of the circuit during system operation. The port parameter measurement circuitry may measure the parameters and the processor may control certain tunable elements of the magnetic resonator at start-up, or at certain intervals, or in response to changes in certain system operating parameters.

A wireless power transmission system may include circuitry to vary or tune the impedance and/or resonant frequency of source and device resonators. Note that while tuning circuitry is shown in both the source and device resonators, the circuitry may instead be included in only the source or the device resonators, or the circuitry may be included in only some of the source and/or device resonators. Note too that while we may refer to the circuitry as "tuning" the impedance and or resonant frequency of the resonators, this tuning operation simply means that various electrical parameters such as the inductance or capacitance of the structure are being varied. In some cases, these parameters may be varied to achieve a specific predetermined value, in other cases they may be varied in response to a control algorithm or to stabilize a target performance value that is changing. In some cases, the parameters are varied as a function of temperature, of other sources or devices in the area, of the environment, at the like.

Applications

For each listed application, it will be understood by one of ordinary skill-in-the-art that there are a variety of ways that the resonator structures used to enable wireless power transmission may be connected or integrated with the objects that are supplying or being powered. The resonator may be physically separate from the source and device objects. The resonator may supply or remove power from an object using traditional inductive techniques or through direct electrical connection, with a wire or cable for example. The electrical connection may be from the resonator output to the AC or DC power input port on the object. The electrical connection may be from the output power port of an object to the resonator input.

FIG. 49 shows a source resonator 4904 that is physically separated from a power supply and a device resonator 4902 that is physically separated from the device 4900, in this illustration a laptop computer. Power may be supplied to the source resonator, and power may be taken from the device resonator directly, by an electrical connection. One of ordinary skill in the art will understand from the materials incorporated by reference that the shape, size, material composition, arrangement, position and orientation of the resonators above are provided by way of non-limiting example, and that a wide variation in any and all of these parameters could be supported by the disclosed technology for a variety of applications.

Continuing with the example of the laptop, and without limitation, the device resonator may be physically connected to the device it is powering or charging. For example, as shown in FIG. 50a and FIG. 50b, the device resonator 5002 may be (a) integrated into the housing of the device 5000 or (b) it may be attached by an adapter. The resonator 5002 may (FIG. 50b-d) or may not (FIG. 50a) be visible on the device. The resonator may be affixed to the device, integrated into the device, plugged into the device, and the like.

The source resonator may be physically connected to the source supplying the power to the system. As described above for the devices and device resonators, there are a variety of ways the resonators may be attached to, connected to or integrated with the power supply. One of ordinary skill in the art will understand that there are a variety of ways the resonators may be integrated in the wireless power transmission system, and that the sources and devices may utilize similar or different integration techniques.

Continuing again with the example of the laptop computer, and without limitation, the laptop computer may be powered, charged or recharged by a wireless power transmission system. A source resonator may be used to supply wireless power and a device resonator may be used to capture the wireless power. A device resonator 5002 may be integrated into the edge of the screen (display) as illustrated in FIG. 50d, and/or into the base of the laptop as illustrated in FIG. 50c. The source resonator 5002 may be integrated into the base of the laptop and the device resonator may be integrated into the edge of the screen. The resonators may also or instead be affixed to the power source and/or the laptop. The source and device resonators may also or instead be physically separated from the power supply and the laptop and may be electrically connected by a cable. The source and device resonators may also or instead be physically separated from the power supply and the laptop and may be electrically coupled using a traditional inductive technique. One of ordinary skill in the art will understand that, while the preceding examples relate to wireless power transmission to a laptop, that the methods and systems disclosed for this application may be suitably adapted for use with other electrical or electronic devices. In general, the source resonator may be external to the source and supplying power to a device resonator that in turn supplies power the device, or the source resonator may be connected to the source and supplying power to a device resonator that in turn supplies power to a portion of the device, or the source resonator may internal to the source and supplying power to a device resonator that in turn supplies power to a portion of the device, as well as any combination of these.

In some systems, the source, or source resonator may be movable or active and may track, follow, or attach to the source or source resonator. For a movable device it may be preferable to maintain alignment between the source resonator and the device resonator to maximize power transfer efficiency. As a device moves a source or a source resonator may track the position of the device or device resonator and adjust its position to ensure optimum or improved alignment. The device tracking by the source may be automatic. A source may include sensors for determining the position of the device and means for adjusting its position, such as by actuators, motors, magnets, and the like. The source may sense the position of the device by measuring power efficiency, magnetic fields, signals generated by the device, optical recognition, and the like. In some embodiments the source may partially attach to the device. A source and device may include magnets which attach the source and device together. A magnetic attachment may be functional through a supporting structure such as a table. The magnetic attachment will attach the source through the supporting structure making a freely movable source to follow the device as it moves. For example, continuing with the laptop example, a source mounted on a freely movable structure may be mounted under a supporting structure such as a table surface, dock, box, and the like. A laptop, with a magnetic attachment placed on top of the table surface will attract the source below the supporting structure and result in proper alignment. Furthermore, as the laptop with the device resonator is moved, or slid on top of the supporting structure, the freely movable source and source resonator may follow the device resonator of the laptop due to the magnetic attraction between the source and the device without requiring active movement mechanisms. In some embodiments, a combination of active and passive movement mechanisms may be used, such that for example, move the source into initial alignment with the device whereupon magnetic attachment means ensures that the source may passively follow the device as it moves.

A system or method disclosed herein may provide power to an electrical or electronics device, such as, and not limited to, phones, cell phones, cordless phones, smart phones, PDAs, audio devices, music players, MP3 players, radios, portable radios and players, wireless headphones, wireless headsets, computers, laptop computers, wireless keyboards, wireless mouse, televisions, displays, flat screen displays, computer displays, displays embedded in furniture, digital picture frames, electronic books, (e.g. the Kindle, e-ink books, magazines, and the like), remote control units (also referred to as controllers, game controllers, commanders, clickers, and the like, and used for the remote control of a plurality of electronics devices, such as televisions, video games, displays, computers, audio visual equipment, lights, and the like), lighting devices, cooling devices, air circulation devices, purification devices, personal hearing aids, power tools, security systems, alarms, bells, flashing lights, sirens, sensors, loudspeakers, electronic locks, electronic keypads, light switches, other electrical switches, and the like. Here the term electronic lock is used to indicate a door lock which operates electronically (e.g. with electronic combo-key, magnetic card, RFID card, and the like) which is placed on a door instead of a mechanical key-lock. Such locks are often battery operated, risking the possibility that the lock might stop working when a battery dies, leaving the user locked-out. This may be avoided where the battery is either charged or completely replaced by a wireless power transmission implementation as described herein.

Here, the term light switch (or other electrical switch) is meant to indicate any switch (e.g. on a wall of a room) in one part of the room that turns on/off a device (e.g. light fixture at the center of the ceiling) in another part of the room. To install such a switch by direct connection, one would have to run a wire all the way from the device to the switch. Once such a switch is installed at a particular spot, it may be very difficult to move. Alternately, one can envision a 'wireless switch', where "wireless" means the switching (on/off) commands are communicated wirelessly, but such a switch has traditionally required a battery for operation. In general, having too many battery operated switches around a house may be impractical, because those many batteries will need to be replaced periodically. So, a wirelessly communicating switch may be more convenient, provided it is also wirelessly powered. For example, there already exist communications wireless door-bells that are battery powered, but where one still has to replace the battery in them periodically. The remote doorbell button may be made to be completely wireless, where there may be no need to ever replace the battery again. Note that here, the term 'cordless' or 'wireless' or 'communications wireless' is used to indicate that there is a cordless or wireless communications facility between the device and another electrical component, such as the base station for a cordless phone, the computer for a wireless keyboard, and the like. One skilled in the art will recognize that any electrical or electronics device may include a wireless communications facility, and that the systems and methods described herein may be used to add wireless power transmission to the device. As described herein, power to the electrical or electronics device may be delivered from an external or internal source resonator, and to the device or portion of the device. Wireless power transmission may significantly reduce the need to charge and/or replace batteries for devices that enter the near vicinity of the source resonator and thereby may reduce the downtime, cost and disposal issues often associated with batteries.

The systems and methods described herein may provide power to lights without the need for either wired power or batteries. That is, the systems and methods described herein may provide power to lights without wired connection to any power source, and provide the energy to the light non-radiatively across mid-range distances, such as across a distance of a quarter of a meter, one meter, three meters, and the like. A 'light' as used herein may refer to the light source itself, such as an incandescent light bulb, florescent light bulb lamps, Halogen lamps, gas discharge lamps, fluorescent lamps, neon lamps, high-intensity discharge lamps, sodium vapor lamps, Mercury-vapor lamps, electroluminescent lamps, light emitting diodes (LED) lamps, and the like; the light as part of a light fixture, such as a table lamp, a floor lamp, a ceiling lamp, track lighting, recessed light fixtures, and the like; light fixtures integrated with other functions, such as a light/ceiling fan fixture, and illuminated picture frame, and the like. As such, the systems and methods described herein may reduce the complexity for installing a light, such as by minimizing the installation of electrical wiring, and allowing the user to place or mount the light with minimal regard to sources of wired power. For instance, a light may be placed anywhere in the vicinity of a source resonator, where the source resonator may be mounted in a plurality of different places with respect to the location of the light, such as on the floor of the room above, (e.g. as in the case of a ceiling light and especially when the room above is the attic); on the wall of the next room, on the ceiling of the room below, (e.g. as in the case of a floor lamp); in a component within the room or in the infrastructure of the room as described herein; and the like. For example, a light/ceiling fan combination is often installed in a master bedroom, and the master bedroom often has the attic above it. In this instance a user may more easily install the light/ceiling fan combination in the master bedroom, such as by simply mounting the light/ceiling fan combination to the ceiling, and placing a source coil (plugged into the house wired AC power) in the attic above the mounted fixture. In another example, the light may be an external light, such as a flood light or security light, and the source resonator mounted inside the structure. This way of installing lighting may be particularly beneficial to users who rent their homes, because now they may be able to mount lights and such other electrical components without the need to install new electrical wiring. The control for the light may also be communicated by near-field communications as described herein, or by traditional wireless communications methods.

The systems and methods described herein may provide power from a source resonator to a device resonator that is either embedded into the device component, or outside the device component, such that the device component may be a traditional electrical component or fixture. For instance, a ceiling lamp may be designed or retrofitted with a device resonator integrated into the fixture, or the ceiling lamp may be a traditional wired fixture, and plugged into a separate electrical facility equipped with the device resonator. In an example, the electrical facility may be a wireless junction box designed to have a device resonator for receiving wireless power, say from a source resonator placed on the floor of the room above (e.g. the attic), and which contains a number of traditional outlets that are powered from the device resonator. The wireless junction box, mounted on the ceiling, may now provide power to traditional wired electrical components on the ceiling (e.g. a ceiling light, track lighting, a ceiling fan). Thus, the ceiling lamp may now be mounted to the ceiling without the need to run wires through the infrastructure of the building. This type of device resonator to traditional outlet junction box may be used in a plurality of applications, including being designed for the interior or exterior of a building, to be made portable, made for a vehicle, and the like. Wireless power may be transferred through common building materials, such as wood, wall board, insulation, glass. brick, stone, concrete, and the like. The benefits of reduced installation cost, re-configurability, and increased application flexibility may provide the user significant benefits over traditional wired installations. The device resonator for a traditional outlet junction box may include a plurality of electrical components for facilitating the transfer of power from the device resonator to the traditional outlets, such as power source electronics which convert the specific frequencies needed to implement efficient power transfer to line voltage, power capture electronics which may convert high frequency AC to usable voltage and frequencies (AC and/or DC), controls which synchronize the capture device and the power output and which ensure consistent, safe, and maximally efficient power transfer, and the like.

The systems and methods described herein may provide advantages to lights or electrical components that operate in environments that are wet, harsh, controlled, and the like, such has outside and exposed to the rain, in a pool/sauna/shower, in a maritime application, in hermetically sealed components, in an explosive-proof room, on outside signage, a harsh industrial environment in a volatile environment (e.g. from volatile vapors or airborne organics, such as in a grain silo or bakery), and the like. For example, a light mounted under the water level of a pool is normally difficult to wire up, and is required to be water-sealed despite the need for external wires. But a pool light using the principles disclosed herein may more easily be made water sealed, as there may be no external wires needed. In another example, an explosion proof room, such as containing volatile vapors, may not only need to be hermetically sealed, but may need to have all electrical contacts (that could create a spark) sealed. Again, the principles disclosed herein may provide a convenient way to supply sealed electrical components for such applications.

The systems and methods disclosed herein may provide power to game controller applications, such as to a remote handheld game controller. These game controllers may have been traditionally powered solely by batteries, where the game controller's use and power profile caused frequent changing of the battery, battery pack, rechargeable batteries, and the like, that may not have been ideal for the consistent use to the game controller, such as during extended game play. A device resonator may be placed into the game controller, and a source resonator, connected to a power source, may be placed in the vicinity. Further, the device resonator in the game controller may provide power directly to the game controller electronics without a battery; provide power to a battery, battery pack, rechargeable battery, and the like, which then provides power to the game controller electronics; and the like. The game controller may utilize multiple battery packs, where each battery pack is equipped with a device resonator, and thus may be constantly recharging while in the vicinity of the source resonator, whether plugged into the game controller or not. The source resonator may be resident in a main game controller facility for the game, where the main game controller facility and source resonator are supplied power from AC 'house' power; resident in an extension facility form AC power, such as in a source resonator integrated into an 'extension cord'; resident in a game chair, which is at least one of plugged into the wall AC, plugged into the main game controller facility, powered by a battery pack in the game chair; and the like. The source resonator may be placed and implemented in any of the configurations described herein.

The systems and methods disclosed herein may integrate device resonators into battery packs, such as battery packs that are interchangeable with other battery packs. For instance, some portable devices may use up electrical energy at a high rate such that a user may need to have multiple interchangeable battery packs on hand for use, or the user may operate the device out of range of a source resonator and need additional battery packs to continue operation, such as for power tools, portable lights, remote control vehicles, and the like. The use of the principles disclosed herein may not only provide a way for device resonator enabled battery packs to be recharged while in use and in range, but also for the recharging of battery packs not currently in use and placed in range of a source resonator. In this way, battery packs may always be ready to use when a user runs down the charge of a battery pack being used. For example, a user may be working with a wireless power tool, where the current requirements may be greater than can be realized through direct powering from a source resonator. In this case, despite the fact that the systems and methods described herein may be providing charging power to the in-use battery pack while in range, the battery pack may still run down, as the power usage may have exceeded the recharge rate. Further, the user may simply be moving in and out of range, or be completely out of range while using the device. However, the user may have placed additional battery packs in the vicinity of the source resonator, which have been recharged while not in use, and are now charged sufficiently for use. In another example, the user may be working with the power tool away from the vicinity of the source resonator, but leave the supplemental battery packs to charge in the vicinity of the source resonator, such as in a room with a portable source resonator or extension cord source resonator, in the user's vehicle, in user's tool box, and the like. In this way, the user may not have to worry about taking the time to, and/or remembering to plug in their battery packs for future use. The user may only have to change out the used battery pack for the charged battery pack and place the used one in the vicinity of the source resonator for recharging. Device resonators may be built into enclosures with known battery form factors and footprints and may replace traditional chemical batteries in known devices and applications. For example, device resonators may be built into enclosures with mechanical dimensions equivalent to AA batteries, AAA batteries, D batteries, 9V batteries, laptop batteries, cell phone batteries, and the like. The enclosures may include a smaller "button battery" in addition to the device resonator to store charge and provide extended operation, either in terms of time or distance. Other energy storage devices in addition to or instead of button batteries may be integrated with the device resonators and any associated power conversion circuitry. These new energy packs may provide similar voltage and current levels as provided by traditional batteries, but may be composed of device resonators, power conversion electronics, a small battery, and the like. These new energy packs may last longer than traditional batteries because they may be more easily recharged and may be recharging constantly when they are located in a wireless power zone. In addition, such energy packs may be lighter than traditional batteries, may be safer to use and store, may operate over wider temperature and humidity ranges, may be less harmful to the environment when thrown away, and the like. As described herein, these energy packs may last beyond the life of the product when used in wireless power zones as described herein.

The systems and methods described herein may be used to power visual displays, such as in the case of the laptop screen, but more generally to include the great variety and diversity of displays utilized in today's electrical and electronics components, such as in televisions, computer monitors, desktop monitors, laptop displays, digital photo frames, electronic books, mobile device displays (e.g. on phones, PDAs, games, navigation devices, DVD players), and the like. Displays that may be powered through one or more of the wireless power transmission systems described herein may also include embedded displays, such as embedded in electronic components (e.g. audio equipment, home appliances, automotive displays, entertainment devices, cash registers, remote controls), in furniture, in building infrastructure, in a vehicle, on the surface of an object (e.g. on the surface of a vehicle, building, clothing, signs, transportation), and the like. Displays may be very small with tiny resonant devices, such as in a smart card as described herein, or very large, such as in an advertisement sign. Displays powered using the principles disclosed herein may also be any one of a plurality of imaging technologies, such as liquid crystal display (LCD), thin film transistor LCD, passive LCD, cathode ray tube (CRT), plasma display, projector display (e.g. LCD, DLP, LCOS), surface-conduction electron-emitter display (SED), organic light-emitting diode (OLED), and the like. Source coil configurations may include attaching to a primary power source, such as building power, vehicle power, from a wireless extension cord as described herein, and the like; attached to component power, such as the base of an electrical component (e.g. the base of a computer, a cable box for a TV); an intermediate relay source coil; and the like. For example, hanging a digital display on the wall may be very appealing, such as in the case of a digital photo frame that receives its information signals wirelessly or through a portable memory device, but the need for an unsightly power cord may make it aesthetically unpleasant. However, with a device coil embedded in the digital photo frame, such as wrapped within the frame portion, may allow the digital photo frame to be hung with no wires at all. The source resonator may then be placed in the vicinity of the digital photo frame, such as in the next room on the other side of the wall, plugged directly into a traditional power outlet, from a wireless extension cord as described herein, from a central source resonator for the room, and the like.

The systems and methods described herein may provide wireless power transmission between different portions of an electronics facility. Continuing with the example of the laptop computer, and without limitation, the screen of the laptop computer may require power from the base of the laptop. In this instance, the electrical power has been traditionally routed via direct electrical connection from the base of the laptop to the screen over a hinged portion of the laptop between the screen and the base. When a wired connection is utilized, the wired connection may tend to wear out and break, the design functionality of the laptop computer may be limited by the required direct electrical connection, the design aesthetics of the laptop computer may be limited by the required direct electrical connection, and the like. However, a wireless connection may be made between the base and the screen. In this instance, the device resonator may be placed in the screen portion to power the display, and the base may be either powered by a second device resonator, by traditional wired connections, by a hybrid of resonator-battery-direct electrical connection, and the like. This may not only improve the reliability of the power connection due to the removal of the physical wired connection, but may also allow designers to improve the functional and/or aesthetic design of the hinge portion of the laptop in light of the absence of physical wires associated with the hinge. Again, the laptop computer has been used here to illustrate how the principles disclosed herein may improve the design of an electric or electronic device, and should not be taken as limiting in any way. For instance, many other electrical devices with separated physical portions could benefit from the systems and methods described herein, such as a refrigerator with electrical functions on the door, including an ice maker, a sensor system, a light, and the like; a robot with movable portions, separated by joints; a car's power system and a component in the car's door; and the like. The ability to provide power to a device via a device resonator from an external source resonator, or to a portion of the device via a device resonator from either external or internal source resonators, will be recognized by someone skilled in the art to be widely applicable across the range of electric and electronic devices.

The systems and methods disclosed herein may provide for a sharing of electrical power between devices, such as between charged devices and uncharged devices. For instance a charged up device or appliance may act like a source and send a predetermined amount of energy, dialed in amount of energy, requested and approved amount of energy, and the like, to a nearby device or appliance. For example, a user may have a cell phone and a digital camera that are both capable of transmitting and receiving power through embedded source and device resonators, and one of the devices, say the cell phone, is found to be low on charge. The user may then transfer charge from the digital camera to the cell phone. The source and device resonators in these devices may utilize the same physical resonator for both transmission and reception, utilize separate source and device resonators, one device may be designed to receive and transmit while the other is designed to receive only, one device may be designed to transmit only and the other to receive only, and the like.

To prevent complete draining the battery of a device it may have a setting allowing a user to specify how much of the power resource the receiving device is entitled to. It may be useful, for example, to put a limit on the amount of power available to external devices and to have the ability to shut down power transmission when battery power falls below a threshold.

The systems and methods described herein may provide wireless power transfer to a nearby electrical or electronics component in association with an electrical facility, where the source resonator is in the electrical facility and the device resonator is in the electronics component. The source resonator may also be connected to, plugged into, attached to the electrical facility, such as through a universal interface (e.g. a USB interface, PC card interface), supplemental electrical outlet, universal attachment point, and the like, of the electrical facility. For example, the source resonator may be inside the structure of a computer on a desk, or be integrated into some object, pad, and the like, that is connected to the computer, such as into one of the computer's USB interfaces. In the example of the source resonator embedded in the object, pad, and the like, and powered through a USB interface, the source resonator may then be easily added to a user's desktop without the need for being integrated into any other electronics device, thus conveniently providing a wireless energy zone around which a plurality of electric and/or electronics devices may be powered. The electrical facility may be a computer, a light fixture, a dedicated source resonator electrical facility, and the like, and the nearby components may be computer peripherals, surrounding electronics components, infrastructure devices, and the like, such as computer keyboards, computer mouse, fax machine, printer, speaker system, cell phone, audio device, intercom, music player, PDA, lights, electric pencil sharpener, fan, digital picture frame, calculator, electronic games, and the like. For example, a computer system may be the electrical facility with an integrated source resonator that utilizes a 'wireless keyboard' and 'wireless mouse', where the use of the term wireless here is meant to indicate that there is wireless communication facility between each device and the computer, and where each device must still contain a separate battery power source. As a result, batteries would need to be replaced periodically, and in a large company, may result in a substantial burden for support personnel for replacement of batteries, cost of batteries, and proper disposal of batteries. Alternatively, the systems and methods described herein may provide wireless power transmission from the main body of the computer to each of these peripheral devices, including not only power to the keyboard and mouse, but to other peripheral components such as a fax, printer, speaker system, and the like, as described herein. A source resonator integrated into the electrical facility may provide wireless power transmission to a plurality of peripheral devices, user devices, and the like, such that there is a significant reduction in the need to charge and/or replace batteries for devices in the near vicinity of the source resonator integrated electrical facility. The electrical facility may also provide tuning or auto-tuning software, algorithms, facilities, and the like, for adjusting the power transfer parameters between the electrical facility and the wirelessly powered device. For example, the electrical facility may be a computer on a user's desktop, and the source resonator may be either integrated into the computer or plugged into the computer (e.g. through a USB connection), where the computer provides a facility for providing the tuning algorithm (e.g. through a software program running on the computer).

The systems and methods disclosed herein may provide wireless power transfer to a nearby electrical or electronics component in association with a facility infrastructure component, where the source resonator is in, or mounted on, the facility infrastructure component and the device resonator is in the electronics component. For instance, the facility infrastructure component may be a piece of furniture, a fixed wall, a movable wall or partition, the ceiling, the floor, and the source resonator attached or integrated into a table or desk (e.g. just below/above the surface, on the side, integrated into a table top or table leg), a mat placed on the floor (e.g. below a desk, placed on a desk), a mat on the garage floor (e.g. to charge the car and/or devices in the car), in a parking lot/garage (e.g. on a post near where the car is parked), a television (e.g. for charging a remote control), a computer monitor (e.g. to power/charge a wireless keyboard, wireless mouse, cell phone), a chair (e.g. for powering electric blankets, medical devices, personal health monitors), a painting, office furniture, common household appliances, and the like. For example, the facility infrastructure component may be a lighting fixture in an office cubical, where the source resonator and light within the lighting fixture are both directly connected to the facility's wired electrical power. However, with the source resonator now provided in the lighting fixture, there would be no need to have any additional wired connections for those nearby electrical or electronics components that are connected to, or integrated with, a device resonator. In addition, there may be a reduced need for the replacement of batteries for devices with device resonators, as described herein.

The use of the systems and methods described herein to supply power to electrical and electronic devices from a central location, such as from a source resonator in an electrical facility, from a facility infrastructure component and the like, may minimize the electrical wiring infrastructure of the surrounding work area. For example, in an enterprise office space there are typically a great number of electrical and electronic devices that need to be powered by wired connections. With utilization of the systems and methods described herein, much of this wiring may be eliminated, saving the enterprise the cost of installation, decreasing the physical limitations associated with office walls having electrical wiring, minimizing the need for power outlets and power strips, and the like. The systems and methods described herein may save money for the enterprise through a reduction in electrical infrastructure associated with installation, re-installation (e.g., reconfiguring office space), maintenance, and the like. In another example, the principles disclosed herein may allow the wireless placement of an electrical outlet in the middle of a room. Here, the source could be placed on the ceiling of a basement below the location on the floor above where one desires to put an outlet. The device resonator could be placed on the floor of the room right above it. Installing a new lighting fixture (or any other electric device for that matter, e.g. camera, sensor, etc., in the center of the ceiling may now be substantially easier for the same reason).

In another example, the systems and methods described herein may provide power "through" walls. For instance, suppose one has an electric outlet in one room (e.g. on a wall), but one would like to have an outlet in the next room, but without the need to call an electrician, or drill through a wall, or drag a wire around the wall, or the like. Then one might put a source resonator on the wall in one room, and a device resonator outlet/pickup on the other side of the wall. This may power a flat-screen TV or stereo system or the like (e.g. one may not want to have an ugly wire climbing up the wall in the living room, but doesn't mind having a similar wire going up the wall in the next room, e.g. storage room or closet, or a room with furniture that blocks view of wires running along the wall). The systems and methods described herein may be used to transfer power from an indoor source to various electric devices outside of homes or buildings without requiring holes to be drilled through, or conduits installed in, these outside walls. In this case, devices could be wirelessly powered outside the building without the aesthetic or structural damage or risks associated with drilling holes through walls and siding. In addition, the systems and methods described herein may provide for a placement sensor to assist in placing an interior source resonator for an exterior device resonator equipped electrical component. For example, a home owner may place a security light on the outside of their home which includes a wireless device resonator, and now needs to adequately or optimally position the source resonator inside the home. A placement sensor acting between the source and device resonators may better enable that placement by indicating when placement is good, or to a degree of good, such as in a visual indication, an audio indication, a display indication, and the like. In another example, and in a similar way, the systems and methods described herein may provide for the installation of equipment on the roof of a home or building, such as radio transmitters and receivers, solar panels and the like. In the case of the solar panel, the source resonator may be associated with the panel, and power may be wirelessly transferred to a distribution panel inside the building without the need for drilling through the roof. The systems and methods described herein may allow for the mounting of electric or electrical components across the walls of vehicles (such as through the roof) without the need to drill holes, such as for automobiles, water craft, planes, trains, and the like. In this way, the vehicle's walls may be left intact without holes being drilled, thus maintaining the value of the vehicle, maintaining watertightness, eliminating the need to route wires, and the like. For example, mounting a siren or light to the roof of a police car decreases the future resale of the car, but with the systems and methods described herein, any light, horn, siren, and the like, may be attached to the roof without the need to drill a hole.

The systems and methods described herein may be used for wireless transfer of power from solar photovoltaic (PV) panels. PV panels with wireless power transfer capability may have several benefits including simpler installation, more flexible, reliable, and weatherproof design. Wireless power transfer may be used to transfer power from the PV panels to a device, house, vehicle, and the like. Solar PV panels may have a wireless source resonator allowing the PV panel to directly power a device that is enabled to receive the wireless power. For example, a solar PV panel may be mounted directly onto the roof of a vehicle, building, and the like. The energy captured by the PV panel may be wirelessly transferred directly to devices inside the vehicle or under the roof of a building. Devices that have resonators can wirelessly receive power from the PV panel. Wireless power transfer from PV panels may be used to transfer energy to a resonator that is coupled to the wired electrical system of a house, vehicle, and the like allowing traditional power distribution and powering of conventional devices without requiring any direct contact between the exterior PV panels and the internal electrical system.

With wireless power transfer significantly simpler installation of rooftop PV panels is possible because power may be transmitted wirelessly from the panel to a capture resonator in the house, eliminating all outside wiring, connectors, and conduits, and any holes through the roof or walls of the structure. Wireless power transfer used with solar cells may have a benefit in that it can reduced roof danger since it eliminates the need for electricians to work on the roof to interconnect panels, strings, and junction boxes. Installation of solar panels integrated with wireless power transfer may require less skilled labor since fewer electrical contacts need to be made. Less site specific design may be required with wireless power transfer since the technology gives the installer the ability to individually optimize and position each solar PV panel, significantly reducing the need for expensive engineering and panel layout services. There may not be need to carefully balance the solar load on every panel and no need for specialized DC wiring layout and interconnections.

For rooftop or on-wall installations of PV panels, the capture resonator may be mounted on the underside of the roof, inside the wall, or in any other easily accessible inside space within a foot or two of the solar PV panel. A diagram showing a possible general rooftop PV panel installation is shown in FIG. 51. Various PV solar collectors may be mounted in top of a roof with wireless power capture coils mounted inside the building under the roof. The resonator coils in the PV panels can transfer their energy wirelessly through the roof to the wireless capture coils. The captured energy from the PV cells may be collected and coupled to the electrical system of the house to power electric and electronic devices or coupled to the power grid when more power than needed is generated. Energy is captured from the PV cells without requiring holes or wires that penetrate the roof or the walls of the building. Each PV panel may have a resonator that is coupled to a corresponding resonator on the interior of the vehicle or building. Multiple panels may utilize wireless power transfer between each other to transfer or collect power to one or a couple of designated panels that are coupled to resonators on the interior of the vehicle of house. Panels may have wireless power resonators on their sides or in their perimeter that can couple to resonators located in other like panels allowing transfer of power from panel to panel. An additional bus or connection structure may be provided that wirelessly couples the power from multiple panels on the exterior of a building or vehicle and transfers power to one or a more resonators on the interior of building or vehicle.

For example, as shown in FIG. 51, a source resonator 5102 may be coupled to a PV cell 5100 mounted on top of roof 5104 of a building. A corresponding capture resonator 5106 is placed inside the building. The solar energy captured by the PV cells can then be transferred between the source resonators 5102 outside to the device resonators 5106 inside the building without having direct holes and connections through the building.

Each solar PV panel with wireless power transfer may have its own inverter, significantly improving the economics of these solar systems by individually optimizing the power production efficiency of each panel, supporting a mix of panel sizes and types in a single installation, including single panel "pay-as-you-grow" system expansions. Reduction of installation costs may make a single panel economical for installation. Eliminating the need for panel string designs and careful positioning and orienting of multiple panels, and eliminating a single point of failure for the system.

Wireless power transfer in PV solar panels may enable more solar deployment scenarios because the weather-sealed solar PV panels eliminate the need to drill holes for wiring through sealed surfaces such as car roofs and ship decks, and eliminate the requirement that the panels be installed in fixed locations. With wireless power transfer, PV panels may be deployed temporarily, and then moved or removed, without leaving behind permanent alterations to the surrounding structures. They may be placed out in a yard on sunny days, and moved around to follow the sun, or brought inside for cleaning or storage, for example. For backyard or mobile solar PV applications, an extension cord with a wireless energy capture device may be thrown on the ground or placed near the solar unit. The capture extension cord can be completely sealed from the elements and electrically isolated, so that it may be used in any indoor or outdoor environment.

With wireless power transfer no wires or external connections may be necessary and the PV solar panels can be completely weather sealed. Significantly improved reliability and lifetime of electrical components in the solar PV power generation and transmission circuitry can be expected since the weather-sealed enclosures can protect components from UV radiation, humidity, weather, and the like. With wireless power transfer and weather-sealed enclosures it may be possible to use less expensive components since they will no longer be directly exposed to external factors and weather elements and it may reduce the cost of PV panels.

Power transfer between the PV panels and the capture resonators inside a building or a vehicle may be bidirectional. Energy may be transmitted from the house grid to the PV panels to provide power when the panels do not have enough energy to perform certain tasks such. Reverse power flow can be used to melt snow from the panels, or power motors that will position the panels in a more favorable positions with respect to the sun energy. Once the snow is melted or the panels are repositioned and the PV panels can generate their own energy the direction of power transfer can be returned to normal delivering power from the PV panels to buildings, vehicles, or devices.

PV panels with wireless power transfer may include auto-tuning on installation to ensure maximum and efficient power transfer to the wireless collector. Variations in roofing materials or variations in distances between the PV panels and the wireless power collector in different installations may affect the performance or perturb the properties of the resonators of the wireless power transfer. To reduce the installation complexity the wireless power transfer components may include a tuning capability to automatically adjust their operating point to compensate for any effects due to materials or distance. Frequency, impedance, capacitance, inductance, duty cycle, voltage levels and the like may be adjusted to ensure efficient and safe power transfer The systems and methods described herein may be used to provide a wireless power zone on a temporary basis or in extension of traditional electrical outlets to wireless power zones, such as through the use of a wireless power extension cord. For example, a wireless power extension cord may be configured as a plug for connecting into a traditional power outlet, a long wire such as in a traditional power extension cord, and a resonant source coil on the other end (e.g. in place of, or in addition to, the traditional socket end of the extension The wireless extension cord may also be configured where there are source resonators at a plurality of locations along the wireless extension cord. This configuration may then replace any traditional extension cord where there are wireless power configured devices, such as providing wireless power to a location where there is no convenient power outlet (e.g. a location in the living room where there's no outlet), for temporary wireless power where there is no wired power infrastructure (e.g. a construction site), out into the yard where there are no outlets (e.g. for parties or for yard grooming equipment that is wirelessly powered to decrease the chances of cutting the traditional electrical cord), and the like. The wireless extension cord may also be used as a drop within a wall or structure to provide wireless power zones within the vicinity of the drop. For example, a wireless extension cord could be run within a wall of a new or renovated room to provide wireless power zones without the need for the installation of traditional electrical wiring and outlets.

The systems and methods described herein may be utilized to provide power between moving parts or rotating assemblies of a vehicle, a robot, a mechanical device, a wind turbine, or any other type of rotating device or structure with moving parts such as robot arms, construction vehicles, movable platforms and the like. Traditionally, power in such systems may have been provided by slip rings or by rotary joints for example. Using wireless power transfer as described herein, the design simplicity, reliability and longevity of these devices may be significantly improved because power can be transferred over a range of distances without any physical connections or contact points that may wear down or out with time. In particular, the preferred coaxial and parallel alignment of the source and device coils may provide wireless power transmission that is not severely modulated by the relative rotational motion of the two coils.

The systems and methods described herein may be utilized to extend power needs beyond the reach of a single source resonator by providing a series of source-device-source-device resonators. For instance, suppose an existing detached garage has no electrical power and the owner now wants to install a new power service. However, the owner may not want to run wires all over the garage, or have to break into the walls to wire electrical outlets throughout the structure. In this instance, the owner may elect to connect a source resonator to the new power service, enabling wireless power to be supplied to device resonator outlets throughout the back of the garage. The owner may then install a device-source 'relay' to supply wireless power to device resonator outlets in the front of the garage. That is, the power relay may now receive wireless power from the primary source resonator, and then supply available power to a second source resonator to supply power to a second set of device resonators in the front of the garage. This configuration may be repeated again and again to extend the effective range of the supplied wireless power.

Multiple resonators may be used to extend power needs around an energy blocking material. For instance, it may be desirable to integrate a source resonator into a computer or computer monitor such that the resonator may power devices placed around and especially in front of the monitor or computer such as keyboards, computer mice, telephones, and the like. Due to aesthetics, space constraints, and the like an energy source that may be used for the source resonator may only be located or connected to in the back of the monitor or computer. In many designs of computer or monitors metal components and metal containing circuits are used in the design and packaging which may limit and prevent power transfer from source resonator in the back of the monitor or computer to the front of the monitor or computer. An additional repeater resonator may be integrated into the base or pedestal of the monitor or computer that couples to the source resonator in the back of the monitor or computer and allows power transfer to the space in front of the monitor or computer. The intermediate resonator integrated into the base or pedestal of the monitor or computer does not require an additional power source, it captures power from the source resonator and transfers power to the front around the blocking or power shielding metal components of the monitor or computer.

The systems and methods described herein may be built-into, placed on, hung from, embedded into, integrated into, and the like, the structural portions of a space, such as a vehicle, office, home, room, building, outdoor structure, road infrastructure, and the like. For instance, one or more sources may be built into, placed on, hung from, embedded or integrated into a wall, a ceiling or ceiling panel, a floor, a divider, a doorway, a stairwell, a compartment, a road surface, a sidewalk, a ramp, a fence, an exterior structure, and the like. One or more sources may be built into an entity within or around a structure, for instance a bed, a desk, a chair, a rug, a mirror, a clock, a display, a television, an electronic device, a counter, a table, a piece of furniture, a piece of artwork, an enclosure, a compartment, a ceiling panel, a floor or door panel, a dashboard, a trunk, a wheel well, a post, a beam, a support or any like entity. For example, a source resonator may be integrated into the dashboard of a user's car so that any device that is equipped with or connected to a device resonator may be supplied with power from the dashboard source resonator. In this way, devices brought into or integrated into the car may be constantly charged or powered while in the car.

The systems and methods described herein may provide power through the walls of vehicles, such as boats, cars, trucks, busses, trains, planes, satellites and the like. For instance, a user may not want to drill through the wall of the vehicle in order to provide power to an electric device on the outside of the vehicle. A source resonator may be placed inside the vehicle and a device resonator may be placed outside the vehicle (e.g. on the opposite side of a window, wall or structure). In this way the user may achieve greater flexibility in optimizing the placement, positioning and attachment of the external device to the vehicle, (such as without regard to supplying or routing electrical connections to the device). In addition, with the electrical power supplied wirelessly, the external device may be sealed such that it is water tight, making it safe if the electric device is exposed to weather (e.g. rain), or even submerged under water. Similar techniques may be employed in a variety of applications, such as in charging or powering hybrid vehicles, navigation and communications equipment, construction equipment, remote controlled or robotic equipment and the like, where electrical risks exist because of exposed conductors. The systems and methods described herein may provide power through the walls of vacuum chambers or other enclosed spaces such as those used in semiconductor growth and processing, material coating systems, aquariums, hazardous materials handling systems and the like. Power may be provided to translation stages, robotic arms, rotating stages, manipulation and collection devices, cleaning devices and the like.

The systems and methods described herein may provide wireless power to a kitchen environment, such as to counter-top appliances, including mixers, coffee makers, toasters, toaster ovens, grills, griddles, electric skillets, electric pots, electric woks, waffle makers, blenders, food processors, crock pots, warming trays, induction cooktops, lights, computers, displays, and the like. This technology may improve the mobility and/or positioning flexibility of devices, reduce the number of power cords stored on and strewn across the counter-top, improve the washability of the devices, and the like. For example, an electric skillet may traditionally have separate portions, such as one that is submersible for washing and one that is not submersible because it includes an external electrical connection (e.g. a cord or a socket for a removable cord). However, with a device resonator integrated into the unit, all electrical connections may be sealed, and so the entire device may now be submersed for cleaning. In addition, the absence of an external cord may eliminate the need for an available electrical wall outlet, and there is no longer a need for a power cord to be placed across the counter or for the location of the electric griddle to be limited to the location of an available electrical wall outlet.

The systems and methods described herein may provide continuous power/charging to devices equipped with a device resonator because the device doesn't leave the proximity of a source resonator, such as fixed electrical devices, personal computers, intercom systems, security systems, household robots, lighting, remote control units, televisions, cordless phones, and the like. For example, a household robot (e.g. ROOMBA) could be powered/charged via wireless power, and thus work arbitrarily long without recharging. In this way, the power supply design for the household robot may be changed to take advantage of this continuous source of wireless power, such as to design the robot to only use power from the source resonator without the need for batteries, use power from the source resonator to recharge the robot's batteries, use the power from the source resonator to trickle charge the robot's batteries, use the power from the source resonator to charge a capacitive energy storage unit, and the like. Similar optimizations of the power supplies and power circuits may be enabled, designed, and realized, for any and all of the devices disclosed herein.

The systems and methods described herein may be able to provide wireless power to electrically heated blankets, heating pads/patches, and the like. These electrically heated devices may find a variety of indoor and outdoor uses. For example, hand and foot warmers supplied to outdoor workers such as guards, policemen, construction workers and the like might be remotely powered from a source resonator associated with or built into a nearby vehicle, building, utility pole, traffic light, portable power unit, and the like.

The systems and methods described herein may be used to power a portable information device that contains a device resonator and that may be powered up when the information device is near an information source containing a source resonator. For instance, the information device may be a card (e.g. credit card, smart card, electronic card, and the like) carried in a user's pocket, wallet, purse, vehicle, bike, and the like. The portable information device may be powered up when it is in the vicinity of an information source that then transmits information to the portable information device that may contain electronic logic, electronic processors, memory, a display, an LCD display, LEDs, RFID tags, and the like. For example, the portable information device may be a credit card with a display that "turns on" when it is near an information source, and provide the user with some information such as, "You just received a coupon for 50% off your next Coca Cola purchase". The information device may store information such as coupon or discount information that could be used on subsequent purchases. The portable information device may be programmed by the user to contain tasks, calendar appointments, to-do lists, alarms and reminders, and the like. The information device may receive up-to-date price information and inform the user of the location and price of previously selected or identified items.

The systems and methods described herein may provide wireless power transmission to directly power or recharge the batteries in sensors, such as environmental sensors, security sensors, agriculture sensors, appliance sensors, food spoilage sensors, power sensors, and the like, which may be mounted internal to a structure, external to a structure, buried underground, installed in walls, and the like. For example, this capability may replace the need to dig out old sensors to physically replace the battery, or to bury a new sensor because the old sensor is out of power and no longer operational. These sensors may be charged up periodically through the use of a portable sensor source resonator charging unit. For instance, a truck carrying a source resonator equipped power source, say providing ~kW of power, may provide enough power to a ~mW sensor in a few minutes to extend the duration of operation of the sensor for more than a year. Sensors may also be directly powered, such as powering sensors that are in places where it is difficult to connect to them with a wire but they are still within the vicinity of a source resonator, such as devices outside of a house (security camera), on the other side of a wall, on an electric lock on a door, and the like. In another example, sensors that may need to be otherwise supplied with a wired power connection may be powered through the systems and methods described herein. For example, a ground fault interrupter breaker combines residual current and overcurrent protection in one device for installation into a service panel. However, the sensor traditionally has to be independently wired for power, and this may complicate the installation. However, with the systems and methods described herein the sensor may be powered with a device resonator, where a single source resonator is provided within the service panel, thus simplifying the installation and wiring configuration within the service panel. In addition, the single source resonator may power device resonators mounted on either side of the source resonator mounted within the service panel, throughout the service panel, to additional nearby service panels, and the like. The systems and methods described herein may be employed to provide wireless power to any electrical component associated with electrical panels, electrical rooms, power distribution and the like, such as in electric switchboards, distribution boards, circuit breakers, transformers, backup batteries, fire alarm control panels, and the like. Through the use of the systems and methods described herein, it may be easier to install, maintain, and modify electrical distribution and protection components and system installations.

In another example, sensors that are powered by batteries may run continuously, without the need to change the batteries, because wireless power may be supplied to periodically or continuously recharge or trickle charge the battery. In such applications, even low levels of power may adequately recharge or maintain the charge in batteries, significantly extending their lifetime and usefulness. In some cases, the battery life may be extended to be longer than the lifetime of the device it is powering, making it essentially a battery that "lasts forever".

The systems and methods described herein may be used for charging implanted medical device batteries, such as in an artificial heart, pacemaker, heart pump, insulin pump, implanted coils for nerve or acupressure/acupuncture point stimulation, and the like. For instance, it may not be convenient or safe to have wires sticking out of a patient because the wires may be a constant source of possible infection and may generally be very unpleasant for the patient. The systems and methods described herein may also be used to charge or power medical devices in or on a patient from an external source, such as from a bed or a hospital wall or ceiling with a source resonator. Such medical devices may be easier to attach, read, use and monitor the patient. The systems and methods described herein may ease the need for attaching wires to the patient and the patient's bed or bedside, making it more convenient for the patient to move around and get up out of bed without the risk of inadvertently disconnecting a medical device. This may, for example, be usefully employed with patients that have multiple sensors monitoring them, such as for measuring pulse, blood pressure, glucose, and the like. For medical and monitoring devices that utilize batteries, the batteries may need to be replaced quite often, perhaps multiple times a week. This may present risks associated with people forgetting to replace batteries, not noticing that the devices or monitors are not working because the batteries have died, infection associated with improper cleaning of the battery covers and compartments, and the like.

The systems and methods described herein may reduce the risk and complexity of medical device implantation procedures. Today many implantable medical devices such as ventricular assist devices, pacemakers, defibrillators and the like, require surgical implantation due to their device form factor, which is heavily influenced by the volume and shape of the long-life battery that is integrated in the device. In one aspect, there is described herein a non-invasive method of recharging the batteries so that the battery size may be dramatically reduced, and the entire device may be implanted, such as via a catheter. A catheter implantable device may include an integrated capture or device coil. A catheter implantable capture or device coil may be designed so that it may be wired internally, such as after implantation. The capture or device coil may be deployed via a catheter as a rolled up flexible coil (e.g. rolled up like two scrolls, easily unrolled internally with a simple spreader mechanism). The power source coil may be worn in a vest or article of clothing that is tailored to fit in such a way that places the source in proper position, may be placed in a chair cushion or bed cushion, may be integrated into a bed or piece of furniture, and the like.

The systems and methods described herein may enable patients to have a 'sensor vest', sensor patch, and the like, that may include at least one of a plurality of medical sensors and a device resonator that may be powered or charged when it is in the vicinity of a source resonator. Traditionally, this type of medical monitoring facility may have required batteries, thus making the vest, patch, and the like, heavy, and potentially impractical. But using the principles disclosed herein, no batteries (or a lighter rechargeable battery) may be required, thus making such a device more convenient and practical, especially in the case where such a medical device could be held in place without straps, such as by adhesive, in the absence of batteries or with substantially lighter batteries. A medical facility may be able to read the sensor data remotely with the aim of anticipating (e.g. a few minutes ahead of) a stroke, a heart-attack, or the like. When the vest is used by a person in a location remote from the medical facility, such as in their home, the vest may then be integrated with a cell-phone or communications device to call an ambulance in case of an accident or a medical event. The systems and methods described herein may be of particular value in the instance when the vest is to be used by an elderly person, where traditional non-wireless recharging practices (e.g. replacing batteries, plugging in at night, and the like) may not be followed as required. The systems and methods described herein may also be used for charging devices that are used by or that aid handicapped or disabled people who may have difficulty replacing or recharging batteries, or reliably supplying power to devices they enjoy or rely on.

The systems and methods described herein may be used for the charging and powering of artificial limbs. Artificial limbs have become very capable in terms of replacing the functionality of original limbs, such as arms, legs, hands and feet. However, an electrically powered artificial limb may require substantial power, (such as 10-20 W) which may translate into a substantial battery. In that case, the amputee may be left with a choice between a light battery that doesn't last very long, and a heavy battery that lasts much longer, but is more difficult to 'carry' around. The systems and methods described herein may enable the artificial limb to be powered with a device resonator, where the source resonator is either carried by the user and attached to a part of the body that may more easily support the weight (such as on a belt around the waist, for example) or located in an external location where the user will spend an adequate amount of time to keep the device charged or powered, such as at their desk, in their car, in their bed, and the like.

The systems and methods described herein may be used for charging and powering of electrically powered exo-skeletons, such as those used in industrial and military applications, and for elderly/weak/sick people. An electrically powered exo-skeleton may provide up to a 10-to-20 times increase in "strength" to a person, enabling the person to perform physically strenuous tasks repeatedly without much fatigue. However, exo-skeletons may require more than 100 W of power under certain use scenarios, so battery powered operation may be limited to 30 minutes or less. The delivery of wireless power as described herein may provide a user of an exo-skeleton with a continuous supply of power both for powering the structural movements of the exo-skeleton and for powering various monitors and sensors distributed throughout the structure. For instance, an exo-skeleton with an embedded device resonator(s) may be supplied with power from a local source resonator. For an industrial exo-skeleton, the source resonator may be placed in the walls of the facility. For a military exo-skeleton, the source resonator may be carried by an armored vehicle. For an exo-skeleton employed to assist a caretaker of the elderly, the source resonator(s) may be installed or placed in or the room(s) of a person's home.

The systems and methods described herein may be used for the powering/charging of portable medical equipment, such as oxygen systems, ventilators, defibrillators, medication pumps, monitors, and equipment in ambulances or mobile medical units, and the like. Being able to transport a patient from an accident scene to the hospital, or to move patients in their beds to other rooms or areas, and bring all the equipment that is attached with them and have it powered the whole time offers great benefits to the patients' health and eventual well-being. Certainly one can understand the risks and problems caused by medical devices that stop working because their battery dies or because they must be unplugged while a patient is transported or moved in any way. For example, an emergency medical team on the scene of an automotive accident might need to utilize portable medical equipment in the emergency care of patients in the field. Such portable medical equipment must be properly maintained so that there is sufficient battery life to power the equipment for the duration of the emergency. However, it is too often the case that the equipment is not properly maintained so that batteries are not fully charged and in some cases, necessary equipment is not available to the first responders. The systems and methods described herein may provide for wireless power to portable medical equipment (and associated sensor inputs on the patient) in such a way that the charging and maintaining of batteries and power packs is provided automatically and without human intervention. Such a system also benefits from the improved mobility of a patient unencumbered by a variety of power cords attached to the many medical monitors and devices used in their treatment.

The systems and methods described herein may be used to for the powering/charging of personal hearing aids. Personal hearing aids need to be small and light to fit into or around the ear of a person. The size and weight restrictions limit the size of batteries that can be used. Likewise, the size and weight restrictions of the device make battery replacement difficult due to the delicacy of the components. The dimensions of the devices and hygiene concerns make it difficult to integrate additional charging ports to allow recharging of the batteries. The systems and methods described herein may be integrated into the hearing aid and may reduce the size of the necessary batteries which may allow even smaller hearing aids. Using the principles disclosed herein, the batteries of the hearing aid may be recharged without requiring external connections or charging ports. Charging and device circuitry and a small rechargeable battery may be integrated into a form factor of a conventional hearing aid battery allowing retrofit into existing hearing aids. The hearing aid may be recharged while it is used and worn by a person. The energy source may be integrated into a pad or a cup allowing recharging when the hearing is placed on such a structure. The charging source may be integrated into a hearing aid dryer box allowing wireless recharging while the hearing aid is drying or being sterilized. The source and device resonator may be used to also heat the device reducing or eliminating the need for an additional heating element. Portable charging cases powered by batteries or AC adaptors may be used as storage and charging stations.

The source resonator for the medical systems described above may be in the main body of some or all of the medical equipment, with device resonators on the patient's sensors and devices; the source resonator may be in the ambulance with device resonators on the patient's sensors and the main body of some or all of the equipment; a primary source resonator may be in the ambulance for transferring wireless power to a device resonator on the medical equipment while the medical equipment is in the ambulance and a second source resonator is in the main body of the medical equipment and a second device resonator on the patient sensors when the equipment is away from the ambulance; and the like. The systems and methods described herein may significantly improve the ease with which medical personnel are able to transport patients from one location to another, where power wires and the need to replace or manually charge associated batteries may now be reduced.

The systems and methods described herein may be used for the charging of devices inside a military vehicle or facility, such as a tank, armored carrier, mobile shelter, and the like. For instance, when soldiers come back into a vehicle after "action" or a mission, they may typically start charging their electronic devices. If their electronic devices were equipped with device resonators, and there was a source resonator inside the vehicle, (e.g. integrated in the seats or on the ceiling of the vehicle), their devices would start charging immediately. In fact, the same vehicle could provide power to soldiers/robots (e.g. packbot from iRobot) standing outside or walking beside the vehicle. This capability may be useful in minimizing accidental battery-swapping with someone else (this may be a significant issue, as soldiers tend to trust only their own batteries); in enabling quicker exits from a vehicle under attack; in powering or charging laptops or other electronic devices inside a tank, as too many wires inside the tank may present a hazard in terms of reduced ability to move around fast in case of "trouble" and/or decreased visibility; and the like. The systems and methods described herein may provide a significant improvement in association with powering portable power equipment in a military environment.

The systems and methods described herein may provide wireless powering or charging capabilities to mobile vehicles such as golf carts or other types of carts, all-terrain vehicles, electric bikes, scooters, cars, mowers, bobcats and other vehicles typically used for construction and landscaping and the like. The systems and methods described herein may provide wireless powering or charging capabilities to miniature mobile vehicles, such as mini-helicopters, airborne drones, remote control planes, remote control boats, remote controlled or robotic rovers, remote controlled or robotic lawn mowers or equipment, bomb detection robots, and the like. For instance, mini-helicopter flying above a military vehicle to increase its field of view can fly for a few minutes on standard batteries. If these mini-helicopters were fitted with a device resonator, and the control vehicle had a source resonator, the mini-helicopter might be able to fly indefinitely. The systems and methods described herein may provide an effective alternative to recharging or replacing the batteries for use in miniature mobile vehicles. In addition, the systems and methods described herein may provide power/charging to even smaller devices, such as microelectromechanical systems (MEMS), nano-robots, nano devices, and the like. In addition, the systems and methods described herein may be implemented by installing a source device in a mobile vehicle or flying device to enable it to serve as an in-field or in-flight re-charger, that may position itself autonomously in proximity to a mobile vehicle that is equipped with a device resonator.

The systems and methods described herein may be used to provide power networks for temporary facilities, such as military camps, oil drilling setups, remote filming locations, and the like, where electrical power is required, such as for power generators, and where power cables are typically run around the temporary facility. There are many instances when it is necessary to set up temporary facilities that require power. The systems and methods described herein may enable a more efficient way to rapidly set up and tear down these facilities, and may reduce the number of wires that must be run throughout the faculties to supply power. For instance, when Special Forces move into an area, they may erect tents and drag many wires around the camp to provide the required electricity. Instead, the systems and methods described herein may enable an army vehicle, outfitted with a power supply and a source resonator, to park in the center of the camp, and provide all the power to nearby tents where the device resonator may be integrated into the tents, or some other piece of equipment associated with each tent or area. A series of source-device-source-device resonators may be used to extend the power to tents that are farther away. That is, the tents closest to the vehicle could then provide power to tents behind them. The systems and methods described herein may provide a significant improvement to the efficiency with which temporary installations may be set up and torn down, thus improving the mobility of the associated facility.

The systems and methods described herein may be used in vehicles, such as for replacing wires, installing new equipment, powering devices brought into the vehicle, charging the battery of a vehicle (e.g. for a traditional gas powered engine, for a hybrid car, for an electric car, and the like), powering devices mounted to the interior or exterior of the vehicle, powering devices in the vicinity of the vehicle, and the like. For example, the systems and methods described herein may be used to replace wires such as those are used to power lights, fans and sensors distributed throughout a vehicle. As an example, a typical car may have 50 kg of wires associated with it, and the use of the systems and methods described herein may enable the elimination of a substantial amount of this wiring. The performance of larger and more weight sensitive vehicles such as airplanes or satellites could benefit greatly from having the number of cables that must be run throughout the vehicle reduced. The systems and methods described herein may allow the accommodation of removable or supplemental portions of a vehicle with electric and electrical devices without the need for electrical harnessing. For example, a motorcycle may have removable side boxes that act as a temporary trunk space for when the cyclist is going on a long trip. These side boxes may have exterior lights, interior lights, sensors, auto equipment, and the like, and if not for being equipped with the systems and methods described herein might require electrical connections and harnessing.

An in-vehicle wireless power transmission system may charge or power one or more mobile devices used in a car: mobile phone handset, Bluetooth headset, blue tooth hands free speaker phone, GPS, MP3 player, wireless audio transceiver for streaming MP3 audio through car stereo via FM, Bluetooth, and the like. The in vehicle wireless power source may utilize source resonators that are arranged in any of several possible configurations including charging pad on dash, charging pad otherwise mounted on floor, or between seat and center console, charging "cup" or receptacle that fits in cup holder or on dash, and the like.

The wireless power transmission source may utilize a rechargeable battery system such that said supply battery gets charged whenever the vehicle power is on such that when the vehicle is turned off the wireless supply can draw power from the supply battery and can continue to wirelessly charge or power mobile devices that are still in the car.

The plug-in electric cars, hybrid cars, and the like, of the future need to be charged, and the user may need to plug in to an electrical supply when they get home or to a charging station. Based on a single over-night recharging, the user may be able to drive up to 50 miles the next day. Therefore, in the instance of a hybrid car, if a person drives less than 50 miles on most days, they will be driving mostly on electricity. However, it would be beneficial if they didn't have to remember to plug in the car at night. That is, it would be nice to simply drive into a garage, and have the car take care of its own charging. To this end, a source resonator may be built into the garage floor and/or garage side-wall, and the device resonator may be built into the bottom (or side) of the car. Even a few kW transfer may be sufficient to recharge the car over-night. The in-vehicle device resonator may measure magnetic field properties to provide feedback to assist in vehicle (or any similar device) alignment to a stationary resonating source. The vehicle may use this positional feedback to automatically position itself to achieve optimum alignment, thus optimum power transmission efficiency. Another method may be to use the positional feedback to help the human operator to properly position the vehicle or device, such as by making LED's light up, providing noises, and the like when it is well positioned. In such cases where the amount of power being transmitted could present a safety hazard to a person or animal that intrudes into the active field volume, the source or receiver device may be equipped with an active light curtain or some other external device capable of sensing intrusion into the active field volume, and capable of shutting off the source device and alert a human operator. In addition, the source device may be equipped with self-sensing capability such that it may detect that its expected power transmission rate has been interrupted by an intruding element, and in such case shut off the source device and alert a human operator. Physical or mechanical structures such as hinged doors or inflatable bladder shields may be incorporated as a physical barrier to prevent unwanted intrusions. Sensors such as optical, magnetic, capacitive, inductive, and the like may also be used to detect foreign structures or interference between the source and device resonators. The shape of the source resonator may be shaped such to prevent water or debris accumulation. The source resonator may be placed in a cone shaped enclosure or may have an enclosure with an angled top to allow water and debris to roll off. The source of the system may use battery power of the vehicle or its own battery power to transmit its presence to the source to initiate power transmission.

The source resonator may be mounted on an embedded or hanging post, on a wall, on a stand, and the like for coupling to a device resonator mounted on the bumper, hood, body panel, and the like, of an electric vehicle. The source resonator may be enclosed or embedded into a flexible enclosure such as a pillow, a pad, a bellows, a spring loaded enclosure and the like so that the electric vehicle may make contact with the structure containing the source coil without damaging the car in any way. The structure containing the source may prevent objects from getting between the source and device resonators. Because the wireless power transfer may be relatively insensitive to misalignments between the source and device coils, a variety of flexible source structures and parking procedures may be appropriate for this application.

The systems and methods described herein may be used to trickle charge batteries of electric, hybrid or combustion engine vehicles. Vehicles may require small amounts of power to maintain or replenish battery power. The power may be transferred wirelessly from a source to a device resonator that may be incorporated into the front grill, roof, bottom, or other parts of the vehicle. The device resonator may be designed to fit into a shape of a logo on the front of a vehicle or around the grill as not to obstruct air flow through the radiator. The device or source resonator may have additional modes of operation that allow the resonator to be used as a heating element which can be used to melt of snow or ice from the vehicle.

An electric vehicle or hybrid vehicle may require multiple device resonators, such as to increase the ease with which the vehicle may come in proximity with a source resonator for charging (i.e. the greater the number and varied position of device resonators are, the greater the chances that the vehicle can pull in and interface with a diversity of charging stations), to increase the amount of power that can be delivered in a period of time (e.g. additional device resonators may be required to keep the local heating due to charging currents to acceptable levels), to aid in automatic parking/docking the vehicle with the charging station, and the like. For example, the vehicle may have multiple resonators (or a single resonator) with a feedback system that provides guidance to either the driver or an automated parking/docking facility in the parking of the vehicle for optimized charging conditions (i.e., the optimum positioning of the vehicle's device resonator to the charging station's source resonator may provide greater power transfer efficiency). An automated parking/docking facility may allow for the automatic parking of the vehicle based on how well the vehicle is coupled.

The power transmission system may be used to power devices and peripherals of a vehicle. Power to peripherals may be provided while a vehicle is charging, or while not charging, or power may be delivered to conventional vehicles that do not need charging. For example, power may be transferred wirelessly to conventional non-electric cars to power air conditioning, refrigeration units, heaters, lights, and the like while parked to avoid running the engine which may be important to avoid exhaust build up in garage parking lots or loading docks. Power may for example be wirelessly transferred to a bus while it is parked to allow powering of lights, peripherals, passenger devices, and the like avoiding the use of onboard engines or power sources. Power may be wirelessly transferred to an airplane while parked on the tarmac or in a hanger to power instrumentation, climate control, de-icing equipment, and the like without having to use onboard engines or power sources.

Wireless power transmission on vehicles may be used to enable the concept of Vehicle to Grid (V2G). Vehicle to grid is based on utilizing electric vehicles and plug-in hybrid electric vehicles (PHEV) as distributed energy storage devices, charged at night when the electric grid is underutilized, and available to discharge back into the grid during episodes of peak demand that occur during the day. The wireless power transmission system on a vehicle and the respective infrastructure may be implemented in such a way as to enable bidirectional energy flow—so that energy can flow back into the grid from the vehicle—without requiring a plug in connection. Vast fleets of vehicles, parked at factories, offices, parking lots, can be viewed as "peaking power capacity" by the smart grid. Wireless power transmission on vehicles can make such a V2G vision a reality. By simplifying the process of connecting a vehicle to the grid, (i.e. by simply parking it in a wireless charging enabled parking spot), it becomes much more likely that a certain number of vehicles will be "dispatchable" when the grid needs to tap their power. Without wireless charging, electric and PHEV owners will likely charge their vehicles at home, and park them at work in conventional parking spots. Who will want to plug their vehicle in at work, if they do not need charging? With wireless charging systems capable of handling 3 kW, 100,000 vehicles can provide 300 Megawatts back to the grid—using energy generated the night before by cost effective base load generating capacity. It is the streamlined ergonomics of the cordless self charging PHEV and electric vehicles that make it a viable V2G energy source.

The systems and methods described herein may be used to power sensors on the vehicle, such as sensors in tires to measure air-pressure, or to run peripheral devices in the vehicle, such as cell phones, GPS devices, navigation devices, game players, audio or video players, DVD players, wireless routers, communications equipment, anti-theft devices, radar devices, and the like. For example, source resonators described herein may be built into the main compartment of the car in order to supply power to a variety of devices located both inside and outside of the main compartment of the car. Where the vehicle is a motorcycle or the like, devices described herein may be integrated into the body of the motorcycle, such as under the seat, and device resonators may be provided in a user's helmet, such as for communications, entertainment, signaling, and the like, or device resonators may be provided in the user's jacket, such as for displaying signals to other drivers for safety, and the like.

The systems and methods described herein may be used in conjunction with transportation infrastructure, such as roads, trains, planes, shipping, and the like. For example, source resonators may be built into roads, parking lots, rail-lines, and the like. Source resonators may be built into traffic lights, signs, and the like. For example, with source resonators embedded into a road, and device resonators built into vehicles, the vehicles may be provided power as they drive along the road or as they are parked in lots or on the side of the road. The systems and methods described herein may provide an effective way for electrical systems in vehicles to be powered and/or charged while the vehicle traverses a road network, or a portion of a road network. In this way, the systems and methods described herein may contribute to the powering/charging of autonomous vehicles, automatic guided vehicles, and the like. The systems and methods described herein may provide power to vehicles in places where they typically idle or stop, such as in the vicinity of traffic lights or signs, on highway ramps, or in parking lots.

The systems and methods described herein may be used in an industrial environment, such as inside a factory for powering machinery, powering/charging robots, powering and/or charging wireless sensors on robot arms, powering/charging tools and the like. For example, using the systems and methods described herein to supply power to devices on the arms of robots may help eliminate direct wire connections across the joints of the robot arm. In this way, the wearing out of such direct wire connections may be reduced, and the reliability of the robot increased. In this case, the device resonator may be out on the arm of the robot, and the source resonator may be at the base of the robot, in a central location near the robot, integrated into the industrial facility in which the robot is providing service, and the like. The use of the systems and methods described herein may help eliminate wiring otherwise associated with power distribution within the industrial facility, and thus benefit the overall reliability of the facility.

The systems and methods described herein may be used for underground applications, such as drilling, mining, digging, and the like. For example, electrical components and sensors associated with drilling or excavation may utilize the systems and methods described herein to eliminate cabling associated with a digging mechanism, a drilling bit, and the like, thus eliminating or minimizing cabling near the excavation point. In another example, the systems and methods described herein may be used to provide power to excavation equipment in a mining application where the power requirements for the equipment may be high and the distances large, but where there are no people to be subjected to the associated required fields. For instance, the excavation area may have device resonator powered digging equipment that has high power requirements and may be digging relatively far from the source resonator. As a result the source resonator may need to provide high field intensities to satisfy these requirements, but personnel are far enough away to be outside these high intensity fields. This high power, no personnel, scenario may be applicable to a plurality of industrial applications.

The systems and methods described herein may also use the near-field non-radiative resonant scheme for information transfer rather than, or in addition to, power transfer. For instance, information being transferred by near-field non-radiative resonance techniques may not be susceptible to eavesdropping and so may provide an increased level of security compared to traditional wireless communication schemes. In addition, information being transferred by near-field non-radiative resonance techniques may not interfere with the EM radiative spectrum and so may not be a source of EM interference, thereby allowing communications in an extended frequency range and well within the limits set by any regulatory bodies. Communication services may be provided between remote, inaccessible or hard-to-reach places such as between remote sensors, between sections of a device or vehicle, in tunnels, caves and wells (e.g. oil wells, other drill sites) and between underwater or underground devices, and the like. Communications services may be provided in places where magnetic fields experience less loss than electric fields.

The systems and methods described herein may enable the simultaneous transmission of power and communication signals between sources and devices in wireless power transmission systems, or it may enable the transmission of power and communication signals during different time periods or at different frequencies. The performance characteristics of the resonator may be controllably varied to preferentially support or limit the efficiency or range of either energy or information transfer. The performance characteristics of the resonators may be controlled to improve the security by reducing the range of information transfer, for example. The performance characteristics of the resonators may be varied continuously, periodically, or according to a predetermined, computed or automatically adjusted algorithm. For example, the power and information transfer enabled by the systems and methods described herein may be provided in a time multiplexed or frequency multiplexed manner. A source and device may signal each other by tuning, changing, varying, dithering, and the like, the resonator impedance which may affect the reflected impedance of other resonators that can be detected. The information transferred as described herein may include information regarding device identification, device power requirements, handshaking protocols, and the like.

The source and device may sense, transmit, process and utilize position and location information on any other sources and/or devices in a power network. The source and device may capture or use information such as elevation, tilt, latitude and longitude, and the like from a variety of sensors and sources that may be built into the source and device or may be part of a component the source or device connect. The positioning and orientation information may include sources such as global positioning sensors (GPS), compasses, accelerometers, pressure sensors, atmospheric barometric sensors, positioning systems which use Wi-Fi or cellular network signals, and the like. The source and device may use the position and location information to find nearby wireless power transmission sources. A source may broadcast or communicate with a central station or database identifying its location. A device may obtain the source location information from the central station or database or from the local broadcast and guide a user or an operator to the source with the aid of visual, vibrational, or auditory signals. Sources and devices may be nodes in a power network, in a communications network, in a sensor network, in a navigational network, and the like or in kind of combined functionality network.

The position and location information may also be used to optimize or coordinate power delivery. Additional information about the relative position of a source and a device may be used to optimize magnetic field direction and resonator alignment. The orientation of a device and a source which may be obtained from accelerometers and magnetic sensors, and the like, for example, may be used to identify the orientation of resonators and the most favorable direction of a magnetic field such that the magnetic flux is not blocked by the device circuitry. With such information a source with the most favorable orientation, or a combination of sources, may be used. Likewise, position and orientation information may be used to move or provide feedback to a user or operator of a device to place a device in a favorable orientation or location to maximize power transmission efficiency, minimize losses, and the like.

The source and device may include power metering and measuring circuitry and capability. The power metering may be used to track how much power was delivered to a device or how much power was transferred by a source. The power metering and power usage information may be used in fee based power delivery arrangements for billing purposes. Power metering may be also be used to enable power delivery policies to ensure power is distributed to multiple devices according to specific criteria. For example, the power metering may be used to categorize devices based on the amount of power they received and priority in power delivery may be given to those having received the least power. Power metering may be used to provide tiered delivery services such as "guaranteed power" and "best effort power" which may be billed at separate rates. Power metering may be used to institute and enforce hierarchical power delivery structures and may enable priority devices to demand and receive-more power under certain circumstances or use scenarios.

Power metering may be used to optimize power delivery efficiency and minimize absorption and radiation losses. Information related to the power received by devices may be used by a source in conjunction with information about the power output of the source to identify unfavorable operating environments or frequencies. For example, a source may compare the amount of power which was received by the devices and the amount of power which it transmitted to determine if the transmission losses may be unusually or unacceptably large. Large transmission losses may be due to an unauthorized device receiving power from the source and the source and other devices may initiate frequency hopping of the resonance frequency or other defensive measures to prevent or deter unauthorized use. Large transmission losses may be due to absorption losses for example, and the device and source may tune to alternate resonance frequencies to minimize such losses. Large transmission losses may also indicate the presence of unwanted or unknown objects or materials and the source may turn down or off its power level until the unwanted or unknown object is removed or identified, at which point the source may resume powering remote devices.

The source and device may include authentication capability. Authentication may be used to ensure that only compatible sources and devices are able to transmit and receive power. Authentication may be used to ensure that only authentic devices that are of a specific manufacturer and not clones or devices and sources from other manufacturers, or only devices that are part of a specific subscription or plan, are able to receive power from a source. Authentication may be based on cryptographic request and respond protocols or it may be based on the unique signatures of perturbations of specific devices allowing them to be used and authenticated based on properties similar to physically unclonable functions. Authentication may be performed locally between each source and device with local communication or it may be used with third person authentication methods where the source and device authenticate with communications to a central authority. Authentication protocols may use position information to alert a local source or sources of a genuine device.

The source and device may use frequency hopping techniques to prevent unauthorized use of a wireless power source. The source may continuously adjust or change the resonant frequency of power delivery. The changes in frequency may be performed in a pseudorandom or predetermined manner that is known, reproducible, or communicated to authorized device but difficult to predict. The rate of frequency hopping and the number of various frequencies used may be large and frequent enough to ensure that unauthorized use is difficult or impractical. Frequency hopping may be implemented by tuning the impedance network, tuning any of the driving circuits, using a plurality of resonators tuned or tunable to multiple resonant frequencies, and the like.

The source may have a user notification capability to show the status of the source as to whether it is coupled to a device resonator and transmitting power, if it is in standby mode, or if the source resonator is detuned or perturbed by an external object. The notification capability may include visual, auditory, and vibrational methods. The notification may be as simple as three color lights, one for each state, and optionally a speaker to provide notification in case of an error in operation. Alternatively, the notification capability may involve an interactive display that shows the status of the source and optionally provides instructions on how to fix or solve any errors or problems identified.

As another example, wireless power transfer may be used to improve the safety of electronic explosive detonators. Explosive devices are detonated with an electronic detonator, electric detonator, or shock tube detonator. The electronic detonator utilizes stored electrical energy (usually in a capacitor) to activate the igniter charge, with a low energy trigger signal transmitted conductively or by radio. The electric detonator utilizes a high energy conductive trigger signal to provide both the signal and the energy required to activate the igniter charge. A shock tube sends a controlled explosion through a hollow tube coated with explosive from the generator to the igniter charge. There are safety issues associated with the electric and electronic detonators, as there are cases of stray electromagnetic energy causing unintended activation. Wireless power transfer via sharply resonant magnetic coupling can improve the safety of such systems.

Using the wireless power transfer methods disclosed herein, one can build an electronic detonation system that has no locally stored energy, thus reducing the risk of unintended activation. A wireless power source can be placed in proximity (within a few meters) of the detonator. The detonator can be equipped with a resonant capture coil. The activation energy can be transferred when the wireless power source has been triggered. The triggering of the wireless power source can be initiated by any number of mechanisms: radio, magnetic near field radio, conductive signaling, ultrasonics, laser light. Wireless power transfer based on resonant magnetic coupling also has the benefit of being able to transfer power through materials such as rock, soil, concrete, water, and other dense materials. The use of very high Q coils as receivers and sources, having very narrow band response and sharply tuned to proprietary frequencies, further ensure that the detonator circuits cannot capture stray EMI and activate unintentionally.

The resonator of a wirelessly powered device may be external, or outside of the device, and wired to the battery of the device. The battery of the device may be modified to include appropriate rectification and control circuitry to receive the alternating currents of the device resonator. This can enable configurations with larger external coils, such as might be built into a battery door of a keyboard or mouse, or digital still camera, or even larger coils that are attached to the device but wired back to the battery/converter with ribbon cable. The battery door can be modified to provide interconnection from the external coil to the battery/converter (which will need an exposed contact that can touch the battery door contacts.

Stranded Printed Circuit Board Traces

As described in previous sections, high-Q inductive elements in magnetic resonators may be formed from litz wire conductors. Litz wires are bundles of thinner, insulated wires woven together in specially designed patterns so that the thinner individual wires do not occupy the same radial position within the larger bundle over any significant length. The weave pattern and the use of multiple smaller diameter wires effectively increases the skin depth and decreases the AC resistance of the wire over a range of frequencies.

High-Q inductive elements in magnetic resonators may also be formed from printed circuit board (PCB) traces. Printed circuit board traces may have a variety of attractive features including accurate reproducibility, easy integration, and cost effective mass-production. In this section, we disclose low AC resistance stranded PCB traces, comprising multiple narrower insulated traces, potentially distributed over multiple board layers, that do not maintain fixed positions within the weave pattern, and that may be fabricated using standard fabrication techniques. The AC resistance of these stranded traces may be determined by the number, the size, and the relative spacing of the narrower individual traces in the designed weave pattern, as well as by the number of board layers on which the weave patterns are printed and interconnected. Individual trace insulation may be provided by air, by circuit board materials, by coatings, by flexible sheets, by cured materials, and the like.

In embodiments, stranded trace weave patterns for PCB fabrication may be designed to be easily reproducible and scalable, as well as to achieve high individual trace densities. The achievable trace density may be determined by the narrowness of the individual traces, by the geometry of the weave pattern, and by the need to incorporate other, potentially larger structures or features, such as "vias" for example, in the weave pattern. In embodiments, methods and designs that place all the vias or through-holes used to connect individual traces between multiple layers of a PCB may be preferably placed on the outer perimeters of the multi-trace weave pattern. The outer location of the vias enables easy scaling and replication of the pattern as well as tight and uniform individual trace placement and density since the normally larger feature sized vias are not used within the weave pattern itself, potentially disrupting the uniformity of the pattern and the density of the weave.

As used in the description of this section, the term 'stranded trace' means a conductor formed from a group of multiple smaller or narrower individual traces, trace segments, or wires. In this section we describe techniques for routing individual traces on a multilayer PCB to form stranded traces that have a lower AC resistance than a solid conductor trace of equivalent size would have.

The braiding of the individual traces on the layered PCB board may be accomplished by routing each individual trace of a stranded trace in a specific pattern such that it undulates across and through the various layers of the PCB. The weave pattern of the individual traces may be designed so that all the individual traces in a stranded trace have substantially the same impedance. That is, an alternating current applied to the stranded trace will flow in substantially equal amounts in each of the individual traces. Because the current may be distributed uniformly across the strands, the AC resistance may be reduced. Note that the stranded conductor may be optimally designed for minimized resistance for specific AC frequencies. In embodiments, system trade-offs such as number and size of individual traces, numbers of layers of the PCB, connection complexities, board space, and the like, may be considered to determine the optimum weave pattern and design.

In this section we may discuss examples which utilize a layered PCB board with a specific number of layers. The specific number of layers in an example is used to clarify the methods and designs and should not be considered as limiting. The methods and designs can be extended and scaled to PCBs with more or fewer layers.

In this section we may discuss and describe examples which refer to specific layered PCB technologies or implementations. All of the techniques, methods, algorithms, and implementations described herein may be generic and may be applicable to a wide range of layered printed circuit board technologies and implementations including flex circuit boards and the like.

The method of routing individual traces to form a stranded trace comprises routing individual traces or segments of traces on different layers of a PCB and varying the relative location of each individual trace or segment within the resulting stranded trace. Each individual trace of a stranded trace may alter its position on each PCB layer, or the individual trace may alternate between two or more positions within a pattern on different PCB layers. It may be preferable that each individual trace of a stranded trace undulate through all the various layers of the layered PCB.

In layered PCB technologies, traces may be routed through to different conductor or PCB layers with vias or through-holes. The dimensions of the vias may be larger than the possible minimum dimensions of the individual traces, the minimum spacing between individual traces, or the skin depth of AC currents at the frequencies of interest.

In embodiments, the designed weave patterns and routing methods may be realized by placing the vias on the outside edges or the exterior of the stranded traces or weave patterns. In embodiments, it may be possible to pack the individual traces as closely as feasible given the fabrication constraints on the individual traces and trace spacing and still achieve AC resistance values suitable for high-Q inductive elements.

The methods and designs for forming stranded traces on a PCB may comprise a specific routing of individual conductor traces on each layer and specific routing between each layer of the PCB.

Figure 52B:
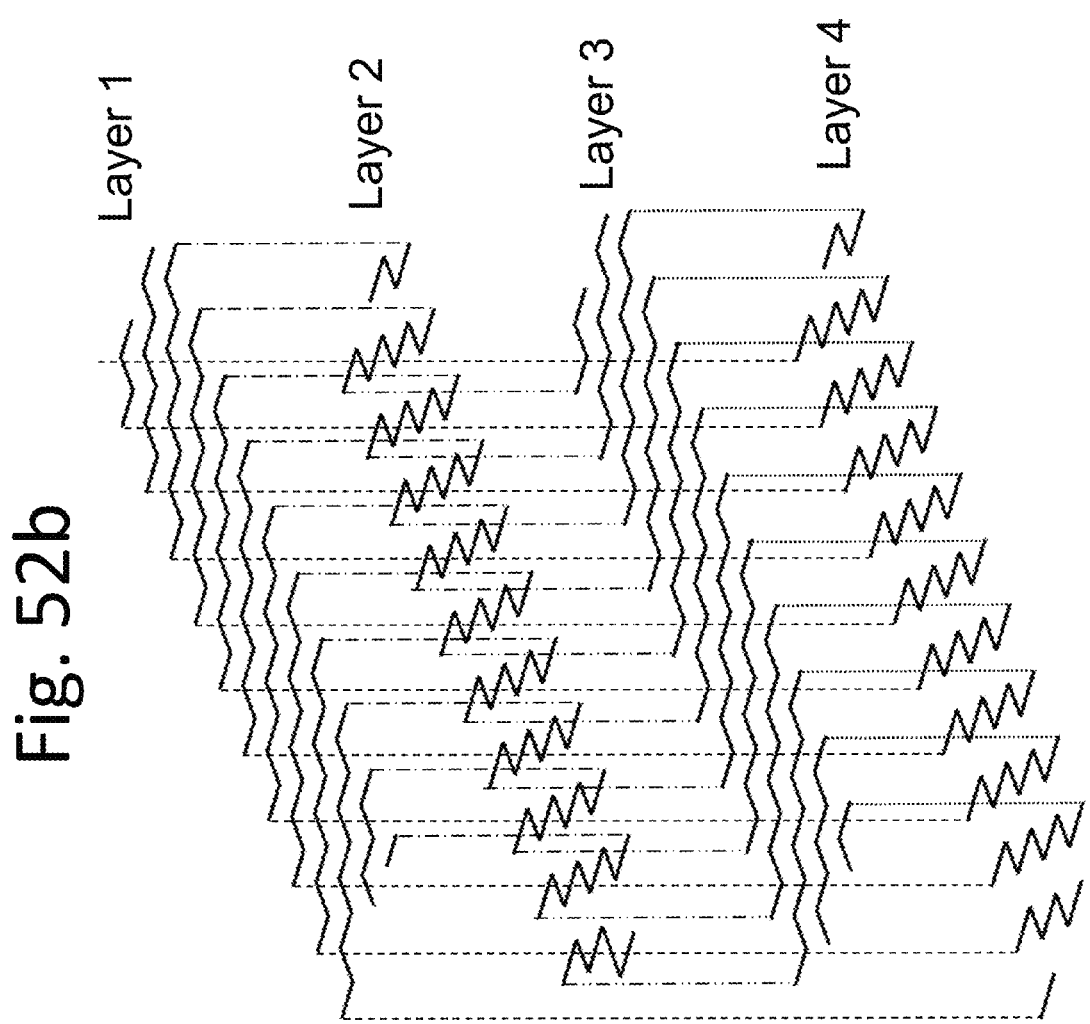
FIG. 52 (a) is a diagram showing routing of individual traces in four layers of a layered PCB (b) is a perspective three dimensional diagram showing routing of individual traces and via connections.

The routing methods and designs may be illustrated and described with an example shown in FIG. 52 which demonstrates some of the main characteristics of the methods and designs. FIG. 52 depicts an exemplary weave pattern for individual traces that may be formed on each layer of a four layer printed circuit board. Connecting the individual traces across the four layers of the board may form a stranded trace comprising seven individual traces. These seven individual traces may be arranged in the pattern shown and may be repeated to the desired length of the stranded trace. The individual traces on each layer are depicted by the black lines in FIG. 52(*a*) and the vias are represented by the black dots on either side of the traces. FIG. 52(*a*) depicts the individual layers of conductors side by side for clarity. In a PCB, the four layers are stacked, one on top of the other, and separated by the insulator layers of the PCB. The vias on the sides of the stranded conductor may be shared through (or across) all of the layers. For this exemplary embodiment, the first bottom via 5201 in FIG. 52 is the same via when the layers are stacked on top of one another. The two numbers next to each via represent the layers with individual traces that are connected by that via. For example, the first bottom via 5201, which is labeled as 4-1 connects the individual trace segments on the fourth conducting layer and the first conducting layer that are connected to that via.

FIG. 52(*b*) shows an isometric three dimensional view of the pattern from FIG. 52(*a*). Individual traces on each layer are depicted with black lines and the connections made by the vias between the layers are depicted with dashed and dotted lines. The four layers of patterns in this example are stacked on top one another. The spacing and scale of the layers, as well as the separation between individual traces on each layer have been exaggerated to improve the clarity of the figure. The vias connect individual trace segments between two layers. In this example, all individual trace segments from each layer traverse the width of the stranded trace and are routed with the vias to an adjacent layer.

A stranded trace may be flanked by rows of vias on both sides of the weave pattern. On each PCB layer, the individual traces may traverse the width of the effective stranded trace. Each individual trace segment may be routed from a via on one side of the stranded trace to a via on the other side of the stranded trace. On each PCB layer, each routed individual trace may be routed from a via that connects that individual trace to an individual trace on another PCB layer. The individual traces may be routed in a manner such that they traverse the width of the effective stranded trace and also traverse a distance with respect to the axis of the stranded trace. The axis of the stranded trace is the virtual line that runs along the length of the stranded trace and is parallel to the rows of vias that flank the stranded trace. The axis of an exemplary stranded trace is illustrated in FIG. 52(*a*) with an arrow 5203.

In embodiments, each individual trace may be routed in effectively a substantially diagonal direction with respect to the axis of the stranded trace. In each conducting layer of the PCB, the individual traces may be routed in substantially the same direction. In the exemplary embodiment of FIGS. 52(*a*), and 52(*b*), all the individual traces of Layer 1 may be routed in a substantially diagonal direction from the vias on one side of the stranded trace to the vias on the other side. At the vias, the individual traces may be routed to another layer of the PCB. All of the individual traces from a layer may be routed to another layer, with a similar, different, translated, reversed and the like, weave pattern at the vias. On the next layer, the individual traces may again be routed, for example, in a substantially diagonal pattern, from the vias on one side of the stranded trace to the vias on the other side of the stranded trace and so on to other layers. This pattern may continue until the individual traces have traversed all or some of the conducting layers of the PCB, whereupon the individual traces may return to the starting conducing layer or an intermediate conducting layer. The individual traces may undulate in such a manner for any number of cycles, depending on the weave pattern, the number of conducting layers in the PCB, the desired length of the stranded trace, and the like. In embodiments, the end points of the stranded traces may be designed to reside of the top and/or bottom layers of the PCBs so they are accessible for easy connection to other circuit elements or conductors.

In embodiments, on each sequential conductor layer, individual traces may be routed in a substantially diagonal direction with respect to the axis of the stranded trace. In embodiments, on each subsequent conductor layer, individual conductor traces may be routed in a substantially orthogonal direction to that of the previous conductor layer. This pattern can be seen in FIG. 52(*a*) and FIG. 52(*b*). The individual traces in Layer 1 are routed in a substantially diagonal direction traversing the stranded trace from left to right in the Figure. In the subsequent layer, Layer 2, the individual traces are routed in a substantially diagonal direction that is substantially orthogonal to the conductor traces of Layer 1, and are routed from right to left of the stranded trace.

Figure 53B:
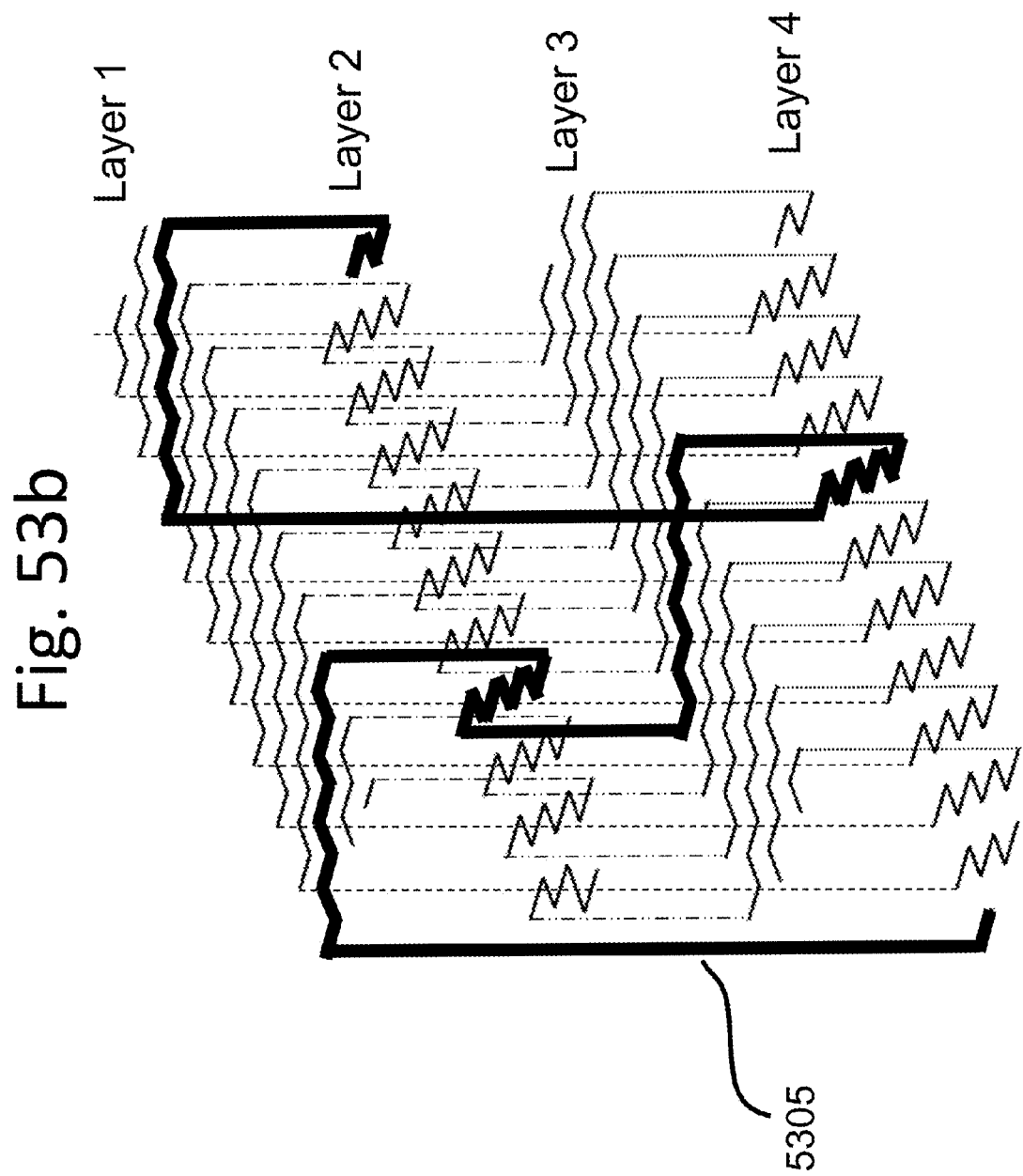
FIG. 53 (a) is a diagram showing routing of individual traces in four layers of a layered PCB with one of the individual traces highlighted to show its path through the layer, (b) is a perspective three dimensional diagram showing routing of conductor traces and via connection with one of the conductor traces highlighted to show its path through the layers for the stranded trace.

The routing or path of one individual conductor trace through the various conductor layers may be more easily distinguishable in FIG. 53(*a*), where the path of one of the individual traces is highlighted by a dotted black line. Starting with the bottom via 5201, that connects Layer 4 and Layer 1, the individual trace is routed from the left side of the stranded trace to a via on the right side that connects Layer 1 and Layer 2. In this exemplary embodiment, all the individual traces on Layer 1 are routed from vias that connect Layer 4 and Layer 1 and a via that connects Layer 1 and Layer 2. The individual trace is routed to Layer 2 by the via and routed right to left in Layer 2 to a via that connects Layers 2 and 3. On Layer 2 the individual trace is routed to a via that connects Layers 3 and 4. On Layer 4 the individual trace is routed to a via that connects Layers 4 and 1, bringing the individual trace back to the first layer. The pattern can be repeated as many times as required for a specific length of the stranded trace.

An isometric view of the routing or path of one individual conductor trace through the conductor layers of one example embodiment is depicted in FIG. 53(*b*). The path of one of the individual traces is highlighted by a thick black line. The individual trace traverses the width of the stranded trace on each layer from one via on one side of the stranded trace to a via on the other side of the stranded trace. The individual trace is routed to other layers by the vias. After traversing all of the four layers the individual trace returns to the starting layer and the pattern continues.

Figure 54:
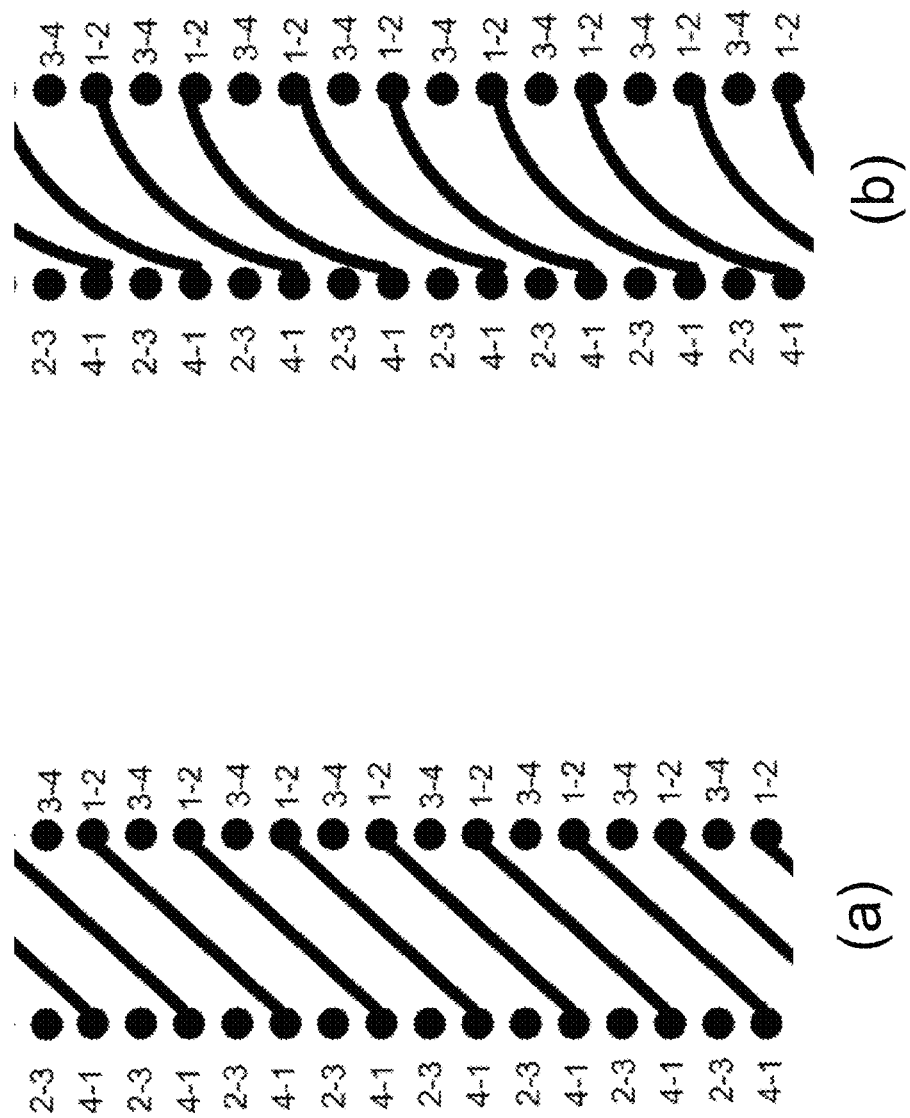
FIGS. 54(*a*) and 54(*b*) is a diagram showing examples of alternative routing of individual traces.

While the example routing patterns shown in FIG. 52 and FIG. 53 feature 90 degree angles in the individual traces that form the weave pattern, and is based on a rectilinear routing pattern for the individual traces, various other weave and routing patterns may be used. In exemplary embodiments, other weave and routing patterns may yield individual trace patterns that may be along substantially diagonal directions with respect to the axis of the stranded trace. For example, the individual traces may bend at shallower angles (such as 45 degrees) to help reduce the gap between traces. In some embodiments, it may be advantageous to make each individual trace a slanted straight line connected directly between two vias. In other embodiments, various curves of the individual traces may be used when the stranded trace does not follow a straight line path along the circuit board, but turns or loops in a direction, for example. Several alternative exemplary diagonal weave and routing patterns for individual traces are shown in FIG. 54, but many other patterns can be derived. In some applications some of the diagonal routing methods may be preferable. For example, for the routing shown in FIG. 54(*a*), the individual traces are straight lines which may be preferable because it may result in the shortest overall conductor length while maintaining consistent spacing between adjacent individual traces. In embodiments, the weave pattern may differ between some or all of the conductor layers in a PCB. For the exemplary stranded trace shown in FIG. 52, the weave pattern on the even layers differs from the weave pattern on the odd layers. In the exemplary stranded trace shown in FIG. 52 the individual traces are routed a distance of four vias in the direction of the axis of the stranded trace in the odd layers while only a distance of three vias in the even layers.

As exemplified in FIG. 52, the scheme of the present invention concentrates the vias on either side of the array or group of individual traces. Thus, the vias (which may have larger minimum feature sizes than traces and gaps between traces) do not take up space within or between the individual traces. This arrangement of the vias may lead to a higher overall density of traces and therefore to a lower AC resistance per cross-sectional area.

The exemplary routed structures described above can be generalized for stranded traces that comprise a various number of conducting layers of a layered PCB as well as various numbers of individual traces. The general characteristics of the routing method may be characterized by an integer N, representing the number of conductor layers, and an integer M, representing the number of individual conductor traces that make up the stranded trace.

For the designs and methods disclosed here, it may be preferable to have an even number of conductor layers. For some specific weave and routing patterns vias that connect traces on two layers may be used. A stranded trace with N conductor layers should have N types of vias connecting the different layers if each via connects only two layers. Each type of via is distinguished or differentiated by the layers that it connects. If each via connects only two layers, for an individual conductor to traverse all of the N layers of a PCB board, there should be N types of vias in the stranded trace. Preferably, there may be N/2 types of vias on either side of the stranded trace, arranged in a fixed repeating order. In the exemplary pattern shown in FIG. 52, of the four types of vias, two types of vias, those that connect Layers 4 and 1 and Layers 2 and 3 are located only on one side of the stranded trace while the other two types of vias, those that connect Layers 1 and 2 and Layers 3 and 4 are located on the other side of the stranded trace. On each layer, an individual trace may preferably be routed in a substantially diagonal direction with respect to the axis of the stranded trace such that it has a displacement of a distance equivalent to at least N/2 vias. All individual conducting traces on a layer may have the same displacement in the axis of the stranded trace.

The number of individual traces that make make-up a stranded trace may be at least partially determined by the total displacement, sometimes characterized by the number of vias that are passed by, that an individual trace makes after traveling through all the conductor layers of a PCB. If the displacement, after all the layers have been traversed, is D vias, then the stranded trace may be comprised of up to D/(N/2) individual traces. This relationship can be seen in the example in FIG. 53. The individual trace represented by the dotted line is displaced a distance equivalent to 14 vias along the axis of the stranded trace after traversing through all of the conductor layers. Since the example had N=4 layers, the total number of individual conductors that make up the stranded conductor is M=14/2=7.

A stranded trace can be optimized by considering the number of individual traces included in the strand. The larger the number of individual traces, the longer each individual trace spends on any one layer which may reduce the effectiveness of the weaving pattern on reducing skin/proximity effects.

If the number of individual traces and the number of conductor layers are chosen appropriately, it may be possible to ensure that each individual trace will be displaced the same distance in each layer along the axis of the stranded conductor. A sufficient condition for this to occur is to choose M(N/2) such that it is divisible by N and to choose M such that (M/2)mod(N/2) and N/2 are co-prime where "mod" is the modulo operation.

Figure 55:
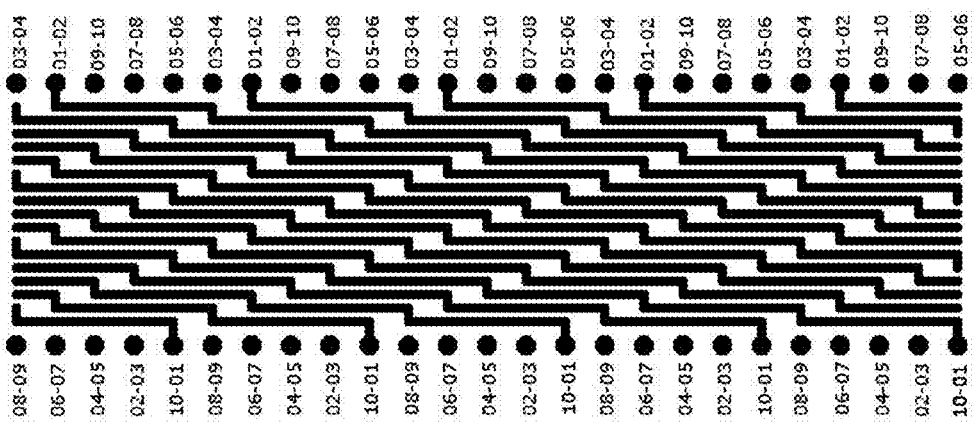
FIG. 55 is a diagram showing routing of individual traces in one layer of a PCB.

FIG. 55 shows another example of a partial pattern of weaved individual traces of the proposed methods. The Figure depicts the individual traces of the first layer of a ten layer stranded trace design. The ten layer stranded trace consists of 136 separate conductors. The parameters of the stranded trace may allow complete symmetry in all ten layers of the stranded conductor. Each conductor layer pattern may be a translated mirror image of the previous layer. That is, the pattern of traces on odd-numbered layers may be the same pattern as the first layer translated in such a way that the ends of the individual trace segments are connected to the correct vias. The patterns for the even-numbered layers can be recovered by reflection symmetry and similar translations for this example.

Figure 56:
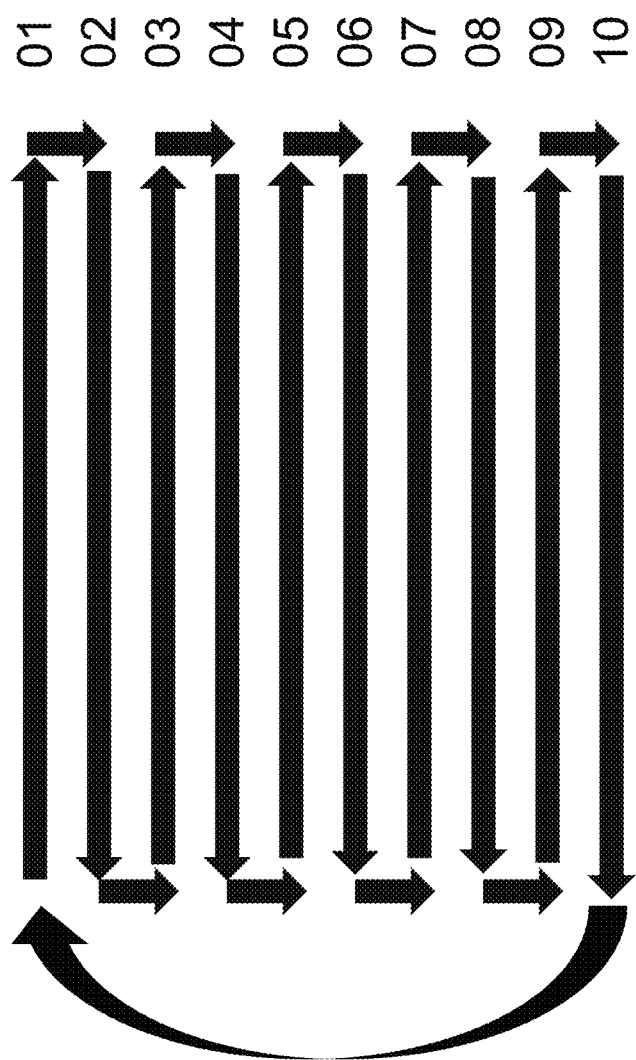
FIG. 56 is a diagram showing routing direction between conducting layers of a PCB.

FIG. 56 is a cross-sectional view representing the conducting layers of a multi-layered PCB. The individual trace segments on each layer (not visible), and therefore the currents they conduct, may flow primarily into the page but they have an additional sideways displacement along each layer, as indicated by the horizontal arrows in the figure. This horizontal displacement enables each trace to move from one side of the weave pattern on a given layer to the opposite side of the weave pattern. Once an individual trace segment reaches the edge of the weave pattern on a particular layer, it is connected by a via (indicated by vertical arrows) to another trace segment on the next layer of the board and makes its way back across the weave pattern in the opposite direction. This pattern repeats itself so that each individual trace spends an approximately equal amount of time at each position along the cross-section of the weave pattern. Alternatively, the individual traces may be routed between the layers in a non-sequential manner. Any permutation of the order of layers may be used. It may be preferable that each individual trace follow the same order or permutation of layers in a strand of traces. Note that the pattern may be continued by connecting trace segments on the bottom layer to trace segments on the top layer, or by routing the traces up and down following the alternate permutations described above.

Preferably, the cross-sectional dimensions of the individual traces that make up the stranded trace on a PCB are small enough (preferably smaller than one skin-depth $\delta = \sqrt{2/\omega\mu_r\mu_0\sigma}$) that they render the losses induced by one individual trace or segment on its neighbors small compared to the losses of an isolated individual trace or segment (which for an individual trace smaller than a skin-depth will be close to the direct current (DC) losses). The braiding of the strands helps to ensure that all the strands may have substantially the same impedance, so that if the same voltage is applied across the bundled strands (i.e., the strands are driven in parallel), the strands may individually conduct substantially the same current. Because the AC current may be distributed uniformly across the strands, the AC resistance may be minimized further.

Figure 58:
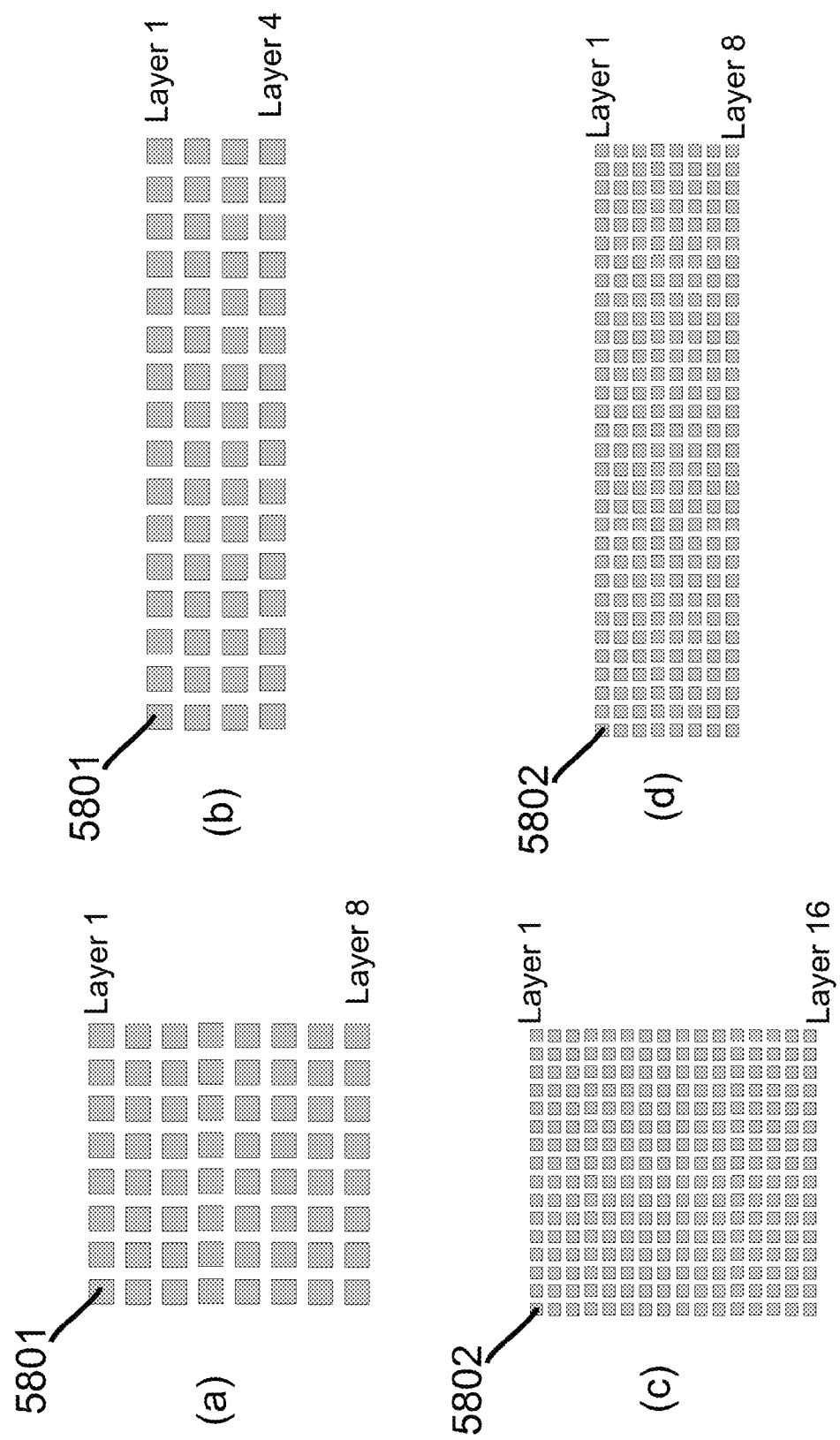
FIGS. 58(*a*)-(*d*) are diagrams of cross sections of stranded traces with various feature sizes and aspect ratios.

As an illustration of the above, finite element analysis simulations were performed on stranded traces made of individual copper traces of square cross-section, driven at 250 kHz. The simulations were performed on stranded traces that have varying aspect ratios as well different dimensions of the individual conductors. The cross sections of the stranded traces, showing the cross-section of the individual traces in gray are shown in FIG. 58. At this frequency, the skin depth of pure copper is ~131 μm. If we arrange individual traces that are 152 μm×152 μm in cross-section 5801 (a little larger than one skin depth) into a square array of 8 layers such that the gap between nearest traces both along and between the layers is 76 μm as in FIG. 58(a), we find that the resistance per meter of a stranded trace conductor braided similarly to the pattern in FIG. 52 may be 18.7 mΩ/m, which is 64% higher than the DC resistance per length of this structure, 11.4 mΩ/m. By contrast, the resistance per length of this structure if the traces are not braided, or all parallel to the axis of the stranded trace is 31.2 mΩ/m, nearly 3 times the DC value.

If we make the individual traces of the stranded trace 76 μm×76 μm in cross section 5802 and arrange them into a square array of 16 layers such that the gap between traces is 38 μm as in FIG. 58(b) (the overall cross-section being thus essentially unchanged from the previous example), we find that the AC resistance of a braided structure may be 13.2 mΩ/m, about 16% higher than the DC value.

In the case where the cross-sectional dimensions of the traces cannot be made much smaller than the skin-depth (e.g., because of limitations in manufacturing), the proximity losses may be reduced by increasing the aspect ratio of the individual traces. The aspect ratio in this context is the effective width of the stranded conductor on a single trace divided by the thickness of the stack of conducting and insulating layers that make up the stranded trace. In some cases, the thickness of the stranded trace is given roughly by the thickness of the PCB. Simulations show that if the aspect ratio of the strand of 152 μm×152 μm traces described above is changed so that there are twice as many trace segments on each layer, but half as many layers as depicted in FIG. 58(c), the AC resistance at 250 kHz may be reduced from 18.7 mΩ/m to 16.0 mΩ/m. For the structure with 76 μm×76 μm traces, again keeping the number of individual conductors the same, but reducing the thickness of the structure by a factor of two as depicted in FIG. 58(d) lowers the AC resistance from 13.2 mΩ/m to 12.6 mΩ/m. The DC resistance per length in both cases is 11.4 mΩ/m. In embodiments, the preferable aspect ratio of the stranded trace may be application dependent. In embodiments, a variety of factors may be considered in determining the best weave patterns for specific high-Q inductive element designs.

A benefit of the proposed approach is that the vias used in the stranded traces may perforate the board completely. That is, there is no need for partial vias or buried vias. Using vias that perforate the board completely may simplify the manufacturing process. For example, several boards can be stacked together and perforated at the same time. Partial vias, or vias that go through only a few consecutive layers of a PCB typically require perforation prior to assembly of the individual layers. Likewise, buried vias, or vias that connect or go through some internal layers of a PCB require perforation and preparation prior to assembly of the outer layers of the PCB during manufacturing.

Figure 57:
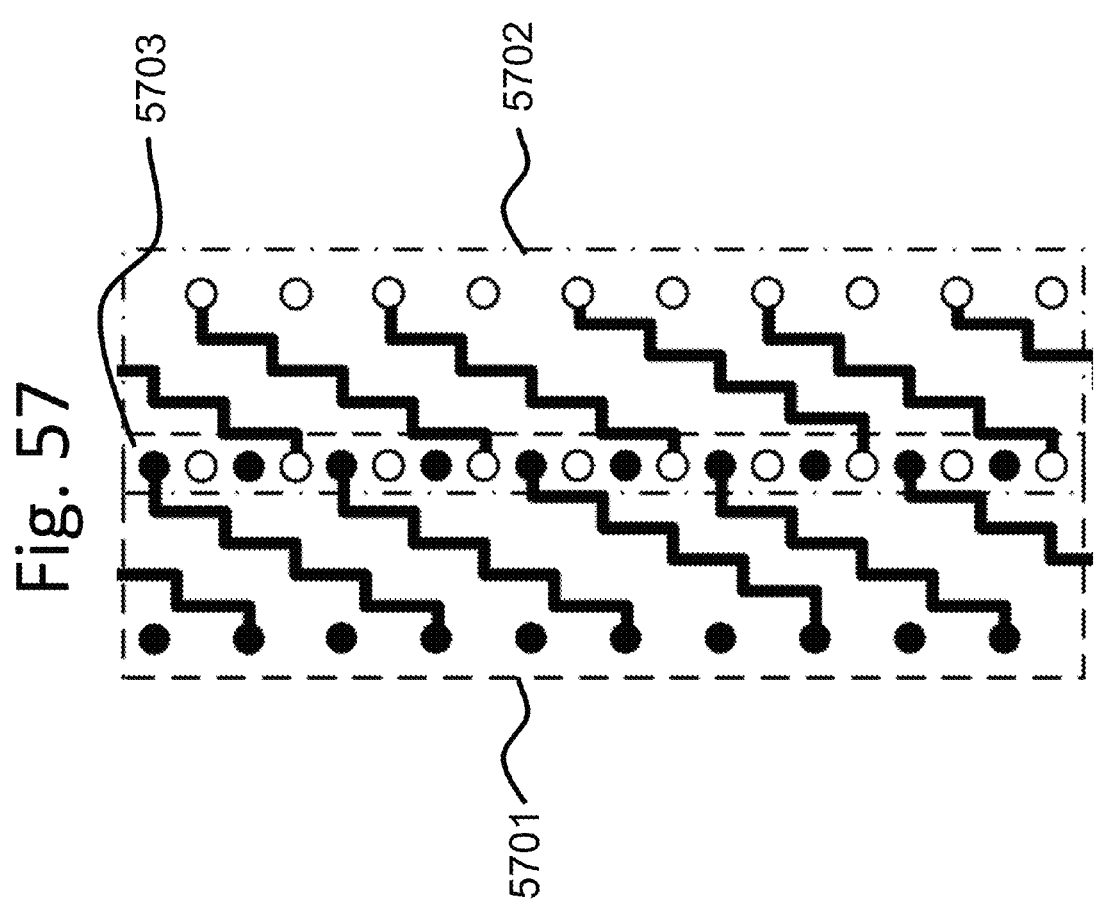
FIG. 57 is a diagram showing sharing of via space of two stranded traces routed next to each other.

Another benefit of the methods and designs described herein is that the location of vias at the outer edges of the weave pattern may allow for smaller separations between multi-turn or higher density stranded trace patterns. When two stranded traces run near each other on a PCB, or when a single stranded trace is shaped, patterned, folded, turned, and/or routed so that different sections of the stranded trace run near each other on the PCB, the separation between these traces may be reduced by reusing or interspacing the nearby vias. For example, FIG. 57 shows the top layer of a PCB with two stranded traces 5701, 5702 that share the same row of vias wherein, for clarity, the vias of the right stranded trace 5702 are depicted as white filled circles while the vias of the left stranded trace 5701 are depicted as black circles. The vias 5703 between the two stranded traces 5701, 5702, are all in the same row and there is substantially no spacing between the two stranded traces. With the use of buried or blind vias, which individually do not traverse or go through the whole thickness or all the layers of a PCB may be stacked on top of each other and the density of the routing of the individual conductor traces can be further increased since the spacing between the vias may not need to be increased to accommodate the vias of an adjacent stranded trace.

It will be clear to those skilled in the art that many changes and modifications can be made to the examples shown within the spirit of the invention. For example, although through vias which perforate the PCB may be used with the methods, blind vias or buried vias may also be used. It may be possible to have more than one via stacked on top of another, and one via location may be used to connect more than two sets of conductor layers together which may be used to increase the density of the conductor traces in the stranded trace. Likewise, although examples use vias that connected only two board (conductor) layers together, the routing method may be modified such that each conductor trace is routed on multiple layers simultaneously. Other modification in the spirit of the proposed methods may include routing individual conductor traces from one via to multiple vias, routing from multiple vias to one via on each layer, using multiple conductor traces to route from one via to another on each conductor layer, or any combination thereof.

In some embodiments it may be beneficial to misalign the conductor traces between the layers to ensure that the traces all present substantially the same impedance.

The stranded traces may be useful in a large diverse set of applications and may serve as a substitute in any application that typically used traditional braided litz wire. The stranded trace may be routed in a loop or loops of various shapes and dimensions to create a coil that may be used in magnetic field power transfer systems such as traditional induction based power transfer systems or near-field magnetic resonance power transfer systems. In some embodiments and applications where the stranded trace may be used as part of a resonator, the trace dimensions, aspect ratio, routing pattern, and the like may be chosen and optimized to maximize the Q of the resonator. In embodiments, the resonant frequency of the high-Q resonator may be chosen to take advantage of specific weave patterns and/or stranded trace designs.

In embodiments, the PCB stranded trace loops may be routed such that a core of magnetic material may be placed in the middle of the loop to create a cored loop. The PCB may have a number of cutouts, channels, pockets, mounts, or holes to accommodate a core.

In embodiments, the PCB of the stranded trace may further be used to carry and integrate other electronics or electronic components. Electronics to power or drive a resonator formed by the stranded trace may be located on the same PCB as the traces.

Adjustable Source Size

The efficiency of wireless power transfer methods decreases with the separation distance between a source and a device. The efficiency of wireless power transfer at certain separations between the source and device resonators may be improved with a source that has an adjustable size. The inventors have discovered that the efficiency of wireless power transfer at fixed separations can be optimized by adjusting the relative size of the source and device resonators. For a fixed size and geometry of a device resonator, a source resonator may be sized to optimize the efficiency of wireless power transfer at a certain separations, positions, and/or orientations. When the source and device resonators are close to each other, power transfer efficiency may be optimized when the characteristic sizes or the effective sizes of the resonators are similar. At larger separations, the power transfer efficiency may be optimized by increasing the effective size of the source resonator relative to the device resonator. The source may be configured to change or adjust the source resonator size as a device moves closer or further away from the source, so as to optimize the power transfer efficiency or to achieve a certain desired power transfer efficiency.

In examples in this section we may describe wireless power transfer systems and methods for which only the source has an adjustable size. It is to be understood that the device may also be of an adjustable size and achieve many of the same benefits. In some systems both the source and the device may be of an adjustable size, or in other systems only the source, or only the device may be of an adjustable size. Systems with only the source being of an adjustable size may be more practical in certain situations. In many practical designs the device size may be fixed or constrained, such as by the physical dimensions of the device into which the device resonator must be integrated, by cost, by weight, and the like, making an adjustable size device resonator impractical or more difficult to implement. It should be apparent to those skilled in the art, however, that the techniques described herein can be used in systems with an adjustable size device, an adjustable size source, or both.

In this section we may refer to the "effective size" of the resonator rather than the "physical size" of the resonator. The physical size of the resonator may be quantified by the characteristic size of the resonator (the radius of the smallest circle than encompasses an effectively 2-D resonator, for example). The effective size refers to the size or extent of the surface area circumscribed by the current-carrying inductive element in the resonator structure. If the inductive element comprises a series of concentric loops with decreasing radii, connected to each other by a collection of switches, for example, the physical size of the resonator may be given by the radius of the largest loop in the structure, while the effective size of the resonator will be determined by the radius of the largest loop that is "switched into" the inductor and is carrying current.

In some embodiments, the effective size of the resonator may be smaller than the physical size of the resonator, for example, when a small part of the conductor comprising the resonator is energized. Likewise, the effective size of the resonator may be larger than the physical size of the resonator. For example, as described below in one of the embodiments of the invention, when multiple individual resonators with given physical sizes are arranged to create a resonator array, grid, multi-element pattern, and the like, the effective size of the resonator array may be larger than the physical size of any of the individual resonators.

Figure 59:
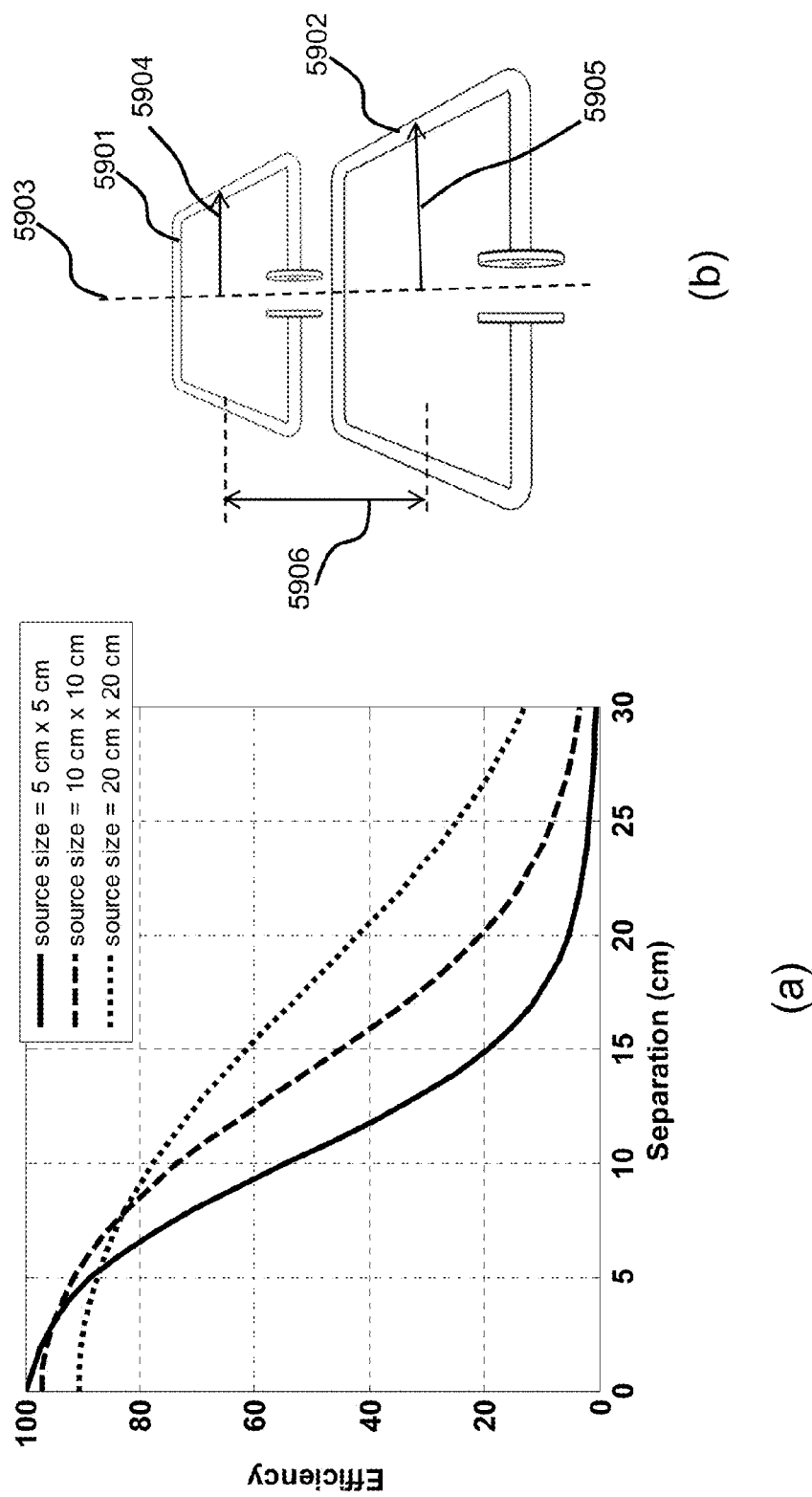
FIG. 59(*a*) is a plot of wireless power transfer efficiency between a fixed size device resonator and different sized source resonators as a function of separation distance and (*b*) is a diagram of the resonator configuration used for generating the plot.

The relationship between wireless power transfer efficiency and source-device resonator separation is shown in FIG. 59(a). The plot in FIG. 59(a) shows the wireless power transfer efficiency for the configuration shown in FIG. 59(b) where the source 5902 and device 5901 capacitively loaded conductor loop resonators are on axis 5903 (centered) and parallel to each other. The plot is shown for a fixed size 5 cm by 5 cm device resonator 5901 and three different size source resonators 5902, 5 cm×5 cm, 10 cm×10 cm and 20 cm×20 cm for a range of separation distances 5906. Note that the efficiency of wireless power transfer at different separations may depend on the relative sizes of the source and device resonators. That is, the size of the source resonator that results in the most efficient wireless power transfer may be different for different separations between the source and the device resonators. For the configuration captured by the plot in FIG. 59(a), for example, at smaller separations the efficiency is highest when the source and device resonators are sized to be substantially equal. For larger separations, the efficiency of wireless power transfer is highest when the source resonator is substantially larger than the device resonator.

The inventors have discovered that for wireless power transfer systems in which the separation between the source and device resonators changes, there may be a benefit to a source that can be configured to have various effective resonator sizes. As a device is brought closer to or further away from the source, the source resonator may change its effective resonator size to optimize the power transfer efficiency or to operate in a range of desired transfer efficiencies. Such adjustment of the effective resonator size may be manual or automatic and may be part of the overall system control, tracking, operating, stabilization and optimization architectures.

A wireless power transfer system with an adjustable source size may also be beneficial when all devices that are to be powered by the source do not have similarly sized device resonators. At a fixed separation between a source and a device, devices with two different sizes of device resonators may realize maximum transfer efficiency for different sized source resonators. Then, depending on the charging protocols and the device power requirements and hierarchies, the source may alter its size to preferentially charge or power one of the devices, a class of devices, all of the devices, and the like.

Furthermore, an additional benefit from an adjustable size source may be obtained when a single source may be required to simultaneously power multiple devices. As more devices require power, the spatial location or the area circumscribed by the source resonator or the active area of the source resonator may need to change. For example, if multiple devices are positioned in an area but are separated from each other, the source may need to be enlarged in order to energize the larger area that includes all the multiple devices. As the number of devices requiring power changes, or their spatial distribution and locations change with respect to the source, an adjustable size source may change its size to change the characteristics and the spatial distribution of the magnetic fields around the source. For example, when a source is required to transfer power to a single device, a relatively smaller source size with the appropriate spatial distribution of the magnetic field may be used to achieve the desired wireless power transfer efficiency. When the source is required to transfer power to multiple devices, a larger source size or a source with a different spatial distribution of the magnetic field may be beneficial since the devices may be in multiple locations around the source. As the number of devices that require power changes, or their distributions or power requirements change, an adjustable size source may change its size to adjust, maximize, optimize, exceed, or meet its operating parameters and specifications.

Figure 60:
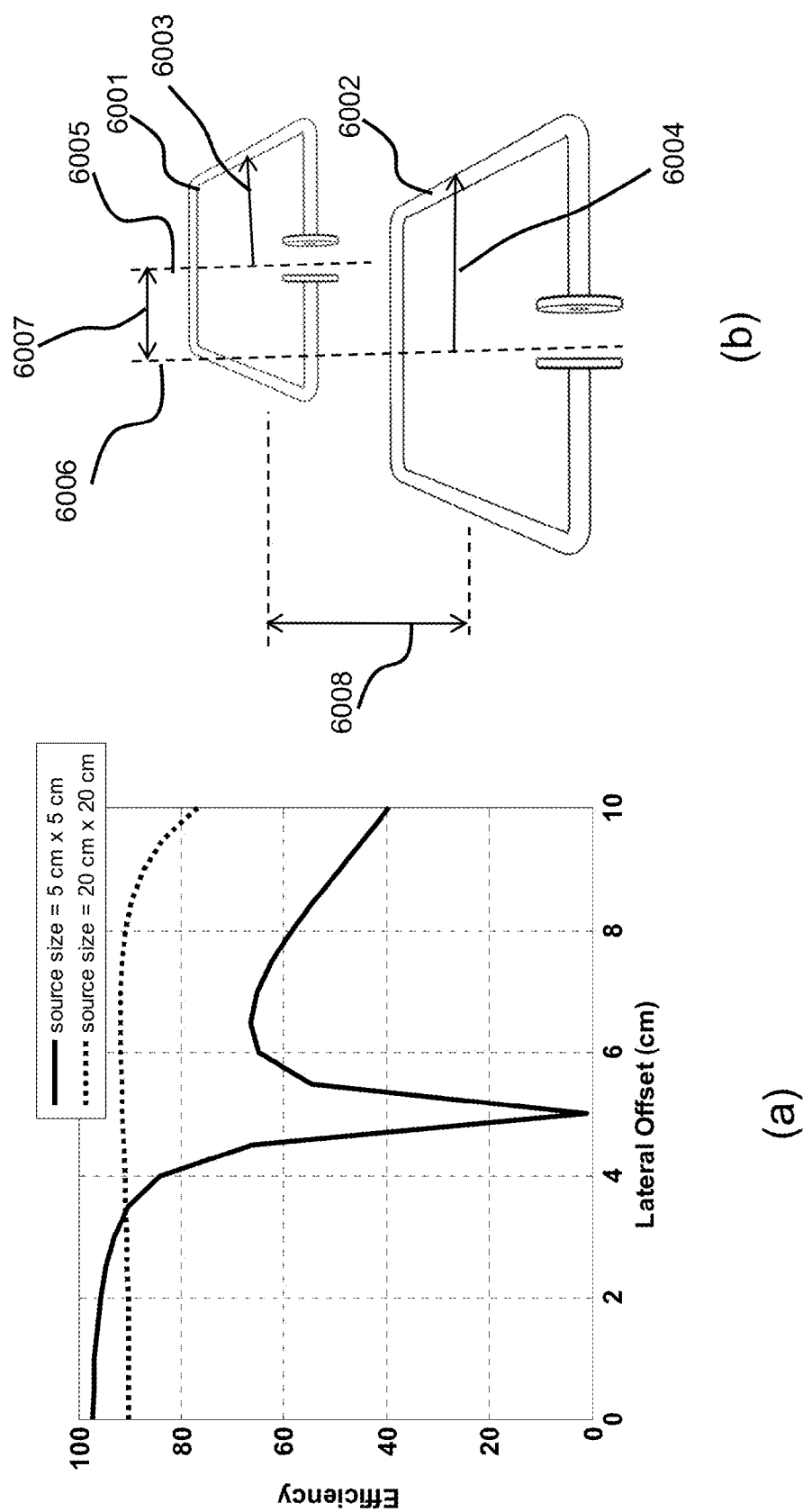
FIG. 60(*a*) is a plot of wireless power transfer efficiency between a fixed size device resonator and different sized source resonators as a function of lateral offset and (*b*) is a diagram of the resonator configuration used for generating the plot.

Another possible benefit of an adjustable source size may be in reducing power transfer inefficiencies associated with uncertainty or variability of the location of a device with respect to the source. For example, a device with a certain lateral displacement relative to the source may experience reduced power transfer efficiencies. The plot in FIG. 60(a) shows the wireless power transfer efficiency for the configuration shown in FIG. 60(b) where the source 6002 and device 6001 capacitively loaded conductor loop resonators are parallel to each other but have a lateral offset 6008 between their center axes 6006, 6005. The plot in FIG. 60(a) shows power transfer efficiency for a 5 cm×5 cm device resonator 6001 separated from a parallel oriented 5 cm×5 cm source resonator 6002 (bold line) or a 20 cm×20 cm source resonator 6002 (dotted line) by 2 cm 6008. Note that at a lateral offset 6007 of approximately 5 cm from the 5 cm×5 cm source resonator (from the center of the device resonator to the center of the source resonator), there is a "dead spot" in the power transfer efficiency. That is, the transfer efficiency is minimized or approaches zero at a particular source-device offset. The dashed line in FIG. 60(a) shows that the wireless power transfer efficiency for the same device at the same separation and same lateral offset but with the source size adjusted to 20 cm by 20 cm may be greater than 90%. The adjustment of the source size from 5 cm×5 cm to 20 cm×20 cm moves the location of the "dead spot" from a lateral offset of approximately 5 cm to a lateral offset of greater than 10 cm. In this example, adjusting the source size increases the wireless power transfer efficiency from almost zero to greater than 90%. Note that the 20 cm×20 cm source is less efficient transferring power to the 5 cm×5 cm device resonator when the two resonators are on axis, or centered, or are laterally offset by less than approximately 2 to 3 cm. In embodiments, a change in source size may be used to move the location of a charging or powering dead spot, or transfer efficiency minimum, allowing greater positioning flexibility for and/or higher coupling efficiency to, a device.

Figure 61:
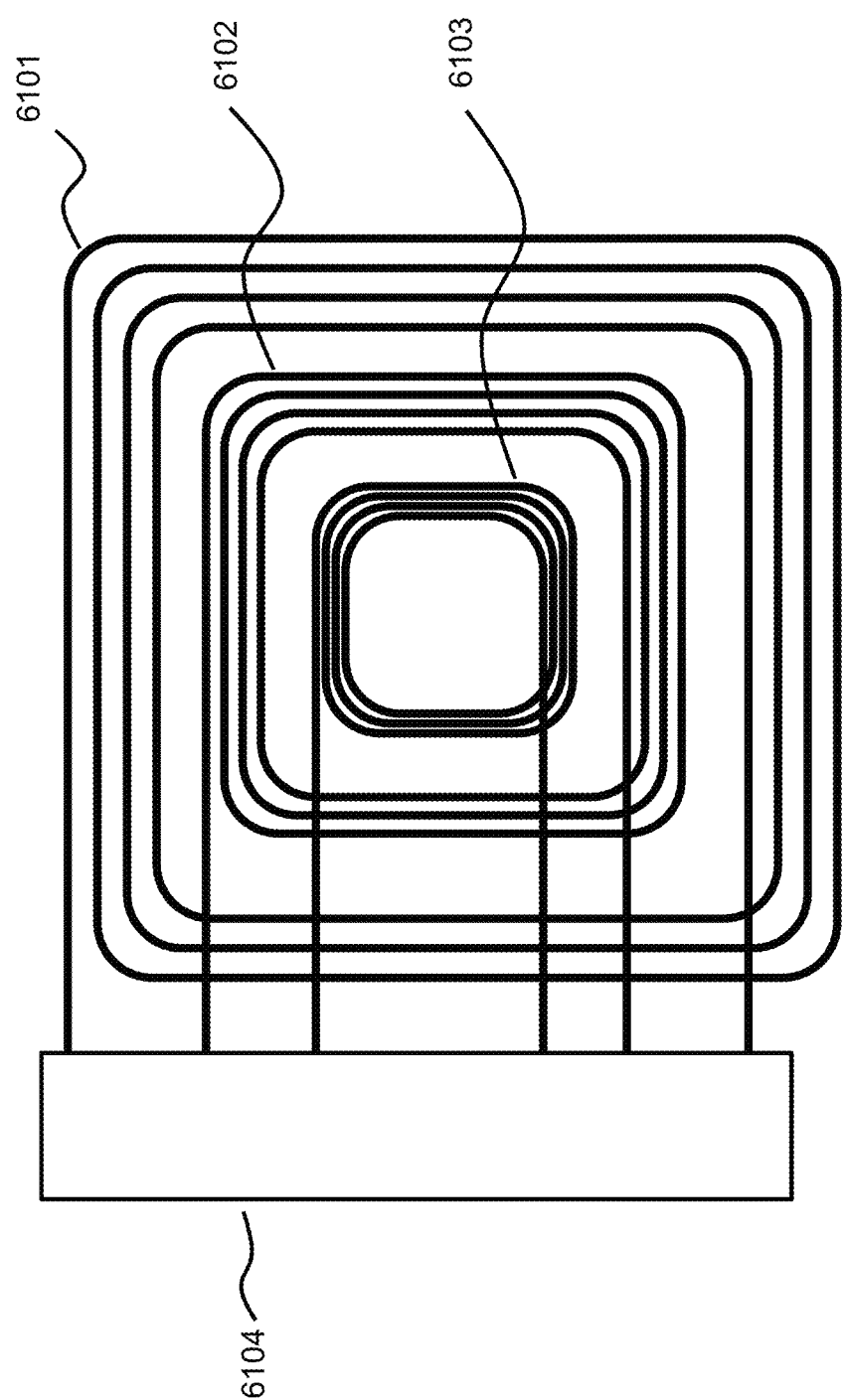
FIG. 61 is a diagram of a conductor arrangement of an exemplary system embodiment.

In some embodiments, a source with an adjustable size may be implemented as a bank of resonators of various sizes that are selectively driven by a power source or by power and control circuitry. Based on predetermined requirements, calculated requirements, from information from a monitoring, sensing or feedback signal, communication, and the like, an appropriately sized source resonator may be driven by a power source and/or by power and control circuitry and that size may be adjusted as the requirements or distances between the source and the device resonators change. A possible arrangement of a bank of differently sized resonators is shown in FIG. 61 which depicts a bank of three differently sized resonators. In the example of FIG. 61, the three resonators 6101, 6102, 6103 are arranged concentrically and coupled to power and control circuitry 6104. The bank of resonators may have other configurations and arrangements. The different resonators may be placed side by side as in FIG. 62, arranged in an array, and the like.

Figure 62:
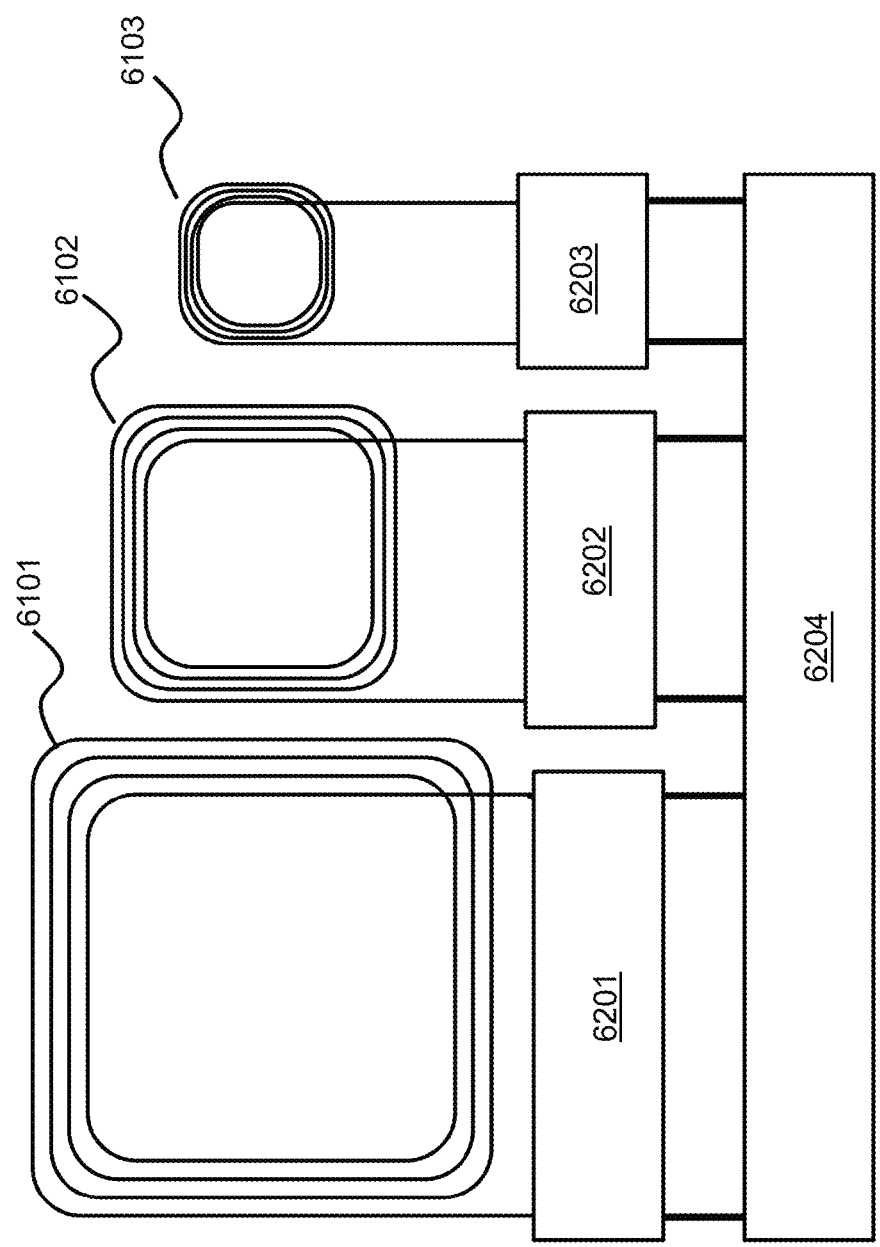
FIG. 62 is a diagram of another conductor arrangement of an exemplary system embodiment.

Each resonator in a multi-size resonator bank may have its own power and control circuitry, or they each may be switched in and selectively connected to one or more power and control circuits by switches, relays, transistors, and the like. In some systems, each of the resonators may be coupled to power and control circuitry inductively. In other systems, each of the resonators may be coupled to power and control circuitry through additional networks of electronic components. A three resonator configuration with additional circuitry 6201, 6202, 6203 is shown in FIG. 62. In some systems, the additional circuitry 6201, 6202, 6203 may be used for impedance matching between each of the resonators 6101, 6102, 6103 and the power and control circuitry 6204. In some systems it may be advantageous to make each of the resonators and its respective additional circuitry have the same effective impedance as seen from the power and control circuitry. It some embodiments the effective impedance of each resonator and additional impedance matching network may be matched to the characteristic impedance of the power source or the power and control circuitry. The same effective impedance for all of the resonators may make switching between resonators in a resonator bank easier, more efficient, or quicker and may require less tuning or tunable components in the power and control circuitry.

In some embodiments of the system with a bank of multi-sized resonators, the additional circuitry 6201, 6202, 6203 may also include additional transistors, switches, relays, and the like, which disable, deactivate, or detune a resonator when not driven or powered by the power and control circuitry. In some embodiments of the system, not all of the resonators in a resonator bank of a source may be powered or driven simultaneously. It such embodiments of the system, it may be desirable to disable, or detune the non-active resonators to reduce energy losses in power transfer due to energy absorption by the unpowered resonators of the source. The unpowered resonators of the source may be deactivated or detuned from the resonant frequency of the other resonators by open circuiting, disrupting, grounding, or cutting the conductor of the resonator. Transistors, switches, relays and the like may be used to selectively open or close electrical paths in the conductor part of a resonator. An unpowered resonator may be likewise detuned or deactivated by removing or adding capacitance or inductance to the resonator with switches, transistors, relays, and the like. In some embodiments, the natural state of individual resonators may be to be detuned from the system operating frequency and to use signals or power from the drive signal to appropriately tune the resonator as it is activated in the bank.

In some embodiments of a system of a source with a bank of multi-sized resonators, multiple resonators may be driven by one or more power and control circuits simultaneously. In some embodiments of the system powered resonators may be driven out of phase to extend or direct the wireless power transfer. Constructive and destructive interference between the oscillating magnetic fields of multiple resonators driven in-phase or out of phase or at any relative phase or phases may be used to create specific "hotspots" or areas of concentrated magnetic energy. In embodiments, the position of these hotspots may be variable and may be moved around to achieve the desired wireless power transfer efficiencies to devices that are moving around or to address devices at different locations, orientations, and the like. In embodiments, the multi-sized source resonator may be adjusted to implement a power distribution and/or sharing algorithm and/or protocol.

In some embodiments of a bank of multi-sized resonators, the resonators may all have substantially similar parameters and characteristics despite the differences in their size. For example, the resonators may all have similar impedance, resonant frequency, quality factor, wire gauge, winding spacing, number of turns, power levels, and the like. The properties and characteristics of the resonators may be within 20% of their values.

In other embodiments of a bank of multi-sized resonators, the resonators may have non-identical parameters and characteristics tailored or optimized for the size of each resonator. For example, in some embodiments the number of turns of a conductor for the larger resonator may be less than for the smallest resonator. Likewise, since the larger resonator may be intended for powering devices that are at a distance from the resonator, the unloaded impedance of the large resonator may be different than that of the small resonator that is intended for powering devices that are closer to the resonator to compensate for the differences in effective loading on the respective resonators due to the differences in separation. In other embodiments, the resonators may have different or variable Q's, they may have different shapes and thicknesses, they may be composed of different inductive and capacitive elements and different conducting materials. In embodiments, the variable source may be custom designed for a specific application.

Figure 63:
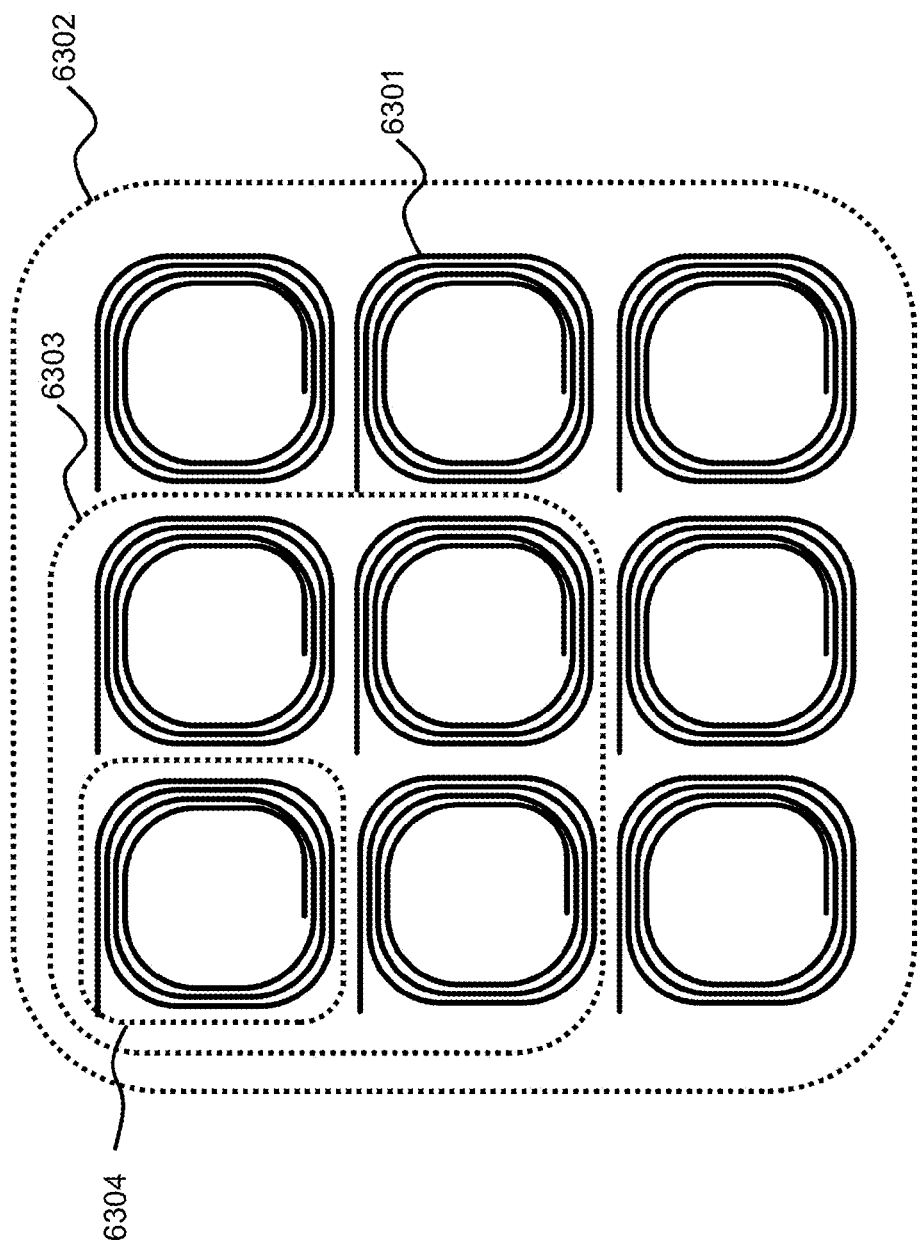
FIG. 63 is a diagram of an exemplary system embodiment of a source comprising an array of equally sized resonators.

In other embodiments, a source with an adjustable size may be realized as an array or grid of similarly sized resonators. Power and control circuitry of the array may selectively drive one or more resonators to change the effective size of the resonator. For example, a possible configuration of a grid of resonators is shown in FIG. 63. A grid of similarly sized resonators 6301 may be arranged in a grid and coupled to one or more power and control circuits (not shown). Each of the resonators 6301 of the array can be individually powered or any number of the resonators may be powered simultaneously. In the array, the effective size of the resonator may be changed by controlling the number, location, and driving characteristics (e.g. drive signal phase, phase offset, amplitude, and the like) of the powered resonators. For example, for the array of resonators in FIG. 63, the effective size of the resonator may be controlled by changing which individual resonators of the array are powered. The resonator may power only one of the resonators resulting in an effective resonator size 6304 which is equal to the size of one of the individual resonators. Alternatively, four of the individual resonators in the upper left portion of the array may be energized simultaneously creating an effective resonator size 6303 that may be approximately twice the size of each of the individual resonators. All of the resonators may also be energized simultaneously resulting in an effective resonator size 6302 that may be approximately three (3) times larger than the physical size each of the individual resonators.

In embodiments, the size of the array of individual resonators may be scaled to any size. In larger embodiments it may be impractical to have power and control circuitry for every individual resonator due to cost, wiring constraints, and the like. A switching bar of a cross-switch may be used to connect any of the individual resonators to as few power and control circuits as needed.

In embodiments of the array of individual resonators, the pattern of the individual energized resonators may be modified or optimized. The shape of the effective resonator may be rectangular, triangular, square, circular, or any arbitrary shape.

In embodiments of arrays of resonators, which resonators get energized may depend on the separation or distance, the lateral offset, the orientation, and the like, between the device resonator and the source resonator. The number of resonators that may be driven may, for example, depend on the distance and/or the orientation between the device resonators and the source resonators, the number of device resonators, their various power requirements, and the like. The location of the energized resonators in the array or grid may be determined according to the lateral position of the device with respect to the source. For example, in a large array of smaller individual resonators that may cover a floor of a room or a surface of a desk, the number of energized resonators may change as the distance between the device and the floor or desk changes. Likewise, as the device is moved around a room or a desk the location of the energized resonators in the array may change.

Figure 64:
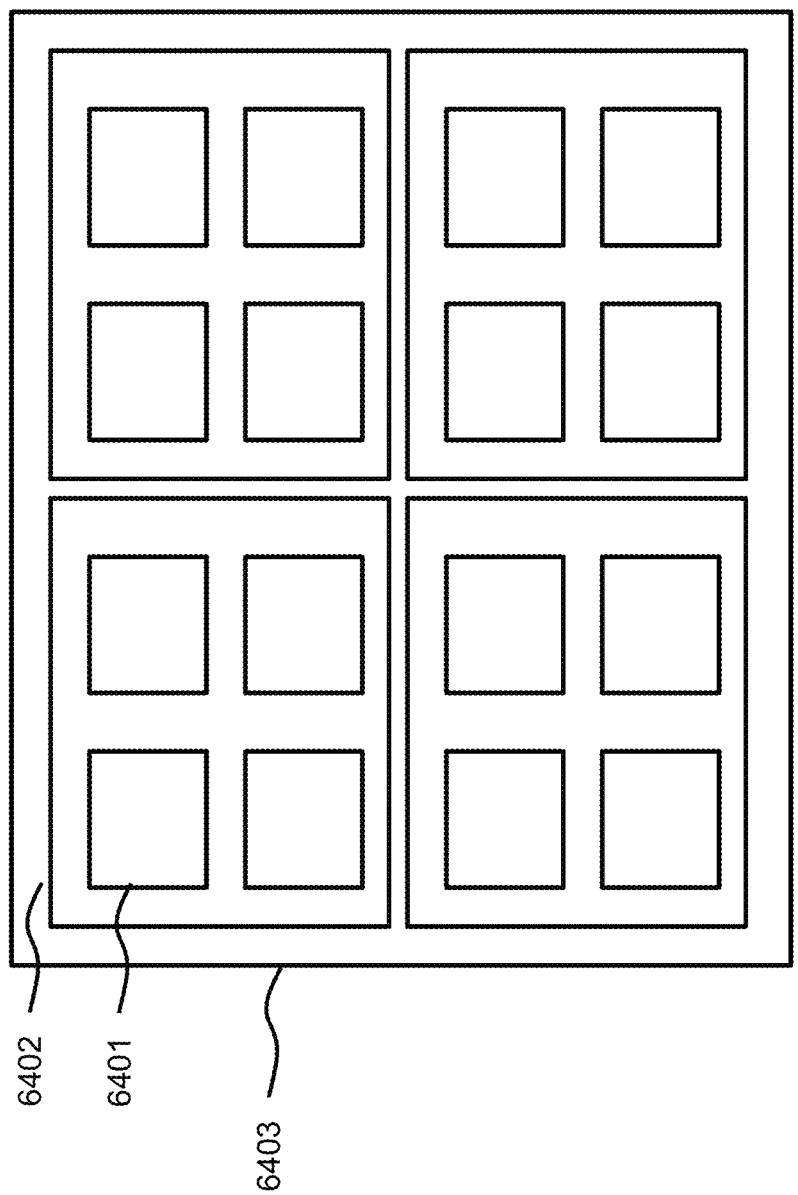
FIG. 64 is a diagram of an exemplary system embodiment of a source comprising an array of multi-sized resonators.

In another embodiment, an adjustable size source resonator may be realized with an array of multi-sized resonators. Several small equally sized resonators may be arranged to make a small assembly of small resonators. The small array may be surrounded by a larger sized resonator to make a larger assembly. The larger assembly may itself be arranged in an array forming a yet larger array with an even larger resonator that may surround the larger array which itself may be arranged in an array, and so on. In this arrangement, the source resonator comprises resonators of various physical sizes distributed throughout the array. An example diagram of an arrangement of resonators is shown in FIG. 64. Smaller resonators 6401 may be arranged in two by two arrays and surrounded by another resonator with a larger physical size 6402, forming an assembly of resonators. That assembly of resonators may be arranged in a two by two array and surrounded by a resonator with an even larger physical size 6403. The pattern can be repeated to make a larger array. The number of times each resonator or assembly of resonators is repeated may be configured and optimized and may or may not be symmetric. In the example of FIG. 64, each resonator and assembly may be repeated in a two by two array, but any other dimension of array may be suitable. Note that the arrays may be circular, square, rectangular, triangular, diamond shaped, and the like, or any combination of shapes and sizes. The use of multi-sized resonators in an array may have a benefit in that it may not require that multiple resonators be energized to result in a larger effective resonator. This feature may simplify the power and control circuitry of the source.

Figure 65:
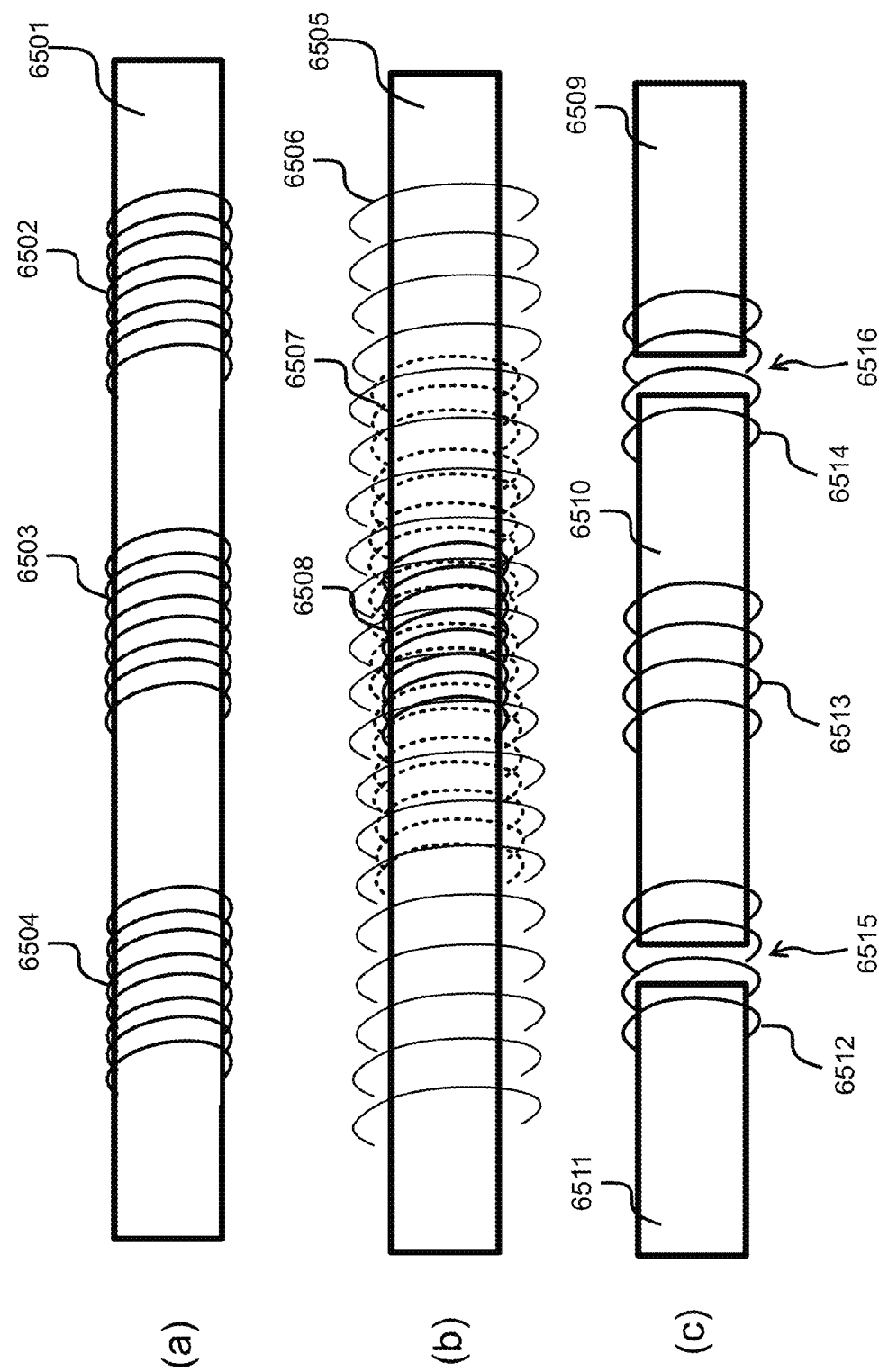
FIG. 65 is a diagram of an exemplary embodiment of an adjustable size source comprising planar resonator structures.

In embodiments, an adjustable source size may also be realized using planar or cored resonator structures that have a core of magnetic material wrapped with a capacitively loaded conductor, examples of which are shown in FIGS. 11, 12, and 13 and described herein. In one embodiment, as depicted in FIG. 65($a$), an adjustable source may be realized with a core of magnetic material 6501 and a plurality of conductors 6502, 6503, and 6504 wrapped around the core such that the loops of the different conductors do not overlap. The effective size of the resonator may be changed or adjusted by energizing a different number of the conductors. A larger effective resonator may be realized when several adjacent conductors are driven or energized simultaneously.

Another embodiment of an adjustable size source with a cored resonator is shown in FIG. 65(b) where a core of magnetic material 6505 is wrapped with a plurality of overlapping conductors 6506, 6507, 6508. The conductors may be wrapped such that each extends a different distance across the magnetic core 6505. For example, for the resonator in FIG. 65(b), conductor 6508 covers the shortest distance or part of the core 6505 while conductors 6507 and 6506 each cover a longer distance. The effective size of the resonator may be adjusted by energizing a different conductor, with the smallest effective size occurring when the conductor that covers the smallest distance of the magnetic core is energized and the largest effective size when the conductor covering the largest distance of the core is energized. Each of the conductors may be wrapped to achieve similar inductances, impedances, capacitances, and the like. The conductors may all be the same length with the covering distance modified by changing the density or spacing between the multiple loops of a conductor. In some embodiments, each conductor may be wrapped with equal spacing thereby requiring conductors of different lengths for each winding. In other embodiments the number of conductors and the wrapping of each conductor may be further optimized with non constant or varying wrapping spacing, gauge, size, and the like.

Another embodiment of an adjustable size source with a cored resonator is shown in FIG. 65(c) where multiple magnetic cores 6509, 6510, 6511 are gapped, or not touching, and wrapped with a plurality of conductors 6512, 6513, 6514. Each of the magnetic cores 6509, 6510, 6511 is separated with a gap 6515, 6516 and a conductor is wrapped around each magnetic core, extending past the gap and around the adjacent magnetic core. Conductors that do not span a gap between two magnetic cores, such as the conductor 6513 in FIG. 65(c), may be used in some embodiments. The effective size of the resonator may be adjusted by simultaneously energizing a different number of the conductors wrapped around the core. The conductors that are wrapped around the gaps between the magnetic cores may be energized guiding the magnetic field from one core to another extending the effective size of the resonator.

As those skilled in the art will appreciate, the methods and designs depicted in FIG. 65 may be extended to planar resonators and magnetic cores having various shapes and protrusions which may enable adjustable size resonators with a variable size in multiple dimensions. For example, multiple resonators may be wrapped around the extensions of the core shaped as in FIG. 13, enabling an adjustable size resonator that has a variable size in two or more dimensions.

In embodiments an adjustable size source resonator may comprise control and feedback systems, circuits, algorithms, and architectures for determining the most effective source size for a configuration of devices or objects in the environment. The control and feedback systems may use a variety of sensors, communication channels, measurements, and the like for determining the most efficient source size. In embodiments data from sensors, measurement circuitry, communication channels and the like may be processed by a variety of algorithms that select the appropriate source size.

In embodiments the source and device may comprise a wireless communication channel such as Bluetooth, WiFi, near-field communication, or modulation of the magnetic field which may be used to communicate information allowing selection of the most appropriate or most efficient source size. The device, for example, may communicate received power, current, or voltage to the source, which may be used by the source to determine the efficiency of power transfer. The device may communicate its position or relative position which may be used to calculate the separation distance between the source and device and used to determine the appropriate size of the source.

In embodiments the source may measure parameters of the resonator or the characteristics of the power transfer to determine the appropriate source size. The source may employ any number of electric or electronic sensors to determine parameters of various resonators or various configurations of source resonators of the source. The source may monitor the impedance, resistance, resonant frequency, the magnitude and phase of currents and voltages, and the like, of each configuration, resonator, or size of the source. These parameters, or changes in these parameters, may be used by the source to determine the most effective source size. For example, a configuration of the source which exhibits the largest impedance difference between its unloaded state and present state may be the most appropriate or the most efficient for the state of the system.

The operating parameters and the size of the source may be changed continuously, periodically, or on demand, such as in response to a request by the device or by an operator of the system. A device may request or prompt the source to seek the most appropriate source size during specific time intervals, or when the power or voltage at the device drops below a threshold value.

Figure 66:
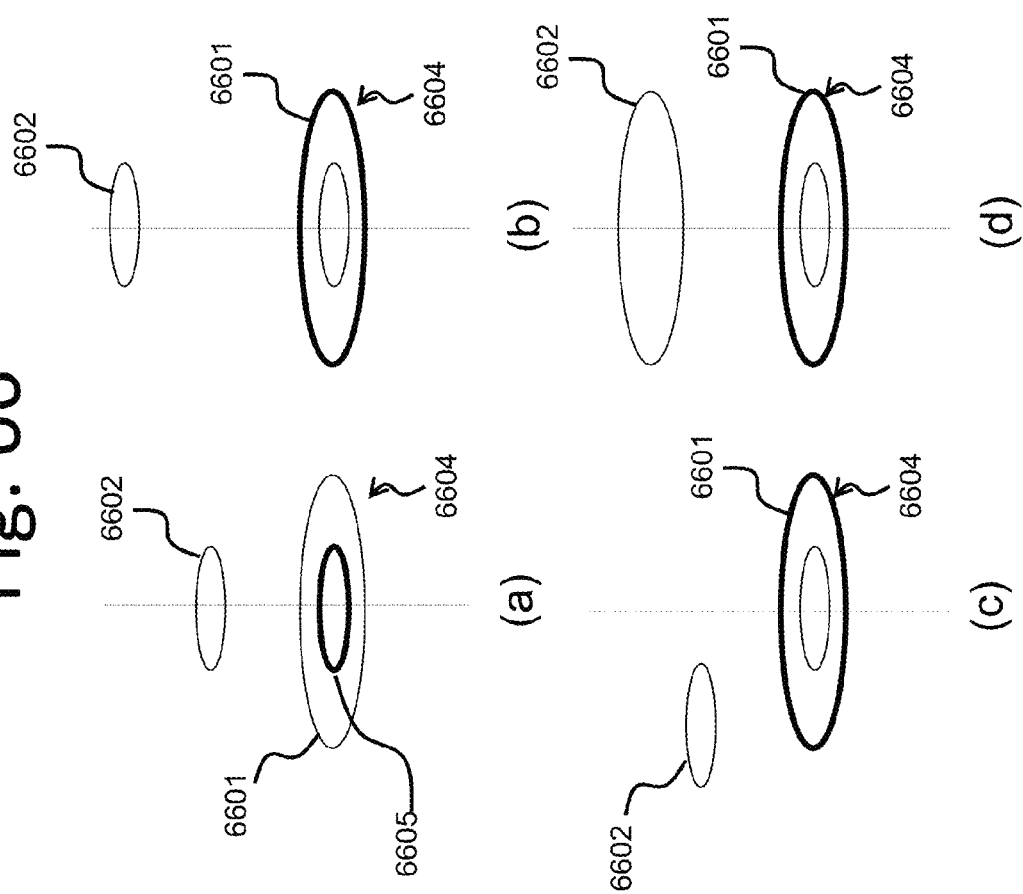
FIGS. 66(*a*)-(*d*) are diagrams showing usage scenarios for an adjustable source size.

FIG. 66 depicts a possible way a wireless power transfer system may use an adjustable source size 6604 comprising two different sized resonators 6601, 6605 during operation in several configurations and orientations of the device resonator 6602 in one possible system embodiment. When a device with a small resonator 6602 is aligned and in close proximity, the source 6604 may energize the smaller resonator 6605 as shown in FIG. 66(a). When a device with a small resonator 6602 is aligned and positioned further away, the source 6604 may energize the larger resonator 6601 as shown in FIG. 66(b). When a device with a small resonator 6602 is misaligned, the source 6604 may energize the larger resonator 6602 as shown in FIG. 66(c). Finally, when a device with a large resonator 6602 is present, the source 6604 may energize the larger resonator 6601 as shown in FIG. 66(d) to maximize the power transfer efficiency.

In embodiments an algorithm for determining the appropriate source size may be executed on a processor, gate array, or ASIC that is part of the source, connected to the source, or is in communication with the source. In embodiments, the algorithm may sequentially energize all, or a subset of possible source configurations or sizes, measure operating characteristics of the configurations and choose the source size with the most desirable characteristics.

Wireless Power Transfer with Immersed Resonators

In embodiments, wireless power transfer systems may be designed to operate when one, two or more resonators are immersed in liquids, slurries, mud, ice, salt solutions, and the like, embedded in materials or surrounded by materials that may be lossy, and/or electrically conducting. In embodiments, power may be transferred wirelessly between one or more resonators that are under water, underground, in streams, in pavement, in cement, in slurries, in mud, in mixtures of materials, in pools of any type of liquid or viscous materials, in wells such as water wells, gas wells, oil wells and the like.

In embodiments, the source and/or device resonators of the wireless power transfer systems may be designed to reduce the magnitude of the electric field in or at lossy or conducting materials or objects that may be in the regions surrounding the resonators, especially those materials and regions nearest to the resonator, so as to achieve a desirable perturbed Q. In embodiments, enclosures with certain dimensions and positions relative to the conducting loops and electrical components of magnetic resonators may be used to improve the perturbed Q relative to an enclosure-free implementation. Such enclosures may support higher perturbed Q resonators in immersed resonator applications by providing spacing between locations where the electric field strength is relatively high and where the lossy or conducting materials may be located. For example, in applications where the resonator may be immersed in water, salt water, oil, gas, or other lossy materials, it may be beneficial to package a magnetic resonator to ensure a minimum separation distance between the lossy materials and the electrical components of the resonator.

The packaging, structure, materials, and the like of the resonator may be designed to provide a spacing or "keep away" zone from the conducting loops in the magnetic resonator. In some embodiments the keep away zone may be less than a millimeter around the resonator. In other embodiments the keep away zone may be less than 1 cm or less than 10 cm around the resonator. In embodiments the size of the keep away zone may depend on the levels of power transferred, the lossiness of the surrounding material, operating frequency of the resonator, size of the resonator, and the like. In embodiments, the size of the keep away zone may be restricted by physical constraints of the application and the keep away zone may be designed such that the perturbed Q of the resonator due to the lossy material outside of the keep away zone is at least 50% of the unperturbed Q of the resonator. In embodiments, the keep away zone may be designed such that the perturbed Q of the resonator is greater than 1% of the unperturbed Q.

Figure 67:
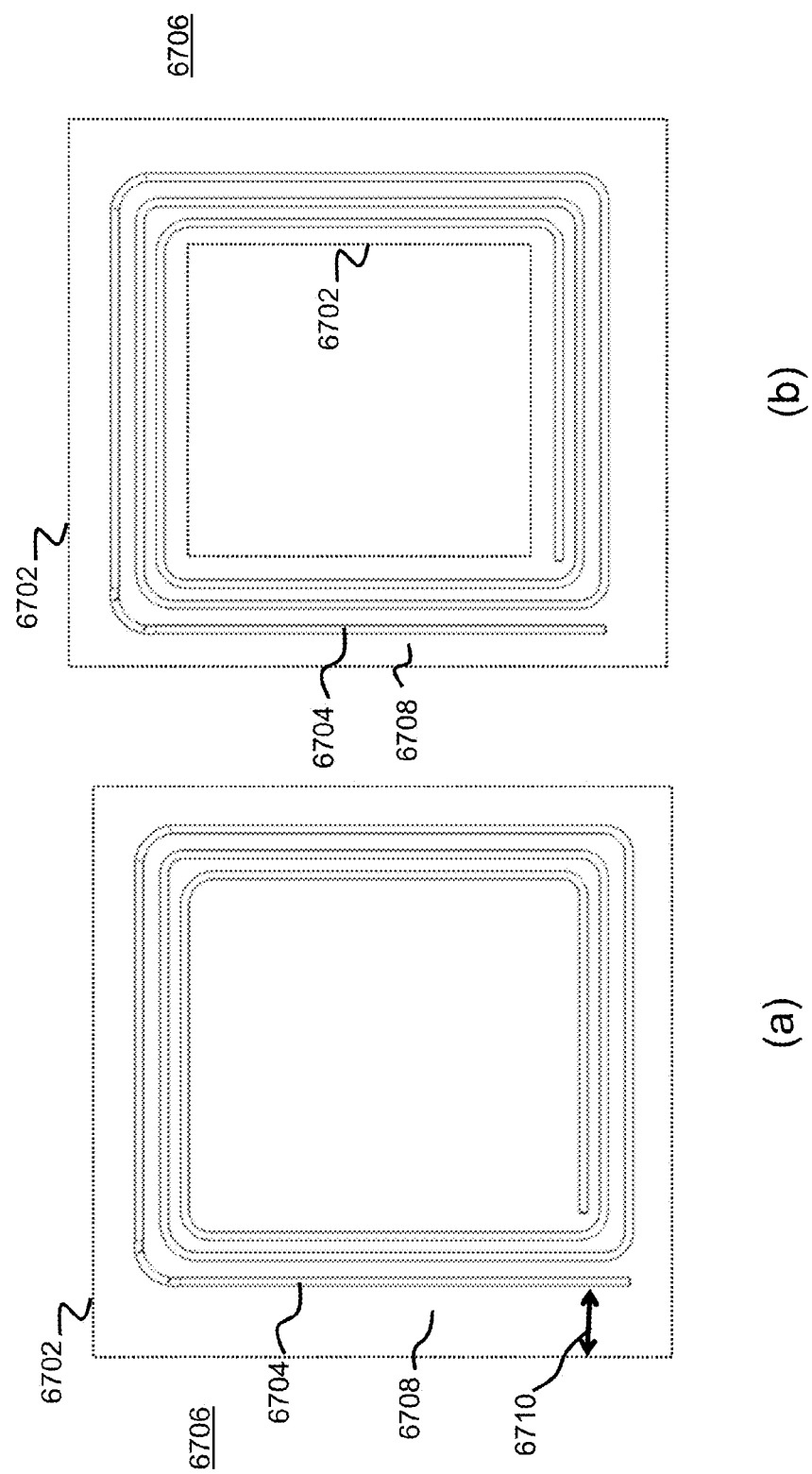
FIGS. 67(*a-b*) is a diagram showing resonators with different keep out zones.

In embodiments the keep away zone around the resonator may be provided by packaging that surrounds the resonator and may also surround the power and control circuitry of the resonator. Preferably the packaging may be constructed from non-lossy materials such as certain plastics, composites, plastic composites, Teflon, Rexolite, ABS, ceramics, stone, and the like. The resonator and circuitry may be encased in such packaging or the packaging may provide an outer barrier with another non-lossy material filling the keep away zone within the packaging. Alternatively, the keep-away zone inside the packaging may comprise vacuum, air, gas, sand, and the like. In embodiments the keep away zone may be provided by the components of the resonator or the circuitry. In embodiments the elements of the resonators and circuitry may provide a sufficient keep away zone for some applications, or the components of a resonator may be chosen to naturally provide for a large enough keep away zone. For example, in some applications the electrical insulation on a conductor of a resonator may provide a suitable keep away zone and may not require additional separation. Diagrams of a resonator 6704 with packaging 6702 providing a keep away 6710 zone around the resonator are shown in FIG. 67. A resonator 6704 may be completely surrounded by an enclosure 6702 that provides separation and a keep away zone as shown in FIG. 67(*a*). In other embodiments the packaging 6702 may surround and follow the shape of the resonator 6704 to provide a keep away zone around the inside and outside edges of a resonator as shown in FIG. 67(*b*).

Figure 68:
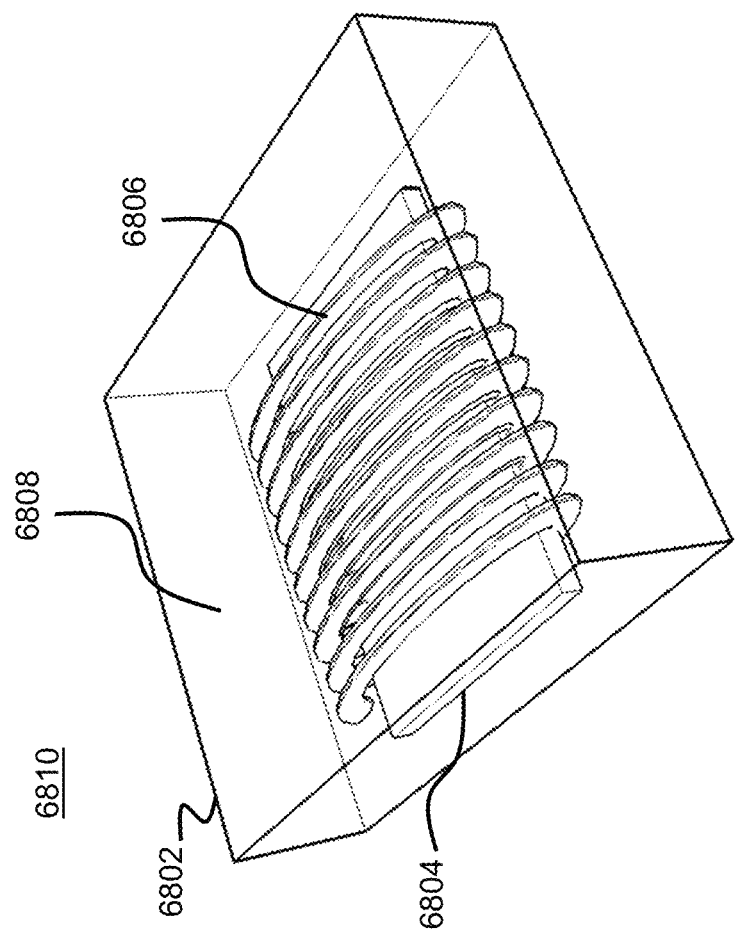
FIG. 68 is a diagram showing a resonator with a symmetric keep out zone.

In an exemplary embodiment, depicted in FIG. 68, a 15 cm×15 cm×5 mm slab of magnetic material 6804 excited at 100 kHz by 10 6806 turns of conductors evenly spaced by 1 cm wound along one of the longer dimensions and immersed in a medium 6808 with resistivity $\rho=0.2$ $\Omega$-m was modeled in a finite element analysis to show the effect of adding a keep away zone. When there was no keep away zone, the perturbing Q due to the lossy medium was 66. With the addition of a keep away zone 6802 shaped like a parallelepiped extending 1 cm from each face of the magnetic material, the perturbing Q was raised to 86. When the shortest distance between the magnetic material 6804 and the edge of the keep away zone 6802 was increased to 2.5 cm, the perturbing Q was calculated to be 119, and when this distance was increased to 10 cm, the perturbing Q improved to 318.

Figure 69:
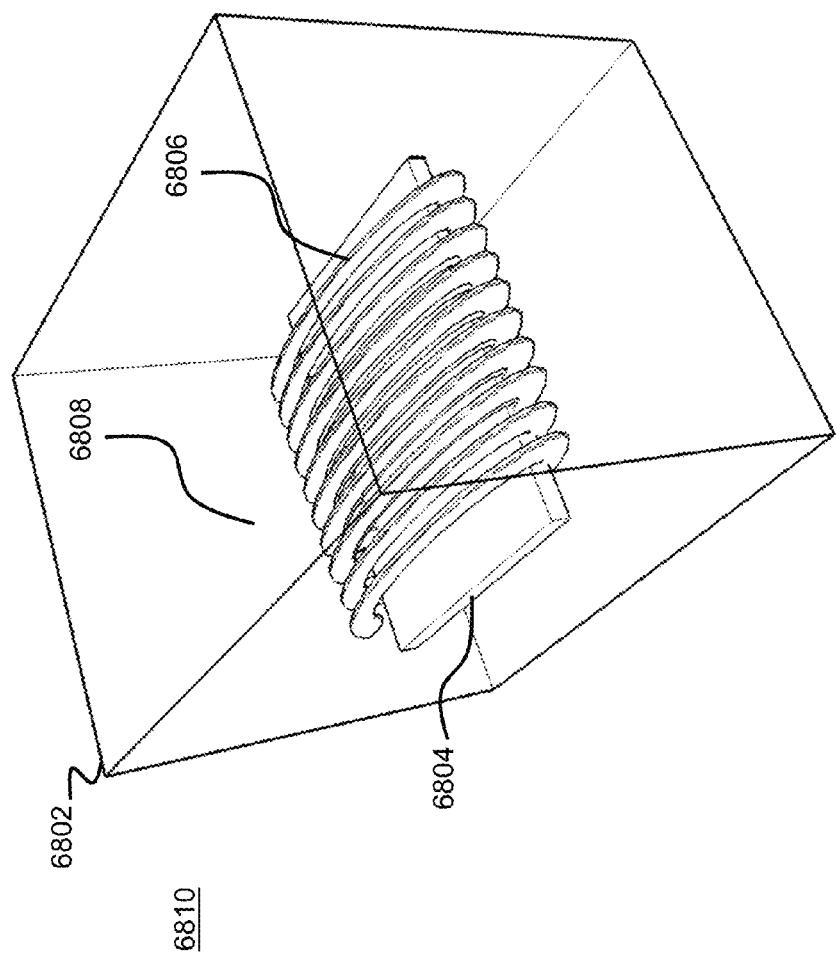
FIG. 69 is a diagram showing a resonator with an asymmetric keep out zone.

In embodiments the keep away zone may not provide for a uniform keep away zone around the resonator but may be non uniform and may be larger or thicker in areas of the resonator that may have larger external electrical fields which may be near the capacitors or near the conductor windings or near the corners of the resonator, for example. This may be illustrated by extending the example above, and exploiting the fact that the electric field may be largest along the directions transversing the magnetic moment of the structure. As depicted in FIG. 69, if the keep away zone along the magnetic moment of the resonator is reduced from 10 cm to 1 cm while the keep away zone along all other directions is kept at 10 cm, the perturbing Q is reduced from 318 to 255, while the volume occupied by the resonator and the keep away zone 6802 is reduced by more than 51% compared to the case where the keep away zone was 10 cm all around the resonator.

In embodiments, the resonant frequencies of the wireless power transfer system may be chosen to improve the perturbed Q of the system. For example, even though the intrinsic Q of an exemplary resonator may improve at higher frequencies, the perturbed Q may decrease at higher frequencies. Therefore, in exemplary embodiments, it may be preferable to choose operating frequencies that are lower than the frequency corresponding to the maximized intrinsic Q. In embodiments, the operating frequency may be chosen to be two to ten times lower than the optimum-Q frequency. In other embodiments, the operating frequency may be chosen to be 10 to 100 times lower than the optimum-Q frequency. In yet other embodiments, the operating frequency may be chosen to be one hundred to ten thousand times lower than the optimum-Q frequency. In embodiments, the operating frequency may be between 100 kHz and 500 kHz. In other embodiments, the operating frequency may be chosen to be between 10 kHz and 100 kHz. In yet other embodiments, the operating frequency may be between 500 kHz and 30 MHz.

In an exemplary embodiment, a capacitively-loaded conducting loop resonator with a loop radius of 15 cm, a resonant frequency of 100 kHz, and surrounded by a fluid with resistivity $\rho=30$ $\Omega$-m was modeled to show the impact of resonator and enclosure design on perturbed Q. The modeled embodiment is shown in FIG. 67(*a*). The capacitively-loaded conducting loop 6704 is enclosed in a box 6702 filled with air 6708. The spacing between the outer edge of the conducting loop or coil 6704 in FIG. 67(*a*) and the outer edge of the enclosure 6702 is the keep away zone. This spacing 6708 may be filled with air, it may be filled by the enclosure material itself, and/or it may be filled by preferably non-lossy materials such as plastic, composites, plastic composites, ceramics, stone, air, gas, sand, and the like. In embodiments, the loss tangent for the enclosure material may be low enough that it does not perturb the Q of the resonator. In embodiments, the loss tangent of the material may be low enough that it improves the perturbed Q of the enclosed resonator relative to the perturbed Q when the resonator is immersed directly in surrounding materials.

For the exemplary system shown in FIG. 67(*a*), the intrinsic Q of the resonators increased as the number of turns of the resonator coil increased. However, the perturbed Q of the resonators decreased as the number of turns increased. The perturbed Q could be increased by increasing the size of the keep out zone 6710 between the edges of the coil 6704 and the edges of the enclosure 6702. In this exemplary embodiment, the perturbed Q of the 4-turn resonator was improved by more than a factor of two (2), for keep out zones larger than 1 cm, and approached its intrinsic Q when the spacing exceeded approximately 2.5 cm. Therefore, enclosures with keep out zones greater than 1 cm may enable efficient wireless power transfer even when the source and device resonators are immersed in or may be in the vicinity of lossy materials.

Some applications for wireless power transfer where at least one of the resonators is immersed in some material other than air may be currently enabled using directly wired solutions. For example, electrical wires may run along the bottom of a pond, through building materials, down a well shaft, through the hull of a boat, and the like. However, these wires, and the connectors that may be used to provide electrical continuity across different segments of the wiring may be prone to failure and may be expensive and/or difficult to replace when they do fail. In addition, they may be difficult or impossible to install because of positional and rotational uncertainties in the installation process and because that process may compromise the integrity of the structures that support the resonators. Wireless power transfer may be advantageous in these applications because it may accommodate gaps between the energy sources and the energy consuming devices or connections, thereby eliminating the need for wiring or electrical connectors in places where such wiring or connectors may be stressed, dangerous, or failure prone.

Figure 70:
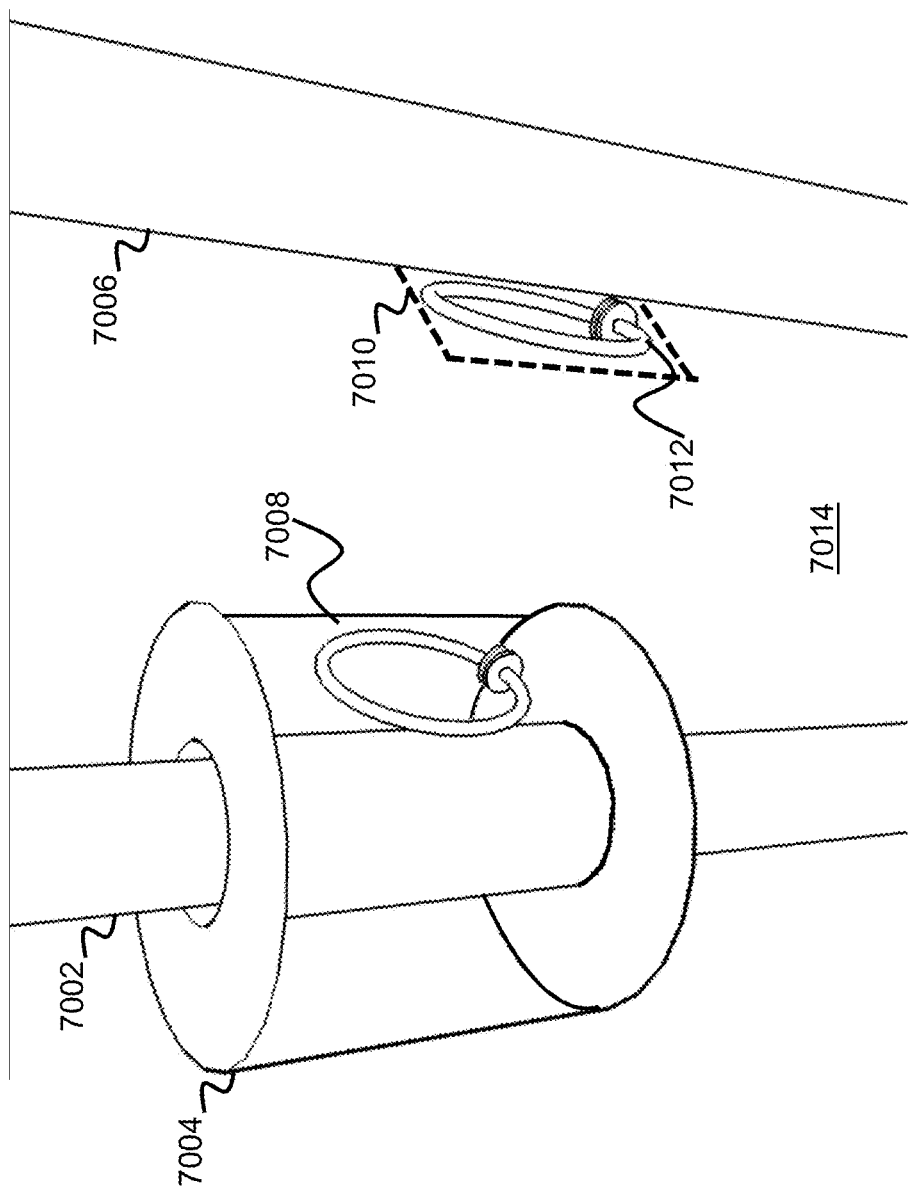
FIG. 70 is a diagram showing an application of wireless power transfer.

FIG. 70 shows an exemplary embodiment of a wireless power transfer system for an underwater sensor application. In this example, a wireless power source 7008 is housed in an annular housing 7004 that surrounds tubing 7002 that may house the wiring used to supply power from a remote generator to the source as well as being used to guide the source resonator 7008 to the general vicinity of the underwater sensor 7010. This tubing 7002 may be made from a variety of materials including steel, plastic, rubber, metal, and the like and may contain a variety of electronic components, strength members, tubes, valves, conduits and the like. The source 7008 may be used to wirelessly transfer power to a device resonator 7012 that may be coupled to a sensor 7010. In embodiments, multiple sensors may be arranged at different locations and depths and the wireless power source 7008 may be flexibly positioned to address multiple sensors simultaneously or one at a time.

Figure 71:
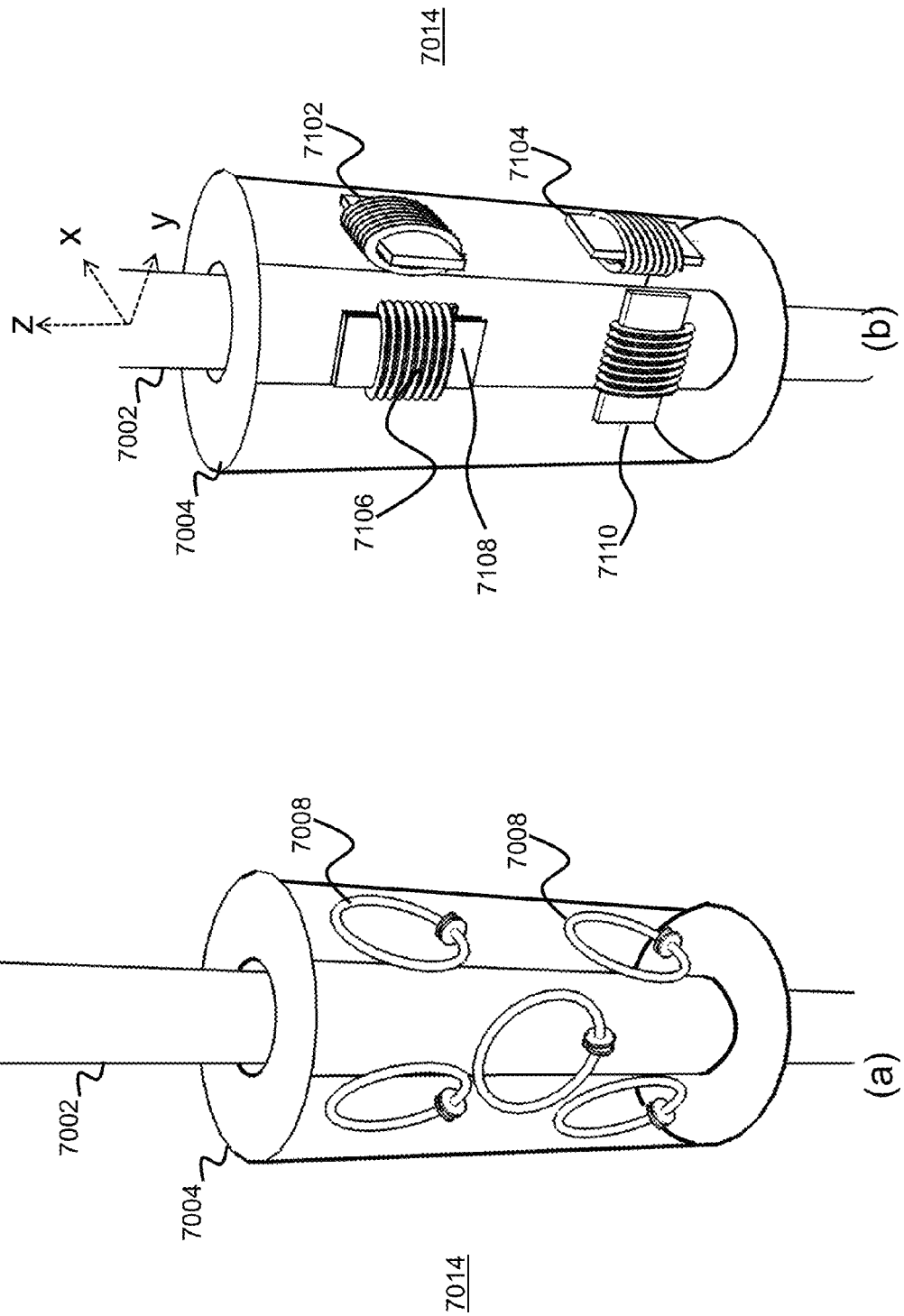
FIGS. 71(*a-b*) is a diagram arrays of resonators used to reduce lateral and angular alignment dependence between the source and device.
Figure 72:
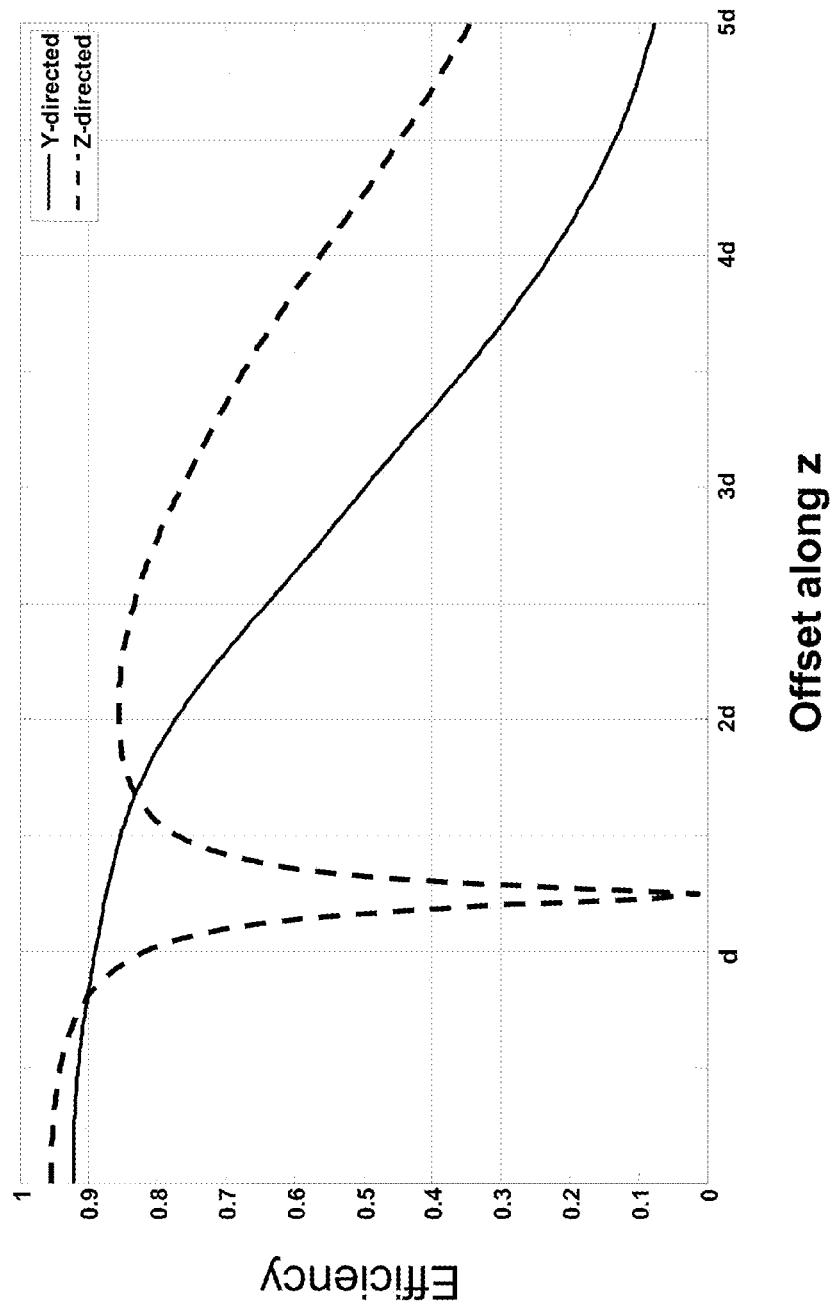
FIG. 72 is a plot showing the effect of resonator orientation on efficiency due to resonator displacement.

FIG. 71 shows two exemplary embodiments of capacitively-loaded conducting loop source resonators, one comprising magnetic materials (FIG. 71(*b*)), situated in a rotationally symmetric enclosure 7004. In the embodiment shown in FIG. 71(*b*), the resonators may have dipole moments that are aligned either parallel to the tubing, defined here as the z-axis (i.e. resonator 7104), or parallel to the x-axis or y-axis (i.e. resonator 7104 and 7110 respectively) depending on the orientation of the conductor loop 7106 that is wrapped around the core of magnetic material 7108. In this exemplary embodiment, the highest energy transfer efficiency may be realized when the similarly-sized source and device resonators have z-directed dipole moments and the resonators are aligned. However, for this dipole orientation, the efficiency may vary through zero at relatively small translational misalignments of these resonators, as shown in FIG. 72, before recovering and falling off with larger offsets. If both resonators are y-directed, the maximum coupling efficiency may not be as high as for the z-oriented dipoles, but the transfer efficiency only goes to zero when the resonators are relatively far apart. A resonator that comprises orthogonally wrapped capacitively-loaded conducting loops, and can be modeled as having both z-directed and y-directed dipoles as shown in FIG. 12, may yield the highest transfer efficiencies over a range of operating scenarios. In embodiments, the orthogonal loops may be used simultaneously, or a selector or switch may be used to select between y-directed and z-directed dipole resonators to achieve the optimum performance. Note that different system considerations may impact which type of resonator is comprised by the source resonator and the device resonator.

Figure 73:
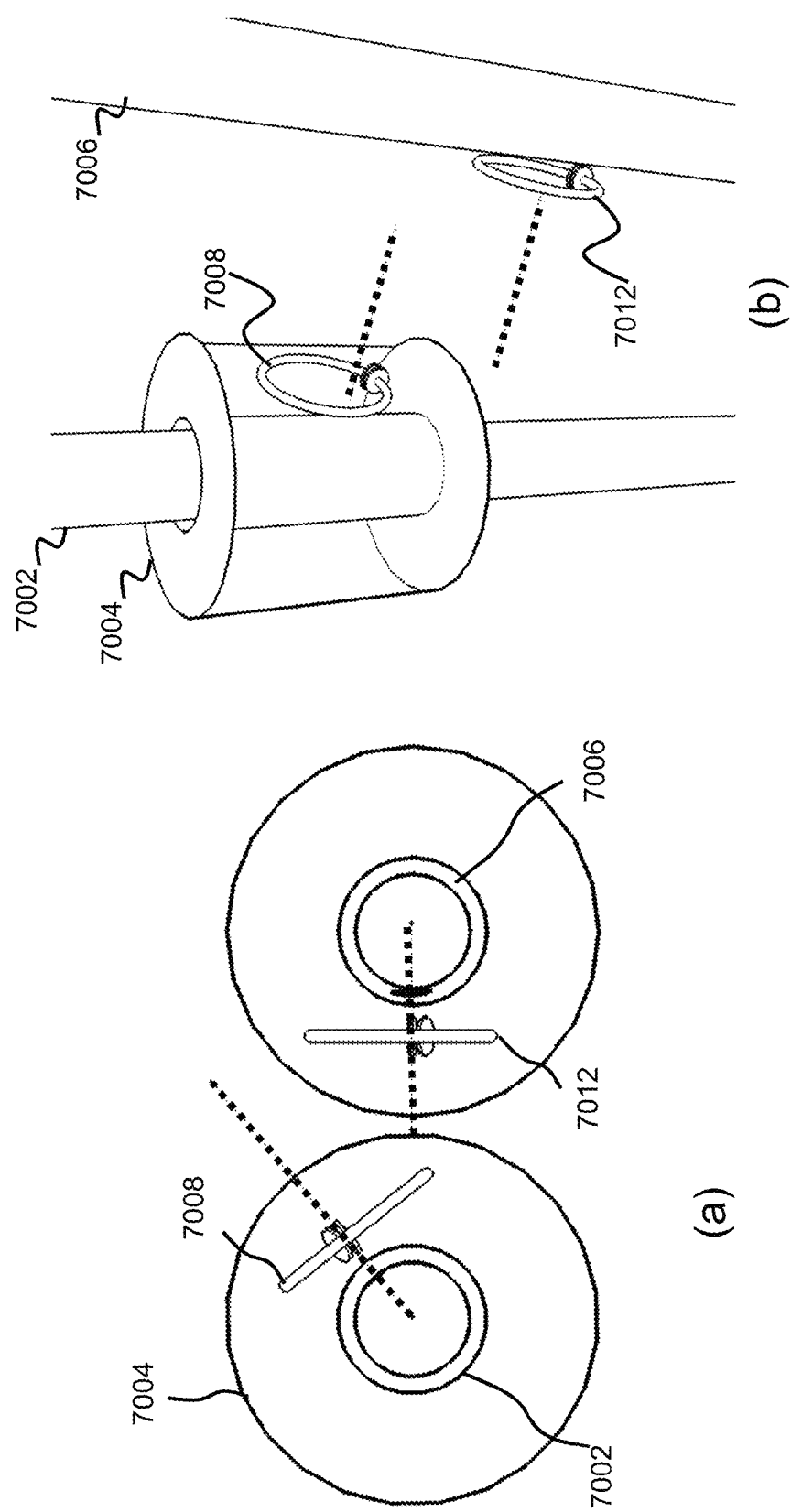
FIGS. 73(*a-b*) are diagrams showing lateral and angular misalignments between resonators.

When the source or device resonators are installed, positioned or activated, there may be uncertainty in the offset and rotation of the source resonators relative to the device resonators. Exemplary positional and rotational uncertainties are depicted in FIGS. 73(*a*) and 73(*b*). Source 7008 and device 7012 resonators may have rotational misalignment as shown in FIG. 73(*a*) or lateral or vertical misalignment as shown in FIG. 73(*b*). For single resonator designs, misalignment of resonators may decrease the efficiency of power transfer. In embodiments, the source and device resonator sizes and materials and the alignment of their dipole moments relative to their physical dimensions may be chosen to maximize the range of positional and rotational misalignments over which sufficiently efficient energy transfer may be realized.

In other embodiments, the potential reduced efficiency associated with positional and rotational uncertainty may be unacceptable. In those embodiments, a number of source resonators may be incorporated in a housing, increasing the probability that at least one of those source resonators is located close enough to the device resonator to yield adequate performance. Exemplary implementations of such a source array are shown in FIG. 71. Multiple resonators may be arranged in a circular fashion in an annular housing 7004 such that a resonator is located every several degrees around the housing such that regardless of the rotational uncertainty at least one source and device may have partial alignment. In addition multiple circular arrangements of resonators may be combined to increase the vertical height of the resonator array. An increase in vertical length of a source may increase the system's ability to tolerate vertical misalignments (along the z axis). In embodiments, the outer radius of the annular housing may be increased to increase the system's ability to tolerate horizontal misalignments (along the y-axis). Note that a variety of source resonator designs and array patterns may be used to implement this concept. The array patterns that are shown here are not meant to be limiting in any way. An array may comprise capacitively loaded loop resonators (FIG. 71(*a*)). An array may comprise planar resonators. In some embodiments planar resonators comprising a conductor wrapped around a core of magnetic material may be used. In an array of planar resonators the conductors of some resonators may be wrapped in orthogonal directions for different resonators as depicted in FIG. 71(*b*).

In addition, the enclosure housing the resonators may be any shape and size and may be application specific. In some applications, the enclosures may be shaped as cubes, rectangular boxes, bulbs, balls, cylinders, sheets, and the like, and may be hollow, solid, or may comprise different materials in their centers. In embodiments, the primary housing and array design considerations may be housing strength, size, appearance, steerability, controllability, water, wind or earth resistance, and the like.

In embodiments, the multiple source resonators may be connected via switches so that after the source resonator array is installed or positioned, only one, or a few of the source resonators may be energized to achieve wireless power transfer. The system monitoring and control capabilities discussed herein may be used to determine which source resonators may be energized and included in the wireless power transfer system. In embodiments, the Q of the unused resonators may be spoiled or reduced to minimize interactions between these resonators and the energized resonators. The resonator Q's may be altered by remotely controllable switches, fuses, connections, and the like.

Note that the designs described above for source resonators may also be for device resonators.

In embodiments, a variety of resonator designs for wireless power transfer may be selected. In an exemplary well drilling application, the source and device resonators may comprise capacitively-loaded conducting loops with air cores or with cores that comprise magnetic materials, as shown in FIG. 68. The resonators may include conducting surfaces to redirect and/or guide the resonator fields to reduce the impact of steel or metallic tubing, structures, instruments, casings, and the like. The conducting surfaces and magnetic materials may be shaped to follow the form of certain well structures, such as being bowed outward to conform to the circular tubing and casings that may run up the center of the well. In embodiments, the surface of the magnetic material closest to structures made of metal or steel may comprise a layer of a higher conductivity material so as to reduce losses due to eddy currents on lossier structures. The shapes and sizes of the conducting materials may be the same as for the magnetic materials, or they may be different. In embodiments, conducting layers may conform to the surface of the magnetic materials or to the inside surfaces of an enclosure or to a feature that has been built into the enclosure. In embodiments, conducting layers may be attached to magnetic materials or separate from them. In embodiments, field shaping may be used to direct resonator fields away for lossy materials or structures and/or to direct or guide resonator fields towards other resonators in the power transfer system. In embodiments, capacitively-loaded conducting loops wrapped around magnetic materials such as shown in FIGS. 11-14 and FIG. 16 may be selected for transferring power from a main borehole in a well to a lateral borehole.

Note that a wireless transfer system for immersed resonator applications may comprise any combination of resonators, enclosures, arrays, electronics, monitoring and control methods as described herein. In embodiments, device resonators may also be installed in arrays, with a subset of the available resonators selected for the wireless power transfer system.

Wireless Power Repeater Resonators

A wireless power transfer system may incorporate a repeater resonator configured to exchange energy with one or more source resonators, device resonators, or additional repeater resonators. A repeater resonator may be used to extend the range of wireless power transfer. A repeater resonator may be used to change, distribute, concentrate, enhance, and the like, the magnetic field generated by a source. A repeater resonator may be used to guide magnetic fields of a source resonator around lossy and/or metallic objects that might otherwise block the magnetic field. A repeater resonator may be used to eliminate or reduce areas of low power transfer, or areas of low magnetic field around a source. A repeater resonator may be used to improve the coupling efficiency between a source and a target device resonator or resonators, and may be used to improve the coupling between resonators with different orientations, or whose dipole moments are not favorably aligned.

An oscillating magnetic field produced by a source magnetic resonator can cause electrical currents in the conductor part of the repeater resonator. These electrical currents may create their own magnetic field as they oscillate in the resonator thereby extending or changing the magnetic field area or the magnetic field distribution of the source.

In embodiments, a repeater resonator may operate as a source for one or more device resonators. In other embodiments, a device resonator may simultaneously receive a magnetic field and repeat a magnetic field. In still other embodiments, a resonator may alternate between operating as a source resonator, device resonator or repeater resonator. The alternation may be achieved through time multiplexing, frequency multiplexing, self-tuning, or through a centralized control algorithm. In embodiments, multiple repeater resonators may be positioned in an area and tuned in and out of resonance to achieve a spatially varying magnetic field. In embodiments, a local area of strong magnetic field may be created by an array of resonators, and the positioned of the strong field area may be moved around by changing electrical components or operating characteristics of the resonators in the array.

In embodiments a repeater resonator may be a capacitively loaded loop magnetic resonator. In embodiments a repeater resonator may be a capacitively loaded loop magnetic resonator wrapper around magnetic material. In embodiments the repeater resonator may be tuned to have a resonant frequency that is substantially equal to that of the frequency of a source or device or at least one other repeater resonator with which the repeater resonator is designed to interact or couple. In other embodiments the repeater resonator may be detuned to have a resonant frequency that is substantially greater than, or substantially less than the frequency of a source or device or at least one other repeater resonator with which the repeater resonator is designed to interact or couple. Preferably, the repeater resonator may be a high-Q magnetic resonator with an intrisic quality factor, $Q_r$, of 100 or more. In some embodiments the repeater resonator may have quality factor of less than 100. In some embodiments, $\sqrt{Q_s Q_r} > 100$. In other embodiments, $\sqrt{Q_d Q_r} > 100$. In still other embodiments, $\sqrt{Q_{r1} Q_{r2}} > 100$.

In embodiments, the repeater resonator may include only the inductive and capacitive components that comprise the resonator without any additional circuitry, for connecting to sources, loads, controllers, monitors, control circuitry and the like. In some embodiments the repeater resonator may include additional control circuitry, tuning circuitry, measurement circuitry, or monitoring circuitry. Additional circuitry may be used to monitor the voltages, currents, phase, inductance, capacitance, and the like of the repeater resonator. The measured parameters of the repeater resonator may be used to adjust or tune the repeater resonator. A controller or a microcontroller may be used by the repeater resonator to actively adjust the capacitance, resonant frequency, inductance, resistance, and the like of the repeater resonator. A tunable repeater resonator may be necessary to prevent the repeater resonator from exceeding its voltage, current, temperature, or power limits. A repeater resonator may for example detune its resonant frequency to reduce the amount of power transferred to the repeater resonator, or to modulate or control how much power is transferred to other devices or resonators that couple to the repeater resonator.

In some embodiments the power and control circuitry of the repeater resonators may be powered by the energy captured by the repeater resonator. The repeater resonator may include AC to DC, AC to AC, or DC to DC converters and regulators to provide power to the control or monitoring circuitry. In some embodiments the repeater resonator may include an additional energy storage component such as a battery or a super capacitor to supply power to the power and control circuitry during momentary or extended periods of wireless power transfer interruptions. The battery, super capacitor, or other power storage component may be periodically or continuously recharged during normal operation when the repeater resonator is within range of any wireless power source.

In some embodiments the repeater resonator may include communication or signaling capability such as WiFi, Bluetooth, near field, and the like that may be used to coordinate power transfer from a source or multiple sources to a specific location or device or to multiple locations or devices. Repeater resonators spread across a location may be signaled to selectively tune or detune from a specific resonant frequency to extend the magnetic field from a source to a specific location, area, or device. Multiple repeater resonators may be used to selectively tune, or detune, or relay power from a source to specific areas or devices.

The repeater resonators may include a device into which some, most, or all of the energy transferred or captured from the source to the repeater resonator may be available for use. The repeater resonator may provide power to one or more electric or electronic devices while relaying or extending the range of the source. In some embodiments low power consumption devices such as lights, LEDs, displays, sensors, and the like may be part of the repeater resonator.

Figure 74:
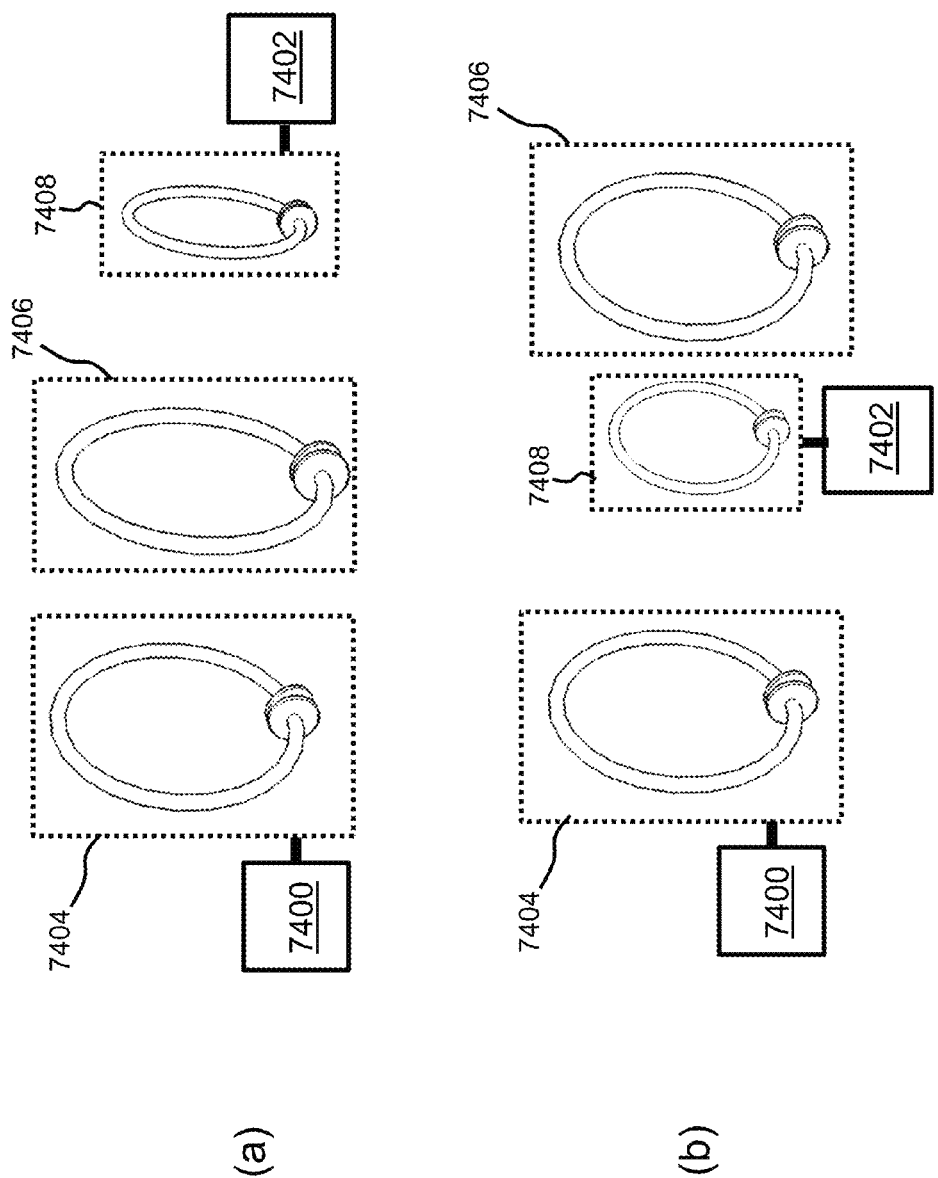
FIGS. 74(*a-b*) are diagram showing two resonator configurations with repeater resonators.
Figure 75:
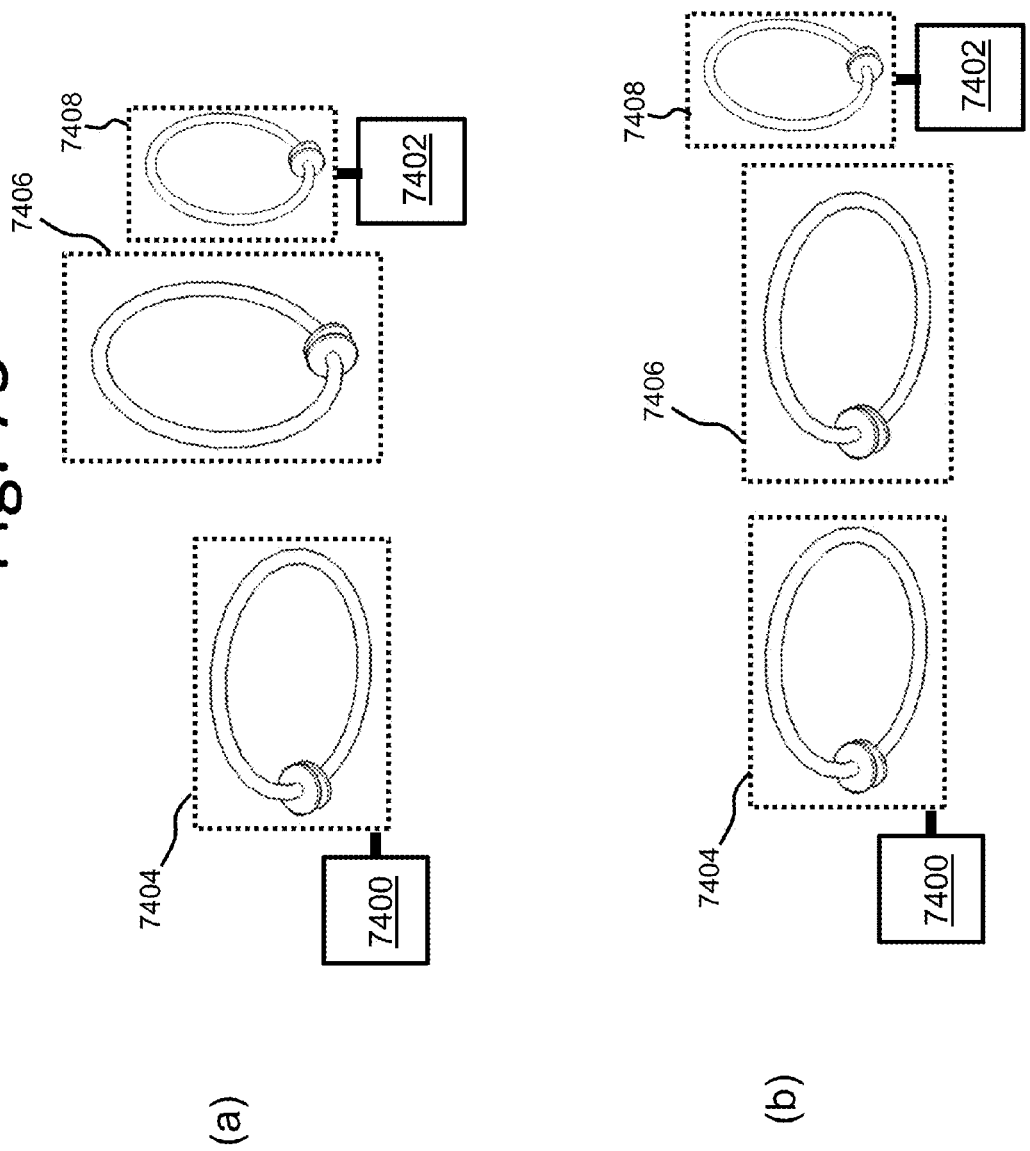
FIGS. 75(*a-b*) are diagram showing two resonator configurations with repeater resonators.
Figure 76:
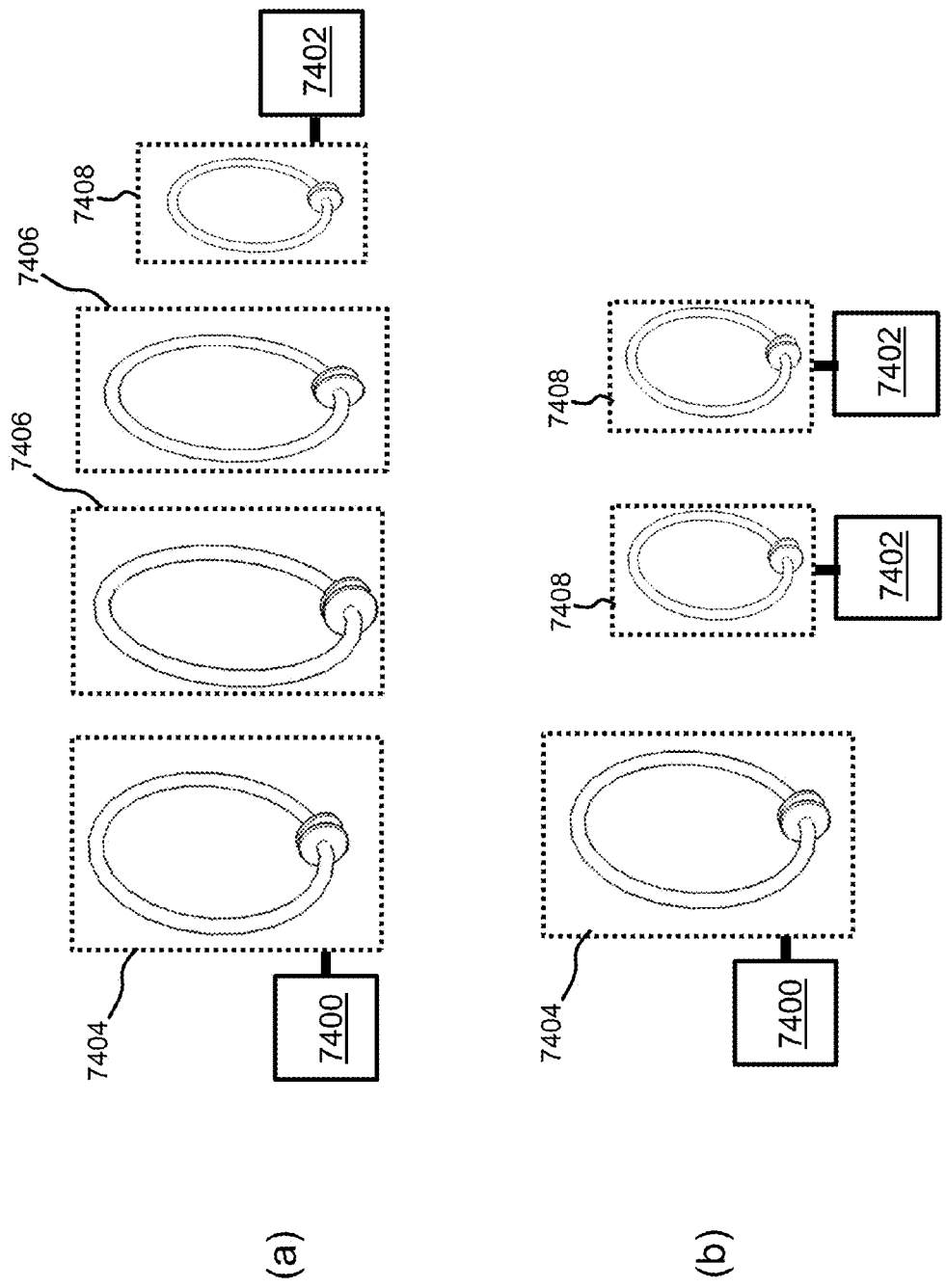
FIG. 76(*a*) is a diagram showing a configuration with two repeater resonators (*b*) is a diagram showing a resonator configuration with a device resonator acting as a repeater resonator.

Several possible usage configurations are shown in FIGS. 74-76 showing example arrangements of a wireless power transfer system that includes a source 7404 resonator coupled to a power source 7400, a device resonator 7408 coupled to a device 7402, and a repeater resonator 7406. In some embodiments, a repeater resonator may be used between the source and the device resonator to extend the range of the source. In some embodiments the repeater resonator may be positioned after, and further away from the source than the device resonator as shown in FIG. 74(b). For the configuration shown in FIG. 74(b) more efficient power transfer between the source and the device may be possible compared to if no repeater resonator was used. In embodiments of the configuration shown in FIG. 74(b) it may be preferable for the repeater resonator to be larger than the device resonator.

In some embodiments a repeater resonator may be used to improve coupling between non-coaxial resonators or resonators whose dipole moments are not aligned for high coupling factors or energy transfer efficiencies. For example, a repeater resonator may be used to enhance coupling between a source and a device resonator that are not coaxially aligned by placing the repeater resonator between the source and device aligning it with the device resonator as shown in FIG. 75(a) or aligning with the source resonator as shown in FIG. 75(b).

In some embodiments multiple repeater resonators may be used to extend the wireless power transfer into multiple directions or multiple repeater resonators may one after another to extend the power transfer distance as shown in FIG. 76(a). In some embodiments, a device resonator that is connected to load or electronic device may operate simultaneously, or alternately as a repeater resonator for another device, repeater resonator, or device resonator as shown in FIG. 76(b). Note that there is no theoretical limit to the number of resonators that may be used in a given system or operating scenario, but there may be practical issues that make a certain number of resonators a preferred embodiment. For example, system cost considerations may constrain the number of resonators that may be used in a certain application. System size or integration considerations may constrain the size of resonators used in certain applications.

In some embodiments the repeater resonator may have dimensions, size, or configuration that is the same as the source or device resonators. In some embodiments the repeater resonator may have dimensions, size, or configuration that is different than the source or device resonators. The repeater resonator may have a characteristic size that is larger than the device resonator or larger than the source resonator, or larger than both. A larger repeater resonator may improve the coupling between the source and the repeater resonator at a larger separation distance between the source and the device.

In some embodiments two or more repeater resonators may be used in a wireless power transfer system. In some embodiments two or more repeater resonators with two or more sources or devices may be used.

Under Cabinet Lighting with Repeater Resonators

Figure 77:
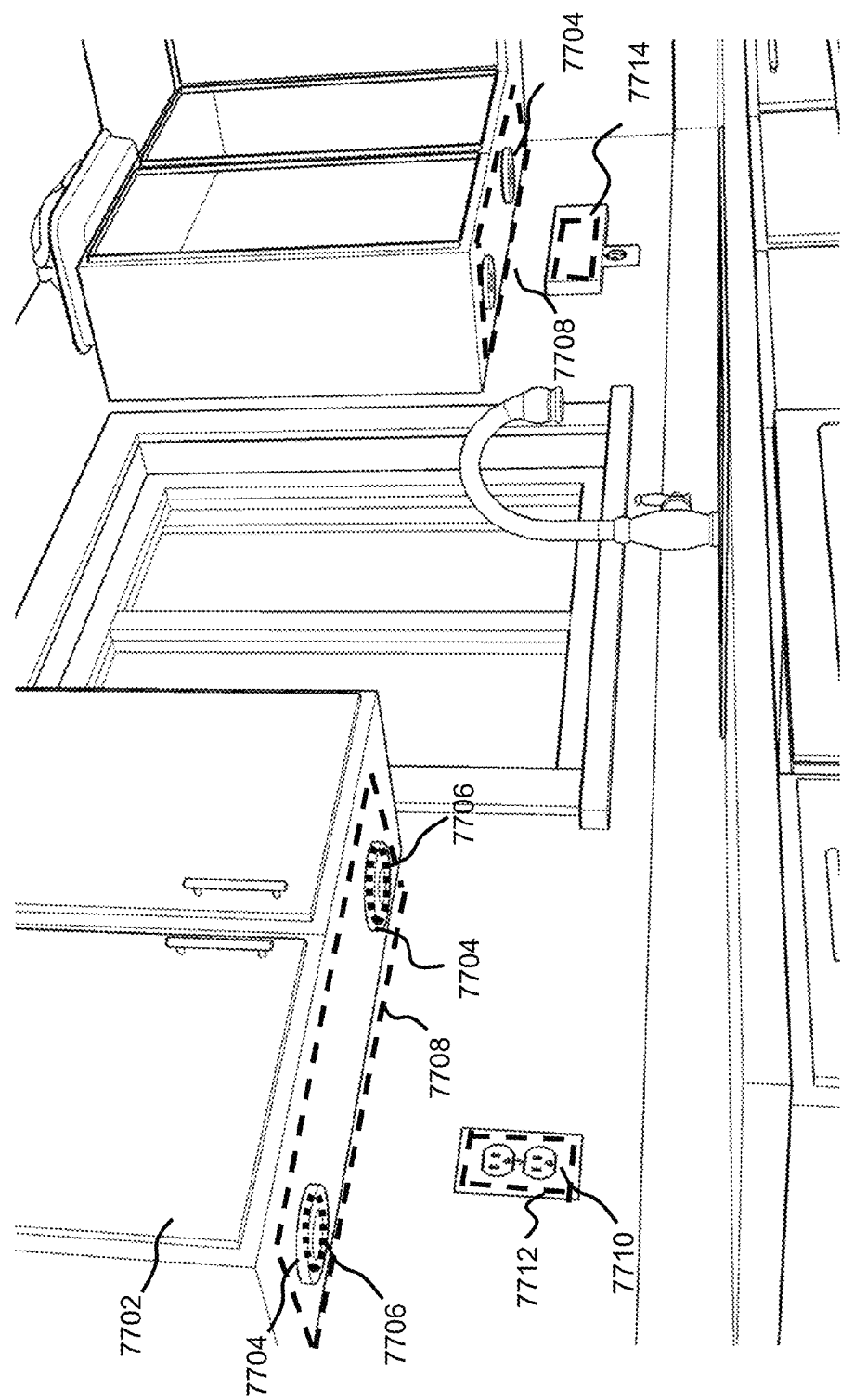
FIG. 77 is a diagram showing under the cabinet lighting application with repeater resonators.

A repeater resonator may be used to enhance power transfer in lighting applications. One example application of a wireless power transfer system using a repeater resonator is shown in FIG. 77 for a kitchen lighting configuration. Power transfer between a source resonator 7712, 7714 and a device resonator 7706 built into a light 7704 may be enhanced or improved, by an additional repeater resonator 7708 positioned above or next to the lights 7704 or the device resonators 7706.

The addition of a larger repeater resonator next to the lights may increase the coupling and power transfer efficiency between the source and the lights and may allow the use of smaller, less obtrusive, and more efficient sources or source resonators, or smaller lights, or device resonators.

In embodiments, the repeater resonator may be a capacitively loaded loop wound in a planar, flat, rectangular coil sized to fit inside of a cabinet. The repeater resonator may be integrated into a rigid or flexible pad or housing allowing placement of regular cabinet contents on top of the resonator. The repeater resonator may be incorporated in materials typically used to line cabinets such as contact paper, mats, non-skid placemats, and the like. In embodiments the repeater resonator may be designed to attach to the bottom of the cabinet and may be integrated with an attachment mechanism or attachment points for lights. In some embodiments the lights may not require additional device resonators but may directly connect or may be integrated into the repeater resonator.

In embodiments a device resonator may be built into the light and designed to couple to the repeater resonator. Each light may be integrated with its own device resonator and power and control circuitry described herein. Each light my include appropriate AC to AC, AC to DC, or DC to DC converters and drivers to power and control the light emitting portion of the device. With a repeater resonator above the device resonators embedded in the lights, it may be possible to position the lights anywhere under the cabinet with freedom to point and move the light at specific areas or points under the cabinet. The lights with the integrated resonators and device power and control circuitry may be attached to the bottom of the cabinet using adhesives, or any number of known fasteners.

Figure 78:
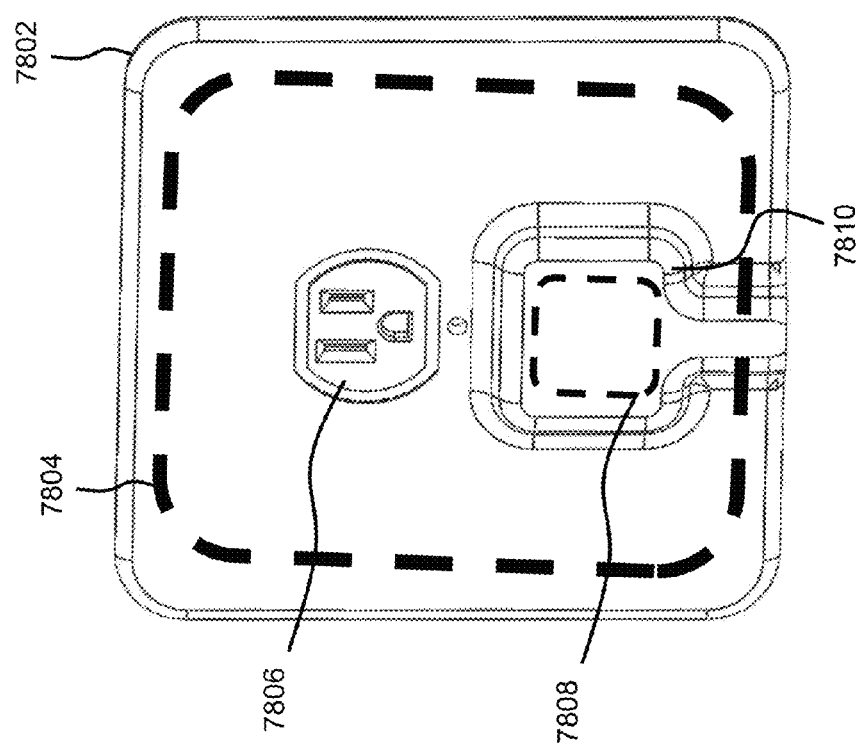
FIG. 78 is a diagram showing a source integrated into an outlet cover.

In embodiments the source resonator may be integrated in a source that is an electrical outlet cover or any type of wall plate. One example of a source for under cabinet lighting is depicted in FIG. 78. The source resonator 7804 may be integrated into a cover of an electrical outlet 7802 that may cover and fit around an existing outlet 7806. The power and control circuitry 7808 of the source may be integrated into the cover. The cover may plug-in or connect to one of the outlets allowing the power and control circuitry to be powered directly from the outlet with 120 VAC or 230 VAC, and the like, making the source self contained and not requiring any additional wiring, plugs, electrical outlets, junction boxes, and the like. The source may be retrofitted by end users by replacing the receptacle cover with the wireless source cover.

In embodiments the source resonator may be integrated in a source that plugs into an electrical located under the cabinet. The source may extend out or around the electrical outlet providing an extended volume or box into which the resonator and the power and control circuitry may be integrated.

In embodiments the source resonator may be designed to replace a complete outlet, where the outlet box or outlet junction box may be used for the power and control circuitry of the source. The cover replacing the outlet may have a similar shape or look as a functional outlet cover but may have a resonator integrated into the perimeter of the cover for transferring wireless power. In embodiments, the cover may be decorative to match the kitchen furnishings. In embodiments, the wireless power circuit may include fault interrupt circuits and other necessary safety, power saving, or regulatory circuits.

In embodiments the source may include manual or automatic switches or sensors for turning the source on or off and thereby allowing a central place for switching on or off the wirelessly powered lights. The source may be integrated with a timer or light sensor to automatically turn on or off when other lights in the area or turned on or off. For example, the wireless power transfer system may include motion sensors or timers to turn lights on and off according to the detected presence of someone in the room or a certain time of day.

In one example configuration, a 15 cm by 15 cm source resonator comprising 10 turns of Litz wire and having a quality factor Q greater than 100 is attached to a wall, 23 cm below a hanging cabinet. One round light with an integrated 7.5 cm diameter resonator comprising eight turns of Litz wire and having a quality factor greater than 100 is mounted 23 cm above the source resonator on the bottom of the cabinet. A rectangular repeater resonator, 29 cm by 86 cm, comprising 10 turns of Litz wire and having a quality factor greater than 100 is placed inside a cabinet 24 cm above the source. In this exemplary embodiment, the repeater resonator is used to enhance the efficiency of power transfer between the wall-mounted source and the under-cabinet-mounted lights. Without the repeater resonator, the efficiency of power transfer was less than 5%. With the repeater resonator positioned as described, the efficiency of power transfer was greater than 50%.

Note that while certain embodiments have been described in terms of one source resonator and one device resonator, systems using multiple sources and/or multiple devices are encompassed by this description. Note too that the resonators may be tuned to be either source resonators, device resonators, or repeater resonators, simultaneously or alternately.

High Power Resonator Enclosures

In embodiments, high-Q resonators and power and control circuitry may require special packaging or enclosures that confine high voltages or currents to within the enclosure, that protect the resonators and electrical components from weather, moisture, sand, dust, and other external elements, as well as from impacts, vibrations, scrapes, explosions, and other mechanical shocks. In embodiments, the packaging and enclosure may require special considerations for thermal dissipation to maintain an operating temperature range for the electrical components and the resonator in the enclosure. The packaging and enclosures may require special considerations to reduce losses or energy dissipation in materials or components of the enclosure or surroundings during wireless power transfer.

Figure 79:
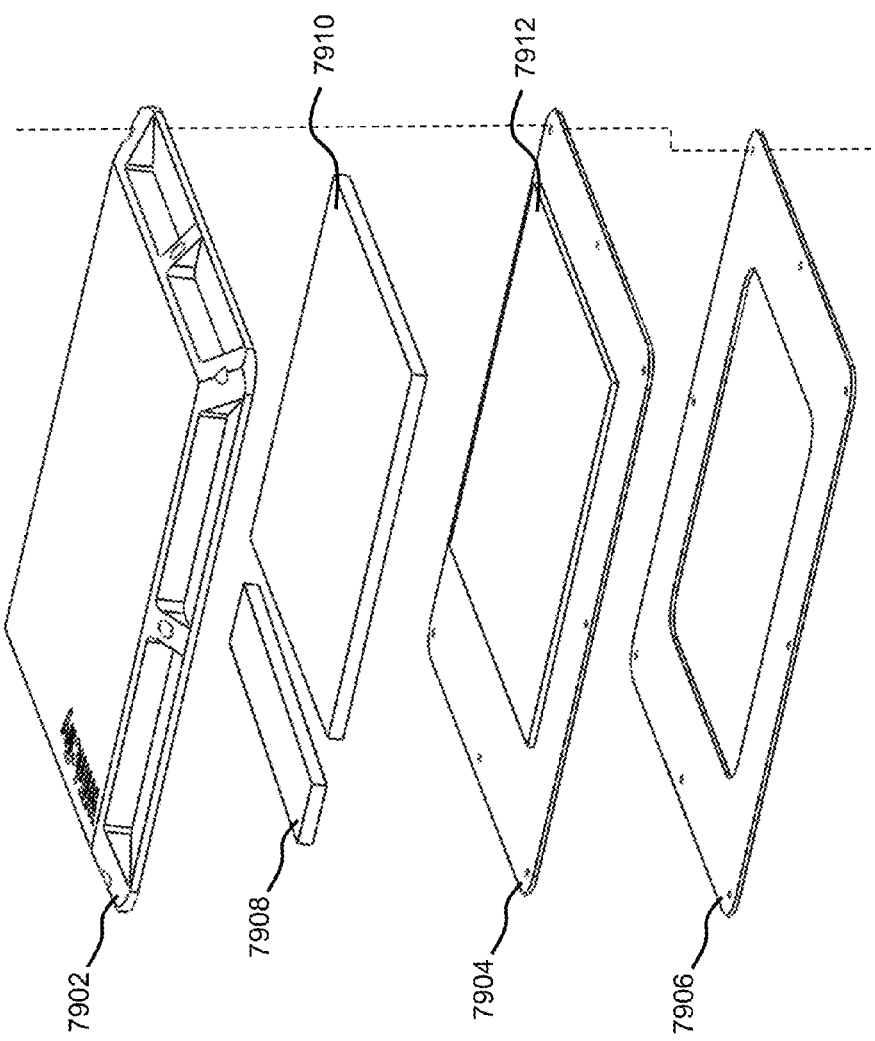
FIG. 79 is an exploded view of a resonator enclosure.

An exploded view of one embodiment of a resonator enclosure designed for vehicle charging applications is shown in FIG. 79. The enclosure includes a support plate 7906, a layer or sheet of a good conductor 7904 a separator piece 7912, and an enclosure cover 7902 that encloses the resonator 7910, any or all of the power and control circuitry or electronic components 7908, and any or all of the enclosure pieces. The support plate 7906 may be made from rigid materials that may support the structural integrity of the enclosure. For example, the support plate may be made from aluminum, steel, cast iron, brass, wood, plastic, any type of composite material, and the like, that provides sufficient rigidity for mounting the cover and sustaining the weight of the resonator which in some embodiments may be as much as 10 kilograms or as much as 20 kilograms. The support plate may comprise mounting holes for mounting the enclosure to a vehicle, in this exemplary embodiment.

A layer or sheet of good conductor 7904 may be included above the support plate 7406. In some embodiments the layer or sheet of good conductor may be electrically and/or thermally isolated from the support plate. In other embodiments, it may be preferable to have the layer or sheet of good conductor in electrical and/or thermal contact with the support plate.

A separator piece 7912 may be located on top of the conductor sheet and may provide a certain separation distance between the layer or sheet of good conductor and the resonator 7910. The preferable separation between the layer or sheet of good conductor and the resonator may depend on the operating frequency of the resonators, the dimensions of the resonators, the materials comprised by the resonators, the power level that will be transferred, the materials surrounding the resonators, and the like.

An enclosure cover 7902 may attach to the support plate in a manner that covers or encloses and protects the internal resonator and any internal components. For the enclosure design of FIG. 79, it may be preferable to use a planar resonator such as that depicted in FIG. 11(*a*) comprising a conductor wrapped around a rectangular form of magnetic material.

In embodiments, the layer or sheet of good conductor may comprise any high conductivity materials such as copper, silver, aluminum, and the like. In embodiments, the layer or sheet of good conductor may be thicker than the skin depth of the conductor at the resonator operating frequency. In embodiments, the layer or sheet of good conductor may be thicker than a few times the skin depth of the conductor at the resonator operating frequency. In embodiments, it may be beneficial for the conductor sheet to be larger than the size of the resonator, or to extend beyond the physical extent of the resonator, to shield the resonator from lossy and/or metallic materials that may be outside the enclosure and behind or beneath the support plate 7906. In embodiments the conductor sheet may extend at least 1 cm past the perimeter of the resonator. In other embodiments the conductor sheet may extend at least 2 cm past the perimeter of the resonator. In embodiments, the size of the conducting sheet may be chosen so that the perturbed Q of the mounted resonator is at least 2% of the perturbed Q of the resonator in the unmounted enclosure. In embodiments, the size of the conducting sheet may be chosen so that the perturbed Q of the mounted resonator is at least 10% of the perturbed Q of the resonator in the unmounted enclosure. In other embodiments, the size of the conducting sheet may be chosen so that the perturbed Q of the mounted resonator is at least 25% of the perturbed Q of the resonator in the unmounted enclosure. In embodiments, the size of the conducting sheet may be chosen so that the perturbed Q of the mounted resonator is at least 50% of the perturbed Q of the resonator in the unmounted enclosure. In other embodiments the conductor sheet may be as large as possible and still fitting into the enclosure.

In embodiments the separator piece, that provides spacing between the conductor sheet and the resonator may be an electrical insulator. In embodiments it may be advantageous for the separator piece to also be a good thermal conductor that may provide for heat dissipation from the resonator. In embodiments the separator piece may include provisions for active cooling comprising air or coolant circulation. The separator piece may be approximately the same size of the resonator of the enclosure or it may be smaller than the resonator. The size of the separator piece may depend on the rigidity of the resonator. In embodiments the separator piece may provide for at least of 0.5 cm of spacing between the resonator and the conductor sheet. In other embodiments the separator piece may provide for at least of 1 cm of spacing between the resonator and the conductor sheet. In embodiments, the separator sheet may be shaped to provide more separation for certain portions of the resonator.

In embodiments, the thickness and material of the separator piece may be chosen so that the perturbed Q of the enclosed resonator is at least 2% of the unperturbed Q. In embodiments, the thickness and material of the separator piece may be chosen so that the perturbed Q of the enclosed resonator is at least 10% of the unperturbed Q. In embodiments, the thickness and material of the separator piece may be chosen so that the perturbed Q of the enclosed resonator is at least 25% of the unperturbed Q. In embodiments, the thickness and material of the separator piece may be chosen so that the perturbed Q of the enclosed resonator is at least 50% of the unperturbed Q.

In embodiments the enclosure cover may be made of a non-lossy material, preferably of a non-metallic material. In embodiments the enclosure cover may be made from plastic, nylon, Teflon, Rexolite, ABS (Acrylonitrile butadiene styrene), rubber, PVC (Polyvinyl chloride), acrylic, polystyrene, and the like. The material may be chosen to provide for sufficient structural strength to protect the resonator from impact, vibrations, and the sustained load on the cover. The material may be chosen to withstand the operating environment envisioned for the vehicle.

In embodiments, the enclosure may include additional layers to give added support, rigidity, ruggedness, tolerance, survivability, and the like. In embodiments, the enclosure may be mounted behind a Kevlar sheet or layer, or may be wrapped in Kevlar, in order to withstand bullets, grenades, improvised explosive devices (IEDs), and other weaponry. In environments, the enclosures may comprise special thermal materials, electrical materials, weatherproof materials, optical materials, and the like. In embodiments, the enclosures may include materials or parts to enable safety systems, control systems, monitoring systems, billing systems, and the like.

In some embodiments the enclosure and packaging may comprise electronic components and circuits. The electronic components may include capacitors, inductors, switches, and the like, of the resonator or capacitors, inductors, switches, and the like, used for impedance matching. In some embodiments the enclosure may enclose any and all parts of the power and control circuitry including amplifiers, rectifiers, controllers, voltage sensors, current sensors, temperature sensors, and the like. The power and control circuitry may require additional cooling or temperature regulation and may require an active cooling system or a connection to an external active cooling system that circulates air or coolant through the enclosure or parts of the enclosure. In embodiments it may be preferable to position or locate the electric or electronic components such that they are not in-line with the dipole moment of the resonator. In embodiments it may be preferable to position or locate the electric or electronic components such that they minimize the perturbed Q of the resonator. In embodiments it may be preferable to position or locate the electric or electronic components underneath the layer or sheet of good conductor in the enclosure, so that the components are shielded from the electromagnetic fields generated by the resonator, and so the resonator is shielded from the lossy portions of the electric and electronic enclosure.

Figure 80:
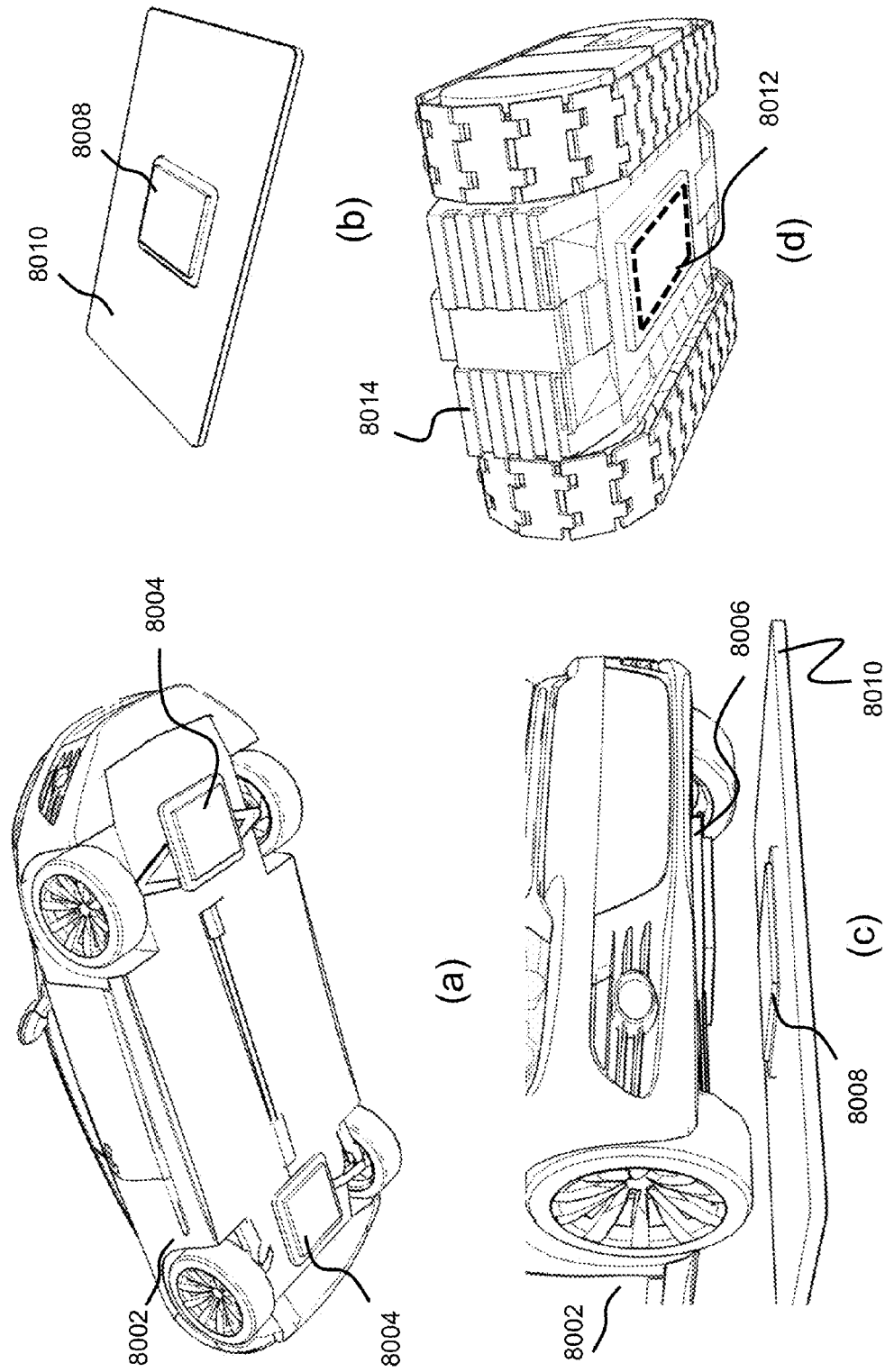
FIG. 80 (*a*) is a vehicle with device resonators mounded on the underside, (*b*) is a source resonator integrated into a mat, (*c*) is a vehicle with a device resonator and a source integrated with a mat, and (*d*) is a robot with a device resonator mounted to the underside.

The enclosures with device resonators may be sized and designed to mount under a car, robot, a cart, a scooter, a motorcycle, a bike, a motorized dolly or platform, a forklift, a piece of construction equipment, a truck, or any other vehicle. A few exemplary mounting and charging configurations are as shown in FIG. 80. The device and source resonators and enclosures may be sized and configured for the appropriate power levels for each application which may be more than 3 kW for a car charging system or may be 500 W for a robot charging system. The device resonator may be configured to receive energy from a source resonator and may be used to recharge batteries, power electronics or devices, and the like of the vehicle. One or more of the enclosures and device resonators 8004 may be mounted on the underside of a vehicle 8002, in the front of the vehicle, towards the back of the vehicle, and the like as depicted in FIG. 80(*a*). A vehicle may have one enclosure mounted on the underside or it may have multiple resonators with enclosures mounted on the underside.

In embodiments the resonator and the enclosure may be mounted inside the vehicle. In some vehicles the floor panels, the wheel wells, the spare tire well, or other parts of the car may be constructed of non-lossy or non non-metallic material, such as plastic, carbon fiber, composites, and the like, providing a window for the magnetic fields to pass through while the resonator is inside the car.

In embodiments, the device resonator may include connections to the vehicle for coolant to provide active cooling or heating to the electronics, components, and resonators inside the enclosure.

In embodiments the source resonator may be mounted in an enclosure 8008 and integrated into a rubber mat 8010, or a platform as depicted in FIG. 80(b). The rubber mat and enclosure may be placed on the floor of a garage or parking space and may connect to a power source allowing wireless power transfer to a vehicle when a vehicle drives over the pad and the source resonator aligning the device resonator with the source resonator as depicted in FIG. 80(c).

An appropriately size enclosure and resonator 8012 may be designed to fit on the underside of a robot, a remotely controlled or an autonomous vehicle 8014. The robot may be designed with a docking cage or charging area with a source resonator that may transfer electrical power to the robot.

Passive Component Compensation

Parameters of electrical components of a wireless power transfer system may be impacted by environmental conditions and/or operating parameters or characteristics of the system. The electrical values and performance of components may be impacted by the temperature, humidity, vibration, and the like of the environment and the wireless power transfer system modules. Changes in temperature for example, may change the capacitance of capacitors, the inductance of the conducting loop inductor, the loss of magnetic materials, and the like. High ambient temperatures may affect electrical components, changing their parameters, which may in turn impact the parameters of the wireless power transfer system. For example, a rise in ambient temperature may increase the capacitance of a capacitor which may shift or change the resonant frequency of a resonator in a wireless power transfer system which in turn may impact efficiency of the power transfer.

In some applications the changes of parameters due to the operating point or operation of the system may negatively impact wireless power transfer. For example, operating a wireless power transfer system at high power levels may require large electrical currents in components causing increased power dissipation and a temperature increase of the components. The temperature increase may affect the capacitance, inductance, resistance, and the like of the components and can affect the efficiency, resonant frequency, and the like of the wireless power transfer system.

In some applications the changes of parameters due to the operating point may create a runaway effect that may negatively impact the performance of the wireless power transfer system. For example, power transfer and operation may heat components of the resonator, such as the capacitors, changing their effective capacitance. The change in capacitance may shift the resonant frequency of the resonator and may cause a drop in power transfer efficiency. The drop in power transfer efficiency may in turn lead to increased heating of components causing further change in capacitance, causing a larger shift in resonant frequency, and so on.

Figure 81:
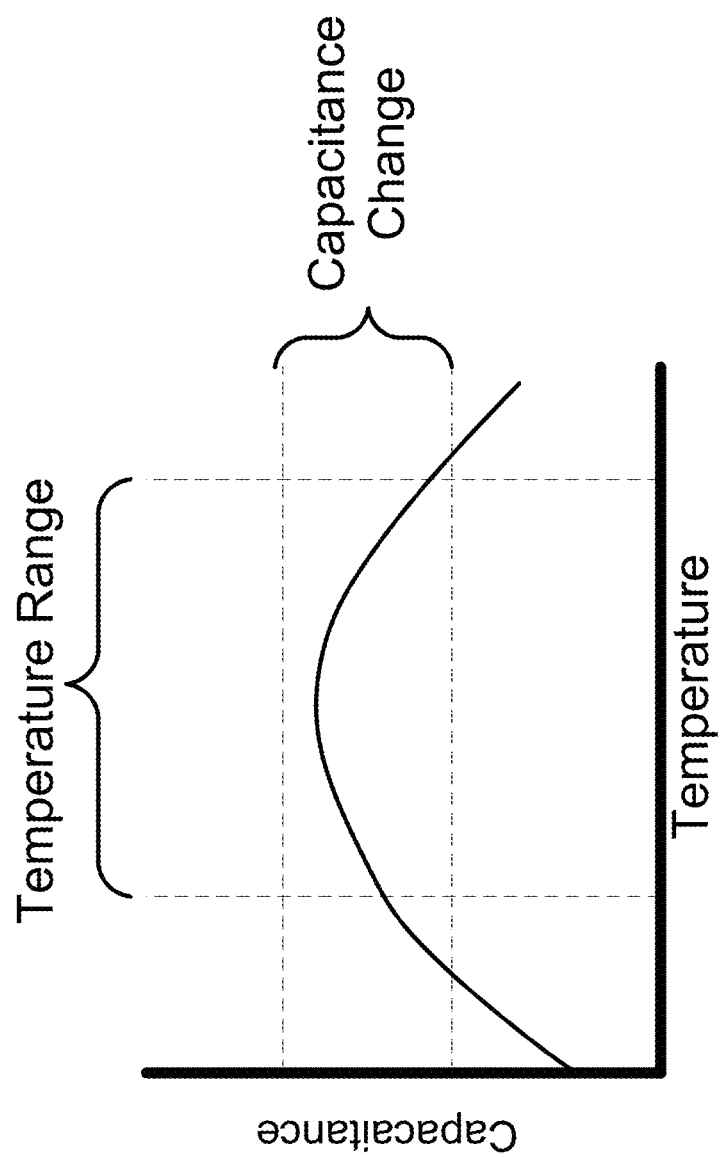
FIG. 81 is a graph showing capacitance changes due to temperature of one ceramic capacitor.

FIG. 81 shows a plot of the effect of temperature on the capacitance of one commercially available ceramic capacitor. Over the working temperature range of the capacitor, the capacitance value may change by 20%. For some technologies or types of capacitors the capacitance change over the working temperature range may be as much as 50% or 200% or more. The capacitance change as a function of temperature may be a monotonically increasing or decreasing function of temperature or it may be a complex function with one or more maxima and minima at one or more different temperatures. The shape and behavior of the capacitance curve as a function of temperature may be a design parameter for various capacitors technologies and the specific characteristics of a batch of components may be tailored extent during the design and manufacturing and of certain components. The design of temperature characteristics may be a tradeoff between other parameters such as breakdown voltage, total capacitance, temperature range, and the like and therefore for some applications the capacitance variations over its temperature range may not be completely customizable or optimizable.

In embodiments of a wireless power transfer system, components such as capacitors may be used in various parts of the system. Electrical components, such as capacitors, for example, may be used as part of the resonator and may set the resonant frequency of the resonator. Electrical components, such as capacitors, may be used in an impedance matching network between the power source and the resonator and in other parts of the circuits as described herein. Changes in parameters of the components due to temperature may affect important characteristics of the wireless power transfer system such as the quality factor of the resonance, resonator frequency and impedance, system efficiency and power delivery and the like.

In some embodiments the changes in parameter values of components may be compensated with active tuning circuits comprising tunable components. Circuits which monitor the operating environment and operating point of components and system may be integrated in the design. The monitoring circuits may include tunable components that actively compensate for the changes in parameters. For example, a temperature reading may be used to calculate expected changes in capacitance of the system allowing compensation by switching in extra capacitors or tuning capacitors to maintain the desired capacitance.

In some embodiments the changes in parameters of components may be compensated with active cooling, heating, active environment conditioning, and the like.

Figure 82:
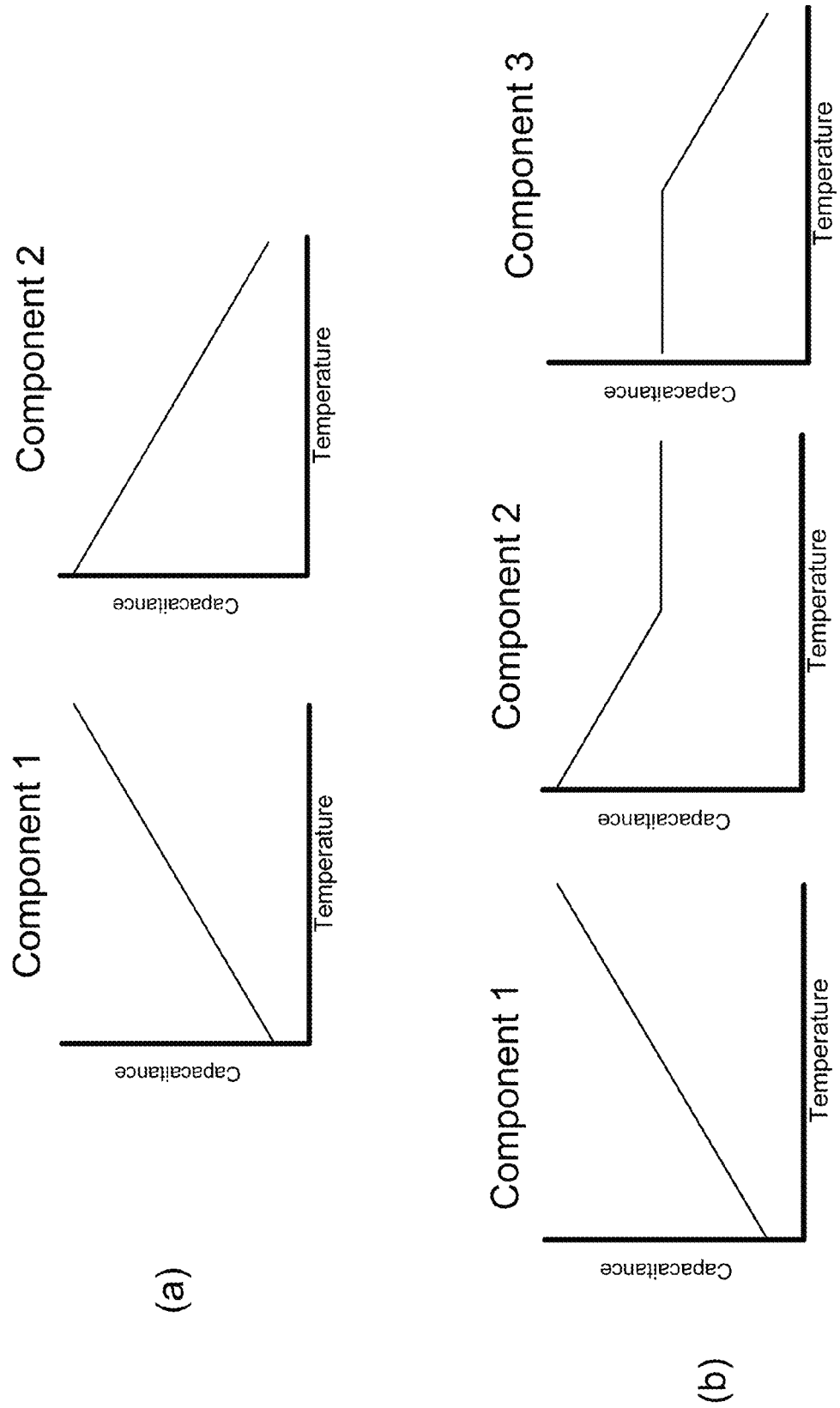
FIG. 82(*a*) are example capacitance versus temperature profiles of two components which can be used for passive compensation (*b*) are example capacitance versus temperature profiles of three components which can be used for passive compensations.

In some embodiments changes in parameters of components may be mitigated by selecting components with characteristics that change in a complimentary or opposite way or direction when subjected to differences in operating environment or operating point. A system may be designed with components, such as capacitors, that have opposite dependence or parameter fluctuations due to temperature, power levels, frequency, and the like. For example, some capacitors or other components of the system may be selected or designed such that they have positive temperature coefficient over a specific temperature range, i.e. the capacitance of the component increases as the temperature increases as shown in FIG. 82(a). Some capacitors or other components in the system may be selected or designed such that they have a negative temperature coefficient over a specific temperature range, i.e. the capacitance of the component decreases as the temperature decreases as shown in the second plot of FIG. 82(a). By selecting the coefficients appropriately a parallel placement of the two capacitor components with the opposite temperature coefficients may cancel out capacitance variations due to a temperature change. That is, as the capacitance of one component rises due a rise in temperature, the capacitance of the other component will decreases thereby causing a net zero change in the overall capacitance.

The passive parameter variation compensation may be advantageous for many applications. A passive compensation method may be less expensive and simpler than an active tuning method since no active sensors and no control or controller may be needed. A passive compensation method may be advantageous for applications where traditional controllers and sensors may not function or may be difficult to deploy. High temperatures, high radiation environments may make digital or analog active monitoring and control circuitry impractical or impossible to deploy. A passive compensation method may have higher reliability, may be smaller and less expensive, because it requires fewer net components to achieve system performance stabilization.

In embodiments the passive compensation method may be combined with active tuning and control methods or systems. Passive compensation may reduce the range over which an active tuning and control method and system may need to operate or compensate. In some embodiments the compensation due to passive components may not be adequate. Variations in thermal coefficients or component values may result in imperfect passive compensation and require additional active tuning An addition of passive compensation to active tuning method may reduce the required tuning range requirement for the active tuning method. The active tuning may only be required to compensate for small changes and imperfections due to incomplete or partial passive tuning compensation, which may be a small fraction of the total change in parameters that would have required compensation if passive compensation was not included in the system.

In some embodiments the passive compensation may be implemented over a complete temperature range or operation range of the system. In some embodiments passive compensation may be implemented over a partial temperature or operation range of the system and may require extra tuning from an active tuning system or method.

Passive compensation may be achieved by various arrangements of components with various thermal parameters using components placed in series, parallel, or in any combination thereof. Passive compensation may be achieved with at least two components having different parameter variations that result from the same environmental or component changes. In some embodiments it may be necessary to use three or more components placed in series, parallel, or any combination thereof to obtain the necessary compensation over a desired range. For example, three components with capacitance curves shown in FIG. 82(*b*) may be placed in parallel to achieve passive compensation due to capacitance variations over their complete temperature range. In some embodiments one component may be used to offset the variation of several components.

In some system embodiments, specific parts of a resonator or system may be exposed to larger parameter fluctuations than other parts. For example, some parts of the circuits may heat more than others, due to localized exposure to sun, a heat source, higher loss components, an enclosure or ventilation block, and the like. It some systems it may be advantageous to distribute the components throughout an enclosure, resonator, circuit, or design to prevent temperature differences of temperature gradients that may affect components in a non-symmetric way.

In some embodiments the variation of component parameters may be used as a safety mechanism or they may be used to adjust or enhance parameters of power transfer. Components may be chosen or designed to have a specific or predetermined parameter deviation. For example, components, such as capacitors, may be chosen to have a sharp increase or decrease in capacitance beyond, below, or in between a certain temperature value. Capacitors with capacitance curves that have a sharp increase after a specific temperature may used in a device or power capture resonator to automatically detune the device resonator when a threshold temperature is reached. Such a characteristic may be used as a passive safety feature since excessive heat may mean that a device is exceeding its power rating. With proper component selection, the components may detune a device resonator from the resonant frequency of the source reducing the power captured by the device resonator preventing overheating or exceeding power ratings of the devices.

It is to be understood that the methods and designs outlined in this section are applicable to many different types of electrical components and many types of parameter variations. Although the methods and designs were outlined primarily using capacitors, capacitance, and temperature as the cause of capacitance variations it should be clear to those skilled in the art that the methods and designs may be used in a variety of other components of a wireless power transfer system. Similar behavior may be exploited to compensate for changes of inductance of inductors, capacitance of resonators, reluctance and loss of magnetic materials, and the like due to temperature variations, voltage levels, current levels, humidity, vibration, barometric pressure, magnetic field strength, electric field strength, exposure to the elements, and the like.

In some embodiments the variations of parameters of one type of component may be compensated with a variation of another type of component. For example, variations in inductance of the resonator coil may be compensated by temperature variations of other components such as capacitors.

Electrical elements with the passive compensation may be placed in series, or in parallel, or may be distributed across the inductors of a resonator, a wireless power source, or a wireless power device.

Exemplary Resonator Optimizations

Properties or performance of resonators and the parameters of wireless power transfer may be affected by changes in the structure, configuration, or operation of the resonators. Changes to the resonator configurations, structures, or operation may be used to optimize the quality factor of the resonator, change the distribution of magnetic fields, reduce losses, or reduce or change the interactions of the resonator with other objects.

Figure 83:
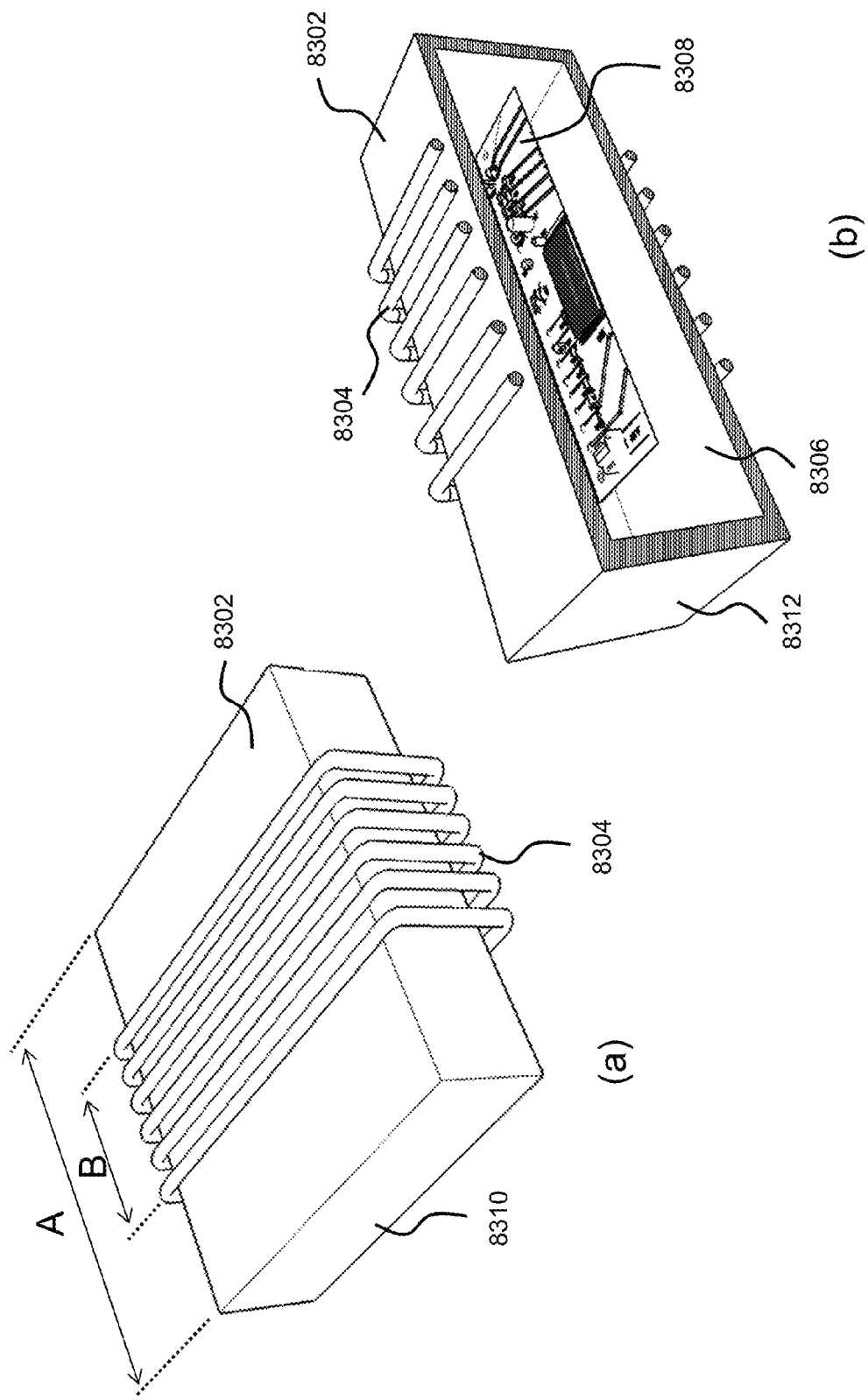
FIG. 83 (*a*) is diagram of a resonator showing the span of the conductor, (*b*) is a cross section of resonator that has a hollow compartment.

In embodiments, the span of the conductor loops wrapped around magnetic material may affect the magnetic field distribution around the resonator. For a planar resonator structure, or a resonator comprising a conductor wrapped around magnetic material such as depicted in FIG. 83(*a*), the distribution of the magnetic field around the structure may be altered or affected by the span of the conductor winding. A conductor 8304 wrapped around a core of magnetic material 8302 that comprises the resonator structure may be wrapped to have a specific span that covers the magnetic material (the span is depicted by the dimension B in FIG. 83(*a*)). This span or dimension may be chosen or modified, for example, by winding the conductor with larger or smaller spacing between individual conductor loops, by varying the number of loops of the conductor around the magnetic material, and the like. The span of the conductor loops, compared to the span or dimension of the magnetic material around which the conductor is wrapped (defined as dimension A in FIG. 83(*a*)), may affect the maximum magnetic fields generated or localized around the resonator. For example, when the span of the conductor (dimension B in FIG. 83(*a*)) is substantially equal to the length of the magnetic material around which the conductor is wrapped (dimension A in FIG. 83(a)), the magnetic fields generated or induced in the resonator may be guided and concentrated by the conductor loops to the ends of the magnetic material resulting in relatively high magnetic fields at the endpoints of the magnetic material of the resonator 8310. If the span of the conductor is much smaller than the length of the magnetic material around which the conductor is wrapped, the magnetic fields generated by the resonator may be concentrated close to the conductor loops resulting in a high magnetic field at those locations. For some systems or applications, the maximum magnetic field strength around the resonator may be a critical parameter and it may be preferable ensure that the magnetic fields are, as much as possible, substantially evenly distributed around the resonator as to eliminate or reduce "magnetic field hot spots" or areas with a relatively high magnetic field compared to other areas around the resonator. For a more uniform field distribution it may be preferable to have the conductor loops span substantially 50% of the total length of the core material and be centered such that equal amounts of the magnetic material extend past the conductor loops in the direction of the dipole moment of the resonator. For systems or applications for which the maximum magnetic field strength around a resonator may be a critical parameter it may be preferable to have the span of the magnetic material to be substantially twice the span of the conductor wrapped around the magnetic material 8304.

The differences in distribution of the magnetic fields were observed when finite element method simulations were performed comparing the maximum magnetic field strengths for three different spans of conductor winding on the same magnetic material structure. The simulations modeled wireless power transfer between resonators comprising a block of magnetic material 45 cm wide by 45 cm long by 1 cm thick. The maximum magnetic field strengths were calculated for a configuration transferring 3.3 kW of power at a 21 cm separation between the two resonators operating and resonant at 175 kHz. The fields were calculated for resonators with ten loops of conductor wrapped around the magnetic material with a span of 10 cm, 20 cm, and 30 cm. For the configuration having a conductor span of 20 cm, that is roughly half the span of the magnetic material, the maximum magnetic field at a distance of 3 cm from the device resonator was $0.75 \times 10^{-3}$ T RMS. For the conductor spans of 10 cm and 30 cm the maximum magnetic field strengths were both $0.95 \times 10^{-3}$ T RMS and concentrated at the conductor or at the ends of the magnetic material respectively.

In systems and applications for which the maximum magnetic field strength may be a critical parameter it may also be preferable to reduce sharp edges or corners of the magnetic material that is wrapped with the conductor loops. It may be preferable to chamfer or radius the corners of the magnetic material.

In embodiments, positioning power and control circuitry of a resonator in an enclosure comprising magnetic material may be used to optimize the perturbed quality factor of a resonator. External circuit boards or electronics which may be part of the power and control circuitry and are often required to be located near a resonator may affect the parameters of the resonator and the wireless power transfer system. A circuit board or electronic components may load the resonator, induce losses, and affect the capacitance, quality factor, inductance, and the like of the resonator. In embodiments the power and control circuitry, which may include amplifiers, power converters, microprocessors, switches, circuit boards, and other lossy objects may be completely or partially enclosed inside the magnetic material of a resonator which may eliminate or reduce the perturbing effects of the circuitry on the resonator parameters.

A drawing of one embodiment that uses the magnetic material of the resonator to house electronic components in shown in FIG. 83(b). The figure shows the cross section of a magnetic resonator that comprises conductor loops 8304 wrapped around magnetic material 8302. The magnetic material 8302 may be a hollow shell such that some or all of the power and control circuitry 8308 or other electrical or electronic circuitry and devices may be inside the magnetic material 8302. Positioning and enclosing circuitry inside the magnetic material of the resonator may eliminate or substantially reduce the perturbing Q of the electronics on the resonator intrinsic Q and the resulting wireless power transfer efficiency compared to the circuitry being placed outside, or close to the resonator but not enclosed in the magnetic material. The magnetic material enclosure may guide the oscillating magnetic fields generated by the conductor of the resonator or by an external source around and away from the circuitry and objects inside the magnetic material thereby preventing the magnetic fields from interacting with the lossy electronic components and/or other objects.

An exemplary 11 cm×5 cm×20 cm magnetic resonator comprising a hollow box of magnetic material with a 0.5 cm wall thickness and twenty loops of Litz wire conductor wrapped around the middle of the magnetic material may be used to demonstrate the impact of lossy materials on the quality factor of a resonator, and the ability of a hollow shell of magnetic material to reduce the perturbing Q of these lossy materials. The intrinsic Q of the exemplary resonator described above had a quality factor, Q=360. A circuit board, which in some embodiments may be a circuit board containing power and control circuitry, placed directly on top of the resonator conductor on the outside of the magnetic material perturbed the resonator and reduced the perturbed quality factor of the structure to 130. However, placing the same circuit board inside the hollow box of magnetic material that comprised the resonator had no effect on the quality factor of the resonator, yielding a perturbed quality factor substantially equal to the intrinsic quality factor.

In embodiments the magnetic material of a resonator may include holes, notches, gaps, and the like that may be used for ventilation, communication, wiring, connections, mounting holes, cooling, and the like. When the power and control circuitry is configured to be mounted inside the magnetic material holes may be required for connection to the conductor or Litz wire on the outside of the resonator. In embodiments the magnetic material may have additional holes, gaps, spaces, voids, and the like on some or all faces or areas of the magnetic material that may have a minimal impact the quality factor of the resonator. For example, for the design depicted in FIG. 83(b) the walls of magnetic material 8312 on the opposite ends of the dipole moment of the resonator are less critical than the magnetic material on other sides and in some embodiments where minimizing the weight or cost of the resonator is a priority.

In embodiments the enclosure of magnetic material may comprise one or more sections, parts, tiles, blocks, or layers of similar or different magnetic materials. In some embodiments the magnetic material may require a substrate or supporting structure on to which the magnetic material is fastened, glued, or attached. In some embodiments, the surface of the magnetic material on the inside of the enclosure may be lined with one or more layers of a good electrical conductor, such as copper, silver, and the like. The inside of the magnetic material enclosure may further be lined with electrical insulator to prevent short circuits between the enclosure and any internal electrical components or devices. In some embodiments it may be preferable for the magnetic material enclosure to be designed from multiple parts such that it may be disassembled or assembled providing access to the internal electronics and components. In embodiments the magnetic material enclosure may be part of, or integrated into, device packaging surrounding the electronics of the device and the power and control circuitry of the resonator. The conductor loops of the resonator may wrap around the whole of the device and magnetic material enclosure.

It should be clear to those skilled in the art that the shape of the magnetic material may include any number of extensions, protrusions, or various geometries while providing an enclosed structure in at least one part of the structure that can be used to completely or partially enclose objects such as circuit boards or electrical components. The designs and configurations may be further extended or modified to include features and designs described herein for resonators using magnetic materials or planar resonators such as using multiple conductors wrapped in orthogonal directions or combining the resonator with a capacitively loaded loop resonator without magnetic material.

Figure 84:
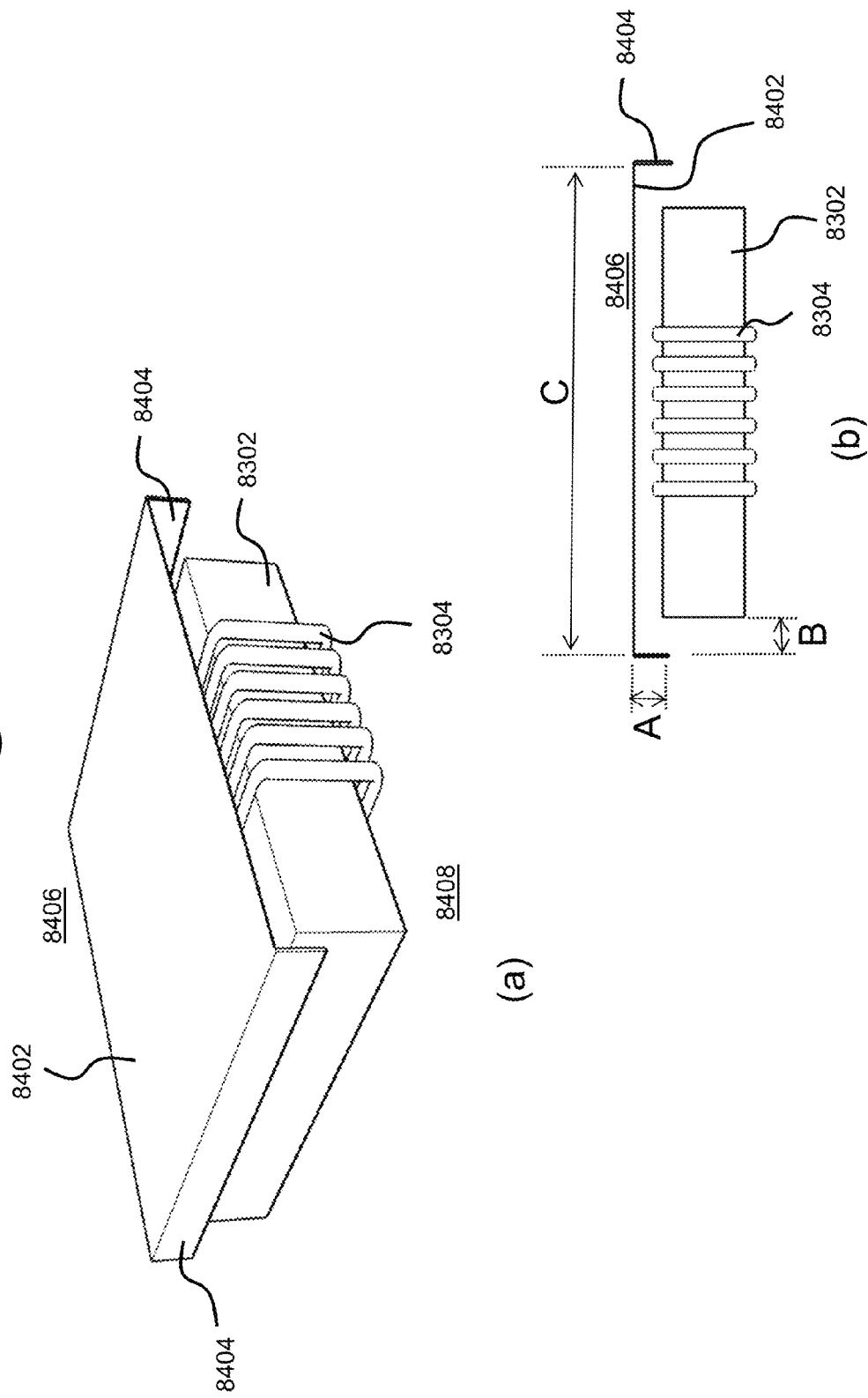
FIG. 84 (*a*) is an isometric view of a resonator with a conductor shield comprising flaps, (*b*) is a side view of a resonator with a conductor shield comprising flaps.

In embodiments, shaping a conductor sheet used for shielding a resonator from loss inducing objects may increase the effective size of the conductor shield or increase the coupling of the resonator without increasing the physical dimensions of the shield. Shaping a conductor shield may also reduce losses or energy dissipation into external objects during wireless power transfer and may increase the quality factor of the resonator in the presence of perturbing objects. As described herein, a sheet of high conductivity material positioned between a high-Q resonator and its surrounding environment may reduce losses due to energy dissipation in objects in the surrounding environment but on the opposite side of the conductor sheet, as shown in FIG. 21. The dimensions of the conductor sheet may be reduced, or the effectiveness of the conductor shield may be improved by shaping the edges of the conductor sheet so they deflect magnetic fields away from objects around the sheet. FIG. 84(*a*) depicts a shaped conductor sheet 8402 above a resonator comprising a conductor 8304 wrapped around a block of magnetic material 8302. In this configuration the conductor sheet 8402 shields any lossy objects above the sheet 8406 from the magnetic fields that may be induced or generated by the resonator below. In embodiments it may be preferable for the conductor sheet to have dimensions larger than the resonator or to extend past the resonator. In applications where the lossy objects are substantially larger than the resonator it may be beneficial to increase the dimensions or the size of the conductor sheet. However, in many applications the dimensions of the conductor sheet may be limited by practical considerations such as weight, available space, cost, and the like. The effectiveness or the effective size of the conductor sheet may be increased without increasing the physical area of the conductor sheet by shaping the edges of the conductor towards the resonator.

An exemplary embodiment of a conductor shield for the resonator comprising a conductor sheet with shaped edges is shown in FIG. 84(*a*) and FIG. 84(*b*). In this exemplary embodiment, the ends the conductor shield 8402 are shaped or bent down, towards the resonator, producing two flaps 8404. The shaped flaps 8404 of the conductor shield do not add to the overall length of the conductor shield (dimension C in FIG. 84), but may improve the effective shielding of the conductor from lossy objects above 8406 the conductor shield. The conductor flaps may deflect and guide the magnetic field downwards reducing the field strength on the sides of the resonator and reducing the field interactions with lossy objects that may be above, or near the edge of the conductor shield. This configuration and shape of the conductor shield may increase the effectiveness of the conductor shield without increasing the length (dimension C in FIG. 84).

In embodiments the shape, separation, and length of the conductor sheet flaps may be specifically configured for each application, environment, power level, positioning of other resonators, power transfer efficiency requirement, and the like. The length of the conductor shield flaps (dimension A in FIG. 84(*b*)) and the separation of the flaps from the resonator (dimension B in FIG. 84(*b*)) may be configured and changed to achieve desired power transfer parameters for each application In an exemplary embodiment, the effectiveness of the conductor sheet shaping in resonator shielding applications may be demonstrated by fine element method simulations for exemplary shapes and sizes of conductor shield over a resonator comprising a 32 cm×30 cm×1 cm block of magnetic material wrapped with 10 loops of a conductor, spanning 20 cm of the magnetic material and wrapped such that the axis of the loops is parallel to the longest edge of the magnetic material. The resonator has a resonant frequency of 175 kHz and is positioned approximately 2 cm from an infinite sheet of steel, with the largest face of the magnetic material of the resonator parallel to the steel sheet. The perturbed quality factor of the resonator in the presence of the infinite sheet of steel may be calculated for various sizes and shapes of the conductor shield positioned between the resonator and the steel sheet. Without any shielding the perturbed quality factor of the resonator is calculated to be approximately 24. Placing a flat (unshaped) 42 cm by 47 cm copper shield between the resonator and the steel sheet improved the perturbed Q of the resonator to 227. Placing a flat (unshaped) 50 cm by 50 cm copper shield between the resonator and the steel sheet improved the perturbed Q of the resonator to 372. Shaping the conductor shields so that they had the same 42 cm by 47 cm, and 50 cm by 50 cm footprints, but now included 2.5 cm flaps on all edges improved the perturbed quality factors to 422 and 574 respectively. This exemplary embodiment shows just one way a conducting sheet may be shaped to improve the perturbed quality factor of a shielded resonator without increasing the footprint of the conductor shield.

It should be clear to those skilled in the art that the shape, size, and geometry of the conductor flaps may be varied and configured from the exemplary embodiments. In some embodiments the conductor shield may only be shaped on the edges that are perpendicular to the dipole moment of the resonator as depicted in FIG. 84. In some embodiments the conductor shield may be shaped on all sides. In some embodiments the length, size, thickness and the like of the flaps may not be uniform around the resonator. The size of the flap may be smaller for the side of the resonator with fewer loss inducing objects and larger on the side where there may be more loss inducing objects. In some embodiments the flaps may have one or more bends or curves. The flaps may be angled at 90 degrees or less with respect to the plane of the conductor.

Repeater Resonator Modes of Operation

A repeater resonator may be used to enhance or improve wireless power transfer from a source to one or more resonators built into electronics that may be powered or charged on top of, next to, or inside of tables, desks, shelves, cabinets, beds, television stands, and other furniture, structures, and/or containers. A repeater resonator may be used to generate an energized surface, volume, or area on or next to furniture, structures, and/or containers, without requiring any wired electrical connections to a power source. A repeater resonator may be used to improve the coupling and wireless power transfer between a source that may be outside of the furniture, structures, and/or containers, and one or more devices in the vicinity of the furniture, structures, and/or containers.

Figure 85:
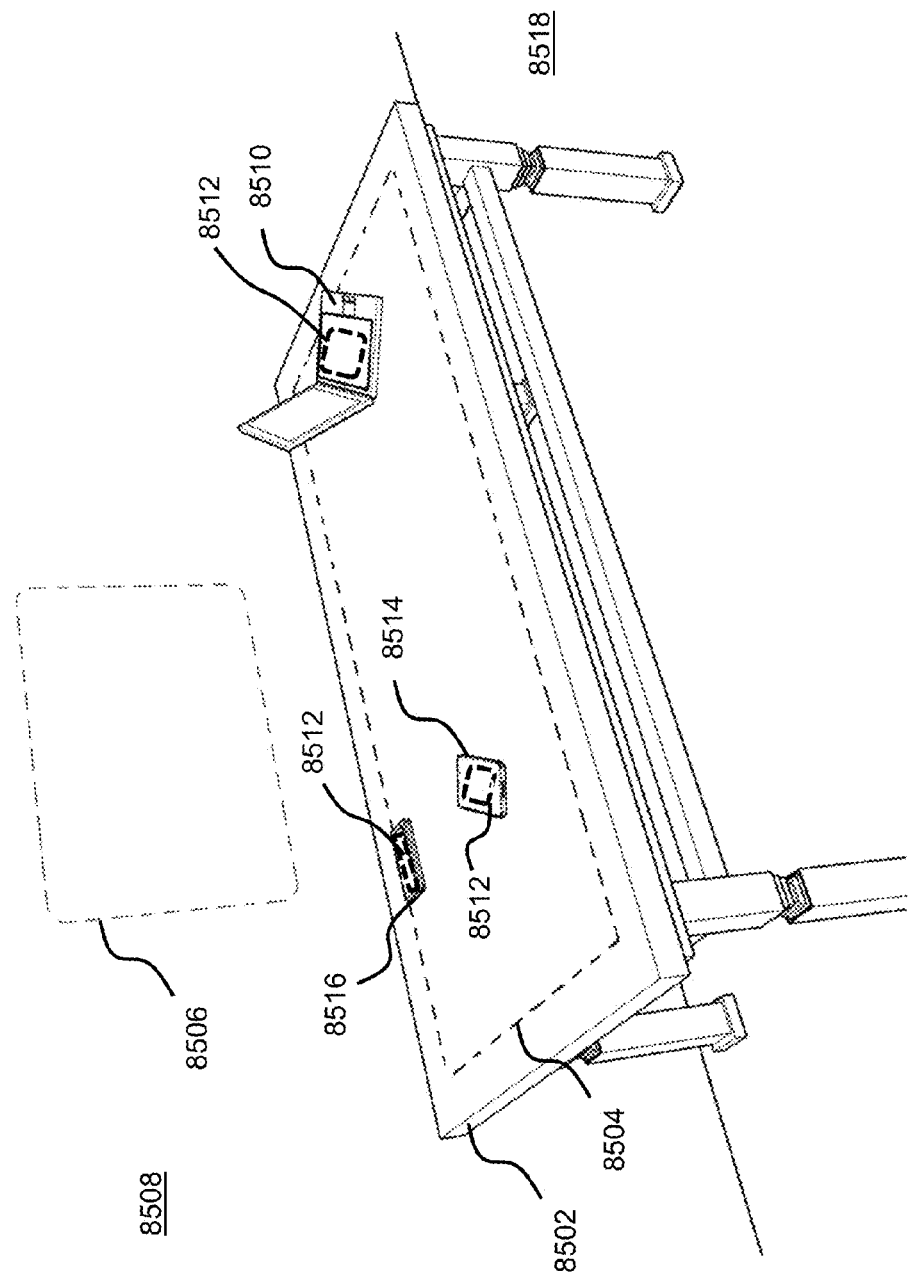
FIG. 85 is a diagram of a system utilizing a repeater resonator with a desk environment.

In one exemplary embodiment depicted in FIG. 85, a repeater resonator 8504 may be used with a table surface 8502 to energize the top of the table for powering or recharging of electronic devices 8510, 8516, 8514 that have integrated or attached device resonators 8512. The repeater resonator 8504 may be used to improve the wireless power transfer from the source 8506 to the device resonators 8512.

In some embodiments the power source and source resonator may be built into walls, floors, dividers, ceilings, partitions, wall coverings, floor coverings, and the like. A piece of furniture comprising a repeater resonator may be energized by positioning the furniture and the repeater resonator close to the wall, floor, ceiling, partition, wall covering, floor covering, and the like that includes the power source and source resonator. When close to the source resonator, and configured to have substantially the same resonant frequency as the source resonator, the repeater resonator may couple to the source resonator via oscillating magnetic fields generated by the source. The oscillating magnetic fields produce oscillating currents in the conductor loops of the repeater resonator generating an oscillating magnetic field, thereby extending, expanding, reorienting, concentrating, or changing the range or direction of the magnetic field generated by the power source and source resonator alone. The furniture including the repeater resonator may be effectively "plugged in" or energized and capable of providing wireless power to devices on top, below, or next to the furniture by placing the furniture next to the wall, floor, ceiling, etc. housing the power source and source resonator without requiring any physical wires or wired electrical connections between the furniture and the power source and source resonator. Wireless power from the repeater resonator may be supplied to device resonators and electronic devices in the vicinity of the repeater resonator. Power sources may include, but are not limited to, electrical outlets, the electric grid, generators, solar panels, fuel cells, wind turbines, batteries, super-capacitors and the like.

In embodiments, a repeater resonator may enhance the coupling and the efficiency of wireless power transfer to device resonators of small characteristic size, non-optimal orientation, and/or large separation from a source resonator. As described above in this document, and as shown in FIGS. 59, 60 and 72, the efficiency of wireless power transfer may be inversely proportional to the separation distance between a source and device resonator, and may be described relative to the characteristic size of the smaller of the source or device resonators. For example, a device resonator designed to be integrated into a mobile device such as a smart phone 8512, with a characteristic size of approximately 5 cm, may be much smaller than a source resonator 8506, designed to be mounted on a wall, with a characteristic size of 50 cm, and the separation between these two resonators may be 60 cm or more, or approximately twelve or more characteristic sizes of the device resonator, resulting in low power transfer efficiency. However, if a 50 cm×100 cm repeater resonator is integrated into a table, as shown in FIG. 85, the separation between the source and the repeater may be approximately one characteristic size of the source resonator, so that the efficiency of power transfer from the source to the repeater may be high. Likewise, the smart phone device resonator placed on top of the table or the repeater resonator, may have a separation distance of less than one characteristic size of the device resonator resulting in high efficiency of power transfer between the repeater resonator and the device resonator. While the total transfer efficiency between the source and device must take into account both of these coupling mechanisms, from the source to the repeater and from the repeater to the device, the use of a repeater resonator may provide for improved overall efficiency between the source and device resonators.

In embodiments, the repeater resonator may enhance the coupling and the efficiency of wireless power transfer between a source and a device if the dipole moments of the source and device resonators are not aligned or are positioned in non-favorable or non-optimal orientations. In the exemplary system configuration depicted in FIG. 85, a capacitively loaded loop source resonator integrated into the wall may have a dipole moment that is normal to the plane of the wall. Flat devices, such as mobile handsets, computers, and the like, that normally rest on a flat surface may comprise device resonators with dipole moments that are normal to the plane of the table, such as when the capacitively loaded loop resonators are integrated into one or more of the larger faces of the devices such as the back of a mobile handset or the bottom of a laptop. Such relative orientations may yield coupling and the power transfer efficiencies that are lower than if the dipole moments of the source and device resonators were in the same plane, for example. A repeater resonator that has its dipole moment aligned with that of the dipole moment of the device resonators, as shown in FIG. 85, may increase the overall efficiency of wireless power transfer between the source and device because the large size of the repeater resonator may provide for strong coupling between the source resonator even though the dipole moments of the two resonators are orthogonal, while the orientation of the repeater resonator is favorable for coupling to the device resonator.

In the exemplary embodiment shown in FIG. 85, the direct power transfer efficiency between a 50 cm×50 cm source resonator 8506 mounted on the wall and a smart-phone sized device resonator 8512 lying on top of the table, and approximately 60 cm away from the center of the source resonator, with no repeater resonator present, was calculated to be approximately 19%. Adding a 50 cm×100 cm repeater resonator as shown, and maintaining the relative position and orientation of the source and device resonators improved the coupling efficiency from the source resonator to the device resonator to approximately 60%. In this one example, the coupling efficiency from the source resonator to the repeater resonator was approximately 85% and the coupling efficiency from the repeater resonator to the device resonator was approximately 70%. Note that in this exemplary embodiment, the improvement is due both to the size and the orientation of the repeater resonator.

In embodiments of systems that use a repeater resonator such as the exemplary system depicted in FIG. 85, the repeater resonator may be integrated into the top surface of the table or furniture. In other embodiments the repeater resonator may be attached or configured to attach below the table surface. In other embodiments, the repeater resonator may be integrated in the table legs, panels, or structural supports. Repeater resonators may be integrated in table shelves, drawers, leaves, supports, and the like. In yet other embodiments the repeater resonator may be integrated into a mat, pad, cloth, potholder, and the like, that can be placed on top of a table surface. Repeater resonators may be integrated into items such as bowls, lamps, dishes, picture frames, books, tchotchkes, candle sticks, hot plates, flower arrangements, baskets, and the like.

In embodiments the repeater resonator may use a core of magnetic material or use a form of magnetic material and may use conducting surfaces to shape the field of the repeater resonator to improve coupling between the device and source resonators or to shield the repeater resonators from lossy objects that may be part of the furniture, structures, or containers.

In embodiments, in addition to the exemplary table described above, repeater resonators may be built into chairs, couches, bookshelves, carts, lamps, rugs, carpets, mats, throws, picture frames, desks, counters, closets, doors, windows, stands, islands, cabinets, hutches, fans, shades, shutters, curtains, footstools, and the like.

In embodiments, the repeater resonator may have power and control circuitry that may tune the resonator or may control and monitor any number of voltages, currents, phases, temperature, fields, and the like within the resonator and outside the resonator. The repeater resonator and the power and control circuitry may be configured to provide one or more modes of operation. The mode of operation of the repeater resonator may be configured to act only as repeater resonator. In other embodiments the mode of operation of the repeater resonator may be configured to act as a repeater resonator and/or as a source resonator. The repeater resonator may have an optional power cable or connector allowing connection to a power source such as an electrical outlet providing an energy source for the amplifiers of the power and control circuits for driving the repeater resonator turning it into a source if, for example, a source resonator is not functioning or is not in the vicinity of the furniture. In other embodiments the repeater resonator may have a third mode of operation in which it may also act as a device resonator providing a connection or a plug for connecting electrical or electronic devices to receive DC or AC power captured by the repeater resonator. In embodiments these modes be selected by the user or may be automatically selected by the power and control circuitry of the repeater resonator based on the availability of a source magnetic field, electrical power connection, or a device connection.

In embodiments the repeater resonator may be designed to operate with any number of source resonators that are integrated into walls, floors, other objects or structures. The repeater resonators may be configured to operate with sources that are retrofitted, hung, or suspended permanently or temporarily from walls, furniture, ceilings and the like.

Although the use of a repeater resonator with furniture has been described with the an exemplary embodiment depicting a table and table top devices it should be clear to those skilled in the art that the same configurations and designs may be used and deployed in a number of similar configurations, furniture articles, and devices. For example, a repeater resonator may be integrated into a television or a media stand or a cabinet such that when the cabinet or stand is placed close to a source the repeater resonator is able to transfer enough energy to power or recharge electronic devices on the stand or cabinet such as a television, movie players, remote controls, speakers, and the like.

In embodiments the repeater resonator may be integrated into a bucket or chest that can be used to store electronics, electronic toys, remote controls, game controllers, and the like. When the chest or bucket is positioned close to a source the repeater resonator may enhance power transfer from the source to the devices inside the chest or bucket with built in device resonators to allow recharging of the batteries.

Figure 86:
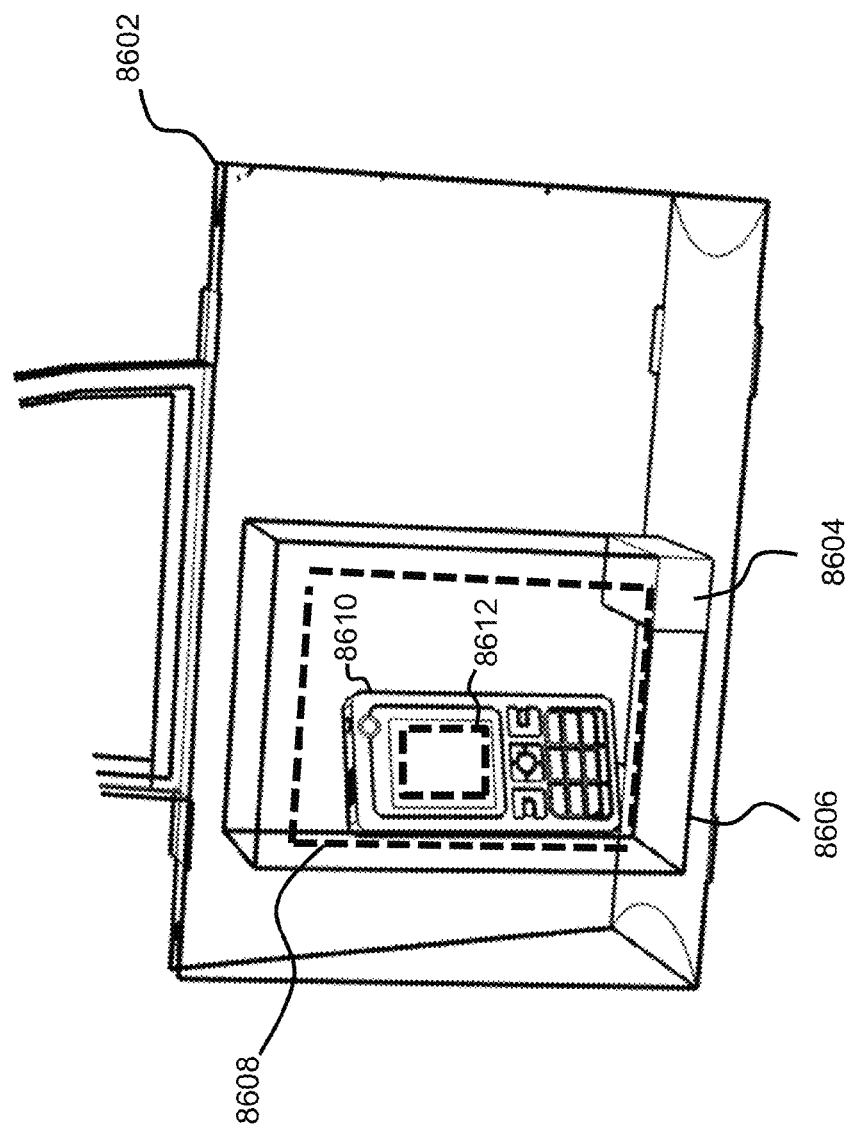
FIG. 86 is a diagram of a system utilizing a resonator that may be operated in multiple modes.

Another exemplary embodiment showing the use of a repeater resonator is depicted in FIG. 86. In this embodiment the repeater resonator may be used in three different modes of operation depending on the usage and state of the power sources and consumers in the arrangement. The figure shows a handbag 8602 that is depicted as transparent to show internal components. In this exemplary embodiment, there may be a separate bag, satchel, pocket, or compartment 8606 inside the bag 8602 that may be used for storage or carrying of electronic devices 8610 such as cell-phones, MP3 players, cameras, computers, e-readers, iPads, netbooks, and the like. The compartment may be fitted with a resonator 8608 that may be operated in at least three modes of operation. In one mode, the resonator 8608 may be coupled to power and control circuitry that may include rechargeable or replaceable batteries or battery packs or other types of portable power supplies 8604 and may operate as a wireless power source for wirelessly recharging or powering the electronic devices located in the handbag 8602 or the handbag compartment 8606. In this configuration and setting, the bag and the compartment may be used as a portable, wireless recharging or power station for electronics.

The resonator 8608 may also be used as a repeater resonator extending the wireless power transfer from an external source to improve coupling and wireless power transfer efficiency between the external source and source resonator (not shown) and the device resonators 8612 of the device 8610 inside the bag or the compartment. The repeater resonator may be larger than the device resonators inside the bag or the compartment and may have improved coupling to the source.

In another mode, the resonator may be used as a repeater resonator that both supplies power to electronic devices and to a portable power supply used in a wireless power source. When positioned close to an external source or source resonator the captured wireless energy may be used by a repeater resonator to charge the battery 8604 or to recharge the portable energy source of the compartment 8606 allowing its future use as a source resonator. The whole bag with the devices may be placed near a source resonator allowing both recharging of the compartment battery 8604 and the batteries of the devices 8610 inside the compartment 8606 or the bag 8602.

In embodiments the compartment may be built into a bag or container or may be an additional or independent compartment that may be placed into any bag or storage enclosure such as a backpack, purse, shopping bag, luggage, device cases, and the like.

Figure 87:
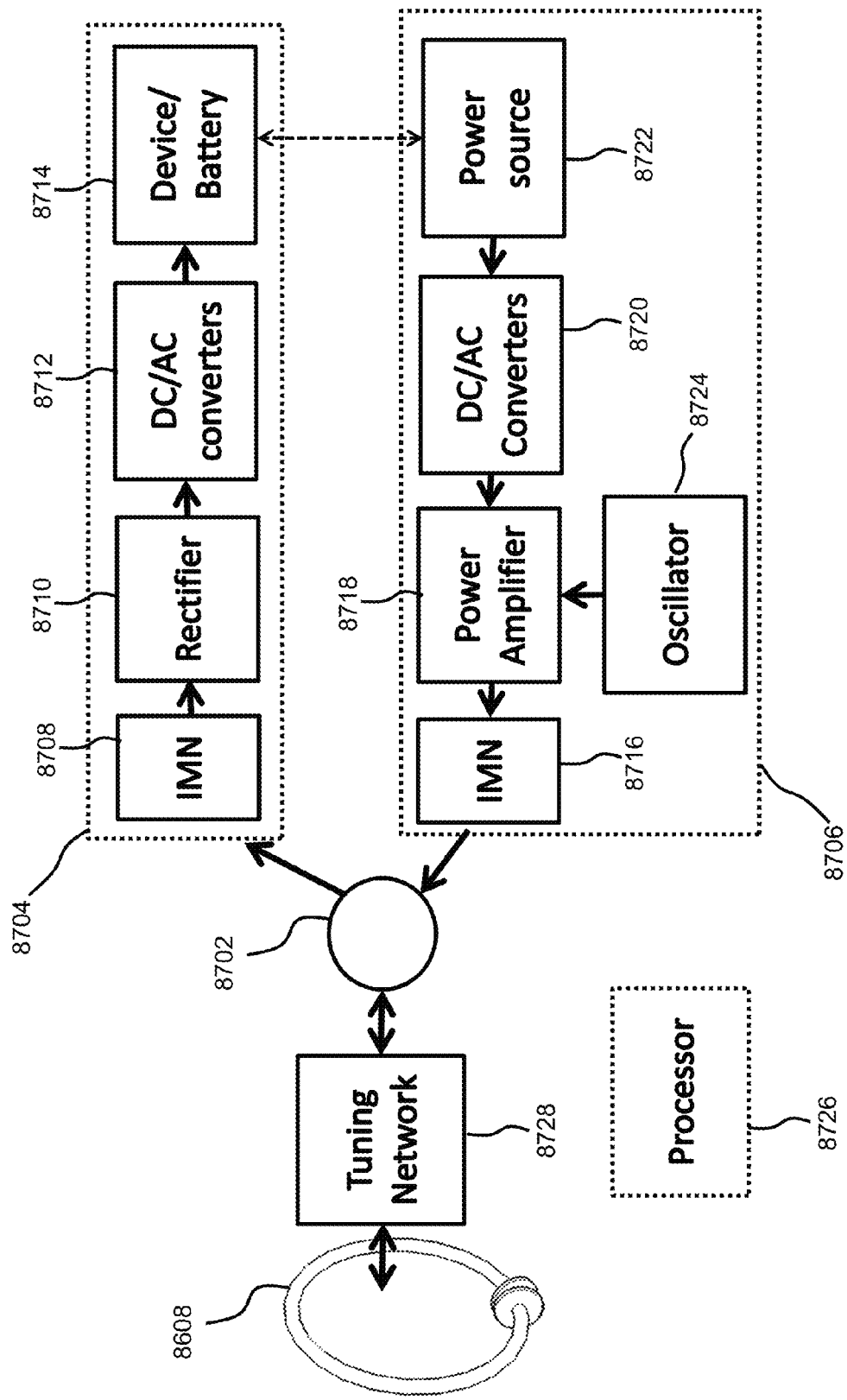
FIG. 87 is a circuit block diagram of the power and control circuitry of a resonator configured to have multiple modes of operation.

In embodiments, the resonator may comprise switches that couple the power and control circuitry into and out of the resonator circuit so that the resonator may be configured only as a source resonator, only as a repeater resonator, or simultaneously or intermittently as any combination of a source, device and repeater resonator. An exemplary block diagram of a circuit configuration capable of controlling and switching a resonator between the three modes of operation is shown in FIG. 87. In this configuration a capacitively loaded conducting loop 8608 is coupled to a tuning network 8728 to form a resonator. The tuning network 8728 may be used to set, configure, or modify the resonant frequency, impedance, resistance, and the like of the resonator. The resonator may be coupled to a switching element 8702, comprising any number of solid state switches, relays, and the like, that may couple or connect the resonator to either one of at least two circuitry branches, a device circuit branch

8704 or a source circuit branch 8706, or may be used to disconnect from any of the at least two circuit branches during an inactive state or for certain repeater modes of operation. A device circuit branch 8704 may be used when the resonator is operating in a repeater or device mode. A device circuit branch 8704 may convert electrical energy of the resonator to specific DC or AC voltages required by a device, load, battery, and the like and may comprise an impedance matching network 8708, a rectifier 8710, DC to DC or DC to AC converters 8710, and any devices, loads, or batteries requiring power 8714. A device circuit branch may be active during a device mode of operation and/or during a repeater mode of operation. During a repeater mode of operation, a device circuit branch may be configured to drain some power from the resonator to power or charge a load while the resonator is simultaneously repeating the oscillating magnetic fields from an external source to another resonator.

A source circuit branch 8706 may be used during repeater and/or source mode of operation of the resonator. A source circuit branch 8706 may provide oscillating electrical energy to drive the resonator to generate oscillating magnetic fields that may be used to wirelessly transfer power to other resonators. A source circuit branch may comprise a power source 8722, which may be the same energy storage device such as a battery that is charged during a device mode operation of the resonator. A source circuit branch may comprise DC to AC or AC to AC converters 8720 to convert the voltages of a power source to produce oscillating voltages that may be used to drive the resonator through an impedance matching network 8716. A source circuit branch may be active during a source mode of operation and/or during a repeater mode of operation of the resonator allowing wireless power transfer from the power source 8722 to other resonators. During a repeater mode of operation, a source circuit branch may be used to amplify or supplement power to the resonator. During a repeater mode of operation, the external magnetic field may be too weak to allow the repeater resonator to transfer or repeat a strong enough field to power or charge a device. The power from the power source 8722 may be used to supplement the oscillating voltages induced in the resonator 8608 from the external magnetic field to generate a stronger oscillating magnetic field that may be sufficient to power or charge other devices.

In some instances, both the device and source circuit branches may be disconnected from the resonator. During a repeater mode of operation the resonator may be tuned to an appropriate fixed frequency and impedance and may operate in a passive manner. That is, in a manner where the component values in the capacitively loaded conducting loop and tuning network are not actively controlled. In some embodiments, a device circuit branch may require activation and connection during a repeater mode of operation to power control and measurement circuitry used to monitor, configure, and tune the resonator.

In embodiments, the power and control circuitry of a resonator enabled to operate in multiple modes may include a processor 8726 and measurement circuitry, such as analog to digital converters and the like, in any of the components or sub-blocks of the circuitry, to monitor the operating characteristics of the resonator and circuitry. The operating characteristics of the resonator may be interpreted and processed by the processor to tune or control parameters of the circuits or to switch between modes of operation. Voltage, current, and power sensors in the resonator, for example, may be used to determine if the resonator is within a range of an external magnetic field, or if a device is present, to determine which mode of operation and which circuit branch to activate.

It is to be understood that the exemplary embodiments described and shown having a repeater resonator were limited to a single repeater resonator in the discussions to simplify the descriptions. All the examples may be extended to having multiple devices or repeater resonators with different active modes of operation.

Wireless Power Converter

In some wireless energy transfer systems and configurations a wireless energy converter may be used to convert the parameters or configurations of wireless power transfer. In some embodiments a system may have one or more sources or one or more devices that are capable or configured to operate and transfer wireless energy with one or more different and possibly incompatible parameters. A wireless energy converter may be used to translate or convert the parameters or characteristics of wireless power transfer allowing energy transfer between sources and devices that may be configured to receive or capture wireless energy with incompatible or different parameters. Note that throughout this disclosure we may use the terms wireless power converter, wireless energy converter, wireless converter, and wireless power conversion, wireless energy conversion, and wireless conversion interchangeably.

In embodiments a wireless power converter may be used to convert the characteristics of wireless power transfer and allow power transfer between a source and a device that may be designed or configured for wireless energy transfer with different parameters or characteristics. For example, a source resonator may be configured or designed to operate at a specific resonant frequency and may transfer energy via oscillating magnetic fields at that frequency. A device resonator may be configured or designed to operate at a different resonant frequency and may be designed or configured to receive energy wirelessly only if the oscillating magnetic fields are at, or close to, the device resonant frequency. If the resonant frequencies of the source and device are substantially different, very little or no energy may be transferred. A wireless power converter may be used to convert the wireless energy transferred by the source to have characteristics or parameters such that the wireless energy may be utilized by the device. A wireless power converter may, for example, receive energy via oscillating magnetic fields at one frequency and use the captured energy to generate oscillating magnetic fields at a different frequency that may be utilized and received by the device with a different resonant frequency than the source.

Figure 88:
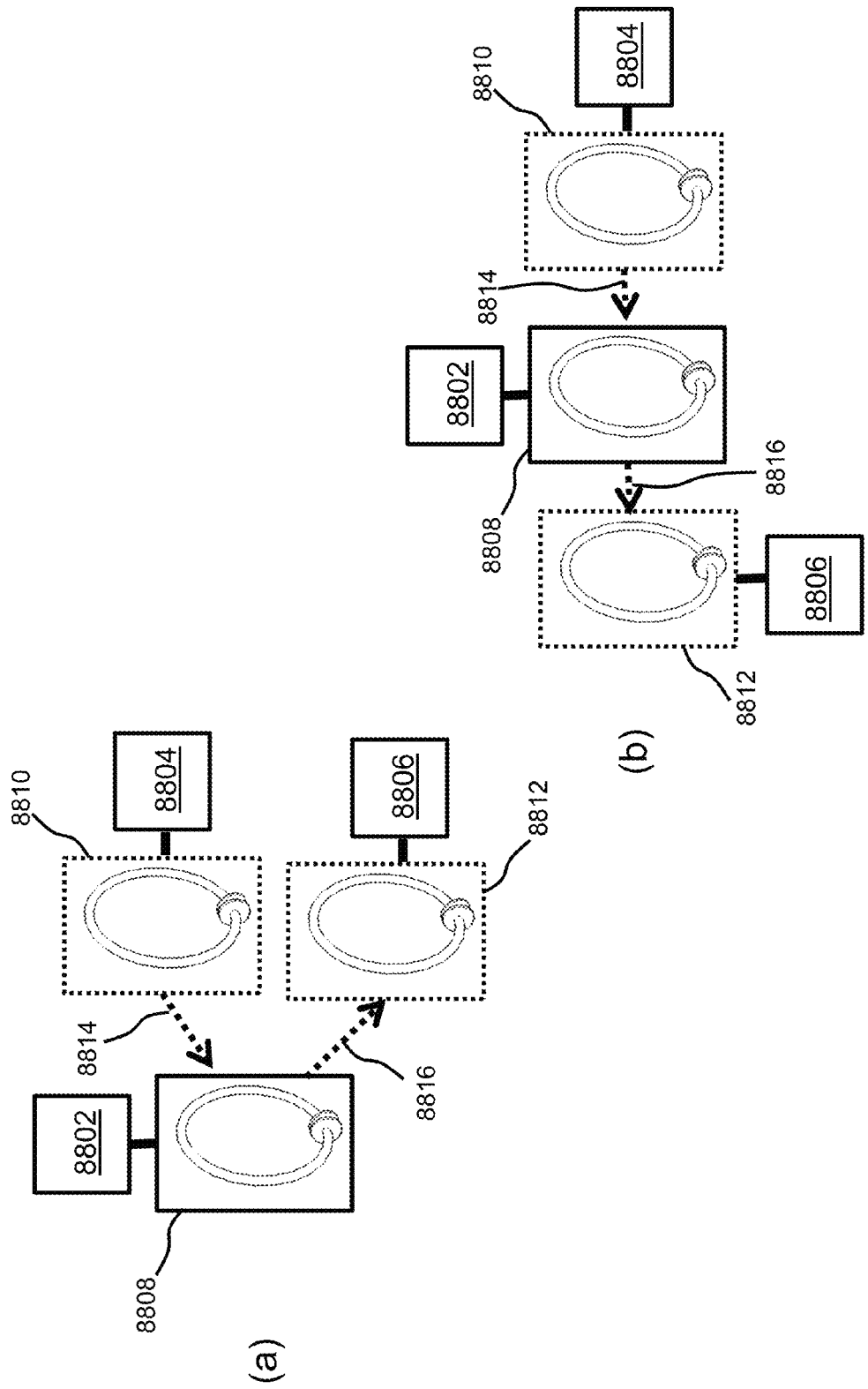
FIG. 88(*a*) is a block diagram of a configuration of a system utilizing a wireless power converter, (*b*) is a block diagram of a configuration of a system utilizing a wireless power converter that may also function as a repeater.

FIG. 88 shows exemplary functionality and uses of a wireless power converter. In wireless energy transfer systems one or more sources 8810 may generate oscillating magnetic fields 8814 at one or more frequencies. A wireless power converter 8808 may couple to the source 8810 and capture the energy from the oscillating magnetic field 8814 and transfer some or all of the captured energy by generating an oscillating magnetic field 8816 at one or more frequencies that may be different from the source resonator frequencies and that may be utilized by the device 8812. It is important to note that the wireless power converter 8808 may not need to be located between the source 8810 and the device 8812, but only in the general vicinity of both the source and device. Note that if a device is configured to operate or receive energy with different parameters or characteristics than what is generated by a source, the device may not receive significant amounts of power from the source, even if the source and device are close together. In embodiments, a wireless power converter may be used to adapt the parameters of the source to parameters that may be received by the device and may increase the efficiency of the wireless power transfer between what would be an incompatible source and device, in the absence of the converter. In some embodiments the wireless power converter may also serve as a repeater resonator and may extend, enhance, or modify the range of the wireless power transfer when it is placed between a source and a device or in the vicinity of the device.

A wireless power converter may be beneficial for many wireless power systems and applications. In some embodiments the wireless power converter may be used to convert the characteristics of wireless power transfer between normally incompatible resonators or wireless power transfer systems.

In some embodiments the wireless power converters may be utilized by the wireless power transfer system to manage, separate, or enhance the wireless power distribution between sources and devices of different power demands, power outputs, and the like. In embodiments, some wireless power transfer systems and configurations may employ devices with different power demands. Some devices in a system may have power demands for several hundred watts of power while other devices may require only a few watts of power or less. In systems without a wireless power converter, such differences in power demands and device power requirements may impose additional design constraints and limitations on the hardware and operation of the devices. For example, in a system where all devices are configured to operate at the same frequency, the devices with lower power demands of a few watts may need to be designed to withstand the voltages, currents, and magnetic field strengths equal to those of a device requiring several hundreds of watts of power. In embodiments, circuit components comprised by lower power device resonators may be required to dissipate large amounts of power as heat. One way to reduce the high voltage, current, power, and the like, requirements on lower power devices may be to detune the lower power device resonant frequency from the high power source resonant frequency, or to use frequency hopping or time multiplexing techniques to periodically, or at adjustable intervals, decouple the device from the source. These schemes may reduce the average power received by the device, and may expand the range of components that may be used in the device because components capable of withstanding high voltages, currents, powers, and the like, for short periods of time, may be smaller, less expensive, and more capable than components that must sustain such voltages, currents and powers, for extended periods of time, or for continuous operation.

In embodiments, such as when the resonant frequency of a device is not tunable, or when the resonant frequency can be tuned to an operating point that supports wireless power transmission between a high power source and a lower power device, a wireless power converter may be used to support wireless power transfer.

In an exemplary embodiment, a wireless power configuration may wirelessly transfer two hundred watts or more of power from a source in a wall to a television. In such an embodiment, it may be useful to also supply wireless power to television remote controllers, game controllers, additional displays, DVD players, music players, cable boxes, and the like, that may be placed in the vicinity of the television. Each of these devices may require different power levels and may require power levels much lower than is available from the source. In such an embodiment, it may not be possible to adjust the power available at the source without disrupting the operation of the television, for example. In addition, the television remote controllers, game controllers, additional displays, DVD players, music players, cable boxes, and the like, may also be able to receive power from other wireless power sources, such as a lower power energized surface source, situated on a shelf or a table, as shown in FIG. 15 for example. Without a wireless power converter, it may be necessary to design the wireless power transfer hardware of the lower power devices to withstand the voltages, currents, and magnetic fields generated by a source capable of supplying hundreds of watts to a television, as well as to be efficient when the lower power devices receive power from a lower power energized surface source, for example. Circuits may be designed for the lower power devices that enable this type of operation, but in some embodiments, it may be preferable to optimize the lower power device circuits for operation with lower power sources, and to use a power converter to convert the high power levels available from a high power source to lower power levels, in some region of operation. A wireless power converter may capture some of the wireless energy generated by a high power source, may condition that power according to a variety of system requirements, and may resupply the conditioned power at different frequencies, power levels, magnetic field strengths, intervals, and the like, suitable for reception by the lower power devices referred to in this exemplary embodiment.

In some embodiments, for example, it may be preferable to operate high power devices requiring 50 watts of power or more at the lower frequencies such as in the range of 100 kHz to 500 kHz. Allowable magnetic field limits for safety considerations are relatively higher, and radiated power levels may be lower at lower operating frequencies. In some embodiments it may be preferable to operate smaller, lower power devices requiring 50 watts of power or less at higher frequencies of 500 kHz or more, to realize higher Q resonators and/or to utilize electric and electronic components such as capacitors, inductors, AC to DC converters, and the like, that may be smaller or more efficient allowing for smaller and/or tighter resonator and power and control circuitry integration.

In embodiments a wireless power converter may be used to convert wireless power transferred from multiple sources with different parameters to a single source and may be used to convert wireless power parameters to be compatible with more than one device. In embodiments a wireless power converter may be used to amplify a specific wireless power source by converting wireless power from other sources working with different parameters.

Figure 89:
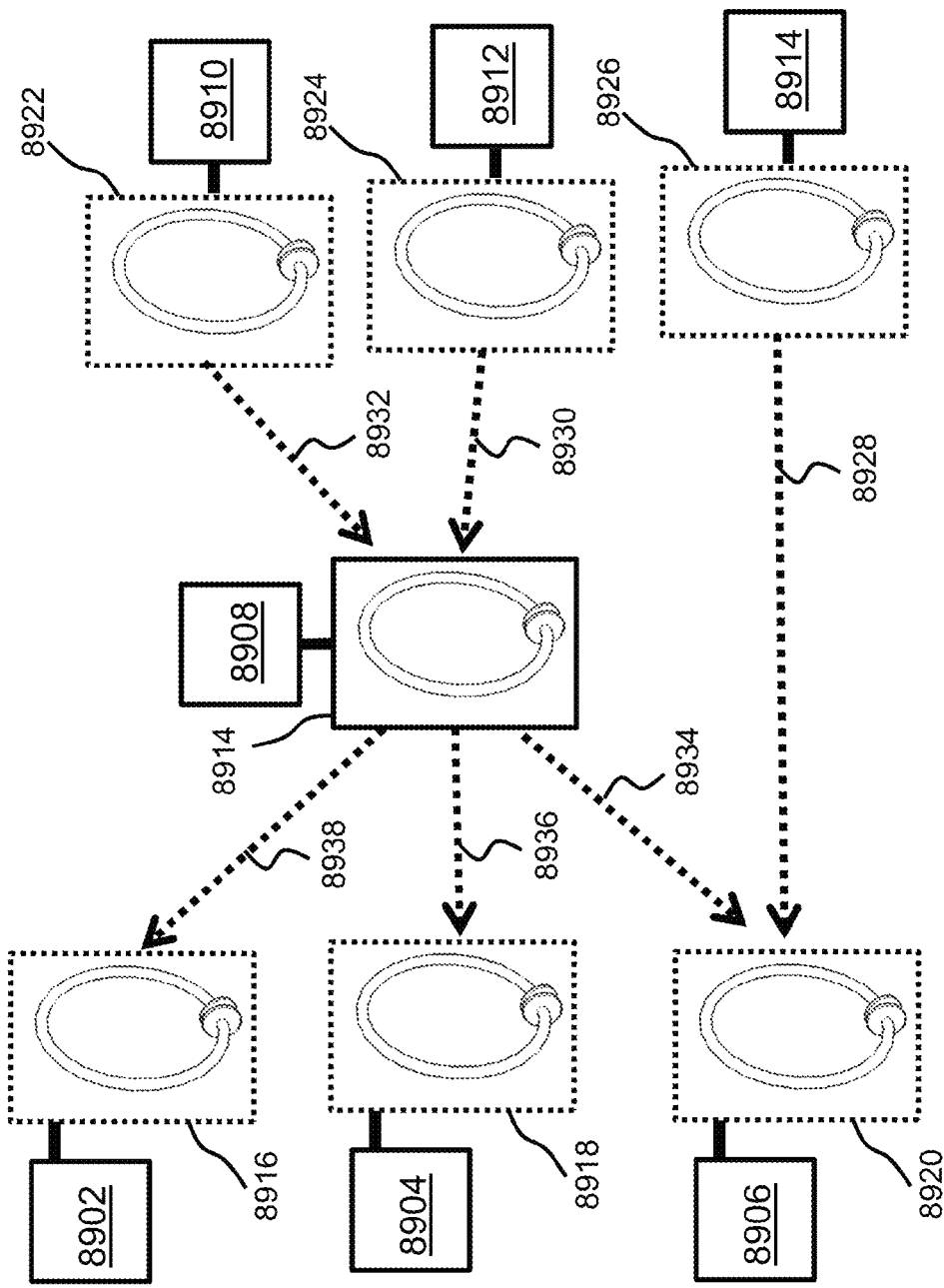
FIG. 89 is a block diagram showing different configurations and uses of a wireless power converter.

Exemplary embodiments of wireless power transfer system configurations employing wireless power converters are depicted in FIG. 89. As part of the configuration, a wireless power converter 8914 may capture energy from oscillating magnetic fields 8932, 8930 from one or more sources 8922, 8924 that may be configured or designed to operate with different parameters. The wireless power converter 8914 may capture the energy and generate a magnetic field 8934, 8936, 8938 with one or more different parameters than the sources 8922, 8924 from which the energy was received and transfer the energy to one or more devices 8916, 8918, 8920. In another aspect of the configuration, a wireless power converter 8914 may be used to capture energy from one or more sources 8922, 8924 that may be designed to operate with different parameters and generate a magnetic field 8934 with parameters that match the field 8928 of another source

8926 providing "amplification" or a boost to a field from sources 8922, 8924 and fields 8930, 8932 with different parameters.

Figure 90:
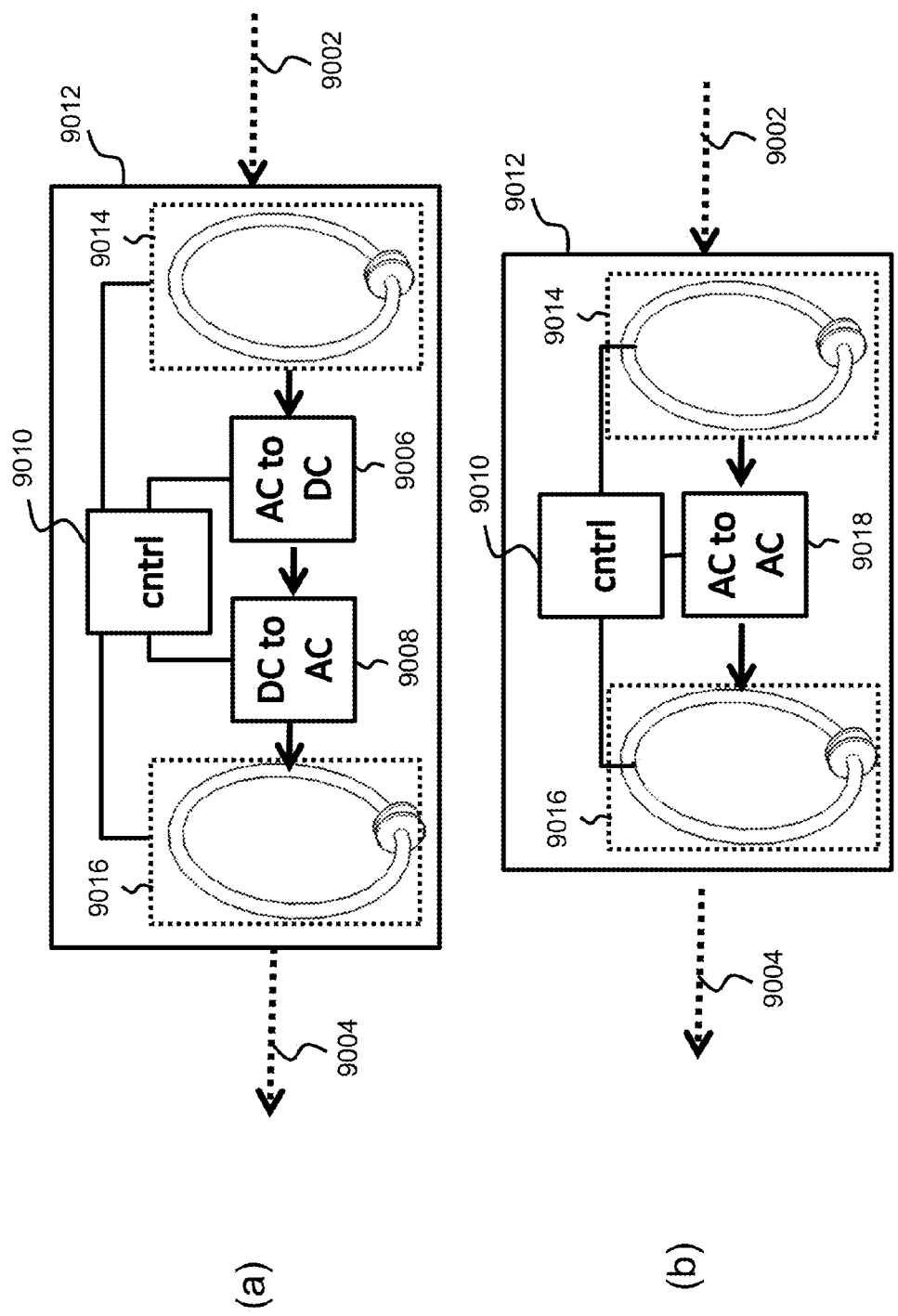
FIG. 90(*a*) is a block diagram of a wireless power converter that uses two separate resonators and a AC to DC converter, (*b*) is a block diagram of a wireless power converter that uses two separate resonators and an AC to AC converter.

In embodiments a wireless power converter may comprise one or more magnetic resonators configured or configurable to capture wireless energy with one or more parameters and one or more resonators configured or configurable to transfer wireless energy with one or more parameters. For example, a wireless power converter designed to convert the frequency parameter of a oscillating magnetic field is depicted in FIG. 90(*a*). The wireless power converter 9012 may have one or more magnetic resonators 9014, 9016 that are tuned or tunable to one or more frequencies. The oscillating voltages generated in the resonator 9014 by the oscillating magnetic fields 9002 may be rectified and used by a DC to AC converter 9008 to drive another resonator 9016 with oscillating currents generating an oscillating magnetic field 9004 with one or more different frequencies. In embodiments the DC to AC converter of the wireless power converter may be tuned or tunable using a controller 9010 to generate a range of frequencies and output power levels.

In embodiments the oscillating voltages of the receiving resonators 9014 may be converted to oscillating voltages at a different frequency using an AC to AC converter 9018 and used to energize a resonator 9016 of a wireless power converter without first converting the received voltages and currents to DC as depicted in FIG. 90(*b*). In embodiments it may be preferable to configure and design a wireless power converter to convert the frequency of magnetic fields such that the captured and transferred magnetic fields are multiples of one another such that a diode, a nonlinear element, a frequency multiplier, a frequency divider, and the like, may be used to convert the frequency of the captured energy to a different frequency without first converting to a DC voltage.

Figure 91:
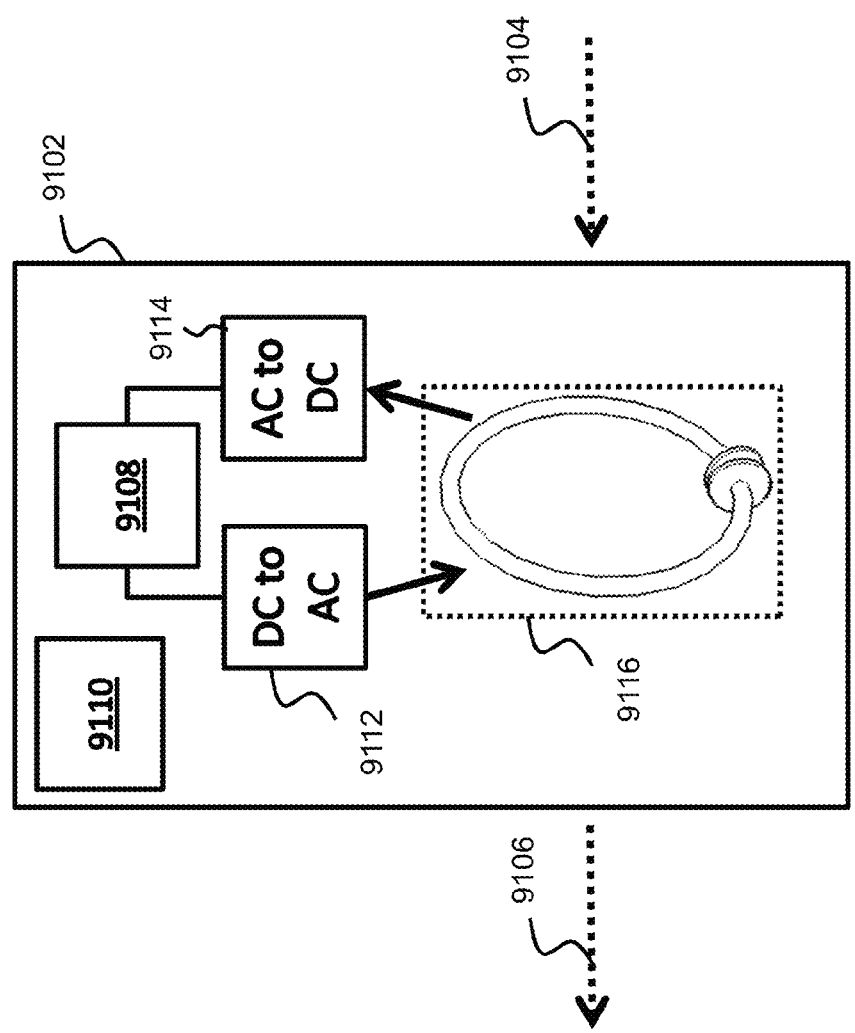
FIG. 91 is a circuit block diagram of a wireless power converter utilizing one resonator.

In embodiments a wireless power converter may include one or more resonators that are time multiplexed between capturing energy at one frequency and transferring energy at a different frequency. The block diagram of time multiplexed power converter is depicted in FIG. 91. A time multiplexed wireless power converter 9102 may be tuned to capture oscillating magnetic fields 9104, convert the generated AC energy to DC energy using an AC to DC converter 9114, and charge an energy storage element 9108 such as a super capacitor, battery, and the like. After a period of time, the resonator 9116 may be tuned to a different frequency and the energy stored in the energy storage element 9108 may be used to power an amplifier or an DC to AC converter 9112 to drive the tuned resonator 9116 with an oscillating voltage at the new resonant frequency thereby generating an oscillating magnetic field. In embodiments the resonator 9116 may change from capturing to transferring power every few milliseconds, seconds, or minutes. The resonator may be configured to change from capturing to transferring of power as soon as energy in the storage element reaches a predetermined level and may switch back to capturing when the energy in the storage element drops below a predetermined level. In embodiments a wireless power converter that converts power from a high power source to a device with low power requirements may only need to capture power for a small fraction of the time multiplexed cycle and slowly transmit power at the required device power level for the remainder of the cycle.

In an embodiment system utilizing wireless power converters, an area, room, or region may be flooded or energized with low power magnetic fields by multiple sources that may be integrated into walls, ceilings, partitions and the like. Different wireless power converters may be distributed or strategically located at different locations to capture and convert the low power magnetic fields to different frequencies, parameters, and power levels to transfer power to different classes or types of devices within the area. In system embodiments utilizing wireless power converters, sources may be configured or extended to function and operate with a large number of various devices with specialized power demands or configurations without requiring changes or reconfiguration of the sources.

In embodiments a wireless power converter may not require any additional energy input and may simply convert the parameters and characteristics of wireless power transfer. In embodiments the wireless power converters may have additional energy inputs from batteries, solar panels, and the like that may be used to supplement the energy transferred.

In embodiments the wireless power converter may be tunable and configurable such that it may be tuned or configured to convert from any number of frequencies or power levels or energy multiplexing schemes to any number of frequencies or power levels or energy multiplexing schemes. It may be adjusted automatically by sensing power levels or frequencies of a source, or the source with the strongest or appropriate magnetic field, for example. The converter may include communication or signaling capability to allow configuration by a source or sources, device or devices, repeater or repeaters, master controller or controllers or other converters, as to parameters of the conversion that may be desired or required. The converter may communicate or signal to a source or sources to turn on or off, or to increase or decrease power levels, depending on the power requirements of the device or devices, repeater or repeaters, to which the converter is transferring energy or for which the converter is adapting, converting, or translating, the characteristics of the wireless power transfer.

Although many of the specific embodiments of a wireless power converter have been described in terms of a converter that changes the frequency of an oscillating magnetic field it is to be understood that frequency is an exemplary parameter and other parameters may be converted without departing from the spirit of the invention. In embodiments a power converter may change any number of parameters including phase, amplitude, and the like. In some embodiments a wireless power converter may change the sequence or timing of frequency hopping, or allow a single frequency source to power devices that employ or expect a constant or periodic frequency hopping mode of operation. In some embodiments, the converter may use time multiplexing techniques to adjust power levels, power distribution algorithms and sequences, and to implement preferential or hierarchical charging or powering services.

In embodiments a wireless power converter may convert the parameters of wireless power transfer and may also, or instead, change the distribution of the fields generated by a source field. A wireless power converter may include multi-sized or variable size resonators that may be configured to redistribute the magnetic field of a source to allow or enhance operation with a device of a different size or at different separations. In embodiments a small source resonator may not be the most efficient at transferring power to a large device resonator. Likewise, a large source resonator may not be the most efficient at transferring power to a small device resonator. A wireless power converter may include two or more differently sized resonators that capture and redistribute the magnetic field for improved efficiency of wireless power transfer to device resonators without requiring changes or reconfiguration of the source or device resonators.

Figure 92:
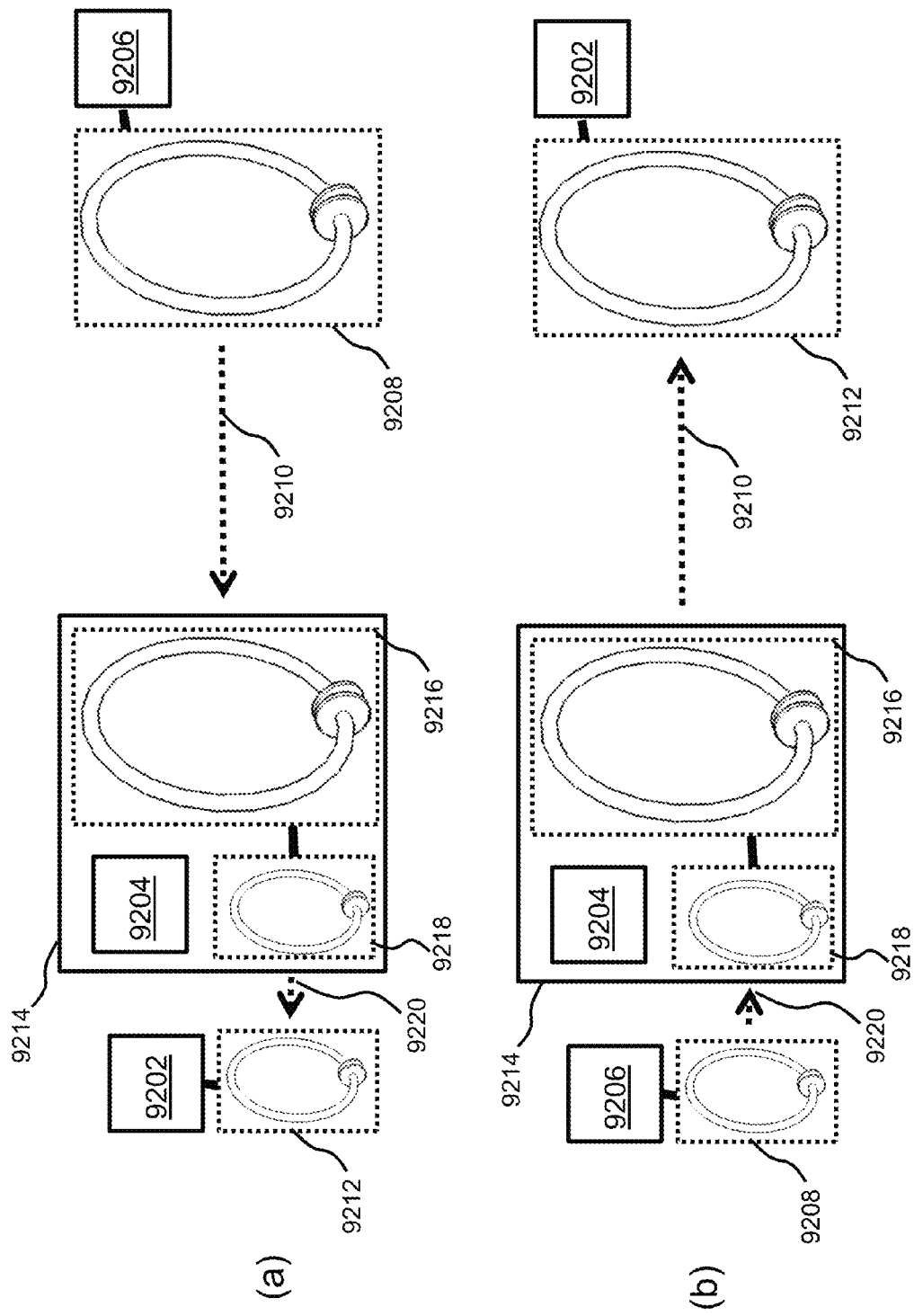
FIGS. 92(*a-b*) are circuit diagrams of system configurations utilizing a wireless power converter with differently sized resonators.

For example, as depicted in FIG. 92(a), a wireless power converter 9214 with a large capture resonator 9216 and a small transmitting resonator 9218 may be placed close to a small device resonator 9212 and may improve the wireless power transfer efficiency between a large distant source resonator 9208 and a small device resonator 9212. Likewise, as depicted in FIG. 92(b), a wireless power converter 9214 with a small capture resonator 9218 and a large transmitting resonator 9216 may placed close to a small source resonator 9208 and may improve the wireless power transfer efficiency between a large distant device resonator 9212 and the small source resonator 9208. The converter resonator may include one or more capture resonators that are sized to maximize the efficiency of wireless power transfer from the source resonator to the converter resonator and one or more transfer resonators that are sized to maximize the efficiency of wireless power transfer from the converter resonator to the device resonator. In some embodiments energy captured by the capture resonator may be used to directly power the transmitting resonator. In embodiments the energy captured by the capture resonator may be converted, modified, metered or amplified before being used to energize the transmitter resonator. A wireless power converter with differently sized resonators may result in improved system efficiency.

Vehicle Charging Configurations

Wireless power transfer may be used for powering, charging, or delivering electrical energy to a vehicle. As described above, power may be delivered to a vehicle from one or more source resonators generating magnetic fields outside of a vehicle to one or more device resonators on, under, alongside, attached to, and the like, a vehicle, for charging a vehicle battery or for charging or powering electronic systems and devices in or on a vehicle.

In embodiments the source and device resonators of the vehicle charging system may require specific alignment or may have limits on operating parameters such as separation distance, lateral offset, axial misalignment, and the like. In embodiments the wireless power transfer system may include designs which ensure, enable, monitor, or facilitate that the distance, offset, alignment, and the like are within the specified operating parameters of the system. In embodiments the wireless power transfer system may include designs and systems which enable, monitor, or facilitate that the distance, offset, alignment, and the like are the best feasible or optimum operating characteristics with respect to safety, efficiency, magnitude of power transfer, and the like, for a specific configuration.

In car embodiments, for example, a device resonator mounted underneath the car may receive power from a source positioned under the car. A car may receive power, charge batteries, power peripherals, and the like from the energy captured by the device resonator by driving or parking over the source. Depending on the size, type, design, orientation, power levels, surroundings, and the like, the car source and the car may need to be positioned within a specific boundary or location with respect to the source. The wireless power transfer system may include features that enable, facilitate, guide, promote, or ensure proper orientation, position, or alignment of the source and device resonators or the vehicle.

In embodiments a digital camera coupled to a machine vision system may be used to aid or automate source and device resonator alignment. A video camera image of the source and device resonator may be displayed to the user in the vehicle providing guidance as to the location of the source. In some embodiments the camera and machine vision may be coupled with a processing unit and appropriate machine vision algorithms and preprocess alignment and positioning of the car to alert a user with positional information using auditory, vibrational, or visual indicators. The processing and alignment algorithms may include positioning and location information from other systems of the vehicle such that the positioning and location indicators take into account obstructions or position limitations of the car. For example, the processing and alignment algorithms may be coupled to infrared or acoustic sensors in the bumpers of the car to aid in the positioning within the confines of a parking space, garage, and the like.

In embodiments the camera system or machine vision system may be coupled with a processing unit and appropriate machine vision algorithms used to automate the process or parts of the process of resonator alignment. In some embodiments the source or device may be mounted on robotic, or automated tracks, arms, platforms that move into alignment using the camera for positioning and orientation information. In some embodiments the camera, machine vision algorithms, and processing unit may be coupled to a vehicle's sensors and controls allowing the car to position and park itself in proper alignment with the source.

In embodiments a camera system or machine vision system may detect, or help to detect obstructions and foreign objects and/or materials between the source and device resonators. In embodiments the camera and machine vision system may constantly monitor the gap and/or vicinity around the source and device for movement, extraneous objects, or any type of undefined or abnormal operating environments or configurations. The system may be designed to stop power or limit power transfer and may be designed to alert the driver, user, or operator when any undefined or abnormal operating environments or configurations are detected by the camera and/or algorithms. In embodiments the camera and machine vision system may be coupled or controlled with self learning or trainable algorithms that can be designed to function in or with a wide variety of environments, vehicles, sources, and systems and may learn or be trained to operate in many environments after periods of supervised operation.

In embodiments the camera may be mounted in or around the source and may transmit video or processed information wirelessly to electronics or users inside or outside the vehicle. In embodiments the camera may be mounted on the car and may be mounted under the car. In embodiments the camera may be fitted with an automated door or housing that opens only when the alignment procedure is initiated or when the device or source are in close proximity. The mechanical door or housing may open and close only as needed protecting the camera lens and electronics from road debris, water, dirt, and the like.

In embodiments, transmitted and/or reflected acoustic, microwave, RF, optical, and the like signals may be used to automatically, or with the help of a user, align source and device resonators to within a specified accuracy. The specified accuracy may be a user settable parameter or it may be a parameter that is set by a control system. The settable parameter may be adjusted depending on the time of day, the demand on the electric grid, the cost of electricity (quoted in kW hours for example), the availability of green energy and the like. The settable parameter may be controlled by a utility provider, by a local agency, by the car company, by a services company, by an individual user, and the like.

In embodiments various sensor systems may be used to aid or automate source and device resonator alignment. Acoustic, pressure, contact, inductive, capacitive, and the like sensors may be located in or around the vehicle to determine the vehicles position and guide the user of operator of the vehicle to establish the best alignment. Various bumpers, lasers, balls, whistles, scrapers, strings, bells, speakers, and the like may also be used as indicators to the users or operators for proper alignment positioning. In embodiments any number of parking guides, or parking assistant devices may be incorporated into the system to help guide or position the vehicle in proper or within the acceptable limits of the source.

In embodiments one or more pressure, temperature, capacitive, inductive, acoustic, infrared, ultraviolet, and the like sensors may be integrated into the source, device, source housing, vehicle, or surrounding area and may detect, or help to detect obstructions and foreign objects and/or materials between the source and device resonators. In embodiments the sensors and safety system may constantly monitor the gap and/or vicinity around the source and device for movement, extraneous objects, or any type of undefined or abnormal operating environments or configurations. In embodiments, for example, the housing covering the source resonator may include or may be mounted on top of a pressure sensor that monitors the weight or forces pushing on the enclosure of the source resonator. Extra pressure or additional detected weight, for example, may indicate a foreign or unwanted object that is left on top of the source indicating that it may be unsafe or undesirable to operate the wireless power transfer system. The output of the sensor may be coupled to the processing elements of the wireless power transfer system and may be used to stop or prevent wireless power transfer or prevent when the sensor is tripped or detects abnormalities. In embodiments the system and sensor may be coupled to auditory, visual, or vibrational indicator to alert the user or operator of the wireless power transfer interruption. In some embodiments multiple sensors, sensing multiple parameters may be used simultaneously to determine if an obstruction or a foreign object is present. In some embodiments the system may be configured such that at least two sensors must be tripped, such as a pressure and a temperature sensor, for example, to turn off or prevent the wireless power transfer.

In embodiments a theft deterrent or detection system may be incorporated into the source and device that utilizes the various sensors and cameras of the wireless power transmission system to detect unauthorized use of the vehicle.

In embodiments the source and device resonators may be of non-identical dimensions and geometries to reduce the dependence on alignment of the efficiency of power transfer between source and device coils. In some embodiments it may be beneficial to make the source resonator larger than the device resonator which may increase the positional tolerance for a desired energy transfer efficiency between the source and device resonators.

Figure 93:
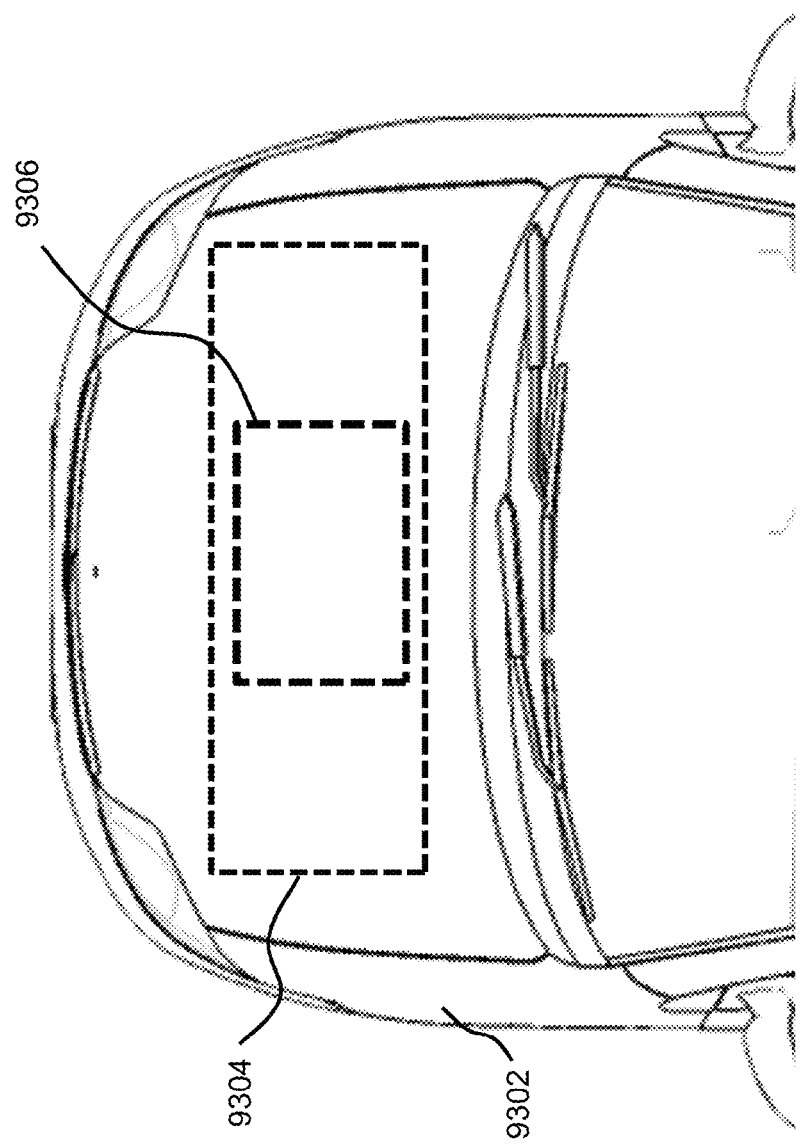
FIG. 93 is a diagram showing relative source and device resonator dimensions to allow lateral displacement or side to side positioning uncertainty of a vehicle.

In embodiments various geometries of source and device resonators may be used to reduce the effects of source and device misalignments, such as those that may be associated with parking variations. Parking variations may include forward and back variations, side-to-side variations, angular offsets (when the vehicle is parked at an angle), and the like. For example, in some embodiments the source and device resonators may be prone to variations in alignment in the forward and backward direction of the vehicle. In such embodiments, the use of rectangular source inductive loop, oriented with the long axis of the inductive loop parallel to the direction of vehicle positional uncertainty—paired with a square device resonator having the same short axis length as the source resonator may yield a better average efficiency as a function of source-to-device resonator displacement than would be achieved by a square source resonator with the same dimensions as the device resonator. Note that the long axis of a rectangular source inductive loop may be aligned with the length of the vehicle, if the positional uncertainty is in that direction and may be aligned with the width of the vehicle if side-to-side positional uncertainty is expected. An exemplary embodiment, showing the relative geometries of a source and a device inductive loop for reducing lateral or side-to-side offset dependency on the vehicle is shown in FIG. 93. The figure shows exemplary relative geometries from the top perspective looking down at the car when the source resonator is located below the car and the device resonator is mounted to the underside of the car. To increase the side to side offset capability of the car 9302 the capacitively loaded loop resonators comprising the source and the device may be of different dimensions. The dimensions of the source 9304 may be larger in the in the side to side dimension or axis of the car than the dimensions of the device 9306.

In embodiments the effects of misalignment between a source and a device may be mitigated or limited with resonator designs that do not require precise alignment. In embodiments the source and device resonator may include planar resonators or resonators comprising a conductor wrapped around a core of magnetic material. In embodiments the dipole moment of the planar resonators may be oriented perpendicular to the dimension of vehicle position uncertainty. The design of the resonators may allow misalignments perpendicular to the dipole moments of the resonators with minimal effects of power transfer efficiency.

In embodiments, device resonators and their respective power and control circuitry may have various levels of integration with other electronic and control systems and subsystems of a vehicle. In some embodiments the power and control circuitry and the device resonators may be completely separate modules or enclosures with minimal integration to existing systems of the vehicle, providing a power output and a control and diagnostics interface to the vehicle. In other embodiments the device resonator or parts of the resonator housing may be integrated into the body, structure, undercarriage, panels of the vehicle. In some embodiments the vehicle may be configured to house a resonator and circuit assembly in a recess area underneath the vehicle making the bottom face of the coil enclosure flush with the underbody. In some embodiments the recessed area may be further lined with a highly conductive material such as aluminum, copper, silver and the like which may electroplated, laminated, sprayed, applied, and the like to the recessed area.

In embodiments the device and source may include active cooling or heating. The device resonator and circuitry may be integrated into a vehicle's cooling system to prevent high temperatures in high power applications. In embodiments the device resonator and circuitry may include its own active cooling or heating system with radiators, fans, liquid coolant, and the like. In embodiments the resonators and power and control circuitry may include various shapes, profiles, protrusions, heat sinks, and the like to aid in temperature control.

In wireless power systems the vehicle power control system may include a power station reservation system that allows users to reserve charging stations for specific times of the day preventing others users from charging from the source. Central information may be used to let users choose specific power sources or sources which use more environmentally friendly sources of energy such as wind or solar power.

In embodiments the device resonator of a vehicle may also be used as a power source. In embodiments vehicle power may be used to power a building during a blackout or a cabin without power. In embodiments the vehicle may be used to transmit power to construction vehicles or tools at a job site.

Resonator Arrays

In embodiments two or more smaller resonators or two or more blocks of magnetic material wrapped with conductor may be arranged to form a larger resonator with an effective size that is larger than the physical size of the smaller resonators or larger than the size of the blocks of magnetic material. A resonator with a larger effective size may have improved coupling over a larger distance, may have a higher efficiency, improved invariance with respect to positional uncertainty, may be able to transfer higher power levels, and the like. An arrangement of smaller resonators or smaller blocks of magnetic material may offer advantages over a single large resonator with respect to manufacturability, cost, scalability, variability, and the like.

Figure 94:
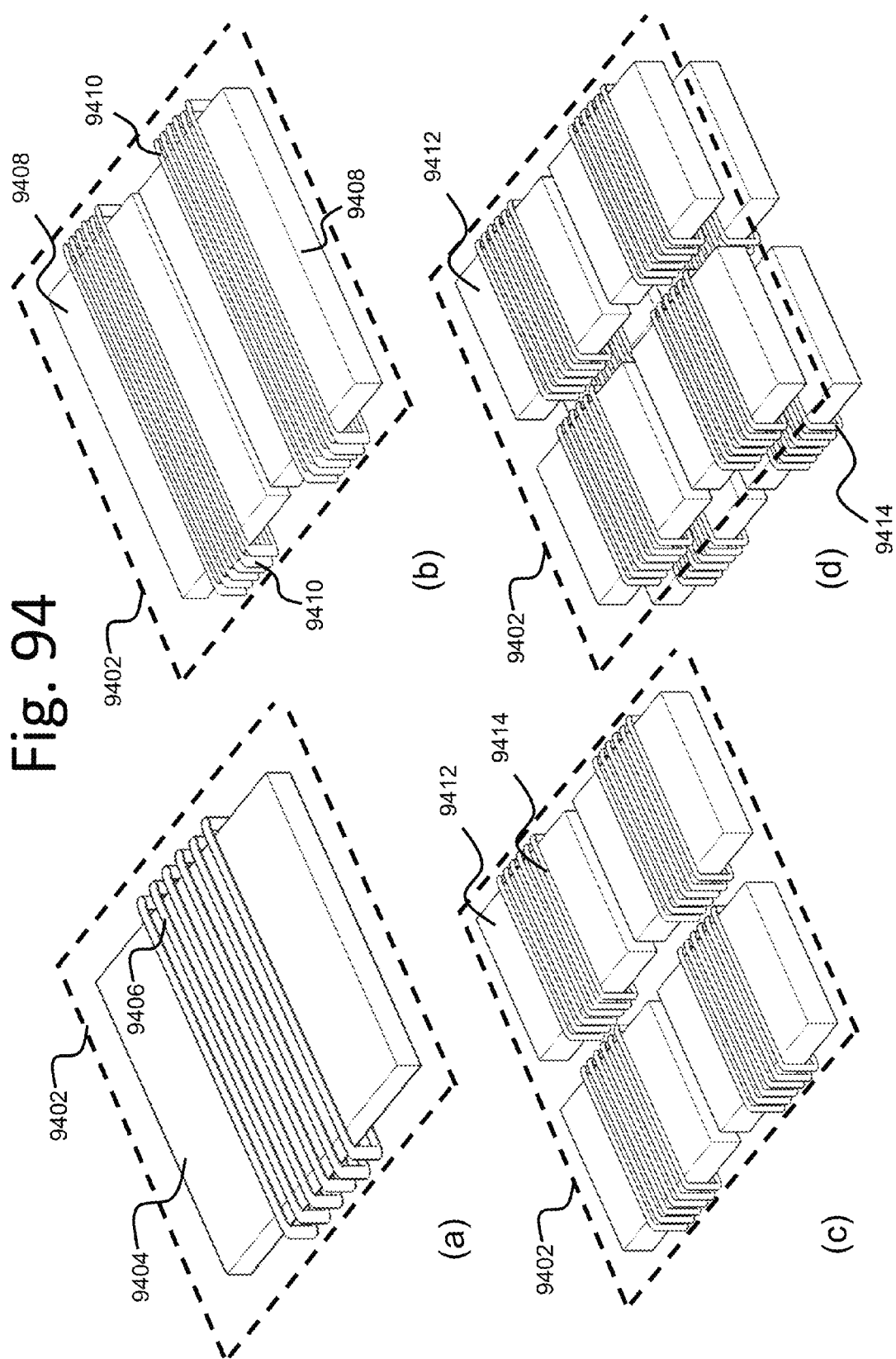
FIG. 94(*a*) is a resonator comprising a single block of magnetic material, (*b-d*) are resonator comprising of multiple separate blocks of magnetic material.

For example, in embodiments as shown in FIG. 94(*a*) a planar resonator comprising a conductor 9406 wrapped around a block of magnetic material 9404 may be implemented using one single resonator or one block of magnetic material. The resonator may comprise a substantially continuous block of magnetic material 9404 with a conductor 9406 wrapped around the complete width of the magnetic material forming loops with an enclosed area that are substantially equal to the cross section of the block of magnetic material. The resonator may have an effective size 9402 that is substantially equal to the physical dimensions of the resonator.

In other embodiments, a planar resonator may be implemented using an arrangement of two or more smaller resonators or blocks of magnetic material. Each of these smaller resonators may comprise smaller blocks of magnetic material wrapped by conductors forming loops with enclosed areas that are substantially equal to the cross sectional area of the blocks of magnetic material. As depicted in an example embodiment in FIG. 94(*b*), two smaller blocks of magnetic material 9408, each wrapped with a conductor 9410 may be arranged side by side to create a resonator with an effective size 9402 that is substantially equal to the physical dimensions of the arrangement of the two blocks of magnetic material. In embodiments, more than two blocks of magnetic material, each comprising a conductor 9414 wrapped around the blocks 9412, may be arranged in two or three dimensional arrays as depicted in FIGS. 94(*c-d*) to create a larger effective composite resonator that has an effective size 9402 that is substantially equal to the physical dimensions of the arrangement of the blocks of magnetic material. The arrays of smaller resonators may be sized and arranged to create an array with the desired effective size and shape and the array may be used instead of a resonator comprising a single substantially continuous block of magnetic material.

In embodiments each block of magnetic material wrapped with a conductor may be treated as a separate resonator and may be coupled to additional electrical elements such as capacitors or inductors for parameter adjustment of each individual block. In other embodiments some or all of the conductors wrapped around the blocks of magnetic material may be connected together and coupled to additional electrical elements such as capacitors, inductors, and the like to make the complete arrangement of blocks of magnetic material and conductors a single resonator. In embodiments, the multiple smaller inductive or resonator structures may be connected in series, or in parallel, or in a network of serial and parallel connections.

In some embodiments, an arrangement of smaller resonators or arrangements of smaller blocks of magnetic material wrapped with a conductor may offer advantages over a single large resonator with respect to manufacturability, cost, scalability, variability, and the like. Magnetic materials are often brittle and a large continuous piece of magnetic material of the resonator, especially for a large resonator, may be susceptible to damage and cracking Smaller arrays of resonators may be more resistant to vibrations and damage as it may be easier to isolate, reinforce, package, and the like the smaller separate blocks of magnetic material. Likewise, composite resonators comprising arrays of separate blocks of magnetic material wrapped with a conductor may be more scalable or expandable. A composite resonator array may be made larger or smaller by adding or removing individual resonator elements or adding or removing individual blocks of magnetic material from the array to increase or decrease the effective size of the resonator depending on the application or deployment configuration. Such arrangements may have advantages in that a large range of resonator effective sizes and shapes may be realized by assembling multiple smaller resonators. Then, a single or a few standard resonators may be stocked, tested, manufactured in volume, and the like, and used to support a wide variety of resonator sizes and shapes supplied for wireless power transfer systems.

Figure 95:
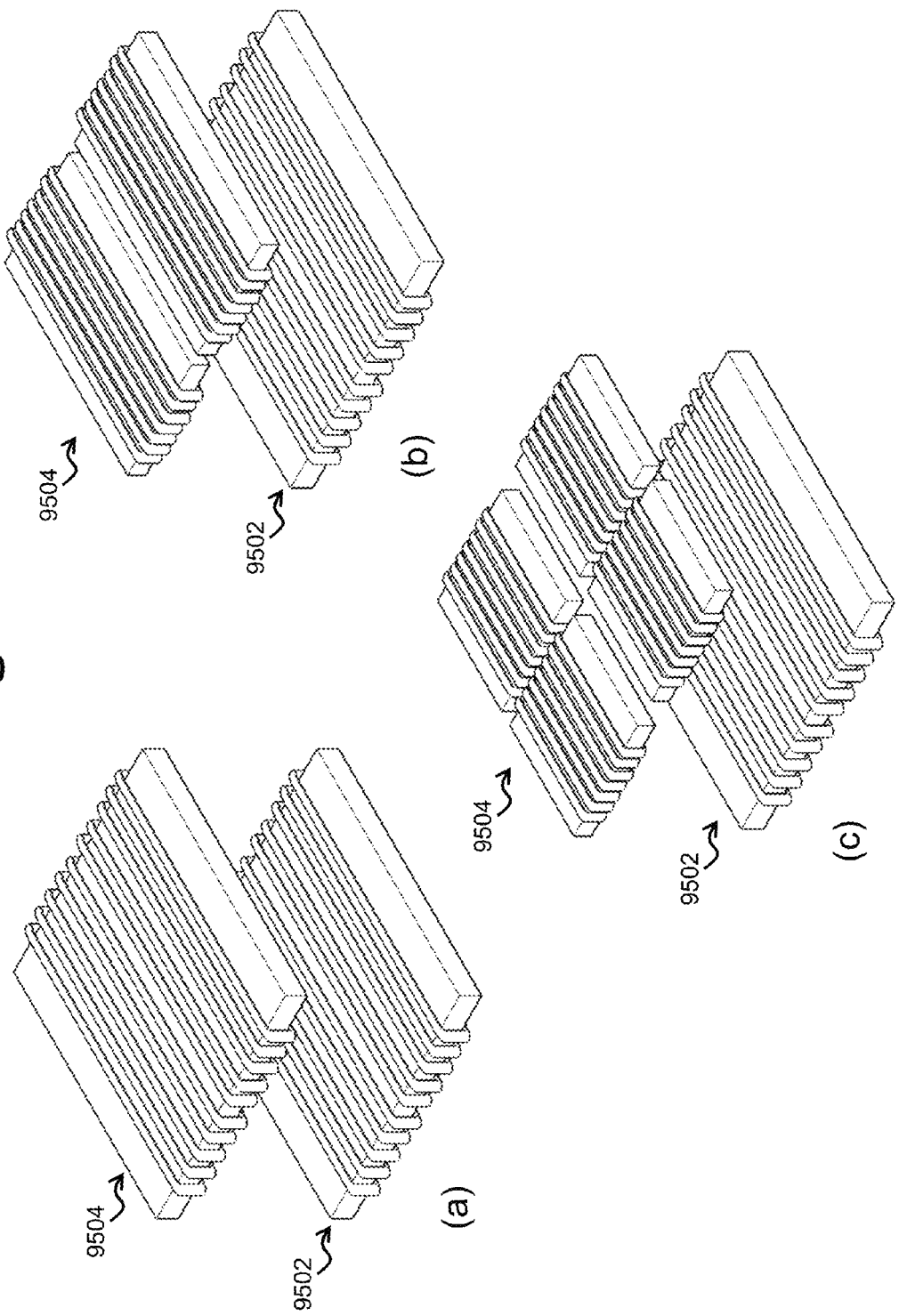
FIGS. 95(*a-c*) is an isometric view of resonator configurations used for comparison of wirelss power transfer characteristics between resonators comprising one and more than one separate block of magnetic material.

In embodiments, composite resonators comprising arrangements of smaller resonators or arrangements of blocks of magnetic material may have substantially the same or similar system parameters and wireless power transfer characteristics as a resonator with a larger, substantially continuous piece of magnetic material and may be used to replace or substitute resonators with a larger, substantially continuous piece of magnetic material without a significant impact on the performance or characteristics of wireless power transfer. In one embodiment of a wireless power transfer configuration, the parameters of wireless power transfer between a source and a device were calculated and compared using finite element method models for arrangements for which the device resonator 9504 was implemented as a conductor wrapped around a single substantially continuous blocks of magnetic material (FIG. 95(*a*)), for which the device resonator 9504 was implemented as two conductors wrapped around two equally sized blocks of magnetic material (FIG. 95(*b*)), and for which the device resonator 9504 was implemented as four conductors wrapped around four equally sized blocks of magnetic material (FIG. 95(*c*)). In each configuration of the device, the effective size of the resonator was maintained at 30 cm by 32 cm and was aligned directly 20 cm above a 30 cm by 32 cm source resonator 9502 comprising a conductor wrapped around a substantially continuous block of magnetic material. In the configuration where the device resonator comprises a single block of magnetic material as shown by 9504 in FIG. 95(*a*), the quality factor of the effective device resonator was calculated to be 450, and the coupling factor k between the source and the device was calculated to be 0.124, resulting in a predicted wireless power transfer efficiency of 96.4% between the source and the device. In the configuration where the device resonator comprises two smaller blocks of magnetic material wrapped with a conductor and separated by a 0.1 cm gap of air, as shown by 9504 in FIG. 95(*b*), the quality factor of the effective device resonator was calculated to be 437, and the coupling factor k between the source and the device was calculated to be 0.115 resulting in a predicted wireless power transfer efficiency of 96.2% between the source and the device. In the configuration where the device resonator comprises four smaller blocks of magnetic material wrapped with conductors separated by a 0.2 cm air gap, as shown in FIG. 95(*c*), the quality factor of the effective device resonator was calculated to be xxx, the coupling factor k between the source and the device was calculated to be 0.109 resulting in a predicted wireless power transfer efficiency of 96% between the source and the device.

Figure 96:
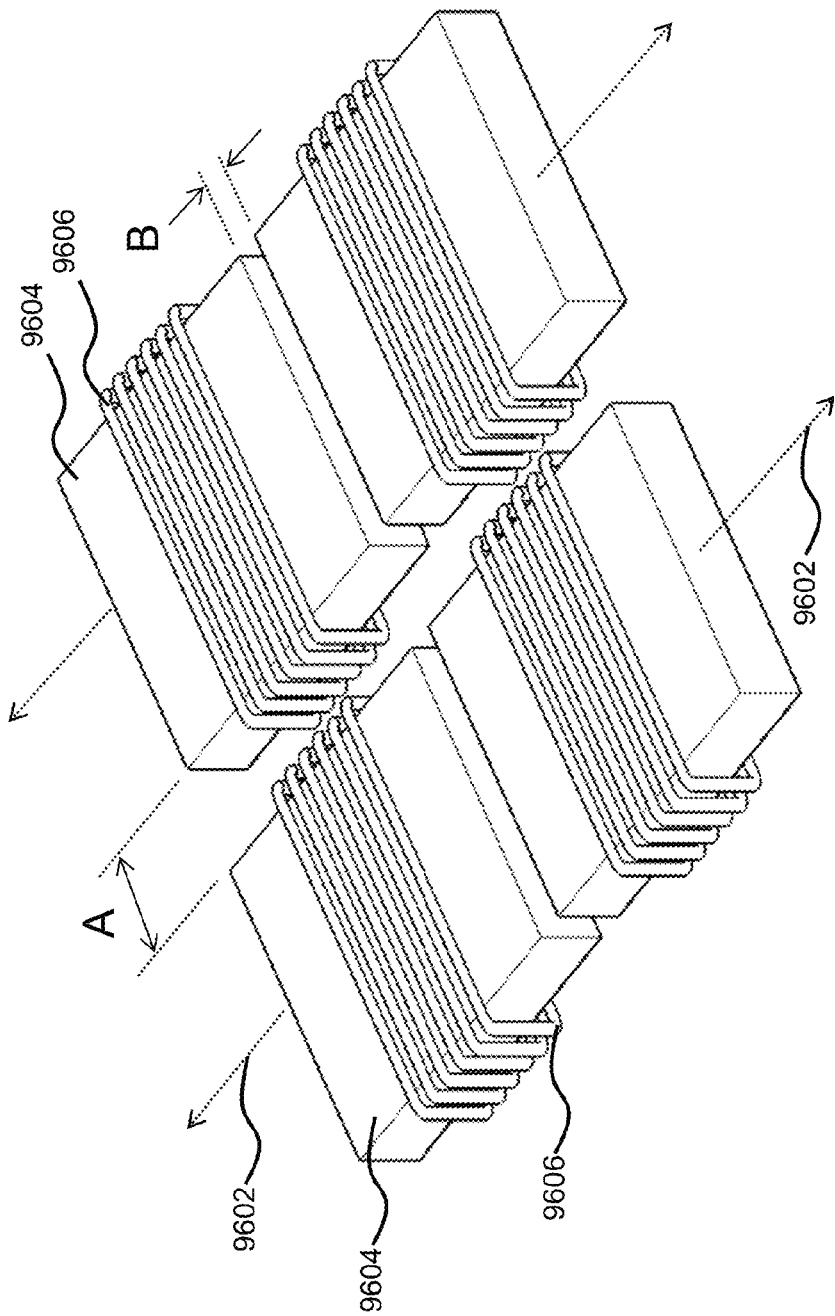
FIG. 96 is an isometric view of a resonator comprising four separate blocks of magnetic material each wrapped with a conductor.

In embodiments, the parameters of the arrangement of composite resonators comprising smaller blocks of magnetic material may be affected by the orientation, positioning, arrangement, and configuration of the blocks of magnetic material, the conductor, and the like. One factor found to be of importance is the separation distance between the resonators and the smaller blocks of magnetic material that may comprise a resonator with a larger effective area. For example, consider a composite resonator with a large effective area comprising four separate smaller resonators with separate blocks of magnetic material is depicted in FIG. 96. The size of the separation distances, labeled as A and B in the figure, may affect the parameters of the resonator and the efficiency of wireless power transfer. For example, for the configuration and orientation depicted in FIG. 95(*c*) and described above, changing both dimension A and dimension B from 0.2 cm to 2 cm reduced the efficiency of wireless power transfer from the source to the device from 96% to 94.8%.

In embodiments it may be preferable to minimize the gaps between the blocks of magnetic material, and may be especially preferable for gaps that are not parallel to the axis of the dipole moments 9602 of the resonators. In embodiments the size of an acceptable or preferable air gap may be dependent on the overall or effective size of the larger resonator, the size of the individual small resonators, power levels, and the like. In embodiments it may be preferable to ensure that the gaps between the blocks of magnetic material be smaller than 10% of the largest dimension of the effective size of the resonator arrangement. In embodiments it may be preferable to ensure that the gaps between the blocks of magnetic material be smaller than 10% of the smallest dimension of the effective size of the resonator.

Figure 97:
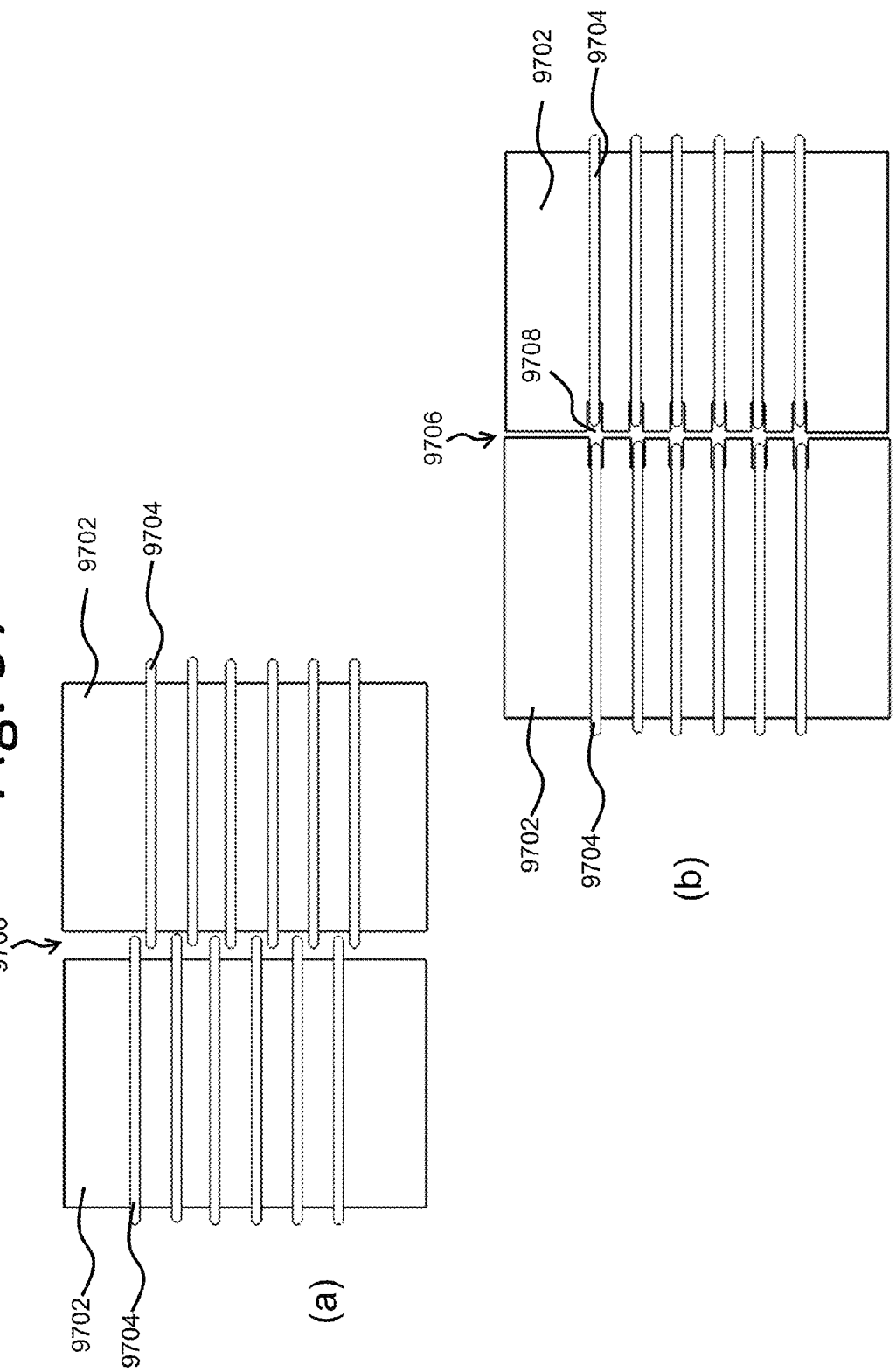
FIG. 97 (*a*) is a top view of a resonator comprising two blocks of magnetic material with staggered conductor windings, (*b*) is a top view of a resonator comprising two block of magnetic material shaped to decrease the spacing between them.

In embodiments, the individual smaller resonators or individual blocks of magnetic material wrapped with a conductor and comprising the effective larger composite resonator may include features, shapes, designs, notches, and the like to enable smaller separation gaps between the smaller blocks of magnetic material or the smaller resonators. In some embodiments, the gap 9706, as shown in FIG. 97, between adjacent resonators may be reduced reduced by staggering the conductor windings 9704 of the adjacent resonators and allowing a conductor of a neighboring resonator to fit between adjacent windings of the conductor of an another resonator as shown in FIG. 97(*a*). In some embodiments the blocks of magnetic material 9702 may be shaped and may have indentations, notches, holes, and the like 9708 to generate an indentation for the conductor 9704 allowing neighboring blocks of magnetic material to come close together and have a separation 9706 that may be smaller than the thickness of the conductor 9704 as shown in FIG. 97(*b*).

In embodiments the gaps between the resonators may be filled completely or partially with magnetic material blocks, powder, epoxy, and the like. In some embodiments the magnetic material may be different from the blocks of magnetic material that comprise the smaller resonators. In some embodiments it may be preferable to use a flexible form of magnetic material which may prevent or reduce vibration or shock transfer between resonators.

In embodiments each of the smaller blocks of magnetic material comprising a larger effective composite resonator may be wrapped with separate pieces of conductors and coupled to separate tuning and matching networks. Each block of magnetic material with a wrapped conductor may be an individual resonator and may be tuned or adjusted independently from the other resonators. In embodiments each resonator or groups of resonators may be coupled to separate power and control circuitry which may be synchronized with an oscillator or clock to ensure all resonators and power and control circuitry are operating at the same frequency and phase or at predetermined frequencies and phase offsets. In embodiments a single power and control circuitry may be used for all of the resonators and, in the case of a source, may drive all the resonators in parallel with an oscillating voltage, or in the case of a device, one power and control circuitry may capture and convert the oscillating voltage on each resonator conductor.

In embodiments a single conductor may be used to sequentially wrap all or groups of blocks of magnetic material of the resonator. A conductor may be wrapped around one block of magnetic material and then wrapped around a second and so on providing a series connection between the conductors around multiple blocks of magnetic material. In such embodiments a single power and control circuitry may be used to energize the conductor with oscillating current.

In embodiments the individual smaller resonators and blocks of magnetic material that comprise the composite resonator arrangement may all have substantially equal dimensions. In other embodiments the blocks of magnetic material may be non-uniform and may have varying thickness or irregular shapes.

In embodiments, the individual smaller resonators or individual blocks of magnetic material wrapped with a conductor comprising the effective larger composite resonator may all be wrapped such that all the loops formed by the conductor are coaxial or such that the axis of all the loops formed by the conductors are all parallel. In other embodiments, the conductors may be wrapped such that not all the axes of the loops formed by the conductors are parallel. Some blocks of magnetic material may be wrapped or arranged such the conductor forms loops with an axis that is perpendicular to other loops of other conductors and may be used to form a larger effective composite resonator that has, or has the capability of having a magnetic dipole moment in more than one direction.

In embodiments a composite resonator comprising an arrangement of smaller blocks of magnetic material may include blocks of magnetic material without a wrapped conductor.

In embodiments of a composite resonator comprising an arrangement of smaller blocks of magnetic material or smaller resonators the conductors may be selectively energized or activated depending on the power levels, distances, magnetic field limits, and the like during wireless power transfer. In embodiments, for example, a source resonator comprising an arrangement that includes multiple conductors may energize one or only a portion of the conductors when low levels of wireless power transfer are required and may energize most or all of the conductors when high levels of wireless power transfer are required.

In some embodiments different conductors or different numbers of conductors may be energized depending on the relative location of a source and a device including distance or lateral offset. For example, in embodiments for a vehicle charging application, where the source resonator may be of a larger dimension than the device resonator as shown in FIG. 93, the source resonator may comprise smaller blocks of magnetic material or smaller resonators for which only the blocks and conductors that are directly below the device resonator may be energized. In such an embodiment the source and device resonators may tolerate greater lateral offset while ensuring that the strongest magnetic fields are always confined to the area below the device resonator.

It is to be understood that any description of blocks of magnetic material, small or large, may refer to blocks that comprise a single monolithic block, tile, structure, crystal, sheet, square, shape, form, and the like, of magnetic material or may comprise any combination of separate smaller blocks, tiles, structures, crystals, sheets, squares, shapes, forms, and the like, of similar or different types of magnetic material that are attached, packed, assembled or secured together to form a substantially continuous form.

Integrated Resonator-Shield Structures

In some embodiments and applications of wireless power transfer it may be necessary or desirable to place the resonator structure in close proximity to another object such as electronic devices, circuit boards, metallic objects, lossy objects, and the like. In some embodiments close proximity to some types of objects, such as batteries, circuit boards, lossy objects, and/or metals, may adversely affect or perturb the performance of the power transfer system. Close proximity to some objects may reduce the quality factor of one or more of the resonators involved in the power transfer or may impact the coupling between two or more of the resonators. In some embodiments the electromagnetic fields generated by the resonators may also affect objects around the resonator by, for example, affecting the operation of electronic devices or circuits, or causing heating of the object.

In embodiments, the effects of the electromagnetic fields on objects as well as the effects of objects on the parameters of wireless power transfer or parameters of the resonators may be at least partially mitigated by introducing a shielding structure between the resonator and the object, as described above and shown in FIGS. 21, 25-27, 79, and 84. In some embodiments, the shielding structure and the resonator may be integrated into one structure allowing the resonator structure to be placed or located near an object with minimal effects on quality factor Q of the resonator and likewise minimal effects on the external object. In some embodiments, an integrated resonator and shield structure may be smaller in at least one dimension, than a structure comprising a resonator and a shield assembled from each of its parts separately.

As described above, one method of shielding against perturbations from external objects for planar resonators, or resonators comprising a block of magnetic material, is to place a sheet of a good conductive material between the resonator and the object. For example, as shown in FIG. 98(a) for a planar resonator 9818 comprising a block of magnetic material 9814 and a conductor wire 9816 wrapped all the way around the block 9814, a shield comprising a sheet of a good electrical conductor 9812 can be positioned next to the resonator 9818 at least partially shielding the resonator from the effects of objects located below 9820 the conductor shield 9812, and likewise at least partially shielding the objects positioned below 9820 the shield from the effects of the electromagnetic fields that may be generated by the resonator. Note that while the Figures may not show the resonator capacitors explicitly, it should be clear the magnetic resonators described here comprise inductive elements comprised of conductive wire loops, either in air or wrapped around a block of magnetic material and capacitive elements, as described above.

One physical effect of the addition of a conductive shield such as shown in FIG. 98(a) is the generation of an "image" resonator, on the other side of the conductive shield. One of ordinary skill in the art will recognize that the "image" described here is similar to the image charges and the method of images used to replicate electromagnetic boundary conditions along a perfect conductor. The "image" resonator will have "image" currents that mirror the electromagnetic currents in the resonator itself. In the limit where the size of the shield is infinitely larger than that of the resonator, the electromagnetic fields in the region of the actual resonator can be expressed as a superposition of the fields generated by the actual resonator and those generated by the image resonator. In some embodiments, an additional benefit of including a shield in the resonator structure is that the shield doubles the effective thickness of the magnetic material in the resonator structure.

In the limit where the shield is flat, large, close to the resonator, and highly conductive, the image currents and the actual currents flowing on the inner conductor segments (between the actual resonator and its image) of the real and image structures will be substantially equal and opposite and the electromagnetic fields they generate are substantially cancelled out. Therefore the wire segments that traverse the bottom of the magnetic material contribute very little to the overall field of the resonator. However, their resistive losses reduce the resonator Q and their thickness increases the overall thickness of the structure.

Figure 98:
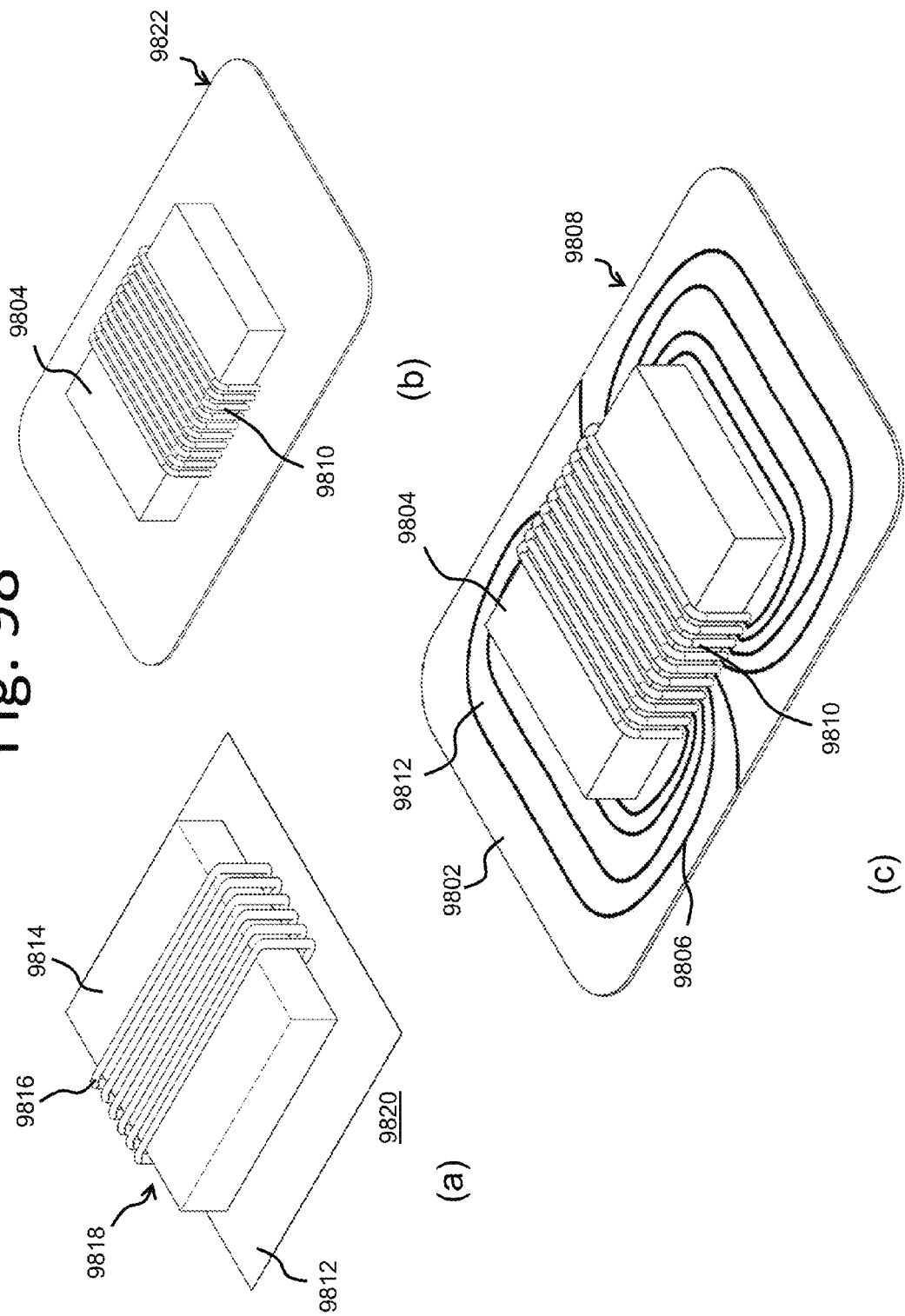
FIG. 98 (*a*) is an isometric view of a resonator with a conductor shield, (*b*) is an isometric view of an embodiment of a resonator with an integrated conductor shield, and (*c*) is an isometric view of a resonator with an integrated conductor shield with individual conductor segments.

In some embodiments, a conductive shield may be placed in proximity to a planar resonator so that a thinner resonator may be used to achieve similar performance to one that is twice as thick. In other embodiments, the thin resonator may be made thinner by moving or removing the segments of the conducting wire that traverse the "bottom" of the magnetic material as shown in FIG. 98 (a). As described above, these wire segments contribute very little to the overall field, but their resistive losses reduce the resonator Q and their thickness increases the overall thickness of the structure. If these conducting wire segments are to be moved or removed from the resonator structure, an alternate electrical path for the current must be provided so that current can flow through the inductive element and around the magnetic material of the resonator.

One structure that removes the wire segments from below the block of magnetic material while preserving the shielding is shown in FIG. 98 (b). In embodiments, current may be returned to the remaining segments of the winding by connecting the remaining winding segments directly to the conductor shield. Such a resonator and shield combination may have a higher-Q than an equivalent resonator not electrically connected to a shield but using a continuous wire wrapping, provided that the current distribution in the newly integrated shield and remaining windings is substantially the same as in the configuration for which the conductor shield is separate. In some embodiments the same current distribution in the integrated resonator-shield structure may be achieved by driving or controlling the current in each conductor wire segment individually. In other embodiments the current distribution may be achieved by separating the shield into optimized individual conductor segments as will be shown below.

In embodiments it may be advantageous to explicitly incorporate the shield as part of the resonator, and use the conductor shield to carry currents that are directly connected to other parts of the resonator that do not have a shielding function. The integrated resonator-shield structure may eliminate the resistive losses of the image currents generated in the shield and may have an increased quality factor compared to a structure using a separate shield and resonator.

An example embodiment of the inductive portion of an integrated resonator-shield structure is shown in FIG. 98(*b*) and comprises a sheet of conductor 9822, a block of magnetic material 9804, and conductor wire segments 9810. The block of magnetic material 9804 is positioned on top of the sheet of conductor 9822 and the core is partially wrapped by the conductor wire segments 9810. The ends of the conductor wire segments 9810 are connected to opposite sides of the conductor shield not covered by the block of magnetic material. In other words, the conductor wire segments only partially wrap the block of magnetic material. That is, the conductor wire segments do not wrap completely around the core of magnetic material, but rather connect to the shield or segments of the shield to complete the electrical circuit. In FIG. 98 (*b*), the conductor wire segments wrap the top and both sides of the block of magnetic material. The conductor wire segments connect to the conductor shield which is used to complete the electrical connection between the two ends of the conductor wire segment. In embodiments, the conductor shield functions in part as the current path for the conductor wire segments.

In some embodiments, the overall current distribution in the winding segments and shield of an integrated resonator may differ substantially from that of the separate resonator and shield, even after accounting for the redundant currents. This difference may occur if, for example, the remaining segments of winding are simply electrically connected to the shield (e.g., by soldering), in which case the separate windings would all be connected in parallel with the shield and unless additional power control is added for each conductor wire segment the electrical current would flow preferentially in those portions of winding exhibiting the lowest impedance. Such a current distribution may not be suitable for all applications. For example, such a current distribution may not be the one that minimizes losses and/or optimizes performance.

One alternative embodiment of the integrated resonator-shield structure is to split the continuous conductor shield into distinct, electrically isolated conductor segments. In FIG. 98(*c*) the integrated resonator-shield structure comprises a conductor shield 9808 that is split or divided into distinct isolated conductor segments 9802, 9812, etc that connect the ends of different conductor wire segments 9810, 9814 forming an electrical connection between the conductor wire segments and creating one continuous conducting path. The net result is a series connection of conductor wire segments alternated with electrically isolated segments of the conductor shield.

Figure 99:
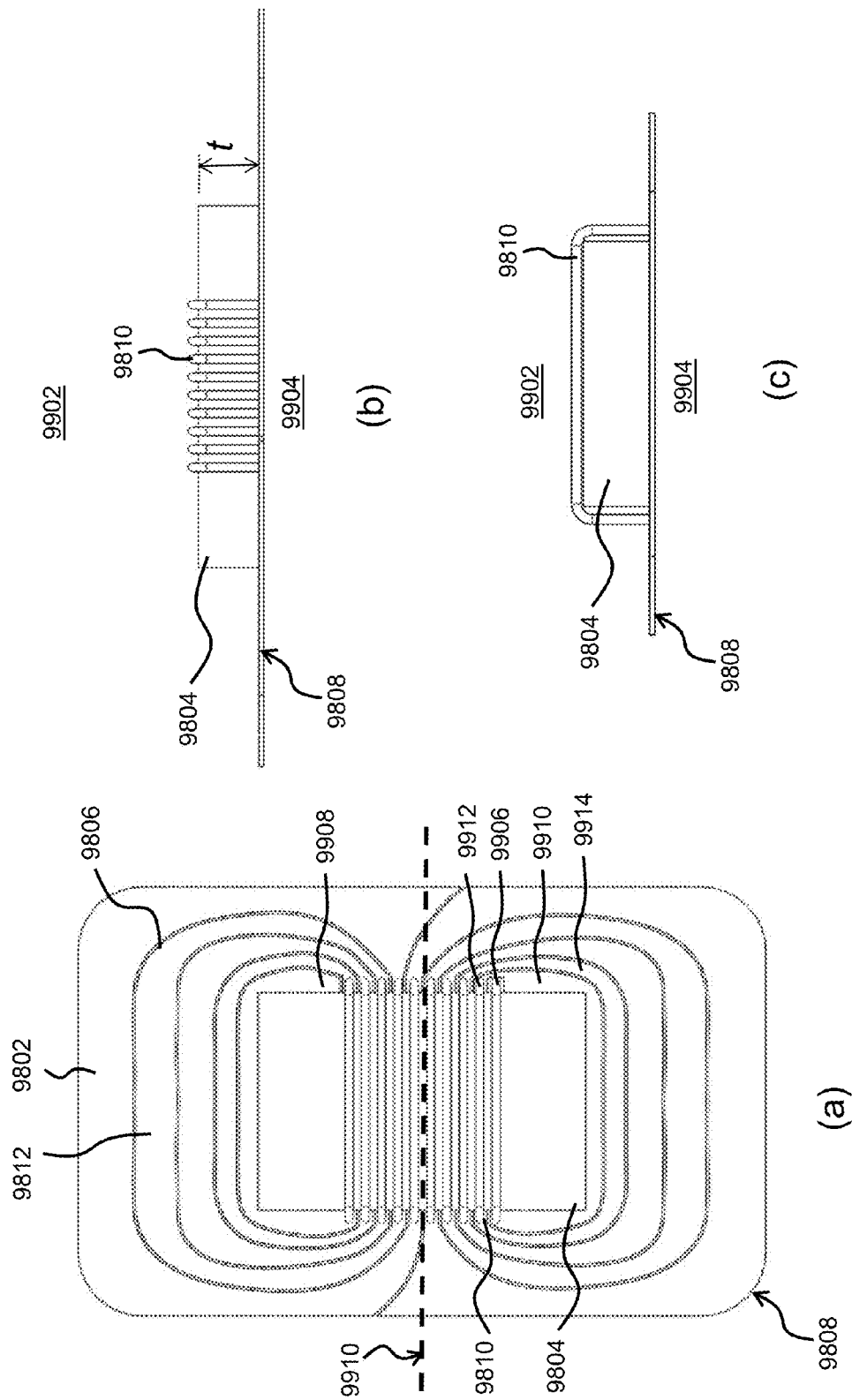
FIG. 99 (*a*)(*b*)(*c*) are the top, side, and front views of an embodiment of an integrated resonator-shield structure respectively.
Figure 100:
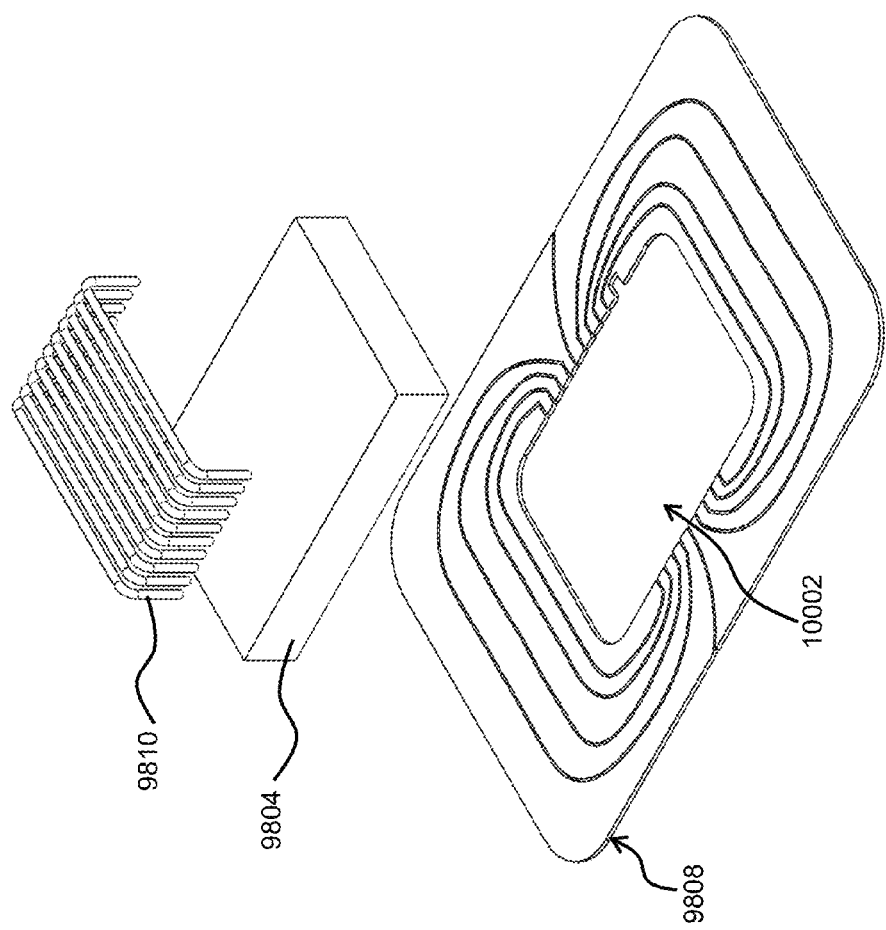
FIG. 100 is an exploded view of an embodiment of an integrated resonator-shield structure.

The top, side, front, and exploded views of one embodiment of the integrated resonator-shield structure are shown in FIGS. 99(*a*), 99(*b*), 99(*c*), and FIG. 100 respectively. The integrated resonator-shield structure has a conductor shield 9808 that is split into multiple isolated conductor segments or paths, 9802, 9812, that are connected to the ends of the conductor wire segments 9810, 9814, the conductor wire segments then partially wrap the block of magnetic material 9804, or rather the conductor wire segments are routed so as to cover part of the magnetic material. As can be seen from the front view of the resonator in FIG. 99(*c*), the conductor wire segment 9810 does not wrap completely around the core of magnetic material 9804, but only wraps partially with the ends of the conductor wire segment 9810 connected to different segments of the conductor shield 9808.

In embodiments the conductor shield may be split into multiple segments and shaped such that the shield segments connect to the ends of the wire conductor segments in a manner that results in each or some of the wire conductors segments being connected in series. An exemplary conductor shield with segments shaped and configured to connect the conductor wire segments in series is shown in FIG. 99(*a*). Each segment 9802, 9812 of the conductor shield 9808 is shaped to connect two ends of different conductor wire segments 9810. In this configuration for example, the individual shield segments and the conductor wire segments are connected in series to produce one continuous conductor that partially wraps around the core of magnetic material 9804 top to bottom, and partially wraps around the block of magnetic material in the plane of the shield. For the embodiment shown in FIG. 99(*a*) for example, the effective conductor starts at the end of one conductor wire segment 9906 and alternates between the conductor wire segments above the block of magnetic material 9804 and the segments of the conductor shield 9808 that are routed around the block of magnetic material 9804. The first conductor wire segment 9906 is routed over the block of magnetic material 9804 and connects to a conductor shield segment 9910 which in turn connects to another conductor wire segment 9912 that is routed over the magnetic material and connects to another conductor segment 9914 and the pattern of alternating conductor wire segments and conducting shield segments is repeated until the last conductor segment of the conductor shield 9908. The combination of the segments on the conductor shield and the conductor wire segments above the core of magnetic material create an effective continuous conductor and thus a magnetic resonator with an integrated shield that may be used to transfer or capture wireless power via oscillating magnetic fields. In embodiments, the conductor wire segments may comprise any type of wire such as solid wire, Litz wire, stranded wire and the like. In other embodiments, the conductor wire segments may comprise PCB or flex circuit traces, conductor strapping, strips, tubing, tape, ink, gels, paint, and the like.

The structure shown in FIG. 99(*a*), for example, may be used as a source magnetic resonator by coupling the two ends of the effective conductor 9906, 9908 to at least one capacitor and to an oscillating voltage power source. The oscillating currents in the effective conductor will generate oscillating magnetic fields that are substantially parallel to the conductor shield 9808 while providing shielding against lossy objects that may be positioned below 9904 the resonator-shield structure. In addition, the fields that are generated may appear as if they have been generated by a resonator with a block of magnetic material that is twice as thick as the actual dimension of the magnetic material block, t, under certain coupling scenarios.

In embodiments it may preferable to connect the conductor wire segments and the segments of the conductor shield such that when the effective conductor is energized by an external power source or by external oscillating magnetic field, the currents in the conductor wire segments flow substantially in the same direction. For example, for the embodiments shown in FIG. 99(*a*), the conductor wire segments are connected such that when the effective conductor is energized through the conductor ends or leads 9908, 9906, all the currents in all individual conductor wire segments 9810, etc. flow in the same direction, wherein the direction depends on the polarity of the induced voltages on the effective conductor. Current flowing in the same direction in the conductor wire segments may generate the strongest magnetic field.

In embodiments it may be preferable to connect and arrange the segments of the conductor shield such that the currents in the shield segments flow in opposite directions for shield segments above or below the center line 9910 of the resonator. For example, for the embodiment shown in FIG. 99(*a*), the conductor segments of the conductor shield are connected such that when the effective conductor is energized at the ends 9908, 9906, the electric currents above the center line of the resonator 9910 flow in the opposite rotation than the currents below of the center line of the resonator 9910 in the conductor segments 9802, 9812 of the conductor shield 9808. That is, if the currents in conductor segments above the center line flow in substantially a clockwise direction, the currents below the center line should flow substantially in the counterclockwise direction. The counter flowing current of the top and bottom portions of the segments of the conducting shield may direct the magnetic fields generated by the respective portions of the resonator to enhance one another or point toward the same direction strengthening the dipole moment of the resonator towards a plane parallel with the conductor shield.

In embodiments the splitting of the integrated shield that generates the conductor shield segments could be done self-consistently so that the resulting current distribution for the integrated structure would perform at least as well (as defined by the resulting quality factor, effectiveness in shielding, coupling to other resonators, and the like) as the original system comprising a separate resonator and shield.

In embodiments the shape and distribution of the segments on the conductor shield may be designed to equalize currents in each segment of the shield, in each conductor winding segment, or in sections of combined segments. It may be preferable to shape and divide the conductor shield and shape the shield segments such that each shield segment carries substantially equal electric current. Such a current distribution may reduce proximity losses for example. The shaping of the shield segments is often done so they are narrower or thinner when they are closest to the magnetic material and thicker or wider when they are farther away may be preferable in some embodiments because the distribution arising from driving all of the conductor segments in parallel with equal current best approximates the current distribution in a solid shield located close to a resonator in a non integrated resonator-shield structure.

The general characteristics of the pattern may be seen in the shield segment shapes in the embodiments shown in FIG. 99(*a*) for example. In the Figure, the conductor segments 9812, 9802 span or cover a larger area of the conductor shield 9808 the further the segments are from the block of magnetic material 9804. In the non-integrated resonator-shield structure, the effective currents induced in the conductor shield increase in areas closer to the block of magnetic material 9804. Shaping the shield segments as shown in FIG. 99 (*a*) forces a substantially similar current distribution in the integrated structure with the segmented shield.

In embodiments, the conductor shield may not need to extend all the way below the block of magnetic material. In embodiments the area under the block of magnetic material may be substantially void of magnetic fields during operation of the resonator. In embodiments the conductor shield may have a hole or cut-out below the block of magnetic material (in the area where the block of magnetic material and the conductor shield would otherwise overlap). In embodiments, removing this shielding material may make the resonator structure lighter or less expensive to make. For example, FIG. 100 depicts an exploded view of an embodiment of a integrated resonator-shield structure which comprises a conductor shield 9808 with a cutout or hole 10002 in the area of the conductor shield which would otherwise overlap with the block of magnetic material 9804 in the assembled structure.

In embodiments, the effective size of the shield may be larger than the dimensions of the block of magnetic material or the inductive portion of the resonator. The exact dimension of the conductor shield may differ for different applications. For example, in resonators designed for small devices such as cell phones or other hand held electronics, it may be preferable to ensure that the conductor shield extends out at least 15-20% of the length of the block of magnetic material in each direction. This shield extension may provide additional shielding from lossy materials in the cell phones or other hand held electronics. The size of the shield with respect to the magnetic material may depend on the types and sizes of objects the shield is meant to be effective against. The size of the conductor shield may be reduced if, for example, objects or materials behind the shield are not very lossy. In embodiments where the resonator may placed on a plane of very lossy steel, however, it may be desirable to make the shield larger to minimize the losses in the steel and the shield may have dimensions larger than 30% larger or more than the dimensions of the block of magnetic material.

In embodiments the segmented shield may be manufactured by any number of fabrication techniques, including machining, electroplating, electro-deposition, etching, painting, patterning, and the like and by rigid and flexible printed, deposited, etched, and the like, circuit board techniques. The individual segments on the conductor shield may be formed by machining a single piece of conductor. In embodiments the separation between the shield segments may comprise an additional separation or insulation space, layer or material. Such additional separation may provide improved electrical isolation between the segments and may prevent electrical arcing between two adjacent conductor traces.

In embodiments, the conductor shield may be further divided into multiple layers of conductors separated by insulators. A layered shield may be used to increase the cross section of conductor over which electrical current flows beyond the limits set by the skin depth effect at the frequency of operation, as described in previous sections. In embodiments, a layered shield may reduce the AC resistance of the conductor segments and increase the quality factor of the structure. A layered shield may also be used to achieve an integrated resonator-shield structure having dipole moments with substantially mutually orthogonal orientations in a thin and compact structure. Such a structure might comprise conductor wire segments that are orthogonal to each other on top of the block of magnetic material. Each layer of shield segment may itself be further divided into narrower tracks of conductor that would provide additional control over the current density profile in the shield and may further increase the performance of the structure.

Figure 101:
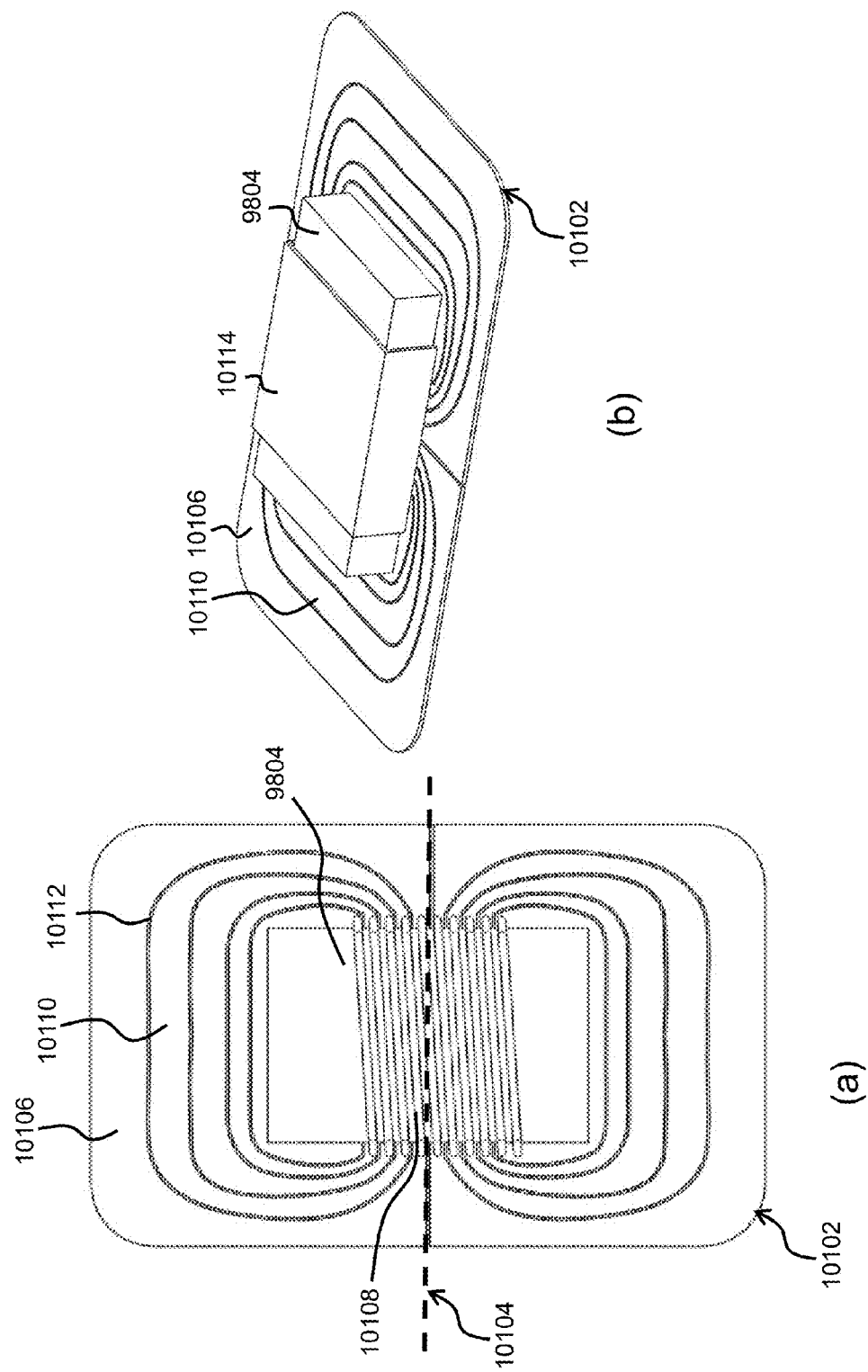
FIG. 101 (*a*) is the top view of an embodiment of an integrated resonator-shield structure with symmetric conductor segments on the conductor shield, (b) is an isometric view of another embodiment of an integrated resonator-shield structure.

In embodiments the segments of the conductor shield may be shaped and arranged to provide a serial connection of the conductor wire segments that are partially wrapped around the block of magnetic material. For example, in the embodiment depicted in FIG. 99(*a*), the shield segments 9812, 9802 are non symmetric with respect to the center line 9910 of the resonator. Each shield trace is shaped to connect the ends of two different conductor wire segments 9810 allowing the conductor wire segments to be arranged in a symmetric pattern with respect to the centerline 9910. Such an arrangement may be advantageous for some configurations since it may allow simpler conductor wire design. The conductor wires that partially wrap around the block of magnetic material are all parallel and at right angles to the resonator structure. In other embodiments the shield segments may be completely or partially symmetric with respect to the center line of the conductor shield requiring the conductor wire segments that wrap partially above the magnetic core to be arranged such that they connect two ends of different shield segments. For example, in the embodiment depicted in FIG. 101(*a*) the shield segments 10106, 10110 of the conductor shield 10102 are symmetric with respect to the center line 10104 of the resonator. A serial connection of the conductor segments is provided by a non symmetric alignment, or diagonal alignment of the conductor wire segments 10108 that partially wrap the block of magnetic material 9804. In some embodiments a combination of non-symmetrical or symmetric shield segments and non-symmetrical or symmetrical conductor wire segment routing may be used to connect some or all of the conductors in series or parallel depending on the desired properties of the resonator. For example, for some higher power configurations wherein large currents may be present in the resonator it may be advantageous to use an arrangement in which at least some of the conductor wire segments are connected in parallel to reduce losses in the conductors.

In embodiments the conductor wire segments that partially wrap the block of magnetic material may be comprised of individual wires or braided wires such as Litz wire. In embodiments the conductor wires may be comprised of flex circuits or traces or printed circuits or traces and may be shaped to fold over the block of magnetic material and may have appropriate contacts or attachments to make electrical connections with the conductor segments of the conductor shield. For example, FIG. 101(*b*) depicts an exemplary embodiment in which the conductor wire segment is integrated into a single piece 10114 that may be a printed circuit board, a flex circuit, and the like, and is formed to fold over the block of magnetic material 9804 and make appropriate electrical contacts with the conductor segments of the conductor shield 10102.

Figure 102:
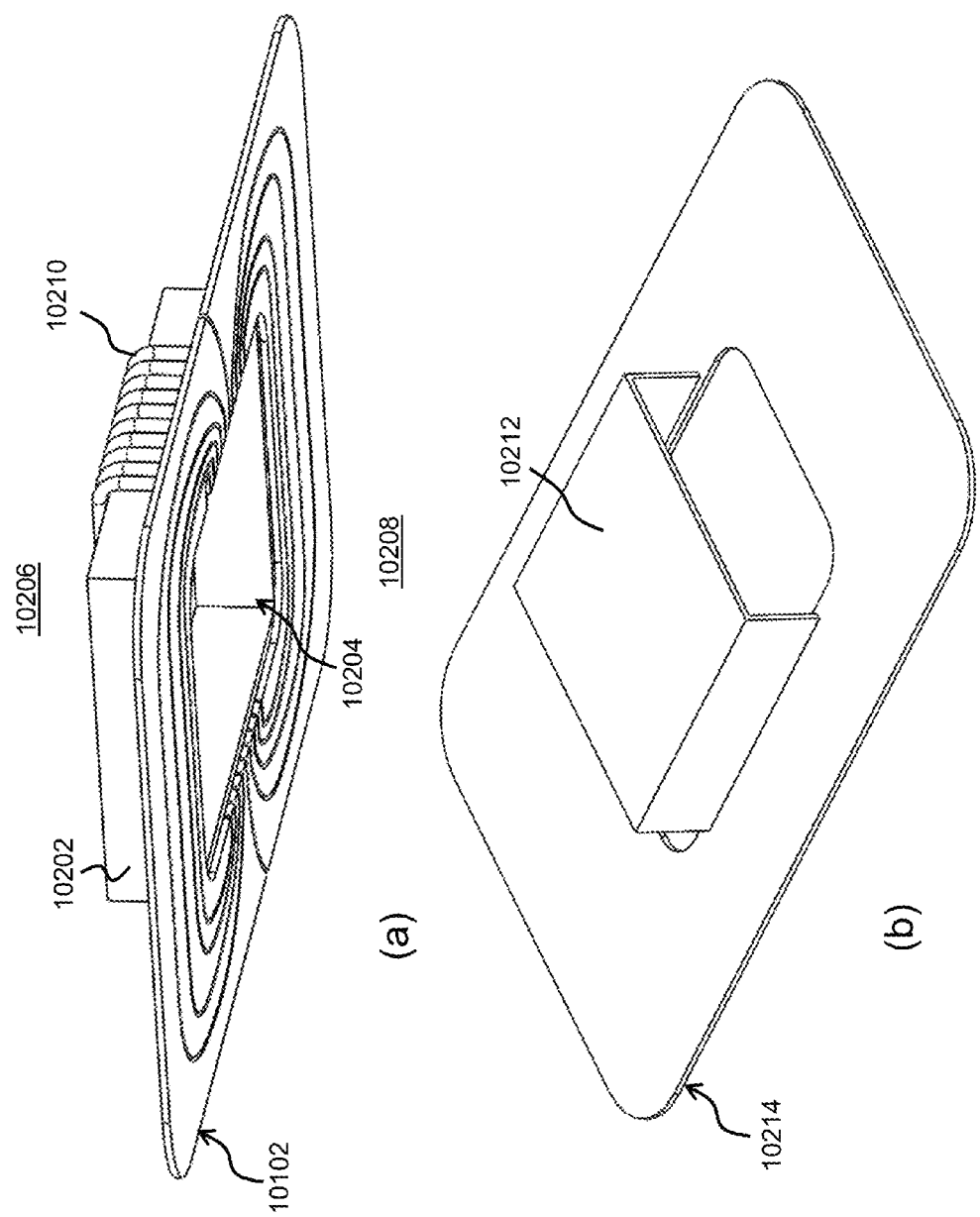
FIG. 102 (a) is an isometric view of an integrated resonator-shield structure with a cavity in the block of magnetic material, (b) is an isometric view of an embodiment of the conductor parts of the integrated resonator-shield structure.

In embodiments, the shield and conductor wire segments may be fabricated in the same process, potentially improving reproducibility and performance while reducing manufacturing costs. In embodiments, an integrated shield and conductor wire segments structure may be fabricated as a flexible PCB, and the resonator structure may be completed by simply inserting the block of magnetic material within the integrated shield and winding, and then connecting the resulting structure to the appropriate circuitry. In the exemplary embodiment depicted in FIG. 102(*b*), the complete structure of the conductor shield 10214 with the conductor segments (not shown) and the conductor wire part 10212 comprising individual conductor segments (not shown) may be one printed circuit board wherein the conductor wire part 10212 is bent or shaped to facilitate or support the placement of a block of magnetic material.

In embodiments, some or all of the supporting circuitry of the resonator may be fabricated on the same printed circuit board as the conductor shield of the integrated resonator-shield structure. For example, one side of the printed circuit board may have the printed conductor traces of the conductor shield while the other side may have electronic components and printed traces and may be used to contain the power and control circuitry for the resonators.

In embodiments, the block of magnetic material may be hollow or may have a cavity on the side facing the conductor shield where the effective magnetic fields or the resonator are minimal. The cavity in the magnetic material may be used to house electric or electronic components such as amplifiers or rectifiers used to power and control the resonator. The electronic components may be located in the cavity without significantly affecting the properties and parameters of the resonators and likewise not being significantly affected by the magnetic fields of the resonator. For example, FIG. 102(*a*) depicts an exemplary integrated resonator-shield structure wherein the bottom side 10208, or the side that faces the conductor shield 10102 of the magnetic material 10202 is shaped to have a cavity 10204 into which components or electronic devices may be located. Placing the components in the cavity 10204 may provide for an integrated resonator-shield structure with the power and control circuitry designed under the magnetic material and shield with minimal or no impact on the height or thickness of the resonator structure. In some embodiments, an antenna or the like may be placed in the cavity and may be operated at a frequency where the magnetic material is substantially transparent or at least not an effective shield. In such embodiments, the antenna may suffer little attenuation from the presence of the resonator.

In embodiments, the conductor shield of the integrated resonator-shield structure may have additional bends, curves, flaps, and the like to enhance, improve, or alter the magnetic fields generated or affecting the resonator. The conductor shield of the integrated resonator-shield structure may have any of the bends, curves, flaps and the like that were described herein for the designs comprising a separate resonator and conductor shield. For example, similarly to the conductor shield depicted in FIG. 84(*a*) in which the conductor shield 8402 is shaped to have flaps 8404, the conductor shield of the integrated resonator-shield structure may be shaped to include flaps that extend towards the block of magnetic material which may increase the effective size of the integrated shield without requiring a larger size conductor shield.

In embodiments, the design of the integrated resonator-shield structure may be sized, modified, configured, and the like to operate at specific configurations, power levels, frequencies, orientations, environments, and the like which may be required for specific applications. The number of conductor wire segments, the number of separate conductor segments on the conductor shield, the wire gauge, the thickness of the conductor shield, the thickness of the magnetic material, the dimensions of the shield, and the like may all be modified and manipulated to meet specific design requirements.

Figure 103:
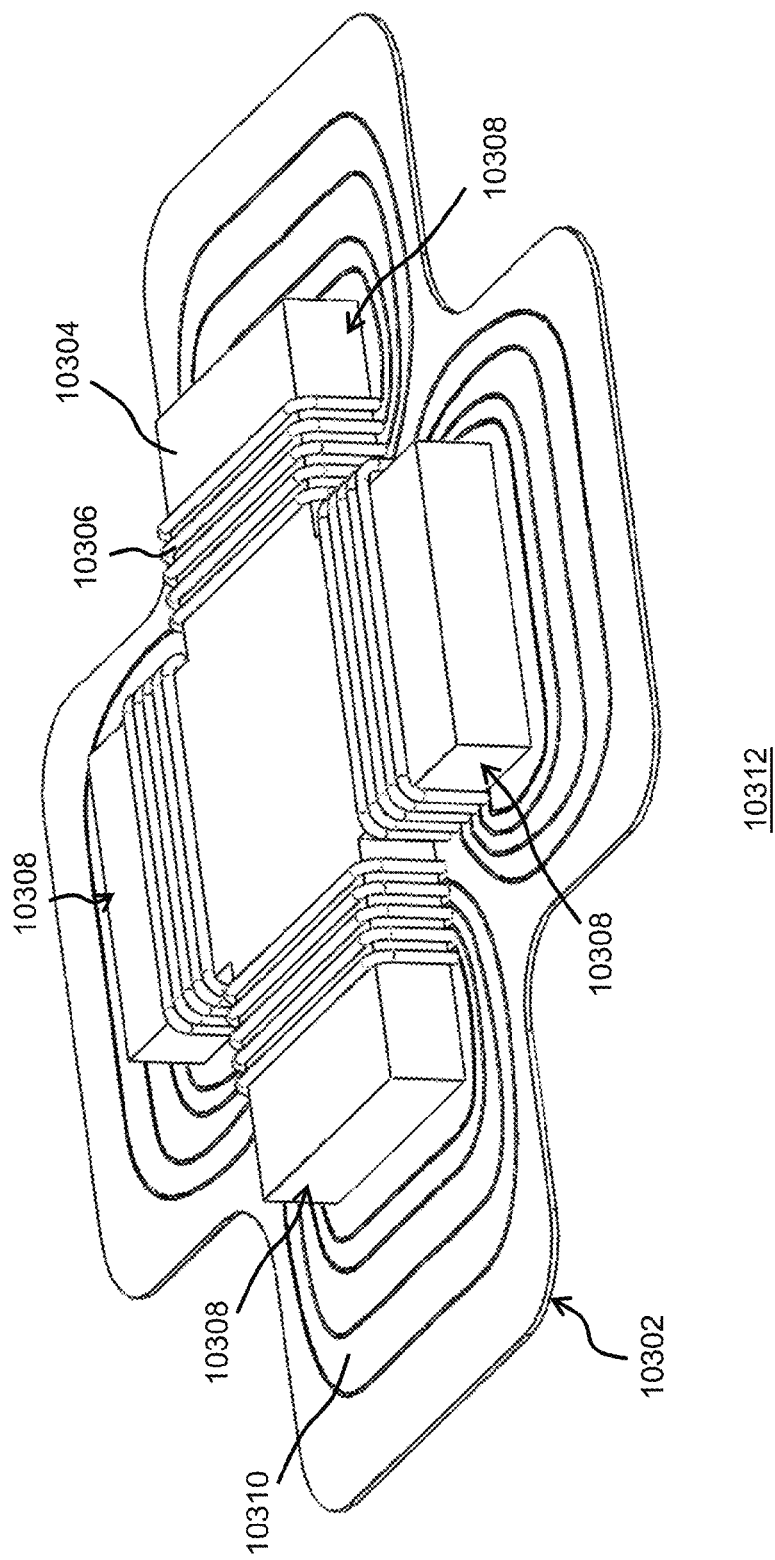
FIG. 103 is an isometric view of an embodiment of an integrated resonator-shield structure with two dipole moments.

In embodiments, the integrated resonator-shield structure may be modified and extended to structures that have more than one magnetic dipole moment. The block of magnetic material may be partially wrapped with conductor wire segments in orthogonal directions or in non-parallel directions with the segments of the conductor shield arranged to connect the conductor wire segments in a serial or parallel or switched configuration. For example, an exemplary embodiment of an integrated resonator-shield structure having two orthogonal dipole moments is shown in FIG. 103. In the embodiment a block of magnetic material 10304 with four protrusions 10308 is partially wrapped with conductor wire segments 10306 that extend around the block of magnetic material 10304 and connect to the conductor segments 10310 of the conductor shield 10302 of the structure. The shield segments 10310 may be shaped to connect the conductor wire segments 10306 in series, in parallel, or may comprise switches so that different dipole moments can be individually excited. The structure has conductor wire segments wrapping the block of magnetic material in orthogonal directions and is capable of producing two orthogonal magnetic dipole moments that are each parallel to the surface of the conductor shield. The segments of the conductor shield provide for a continuous current path while eliminating losses associated with non-integrated shields used to shield a resonator from perturbating objects that may be located below 10312 the structure.

Example Resonator Circuitry

Figure 104:
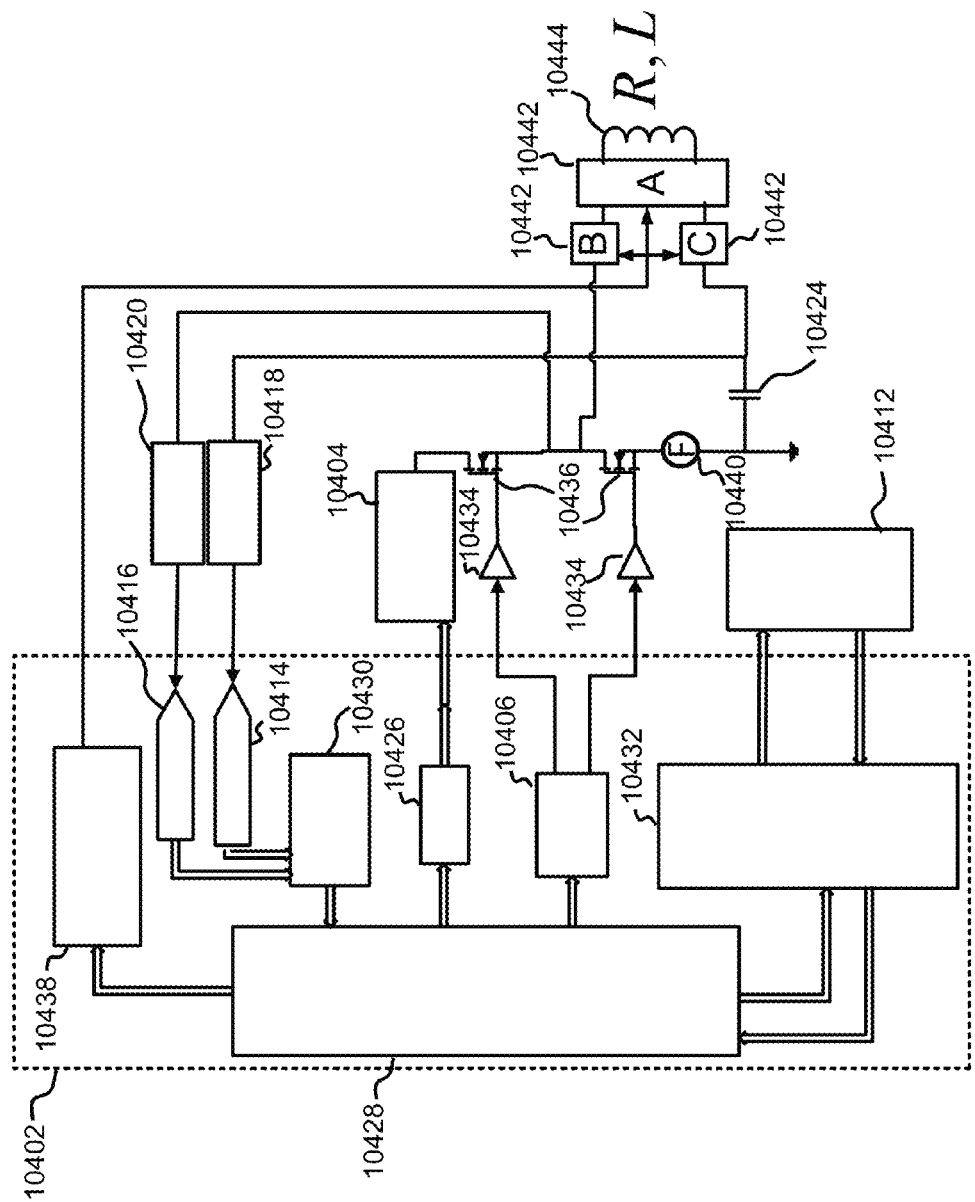
FIG. 104 is a block diagram of a wireless source with a single-ended amplifier.
Figure 105:
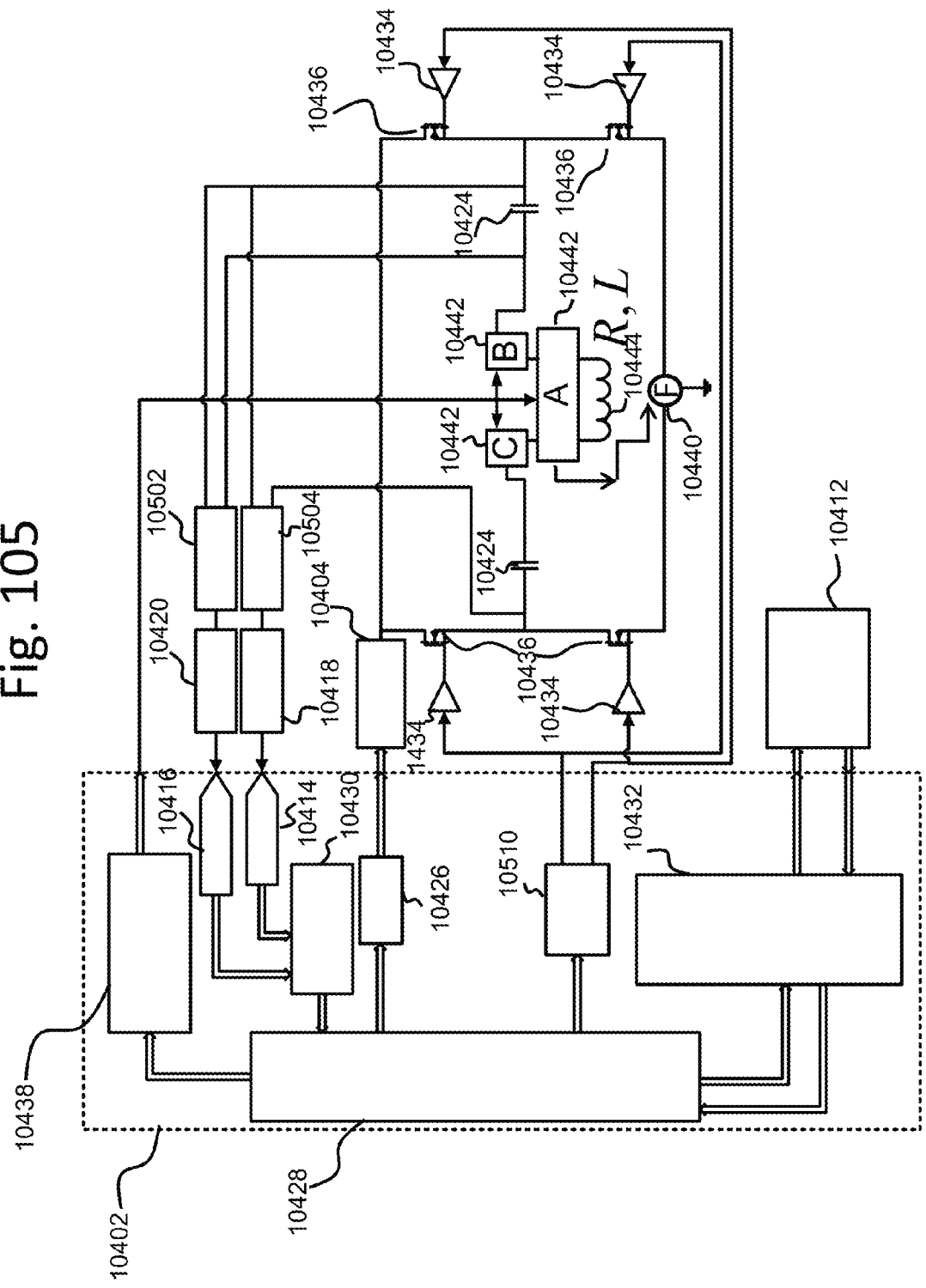
FIG. 105 is a block diagram of a wireless source with a differential amplifier.

FIGS. 104 and 105 show high level block diagrams depicting power generation, monitoring, and control components for exemplary sources of a wireless energy transfer system. FIG. 104 is a block diagram of a source comprising a half-bridge switching power amplifier and some of the associated measurement, tuning, and control circuitry. FIG. 105 is a block diagram of a source comprising a full-bridge switching amplifier and some of the associated measurement, tuning, and control circuitry.

The half bridge system topology depicted in FIG. 104 may comprise a processing unit that executes a control algorithm 10428. The processing unit executing a control algorithm 10428 may be a microcontroller, an application specific circuit, a field programmable gate array, a processor, a digital signal processor, and the like. The processing unit may be a single device or it may be a network of devices. The control algorithm may run on any portion of the processing unit. The algorithm may be customized for certain applications and may comprise a combination of analog and digital circuits and signals. The master algorithm may measure and adjust voltage signals and levels, current signals and levels, signal phases, digital count settings, and the like.

The system may comprise an optional source/device and/or source/other resonator communication controller 10432 coupled to wireless communication circuitry 10412. The optional source/device and/or source/other resonator communication controller 10432 may be part of the same processing unit that executes the master control algorithm, it may a part or a circuit within a microcontroller 10402, it may be external to the wireless power transmission modules, it may be substantially similar to communication controllers used in wire powered or battery powered applications but adapted to include some new or different functionality to enhance or support wireless power transmission.

The system may comprise a PWM generator 10406 coupled to at least two transistor gate drivers 10434 and may be controlled by the control algorithm. The two transistor gate drivers 10434 may be coupled directly or via gate drive transformers to two power transistors 10436 that drive the source resonator coil 10444 through impedance matching network components 10442. The power transistors 10436 may be coupled and powered with an adjustable DC supply 10404 and the adjustable DC supply 10404 may be controlled by a variable bus voltage, Vbus. The Vbus controller may be controlled by the control algorithm 10428 and may be part of, or integrated into, a microcontroller 10402 or other integrated circuits. The Vbus controller 10426 may control the voltage output of an adjustable DC supply 10404 which may be used to control power output of the amplifier and power delivered to the resonator coil 10444.

The system may comprise sensing and measurement circuitry including signal filtering and buffering circuits 10418, 10420 that may shape, modify, filter, process, buffer, and the like, signals prior to their input to processors and/or converters such as analog to digital converters (ADC) 10414, 10416, for example. The processors and converters such as ADCs 10414, 10416 may be integrated into a microcontroller 10402 or may be separate circuits that may be coupled to a processing core 10430. Based on measured signals, the control algorithm 10428 may generate, limit, initiate, extinguish, control, adjust, or modify the operation of any of the PWM generator 10406, the communication controller 10432, the Vbus control 10426, the source impedance matching controller 10438, the filter/buffering elements, 10418, 10420, the converters, 10414, 10416, the resonator coil 10444, and may be part of, or integrated into, a microcontroller 10402 or a separate circuit. The impedance matching networks 10442 and resonator coils 10444 may include electrically controllable, variable, or tunable components such as capacitors, switches, inductors, and the like, as described herein, and these components may have their component values or operating points adjusted according to signals received from the source impedance matching controller 10438. Components may be tuned to adjust the operation and characteristics of the resonator including the power delivered to and by the resonator, the resonant frequency of the resonator, the impedance of the resonator, the Q of the resonator, and any other coupled systems, and the like. The resonator may be any type or structure resonator described herein including a capacitively loaded loop resonator, a planer resonator comprising a magnetic material or any combination thereof.

The full bridge system topology depicted in FIG. 105 may comprise a processing unit that executes a master control algorithm 10428. The processing unit executing the control algorithm 10428 may be a microcontroller, an application specific circuit, a field programmable gate array, a processor, a digital signal processor, and the like. The system may comprise a source/device and/or source/other resonator communication controller 10432 coupled to wireless communication circuitry 10412. The source/device and/or source/other resonator communication controller 10432 may be part of the same processing unit that executes that master control algorithm, it may a part or a circuit within a microcontroller 10402, it may be external to the wireless power transmission modules, it may be substantially similar to communication controllers used in wire powered or battery powered applications but adapted to include some new or different functionality to enhance or support wireless power transmission.

The system may comprise a PWM generator 10510 with at least two outputs coupled to at least four transistor gate drivers 10434 that may be controlled by signals generated in a master control algorithm. The four transistor gate drivers 10434 may be coupled to four power transistors 10436 directly or via gate drive transformers that may drive the source resonator coil 10444 through impedance matching networks 10442. The power transistors 10436 may be coupled and powered with an adjustable DC supply 10404 and the adjustable DC supply 10404 may be controlled by a Vbus controller 10426 which may be controlled by a master control algorithm. The Vbus controller 10426 may control the voltage output of the adjustable DC supply 10404 which may be used to control power output of the amplifier and power delivered to the resonator coil 10444.

The system may comprise sensing and measurement circuitry including signal filtering and buffering circuits 10418, 10420 and differential/single ended conversion circuitry 10502, 10504 that may shape, modify, filter, process, buffer, and the like, signals prior to being input to processors and/or converters such as analog to digital converters (ADC) 10414, 10416. The processors and/or converters such as ADC 10414, 10416 may be integrated into a microcontroller 10402 or may be separate circuits that may be coupled to a processing core 10430. Based on measured signals, the master control algorithm may generate, limit, initiate, extinguish, control, adjust, or modify the operation of any of the PWM generator 1510, the communication controller 10432, the Vbus controller 10426, the source impedance matching controller 1438, the filter/buffering elements, 10418, 10420, differential/single ended conversion circuitry 10502, 10504, the converters, 10414, 10416, the resonator coil 10444, and may be part of or integrated into a microcontroller 10402 or a separate circuit.

Impedance matching networks 10442 and resonator coils 10444 may comprise electrically controllable, variable, or tunable components such as capacitors, switches, inductors, and the like, as described herein, and these components may have their component values or operating points adjusted according to signals received from the source impedance matching controller 10438. Components may be tuned to enable tuning of the operation and characteristics of the resonator including the power delivered to and by the resonator, the resonant frequency of the resonator, the impedance of the resonator, the Q of the resonator, and any other coupled systems, and the like. The resonator may be any type or structure resonator described herein including a capacitively loaded loop resonator, a planar resonator comprising a magnetic material or any combination thereof.

Impedance matching networks may comprise fixed value components such as capacitors, inductors, and networks of components as described herein. Parts of the impedance matching networks, A, B and C, may comprise inductors, capacitors, transformers, and series and parallel combinations of such components, as described herein. In some embodiments, parts of the impedance matching networks A, B, and C, may be empty (short-circuited). In some embodiments, part B comprises a series combination of an inductor and a capacitor, and part C is empty.

The full bridge topology may allow operation at higher output power levels using the same DC bus voltage as an equivalent half bridge amplifier. The half bridge exemplary topology of FIG. 104 may provide a single-ended drive signal, while the exemplary full bridge topology of FIG. 105 may provide a differential drive to the source resonator 10408. The impedance matching topologies and components and the resonator structure may be different for the two systems, as discussed herein.

The exemplary systems depicted in FIGS. 104 and 105 may further include fault detection circuitry 10440 that may be used to trigger the shutdown of the microcontroller in the source amplifier or to change or interrupt the operation of the amplifier. This protection circuitry may comprise a high speed comparator or comparators to monitor the amplifier return current, the amplifier bus voltage (Vbus) from the DC supply 10404, the voltage across the source resonator 10408 and/or the optional tuning board, or any other voltage or current signals that may cause damage to components in the system or may yield undesirable operating conditions. Preferred embodiments may depend on the potentially undesirable operating modes associated with different applications. In some embodiments, protection circuitry may not be implemented or circuits may not be populated. In some embodiments, system and component protection may be implemented as part of a master control algorithm and other system monitoring and control circuits. In embodiments, dedicated fault circuitry 10440 may include an output (not shown) coupled to a master control algorithm 10428 that may trigger a system shutdown, a reduction of the output power (e.g. reduction of Vbus), a change to the PWM generator, a change in the operating frequency, a change to a tuning element, or any other reasonable action that may be implemented by the control algorithm 10428 to adjust the operating point mode, improve system performance, and/or provide protection.

As described herein, sources in wireless power transfer systems may use a measurement of the input impedance of the impedance matching network 10442 driving source resonator coil 10444 as an error or control signal for a system control loop that may be part of the master control algorithm. In exemplary embodiments, variations in any combination of three parameters may be used to tune the wireless power source to compensate for changes in environmental conditions, for changes in coupling, for changes in device power demand, for changes in module, circuit, component or subsystem performance, for an increase or decrease in the number or sources, devices, or repeaters in the system, for user initiated changes, and the like. In exemplary embodiments, changes to the amplifier duty cycle, to the component values of the variable electrical components such as variable capacitors and inductors, and to the DC bus voltage may be used to change the operating point or operating range of the wireless source and improve some system operating value. The specifics of the control algorithms employed for different applications may vary depending on the desired system performance and behavior.

Impedance measurement circuitry such as described herein, and shown in FIGS. 104 and 105, may be implemented using two-channel simultaneous sampling ADCs and these ADCs may be integrated into a microcontroller chip or may be part of a separate circuit. Simultaneously sampling of the voltage and current signals at the input to a source resonator's impedance matching network and/or the source resonator, may yield the phase and magnitude information of the current and voltage signals and may be processed using known signal processing techniques to yield complex impedance parameters. In some embodiments, monitoring only the voltage signals or only the current signals may be sufficient.

The impedance measurements described herein may use direct sampling methods which may be relatively simpler than some other known sampling methods. In embodiments, measured voltage and current signals may be conditioned, filtered and scaled by filtering/buffering circuitry before being input to ADCs. In embodiments, the filter/buffering circuitry may be adjustable to work at a variety of signal levels and frequencies, and circuit parameters such as filter shapes and widths may be adjusted manually, electronically, automatically, in response to a control signal, by the master control algorithm, and the like. Exemplary embodiments of filter/buffering circuits are shown in FIGS. 104, 105, and 106.

Figure 106A:
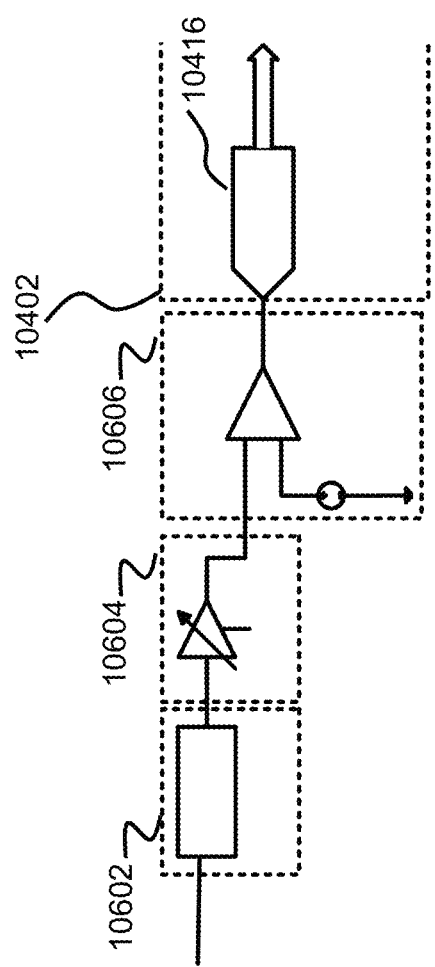
FIGS. 106a and 106b are block diagrams of sensing circuits.
Figure 106B:
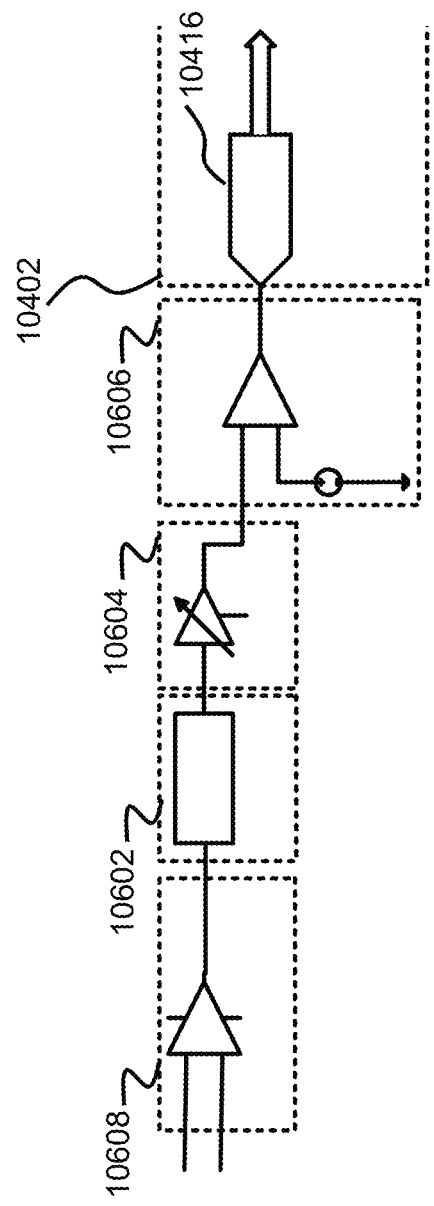

FIG. 106 shows more detailed views of exemplary circuit components that may be used in filter/buffering circuitry. In embodiments, and depending on the types of ADCs used in the system designs, single-ended amplifier topologies may reduce the complexity of the analog signal measurement paths used to characterize system, subsystem, module and/or component performance by eliminating the need for hardware to convert from differential to single-ended signal formats. In other implementations, differential signal formats may be preferable. The implementations shown in FIG. 106 are exemplary, and should not be construed to be the only possible way to implement the functionality described herein. Rather it should be understood that the analog signal path may employ components with different input requirements and hence may have different signal path architectures.

In both the single ended and differential amplifier topologies, the input current to the impedance matching networks 10442 driving the resonator coils 10444 may be obtained by measuring the voltage across a capacitor 10424, or via a current sensor of some type. For the exemplary single-ended amplifier topology in FIG. 104, the current may be sensed on the ground return path from the impedance matching network 10442. For the exemplary differential power amplifier depicted in FIG. 105, the input current to the impedance matching networks 10442 driving the resonator coils 10444 may be measured using a differential amplifier across the terminals of a capacitor 10424 or via a current sensor of some type. In the differential topology of FIG. 105, the capacitor 10424 may be duplicated at the negative output terminal of the source power amplifier.

In both topologies, after single ended signals representing the input voltage and current to the source resonator and impedance matching network are obtained, the signals may be filtered 10602 to obtain the desired portions of the signal waveforms. In embodiments, the signals may be filtered to obtain the fundamental component of the signals. In embodiments, the type of filtering performed, such as low pass, bandpass, notch, and the like, as well as the filter topology used, such as elliptical, Chebyshev, Butterworth, and the like, may depend on the specific requirements of the system. In some embodiments, no filtering will be required.

The voltage and current signals may be amplified by an optional amplifier 10604. The gain of the optional amplifier 10604 may be fixed or variable. The gain of the amplifier may be controlled manually, electronically, automatically, in response to a control signal, and the like. The gain of the amplifier may be adjusted in a feedback loop, in response to a control algorithm, by the master control algorithm, and the like. In embodiments, required performance specifications for the amplifier may depend on signal strength and desired measurement accuracy, and may be different for different application scenarios and control algorithms.

The measured analog signals may have a DC offset added to them, 10606, which may be required to bring the signals into the input voltage range of the ADC which for some systems may be 0 to 3.3V. In some systems this stage may not be required, depending on the specifications of the particular ADC used.

Figure 107A:
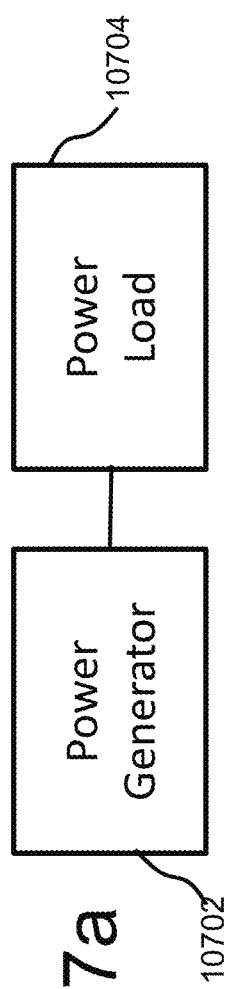
FIGS. 107a, 107b, and 107c are block diagrams of a wireless source.

As described above, the efficiency of power transmission between a power generator and a power load may be impacted by how closely matched the output impedance of the generator is to the input impedance of the load. In an exemplary system as shown in FIG. 107(*a*), power may be delivered to the load at a maximum possible efficiency, when the input impedance of the load 10704 is equal to the complex conjugate of the internal impedance of the power generator or the power amplifier 10702. Designing the generator or load impedance to obtain a high and/or maximum power transmission efficiency may be called "impedance matching". Impedance matching may be performed by inserting appropriate networks or sets of elements such as capacitors, resistors, inductors, transformers, switches and the like, to form an impedance matching network 10706, between a power generator 10702 and a power load 10704 as shown in FIG. 107(*b*). In other embodiments, mechanical adjustments and changes in element positioning may be used to achieve impedance matching. As described above for varying loads, the impedance matching network 10706 may include variable components that are dynamically adjusted to ensure that the impedance at the generator terminals looking towards the load and the characteristic impedance of the generator remain substantially complex conjugates of each other, even in dynamic environments and operating scenarios. In embodiments, dynamic impedance matching may be accomplished by tuning the duty cycle, and/or the phase, and/or the frequency of the driving signal of the power generator or by tuning a physical component within the power generator, such as a capacitor, as depicted in FIG. 107(*c*). Such a tuning mechanism may be advantageous because it may allow impedance matching between a power generator 10708 and a load without the use of a tunable impedance matching network, or with a simplified tunable impedance matching network 10706, such as one that has fewer tunable components for example. In embodiments, tuning the duty cycle, and/or frequency, and/or phase of the driving signal to a power generator may yield a dynamic impedance matching system with an extended tuning range or precision, with higher power, voltage and/or current capabilities, with faster electronic control, with fewer external components, and the like. The impedance matching methods, architectures, algorithms, protocols, circuits, measurements, controls, and the like, described below, may be useful in systems where power generators drive high-Q magnetic resonators and in high-Q wireless power transmission systems as described herein. In wireless power transfer systems a power generator may be a power amplifier driving a resonator, sometimes referred to as a source resonator, which may be a load to the power amplifier. In wireless power applications, it may be preferable to control the impedance matching between a power amplifier and a resonator load to control the efficiency of the power delivery from the power amplifier to the resonator. The impedance matching may be accomplished, or accomplished in part, by tuning or adjusting the duty cycle, and/or the phase, and/or the frequency of the driving signal of the power amplifier that drives the resonator.

Efficiency of Switching Amplifiers

Switching amplifiers, such as class D, E, F amplifiers, and the like or any combinations thereof, deliver power to a load at a maximum efficiency when no power is dissipated on the switching elements of the amplifier. This operating condition may be accomplished by designing the system so that the switching operations which are most critical (namely those that are most likely to lead to switching losses) are done when both the voltage across the switching element and the current through the switching element are zero. These conditions may be referred to as Zero Voltage Switching (ZVS) and Zero Current Switching (ZCS) conditions respectively. When an amplifier operates at ZVS and ZCS either the voltage across the switching element or the current through the switching element is zero and thus no power can be dissipated in the switch. Since a switching amplifier may convert DC (or very low frequency AC) power to AC power at a specific frequency or range of frequencies, a filter may be introduced before the load to prevent unwanted harmonics that may be generated by the switching process from reaching the load and being dissipated there. In embodiments, a switching amplifier may be designed to operate at maximum efficiency of power conversion, when connected to a resonant load, with a nontrivial quality factor (say Q>5), and of a specific impedance $Z_o^* = R_o + jX_o$, which leads to simultaneous ZVS and ZCS. We define $Z_o = R_o - jX_o$ as the characteristic impedance of the amplifier, so that achieving maximum power transmission efficiency is equivalent to impedance matching the resonant load to the characteristic impedance of the amplifier.

In a switching amplifier, the switching frequency of the switching elements, $f_{switch}$, wherein $f_{switch} = \omega/2\pi$ and the duty cycle, dc, of the ON switch-state duration of the switching elements may be the same for all switching elements of the amplifier. In this specification, we will use the term "class D" to denote both class D and class DE amplifiers, that is, switching amplifiers with dc<=50%.

Figure 108:
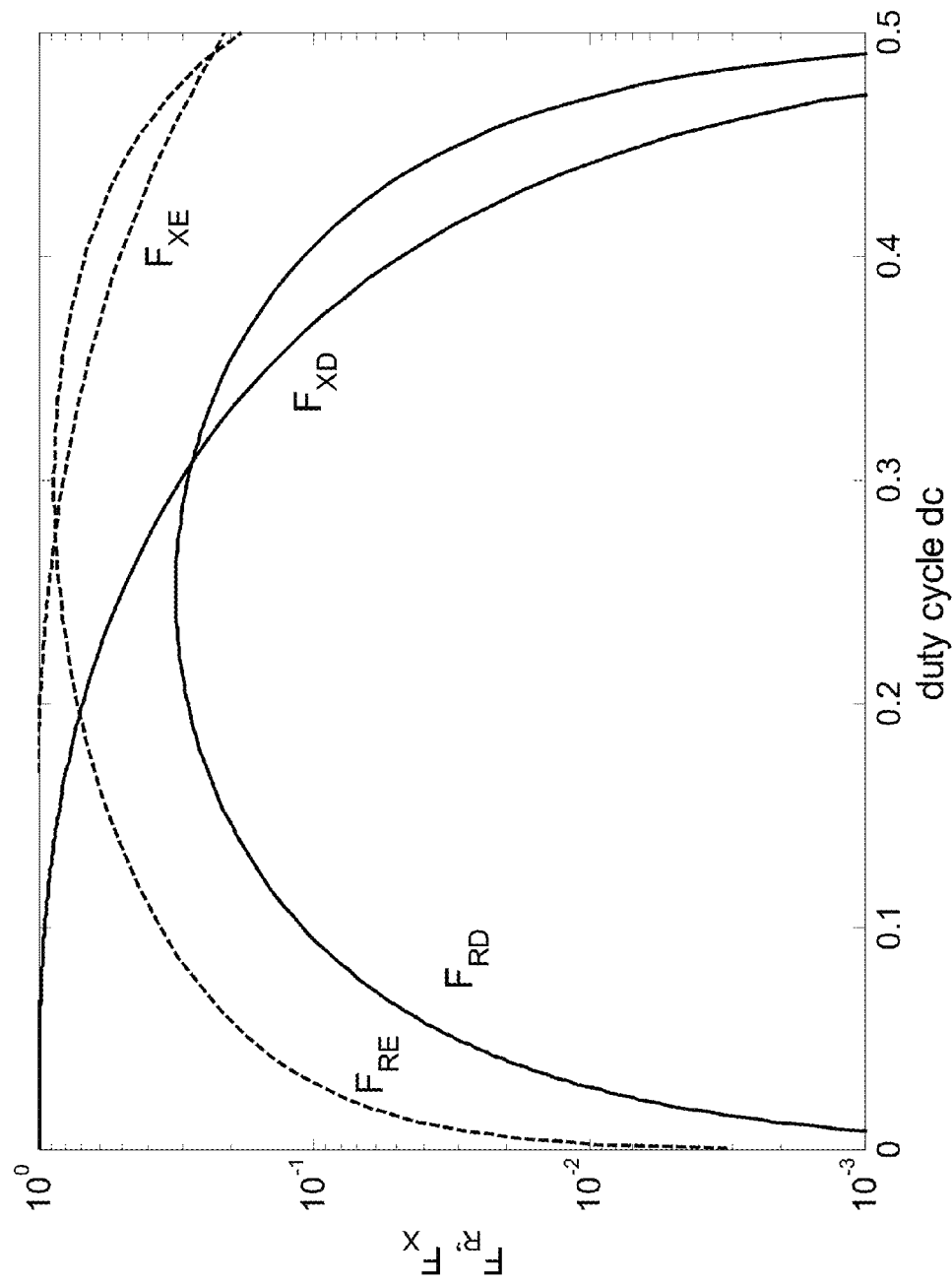
FIG. 108 is a plot showing the effects of a duty cycle on the parameters of an amplifier.

The value of the characteristic impedance of the amplifier may depend on the operating frequency, the amplifier topology, and the switching sequence of the switching elements. In some embodiments, the switching amplifier may be a half-bridge topology and, in some embodiments, a full-bridge topology. In some embodiments, the switching amplifier may be class D and, in some embodiments, class E. In any of the above embodiments, assuming the elements of the bridge are symmetric, the characteristic impedance of the switching amplifier has the form $$R_o = F_R(dc)/\omega C_a, X_o = F_X(dc)/\omega C_a, \quad (1)$$

where dc is the duty cycle of ON switch-state of the switching elements, the functions $F_R(dc)$ and $F_X(dc)$ are plotted in FIG. 108 (both for class D and E), $\omega$ is the frequency at which the switching elements are switched, and $C_a = n_a C_{switch}$ where $C_{switch}$ is the capacitance across each switch, including both the transistor output capacitance and also possible external capacitors placed in parallel with the switch, while $n_a = 1$ for a full bridge and $n_a = 2$ for a half bridge. For class D, one can also write the analytical expressions $$F_R(dc) = \sin^2 u/\pi, F_R(dc) = (u - \sin u^* \cos u)/\pi, \quad (2)$$

where $u = \pi(1-2^*dc)$, indicating that the characteristic impedance level of a class D amplifier decreases as the duty cycle, dc, increases towards 50%. For a class D amplifier operation with dc=50%, achieving ZVS and ZCS is possible only when the switching elements have practically no output capacitance ($C_a = 0$) and the load is exactly on resonance ($X_o = 0$), while $R_o$ can be arbitrary.

Impedance Matching Networks

In applications, the driven load may have impedance that is very different from the characteristic impedance of the external driving circuit, to which it is connected. Furthermore, the driven load may not be a resonant network. An Impedance Matching Network (IMN) is a circuit network that may be connected before a load as in FIG. 107(b), in order to regulate the impedance that is seen at the input of the network consisting of the IMN circuit and the load. An IMN circuit may typically achieve this regulation by creating a resonance close to the driving frequency. Since such an IMN circuit accomplishes all conditions needed to maximize the power transmission efficiency from the generator to the load (resonance and impedance matching –ZVS and ZCS for a switching amplifier), in embodiments, an IMN circuit may be used between the driving circuit and the load.

Figure 107B:
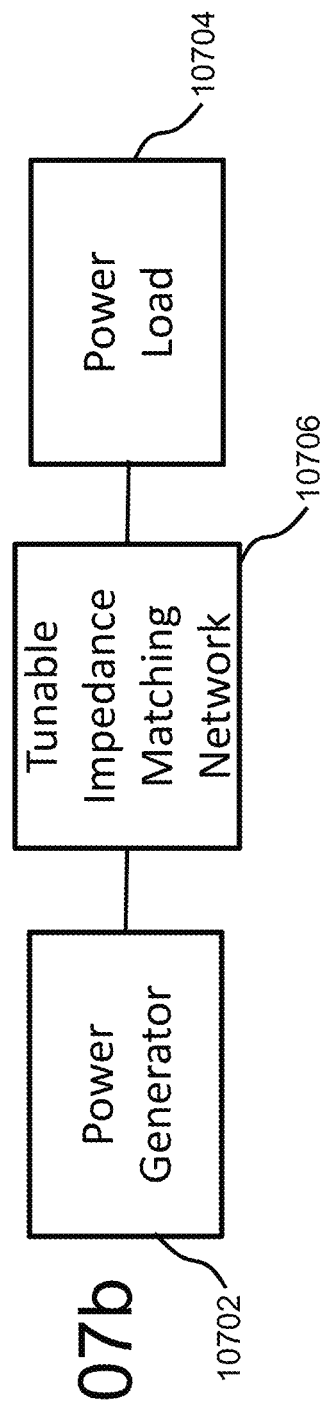

For an arrangement shown in FIG. 107(b), let the input impedance of the network consisting of the Impedance Matching Network (IMN) circuit and the load (denoted together from now on as IMN+load) be $Z_l = R_l(\omega) + jX_l(\omega)$. The impedance matching conditions of this network to the external circuit with characteristic impedance $Z_o = R_o - jX_o$ are then $R_l(\omega) = R_o$, $X_l(\omega) = X_o$.

Methods for Tunable Impedance Matching of a Variable Load

In embodiments where the load may be variable, impedance matching between the load and the external driving circuit, such as a linear or switching power amplifier, may be achieved by using adjustable/tunable components in the IMN circuit that may be adjusted to match the varying load to the fixed characteristic impedance $Z_o$ of the external circuit (FIG. 107(b)). To match both the real and imaginary parts of the impedance two tunable/variable elements in the IMN circuit may be needed.

In embodiments, the load may be inductive (such as a resonator coil) with impedance $R + j\omega L$, so the two tunable elements in the IMN circuit may be two tunable capacitance networks or one tunable capacitance network and one tunable inductance network or one tunable capacitance network and one tunable mutual inductance network.

Figure 107C:
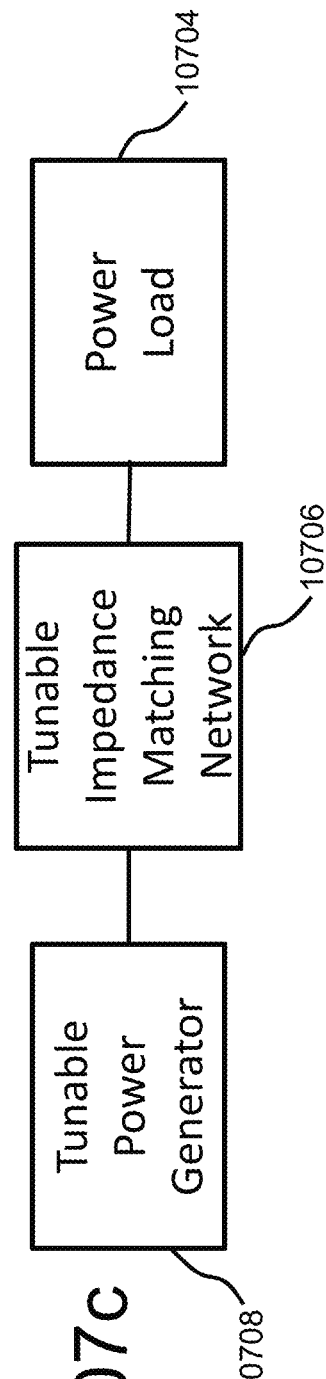

In embodiments where the load may be variable, the impedance matching between the load and the driving circuit, such as a linear or switching power amplifier, may be achieved by using adjustable/tunable components or parameters in the amplifier circuit that may be adjusted to match the characteristic impedance $Z_o$ of the amplifier to the varying (due to load variations) input impedance of the network consisting of the IMN circuit and the load (IMN+load), where the IMN circuit may also be tunable (FIG. 107(c)). To match both the real and imaginary parts of the impedance, a total of two tunable/variable elements or parameters in the amplifier and the IMN circuit may be needed. The disclosed impedance matching method can reduce the required number of tunable/variable elements in the IMN circuit or even completely eliminate the requirement for tunable/variable elements in the IMN circuit. In some examples, one tunable element in the power amplifier and one tunable element in the IMN circuit may be used. In some examples, two tunable elements in the power amplifier and no tunable element in the IMN circuit may be used.

In embodiments, the tunable elements or parameters in the power amplifier may be the frequency, amplitude, phase, waveform, duty cycle and the like of the drive signals applied to transistors, switches, diodes and the like.

In embodiments, the power amplifier with tunable characteristic impedance may be a tunable switching amplifier of class D, E, F or any combinations thereof. Combining Equations (1) and (2), the impedance matching conditions for this network are $$R_l(\omega) = F_R(dc)/\omega C_a, X_l(\omega) = F_X(dc)/\omega C_a \quad (3).$$

In some examples of a tunable switching amplifier, one tunable element may be the capacitance $C_a$, which may be tuned by tuning the external capacitors placed in parallel with the switching elements.

In some examples of a tunable switching amplifier, one tunable element may be the duty cycle dc of the ON switch-state of the switching elements of the amplifier. Adjusting the duty cycle, dc, via Pulse Width Modulation (PWM) has been used in switching amplifiers to achieve output power control. In this specification, we disclose that PWM may also be used to achieve impedance matching, namely to satisfy Eqs. (3), and thus maximize the amplifier efficiency.

In some examples of a tunable switching amplifier one tunable element may be the switching frequency, which is also the driving frequency of the IMN+load network and may be designed to be substantially close to the resonant frequency of the IMN+load network. Tuning the switching frequency may change the characteristic impedance of the amplifier and the impedance of the IMN+load network. The switching frequency of the amplifier may be tuned appropriately together with one more tunable parameters, so that Eqs. (3) are satisfied.

Figure 109:
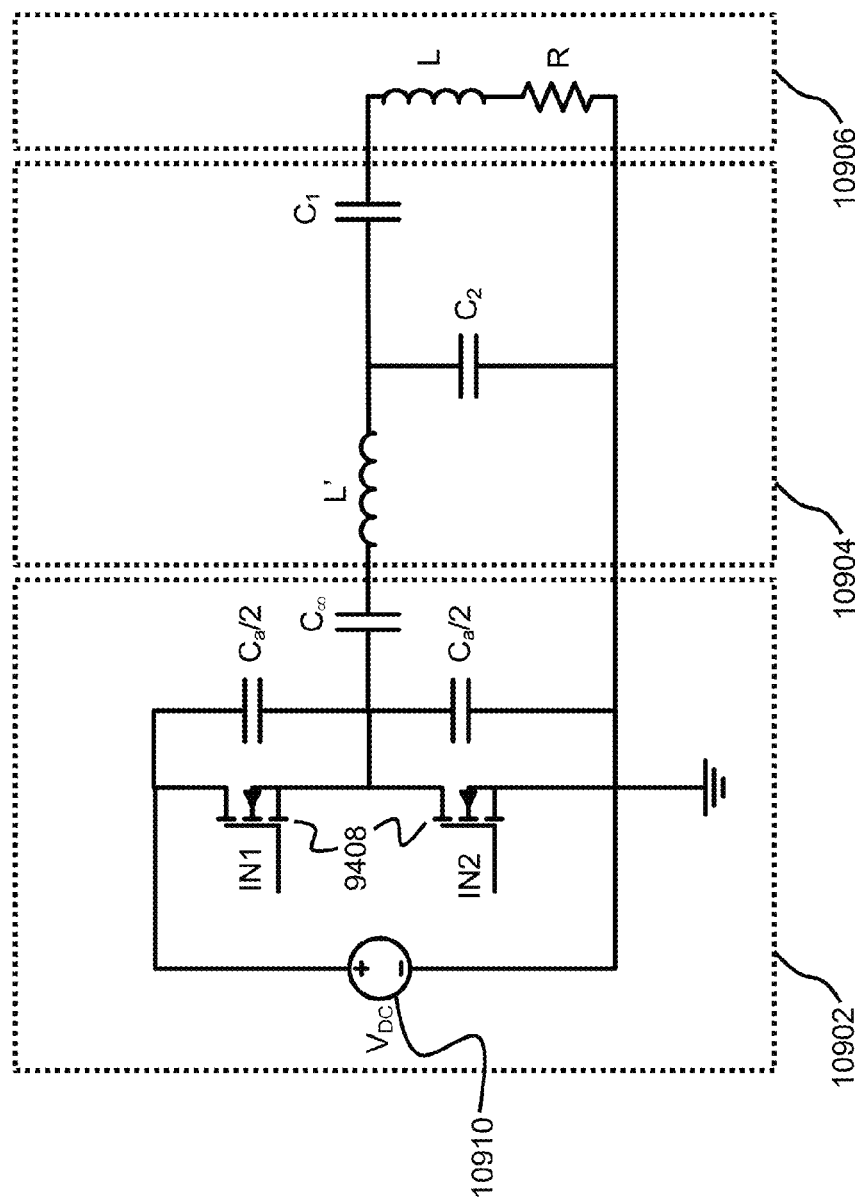
FIG. 109 is a simplified circuit diagram of a wireless power source with a switching amplifier.

A benefit of tuning the duty cycle and/or the driving frequency of the amplifier for dynamic impedance matching is that these parameters can be tuned electronically, quickly, and over a broad range. In contrast, for example, a tunable capacitor that can sustain a large voltage and has a large enough tunable range and quality factor may be expensive, slow or unavailable for with the necessary component specifications Examples of Methods for Tunable Impedance Matching of a Variable Load A simplified circuit diagram showing the circuit level structure of a class D power amplifier 10902, impedance matching network 10904 and an inductive load 10906 is shown in FIG. 109. The diagram shows the basic components of the system with the switching amplifier 10904 comprising a power source 10910, switching elements 10908, and capacitors. The impedance matching network 10904 comprising inductors and capacitors, and the load 10906 modeled as an inductor and a resistor.

An exemplary embodiment of this inventive tuning scheme comprises a half-bridge class-D amplifier operating at switching frequency $f$ and driving a low-loss inductive element R+jωL via an IMN, as shown in FIG. 109.

In some embodiments L' may be tunable. L' may be tuned by a variable tapping point on the inductor or by connecting a tunable capacitor in series or in parallel to the inductor. In some embodiments $C_a$ may be tunable. For the half bridge topology, $C_a$ may be tuned by varying either one or both capacitors $C_{switch}$, as only the parallel sum of these capacitors matters for the amplifier operation. For the full bridge topology, $C_a$ may be tuned by varying either one, two, three or all capacitors $C_{switch}$, as only their combination (series sum of the two parallel sums associated with the two halves of the bridge) matters for the amplifier operation.

Figure 110:
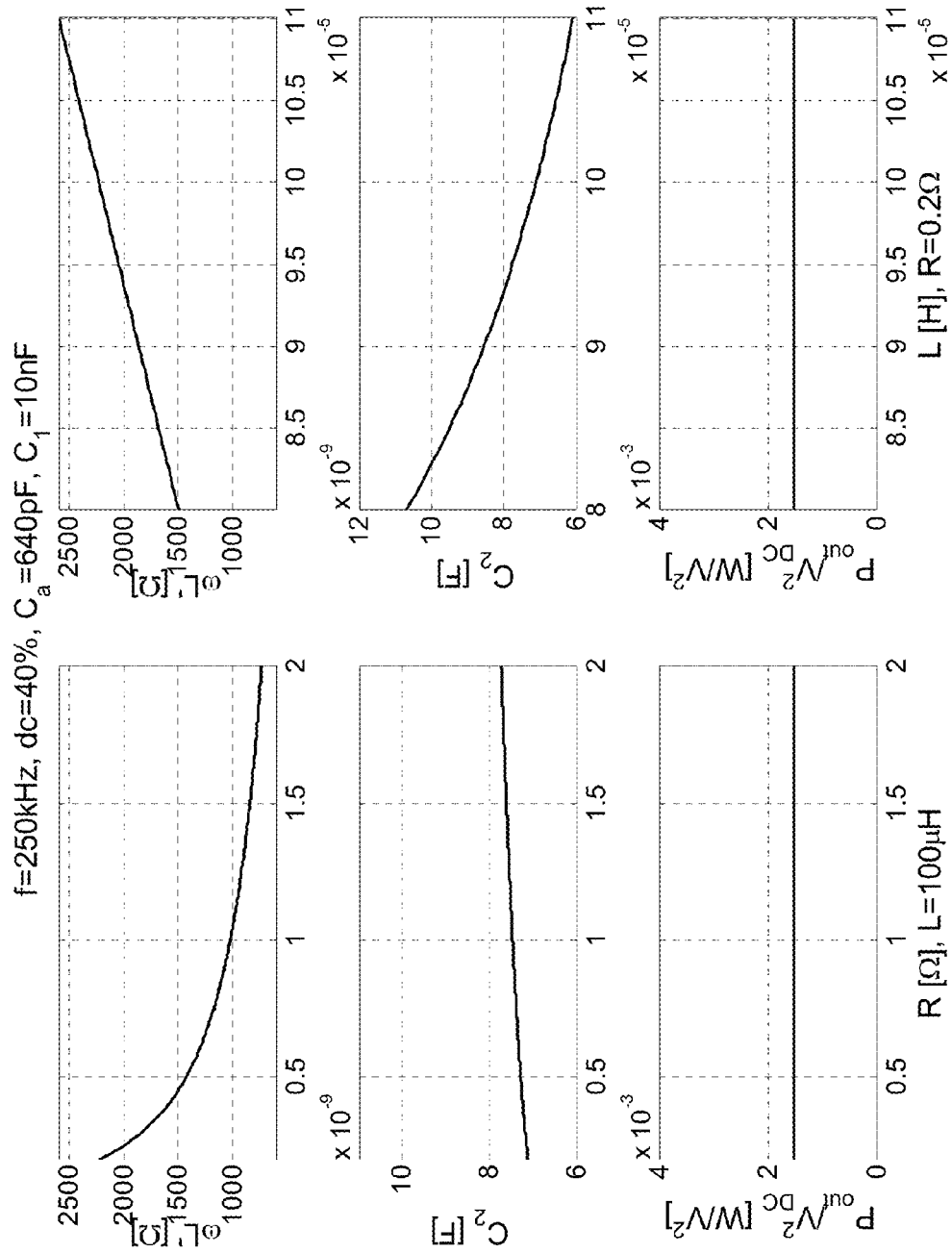
FIG. 110 shows plots of the effects of changes of parameters of a wireless power source.

In some embodiments of tunable impedance matching, two of the components of the IMN may be tunable. In some embodiments, L' and $C_2$ may be tuned. Then, FIG. 110 shows the values of the two tunable components needed to achieve impedance matching as functions of the varying R and L of the inductive element, and the associated variation of the output power (at given DC bus voltage) of the amplifier, for f=250 kHz, dc=40%, $C_a$=640 pF and $C_1$=10 nF. Since the IMN always adjusts to the fixed characteristic impedance of the amplifier, the output power is always constant as the inductive element is varying.

Figure 111:
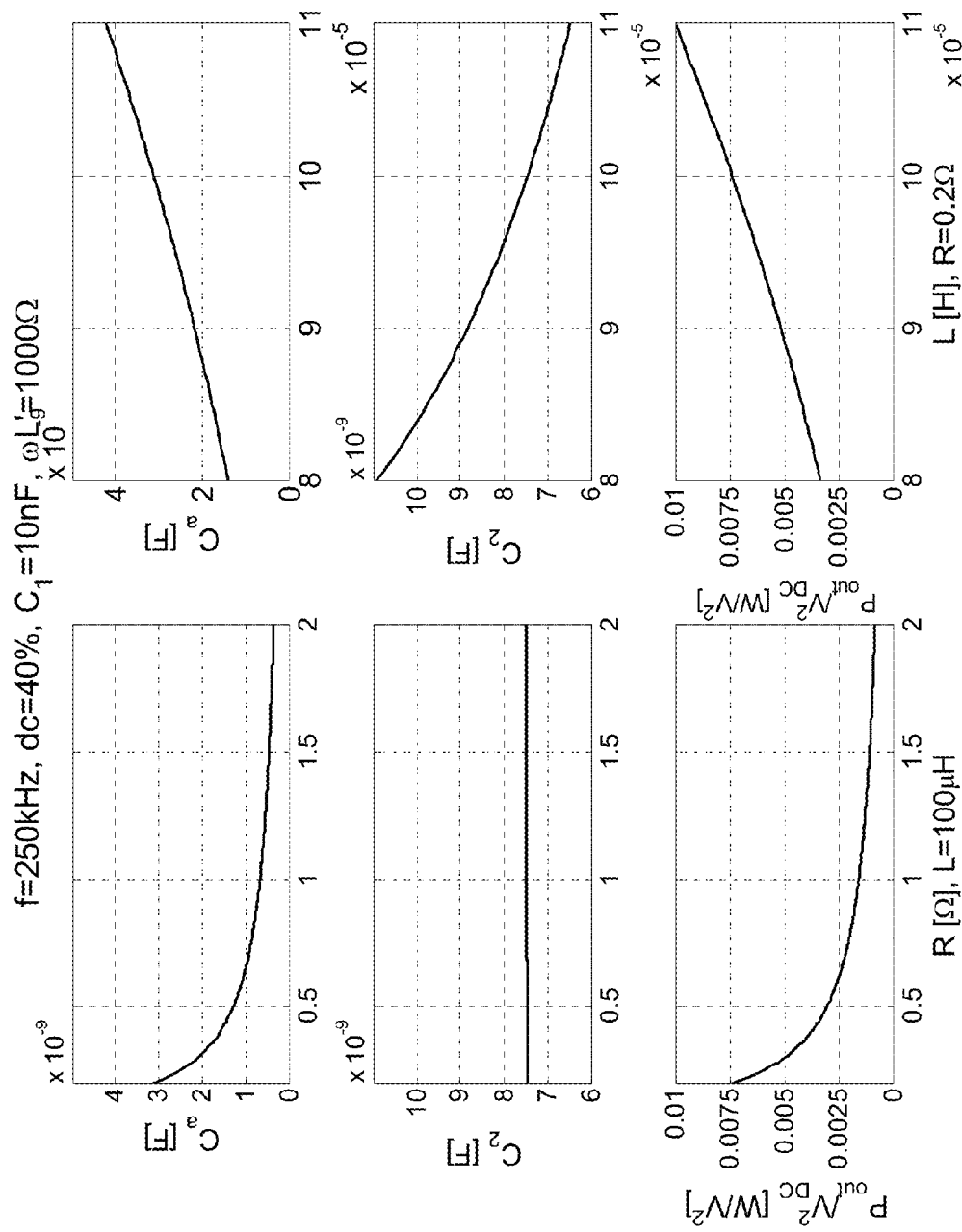
FIG. 111 shows plots of the effects of changes of parameters of a wireless power source.

In some embodiments of tunable impedance matching, elements in the switching amplifier may also be tunable. In some embodiments the capacitance $C_a$ along with the IMN capacitor $C_2$ may be tuned. Then, FIG. 111 shows the values of the two tunable components needed to achieve impedance matching as functions of the varying R and L of the inductive element, and the associated variation of the output power (at given DC bus voltage) of the amplifier for f=250 kHz, dc=40%, $C_1$=10 nF and ωL'=1000Ω. It can be inferred from FIG. 111 that $C_2$ needs to be tuned mainly in response to variations in L and that the output power decreases as R increases.

In some embodiments of tunable impedance matching, the duty cycle dc along with the IMN capacitor $C_2$ may be tuned. Then, FIG. 112 shows the values of the two tunable parameters needed to achieve impedance matching as functions of the varying R and L of the inductive element, and the associated variation of the output power (at given DC bus voltage) of the amplifier for f=250 kHz, $C_a$=640 pF, $C_1$=10 nF and ωL'=1000Ω. It can be inferred from FIG. 112 that $C_2$ needs to be tuned mainly in response to variations in L and that the output power decreases as R increases.

Figure 112A:
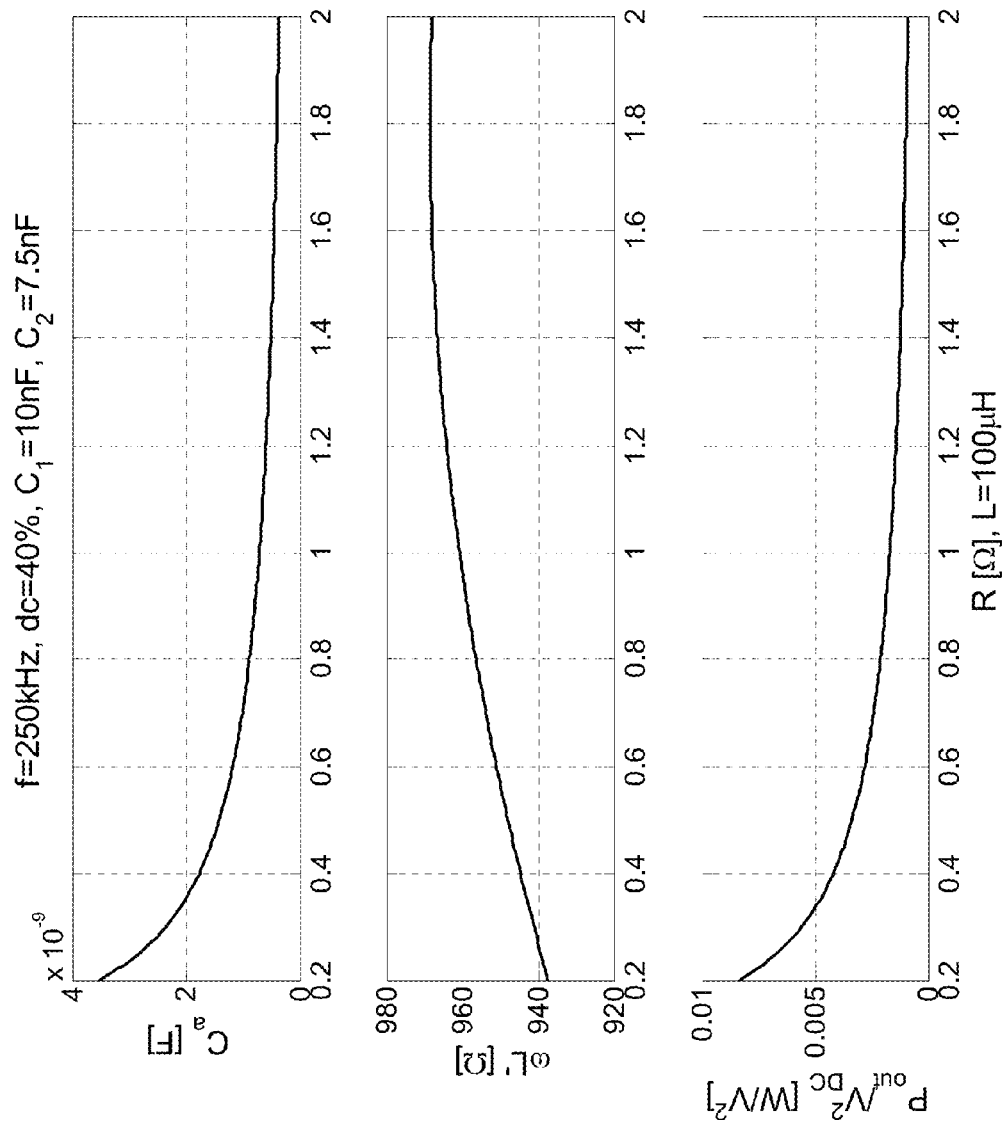
FIGS. 112a, 112b, and 112c are plots showing the effects of changes of parameters of a wireless power source.

In some embodiments of tunable impedance matching, the capacitance $C_a$ along with the IMN inductor L' may be tuned. Then, FIG. 112(a) shows the values of the two tunable components needed to achieve impedance matching as functions of the varying R of the inductive element, and the associated variation of the output power (at given DC bus voltage) of the amplifier for f=250 kHz, dc=40%, $C_1$=10 nF and $C_2$=7.5 nF. It can be inferred from FIG. 112(a) that the output power decreases as R increases.

Figure 112B:
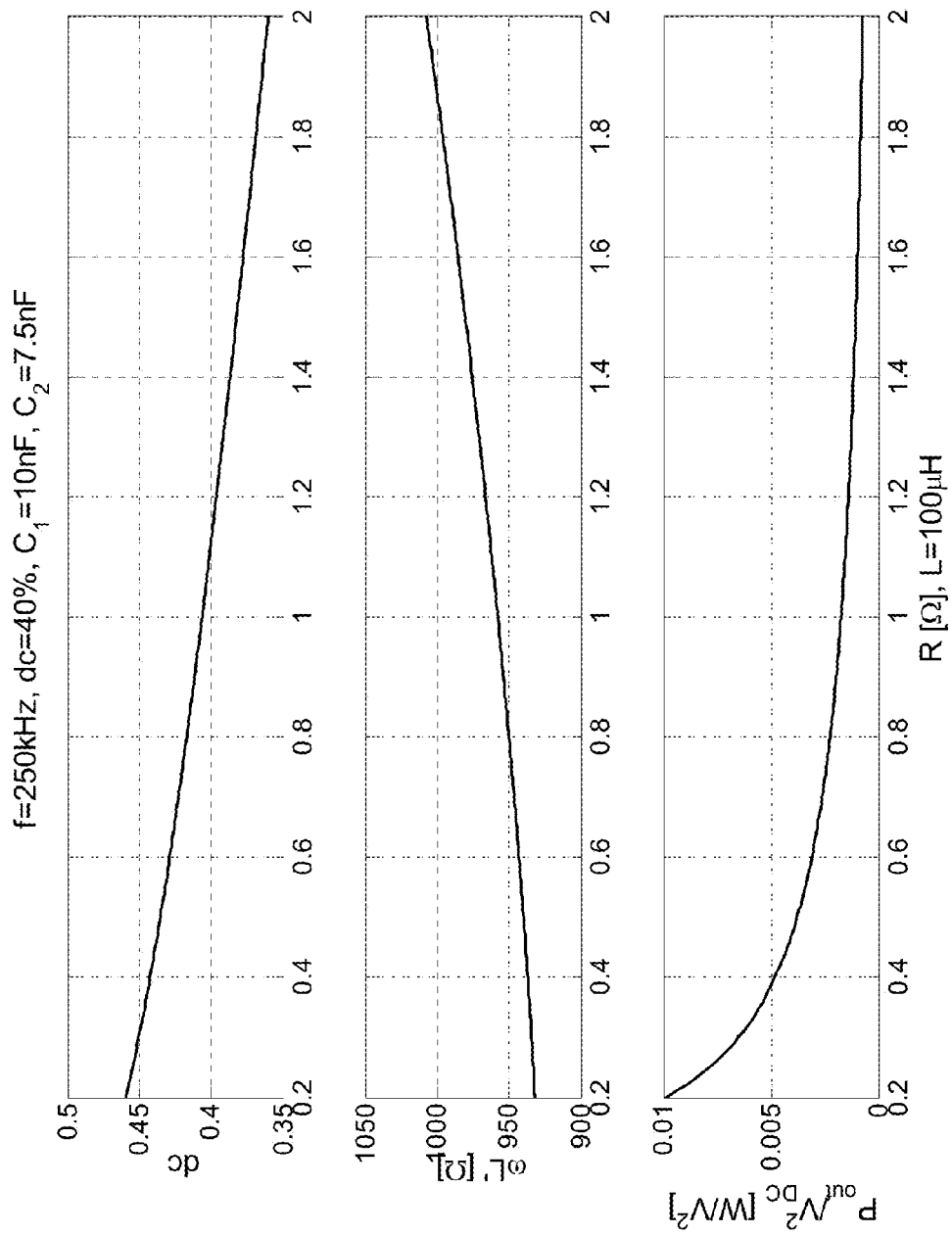

In some embodiments of tunable impedance matching, the duty cycle dc along with the IMN inductor L' may be tuned. Then, FIG. 112(b) shows the values of the two tunable parameters needed to achieve impedance matching as functions of the varying R of the inductive element, and the associated variation of the output power (at given DC bus voltage) of the amplifier for f=250 kHz, $C_a$=640 pF, $C_1$=10 nF and $C_2$=7.5 nF as functions of the varying R of the inductive element. It can be inferred from FIG. 112(b) that the output power decreases as R increases.

Figure 112C:
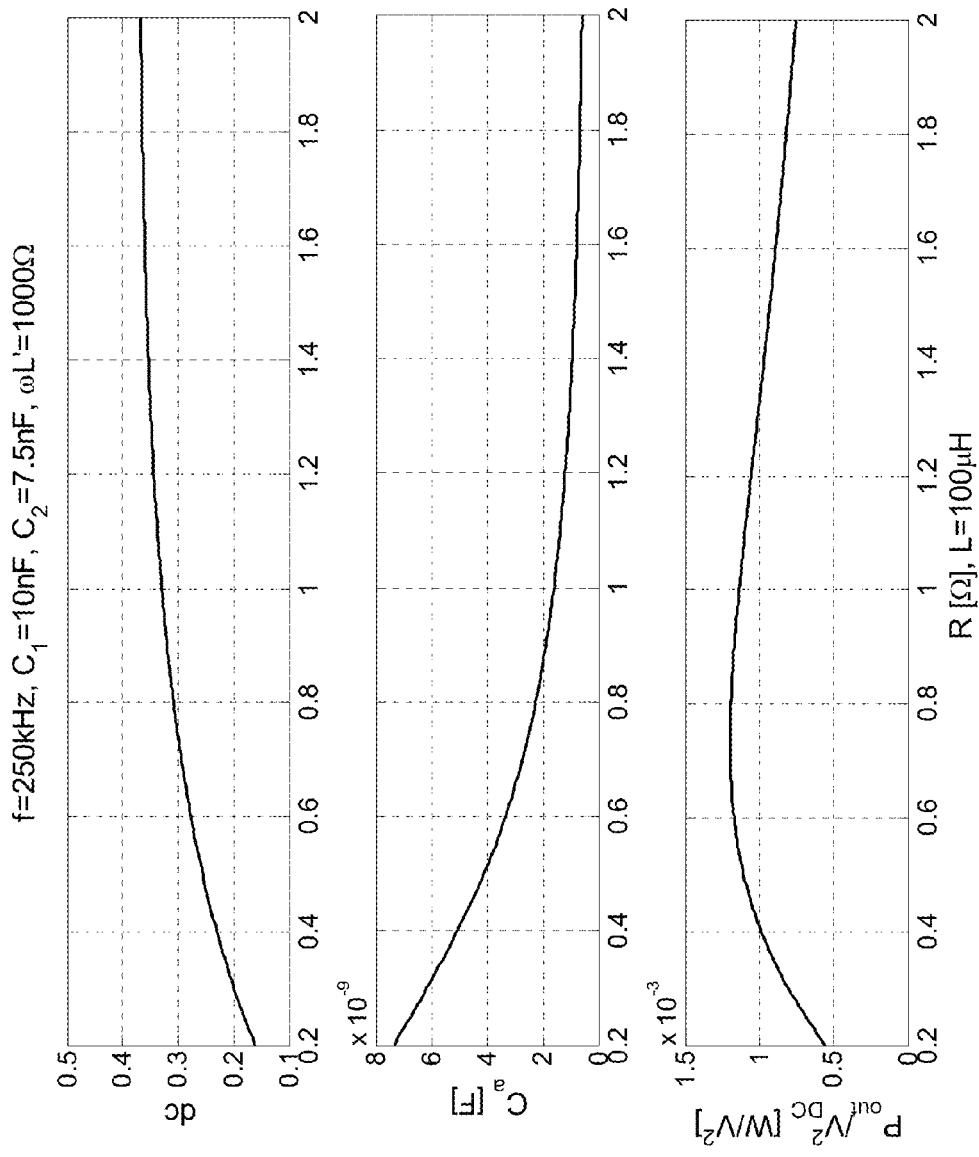

In some embodiments of tunable impedance matching, only elements in the switching amplifier may be tunable with no tunable elements in the IMN. In some embodiments the duty cycle dc along with the capacitance $C_a$ may be tuned. Then, FIG. 112(c), shows the values of the two tunable parameters needed to achieve impedance matching as functions of the varying R of the inductive element, and the associated variation of the output power (at given DC bus voltage) of the amplifier for f=250 kHz, $C_1$=10 nF, $C_2$=7.5 nF and ωL'=1000Ω. It can be inferred from FIG. 112(c) that the output power is a non-monotonic function of R. These embodiments may be able to achieve dynamic impedance matching when variations in L (and thus the resonant frequency) are modest.

Figure 113:
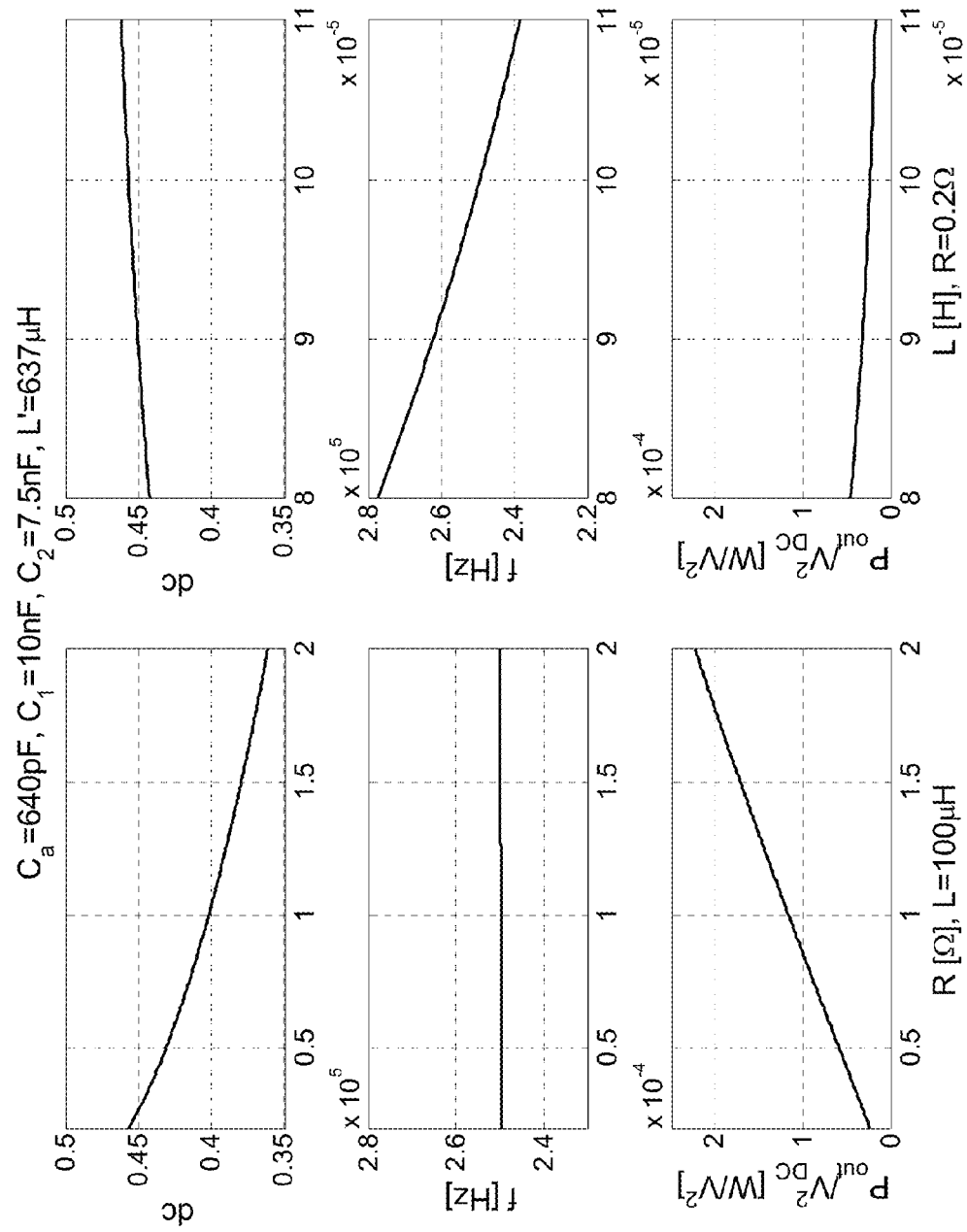

In some embodiments, dynamic impedance matching with fixed elements inside the IMN, also when L is varying greatly as explained earlier, may be achieved by varying the driving frequency of the external frequency $f$ (e.g. the switching frequency of a switching amplifier) so that it follows the varying resonant frequency of the resonator. Using the switching frequency $f$ and the switch duty cycle dc as the two variable parameters, full impedance matching can be achieved as R and L are varying without the need of any variable components. Then, FIG. 113 shows the values of the two tunable parameters needed to achieve impedance matching as functions of the varying R and L of the inductive element, and the associated variation of the output power (at given DC bus voltage) of the amplifier for $C_a$=640 pF, $C_1$=10 nF, $C_2$=7.5 nF and L'=637 µH. It can be inferred from FIG. 113 that the frequency $f$ needs to be tuned mainly in response to variations in L, as explained earlier.

Tunable Impedance Matching for Systems of Wireless Power Transmission

In applications of wireless power transfer the low-loss inductive element may be the coil of a source resonator coupled to one or more device resonators or other resonators, such as repeater resonators, for example. The impedance of the inductive element R+jωL may include the reflected impedances of the other resonators on the coil of the source resonator. Variations of R and L of the inductive element may occur due to external perturbations in the vicinity of the source resonator and/or the other resonators or thermal drift of components. Variations of R and L of the inductive element may also occur during normal use of the wireless power transmission system due to relative motion of the devices and other resonators with respect to the source. The relative motion of these devices and other resonators with respect to the source, or relative motion or position of other sources, may lead to varying coupling (and thus varying reflected impedances) of the devices to the source. Furthermore, variations of R and L of the inductive element may also occur during normal use of the wireless power transmission system due to changes within the other coupled resonators, such as changes in the power draw of their loads. All the methods and embodiments disclosed so far apply also to this case in order to achieve dynamic impedance matching of this inductive element to the external circuit driving it.

To demonstrate the presently disclosed dynamic impedance matching methods for a wireless power transmission system, consider a source resonator including a low-loss source coil, which is inductively coupled to the device coil of a device resonator driving a resistive load.

In some embodiments, dynamic impedance matching may be achieved at the source circuit. In some embodiments, dynamic impedance matching may also be achieved at the device circuit. When full impedance matching is obtained (both at the source and the device), the effective resistance of the source inductive element (namely the resistance of the source coil $R_s$ plus the reflected impedance from the device) is $R=R_s\sqrt{1+U_{sd}^2}$. (Similarly the effective resistance of the device inductive element is $R_d\sqrt{1+U_{sd}^2}$, where $R_d$ is the resistance of the device coil.) Dynamic variation of the mutual inductance between the coils due to motion results in a dynamic variation of $U_{sd}=\omega M_{sd}/\sqrt{R_s R_d}$. Therefore, when both source and device are dynamically tuned, the variation of mutual inductance is seen from the source circuit side as a variation in the source inductive element resistance R. Note that in this type of variation, the resonant frequencies of the resonators may not change substantially, since L may not be changing. Therefore, all the methods and examples presented for dynamic impedance matching may be used for the source circuit of the wireless power transmission system.

Note that, since the resistance R represents both the source coil and the reflected impedances of the device coils to the source coil, in FIGS. 110-113, as R increases due to the increasing U, the associated wireless power transmission efficiency increases. In some embodiments, an approximately constant power may be required at the load driven by the device circuitry. To achieve a constant level of power transmitted to the device, the required output power of the source circuit may need to decrease as U increases. If dynamic impedance matching is achieved via tuning some of the amplifier parameters, the output power of the amplifier may vary accordingly. In some embodiments, the automatic variation of the output power is preferred to be monotonically decreasing with R, so that it matches the constant device power requirement. In embodiments where the output power level is accomplished by adjusting the DC driving voltage of the power generator, using an impedance matching set of tunable parameters which leads to monotonically decreasing output power vs. R will imply that constant power can be kept at the power load in the device with only a moderate adjustment of the DC driving voltage. In embodiments, where the "knob" to adjust the output power level is the duty cycle dc or the phase of a switching amplifier or a component inside an Impedance Matching Network, using an impedance matching set of tunable parameters which leads to monotonically decreasing output power vs. R will imply that constant power can be kept at the power load in the device with only a moderate adjustment of this power "knob".

In the examples of FIGS. 110-113, if $R_s=0.19\Omega$, then the range $R=0.2-2\Omega$ corresponds approximately to $U_{sd}=0.3-10.5$. For these values, in FIG. 115, we show with dashed lines the output power (normalized to DC voltage squared) required to keep a constant power level at the load, when both source and device are dynamically impedance matched. The similar trend between the solid and dashed lines explains why a set of tunable parameters with such a variation of output power may be preferable.

In some embodiments, dynamic impedance matching may be achieved at the source circuit, but impedance matching may not be achieved or may only partially be achieved at the device circuit. As the mutual inductance between the source and device coils varies, the varying reflected impedance of the device to the source may result in a variation of both the effective resistance R and the effective inductance L of the source inductive element. The methods presented so far for dynamic impedance matching are applicable and can be used for the tunable source circuit of the wireless power transmission system.

Figure 115:
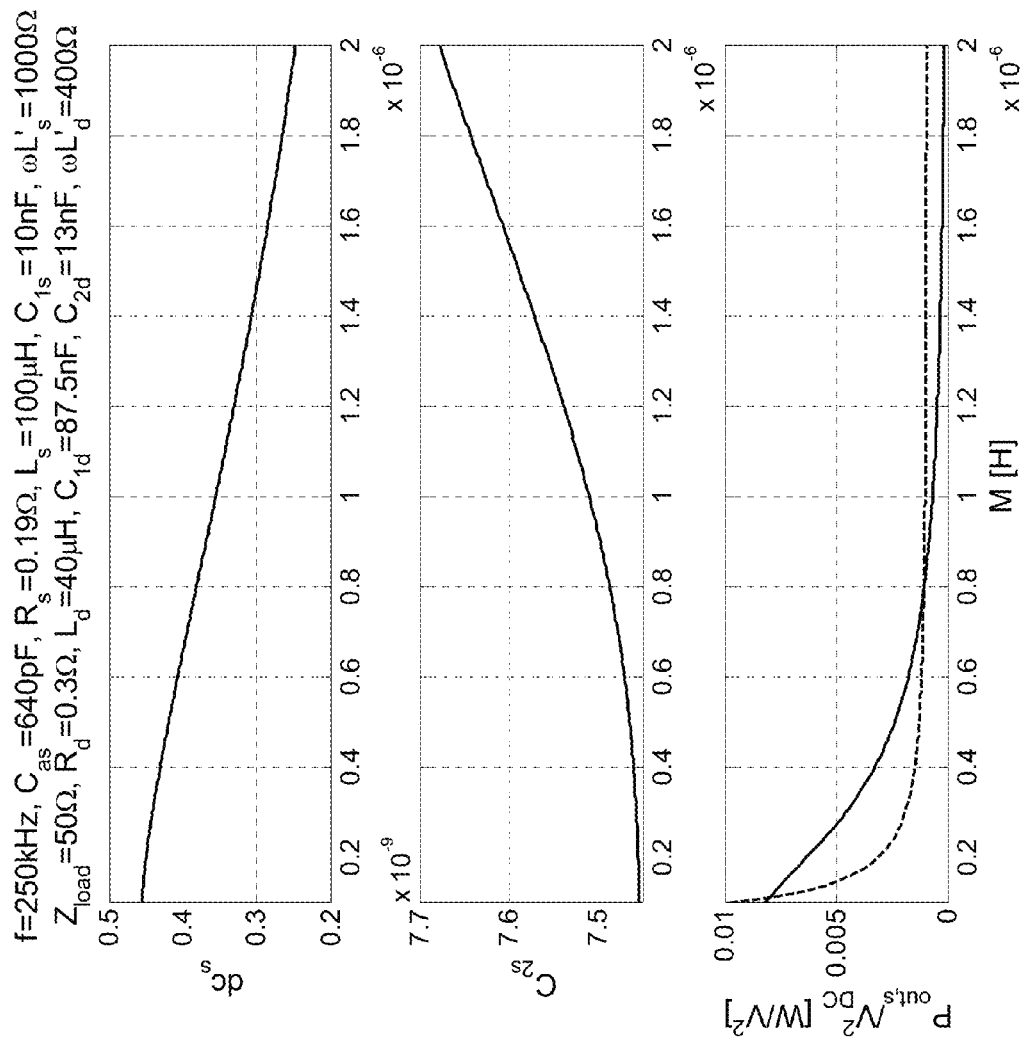

As an example, consider the circuit of FIG. 115, where f=250 kHz, $C_a$=640 pF, $R_s$=0.19$\Omega$, $L_s$=100 µH, $C_{1s}$=10 nF, $\omega L_s'$=1000$\Omega$, $R_d$=0.3$\Omega$, $L_d$=40 µH, $C_{1d}$=87.5 nF, $C_{2d}$=13 nF, $\omega L_d'$=400$\Omega$ and $Z_l$=50$\Omega$, where s and d denote the source and device resonators respectively and the system is matched at $U_{sd}$=3. Tuning the duty cycle dc of the switching amplifier and the capacitor $C_{2s}$ may be used to dynamically impedance match the source, as the non-tunable device is moving relatively to the source changing the mutual inductance M between the source and the device. In FIG. 115, we show the required values of the tunable parameters along with the output power per DC voltage of the amplifier. The dashed line again indicates the output power of the amplifier that would be needed so that the power at the load is a constant value.

Figure 114:
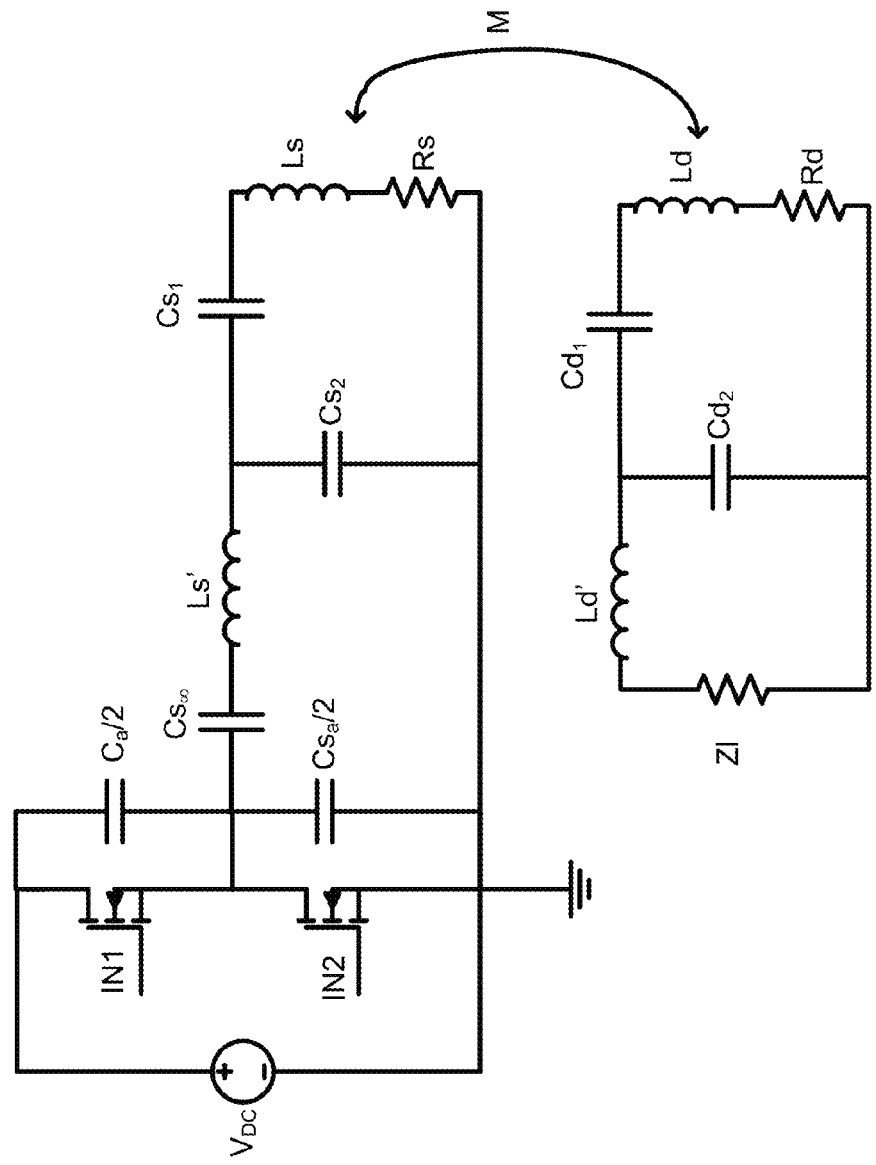

In some embodiments, tuning the driving frequency f of the source driving circuit may still be used to achieve dynamic impedance matching at the source for a system of wireless power transmission between the source and one or more devices. As explained earlier, this method enables full dynamic impedance matching of the source, even when there are variations in the source inductance $L_s$ and thus the source resonant frequency. For efficient power transmission from the source to the devices, the device resonant frequencies must be tuned to follow the variations of the matched driving and source-resonant frequencies. Tuning a device capacitance (for example, in the embodiment of FIG. 114 $C_{1d}$ or $C_{2d}$) may be necessary, when there are variations in the resonant frequency of either the source or the device resonators. In fact, in a wireless power transfer system with multiple sources and devices, tuning the driving frequency alleviates the need to tune only one source-object resonant frequency, however, all the rest of the objects may need a mechanism (such as a tunable capacitance) to tune their resonant frequencies to match the driving frequency.

Resonator Thermal Management

In wireless energy transfer systems, some portion of the energy lost during the wireless transfer process is dissipated as heat. Energy may be dissipated in the resonator components themselves. For example, even high-Q conductors and components have some loss or resistance, and these conductors and components may heat up when electric currents and/or electromagnetic fields flow through them. Energy may be dissipated in materials and objects around a resonator. For example, eddy currents dissipated in imperfect conductors or dielectrics surrounding or near-by the resonator may heat up those objects. In addition to affecting the material properties of those objects, this heat may be transferred through conductive, radiative, or convective processes to the resonator components. Any of these heating effects may affect the resonator Q, impedance, frequency, etc., and therefore the performance of the wireless energy transfer system.

In a resonator comprising a block or core of magnetic material, heat may be generated in the magnetic material due to hysteresis losses and to resistive losses resulting from induced eddy currents. Both effects depend on the magnetic flux density in the material, and both can create significant amounts of heat, especially in regions where the flux density or eddy currents may be concentrated or localized. In addition to the flux density, the frequency of the oscillating magnetic field, the magnetic material composition and losses, and the ambient or operating temperature of the magnetic material may all impact how hysteresis and resistive losses heat the material.

In embodiments, the properties of the magnetic material such as the type of material, the dimensions of the block, and the like, and the magnetic field parameters may be chosen for specific operating power levels and environments to minimize heating of the magnetic material. In some embodiments, changes, cracks, or imperfections in a block of magnetic material may increase the losses and heating of the magnetic material in wireless power transmission applications.

For magnetic blocks with imperfections, or that are comprised of smaller size tiles or pieces of magnetic material arranged into a larger unit, the losses in the block may be uneven and may be concentrated in regions where there are inhomogeneities or relatively narrow gaps between adjacent tiles or pieces of magnetic material. For example, if an irregular gap exists in a magnetic block of material, then the effective reluctance of various magnetic flux paths through the material may be substantially irregular and the magnetic field may be more concentrated in portions of the block where the magnetic reluctance is lowest. In some cases, the effective reluctance may be lowest where the gap between tiles or pieces is narrowest or where the density of imperfections is lowest. Because the magnetic material guides the magnetic field, the magnetic flux density may not be substantially uniform across the block, but may be concentrated in regions offering relatively lower reluctance. Irregular concentrations of the magnetic field within a block of magnetic material may not be desirable because they may result in uneven losses and heat dissipation in the material.

Figure 116:
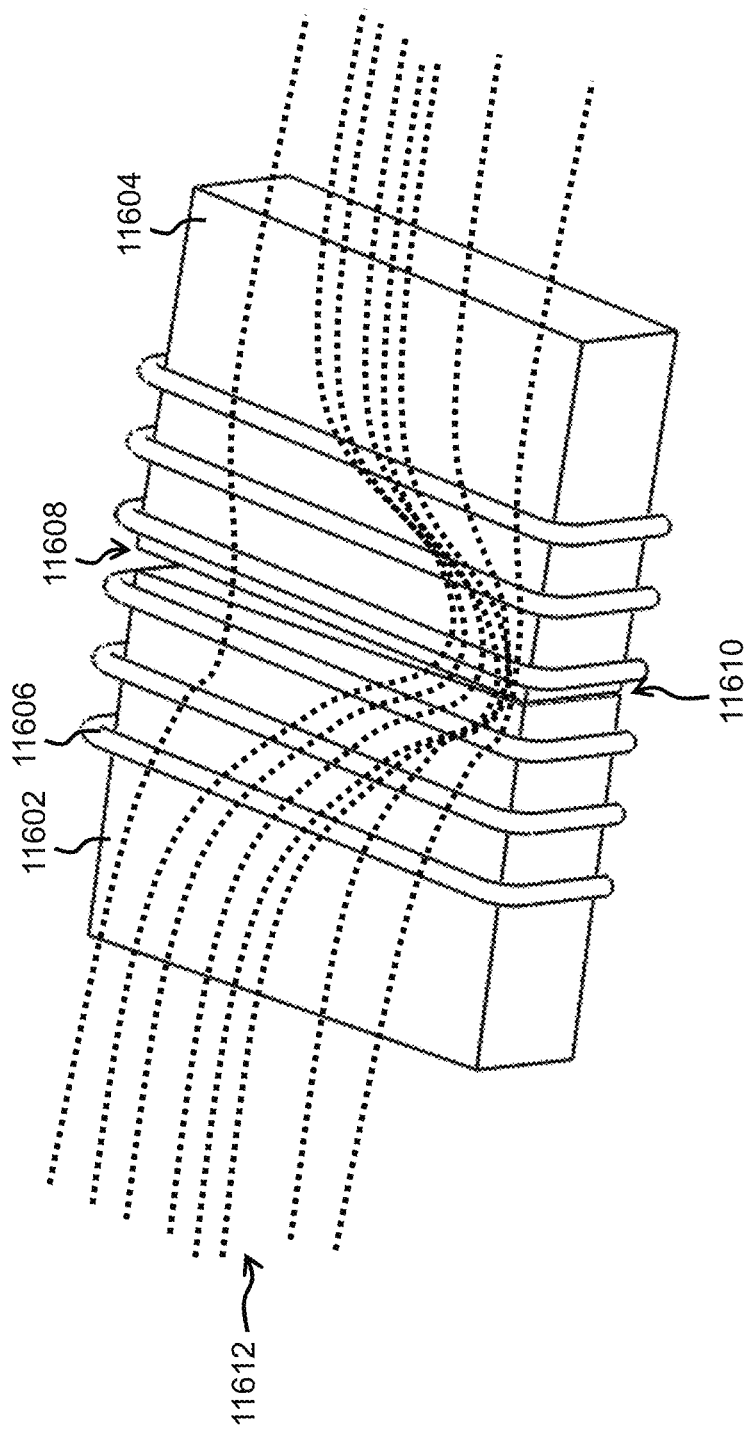

For example, consider a magnetic resonator comprising a conductor 11606 wrapped around a block of magnetic material composed of two individual tiles 11602, 11604 of magnetic material joined such that they form a seam 11608 that is perpendicular to the axis of the conductor 11606 loops as depicted in FIG. 116. An irregular gap in the seam 11608 between the tiles of magnetic material 11602, 11604 may force the magnetic field 11612 (represented schematically by the dashed magnetic field lines) in the resonator to concentrate in a sub region 11610 of the cross section of the magnetic material. Since the magnetic field will follow the path of least reluctance, a path including an air gap between two pieces of magnetic material may create an effectively higher reluctance path than one that traverses the width of the magnetic material at a point where the pieces of magnetic materials touch or have a smaller air gap. The magnetic flux density may therefore preferentially flow through a relatively small cross area of the magnetic material resulting in a high concentration of magnetic flux in that small area 11610.

In many magnetic materials of interest, more inhomogeneous flux density distributions lead to higher overall losses. Moreover, the more inhomogeneous flux distribution may result in material saturation and cause localized heating of the area in which the magnetic flux is concentrated. The localized heating may alter the properties of the magnetic material, in some cases exacerbating the losses. For example, in the relevant regimes of operation of some materials, hysteresis and resistive losses increase with temperature. If heating the material increases material losses, resulting in more heating, the temperature of the material may continue to increase and even runaway if no corrective action is taken. In some instances, the temperature may reach 100 C or more and may degrade the properties of the magnetic material and the performance of wireless power transfer. In some instances, the magnetic materials may be damaged, or the surrounding electronic components, packaging and/or enclosures may be damaged by the excessive heat.

In embodiments, variations or irregularities between tiles or pieces of the block of magnetic material may be minimized by machining, polishing, grinding, and the like, the edges of the tiles or pieces to ensure a tight fit between tiles of magnetic materials providing a substantially more uniform reluctance through the whole cross section of the block of magnetic material. In embodiments, a block of magnetic material may require a means for providing a compression force between the tiles to ensure the tiles are pressed tight together without gaps. In embodiments, an adhesive may be used between the tiles to ensure they remain in tight contact.

In embodiments the irregular spacing of adjacent tiles of magnetic material may be reduced by adding a deliberate gap between adjacent tiles of magnetic material. In embodiments a deliberate gap may be used as a spacer to ensure even or regular separations between magnetic material tiles or pieces. Deliberate gaps of flexible materials may also reduce irregularities in the spacings due to tile movement or vibrations. In embodiments, the edges of adjacent tiles of magnetic material may be taped, dipped, coated, and the like with an electrical insulator, to prevent eddy currents from flowing through reduced cross-sectional areas of the block, thus lowering the eddy current losses in the material. In embodiments a separator may be integrated into the resonator packaging. The spacer may provide a spacing of 1 mm or less.

In embodiments, the mechanical properties of the spacer between tiles may be chosen so as to improve the tolerance of the overall structure to mechanical effects such as changes in the dimensions and/or shape of the tiles due to intrinsic effects (e.g., magnetostriction, thermal expansion, and the like) as well as external shocks and vibrations. For example, the spacer may have a desired amount of mechanical give to accommodate the expansion and/or contraction of individual tiles, and may help reduce the stress on the tiles when they are subjected to mechanical vibrations, thus helping to reduce the appearance of cracks and other defects in the magnetic material.

In embodiments, it may be preferable to arrange the individual tiles that comprise the block of magnetic material to minimize the number of seams or gaps between tiles that are perpendicular to the dipole moment of the resonator. In embodiments it may be preferable to arrange and orient the tiles of magnetic material to minimize the gaps between tiles that are perpendicular to the axis formed by the loops of a conductor comprising the resonator.

Figure 117:
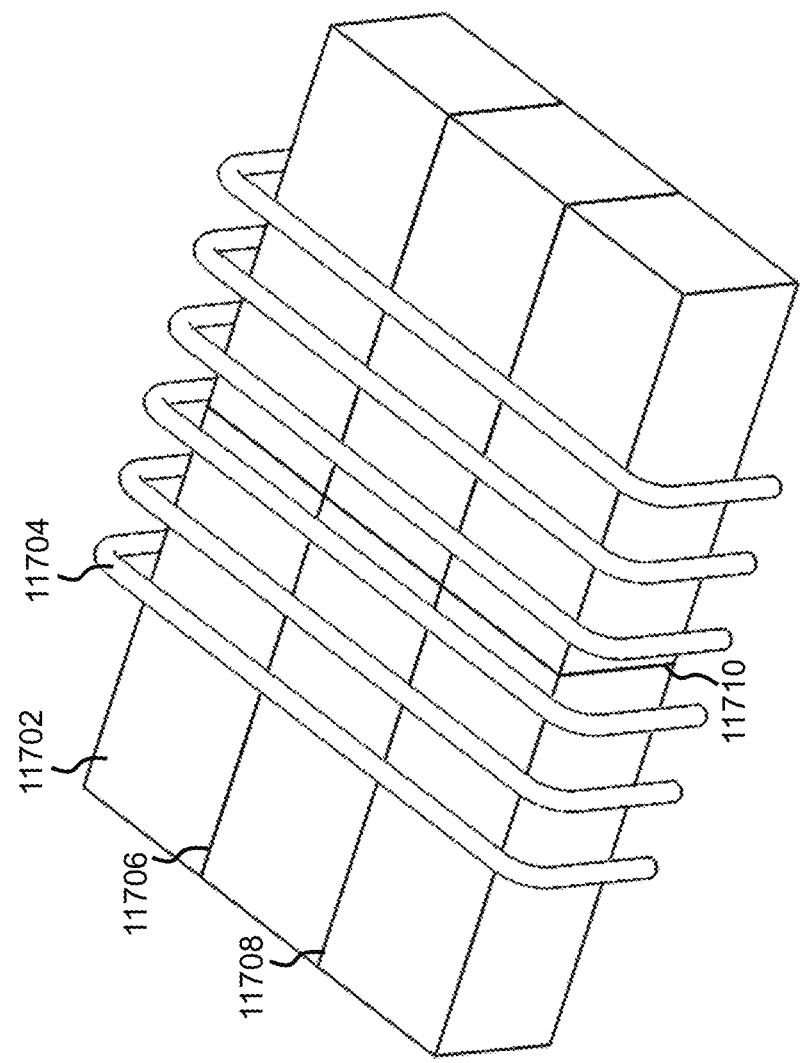

For example, consider the resonator structure depicted in FIG. 117. The resonator comprises a conductor 11704 wrapped around a block of magnetic material comprising six separate individual tiles 11702 arranged in a three by two array. The arrangement of tiles results in two tile seams 11706, 11708 when traversing the block of magnetic material in one direction, and only one tile seam 11710 when traversing the block of magnetic material in the orthogonal direction. In embodiments, it may be preferable to wrap the conductor wire 11704 around the block of magnetic material such that the dipole moment of the resonator is perpendicular to the fewest number of tile seams. The inventors have observed that there is relatively less heating induced around seams and gaps 11706, 11708 that are parallel to the dipole moment of the resonator. Seams and gaps that run perpendicular to the dipole moment of the resonator may also be referred to as critical seams or critical seam areas. It may still be desirable, however, to electrically insulate gaps that run parallel to the dipole moment of the resonator (such as 11706 and 11708) so as to reduce eddy current losses. Uneven contact between tiles separated by such parallel gaps may cause eddy currents to flow through narrow contact points, leading to large losses at such points.

In embodiments, irregularities in spacing may be tolerated with adequate cooling of the critical seam areas to prevent the localized degradation of material properties when the magnetic material heats up. Maintaining the temperature of the magnetic material below a critical temperature may prevent a runaway effect caused by a sufficiently high temperature. With proper cooling of the critical seam area, the wireless energy transfer performance may be satisfactory despite the additional loss and heating effects due to irregular spacing, cracks, or gaps between tiles.

Effective heatsinking of the resonator structure to prevent excessive localized heating of the magnetic material poses several challenges. Metallic materials that are typically used for heatsinks and thermal conduction can interact with the magnetic fields used for wireless energy transfer by the resonators and affect the performance of the system. Their location, size, orientation, and use should be designed so as to not excessively lower the perturbed Q of the resonators in the presence of these heatsinking materials. In addition, owing to the relatively poor thermal conductivity of magnetic materials such as ferrites, a relatively large contact area between the heatsink and the magnetic material may be required to provide adequate cooling which may require placement of substantial amount of lossy materials close to the magnetic resonator.

In embodiments, adequate cooling of the resonator may be achieved with minimal effect on the wireless energy transfer performance with strategic placement of thermally conductive materials. In embodiments, strips of thermally conductive material may be placed in between loops of conductor wire and in thermal contact with the block of magnetic material.

One exemplary embodiment of a resonator with strips of thermally conductive material is depicted in FIG. 118. FIG. 118(*a*) shows the resonator structure without the conducting strips and with the block of magnetic material comprising smaller tiles of magnetic material forming gaps or seams. Strips of thermally conductive 11808 material may be placed in between the loops of the conductor 11802 and in thermal contact with the block of magnetic material 11804 as depicted in FIGS. 118(*b*) and 118(*c*). To minimize the effects of the strips on the parameters of the resonator, in some embodiments it may be preferable to arrange the strips parallel to the loops of conductor or perpendicular to the dipole moment of the resonator. The strips of conductor may be placed to cover as much or as many of the seams or gaps between the tiles as possible especially the seams between tiles that are perpendicular to the dipole moment of the resonator.

In embodiments the thermally conductive material may comprise copper, aluminum, brass, thermal epoxy, paste, pads, and the like, and may be any material that has a thermal conductivity that is at least that of the magnetic material in the resonator (~5 W/(K-m) for some commercial ferrite materials). In embodiments where the thermally conductive material is also electrically conducting, the material may require a layer or coating of an electrical insulator to prevent shorting and direct electrical contact with the magnetic material or the loops of conductor of the resonator.

In embodiments the strips of thermally conductive material may be used to conduct heat from the resonator structure to a structure or medium that can safely dissipate the thermal energy. In embodiments the thermally conductive strips may be connected to a heat sink such as a large plate located above the strips of conductor that can dissipate the thermal energy using passive or forced convection, radiation, or conduction to the environment. In embodiments the system may include any number of active cooling systems that may be external or internal to the resonator structure that can dissipate the thermal energy from the thermally conducting strips and may include liquid cooling systems, forced air systems, and the like. For example, the thermally conducting strips may be hollow or comprise channels for coolant that may be pumped or forced through to cool the magnetic material. In embodiments, a field deflector made of a good electrical conductor (such as copper, silver, aluminum, and the like) may double as part of the heatsinking apparatus. The addition of thermally and electrically conducting strips to the space between the magnetic material and the field deflector may have a marginal effect on the perturbed Q, as the electromagnetic fields in that space are typically suppressed by the presence of the field deflector. Such conducting strips may be thermally connected to both the magnetic material and the field deflector to make the temperature distribution among different strips more homogeneous.

In embodiments the thermally conducting strips are spaced to allow at least one loop of conductor to wrap around the magnetic material. In embodiments the strips of thermally conductive material may be positioned only at the gaps or seams of the magnetic material. In other embodiments, the strips may be positioned to contact the magnetic material at substantially throughout its complete length. In other embodiments, the strips may be distributed to match the flux density within the magnetic material. Areas of the magnetic material which under normal operation of the resonator may have higher magnetic flux densities may have a higher density of contact with the thermally conductive strips. In embodiments depicted in FIG. 118(*a*) for example, the highest magnetic flux density in the magnetic material may be observed toward the center of the block of magnetic material and the lower density may be toward the ends of the block in the direction of the dipole moment of the resonator.

To show how the use of thermally conducting strips helps to reduce the overall temperature in the magnetic material as well as the temperature at potential hot spots, the inventors have performed a finite element simulation of a resonator structure similar to that depicted in FIG. 118(*c*). The structure was simulated operating at a frequency of 235 kHz and comprising a block of EPCOS N95 magnetic material measuring 30 cm×30 cm×5 mm excited by 10 turns of litz wire (symmetrically placed at 25 mm, 40 mm, 55 mm, 90 mm and 105 mm from the plane of symmetry of the structure) carrying 40 A of peak current each, and thermally connected to a 50 cm×50 cm×4 mm field deflector by means of three 3×¾×1' hollow square tubes (⅛" wall thickness) of aluminum (alloy 6063) whose central axes are placed at −75 mm, 0 mm, and +75 from the symmetry plane of the structure. The perturbed Q due to the field deflector and hollow tubes was found to be 1400 (compared to 1710 for the same structure without the hollow tubes). The power dissipated in the shield and tubes was calculated to be 35.6 W, while that dissipated in the magnetic material was 58.3 W. Assuming the structure is cooled by air convection and radiation and an ambient temperature of 24° C., the maximum temperature in the structure was 85° C. (at points in the magnetic material approximately halfway between the hollow tubes) while the temperature in parts of the magnetic material in contact with the hollow tubes was approximately 68° C. By comparison, the same resonator without the thermally conducting hollow tubes dissipated 62.0 W in the magnetic material for the same excitation current of 40 W peak and the maximum temperature in the magnetic material was found to be 111° C.

The advantage of the conducting strips is more apparent still if we introduce a defect in a portion of the magnetic material that is in good thermal contact with the tubes. An air gap 10 cm long and 0.5 mm placed at the center of the magnetic material and oriented perpendicular to the dipole moment increases the power dissipated in the magnetic material to 69.9 W (the additional 11.6 W relative to the previously discussed no-defect example being highly concentrated in the vicinity of the gap), but the conducting tube ensures that the maximum temperature in the magnetic material has only a relative modest increase of 11° C. to 96° C. In contrast, the same defect without the conducting tubes leads to a maximum temperature of 161° C. near the defect. Cooling solutions other than convection and radiation, such as thermally connecting the conducting tubes body with large thermal mass or actively cooling them, may lead to even lower operational temperatures for this resonator at the same current level.

In embodiments thermally conductive strips of material may be positioned at areas that may have the highest probability of developing cracks that may cause irregular gaps in the magnetic material. Such areas may be areas of high stress or strain on the material, or areas with poor support or backing from the packaging of the resonator. Strategically positioned thermally conductive strips may ensure that as cracks or irregular gaps develop in the magnetic material, the temperature of the magnetic material will be maintained below its critical temperature. The critical temperature may be defined as the Curie temperature of the magnetic material, or any temperature at which the characteristics of the resonator have been degraded beyond the desired performance parameters.

In embodiments the heastsinking structure may provide mechanical support to the magnetic material. In embodiments the heatsinking structure may be designed to have a desired amount of mechanical give (e.g., by using epoxy, thermal pads, and the like having suitable mechanical properties to thermally connect different elements of the structure) so as to provide the resonator with a greater amount of tolerance to changes in the intrinsic dimensions of its elements (due to thermal expansion, magnetostriction, and the like) as well as external shocks and vibrations, and prevent the formation of cracks and other defects.

In embodiments where the resonator comprises orthogonal windings wrapped around the magnetic material, the strips of conducting material may be tailored to make thermal contact with the magnetic material within areas delimited by two orthogonal sets of adjacent loops. In embodiments a strip may contain appropriate indentations to fit around the conductor of at least one orthogonal winding while making thermal contact with the magnetic material at least one point. In embodiments the magnetic material may be in thermal contact with a number of thermally conducting blocks placed between adjacent loops. The thermally conducting blocks may be in turn thermally connected to one another by means of a good thermal conductor and/or heatsinked.

Throughout this description although the term thermally conductive strips of material was used as an exemplary specimen of a shape of a material it should be understood by those skilled in the art that any shapes and contours may be substituted without departing from the spirit of the inventions. Squared, ovals, strips, dots, elongated shapes, and the like would all be within the spirit of the present invention.

Communication in a Wireless Energy Transfer System

A wireless energy transfer system may require a verification step to ensure that energy is being transferred between designated resonators. For example, in wireless energy transfer systems, source resonators, device resonators, and repeater resonators, do not require physical contact with each other in order to exchange energy, and these resonators may be separated from each other by distances of centimeters or meters, depending on the size and number of resonators in the system. In some configurations, multiple resonators may be in a position to generate or receive power, but only two or some of those resonators are designated resonators.

Communication of information between resonators in a wireless energy transfer system may be utilized to designate resonators. Communication of information between resonators may be implemented using in-band or out-of-band communications or communications channels. If at least some part of a magnetic resonator used to exchange power is also used to exchange information, and the carrier frequency of the information exchange is close to the resonant frequency used in the power exchange, we refer to that communication as in-band. Any other type of communication between magnetic resonators is referred to as out-of-band. An out-of-band communication channel may use an antenna and a signaling protocol that is separated from the energy transfer resonator and magnetic fields. An out-of-band communication channel may use or be based on Bluetooth, WiFi, Zigbee, NFC technology and the like.

Communication between resonators may be used to coordinate the wireless energy transfer or to adjust the parameters of a wireless energy transfer system, to identify and authenticate available power sources and devices, to optimize efficiency, power delivery, and the like, to track and bill energy preferences, usage, and the like, and to monitor system performance, battery condition, vehicle health, extraneous objects, also referred to as foreign objects, and the like. Methods for designating and verifying resonators for energy transfer may be different when in-band and out-of-band communication channels are used because the distance over which communication signals may be exchanged using out-of-band techniques may greatly exceed the distance over which the power signals may be exchanged. Also, the bandwidth of out-of-band communication signals may be larger than in-band communication signals. This difference in communication range and capability may affect the coordination of the wireless energy transfer system. For example, the number of resonators that may be addressed using out-of-band communication may be very large and communicating resonators may be farther apart than the distance over which they may efficiently exchange energy.

In some embodiments all of the signaling and communication may be performed using an in-band communication channel and the signals may be modulated on the fields used for energy transfer. In other embodiments, in-band communication may use substantially the same frequency spectrum as is used for energy transfer, but communication may occur while useful amounts of energy are not being transmitted. Using only the in-band communication channel may be preferable if separate or multiple verification steps are problematic, because the range of the communication may be limited to the same range as the power exchange or because the information arrives as a modulation on the power signal itself. In some embodiments however, a separate out-of-band communication channel may be more desirable. For example, an out-of-band communication channel may be less expensive to implement and may support higher data rates. An out-of-band communication channel may support longer distance communication, allowing resonator discovery and power system mapping. An out-of-band communication channel may operate regardless of whether or not power transfer is taking place and may occur without disruption of the power transfer.

An exemplary embodiment of a wireless energy system is shown in FIG. 119. This exemplary embodiment comprises two device resonators 11902, 11916 each with an out-of-band communication module 11904, 11918 respectively and two source resonators 11906, 11910 each with their own out-of-band communication modules 11908, 11912 respectively. The system may use the out-of-band communication channel to adjust and coordinate the energy transfer. The communication channel may be used to discover or find resonators in the proximity, to initiate power transfer, and to communicate adjustment of operating parameters such as power output, impedance, frequency, and the like of the individual resonators.

In some situations a device resonator may incorrectly communicate with one source but receive energy from another source resonator. For example, imagine that device 11902 sends an out-of-band communication signal requesting power from a source. Source 11910 may respond and begin to supply power to device 11902. Imagine that device 11916 also sends an out-of-band communication signal requesting power from a source and that source 11906 responds and begins to supply power to device 11916. Because of the proximity of device 11902 to source 11906, it is possible that device 11902 receives some or most of its power from source 11906. If the power level received by device 11902 becomes too high, device 11902 may send an out-of-band communication signal to source 11910 to reduce the power it is transmitting to device 11902. However, device 11902 may still be receiving too much power, because it is receiving power from source 11906 but is not communicating control signals to that source 11906.

Therefore, the separation of the energy transfer channel and the communication channel may create performance, control, safety, security, reliability, and the like issues in wireless energy transfer systems. In embodiments, it may be necessary for resonators in a wireless energy transfer system to identify/designate and verify any and all resonators with which it is exchanging power. As those skilled in the art will recognize, the example shown in FIG. 119 is just one example and there exist many configurations and arrangements of wireless power transmission systems that may benefit from explicit or implicit energy transfer verification steps.

In embodiments, the potential performance, control, safety, security, reliability and the like, issues may be avoided by providing at least one verification step that insures that the energy transfer channel and the communication channel used by a pair of resonators are associated with the same pair of resonators.

In embodiments the verification step may comprise some additional information exchange or signaling through the wireless energy transfer channel. A verification step comprising communication or information exchange using the energy transfer channel, or fields of the energy transfer channel may be used to verify that the out-of-band communication channel is exchanging information between the same two resonators that are or will be exchanging energy.

In embodiments with an out-of-band communication channel the verification step may be implicit or explicit. In some embodiments verification may be implicit. In embodiments an energy transfer channel may be implicitly verified by monitoring and comparing the behavior of the energy transfer channel to expected behavior or parameters in response to the out-of-band information exchange. For example, after establishing out-of-band communications, a device may request that a wireless source increase the amount of power it is transmitting. At the same time, parameters of the wireless energy transfer channel and resonators may be monitored. An observed increase of delivered power at the device may be used to infer that the out-of-band communication channel and the energy transfer channel are correctly linked to the designated resonators.

In embodiments an implicit verification step may involve monitoring any number of the parameters of the wireless energy transfer or parameters of the resonators and components used in the wireless energy transfer. In embodiments the currents, voltages, impedances, frequency, efficiency, temperatures, of the resonators and their drive circuits and the like may be monitored and compared to expected values, trends, changes and the like as a result of an out-of-band communication exchange.

In embodiments a resonator may store tables of measured parameters and expected values, trends, and/or changes to these parameters as a consequence of a communication exchange. A resonator may store a history of communications and observed parameter changes that may be used to verify the energy transfer channel. In some cases a single unexpected parameter change due to a communication exchange may be not be conclusive enough to determine the out-of-band channel is incorrectly paired. In some embodiments the history of parameter changes may be scanned or monitored over several or many communication exchanges to perform verification.

Figure 120B:
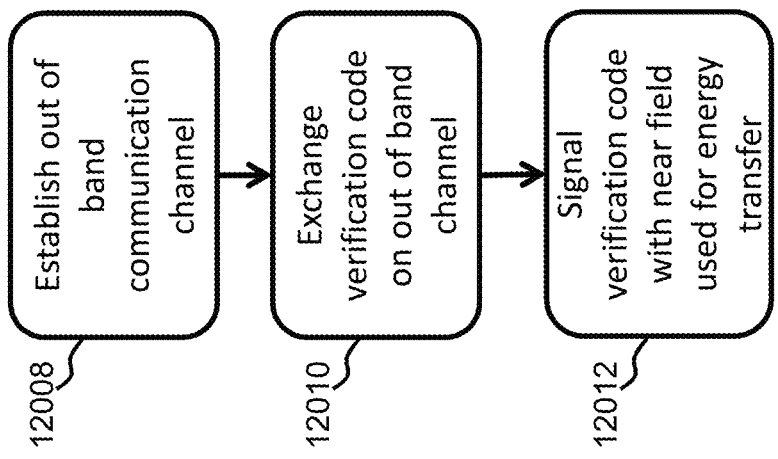
Figure 120A:
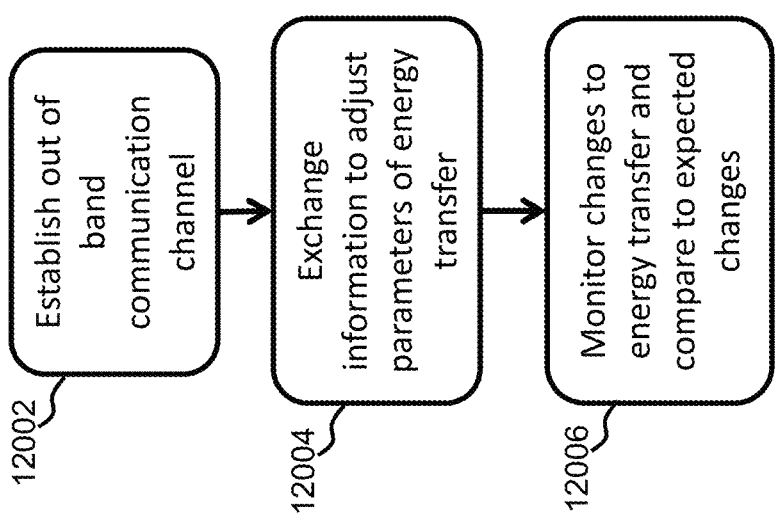

An example algorithm showing the series of steps which may be used to implicitly verify an energy transfer channel in a wireless energy transfer system using out-of-band communication is shown in FIG. 120(*a*). In the first step 12002 an out-of-band communication channel between a source and a device is established. In the next step 12004 the source and device may exchange information regarding adjusting the parameters of the wireless energy transfer or parameters of the components used for wireless energy transfer. The information exchange on the out-of-band communication channel may be a normal exchange used in normal operation of the system to control and adjust the energy transfer. In some systems the out-of-band communication channel may be encrypted preventing eavesdropping, impersonation, and the like. In the next step 12006 the source and the device or just a source or just a device may monitor and keep track of any changes to the parameters of the wireless energy transfer or any changes in parameters in the components used in the energy transfer. The tracked changes may be compared against expected changes to the parameters as a consequence of any out-of-band communication exchanges. Validation may be considered failed when one or many observed changes in parameters do not correspond to expected changes in parameters.

In some embodiments of wireless energy transfer systems verification may be explicit. In embodiments a source or a device may alter, dither, modulate, and the like the parameters of the wireless energy transfer or the parameters of the resonators used in the wireless energy transfer to communicate or provide a verifiable signal to a source or device through the energy transfer channel. The explicit verification may involve changing, altering, modulating, and the like some parameters of the wireless energy transfer or the parameters of the resonators and components used in the energy transfer for the explicit purpose of verification and may not be associated with optimizing, tuning, or adjusting the energy transfer.

The changing, altering, modulating, and the like some parameters of the wireless energy transfer or the parameters of the resonators and components used in the energy transfer for the purpose of signaling or communicating with another wireless energy resonator or component may also be referred to as in-band communication. In embodiments, the in-band communication channel may be implemented as part of the wireless energy transfer resonators and components. Information may be transmitted from one resonator to another by changing the parameters of the resonators. Parameters such as inductance, impedance, resistance, and the like may be dithered or changed by one resonator. These changes may affect the impedance, resistance, or inductance of other resonators around the signaling resonator. The changes may manifest themselves as corresponding dithers of voltage, current, and the like on the resonators which may be detected and decoded into messages. In embodiments, in-band communication may comprise altering, changing, modulating, and the like the power level, amplitude, phase, orientation, frequency, and the like of the magnetic fields used for energy transfer.

In one embodiment the explicit in-band verification may be performed after an out-of-band communication channel has been established. Using the out-of-band communication channel a source and a device may exchange information as to the power transfer capabilities and in-band signaling capabilities. Wireless energy transfer between a source and a device may then be initiated. The source or device may request or challenge the other source or device to signal using the in-band communication channel to verify the connection between the out-of-band and communication channel and the energy transfer channel. The channel is verified when the agreed signaling established in the out-of-band communication channel is observed at the in-band communication channel.

In embodiments verification may be performed only during specific or predetermined times of an energy exchange protocol such as during energy transfer startup. In other embodiments explicit verification steps may be performed periodically during the normal operation of the wireless energy transfer system. The verification steps may be triggered when the efficiency or characteristics of the wireless power transfer change which may signal that the physical orientations have changed. In embodiments the communication controller may maintain a history of the energy transfer characteristics and initiate a verification of the transfer that includes signaling using the resonators when a change in the characteristics is observed. A change in the energy transfer characteristics may be observed as a change in the efficiency of the energy transfer, the impedance, voltage, current, and the like of the resonators, or components of the resonators and power and control circuitry.

Those skilled in the art will appreciate a signaling and communication channel capable of transmitting messages may be secured with any number of encryption, authentication, and security algorithms. In embodiments the out-of-band communication may be encrypted and the secured communication channel may be used to transmit random sequences for verification using the in-band channel. In embodiments the in-band communication channel may be encrypted, randomized, or secured by any known security and cryptography protocols and algorithms. The security and cryptography algorithms may be used to authenticate and verify compatibility between resonators and may use a public key infrastructure (PKI) and secondary communication channels for authorization and authentication.

In embodiments of energy transfer systems between a source and a device a device may verify the energy transfer channel to ensure it is receiving energy from the desired or assumed source. A source may verify the energy transfer channel to ensure energy is being transferred to the desired or assumed source. In some embodiments the verification may be bidirectional and a source and device may both verify their energy transfer channels in one step or protocol operation. In embodiments, there may be more than two resonators and there may be repeater resonators. In embodiments of multiple resonators, communication and control may be centralized in one or a few resonators or communication and control may be distributed across many, most, or all the resonators in a network. In embodiments, communication and/or control may be effected by one or more semiconductor chips or microcontrollers that are coupled to other wireless energy transfer components.

An example algorithm showing the series of steps which may be used to explicitly verify an energy transfer channel in a wireless energy transfer system using out-of-band communication is shown in FIG. 120(*b*). In the first step 12008 an out-of-band communication channel between a source and a device is established. In the next step 12010 the source and device may coordinate or agree on a signaling protocol, method, scheme, and the like that may be transmitted through the wireless energy transfer channel. To prevent eavesdropping and provide security the out-of-band communication channel may be encrypted and the source and device may follow any number of known cryptographic authentication protocols. In a system enabled with cryptographic protocols the verification code may comprise a challenge-response type exchange which may provide an additional level of security and authentication capability. A device, for example, may challenge the source to encrypt a random verification code which it sends to the source via the out-of-band communication channel using a shared secret encryption key or a private key. The verification code transmitted in the out-of-band communication channel may then be signaled 12012 through the in-band communication channel. In the case where the source and device are enabled with cryptographic protocols the verification code signaled in the in-band communication channel may be encrypted or modified by the sender with a reversible cryptographic function allowing the receiver to further authenticate the sender and verify that the in-band communication channels are linked with the same source or device associated with the out-of-band communication channel.

In situations when the verification fails a wireless energy transfer system may try to repeat the validation procedure. In some embodiments the system may try to re-validate the wireless energy transfer channel by exchanging another verification sequence for resignaling using the in-band communication channel. In some embodiments the system may change or alter the sequence or type of information that is used to verify the in-band communication channel after attempts to verify the in-band communication channel have failed. The system may change the type of signaling, protocol, length, complexity and the like of the in-band communication verification code.

In some embodiments, upon failure of verification of the in-band communication channel and hence the energy transfer channel, the system may adjust the power level, the strength of modulation, frequency of modulation and the like of the signaling method in the in-band communication channel. For example, upon failure of verification of a source by a device, the system may attempt to perform the verification at a higher energy transfer level. The system may increase the power output of the source generating stronger magnetic fields. In another example, upon failure of verification of a source by a device, the source that communicated the verification code to the device by changing the impedance of its source resonator may increase or even double the amount of change in the impedance of the source resonator for the signaling.

In embodiments, upon failure of verification of the energy transfer channel, the system may try to probe, find, or discover other possible sources or devices using the out-of-band communication channel. In embodiments the out-of-band communication channel may be used to find other possible candidates for wireless energy transfer. In some embodiments the system may change or adjust the output power or the range of the out-of-band communication channel to help minimize false pairings.

The out-of-band communication channel may be power modulated to have several modes, long range mode to detect sources and a short range or low power mode to ensure the communication is with another device or source that is within a specified distance. In embodiments the out-of-band communication channel may be matched to the range of the wireless channel for each application. After failure of verification of the energy transfer channel the output power of the out-of-band communication channel may be slowly increased to find other possible sources or devices for wireless energy transfer. As discussed above, an out-of-band communication channel may exhibit interferences and obstructions that may be different from the interferences and obstructions of the energy transfer channel and sources and devices that may require higher power levels for out-of-band communication may be in close enough proximity to allow wireless energy transfer.

In some embodiments the out-of-band communication channel may be directed, arranged, focused, and the like, using shielding or positioning to be only effective in a confined area (i.e., under a vehicle), to insure it is only capable of establishing communication with another source or device that is in close enough proximity, position, and orientation for energy transfer.

In embodiments the system may use one or more supplemental sources of information to establish an out-of-band communication channel or to verify an in-band energy transfer channel. For example, during initial establishment of an out-of-band communication channel the locations of the sources or devices may be compared to known or mapped locations or a database of locations of wireless sources or devices to determine the most probable pair for successful energy transfer. Out-of-band communication channel discovery may be supplemented with GPS data from one or more GPS receivers, data from positioning sensors, inertial guidance systems and the like.

It is to be understood that although example embodiments with verification were described in systems consisting of a source and device verification may be performed in systems with any number of sources, devices, or repeaters. A single source may provide verification to multiple devices. In some embodiments multiple sources may provide power to one or more devices concurrently each may be varied. In embodiments verification may be performed with a repeater. In some embodiments verification may be performed through a repeater. A device receiving power from a source via a repeater resonator may verify the source of power from the repeater. A device receiving power from a source via a repeater resonator may verify the source of energy through the repeater, i.e., the in-band communication may pass through the repeater to the source for verification. It should be clear to those skilled in the art that all of these and other configurations are within the scope of the invention.

Low Resistance Electrical Conductors

As described above, resonator structures used for wireless energy transfer may include conducting wires that conduct high frequency oscillating currents. In some structures the effective resistance of the conductors may affect the quality factor of the resonator structure and a conductor with a lower loss or lower resistance may be preferable. The inventors have discovered new structures for reducing the effective resistance of conducting wires at high frequencies compared to solid wire conductors or even Litz wire conductors of the same equivalent wire gauge (diameter).

In embodiments, structures comprising concentric cylindrical conducting shells can be designed that have much lower electrical resistance for frequencies in the MHz range than similarly sized solid wire conductors or commercially available Litz wires. At such frequencies, wire resistances are dominated by skin-depth effects (also referred to as proximity effects), which prevent electrical current from being uniformly distributed over the wire cross-section. At lower frequencies, skin-depth effects may be mitigated by breaking the wire into a braid of many thin insulated wire strands (e.g. Litz wire), where the diameter of the insulated strands are related to the conductor skin depth at the operating frequency of interest. In the MHz frequency range, the skin depth for typical conductors such as copper are on the order of 10 μm, making traditional Litz wire implementations impractical.

The inventors have discovered that breaking the wire into multiple properly designed concentric insulated conducting shells can mitigate the skin depth effects for frequencies above 1 MHz. In embodiments, wires comprising fewer than 10 coaxial shells can lower AC resistance by more than a factor of 3 compared to solid wire. In embodiments, wires or conductors comprising thin concentric shells can be fabricated by a variety of processes such as electroplating, electrodeposition, vapor deposition, sputtering, and processes that have previously been applied to the fabrication of optical fibers.

In embodiments, conducting structures comprising nested cylindrical conductors may be analyzed using the quasistatic Maxwell equations. Of particular importance in the design of these conducting structures is taking account of the proximity losses induced by each conducting shell in the others via the magnetic fields. Modeling tools may be used to optimize the number of conducting shells, the size and shape of the conducting shells, the type and thickness of insulating materials for a given conductor diameter, operating frequency and environment, cost, and the like.

One embodiment of the new conductor structure comprises a number, N, of concentric conducting shells. Such a structure can be designed to have much lower AC resistance at frequencies in the 10 MHz range than similar gauge solid or stranded wires or commercially available Litz wires.

An embodiment of a wire or conductor comprising conducting shells may comprise at least two concentric conducting shells separated by an electrical insulator. An exemplary embodiment of an electrical conductor with four concentric shells is shown in FIG. 121. Note that the conductor may have an unlimited length along the z axis. That is, the length along the z axis is the length of the wire or the conductor. Also, the wire or conductor may have any number of bends, curves, twists, and the like (not shown) as would other conductors of equivalent gauge or thickness. Also note that in embodiments where the cross-section of the shell is annular or substantially annular, the shell will consequently be cylindrical or substantially cylindrical. There is no limitation to the shape of the cross sections and thus the shape of the resulting three-dimensional structure. For example, the cross-sectional shape may be rectangular in embodiments.

An embodiment shown in FIG. 121 comprises four concentric shells 12108, 12106, 12104, 12102 of an electrical conductor that extend through the complete length of the conducting wire along the z axis. The conductor shells may be referred to by their location with respect to the center or innermost conductor shell. For convention, the innermost shell may be referred to as the first shell, and each successive shell as the second shell, third shell, etc. The successive shells may also referred to as nested concentric shells. For example, in the embodiment shown in FIG. 121 conductor shell 12102 may be referred to as the first shell or the innermost shell and the conductor 12104 as the second shell, conductor 12106 as the third shell, and conductor 2008 as the fourth shell or the outermost shell. Each shell, except the innermost and the outermost shell, is in direct proximity to two neighboring shells, an inner neighbor and an outer neighbor shell. The innermost shell only has an outer neighbor, and the outermost shell only has an inner neighbor. For example, the third conductor 12106 has two shell neighbors, the inner neighbor being the second shell 12104 and the outer neighbor being the fourth shell 12108. In embodiments, the inner shell may be a solid core (in embodiments, cylindrical with an inner diameter zero). Alternatively, it may have a finite inner diameter and surround a core made of insulating material and the like.

In embodiments each successive shell covers its inner neighbor shell long the z axis of the conductor. Each shell wraps around its inner neighbor shell except the faces of each shell that are exposed at the ends of the conductor. For example, in the embodiment shown in FIG. 121, shell 12102 is wrapped around by its outer neighbor shell 12104 and shell 12104 is wrapped by 12106 and etc.

In embodiments each successive shell may comprise one or more strips of conductor shaped so as to conform to the cylindrical geometry of the structure. In embodiments the strips in each shell may be mutually insulated and periodically connected to strips in adjacent shells so that the input impedances of the shells and/or strips naturally enforce the current distribution that minimizes the resistance of the structure. In embodiments the strips in each shell may be wound at a particular pitch. The pitch in different shells may be varied so as to assist in the impedance matching of the entire structure.

FIG. 121 shows an end section of the conductor with the conducting layers staggered to provide a clear illustration of the layers. The staggering of layers in the drawing should not be considered as a preferred termination of the conductor. The conductor comprising multiple shells may be terminated with all shells ending in the same plane or at different staggered planes as depicted in FIG. 121.

In embodiments, the innermost conductor shell 12102 may be solid as shown in FIG. 121. In embodiments the innermost conductor shell may be hollow defining a hole or cavity along its length along the z axis of the conductor.

In embodiments neighboring shells may be separated from each other by layers of an electrical insulator such that neighboring layers are not in electrical contact with one another. The thickness and material of the insulating layer may depend on the voltages, currents, and relative voltage potential between each neighboring shell. In general the insulator should be selected such that its breakdown voltage exceeds the voltage potential between neighboring conducting shells. In embodiments the outside of the outermost shell 12110 may be covered by additional electrical insulators or protective casing for electrical safety, durability, water resistance, and the like. In embodiments different shells and insulator layers may have different thicknesses depending on the application, frequency, power levels and the like.

Figure 122:
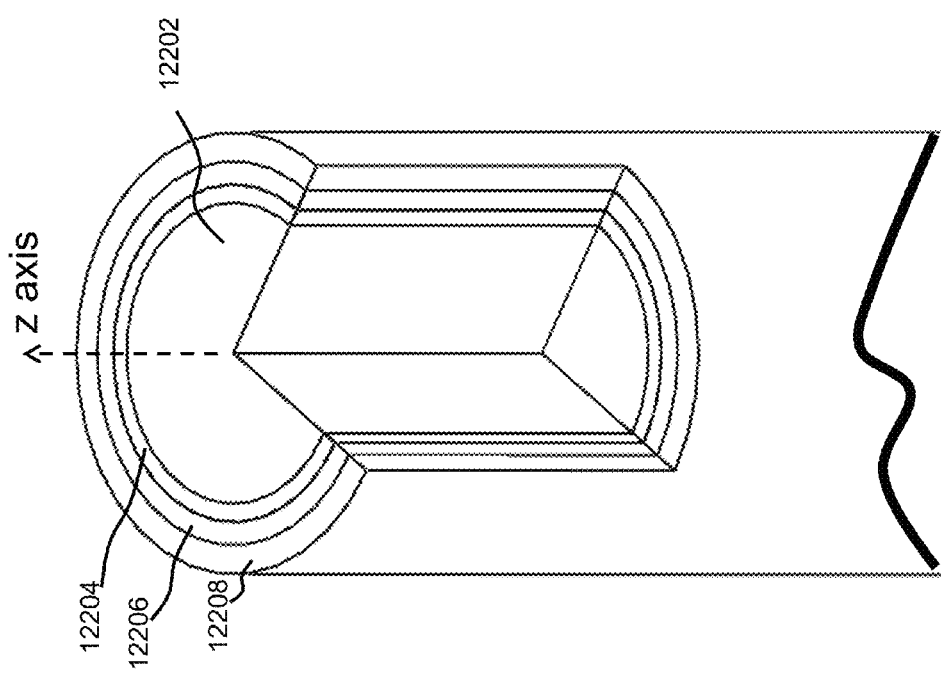

Another view of a cross section of an embodiment of the conductor comprising four shells is shown in FIG. 122. The figure shows a cross-section, normal to the z-axis, of the conductor comprising the conductor shells 12202, 12204, 12206, 12208. Note that in this figure, and in FIG. 121, the insulating layers are not shown explicitly, but are understood to be located between the various shells. In embodiments, the thickness of the insulating layers may be extremely thin, especially in comparison to the thickness of the conducting shells.

The thickness, relative thickness, size, composition, shape, number, fraction of total current carried and the like, of concentric conducing shells may be selected or optimized for specific criteria such as the voltage and/or current levels carried by the wire, the operating frequency of the resonator, size, weight and flexibility requirements of the resonator, required Q-values, system efficiencies, costs and the like. The appropriate size, number, spacing, and the like of the conductors may be determined analytically, through simulation, by trial and error, and the like.

Figure 123:
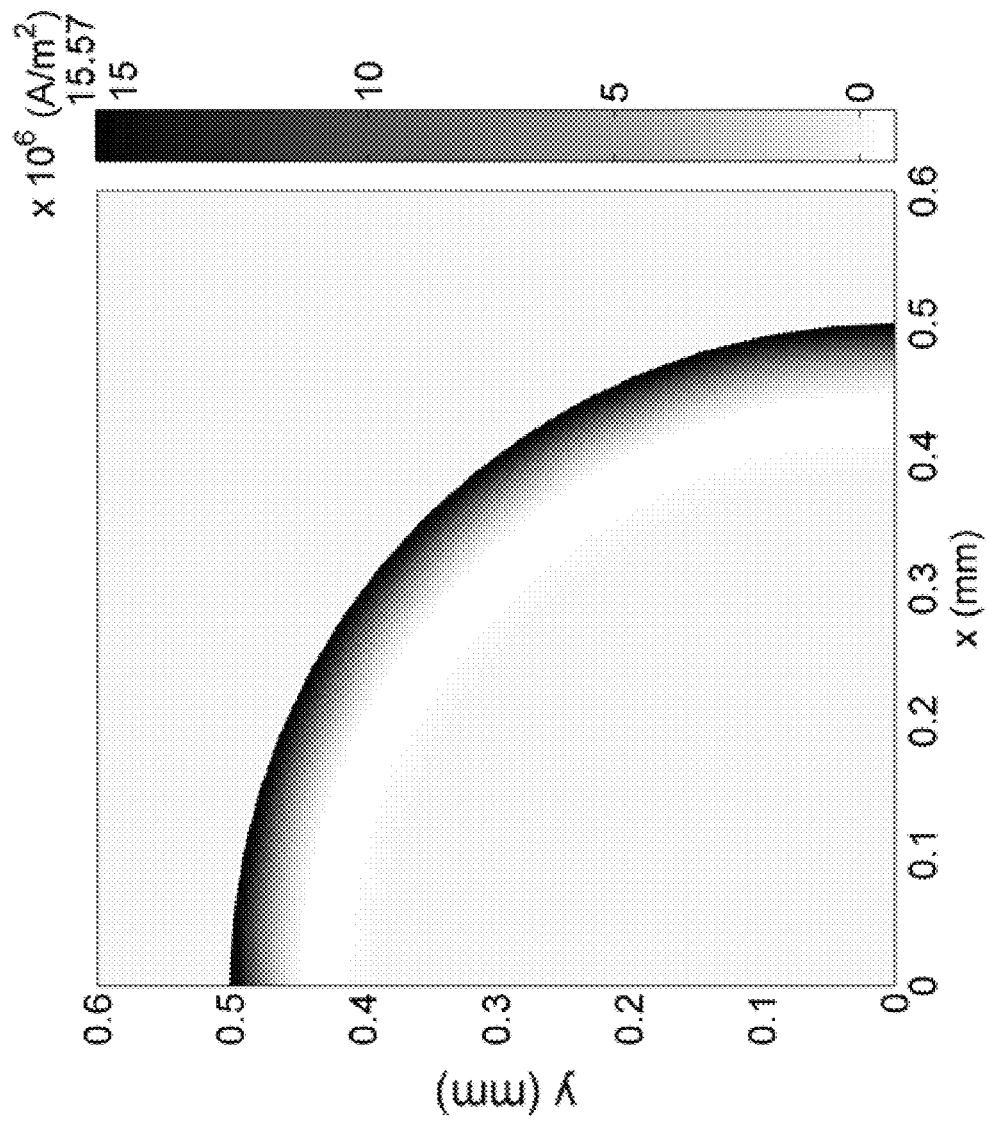
Figure 124:
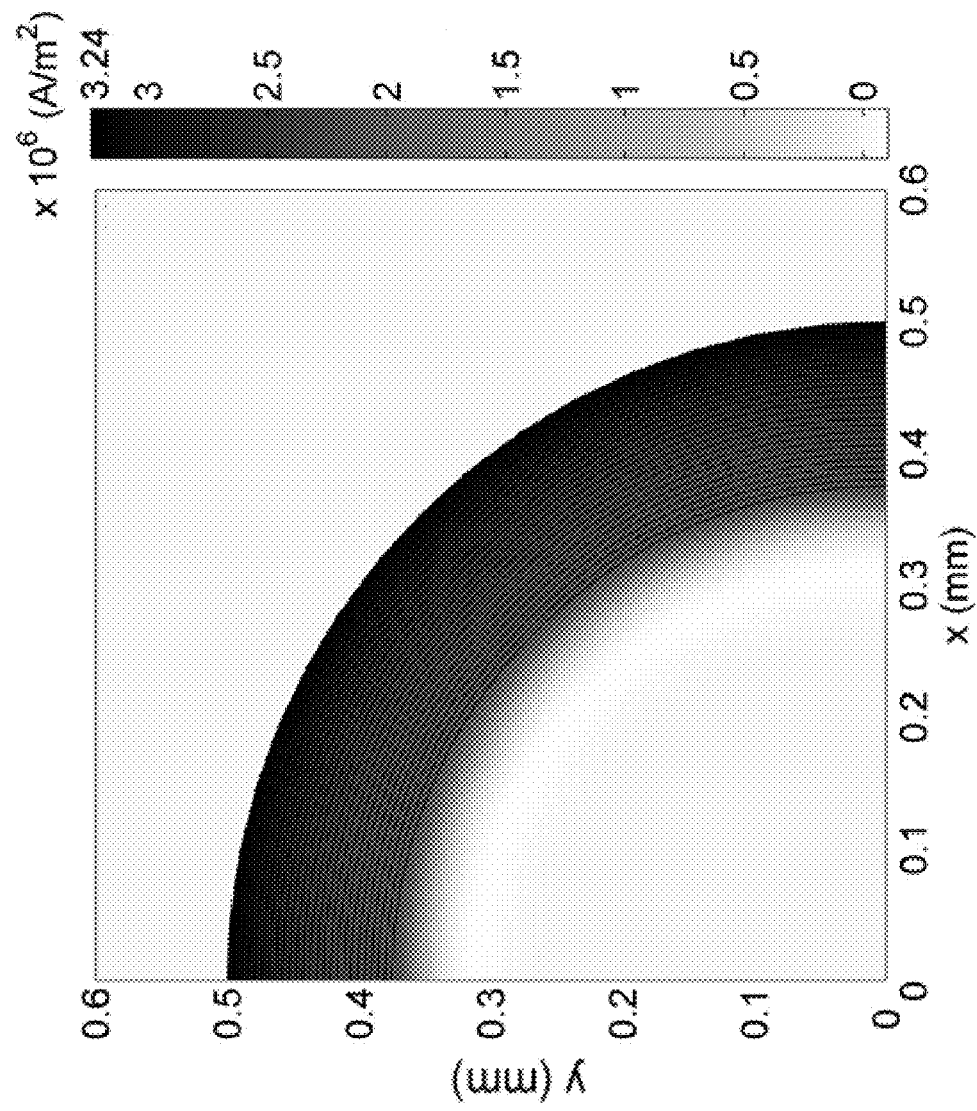

The benefits of the concentric shell design may be seen by comparing the current distributions in conductors of similar diameters but with different conductor arrangements. By way of example, calculations of the current distributions in two concentric shell conductor structures and one solid conductor are shown in FIGS. 123-125. The figures show one quarter of the cross section of the conductor with the conductor being symmetric around x=0, y=0 coordinate. The figures show the current density at 10 MHz for a copper conductor with an outside diameter (OD) of 1 mm and carrying a peak current of 1 A. Note that the darker shadings indicate higher current densities, as shown in the legend on the right hand side of the figure.

FIG. 123 shows the current distribution for a wire comprising a single, 1 mm diameter, solid core of copper. Note that the current is concentrated on the outer perimeter of the solid conductor, limiting the area over which the current is distributed, and yielding an effective resistance of 265.9 mΩ/m. This behavior is indicative of the known proximity effect.

FIG. 124 shows the current distribution for an embodiment where the 1 mm diameter wire comprises 24 mutually insulated 5.19 μm concentric conductive shells, around a solid innermost copper shell, totaling 25 conductive shell elements. Note that the optimal current density (i.e., the current distribution among the shells that minimizes the AC resistance, which may be found for any given structure using mathematical techniques familiar to those skilled in the art) in this structure is more uniformly distributed, increasing the cross section over which the current flows, and reducing the effective resistance of the wire to 55.2 mΩ/m. Note that this wire comprising concentric conducting shells has an AC resistance that is approximately five times lower than the similarly sized solid conducting wire.

FIG. 125 shows the current distribution for an embodiment where the 1 mm diameter wire comprises 25 conductive shells (including an innermost solid core) whose thicknesses are varied from shell to shell so as to minimize the overall resistance. Each shell is of a different thickness with thinner and thinner shells towards the outside of the wire. In this embodiment, the thickness of the shells ranged from 16.3 μm to 3.6 μm (except for the solid innermost shell). The inset in FIG. 125 shows the radial locations of the interfaces between the shells. The effective resistance of the wire comprising the varying thickness shells as shown in FIG. 125 is 51.6 mΩ/m. Note that the resistance of the conducting structures shown in FIGS. 123-125 was calculated analytically using methods described in A. Kurs, M. Kesler, and S. G. Johnson, Optimized design of a low-resistance electrical conductor for the multimegahertz range, Appl. Phys. Lett. 98, 172504 (2011), as well as U.S. Provisional Application Ser. No. 61/411,490, filed Nov. 9, 2010 the contents of each which are incorporated herein by reference in their entirety as if fully set forth herein. For simplicity, the insulating gap between the shells was taken to be negligibly small for each structure.

Note that while the embodiments modeled in FIGS. 124-125 comprised solid innermost conductor shells, most of the current flowing in that shell is confined to the outer layer of this innermost shell. In other embodiments, this solid innermost shell may be replaced by a hollow or insulator filled shell, a few skin-depths thick, without significantly increasing the AC resistance of the structure.

FIGS. 126-128 show plots that compare the ratio of the lowest AC resistance (as a function of the number of shells, N, and the operating frequency, f) achievable for a 1 mm OD wire comprising concentric conducting shells and a 1 mm OD solid core wire, of the same conducting material.

FIG. 126 shows that an optimized cylindrical shell conductor can significantly outperform a solid conductor of the same OD. One can also see from FIG. 126 that much of the relative improvement of an optimized concentric shell conductor over a solid conductor occurs for structures with only a small number of elements or shells. For example, a wire comprising 10 concentric conducting shells has an AC resistance that is three times lower than a similarly sized solid wire over the entire 2-20 MHz range. Equivalently, since the resistance of a solid conductor in the regime $\kappa D \gg 1$ ($\kappa$ being the inverse of the skin depth $\delta$ and D the diameter of the conductor) scales as $1/D$, the conductor comprising ten shells would have the same resistance per unit length as a solid conductor with a diameter that is 3.33 times greater (and roughly 10 times the cross area) than the wire comprising shells.

Increasing the number of shells to 20 and 30 further reduces the AC resistance to four times lower, and five times lower than the AC resistance for a similarly sized solid wire.

It should be noted that with the presented structures comprising multiple conductor shells it may be necessary to impedance match each shell to ensure an optimal current distribution. However due to the relatively small number of shell conductors for most applications (<40) a brute force approach of individually matching the impedance of each shell (e.g., with a lumped-element matching network) to achieve the optimal current distribution could be implemented (similar impedance matching considerations arise in multi-layer high-$T_c$ superconducting power cables (see H. Noji, Supercond. Sci. Technol. 10, 552 (1997). and S. Mukoyama, K. Miyoshi, H. Tsubouti, Y. Yoshida, M. Mimura, N. Uno, M. Ikeda, H. Ishii, S. Honjo, and Y. Iwata, IEEE Trans. Appl. Supercond. 9, 1269 (1999). the contents of which are incorporated in their entirety as if fully set forth herein), albeit at much lower frequencies).

In embodiments, concentric conducting shells of a wire may preferably be cylindrical or have circular cross-sections, however other shapes are contemplated and may provide for substantial improvement over solid conductors. Concentric conducting shells having an elliptical, rectangular, triangular, or other irregular shapes are within the scope of this invention. The practicality and usefulness of each cross-section shape may depend on the application, manufacturing costs, and the like.

In this section of the disclosure we may have referred to the structures comprising multiple shells of conductors as a wire. It is to be understood that the term wire should not be limited to mean any specific or final form factor of the structures. In embodiments the structures may comprise free standing conductors that may be used to replace traditional wires. In embodiments the structures comprising multiple shells may be fabricated or etched onto a multilayer printed circuit board or substrate. The structures may be etched, deposited on wafers, boards, and the like. In embodiments thin concentric shells can be fabricated by a variety of processes (such as electroplating, electro-deposition, vapor deposition, or processes utilized in optical fiber fabrication).

The conductor structures may be utilized in many resonator or coil structures used for wireless energy transfer. The multi-shell structures may be used as part of a resonator such as those shown in FIG. 98(*a*) or 98(*c*). The low loss conductors may be wrapped around a core of magnetic material to form low loss planar resonators. The low loss conductors may be etched or printed on a printed circuit board to form a printed coil and the like.

Wireless Energy Distribution System

Wireless energy may be distributed over an area using repeater resonators. In embodiments a whole area such as a floor, ceiling, wall, table top, surface, shelf, body, area, and the like may be wirelessly energized by positioning or tiling a series of repeater resonators and source resonators over the area. In some embodiments, a group of objects comprising resonators may share power amongst themselves, and power may be wireless transmitted to and/or through various objects in the group. In an exemplary embodiment, a number of vehicles may be parked in an area and only some of the vehicles may be positioned to receive wireless power directly from a source resonator. In such embodiments, certain vehicles may retransmit and/or repeat some of the wireless power to vehicles that are not parked in positions to receive wireless power directly from a source. In embodiments, power supplied by a vehicle charging source may use repeaters to transmit power into the vehicles to power devices such as cell phones, computers, displays, navigation devices, communication devices, and the like. In some embodiments, a vehicle parked over a wireless power source may vary the ratio of the amount of power it receives and the amount of power it retransmits or repeats to other nearby vehicles. In embodiments, wireless power may be transmitted from one source to device after device and so on, in a daisy chained fashion. In embodiments, certain devices may be able to self determine how much power that receive and how much they pass on. In embodiments, power distribution amongst various devices and/or repeaters may be controlled by a master node or a centralized controller.

Some repeater resonators may be positioned in proximity to one or more source resonators. The energy from the source may be transferred from the sources to the repeaters, and from those repeaters to other repeaters, and to other repeaters, and so on. Therefore energy may be wirelessly delivered to a relatively large area with the use of small sized sources being the only components that require physical or wired access to an external energy source.

In embodiments the energy distribution over an area using a plurality of repeater resonators and at least one source has many potential advantages including in ease of installation, configurability, control, efficiency, adaptability, cost, and the like. For example, using a plurality of repeater resonators allows easier installation since an area may be covered by the repeater resonators in small increments, without requiring connections or wiring between the repeaters or the source and repeaters. Likewise, a plurality of smaller repeater coils allows a greater flexibility of placement allowing the arrangement and coverage of an area with an irregular shape. Furthermore, the repeater resonators may be easily moved or repositioned to change the magnetic field distribution within an area. In some embodiments the repeaters and the sources may be tunable or adjustable allowing the repeater resonators to be tuned or detuned from the source resonators and allowing a dynamic reconfiguration of energy transfer or magnetic field distribution within the area covered by the repeaters without physically moving components of the system.

For example, in one embodiment, repeater resonators and wireless energy sources may be incorporated or integrated into flooring. In embodiments, resonator may be integrated into flooring or flooring products such as carpet tiles to provide wireless power to an area, room, specific location, multiple locations and the like. Repeater resonators, source resonators, or device resonators may be integrated into the flooring and distribute wireless power from one or more sources to one more devices on the floor via a series of repeater resonators that transfer the energy from the source over an area of the floor.

It is to be understood that the techniques, system design, and methods may be applied to many flooring types, shapes, and materials including carpet, ceramic tiles, wood boards, wood panels and the like. For each type of material those skilled in the art will recognize that different techniques may be used to integrate or attach the resonators to the flooring material. For example, for carpet tiles the resonators may be sown in or glued on the underside while for ceramic tiles integration of tiles may require a slurry type material, epoxy, plaster, and the like. In some embodiments the resonators may not be integrated into the flooring material but placed under the flooring or on the flooring. The resonators may, for example, come prepackaged in padding material that is placed under the flooring. In some embodiments a series or an array or pattern of resonators, which may include source, device, and repeater resonators, may be integrated in to a large piece of material or flooring which may be cut or trimmed to size. The larger material may be trimmed in between the individual resonators without disrupting or damaging the operation of the cut piece.

Returning now to the example of the wireless floor embodiment comprising individual carpet tiles, the individual flooring tiles may be wireless power enabled by integrating or inserting a magnetic resonator to the tile or under the tile. In embodiments resonator may comprise a loop or loops of a good conductor such as Litz wire and coupled to a capacitive element providing a specific resonant frequency which may be in the range of 10 KHz to 100 MHz. In embodiments the resonator may be a high-Q resonator with a quality factor greater than 100. Those skilled in the art will appreciate that the various designs, shaped, and methods for resonators such as planar resonators, capacitively loaded loop resonators, printed conductor loops, and the like described herein may be integrated or combined within a flooring tile or other flooring material.

Example embodiments of a wireless power enabled floor tile are depicted in FIG. 129(*a*) and FIG. 129(*b*). A floor tile 12902 may include loops of an electrical conductor 12904 that are wound within the perimeter of the tile. In embodiments the conductor 12904 of the resonator may be coupled to additional electric or electronic components 12906 such as capacitors, power and control circuitry, communication circuitry, and the like. In other embodiments the tile may include more than one resonator and more than one loop of conductors that may be arranged in an array or a deliberate pattern as described herein such as for example a series of multisized coils, a configurable size coil and the like.

In embodiments the coils and resonators integrated into the tiles may include magnetic material. Magnetic material may be used to construct planar resonator structures such those depicted in FIG. 98(*a*) or 98(*c*). In embodiments the magnetic material may also be used for shielding of the coil of the resonator from lossy objects that may be under or around the flooring. In some embodiments the structures may further include a layer or sheet of a good electrical conductor under the magnetic material to increase the shielding capability of the magnetic material as described herein.

Tiles with a resonator may have various functionalities and capabilities depending on the control circuitry, communication circuitry, sensing circuitry, and the like that is coupled to the coil or resonator structure. In embodiments of a wireless power enabled flooring the system may include multiple types of wireless enabled tiles with different capabilities. One type of floor tile may comprise only a magnetic resonator and function as a fixed tuned repeater resonator that wirelessly transfers power from one resonator to another resonator without any direct or wired power source or wired power drain.

Another type of floor tile may comprise a resonator coupled to control electronics that may dynamically change or adjust the resonant frequency of the resonator by, for example, adjusting the capacitance, inductance, and the like of the resonator. The tile may further include an in-band or out-of-band communication capability such that it can exchange information with other communication enabled tiles. The tile may be then able to adjust its operating parameters such as resonant frequency in response to the received signals from the communication channel.

Another type of floor tile may comprise a resonator coupled to integrated sensors that may include temperature sensors, pressure sensors, inductive sensors, magnetic sensors, and the like. Some or all the power captured by the resonator may be used to wirelessly power the sensors and the resonator may function as a device or partially as a repeater.

Yet another type of wireless power enabled floor tile may comprise a resonator with power and control circuitry that may include an amplifier and a wired power connection for driving the resonator and function like a wireless power source. The features, functions, capabilities of each of the tiles may be chosen to satisfy specific design constraints and may feature any number of different combinations of resonators, power and control circuitry, amplifiers, sensors, communication capabilities and the like.

A block diagram of the components comprising a resonator tile are shown in FIG. 130. In a tile, a resonator 13002 may be optionally coupled to power and control circuitry 13006 to receive power and power devices or optional sensors 13004. Additional optional communication circuitry 13008 may be connected to the power and control circuitry and control the parameters of the resonator based on received signals.

Tiles and resonators with different features and capabilities may be used to construct a wireless energy transfer systems with various features and capabilities. One embodiment of a system may include sources and only fixed tuned repeater resonator tiles. Another system may comprise a mixture of fixed and tunable resonator tiles with communication capability. To illustrate some of the differences in system capabilities that may be achieved with different types of floor tiles we will describe example embodiments of a wireless floor system.

The first example embodiment of the wireless floor system may include a source and only fixed tuned repeater resonator tiles. In this first embodiment a plurality of fixed tuned resonator tiles may be arranged on a floor to transfer power from a source to an area or location over or next to the tiles and deliver wireless power to devices that may be placed on top of the tiles, below the tiles, or next to the tiles. The repeater resonators may be fixed tuned to a fixed frequency that may be close to the frequency of the source. An arrangement of the first example embodiment is shown in FIG. 131. The tiles 13102 are arranged in an array with at least one source resonator that may be integrated into a tile 13110 or attached to a wall 13106 and wired 13112 to a power source. Some repeater tiles may be positioned next to the source resonator and arranged to transfer the power from the source to a desired location via one or more additional repeater resonators.

Energy may be transferred to other tiles and resonators that are further away from the source resonators using tiles with repeater resonators which may be used to deliver power to devices, integrated or connected to its own device resonator and device power and control electronics that are placed on top or near the tiles. For example, power from the source resonator 13106 may be transferred wirelessly from the source 13106 to an interior area or interior tile 13122 via multiple repeater resonators 13114, 13116, 13118, 13120 that are between the interior tile 13122 and the source 13106. The interior tile 13122 may than transfer the power to a device such as a resonator built into the base of a lamp 13108. Tiles with repeater resonators may be positioned to extend the wireless energy transfer to a whole area of the floor allowing a device on top of the floor to be freely moved within the area. For example additional repeater resonator tiles 13124, 13126, 13128 may be positioned around the lamp 13108 to create a defined area of power (tiles 13114, 13116, 13118, 13120, 13122, 13124, 13126, 13128) over which the lamp may be placed to receive energy from the source via the repeater tiles. The defined area over which power is distributed may be changed by adding more repeater tiles in proximity to at least one other repeater or source tile. The tiles may be movable and configurable by the user to change the power distribution as needed or as the room configuration changes. Except a few tiles with source resonators which may need wired source or energy, each tile may be completely wireless and may be configured or moved by the user or consumer to adjust the wireless power flooring system.

A second embodiment of the wireless floor system may include a source and one or more tunable repeater resonator tiles. In embodiments the resonators in each or some of the tiles may include control circuitry allowing dynamic or periodic adjustment of the operating parameters of the resonator. In embodiments the control circuitry may change the resonant frequency of the resonator by adjusting a variable capacitor or a changing a bank of capacitors.

To obtain maximum efficiency of power transfer or to obtain a specific distribution of power transfer in the system of multiple wireless power enabled tiles it may be necessary to adjust the operating point of each resonator and each resonator may be tuned to a different operating point. For example, in some situations or applications the required power distribution in an array of tiles may be required to be non-uniform, with higher power required on one end of the array and lower power on the opposite end of the array. Such a distribution may be obtained, for example, by slightly detuning the frequency of the resonators from the resonant frequency of the system to distribute the wireless energy where it is needed.

For example, consider the array of tiles depicted in FIG. 131 comprising 36 tunable repeater resonator tiles with a single source resonator 13106. If only one device that requires power is placed on the floor, such as the lamp 13108, it may be inefficient to distribute the energy across every tile when the energy is needed in only one section of the floor tile array. In embodiments the tuning of individual tiles may be used to change the energy transfer distribution in the array. In the example of the single lamp device 13108, the repeater tiles that are not in direct path from the source resonator 13106 to the tile closes to the device 13122 may be completely or partially detuned from the frequency of the source. Detuning of the unused repeaters reduces the interaction of the resonators with the oscillating magnetic fields changing the distribution of the magnetic fields in the floor area. With tunable repeater tiles, a second device may be placed within the array of tiles or the lamp device 13108 is moved from its current location 13122 to another tile, say 13130, the magnetic field distribution in the area of the tiles may be changed by retuning tiles that are in the path from the source 13106 to the new location 13130.

In embodiments, to help coordinate the distribution of power and tuning of the resonators the resonator may include a communication capability. Each resonator may be capable of wirelessly communicating with one or more of its neighboring tiles or any one of the tiles to establish an appropriate magnetic field distribution for a specific device arrangement.

In embodiments the tuning or adjustment of the operating point of the individual resonators to generate a desired magnetic field distribution over the area covered by the tiles may be performed in a centralized manner from one source or one "command tile". In such a configuration the central tile may gather the power requirements and the state of each resonator and each tile via wireless communication or in band communication of each tile and calculate the most appropriate operating point of each resonator for the desired power distribution or operating point of the system. The information may be communicated to each individual tile wirelessly by an additional wireless communication channel or by modulating the magnetic field used for power transfer. The power may be distributed or metered out using protocols similar to those used in communication systems. For example, there may be devices that get guaranteed power, while others get best effort power. Power may be distributed according to a greedy algorithm, or using a token system. Many protocols that have been adapted for sharing information network resources may be adapted for sharing wireless power resources.

In other embodiments the tuning or adjustment of the operating point of the individual resonators may be performed in a decentralized manner. Each tile may adjust the operating point of its resonator on its own based on the power requirements or state of the resonators of tiles in its near proximity.

In both centralized and decentralized arrangements any number of network based centralized and distributed routing protocols may be used. For example, each tile may be considered as a node in network and shortest path, quickest path, redundant path, and the like, algorithms may be used to determine the most appropriate tuning of resonators to achieve power delivery to one or more devices.

In embodiments various centralized and decentralized routing algorithms may be used to tune and detune resonators of a system to route power via repeater resonators around lossy objects. If an object comprising lossy material is placed on some of the tiles it may the tiles, it may unnecessarily draw power from the tiles or may disrupt energy transmission if the tiles are in the path between a source and the destination tile. In embodiments the repeater tiles may be selectively tuned to bypass lossy objects that may be on the tiles. Routing protocols may be used to tune the repeater resonators such that power is routed around lossy objects.

In embodiments the tiles may include sensors. The tiles may include sensors that may be power wirelessly from the magnetic energy captured by the resonator built into the tile to detect objects, energy capture devices, people 13134, and the like on the tiles. The tiles may include capacitive, inductive, temperature, strain, weight sensors, and the like. The information from the sensors may be used to calculate or determine the best or satisfactory magnetic field distribution to deliver power to devices and maybe used to detune appropriate resonators. In embodiments the tiles may comprise sensors to detect metal objects. In embodiments the presence of a lossy object may be detected by monitoring the parameters of the resonator. Lossy objects may affect the parameters of the resonator such as resonant frequency, inductance, and the like and may be used to detect the metal object.

In embodiments the wireless powered flooring system may have more than one source and source resonators that are part of the tiles, that are located on the wall or in furniture that couple to the resonators in the flooring. In embodiments with multiple sources and source resonators the location of the sources may be used to adjust or change the power distribution within in the flooring. For example, one side of a room may have devices which require more power and may require more sources closer to the devices. In embodiments the power distribution in the floor comprising multiple tiles may be adjusted by adjusting the output power (the magnitude of the magnetic field) of each source, the phase of each source (the relative phase of the oscillating magnetic field) of each source, and the like.

In embodiments the resonator tiles may be configured to transfer energy from more than one source via the repeater resonators to a device. Resonators may be tuned or detuned to route the energy from more than one source resonator to more than one device or tile.

In embodiments with multiple sources it may be desirable to ensure that the different sources and maybe different amplifiers driving the different sources are synchronized in frequency and/or phase. Sources that are operating at slightly different frequencies and/or phase may generate magnetic fields with dynamically changing amplitudes and spatial distributions (due to beating effects between the oscillating sources). In embodiments, multiple source resonators may be synchronized with a wired or wireless synchronization signal that may be generated by a source or external control unit. In some embodiments one source resonator may be designed as a master source resonator that dictates the frequency and phase to other resonators. A master resonator may operate at its nominal frequency while other source resonators detect the frequency and phase of the magnetic fields generated by the master source and synchronize their signals with that of the master.

In embodiments the wireless power from the floor tiles may be transferred to table surfaces, shelves, furniture and the like by integrating additional repeater resonators into the furniture and tables that may extend the range of the wireless energy transfer in the vertical direction from the floor. For example, in some embodiments of a wireless power enabled floor, the power delivered by the tiles may not be enough to directly charge a phone or an electronic device that may be placed on top of a table surface that may be two or three feet above the wireless power enabled tiles. The coupling between the small resonator of the electronic device on the surface of the table and the resonator of the tile may be improved by placing a large repeater resonator near the surface of the table such as on the underside of the table. The relatively large repeater resonator of the table may have good coupling with the resonator of the tiles and, due to close proximity, good coupling between the resonator of the electronic device on the surface of the table resulting in improved coupling and improved wireless power transfer between the resonator of the tile and the resonator of the device on the table.

As those skilled in the art will recognize the features and capabilities of the different embodiments described may be rearranged or combined into other configurations. A system may include any number of resonator types, source, devices, and may be deployed on floors, ceilings, walls, desks, and the like. The system described in terms of floor tiles may be deployed onto, for example, a wall and distribute wireless power on a wall or ceiling into which enabled devices may be attached or positioned to receive power and enable various applications and configurations. The system techniques may be applied to multiple resonators distributed across table tops, surfaces, shelves, bodies, vehicles, machines, clothing, furniture, and the like. Although the example embodiments described tiles or separate repeater resonators that may be arranged into different configurations based on the teachings of this disclosure it should be clear to those skilled in the art that multiple repeater or source resonator may not be attached or positioned on separate physical tiles or sheets. Multiple repeater resonators, sources, devices, and their associated power and control circuitry may be attached, printed, etched, to one tile, sheet, substrate, and the like. For example, as depicted in FIG. 132, an array of repeater resonators 13204 may be printed, attached, or embedded onto one single sheet 13202. The single sheet 13202 may be deployed similarly as the tiles described above. The sheet of resonators may be placed near, on, or below a source resonator to distribute the wireless energy through the sheet or parts of the sheet. The sheet of resonators may be used as a configurable sized repeater resonator in that the sheet may be cut or trimmed between the different resonators such as for example along line 13206 shown in FIG. 132.

In embodiments a sheet of repeater resonators may be used in a desktop environment. Sheet of repeater resonators may be cut to size to fit the top of a desk or part of the desk, to fit inside drawers, and the like. A source resonator may be positioned next to or on top of the sheet of repeater resonators and devices such as computers, computer peripherals, portable electronics, phones, and the like may be charged or powered via the repeaters.

In embodiments resonators embedded in floor tiles or carpets can be used to capture energy for radiant floor heating. The resonators of each tile may be directly connected to a highly resistive heating element via unrectified AC, and with a local thermal sensor to maintain certain floor temperature. Each tile may be able to dissipate a few watts of power in the thermal element to heat a room or to maintain the tiles at a specific temperature.

Medical and Surgical Applications

Wireless power transfer may be used in hospital and operating room environments. A large number of electric and electronic equipment is used in hospitals and operating rooms to monitor patients, administer medications, perform medical procedures, maintain administrative and medical records, and the like. The electric and electronic equipment is often moved, repositioned, moved with a patient, or attached to a patient. The frequent movement may result in problems related to power delivery to the devices. Equipment and electronic devices that are often moved and repositioned may create a power cable hazards and management problem due to cables that become tangled, strained, unplugged, that become a tripping hazard, and the like. Devices with a battery backup that are capable of operating for a period of time without a direct electrical connection require frequent recharging or plugging and unplugging from electrical outlets every time a device is used or repositioned. Wireless power transfer may be used to eliminate the problems and hazards of traditional wired connection in hospital and operating room environments.

Wireless power transfer may be used to power surgical robots, equipment, sensors, and the like. Many medical procedures and surgical operations utilize robots or robotic equipment to perform or aid in medical procedures or operations. Wireless power transfer may be used to transfer power to the robotic equipment, to parts of the equipment, or to instruments or tools manipulated by the equipment which may reduce the potentially hazardous and troublesome wiring of the systems.

One example configuration of a surgical robot utilizing wireless power transfer is shown in FIG. 133. The figure depicts a surgical robot 13306 and an operating bed 13304. The surgical robot may be powered wirelessly from a wireless source embedded in the bed, floor, or other structure. The wireless energy transfer may allow the robot to be repositioned without changing the position of power cables. In some embodiments the surgical robot may receive power wirelessly for operation or charging its battery or energy storage system. The received power may be distributed to systems or parts such as motors, controllers, and the like via conventional wired methods. The surgical robot may have a device resonator in its base 13316, neck 13302, main structure 13308, and the like for capturing oscillating magnetic energy generated by a source. In some embodiments the robot may be wirelessly powered from a source 13314 that is integrated, attached, or next to the operating bed.

In some embodiments the source resonator or the device resonator may be mounted on an articulating arm, or a moving or configurable extension as depicted in FIG. 134. The arm or moving extension 13402 may be configured to respond to positional changes of the robot, power demands, or efficiency of the wireless power transfer to reposition the source or the device to ensure that adequate levels of power are delivered to the robot. In some embodiments the movable source or device may be moved manually by an operator or may be automatic or computerized and configured to align or to maintain a specific separation range or orientation between the source and the device.

In embodiments the movable arm or extension may be used in situations or configurations where there may be a positional offset, mismatch, later offset, or height offset between the source and the device. In embodiments the movable arm that houses or is used to position the source or device resonator may be computer controlled and may autonomously position itself to obtain the best power transfer efficiency. The arm, for example, may move in all direction scanning the most efficient configuration or position and may use learning or other algorithms to fine tune its position and alignment. In embodiments the controller may use any number of measurements from the sensor to try to align or seek the best or most efficient position including, but limited to, impedance, power, efficiency, voltage, current, quality factor, coupling rate, coupling coefficient measurements, and the like.

In other embodiments the surgical robot may use wireless power transfer to power motors, sensors, tools, circuits, devices, or systems of the robot, that are manipulated by the robot, or that are integrated into the robot. For example, many surgical robots may have complex appendages that have multiple degrees of freedom of movement. It may be difficult to provide power along or through the various joints or moving parts of the appendages due to bulkiness, inflexibility, or unreliability of wires.

Likewise, powering of the various tools or instruments necessary for a procedure may pose reliability and safety problems with power connections and connectors in the presence of body fluids. A surgical robot may utilize one or more source resonator 13302 and one or more device resonators 13310, 13312 located in the appendages or tools to power motors, electronics, or devices to allow movement of the appendages or powering of tools, cameras, and the like that the robot manipulates which may be inside, or outside of a patient. The power may be transferred wirelessly without any wires regardless of the articulation or rotation of the appendages and may increase the degrees or articulation capability of the appendages. In some embodiments the sources may be integrated into the robot and powered by the robot that may receive its own power wirelessly or from a wired connection. In some embodiments the source powering the appendages and the tools may be mounted on the operating bed, under the bed, or next to the patient.

As those skilled in the art will appreciate, the systems described and shown in the figures are specific exemplary embodiments and systems may utilize any one of many different robot devices of various shapes and capabilities, tools, and the like. Likewise the source may be mounted on any number of objects of various dimensions depending on the application and use of the robot. The source may be mounted on the operating room bed or pedestal as shown in the FIG. 133. In other embodiments a source may be mounted in the floor, walls, ceilings, other devices, and the like.

Wireless power transfer may be used to power or recharge movable equipment such as an IV or drug delivery racks or computer stands. Such stands or racks are often repositioned temporarily or moved from one location to another with a patient. The electronic devices attached to these racks often have battery backup allowing them to operate for a period of time without a direct electrical connection such that they can be moved or repositioned and maintain their functionality. However, every time a traditional rack is moved or repositioned it needs to be unplugged and plugged back into an outlet for recharging or powering and the cable must be wound or untangled from other cables.

The problems with traditional movable wired drug delivery, patient monitoring, or computer racks may be overcome by integrating a wireless power transfer system to the devices. For example, sample embodiments of a drug delivery rack and a computer rack are depicted in FIG. 135(a) and FIG. 135(b). Device resonators 13508, 13506 and power and control circuitry may be integrated or attached to the base or the body of the rack or the supporting structure allowing wireless power transfer from a source resonator mounted into the floor, wall, charging station, or other objects. To be charged or powered the rack 13502 or stand 13514 may be positioned in the proximity of the source, within a meter distance of the source, or within a foot separation of the source. The wireless power transfer enabled rack and the electrical equipment does not require plugging or unplugging or cable management. The wireless power transfer enabled rack or electrical equipment may be powered by positioning the rack or electrical equipment in a specific area of a room or in proximity to the source that may be integrated into the floor, carpet, walls, baseboard, other equipment and the like. In this configuration, for example, a device or rack that may is only used for short period of time to measure or diagnose a patient may be moved from the charging location and brought anywhere close to the patient to take a measurement and moved back into the charging location without requiring precise positioning or plugging or unplugging of the equipment.

In some embodiments the device capturing wireless energy may require additional electric and electronic components in addition to a resonator. As described herein, additional AC to DC converters, AC to AC converters, matching networks, active components may be necessary to condition, control, and convert the voltages and currents from the resonator to voltages and currents that may be usable by the device to be powered. In some devices and embodiments, the voltages and currents of the resonator may be used directly without an additional conditioning or conversion step. Surgical tools such as cauterizers, electric scalpels, and the like use oscillating high voltages to effectively cut, stimulate, or cauterize tissue. The oscillating voltages on the device resonator may be directly used to power such devices reducing their size, cost, and complexity.

For example, in some embodiments a surgical tools such as a cauterizer 13604 may be fitted with a device resonator 13606 capable of capturing magnetic energy from one or more source resonators 13602 as depicted in FIG. 136. Depending on the inductance, quality factor, resistance, relative distance to the source resonators, power output of the source resonators, frequency, and the like the parameters of the voltages and currents on the device resonator may be enough to directly cauterize or cut tissue. Voltages of 30 or more volts with frequencies of 1 KHz to over 5 MHz may be generated on the device resonator 13606 and may be used directly as the output 13612 of the surgical tool 13614. In some embodiments monitoring circuitry, such as voltage or current sensing circuitry 13610 may integrated into the device resonator along with a wireless communication capability to relay the measured values to a source. The source may monitor the received current and voltage values and adjust its operating parameters to maintain a specific voltage, frequency, or current at the device or to adjust the current or voltage is response to the operator input.

Wireless Power Transfer for Implantable Devices

In embodiments, wireless power transfer may be used to deliver power to electronic, mechanical, and the like devices that may be implanted in a person or animal. Implantable devices such as mechanical circulatory support (MCS) devices, ventricular assist devices (VAD), implantable cardioverter defibrillators (ICD), and the like may require an external energy source for operation for extended periods of time. In some patients and situations the implanted device requires constant or near constant operation and has considerable power demands that require connection to an external power source requiring percutaneous cables or cables that go through the skin of the patient to an external power source increasing the possibility of infection and decreasing patient comfort.

Some implanted devices may require 1 watt of power or more or 10 watts of power or more for periodic or continuous operation making a self-contained system that operates only from the battery energy implanted in a patient impractical as the battery would require frequent replacement or replacement after the implanted device is activated.

In embodiments, wireless power transfer described herein may be used to deliver power to the implanted device without requiring through the skin wiring. In embodiments wireless power transfer may be used to periodically or continuously power or recharge an implanted rechargeable battery, super capacitor, or other energy storage component.

For example, as depicted in FIG. 137(a), an implanted device 13708 requiring electrical energy may be wired 13706 to a high-Q device resonator 13704 implanted in the patient 13702 or animal. The device resonator may be configured to wirelessly receive energy from one or more external high-Q resonators 13712 via oscillating magnetic fields. In embodiments additional battery or energy storage components may be implanted in the patient and coupled to the device resonator and the implanted device. The internal battery may be recharged using the captured energy from the device resonator allowing the implanted device to operate for some time, even when wireless power is not transferred or is temporarily interrupted to the patient. The block components comprising an embodiment of a wireless power system are depicted in FIG. 137(b). A device resonator 13704 implanted inside a patient and coupled to power and control circuitry (not shown) that controls and tunes the operation of the resonator may be coupled to a rechargeable battery or other energy storage element 13710 that is also implanted in the patient. The energy captured by the device resonator may be used to charge the battery or power the implanted device 13708 directly using the captured energy that is generated by an external resonator 13712.

The wireless energy transfer system based on the high-Q resonator sources and devices described herein may tolerate larger separation distance and larger lateral offsets than traditional induction based systems. A device resonator implanted in a patient may be energized through multiple sides and angles of the patient. For example, a device resonator implanted in the abdomen of a patient may be energized with a source from the back of the patient. The same device resonator may also be energized from a source positioned in the front abdomen side of the patient providing for a more flexible positioning and orientation configuration options for the source.

In embodiments the resonator and the battery may be integrated with the implanted device into one substantially continuous unit. In other embodiments the device resonator and the battery may be separate from the implanted device and may be electrically wired to the device. The resonator may be implanted in a different part of the body than the device, a part of the body that may be more accessible for an external source resonator, less obtrusive to the patient, and the like. In embodiments the device resonator may be implanted in or close to the buttock of the patient, or the lower back of the patient, and the like. In embodiments the size of the resonator and placement may depend on the amount of power required by the implanted device, distance of wireless power transfer, frequency of power delivery or recharging, and the like. In some embodiments, for example, it may be preferable to use a device resonator that is smaller than 7 cm by 7 cm such that it may be easier to implant in a person while capable of delivering 5 watts or more or power at a separation of at least 2 cm.

In embodiments the implanted device resonators may comprise a round or rectangular planar capacitively loaded conductor loop comprising five loops of a Litz conductor coupled to a capacitor network as described herein. In embodiments it may be preferable to enclose the implanted device resonator in an enclosure comprising mostly nonmetallic materials to minimize losses, or an enclosure which has at last one side that comprises non-metallic material.

In embodiments, an implanted medical device may comprise an inductive element comprised of any number of turns of Litz wire, magnetic wire, standard wire, conducting ribbon such as a trace on a printed circuit board, and the like. In embodiments, implanted medical devices may comprise magnetic materials, ferrites, and the like and may be optimized for specific frequencies or frequency ranges such as 13.56 MHz or 100 or more kHz.

In embodiments, a patient may have more than one implanted device that is wirelessly powered or recharged. In embodiments, multiple devices may be powered or charged by a single source or by multiple sources. In embodiments, multiple devices may operate at the same resonant frequency or at different resonant frequencies. Either the source, repeater or device resonators may tune their frequency to receive or share power.

In embodiments, the magnetic resonators may comprise means for communication with other magnetic resonators. Such communication may be used to coordinate operation of wirelessly powered medical devices with other wireless systems. In an exemplary environment, an implanted device resonator may adjust its operating parameters in the vicinity of a high-power source of another wireless power system. In an embodiment, a medical device source may communicate with another wireless power source in a region and communicate with a patient to avoid or exercise caution in such a region.

Embodiments comprising high-Q device resonators and optionally high-Q source resonators allow for more efficient wireless power transfer and can tolerate larger separation distances and lateral offsets of the source and device resonators than traditional induction based systems. The high efficiency of the wireless power transfer systems described herein reduces heating and heat buildup in resonators which may be of critical importance for resonators implanted in a patient. The described resonators may transfer 5 watts or more or power while without significant heating of the elements such that the temperature of the components does not exceed 50 C.

Tolerance to separation distance and lateral offset between an external source resonator and an implanted device resonator allows greater freedom of placement of the source resonator. The use of wireless power transfer systems as described herein may also provide greater safety to the patient since movements or displacements of the source resonator will not disrupt the power transfer to the implanted device.

In embodiments power may be transferred to the implanted device resonator from a source resonator that is worn by the patient in a backpack, hip pack, article of clothing and the like. For example, as depicted in FIG. 138(*a*), source resonators 13804 may be embedded in clothing and worn by a person 13802, the source resonators 13804 may be wired to power and control circuitry and a battery (not shown) to deliver the power to the implanted device resonator (not shown). In other embodiments the source resonators and power source may be contained in a backpack, or a bag as depicted in FIGS. 138(*b*), 138(*c*), and 138(*d*). A backpack 13806 or other bag 13812 may be integrated with a source resonator 13808, 13814 in a location such that when worn by the patient the source resonator will be in substantial alignment with the implanted device resonator in the patient. For example, for a device resonator implanted in the buttock or lower back, a backpack with a source resonator integrated into the lower back portion provides for substantial alignment of the source and device resonators when the backpack is worn by the patient as shown in FIG. 138(*d*). In embodiments the backpack or bag may further comprise additional device resonators 13810 for wireless charging of the internal energy storage or battery that is inside the bag. The backpack may be placed near an external source resonator or charging station and charged wirelessly. In some embodiments the source and device resonators of the backpack or bag may be the same physical resonator that alternates function between a source and a device depending on the use.

In embodiments external source resonator may be integrated into furniture such as chairs, beds, couches, car seats, and the like. Due to the tolerance to misalignment of the high-Q wireless power transfer system described herein, device resonators may be integrated into the furniture in areas of relative proximity to the implanted device resonators (i.e. within 25 cm) and transfer power to the implanted device resonator and implanted device while a patient is working at a desk and sitting in a chair, sitting in couch, driving, sleeping, and the like.

In embodiments the wireless power transfer system for implantable devices may include repeater resonators. Repeater resonators may be used to improve the energy transfer between the source and device resonators and may be used to increase the overall coupling and power transfer efficiency. As described herein a repeater resonator positioned in proximity to a device resonator may increase the wireless power transfer efficiency to the device resonator from a distal source resonator.

In embodiments the repeater resonators are positioned to improve the energy transfer between the source and the device. The position of the repeater resonators that provides the highest improvement in efficiency or coupling may depend on the application, size of the resonators, distance, orientation of resonators, location of lossy objects and the like. In some embodiments an improvement in wireless energy transfer efficiency may be obtained by positioning the repeater resonators in between the source and device resonators. In other embodiments it may be beneficial to position the repeater resonators angled or further away from the source than the device. The exact placement of repeater resonators may be determined experimentally with trial or error, with simulation, or calculations for specific configurations, power demands, implanted devices and the like.

In embodiments of a system, repeater resonators may be positioned or located internal to the patient, or they may be located external to the patient, or a system may have both internal and external resonators. A repeater resonator may be internal or implanted into a patient. A repeater resonator may be implanted under the skin of a patient to improve the coupling to a device resonator. Since a repeater resonator does not need to be connected to a device it may be easier to position or implant a larger repeater resonator than a device resonator that is connected to an implanted medical device. The device resonator may have to be implanted deeper inside a patient due to distance limitations or size limitations between the resonator and the medical device. The repeater resonators may comprise loops of a conductor like Litz wire connected to a network of capacitors. The repeater resonator may be encased in flexible material or packaging such as silicon, or other implantable plastics. The whole structure may be implanted inside the body under the skin to provide fine tuning of the wireless energy transfer between the external source and the implanted device.

In embodiments repeater resonators may be positioned outside, external to a patient into articles of clothing, packs, furniture and the like. For example, larger repeater resonators with a diameter of 20 cm or more may be integrated into an article of clothing such as a vest, robe, and the like or an attachable pad and worn by the patient such that the repeater resonator overlaps or is in close proximity of the implanted device resonator. The repeater resonator may be completely passive or it may have additional circuitry for power and control. Locating the repeater resonator in close proximity of the implanted device resonator effectively increases the size of the implanted resonator to a size that is substantially or close to the size of the repeater resonator and may allow more efficient wireless power transfer to the implanted device resonator and device over a larger distance. The repeater resonator may be much larger than the resonator that is practical for implant in a person.

In embodiments multiple repeater resonators, internal or external to the patient, may be arranged in an array or a pattern around the body to allow wireless energy transfer from a source to an implanted device over a large range of offsets. Each repeater resonator may be specifically tuned or configured to provide adequate coupling to an implanted device resonator based on its relative location from the device resonator.

In embodiments a room, a bathroom, a vehicle, and the like may be fitted with large source resonators to transfer sufficient power to the patient via the repeater resonator allowing continuous power transfer and restrictions on mobility while showering, sleeping, cooking, working, and the like.

In embodiments the repeater resonator may include wireless power converter functionality for translating wireless energy with incompatible parameters to oscillating magnetic fields with parameters compatible with the implanted device resonator. A wireless power converter resonator integrated into a vest, bag, and the like may be worn by the patient and capture wireless power from a variety of sources and transfer the captured wireless power to the implanted device resonator with parameters compatible with the implanted device resonator. In embodiments the wireless power converter may be configured to capture wireless power from solar energy, an RF source, movement, motion, and the like. In embodiments the repeater resonator may act as a power converter that limits the power delivered to the implanted device resonator preventing too much power from being delivered to the patient.

In embodiments, a repeater resonator or wireless power converter may have auditory visual or vibrational alerts when it no longer receives power. A repeater resonator may detect when it is not coupled to the implanted device or may detect that it is not receiving enough power from an external source and may be configured to alert the patient.

In embodiments a fully integrated external source resonator, may be encased in a waterproof enclosure, including a rechargeable battery, RF amplifier, and a source resonator. The integrated source and circuitry may be of a form factor that may be attached with a belt or a strap allowing the patient to go swimming or take a shower with the integrated source intact. The integrated source and circuitry may also have an internal battery charging circuit & rectifier, so it can be wirelessly charged by switching the resonator and electronics to capture mode.

In embodiments of the system, the device and source and repeater resonators may include a tuning capability to control heat dissipation in implanted resonators. During wireless energy transfer electric currents and voltages induced in the device resonator by the magnetic fields of the source resonator may cause heating of the resonator elements due to ohmic losses, internal losses, and the like. An implanted resonator may have restrictions on the amount of heat it can safely dissipate before raising the temperature of the surrounding tissue to an undesirable level. The amount of power that may be safely dissipated may depends on the size of the resonator, location of the resonator and the like. In some systems one or more watts of power may be safely dissipated in a patient.

A source or repeater resonator, which is external to a patient, may be designed to tolerate higher levels of heat dissipation. The external source or repeater resonator may have higher limits of safe power dissipation or heating. A source or repeater resonator that is external to a patient may be designed to safely dissipate 5 watts of more of heat and may include active cooling means such as fans, or water cooling and may be able to safely dissipate 15 watts or more of power. In embodiments a wireless energy transfer system may control the amount of heat dissipated in the device resonator. Since a source or repeater resonator may be able to tolerate more heat dissipation than a device resonator, a wireless energy transfer system may be tuned to reduce the heat dissipation at the device resonator. A system tuned to reduce heat dissipation at the device may have higher overall heat dissipation with the increased heat dissipation occurring in the source or repeater resonator.

The heat dissipation in a device resonator may be controlled by reducing the electric currents oscillating in the implanted device resonator. The currents in the device resonator may be controlled by tuning the resonant frequency of the resonator. The currents in the device resonator may be controlled by tuning the impedance of the resonator.

In embodiments the device resonator may comprise one or more temperature sensors along with monitoring circuitry and control logic. Upon the detection of a temperature threshold the monitoring and control circuitry may detune the resonant frequency away from the resonant frequency of the source or repeater resonator. The monitoring and control circuitry may detune the resonant frequency above the resonant frequency of the source or repeater resonator. The monitoring and control circuitry may detune the resonant frequency below the resonant frequency of the source or repeater resonator. The device may be detuned incrementally until the temperature of the device resonator stabilizes. In embodiments the frequency may be detuned by 1% or more or in increments of 1 kHz or more.

As those skilled in the art will appreciate, the resonant frequency may be changed with a variable component in the device resonator such as a variable capacitor, inductor, a bank of capacitors, and the like.

In embodiments the detuning of the resonant frequency of the device resonator may decrease the efficiency of energy transfer between the source or repeater and device. To maintain the same level of power delivered to the device the source may be required to increase the power output to compensate for the reduction in efficiency. In embodiments the device resonator may signal the source resonator of a temperature condition that may require an adjustment of its resonant frequency and also the power output of the source resonator.

Similarly to controlling the resonant frequency, the effective impedance of the device resonator which may affect the currents and voltages in the resonator may be controlled by adjusting components of the resonator such as inductance and the capacitance. In embodiments the impedance may be tuned by changing the power requirements of the device, or by controlling the switching frequency, phase, and the like of the rectifier or the switching dc to dc converter of the device.

A device resonator may continuously monitor the temperature of the components and monitor and trends of the temperatures and adjust the frequency and values of components to stabilize the temperature.

In embodiments the wireless energy transfer system may be tuned to reduce the heat dissipation in device resonators and distribute the heat dissipation to repeater resonators. Implanted repeater resonators may be larger than the device resonators and may be able to dissipate more heat than a smaller device resonator. Likewise a repeater resonator may be implanted closer to the skin of a patient thus allowing the repeater resonator to be cooled through the skin with external cooling packs or pads worn by the patient.

Wireless Energy Transfer and Vehicle Safety Systems

Wireless power transfer may be used for powering, charging, or delivering electrical energy to a vehicle. Power may be delivered to a vehicle from one or more source resonators generating magnetic fields outside of a vehicle to one or more device resonators on, under, alongside, attached to, and the like, a vehicle, for charging a vehicle battery or for charging or powering electronic systems and devices in or on a vehicle.

Referring now to FIG. 139, a charging source resonator 13901 is integrated with a garage floor 13907 so as to provide wireless charging to an automobile 13902. In one embodiment, source resonator 13901 is embedded in floor 13907. In a second embodiment, resonator 13901 is fixed on top of floor 13907, such as by a plate bolted to floor 13907. In a third embodiment, resonator 13901 is implemented as a mat laid on top of floor 13907. Resonator 13901 is part of a wireless vehicle charging system, the other components of which are not explicitly illustrated here. For clarity in this disclosure, other components of the wireless charging system can be considered to be represented by resonator 13901, even though such other components may actually be located remotely from resonator 13901. A vehicle resonator 13911 (sometimes referred to as a device, capture, drain or sink resonator) attached to automobile 13902 captures the energy transferred via oscillating magnetic fields from source resonator 13901. In one embodiment, device resonator 13911 is attached to the underside of automobile 13902 toward its midsection; in variations resonator 13911 is located substantially toward the front or rear of automobile 13902. In still other embodiments, resonator 13911 is integrated into part of the structure, body or panels of automobile 13902. As a specific example, resonator 13911 may be shaped to fit into a vehicle's bumper section, allowing almost invisible design while being positioned within reasonably close proximity to either a wall- or floor-mounted source resonator 13901. It should also be noted that where terms such as "charging" or "charger" are used herein they should be construed broadly to include generalized power transfer, as opposed to just battery charging.

In practice, it is found that in certain instances, extraneous objects (e.g., object 13910) disposed between source resonator 13901 and a corresponding vehicle resonator 13911 can alter the operating characteristics of a vehicle charging system. Depending on the nature of object 13910 and its location, object 13910 can absorb some of the energy being transferred by the system, resulting in heating of the object 13910 and its surroundings.

For systems capable of wirelessly recharging vehicles such as automobiles, the absorbed energy in object 13910 can cause it and the surrounding area to become too hot to touch. For example, if automobile 13902 leaves the charging area after hours of recharging, someone picking up object 13910 could find it too hot to touch. Likewise, even if the object is moved, a person or animal standing on the heated area could be affected.

Accordingly, in one embodiment a sensor 13903 detects thermal conditions significant enough to result in a safety concern. As shown in FIG. 139, sensor 13903 is mounted on wall 13906 in front of the automobile. In various implementations for such wall-mounted configurations, a conventional thermal sensor 13903 such as an infrared camera or solid-state sensor is aimed from wall 13906 to the area around resonator 13901 and detects high temperatures anywhere in that area. In other implementations, a conventional heat sensor such as a thermistor-based sensor is integrated directly in resonator 13901. In alternate implementations, an array of such sensors is used to provide coverage for a larger area of interest. In some embodiments, one or more thermal sensors 13912 comprising IR cameras, temperature gauges, and the like are positioned around source resonator 13901, integrated into source resonator 13901, integrated into device resonator 13911, or attached to automobile 13902. In some applications mounting sensors 13912 on the underside of automobile 13902 may be preferable, as that location typically provides a clear view of the source resonator 13901 below.

Some inexpensive implementations of sensor 13903 such as unfocused infrared detectors may read vastly differently if their field of view includes areas that are being warmed due to other reasons, for instance sun beating down on floor 13907 or engine/exhaust system heat. To allow continued use of very inexpensive devices for sensor 13903, in such situations additional sensors are used to provide a level of calibration. In one embodiment, a sensor (not shown) is located above the automobile, for instance in the location of annunciator 13904, and is aimed to obtain a reference ambient temperature not indicative of a resonator-related heat issue. The difference in temperatures is then used to determine whether there is an over-temperature situation related to charging of automobile 13902. In other embodiments a light indicator rather than a heat indicator is used to determine whether sunlight falling on floor 13907 is resulting in higher than expected temperature indications from sensor 13903.

In some embodiments it may be possible to determine the source of a temperature increase by turning on and off the power transfer and examining temperature readings to see whether they correlate or follow the modulation of power transfer. For example, if the safety system suspects (e.g., due to a high sensor reading) there might be an object that is being heated due to the wireless power transfer, the safety system may temporaly modulate the level of wireless power transfer in a prescribed or random temporal fashion. If heating or a temperature increase detected by a sensor follows the modulation of the power source there may be a high likelyhood that the wireless power transfer is causing a heating effect of a foreign object.

In some embodiments, sensor(s) 13912 calibrate the area around resonator 13901 once a vehicle has parked but before charging is initiated. This calibration procedure provides a baseline value for subsequent sensing so that temperature changes attributable to charging are more easily identified for mitigation or notification, as detailed herein.

Depending on the nature of the safety concern, an appropriate response to a high temperature condition may vary. If a charging system is known to be prone to overheating only in one particular location (a known hot spot), it may be most appropriate to actively cool that location if heat above an acceptable threshold is detected. If the safety risk is one of only discomfort or minor injury, a warning to those nearby may be most appropriate. In certain embodiments, upon determining an unacceptable amount of heating the charging power level is reduced so that the vehicle is still charged, albeit at a slower rate. In such a situation, it may be appropriate for the system to notify the vehicle owner with an indicator (e.g., via a wireless communication protocol, email message, text message, cell phone message) of this reduced charging rate. The vehicle owner can then decide whether to return to the vehicle to clear the object 110 causing the reduction in charge rate.

Accordingly, in one embodiment an annunciator 13904 is operatively coupled to the sensor(s) 13903, 13912 such that it activates upon sensor(s) 13903, 13912 detecting high temperatures. In one embodiment, annunciator 13904 provides an auditory warning, such as a synthesized voice cautioning those nearby to be careful of high temperatures underneath the automobile. Alternatively, simpler notifications such as chirps, beeps and the like are used to warn those nearby. If more information should be conveyed, a sign near the annunciator is provided to explain that when it is activated, there are high temperatures in the area. In various environments, indicators other than such an annunciator 13904 are more appropriate.

In some environments, the likelihood of high temperatures in the vicinity of resonator 13911 causing a safety issue may be minimal when automobile 13902 is still present, but increase markedly once automobile 13902 departs, thereby leaving an open space into which pedestrians, or for instance a dog on a leash, might venture. In such environments, sensor(s) 13903, 13912 include an integrated proximity sensor that determines the presence or absence of automobile 13902, and only activates annunciator 13904 when both (i) a high temperature situation is detected and (ii) automobile 13902 is no longer present.

As described above, annunciator 13904 provides an aural warning. In other embodiments, visual warnings are provided. In simple implementations, the visual warnings are via solid or blinking lights, e.g., LED devices. In more complex implementations, electronic signs including text messages are provided. Depending on the environment and extent of the concern, pulsating, blinking or strobed lighting effects are used to provide the appropriate amount of attention to the risk. In some embodiments, a message is sent to the owner or other specified user via phone, text, tweet, email instant message or the like.

Figure 142:
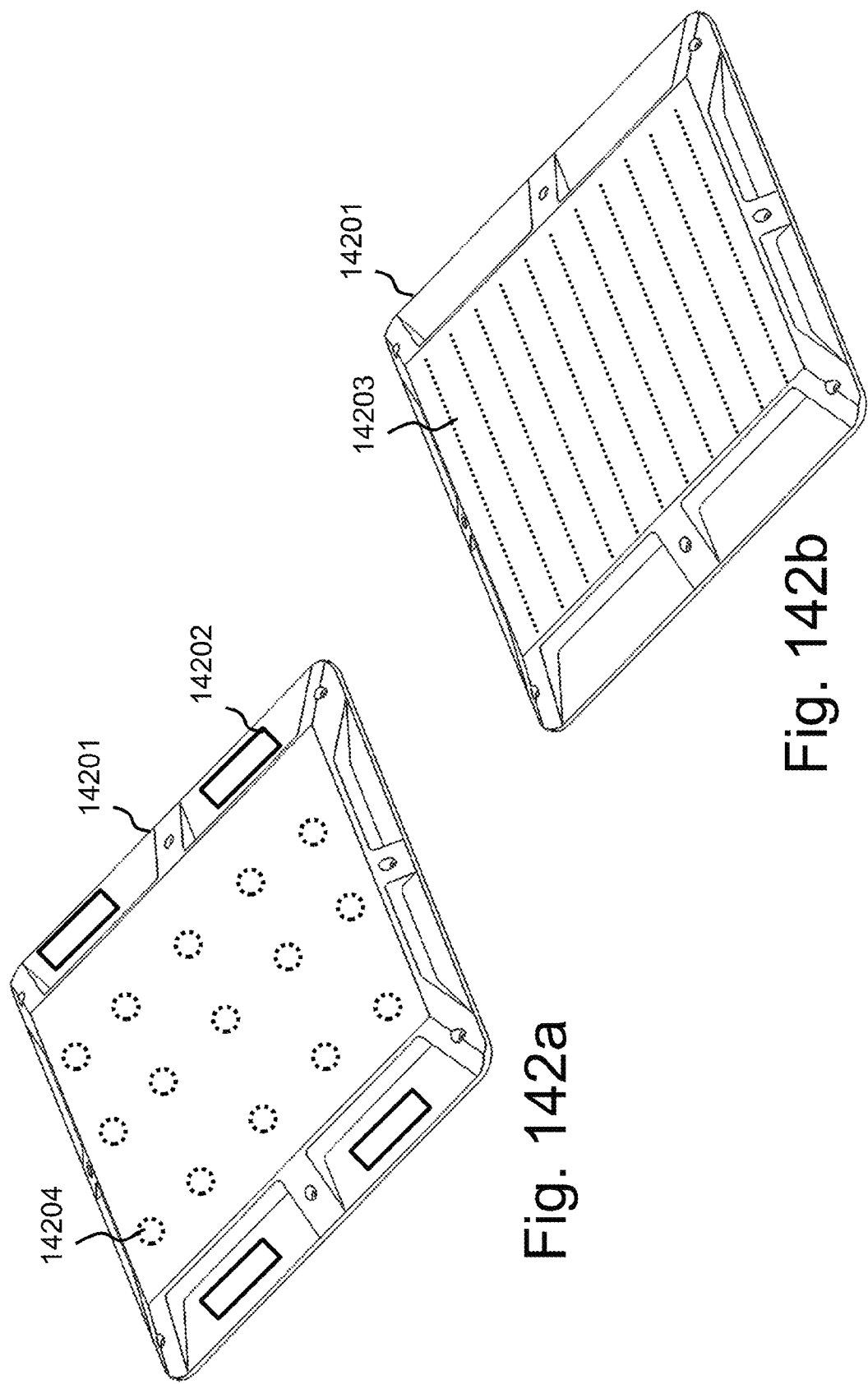

Referring now to FIG. 142(*a*), in various embodiments arrays or arrangements of temperature sensors are integrated into the enclosure of the source or device resonators. In one embodiment depicted in FIG. 142(*a*), temperature sensors 14201 are deployed as an array on the top of resonator 14201. The array of temperature sensors 14201 may be mounted on the inside of the resonator enclosure close enough to the top surface of the resonator to detect temperature differences due to hot objects on top of the resonator. In other embodiments the temperature sensors 14204 are integrated with the enclosure itself as encased within, or integral to, the packaging of the enclosure. In yet another embodiment the sensors 14202 are in a separate module substantially covering the top of resonator 14201. The array of temperature sensors 14204 may be used and calibrated to distinguish between localized heating due to a lossy object placed on top of resonator 14201 or due to overall rise in ambient temperature. For example, a higher temperature reading in one or two sensors may signify that a foreign object may be on top of the resonator and absorbing energy, whereas an overall rise in temperature readings of all the temperature sensors may signify changes in the ambient temperature due to the sun, environment, and the like. An ability to make such a differential reading can eliminate any need for calibration of the sensors, as only the relative difference between their readings may be needed to detect a hot object. In some applications, the output of the sensors 14204 is coupled to the power and control circuitry of the source allowing the source control to change its operating parameters to limit or reduce the heating of the foreign object. Lights 14202 on or near resonator 14201 such as LEDs, photoluminescent strips, or other light emitting sources are optionally provided to alert a user of a potentially hot object, based on the output of sensors 14201.

In an another embodiment, as depicted in FIG. 142(*b*), strips, wires, strings, and the like of heat sensitive material 14203 are arranged across the face of the source resonator 14201. The strips 14203 are coupled to appropriate sensing circuitry to detect the changes in properties of the strips 14203 due to heating from objects on top of the resonator and are used to control the power output or other operating characteristics of the resonator or notify the user of possible hot items on top of the resonator as described above.

In certain environments, a safety risk may be sufficiently large that a warning alone is inadequate. For instance, children might wander through a parking facility at a playground or school and try to pick up an object 13910 that is hot. In such environments, active management of the overheating is appropriate. Accordingly, in the embodiment of FIG. 139, a coolant dispenser 13905 is disposed on wall 13906 near floor 13907 and activates upon detection of overheating. In a simple embodiment, coolant dispenser 13905 is merely a water nozzle with a solenoid-controlled valve that opens when overheating is detected. In a related embodiment, the water spray is used for additional purposes as well, including cleaning the underbody of the automobile (in one particular embodiment in combination with other car washing nozzles), cleaning oil, grease and other automotive fluids from floor 13907, and sweeping debris from floor 13907. Other environments may call for more complex approaches. In one embodiment, cooling tubes are integrated with resonator 13901.

In certain environments, the safety concerns related to overheating call for reducing or turning off vehicle charging rather than, or in addition to, notification of an overheating condition or activation of a cooling mechanism. In one implementation for such environments, sensor 13903 is coupled to the vehicle charger and an over-temperature indication results in fully or partially depowering the charger. In one embodiment, conventional interlock circuitry is used to implement such control so that charging cannot take place if object 13910 is detected. Some vehicle charger designs make use of multiple source and device resonators; in such implementations one embodiment applies different combinations of resonator elements to permit some charging to continue, but in a manner that does not result in overheating. In some embodiments, the charging system includes a variable size source and the size of the source may be varied to permit at least some charging to continue, but in a manner that does not result in overheating. In other embodiments a wireless charging system includes multiple source and device resonators or an array of source and device resonators which may be energized or powered in a manner that minimizes heating of the foreign objects. For example, in one embodiment a wireless charging system may include one source and device resonator positioned toward the front of the automobile and a second source and device resonator positioned towards the rear of the automobile. Temperature sensors may monitor any abnormal conditions in between or around the source and device resonators and use the pair that produces the least amount of heating, allowing the automobile to receive power despite a possible obstruction.

Preventing overheating rather than reacting to overheating is preferable in certain environments. In such circumstances, sensor 13903 detects the presence of an object 13910 that may result in overheating and takes the appropriate action (notification, clearing the object, shutting down of the charger) before any overheating occurs. In such environments, sensor 13903 is implemented not to detect overheating itself, but the mere presence of an object likely to lead to overheating. In a simple embodiment, light beams are used in a manner similar to garage door mechanisms to ensure the absence of humans or objects before closing the door. Conventional light curtains may provide a slightly more comprehensive detection area. In certain implementations, digital cameras and conventional machine vision systems are cost-effective components for sensor 13903, particularly if other systems relating to the automobile or the vehicle charging system already employ such components for other purposes (e.g., assistance to a driver in parking so that resonators are aligned). Some vehicles already have systems that use transmitted and/or reflected acoustic, microwave, RF, optical, and other signals for positioning, parking assist, collision avoidance and the like; in appropriate environments minor modifications and enhancements to these systems may provide cost-effective supplements and alternatives to sensor 13903. For example, an automobile with low-mounted LIDAR curb detection for parking assist is readily modified for the LIDAR to face toward the resonator area, rather than toward a curb, while in a charging mode. Sensor(s) 13912 are also usable in some embodiments to detect presence of object 13910 in the same manner as described above.

In various embodiments one or more pressure, temperature, capacitive, inductive, acoustic, infrared, ultraviolet, and the like sensors are integrated into the source, device, source housing, vehicle, or surrounding area to detect obstructions and foreign objects and/or materials between the source and device resonators. In critical environments the sensors and safety system constantly monitor the resonator area for movement, extraneous objects, and any type of undefined or abnormal operating condition. For example, a housing covering resonator 13901 may include or may be mounted on top of a pressure sensor that monitors the weight or forces pushing on the enclosure of source resonator 13901. Extra pressure or additional detected weight, for example, may indicate a foreign or unwanted object that is left on top of the source making it unsafe or undesirable to operate the charging system. Much like operation of sensor 13903, output from such a pressure sensor is coupled to processing elements of the charging system and is used to stop or reduce wireless power transfer when the sensor is tripped or detects abnormalities. As appropriate for the particular environment the sensor is coupled to an auditory, visual, vibrational, communication link or other indicator to provide notification of charger interruption. In some embodiments multiple sensors, sensing multiple parameters, are used simultaneously to determine if an obstruction or a foreign object is present. To prevent false triggering, in some embodiments at least two sensors must be tripped, such as a pressure and a temperature sensor, for example, to turn off the vehicle charger.

In a resonator implementation in which metal is the most likely substance to lead to overheating, one embodiment integrates sensor 13903 via a metal detector. An advantage of such an implementation is that conventional metal detector circuitry is based on inductive loops, which can be easily integrated with typical designs of resonators (e.g., 13901). Given the large mass of metal in automobile 13902, preferably such detector has an effective range shorter than the distance to automobile 13902. A variety of conventional magnetometer architectures are usable to sense presence of an object 13910. The frequency of operation and type of magnetometer are preferably chosen for reliable operation in the presence of a large charging field; alternatively, such magnetometer is used before the charger is turned on, when it is at reduced power, or when it has been turned off, such as during temporary interruptions in charging to allow a magnetometer check.

In some resonator implementations, presence of an object 13910 likely to cause overheating may result in an operating parameter of the resonator to vary from what would be expected. For example, the power transfer from the charger may be noticeably reduced, the amplitude of an expected voltage or current may change, a magnetic field may be altered, a reactance value of the resonator may change, and a phase relationship in vehicle charger may change from what would be expected. Depending on the particular implementation of resonators and other circuitry in the vehicle charger, an appropriate electrical parameter or set of parameters is compared with a nominal value and such comparison is used rather than, or in combination with, sensor 13903 to detect presence of object 13910. In some resonator implementations the system may monitor the power input at the source as well as received power at the device resonator and compare that value to an expected or nominal value. Significant differences from a nominal value may mean that the energy is being dissipated in other objects or there may be an error in the system. In some resonator implementation the coupling factor k, the quality factor Q, the resonant frequency, inductance, impedance, resistance, and the like may be measured by the system and compared to nominal or expected values. A change of 5% or more of the parameters from their nominal values may signify an error in the system, or a foreign object and may be used as a signal to shutdown, lower the power transfer, run diagnostics, and the like. For example, high-conductivity materials may shift the resonant frequency of a resonator and detune it from other resonant objects. In some embodiments, a resonator feedback mechanism is employed that corrects its frequency by changing a reactive element (e.g., an inductive element or capacitive element). To the extent that such mechanisms are already present in a vehicle charger system, in certain embodiments they are employed to supplement and in certain environments replace sensor 13903.

Discussion above has primarily focused on detection and response based on components that are part of the vehicle charger. In certain embodiments, portions of such circuitry are instead deployed at least in part on automobile 13902 itself. For instance, line of sight from sensor 13903 mounted on wall 13906 may be inferior to that achievable by a sensor or array of sensors mounted on the underside of automobile 1102. Other advantages flow from such automobile-mounted implementations as well. Sensors can easily be aimed directly below the automobile's device resonator and can be positioned so as to avoid sensing artifact-producing locations such as near exhaust system components, engine components, brake components and the like. In one such embodiment, annunciator 13904 is also implemented in automobile 13902. In one specific example, the existing voice synthesis module used for the automobile's GPS system is used to announce to the driver that charging will not occur because an object 13910 is detected beneath the vehicle, and that it should be cleared so that charging can commence.

Referring now to FIG. 140(*a*), an alternate embodiment that does not require any circuitry is based on the use of thermally sensitive materials. In one specific embodiment, resonator 13901 is deployed with heat sensitive paint applied in an area 14001 overlapping resonator 13901 and in an adjacent area 14003 such that if an object becomes sufficiently warm, a portion of the area affected by the heated object will change color to warn of high temperatures. Preferably, a distinctive color change that provides a clear warning is used, such as from white to neon red/orange. In one embodiment, the paint is applied through stencils such that a warning message 14002 (e.g., "HOT" of "Caution") appears when the paint changes color.

By using heat sensitive paint, the functions of both sensor 13903 and annunciator 13904 are achieved together. Management functions can also be achieved in a "passive" manner that does not call for components such as solenoid-controlled water valve/nozzle arrangements (e.g., 13905). In one such embodiment, depicted in FIG. 140(*b*), a portion of resonator 13901 is not merely flat, but is implemented in a pyramidal, crowned or conical shape 14005 such that an object 13910 is not likely to stay on resonator 13901. In a first implementation, such shape is achieved by using a conventional form for the poured concrete, epoxy, Fiberglas or other material that makes up the remainder of the surface of floor 13907. In certain environments, low loss materials such as Teflon, REXOLITE, styrene, ABS, delryn, and the like are preferable for implementing area 14001 over resonator 13901 to provide both strength and minimal interaction with the charging fields. In a second implementation, a mat including resonator 13901 and having a pyramidal shape is used to implement area 14001. In this implementation, the material of the mat itself rather than heat sensitive paint may change color with heat. In a related embodiment a thermotropic material is used for the mat such that heated areas of the mat rise to form a slope wherever a hot object is, gradually causing it to migrate off of the energized area. Numerous thermotropic materials are known that change in appearance with temperature and can thus provide visual indication of overheating as well. An alternate embodiment achieves deformation by including a bladder in the mat such that by filling the bladder with air, water or another substance the shape of the mat changes to dislodge foreign objects (e.g., 13910). In yet another implementation, area 14001 is implemented as a wobbly surface, such as a pyramidal surface suspended at its apex from the floor by a short cylinder. By such suspension, the perimeter of such surface is nominally maintained a short height (in one embodiment approximately 1 cm) above floor 13907 such that when a vehicle or pedestrian walks over the surface, it moves sufficiently that an object 13910 is likely to eventually roll or slide off. Optionally, a drain area is integrated around the periphery of area 14001 or 14003 so that melting snow and other debris readily migrate into the drain. In environments where greater certainty of object clearance is required, the supporting cylinder mentioned above is part of a piston subsystem that controllably provides vibration to the surface to move objects off of resonator 13901. In some charger implementations, resonator 13901 is designed to be movable so as to optimally align with a corresponding resonator in automobile 13902. In those implementations, the same mechanism used to achieve resonator alignment is used to move/vibrate the surface so as to relocate object 13910 from area 14001.

An alternative for clearing area 14001 of extraneous objects is a conventional sweeper/wiper mechanism (not shown) deployed from wall 13906 or another convenient location. In one embodiment, the clearing mechanism operates immediately as a vehicle approaches area 14001 to minimize the likelihood that tools, trash or other materials get placed in area 14001 between the time of clearing and the time that charging begins. In some embodiments, this mechanism is engaged by operation of an automatic garage door opener; in other embodiments a conventional remote control is used. In an alternate embodiment, the clearing mechanism is capable of operation even when automobile 13902 is parked over area 14001 so that materials such as melting ice from automobile 13902 can be cleared while vehicle charging is taking place. This is important because it is found that winter slush sometimes includes extraneous materials such as metal debris (e.g., from broken snowplow bolts, salt spreading apparatus and the like). Once the slush melts, the resulting debris can cause the same high temperature conditions as described above. As ferrous objects are found to be particularly susceptible to heating, in one embodiment a magnetized wiper mechanism is used to more readily clear metal objects.

In environments in which slush is considered particularly problematic, water jets aimed at the underbody of the automobile dislodge slush quickly before charging commences. A particular advantage of such jets is that if sufficient water is used, the water dripping from the underbody onto area 14001 will eventually cause not only slush, but at least small objects as well, to be dislodged from area 14001.

A related embodiment using water jets is well suited for warmer environments. This embodiment provides a relatively strong blast of water from above area 14001 just before the automobile arrives, thus clearing area 14001 of foreign material. An advantage of such an approach is that it is readily integrable with other features of interest, such as a car rinse or car wash.

Not all vehicle charger resonators are deployed underneath an automobile. In some applications, resonators are implemented in other structures. In one alternative implementation, source resonators are implemented as horizontal barriers suspended from wall 13906 at a height set to match a corresponding resonator in the front or rear bumper of automobile 13902. In another implementation, vertical posts set in floor 13907, such as those commonly provided for protection of a wall or support column in a parking garage, serve as enclosures for source resonator 13901. Such varied implementations result in possible safety issues that differ somewhat from the examples discussed herein. However, those skilled in the art will recognize that the principles disclosed herein can readily be applied to other implementations as well.

Referring now to FIG. 141, a wireless vehicle charger safety system 14100 includes a detection subsystem 14101, a notification subsystem 14102, and a management subsystem 14103. In certain environments, the notification and management subsystems are not required. In other embodiments, the various subsystems are implemented in an integrated manner; the use of heat-sensitive paint as discussed in connection with FIG. 140(*a*) is an example in which the detection subsystem and the notification subsystem are implemented in a unitary manner. Not shown in FIG. 141 are various interconnections that exist in certain embodiments with other components of a wireless vehicle charger, such as interlock circuitry that is controllable by the management subsystem. As shown in this disclosure, the various subsystems are implemented in different embodiments by electronic circuitry, electro-mechanical systems, chemical/materials-based approaches, fluid control systems, computer-implemented control systems, and the like. In practice it is found that one particular application environment may be ill-suited for an approach that is optimal in a different application environment. Large trucks kept in a company loading facility call for different safety measures than passenger cars in a residential garage. In some embodiments, subsystems 14101-14103 operate with self-learning or trainable algorithms designed to function in or with a wide variety of environments, vehicles, sources, and systems and may learn or be trained to operate in many environments after periods of supervised operation. In some embodiments, any or any combination of the detection subsystem 14101, a notification subsystem 14102, and a management subsystem 14103, may be a stand alone module or subsystem. In other embodiments, any or any combination of the detection subsystem 14101, a notification subsystem 14102, and a management subsystem 14103, may be implemented at least partially using resources already available on the vehicle.

Wireless Outdoor Light

Wireless power transfer may be incorporated into outdoor lighting applications. A wireless power transfer system may be used to transfer power from a source resonator, through materials and/or structures and/or over a distance, to a device resonator in lighting fixtures that may be located a distance from the source, that may be sealed, encapsulated, weatherproofed, and the like and that may be installed without requiring the connection of any electrical wires to the light fixtures.

With wireless power transfer, a wireless power transfer enabled lighting fixture may be placed, mounted, secured, attached, and the like, in the vicinity of a wireless power source and receive power to provide security lighting, decorative lighting, utility lighting, safety lighting, signaling lighting, insect repellent lighting, and the like. A lighting fixture with wireless power capture capability may be placed, mounted, secured, attached, and the like where it may be difficult, impossible, impractical, inconvenient, or too expensive to place traditional lighting fixtures which receive power from a wired power source or from a portable power source such as a battery, super-capacitor or energy storage unit.

A lighting fixture with wireless power transfer capability may be mounted in locations where wired electricity, a junction box, a wired outlet, and the like, are unwanted or unavailable. With wireless power transfer, a wireless power source may be located near or connected to a traditional wired power source such as a power outlet, a battery, an energy storage unit, a generator, an engine, and the like, and the source may wirelessly transfer power to a light fixture location. In embodiments, the light fixtures may be located in a place where traditional wired power is not available. In embodiments, the light fixtures may be located in a place where traditional wired power is difficult to supply. In embodiments, the light fixtures may be located in a place where traditional wired power is available, but a wireless approach is preferred.

Outdoor wireless lighting fixtures may comprise lighting fixtures that are used or located on the exterior of homes, buildings, sheds, tents, barns, and the like. Outdoor wireless lighting fixtures may comprise lighting fixtures that are used or located on the exterior of vehicles such as cars, boats, ships, planes, trains, motorcycles, scooters, all-terrain vehicles, snow mobiles, carts, and the like. Outdoor wireless lighting fixtures may comprise multiple lighting fixtures that may exchange power with each other as well as with a wireless power transmission source unit. Such strings or networks of light may extend the distance, operating range, or performance of wireless lighting fixtures. Wireless lighting fixtures may be affixed to walls, roofs, doors, windows, hulls, decks, panels, clothing, racks, mounts, accessories, bumpers, handlebars, hoods, trunks, platforms, wheels, plants, posts, supports, and the like.

The position of traditional outdoor lighting fixtures for buildings or vehicles may be limited or restricted to prewired positions. Changing the positions of those wired fixtures, or adding additional wired fixtures may be difficult or undesirable and may require modification(s) of the exterior or structure of the building or vehicle and may affect the integrity of the building, vehicle, lighting fixture, or the electrical systems. Changes to the integrity of the building, vehicle, lighting fixture or electrical systems may included changes to the weather proofing, fire proofing, sound proofing, insulation, strength, and the like. Users or customers wishing to add traditional wired exterior lights may be forced to pay for electrician services or skilled labor to install or move wired lighting fixtures. In addition, it may be difficult to make small adjustments to the wired fixture's position or orientation once it has been installed.

With a wireless power transfer system for lighting devices, a wireless power transfer source may be located near or connected to a wired power outlet, battery, energy storage unit, junction box, generator, engine, and the like, and wirelessly transfer power to a device resonator attached to a lighting fixture which may be at a distance of several millimeters, several centimeters, or several meters away from the source, at the desired light fixture location. A wireless power source may be located inside or within a building, vehicle, wall, panel, roof, window, board, seat cushion, bumper, trunk, and the like, and the power may be wirelessly transferred to a lighting fixture on the outside or other side of the building, vehicle, wall, panel, roof, window, board, seat cushion, bumper, trunk, and the like.

In the interiors of buildings, wired power outlets may be located throughout the building, and may be positioned at regular intervals. These wired power outlets may drive wireless power sources that supply power to wireless lighting fixtures that have been flexibly positioned on the inside or the outside of the building. In embodiments, a wireless source may be placed on the inside of the building in the vicinity of the desired location of the wireless lighting fixture. The indoor source may be connected to a traditional household outlet or may be wired to the interior household electrical system. If the source is placed inside the building it may not need to be weather proofed or ruggedized for outdoor use. Since the outdoor lighting fixture may not be hardwired, it may be completely sealed with no exposed electrical wires or connectors.

A diagram of the components of an exemplary embodiment of a wireless lighting system with a wireless lighting fixture is shown in FIG. 143. FIG. 143 shows a lighting fixture 14303 that may be mounted on the outside of a building. In this figure, the region outside the building 14301, is separated from the region inside the building, 14302, by a wall, 14308. The lighting fixture, 14303, comprises at least one magnetic resonator 14306, which may be integrated in the lighting fixture 14303 or the mounting hardware or may be connected to the lighting fixture 14303 in some other way. Inside the building 14302, the wireless power source 14310 comprises at least one source magnetic resonator 14309 and power and control circuitry 14312 which is coupled to a power source such as a power outlet 14311 on the inside of the house. The source may be coupled to the power outlet 14311 with an electrical cord 14313 allowing the source resonator to be placed in various locations on the inside of the building, including locations away from the power outlet. The lighting fixture 14303 on the outside of the building may be positioned in a variety of locations including away from the building, or attached to the building using any known fastening methods. Oscillating magnetic fields generated by the oscillating electrical currents of the source magnetic resonator 14309, penetrate the wall 14308 and induce currents in the magnetic resonator 14306 of the light fixture 14303.

The source and device resonators may be any type of the resonators described herein such as a capacitively-loaded conducting wire loops or planar resonators comprising capacitively-loaded conducting wire loops wrapped around magnetic materials. The resonators may be arranged in arrays or composed of multiple sized resonators or conductors as described herein. The power and control circuitry may include impedance matching, and tuning circuits. The resonators may comprise printed circuit traces or loops of printed circuit traces woven to reduce AC resistance as described herein.

A clear advantage of such a wireless lighting system is that it may be installed by unskilled labor and may not require electrician services or skilled labor for installation. A user may install a wireless lighting fixture by placing or fastening the wireless lighting fixture at the outside of a building and connecting the wireless source to a power source such as an traditional power outlet inside the building that is near the location of the outdoor wireless lighting fixture.

In some embodiments it may be desirable that the source resonator inside the building or vehicle and the device resonator attached to the lighting fixture be aligned, facing each other, or within a predetermined maximum separation distance to maintain proper operation, efficiency, and the like. To aid alignment the source or the device modules of the wireless power transfer system may comprise sensors, monitors, system controls, user feedback mechanisms, and the like, for aiding the user in attaining proper alignment or distance between the source and device resonators. Sensors which measure or monitor, power transfer efficiency, voltage, current, or phase of current of voltage on the resonators may be used to determine alignment or distance between the source and device resonators. The measured data may be translated into any number of visual, auditory, or vibration feedback signals to the user.

In embodiments the wireless power transfer system for the light fixture may comprise hardware and/or software for controlling the intensity of the light emitted from the lighting fixture including putting the lighting fixture into a power saving mode, turning the light on or off, turning the light on partially, intermittently, periodically, or in response to a change in a sensor output, and the like. In embodiments, the sensor may be a light sensor, a motion sensor, a thermal sensor, an acoustic sensor, and the like.

In embodiments, the amount of light generated by the outdoor light fixture may be completely controlled by the power delivered by the source resonator. For example, the outdoor lighting fixture may be turned on or off by turning on or off to power supplied to the source resonator inside the building. In some embodiments, the wireless lighting fixture may be controlled by a switch that controls power delivery to the source. In another embodiment, the light fixture may comprise a manual or automatic switch, or a sensor with appropriate drive circuitry to control the intensity of the light emitted from the lighting fixture. In such embodiments it may be possible to maintain wireless power transfer from the source resonator to the device resonator and to modulate the intensity of the light emitted by the lighting fixture using components within the lighting fixture itself.

In some embodiments the device and source modules may have a signaling capability that transfers information about the operating states of the various resonators to each other. In embodiments, the signaling capability may be realized using a wireless communications channel of the types described herein. In other embodiments, the signaling capability may be realized by changing the electrical properties of the source and/or device resonators. A device module may monitor motion sensors, light sensors, acoustic sensors, thermal sensors, switch settings, buttons, and the like of the lighting fixture to determine the desired operating point for the light and may signal the source module to turn on or off as necessary.

In some embodiments the source module may have multiple power modes. One power mode may be used during normal operation when the outdoor light is on and drawing power. Another power mode may be used when the outdoor light is off. The source may transfer a fraction of the available power in lower power modes to minimize the energy consumption of the lighting fixture when less light is required or when only sensors, control circuitry and the like are consuming power. The source may switch between power modes as signaled by the device using wireless signaling, a wireless communication link, or by the device changing its electrical properties as sensed by the source.

In embodiments the device module of the lighting fixture may comprise a rechargeable battery, super-capacitor, power storage unit and the like, which may be used to power outdoor light sensors and control circuitry while the source module is turned off or in a quiescent state. In such embodiments, the source may be configured to turn on periodically or as requested by the device module to recharge the batteries of the device module and lighting fixture or to power the lighting fixture.

In embodiments the device module and lighting fixture may include power and control circuitry tailored specifically to the type of light or light emitting part of the light fixture. In some embodiments, the power and control circuitry in the device module 14307 may not include rectification circuits or AC to DC converters. In embodiments, the device resonator may be directly connected to a light emitting part. In other embodiments, the device resonator may be connected to the light emitting part after the resonator signal has been conditioned by a voltage clamp, a transformer, a switch, a converter, and the like.

In some embodiments the light emitting part of the light fixture may require DC voltage, or voltage and currents at a specific frequency. The power and control circuitry may comprise AC to DC converters or AC to AC converters that change or control the voltage frequency at their outputs.

In embodiments the source may include power and control circuitry tailored specifically to the type of light emitting part of the light fixture. In some embodiments the source may drive the source resonator at a specific frequency such that the voltages and currents at the device resonator may be directly coupled to the light emitting part of the light fixture. The power and control circuitry of the source may include AC to DC and DC to AC converters to change the input voltage to an appropriate frequency and power level.

In some embodiments the power and control circuit may include a ballast circuit which is powered by standard AC household current and outputs a high frequency oscillating voltage in the range of 1 kHz to 500 kHz which may be used to directly drive the source resonator. In some embodiments, the frequency of the oscillating voltage used to drive the source resonator may be within the range of frequencies acceptable by the light element of the light fixture and the light fixture or device resonator may not require additional AC to DC or AC to AC converters in the light fixture. In some embodiments the light fixture or the light element may be connected directly to the resonator and be powered directly from the oscillating voltage of the device resonator not requiring further voltage conditioning of conversion.

In some embodiments, the lighting fixtures may comprise different kinds of lamps and lights which may include, but may not be limited to, compact fluorescent lamps (CFLs), fluorescent tube and circline lamps, mercury vapor lamps, metal halide lamps, high-pressure sodium lamps, standard incandescent lamps, tungsten halogen lamps, reflector lamps, light emitting diodes (LEDs), and the like. In embodiments, the light fixture may comprise housings, circuits, sockets, plugs, connectors, wires, and the like. The light fixtures may be smaller than the lighting elements or larger than the lighting elements. The light fixtures may be integrated into clothing, bags, posts, bumpers, helmets, eyewear, pouches, racks, decks, vehicle accessories, building accessories, and the like.

Appliances with Wireless Power Transfer

Wireless power transfer may be incorporated into household appliances such as refrigerators, washing machines, dishwashers, stoves, and the like. A wireless power transfer system may be used to transfer power to or from household appliances or parts of household appliances, allowing portable electronics or sensors that are placed on, near, or inside the appliances to be powered or charged wirelessly from the appliances.

For example, in many homes the refrigerator is in a central location and, in addition to food storage and preparation, may be used to display messages, photographs, drawings, reminders, lists, and the like. In embodiments, items may be attached to a refrigerator using tape, hooks, permanent magnets, and the like. A refrigerator enabled with wireless power transfer may power or charge electric or electronic devices that are placed on, near, or inside the refrigerator. Electric or electronic devices may be placed on the refrigerator using permanent tape, hooks, magnets and the like. Devices such as televisions, monitors, displays, digital picture frames, lights, electronic writing pads, tablets, mobile devices, cell phones, music players, cooking timers, electronic cookbooks, clocks, and the like may be attached to the fridge and wirelessly receive power from the fridge. In embodiments, mobile devices may be recharged while magnetically "stuck", hooked, attached, or placed in any way onto the refrigerator door.

For example, a small television, or a monitor may be integrated with a device resonator and power and control circuitry. Such a television or monitor may then be attached to the refrigerator using hooks, magnets, clasps, and the like and receive power from a source resonator integrated in or attached to the refrigerator. Without power cables, the television or monitor may be freely removed or repositioned as needed. Simple devices, such as small lights, or small speakers, may be integrated with a device resonator and programmed to flash or sound on demand, to serve as a reminder or to alert a person to a note or message left on the refrigerator or another message location in the home. These small lights or speakers may never require batteries and may be placed or removed from the refrigerator as needed.

In another example, the refrigerator may be used as charging location for electronics or electric devices. Devices such as cell-phones, mobile devices, mobile handsets, remotes, and the like, may be attached to the refrigerator and receive power to recharge their batteries. The devices may have a magnetic back or any number of hooks, cables, clasps, and the like to attach to the refrigerator.

Wireless power transfer may be used to power devices inside the refrigerator. Devices and sensors enabled with wireless power transfer may be completely sealed and resistant to the cold and moisture of the refrigerator and the food products inside. Smart internal appliances, such as ice trays that sense when the ice is out, may be powered by the source and device resonators. Temperature sensors, sensors for checking if food is spoiling by monitoring gasses, smart containers which monitor food expiration dates and relay their data to an external display may be kept and powered inside the refrigerator. Items inside the refrigerator may be catalogued and tracked using wirelessly powered sensors, transmitters, and readers, and the contents of the refrigerator may be displayed on a monitor on the front of the refrigerator. Smart tracking and organizing algorithms may be used to alert a consumer that certain items need to be replenished or removed and may suggested items for the weekly shopping list.

As depicted in FIG. 144, source resonators for transferring power wirelessly may be integrated into the doors 14403, 14404, the sides 14401, or the top of the refrigerator 14402 and coupled to source power and control circuitry (not shown). Source resonators may be integrated into internal shelves inside the refrigerator.

Wirelessly powered or charged devices or sensors may be attached to the outside, the outside door, the side or the top of the refrigerator or they may be placed on the inside of the refrigerator, on the shelves or inside containers, and the like. Each device or sensor may be integrated with its own device resonator and device power and control circuitry to receive power transferred by the source, or multiple devices and/or sensors may share device resonators and power and control circuitry.

The source and device resonators may be any type of the resonators described herein such as a capacitively-loaded conducting wire loops or planar resonators comprising capacitively-loaded conducting wire loops wrapped around magnetic materials. The resonators may be arranged in arrays or composed of multiple sized resonators or conductors as described herein. The power and control circuitry may include impedance matching, and tuning circuits. The resonators may comprise printed circuit traces or loops of printed circuit traces woven to reduce AC resistance as described herein.

To accommodate wireless power transfer from sources inside the refrigerator or refrigerator panels to devices on the exterior of the refrigerator, some portion of the surface of the refrigerator may be constructed using non-metallic and/or non-ferrous materials. These portions of the refrigerator may be covered using cover sheets made of different materials and the material choices may depend on whether or not the wireless power transmission system is operating. In embodiments, the cover sheets may appear metallic, to match the texture and veneer of the rest of the appliance. In embodiments, the cover sheets may be decorative or personalized, and sets of cover sheets may be used to provide a variety of appearances for the exterior of the refrigerator. The cover sheets may be solid sheets, or they may contain cutouts, or they may be shaped to only partially cover the wireless power transfer area so that wirelessly powered devices may be mounted next to the cover sheets. The cover sheets may be made of materials that do not significantly perturb the wireless power transfer system so that wirelessly powered devices may be mounted on top of cover sheets.

A diagram of one possible configuration is shown in FIG. 145. A capacitively loaded conductor coil resonator 14502 may be integrated into a door of a refrigerator 14501. This source resonator may be powered using a wired connection to a wall outlet or a power connector in the refrigerator or it may receive its power wirelessly, from another source resonator integrated in the body of the refrigerator. In embodiments, power to devices in a refrigerator door, such as ice dispensers, or the other devices described herein, may be preferentially delivered wirelessly because the wireless power system eliminates the need failure-prone wires that cross moving joints such as a door hinge. The outer door 14503 may include magnetic materials to shape the magnetic fields toward the front of the door and/or toward any mounted devices 14504 and their respective resonators 14505. The cover and casing of the door 14503 covering the source resonator 14502 may include areas of magnetic or metallic materials allowing devices 14504 to be attached to the door with magnets.

Wireless power transfer may be achieved using power sources attached to the exterior of the refrigerator. These sources may comprise resonators of any of the varieties discussed herein. These sources may be attached to the refrigerator using hooks, magnets, clasps, and the like. These sources may comprise field shaping elements to enable efficient power transfer when the sources are mounted on metallic and/or ferrous materials. A diagram of an exemplary embodiment is shown in FIG. 146. A source 14602 with a source resonator 14604 and power and control circuitry (not shown) may be attached to the outside of the refrigerator. The source 14602 may be attached permanently and wired to the refrigerator and receive power from the refrigerator. In some embodiments the source may be placed temporarily or attached by a user. In some embodiments the source may have a power cord that may attach to a house hold power outlet (not shown) allowing retrofitting to any refrigerator. The source may be attached by magnets, glue, tape, screws, fasteners, and the like, to the refrigerator. In some embodiments it may be preferable for the source to use so called planar resonators described herein comprising a conductor wrapped around magnetic material resulting in a magnetic field lines that are substantially in the plane of the refrigerator surface to which the source is attached, making the surface an energized surface such that devices 14606 attached to the surface may be wirelessly powered. Devices 14606 may be attached to, placed on, or placed near the energized surface and receive power wirelessly from the source 14602. The devices 14606 may be placed anywhere on the energized surface. In embodiments with an external resonator comprising a planar resonator source it may be beneficial for the devices to use a planar device resonator. In embodiments, the source 14602 and devices 14606 may include additional shielding to reduce losses due to metallic or ferrous material that may be part of the structure of the refrigerator. Layers of magnetic material or sheets or tiles of good conductors or a combination thereof as described herein may be used to shield or guide magnetic fields away from the lossy materials of the refrigerator or guide them towards, or in a parallel direction the plane of the surface to which they are attached.

Wireless power transfer may be incorporated into a washing machine. A wireless power transfer system may be used to transfer power to devices inside the washing machine, when the machine is idle, when the machine is running and washing clothes, when the machine is in a self clean cycle, and the like. A wireless power transfer may be used to transfer power to devices outside, on top, or on the side of the washing machine. Wireless power transfer may be used to charge or power devices on the exterior of the washing machine.

A wireless power transfer system may be retrofitted into existing washing machines. Wireless power transfer source may be retrofitted into the lid of a washing machine. A lid with a power connection and an integrated wireless power transfer source may be used as a replacement for existing washing machines to enable wireless power transfer. Wireless power transfer sources may be attached to the lid of a washing machine, the side of the machine, the top of the machine as an add-on or a module installed by a technician or a consumer.

A wireless power transfer system may be integrated into the washing compartment of the washing machine. A wireless power transfer source may be integrated into central agitator of a washing machine allowing power transfer to devices in the washing compartment of the machine. A wireless power transfer source may be integrated around the washing machine compartment. The conductor of a source resonator may be shaped to fit around the outer diameter of the washing compartment transferring wireless power to devices inside the washing compartment. The conductor of a source resonator may be shaped to fit around the inner diameter of the washing compartment transferring wireless power to devices inside the washing compartment. A wireless power transfer source may be integrated into the side, top, or bottom panels of the washing machine and may transfer power to devices on the side, on top, or inside the washing machine. In some embodiments it may be preferable to construct parts of the washing machine from non-metallic materials to reduce wireless power transfer losses. In some embodiments the washing compartment or the washing machine enclosure may be constructed completely or partially from non-metallic materials.

In embodiments the wireless power transfer source integrated or retrofitted into a washing machine may be used to transfer power to devices inside the washing compartment of the machine. The devices may be integrated with device magnetic resonators and power and control circuitry described herein for capturing power from the source. In some embodiments the devices may be powered directly by the powered captured by the device resonator. In other embodiments the devices may also include a rechargeable battery, super cap, energy storage, and the like to recharge the battery, super cap, and the like allowing the device to operate even when not directly receiving power from the source.

The devices in the washing machine may be powered or recharged during the machine's normal operation or when idle. In embodiments the wirelessly powered devices may include wirelessly powered agitators. Devices that vibrate, move, rotate, have rotating parts, may be placed, attached, mounted, screwed, and the like to the inside of the washing compartment and provide additional or primary agitation or movement to the washing compartment. Since the agitators may not require any external power connections they may be easily upgraded or replaced. The agitators may be devices that are dropped into the washing compartment. The ease of replacement may allow for specialized agitators for each different wash cycle, fabric type, and the like. A wirelessly powered agitator device may be attached or placed inside the washing compartment as needed for different wash cycles, temperatures, clothes, and the like.

In embodiments the wirelessly powered devices may include wirelessly powered sensors. Devices may include dirt, soil, cleanliness sensors. A sensor which tests the hardness of the water, the minerals in the water, particulates in the water, and the like may be used to adjust the wash cycles to a necessary length and type or to continue a cycle until clothes are clean or sensors do not detect more dirt or particles being washed from the articles in the machine. In embodiments the sensors may include temperature sensors, detergent sensors, water sensors and the like. The sensors may be used to adjust the wash cycles, or increase detergent levels and the like.

In embodiments the wirelessly powered devices may include other wirelessly powered devices such as smart detergent, fabric softener, and the like containers. The containers may be fitted with electromechanical valves or release methods allowing controlled release of detergent into the wash. The wirelessly powered devices such as agitators, sensors, other devices, and the like may include a wireless signaling capability to receive configuration and operation information from the washing machine with regards to the agitation settings, times to power on or off, release detergent, and the like.

In embodiments wireless power sources may be configured to provide power to the outside of the washing machine such that devices placed on or next to the washing machine can receive power for operation or recharging. Power outside of washing machine may be used to recharge agitators, sensors, and other devices for use inside the washing machine such that the devices may not require wireless power inside the washing chamber during operation of the washing machine and may be powered using the devices stored power. In embodiments wireless power may be used to power or recharge washing devices such as scrubbers or rotating brushes that may be used for pretreating stains prior to washing. Wireless power may be transferred to other appliances or devices placed next to the washing machine, accessories like a clothes warmer installed on the side of a washer may obtain power from the washing machine and not require a separate plug and may be designed to be more modular or movable.

Wirelessly powered or recharged devices may be made completely waterproof and chemical resistant since so external connections, cables, power ports are necessary. The whole device may be completely sealed to withstand detergents, water, heat, chemicals, and the like used in a washing machine. Likewise, the wirelessly powered devices may not require any electrical connections to the washing machine. Features, devices, sensors, and the like in a washing machine may be made modular and designed to be easily removable, upgradable, replaceable, reconfigurable, and the like. Consumers may be able to easily replace sensor modules as newer sensor technology is available, replace a malfunctioning device, or upgrade to new features by dropping a new device module into the washing compartment.

Although a washing machine was used as an example appliance above, it will be clear to those skilled in the art that the same, or similar designs may also be incorporated into dryers and dishwashing machines. Wireless power sources may be mounted or integrated into a dryer or dishwasher. The sources may be permanently integrated into the appliances or they may be installed by the consumers. The sources may wirelessly power devices inside the appliances such as sensors or agitators. For example, the dryer may have devices that vibrate or fluff the clothes for extra softness. Dryer devices may release chemical, fluids, powders, or fragrances. The dryer may have devices to measure the temperature or the moisture content of the clothes and adjust the drying cycle or heat until the desired moisture content of the articles in the dryer are obtained. A dishwasher may include wirelessly power devices that rotate, vibrate, or move to provide additional scrubbing action for dishes. A dishwasher may include wirelessly powered sensors for sensing temperature, cleanliness of water, moisture content, and the like which may be used to adjust control or indicate to the user the success or length of washing, drying, or rinsing cycles.

In embodiments, a wireless power source may be integrated into the top of a dish washing machine such that when it is installed under a counter it creates an energized surface at the counter above the dishwasher machine. The energized surface may be used to power kitchen electronics or appliances.

Wireless power may be incorporated into an oven transferring power to devices inside the oven. A wireless power source placed in the oven may be used to wirelessly power a portable heating element. A device that includes a device resonator, power and control circuitry, and a heating element that uses converts the electric energy from the resonator into heat may be used to accelerate cooking or baking inside the oven. The wireless heating device may be placed inside baked goods, meat, and other food to allow heating from the inside which may accelerate the baking, cooking, or heating process. In embodiments wirelessly powered oven devices may include temperature sensors, some which may be placed inside of food to measure cooking temperature which may wirelessly signal the control system of the oven or the user when a predetermined temperature or temperature for a predetermined threshold has been reached.

Application Specific Charging/Boost Charging

Wireless power transfer may be used to provide full or supplemental power for powering or charging specific electronic modules or circuits. Wireless power transfer may be used to provide power or supplement power to specific circuits of a device or during specific operations of a device. Supplemental power delivery may be used in portable or battery powered devices to power specific operations or circuitry that may have significant power demands or whose operation may be controlled by an external source of power.

Wirelessly powered electronic modules incorporated into devices, such as battery powered portable devices, may allow operations and applications which may normally not be practical using battery power alone.

An electronic module may be integrated with wireless power transfer capability. Power for the electronic module may be provided by an integrated wireless power device resonator. The electronic module may be powered solely by the wireless power transfer system, or the wireless power transfer system may provide a portion of the power delivered to the module with the rest being delivered from a battery source, a super-capacitor, a power storage unit, and the like.

For example, a mobile device may be integrated with a high speed wireless data transfer module for transferring or broadcasting video to a television or sending or receiving large amounts of data. The high speed wireless data transfer module may require considerable power for powering the transceiver radios or the computing and processing circuits on the module. In some situations, the power requirements of the data transfer module may be impractical for a battery powered device, requiring a large heavy battery, or severely limiting the operational times of the battery-powered devices. Improved performance characteristics may be enabled by integrating in the electronic module a device resonator and circuitry for capturing wireless power in a wireless power transferred by a wireless power source. The electronic module may be at least partially powered by the power received by the device resonator, reducing the battery-power requirements of the electronic module. In some systems the electronic module may use wireless power transfer to operate completely independently of the battery. In some embodiments the electronic module may be configured to operate only when wireless power transfer is active.

In one embodiment, the electronic module may be a high speed communication module operating at 60 GHz and capable of streaming data at 1 Gbps or more and may stream video or send data wirelessly to enabled devices. The electronic module, as well as the devices with which the module communicates, may be integrated with resonators and circuitry described herein for transferring power wirelessly in addition to the data. The electronic module may be integrated into a battery powered mobile device that transmits streaming video signals to monitors, televisions, computers, and the like. The display devices may comprise source resonators that transfer power wirelessly to the video transmitting module as the module operates, allowing transfer of video and data signals without draining the batteries of the mobile device. Supplemental power transfer may be integrated into any number of modules with various functionalities including communication modules such as those that employ close proximity near-field data transfer such as Transfer Jet, or other wireless data transfer standards such as wireless USB and the like.

Wirelessly Powered Computer Peripherals

Cordless computer peripherals and other electronic devices may require a portable energy source such as a battery or batteries to operate. Devices such as wireless keyboards, computer mice, cameras, microphones, mobile handsets, and the like are often powered by batteries. As the energy of the batteries is drained, the batteries need to be replaced or the devices plugged into a power source for charging. This mode of operation can be problematic since the electronic devices cannot be used if replacement batteries are unavailable. Likewise, when a device is connected to a wired cord for charging it may not be used freely since the charging cord may restrict the movement of the device.

The aforementioned problems are overcome in with a wireless energy transfer system that may power or charge a plurality of computer peripherals and other devices at the same time. The system may use one or more sources comprising magnetic resonators that may transfer energy wirelessly to other magnetic resonators integrated or coupled to the computer peripherals or electronic devices. Using appropriate magnetic resonator design, a small magnetic resonator may be attached, coupled, integrated, or located near a computer or monitor (also referred to as a display, computer screen, LCD display, LED display and the like), and transfer energy over a distance, via an oscillating magnetic field, to multiple magnetic resonators attached to or integrated in the peripherals and other electronic devices. The power transferred may be sufficient to directly power or recharge batteries inside the peripherals.

Power may be transferred from the source or sources to the device or devices over a distance allowing the peripherals to be charged or powered while in their natural position in front of a computer or monitor.

In some systems, the distance, distribution, number of peripherals that can be powered or charged may be enhanced by the use of passive, intermediate, magnetic resonator repeaters.

In some systems, the power transfer system may use wireless communication channels to transfer status and tuning information between the source, peripherals, other devices, computer, and the like, to exchange status information, control the power transfer, or optimize the power transfer. In some systems, the power transfer system may use the oscillating magnetic field mediating the power transfer to transfer or sense status and tuning information between the source, peripherals, other devices, computer, and the like to exchange status information, control the power transfer, or optimize the power transfer.

In this section describing an application of wireless power transfer we may refer to computer peripherals and give examples of peripherals such as computer mice or keyboards. It is to be understood that computer peripherals may refer to a wide range of electric and electronic devices and is not limited to those listed. In the scope of this disclosure any portable electronic device, such as a cell phone, keyboard, camera, mobile handset, and the like, and any usual workspace electronic devices such as printers, clocks, lamps, headphones, external drives, projectors, additional displays, and the like, may be considered a computer peripheral and is applicable to the methods and designs described.

In this section describing an application of wireless power transfer we may refer to a source coupled to or integrated into a computer. It is to be understood that a computer is used as a generic term encompassing many various display and computing electronic devices including computer monitors, all-in-one computers, laptops, desktops, notebook computers, televisions, and the like.

A diagram illustrating features of one example system is shown in FIG. 147. FIG. 147 depicts a computer 14714 with a source 14711 coupled to a power source (not shown) which transfers energy wirelessly and over a distance to magnetic resonators 14716, 14717 integrated into two peripherals 14712, 14713. The source may be coupled to a power source via a connection internal to the computer or a connection external to the computer such as a USB port, or a power plug, for example. The source may be coupled directly to a power source and it may share power with a variety of other components in the system. The power source may be turned up and down or on and off in response to commands, algorithms, programs, operational parameters, and the like, running in the computer. The power supplied by the power source may be adjusted in response to the power requirements of the peripherals and/or in response to user settable operational modes such as power saving modes, hibernation modes, stand-by modes, screen-saver modes, enhanced performance modes, and the like.

Preferably, the source comprises at least one high-Q magnetic resonator that is coupled to power and control circuitry 2302 which may be integrated into the source 14711 or integrated into the computer 14714. The magnetic resonators of the source may be planar magnetic resonators comprising a conductor or conductors wrapped around a core or cores of magnetic material. Alternatively, the magnetic resonators of the source may be capacitively-loaded magnetic resonator loops or any combination of magnetic resonator structures described herein.

Although FIG. 147 depicts the source 14711 attached to the computer 14714 at the bottom location of the computer screen, it should be clear to those skilled in the art that many alternative locations and positions may also be satisfactory. For example, the source may be attached to the base of the computer 14715, the side, the back, and the like depending on the exact materials and configuration comprising the computer. In notebook computers for example, a source may be located in the lip or lid of the notebook computer.

Preferably, the computer peripherals that require power may be coupled or are integrated with at least one magnetic resonator and may be coupled to power and control circuitry 2304 that may control the power transfer between the source and the peripheral as well as any power or voltage regulation that the computer peripheral circuitry or batteries may require. The magnetic resonator of the peripheral may be a planar magnetic resonator or resonators which comprise a conductor or conductors wrapped around a core or cores of magnetic material. Alternatively, the magnetic resonators may be a capacitively loaded conductor formed in a loop or loops. The magnetic resonators of the computer peripherals may be high-Q magnetic resonators and may have a quality factor of at least 100.

In the system, the source generates an oscillating magnetic field. The oscillating magnetic field causes current flow in the conductors of the magnetic resonators of the computer peripherals thereby transferring energy to the peripherals.

In some systems, the source magnetic resonators and the device magnetic resonators of the computer peripherals may include shielding. The shielding may be placed in between the magnetic resonator and any lossy components or materials near the resonator. For example, a source magnetic resonator 14711 attached to the bottom of a computer 14714 may have a layer or a sheet of a good conductor like copper placed between it and the casing of the computer. In some systems, the shielding may include a layer of magnetic material between the resonator and the conductor sheet or layer to improve the power transfer efficiency and/or to shape the fields used in the wireless power transfer system as described herein.

In an experimental system, the source 14711, comprising one magnetic resonator is attached to the bottom of the computer as shown in FIG. 147. In this system, the computer is an "iMac" computer, also referred to as an "all-in-one desktop" computer. A more detailed, exploded view of the source assembly is shown in FIG. 152. In the experimental system, a planar magnetic resonator 15203 is attached to the bottom of the computer 14714 with a cover 15201 that is made from ABS plastic. Low-loss tangent materials are typically chosen for the source and device resonator housings. The source magnetic resonator 15203 is a planar resonator comprising a 160 mm×20 mm×3 mm core of magnetic material with a single piece of litz wire conductor wrapped around the core such that it forms 30 loops that are coaxial with the largest dimension of the core. The resonator has a quality factor, Q, of approximately 500 and a perturbed quality factor, $Q_{(integrated)}$ of 135, when mounted to the bottom of the computer as shown in FIG. 147. The magnetic resonator is positioned such that its dipole moment is parallel with the bottom edge of the computer. A thin sheet of a good conductor 15202, in this case copper, is placed between the magnetic resonator and the computer casing to reduce losses due to the material of the casing of the computer and/or losses due to the materials inside the computer. The source power and control circuitry (not shown) is integrated inside the computer housing and directly coupled to the ends of the litz wire conductor of the source resonator that are routed through the case of the computer to the power and control circuitry. The source power and control circuitry comprises the components described earlier as shown, for example, in FIG. 40 and includes the impedance matching network between the source resonator and the power amplifier. The impedance matching network uses the network shown in FIG. 30h, where an inductor $L_2$ is in series with the resonator. The source power and control circuitry is connected to an internal 5V power source in the computer.

In the experimental system two peripherals, a computer keyboard and a computer mouse, are each integrated with a device magnetic resonator. In this demonstration system, the keyboard is an "Apple Wireless Keyboard". The wireless keyboard is fully functional even as it is wirelessly powered, as described herein.

A more detailed, exploded view of the experimental computer keyboard with the wireless power transfer system is shown in FIG. 151. In the example system the computer keyboard 14713 is integrated with planar magnetic resonator 15102 and optionally a rechargeable battery 15105. The energy transferred to the device resonator may be used to recharge the battery allowing the keyboard to operate even when removed from the charging zone or active area of the system.

In the computer keyboard a planar magnetic resonator 15102 comprising a 90 mm×10 mm×6 mm core of magnetic material 15103 with a single piece of litz wire conductor 15104 wrapped around the core such that it forms 35 loops coaxial with the largest dimension of the core is used. The device resonator has a Q of approximately 500, and a perturbed Q, $Q_{(integrated)}$ of approximately 113, when integrated in the keyboard as shown in FIG. 151.

The magnetic resonator is integrated into the keyboard in the at least partially vacated battery compartment situated along the front edge of the keyboard and oriented such that the dipole moment of the resonator is parallel to the longest dimension of the keyboard. In some computer keyboards, the main body or housing of the keyboard may include metallic materials or sections that may block the magnetic field of the source. In such at least partially metallic keyboards, the device resonator may be situated in a portion of keyboard that does not include metallic materials, or may be situated in a position where the keyboard housing may be altered to remove the metallic section. The removed metallic materials or sections may be replaced with a cover or housing made from low loss materials such as have been described herein. In the example system, the resonator 15102 is integrated into the housing of the keyboard behind a cover 15101 made from ABS plastic, and designed to maintain the original size and form of the "Apple Wireless Keyboard". This section of the keyboard may have originally housed the battery compartment for the wireless keyboard. In computer keyboards where the housing or body comprises a non-lossy material, the device resonator may not require a cover or window of a different material. Optionally, a thin sheet of copper shielding (not shown) may be placed between the magnetic resonator and the lossy materials of the keyboard.

The device power and control circuitry may also be integrated within the keyboard next to, along the side, at the end of the device resonator and optional rechargeable battery. Alternatively, the device power and control circuitry may be mounted on the bottom of the keyboard or behind the keyboard and directly coupled to the two ends of the conductor of the device resonator integrated into the keyboard. One of ordinary skill in the art will recognize that the placement of the resonator or resonators, power and control circuitry, and optional battery or batteries, may be determined by industrial or artistic design considerations, as well as by performance specifications.

A more detailed exploded view diagram of the experimental computer mouse is shown in FIG. 153. In the experimental system, the computer mouse 15303, 15301 (14712 shown in FIG. 150) includes a planar magnetic resonator 15302 comprising a 50 mm×35 mm×3 mm core of magnetic material wrapped with a single piece of litz wire conductor to form 35 loops that are coaxial with the largest dimension of the core. The magnetic resonator is integrated into the inside of the mouse and oriented such that the dipole moment of the resonator is parallel to the longest dimension of the mouse and has a quality factor of approximately 500, and a perturbed quality factor of approximately 411 when integrated in the mouse. The resonator is mounted above the circuitry and electronics (not shown) of the mouse and the device power and control circuitry (not shown).

In the experimental system, the source is able to transfer energy to both of the computer peripherals to power or to charge the batteries of the device peripherals even when the peripherals are placed approximately 20 cm away from the source. The effective active area of the experimental system in front of the computer may be approximately represented by the area 14931 outlined in FIG. 149. The shape and extent of the active area 14931, is determined by the shape, size, orientation, and structure, of the source and device resonators, by the power available to the source and by the power required by each peripheral device. In this experimental system, the source and device resonator active areas may be approximated by single-axis dipole patterns, and may contain so-called "dead spots" where power transfer efficiency is reduced in a sub-region of the effective active area. Such dead spots may be minimized or eliminated using other resonator designs discussed herein, and by using source and/or device power adjustment algorithms and techniques described herein. Note that the effective active area in this experimental system extends behind the computer as well, but may be impacted by the stand used to hold the "all-in-one" computer and display.

As those skilled in the art will appreciate, the parameters of the resonators may be changed or optimized based on design criteria such as size and power requirements and the exemplary values given for the system should not be viewed as limiting. For example, in each instance a single planar resonator was described multiple resonators may be used and oriented at orthogonal angles, or a single planar resonator with multiple conductors at orthogonal angles may be used to improve the omni-directionality and uniformity of the active area of the system.

In the experimental system the computer peripherals may include one or more rechargeable batteries that may be used to power the peripheral. These batteries may allow the devices to operate even when they are moved outside of the active area. Whenever the peripherals are placed inside the active area, the batteries may be recharged. As a consequence of the large active area in front of the computer the peripherals may be recharged while in their normal operating positions in front of the computer and may require only a small and lightweight rechargeable battery for the times when the devices are occasionally removed from the active area. The use of rechargeable batteries in these computer peripheral applications may greatly reduce the demand for disposable batteries. Such reduced demand for disposable batteries may have a positive environmental, economic, and/or health impact.

For some computer peripherals the device resonator, shielding, power and control circuitry, and possibly a small rechargeable battery may be combined into a module that fits into the battery compartment, replacing normal batteries, of a traditional battery power peripheral. Some devices can be retrofitted with this wireless power transfer technology by inserting the module into the existing battery compartment to enable wireless power transfer.

In some power transfer systems the source may be configured to turn on during specific times or during predetermined operating conditions. For example, the source may be configured to turn on or be active when the computer or peripherals are not in use. In some systems the source may be configured to turn on at specific times of the day when the user is known to be less active such as at night. In other systems the source may be configurable by the user to turn on or off at specific times or on demand.

In some systems, the source, or the source and device resonators may require active tuning to maximize, optimize, or control the power transfer. The active tuning of the power transfer may involve communication between the peripherals and the source or the peripherals and the computer to which the source is attached. Likewise tuning and control communication may also be between peripherals. The communication may be channeled through the communication channels of the peripherals. For example, many peripherals contain communication capability such as Bluetooth, Wifi, and the like. Alternatively, the power transfer system may have its own separate communication subsystem utilizing any number of wireless data transfer methods and technologies.

In some systems, the communication can be used to allow user control and monitoring of the power transfer system. Communication between the peripheral devices and the computer and, the computer and the source may be used by the computer to display and control the power transfer. A user interface on the computer may be created to allow a user to turn the power transfer on or off, or to monitor the charging of the peripherals, or adjust any of the operating parameters of the system. In some systems, the oscillating magnetic field used for power transfer may be used to transfer or sense status and tuning information between the source, peripherals, other devices, computer, and the like to exchange status information, control the power transfer, optimize the power transfer, or adjust the power transfer in any way.

In some systems the source may be permanently integrated into the computer and the control and power circuitry may be integrated with the circuitry of the computer. In other systems the source may be movable to customize the active area or the charging zone of the system. For example, for a right handed person an active area or charging zone that is more to the right of the computer may be more desirable since that is the typical location of the computer mouse while a left handed person may require that the active area or charging zone be to the left of the computer. The source may be mounted such that it can swivel, slide, extend, retract, or move in any direction of orientation, to allow modification of the active area. In other systems, the source may be a completely separate unit from the computer and may be powered from an external source or a port, such as a USB port, on the computer and may be attached to a computer or monitor using any number of various fasteners, adhesives, magnets, and the like. In other systems, the source may be a completely separate unit from the computer and may be powered from a battery pack, a solar cell, a fuel cell, a wall plug, a power supply, or any type of power source.

In some embodiments of the system, passive repeater resonators may be used to extend and enhance the active area or the charging area of the system, or used to eliminate regions of weaker charging. A passive resonator, which is a resonator that is not connected to a power source, may be placed near the source to capture and transfer the energy. The passive repeater may comprise any number of resonators of various configurations such as planar resonators or capactively loaded loops and may be tuned to the frequency of the source. The passive repeater may be a separate module or may be integrated into another computer peripheral. FIG. 148 shows an exemplary system with an exemplary passive repeater 14821. The repeater may be moved freely to optimize the active area. For example, to extend the active area of the computer mouse 14712, the passive repeater 14821 may be placed substantially between the source 14711 and the mouse 14712. Alternatively, a passive repeater may be placed on the bottom edge of a computer 14822 to extend or modify the active charging area.

In some embodiments a repeater or intermediate resonator may be integrated into a computer peripheral. For example, the computer keyboard may have an additional repeater resonator oriented to extend the active area of the source to the side of the keyboard to power or charge a mouse that is typically placed on the side of the keyboard for example.

In some embodiments a device resonator in a peripheral may simultaneously receive and deliver power to a device, and serve as a passive repeater for other resonators in the system. In some embodiments, resonators may be operating simultaneously as device and repeater resonators, or they may be switched from one function to the other, periodically, or in response to some control algorithm.

In some embodiments a passive repeater resonator may be used to transfer energy around a material or object that would otherwise block energy transfer. For example, FIG. 150 shows an arrangement that allows energy to be transferred around a blocking material by using a passive repeater. In some embodiments an active source resonator 15041, which is a resonator coupled to an energy source, may be required to be completely integrated into a computer or behind the computer. The circuit boards and housing of the computer may contain lossy material or metallic materials that may attenuate, block, or redirect the magnetic field, reducing the efficiency of the power transfer to the resonators of the peripherals. An additional passive repeater resonator 15042 may be placed below the active resonator 15041, for example, to transfer energy around the blocking material to the resonators in the computer peripherals 14717, 14716. When the passive resonator is placed in the base 14715 power is transferred through the resonator in the base without requiring a separate power connection to the base.

While the invention has been described in connection with certain preferred embodiments, other embodiments will be understood by one of ordinary skill in the art and are intended to fall within the scope of this disclosure, which is to be interpreted in the broadest sense allowable by law. For example, designs, methods, configurations of components, etc. related to transmitting wireless power have been described above along with various specific applications and examples thereof. Those skilled in the art will appreciate where the designs, components, configurations or components described herein can be used in combination, or interchangeably, and that the above description does not limit such interchangeability or combination of components to only that which is described herein.

All documents referenced herein are hereby incorporated by reference.

What is claimed is:

1. A wireless receiver for use with a first electromagnetic resonator coupled to a power supply, the first electromagnetic resonator having a mode with a resonant frequency $\omega_1$, an intrinsic loss rate $\Gamma_1$, and a first Q-factor $Q_1=\omega_1/2\Gamma_1$, -the wireless receiver comprising:
   a load configured to power a system using electrical power;
   a second electromagnetic resonator configured to be coupled to the load, the second electromagnetic resonator having a mode with a resonant frequency $\omega_2$, an intrinsic loss rate $\Gamma_2$, and a second Q-factor $Q_2=\omega_2/2\Gamma_2$;
   wherein the second electromagnetic resonator is configured to be wirelessly coupled to the first electromagnetic resonator to provide resonant, non-radiative wireless power to the second electromagnetic resonator from the first electromagnetic resonator; and
   a communication facility to confirm compatibility of the first and second electromagnetic resonators and provide authorization for initiation of transfer of power;
   wherein the communication facility is configured to establish an out-of-band communication channel for information exchange; and
   wherein the communication facility is configured to use an in-band communication channel to verify a wireless coupling between the first electromagnetic resonator and the second electromagnetic resonator based on the information exchanged via the out-of-band communication channel.

2. The wireless receiver of claim 1, wherein the communication facility is configured to use a secure communication channel as the out-of-band communication channel, the information exchanged via the secure out-of-band communication channel comprises a verification code, and the verification code is signaled in response through the in-band communication channel.

3. The wireless receiver of claim 2, wherein the communication facility is configured to use public key infrastructure for the secure communication channel.

4. The wireless receiver of claim 2, wherein the communication facility is configured to transmit the verification code in the out-of-band communication channel and receive in return a cryptographically modified version of the verification code signaled through the in-band communication channel from the first electromagnetic resonator to the second electromagnetic resonator to authenticate a source of power transfer.

5. The wireless receiver of claim 1, wherein the information comprises information to adjust one or more parameters of power transfer over the in-band communication channel, and verification of the wireless coupling comprises monitoring changes to the power transfer and comparing the monitored changes to expected changes based on the one or more parameters.

6. The wireless receiver of claim 1, wherein the wireless receiver is configured to verify that the first electromagnetic resonator and the second electromagnetic resonator of the wireless coupling for transfer of power are a same two resonators exchanging information on the out-of-band communication channel.

7. The wireless receiver of claim 1, wherein the load is configured to power a drive system of a vehicle that is driven at least in part by electrical power.

8. The wireless receiver of claim 1, wherein the load is configured to power a medical device.

9. A power source for wirelessly providing power to a wireless receiver, the power source comprising:
 a power supply, the power supply configured to supply power at a rate sufficient to charge a battery associated with the wireless receiver;
 a first electromagnetic resonator coupled to the power supply and having a mode with a resonant frequency $\omega_1$, an intrinsic loss rate $\Gamma_1$, and a first Q-factor $Q_1=\omega_1/2\Gamma_1$;
 wherein the first electromagnetic resonator is configured to be wirelessly coupled to a second electromagnetic resonator of the wireless receiver to provide non-radiative wireless power to the second electromagnetic resonator, the second electromagnetic resonator having a mode with a resonant frequency $\omega_2$, an intrinsic loss rate $\Gamma_2$, and a second Q-factor $Q_2=\omega_2/2\Gamma_2$; and
 a communication facility to confirm compatibility of the first and second electromagnetic resonators and provide authorization for initiation of transfer of power;
 wherein the communication facility is configured to establish an out-of-band communication channel for information exchange; and
 wherein the communication facility is configured to use an in-band communication channel to verify a wireless coupling between the first electromagnetic resonator and the second electromagnetic resonator based on the information exchanged via the out-of-band communication channel.

10. The power source of claim 9, wherein the communication facility is configured to use a secure communication channel as the out-of-band communication channel, the information exchanged via the secure out-of-band communication channel comprises a verification code, and the verification code is signaled in response through the in-band communication channel.

11. The power source of claim 10, wherein the communication facility is configured to use public key infrastructure for the secure communication channel.

12. The power source of claim 10, wherein the communication facility is configured to transmit the verification code in the out-of-band communication channel and receive in return a cryptographically modified version of the verification code signaled through the in-band communication channel from the second electromagnetic resonator to the first electromagnetic resonator to authenticate a destination of power transfer.

13. The power source of claim 9, wherein the information comprises information to adjust one or more parameters of power transfer over the in-band communication channel, and verification of the wireless coupling comprises monitoring changes to the power transfer and comparing the monitored changes to expected changes based on the one or more parameters.

14. The power source of claim 9, wherein the power source is configured to verify that the first electromagnetic resonator and the second electromagnetic resonator of the wireless coupling for transfer of power are a same two resonators exchanging information on the out-of-band communication channel.

15. A wireless power system, comprising:
 a power supply, the power supply configured to supply power at a rate sufficient to charge a battery of the system;
 a first electromagnetic resonator coupled to the power supply and having a mode with a resonant frequency $\omega_1$, an intrinsic loss rate $\Gamma_1$, and a first Q-factor $Q_1=\omega_1/2\Gamma_1$;
 a load configured to power the system;
 a second electromagnetic resonator configured to be coupled to the load, the second electromagnetic resonator having a mode with a resonant frequency $\omega_2$, an intrinsic loss rate $\Gamma_2$, and a second Q-factor $Q_2=\omega_2/2\Gamma_2$;
 wherein the second electromagnetic resonator is configured to be wirelessly coupled to the first electromagnetic resonator to provide resonant, non-radiative wireless power to the second electromagnetic resonator from the first electromagnetic resonator; and
 a communication facility to confirm compatibility of the first and second electromagnetic resonators and provide authorization for initiation of transfer of power;
 wherein the communication facility is configured to establish an out-of-band communication channel for information exchange; and
 wherein the communication facility is configured to use an in-band communication channel to verify a wireless coupling between the first electromagnetic resonator and the second electromagnetic resonator based on the information exchanged via the out-of-band communication channel.

16. The wireless power system of claim 15, wherein the communication facility is configured to use a secure communication channel as the out-of-band communication channel, the information exchanged via the secure out-of-band communication channel comprises a verification code, and the verification code is signaled in response through the in-band communication channel.

17. The wireless power system of claim 16, wherein the communication facility is configured to use public key infrastructure for the secure communication channel.

18. The wireless power system of claim 16, wherein the communication facility is configured to transmit the verification code in the out-of-band communication channel and receive in return a cryptographically modified version of the verification code signaled through the in-band communication channel from the first electromagnetic resonator or the second electromagnetic resonator to authenticate a source or a destination of power transfer.

19. The wireless power system of claim 15, wherein the information comprises information to adjust one or more parameters of power transfer over the in-band communication channel, and verification of the wireless coupling comprises monitoring changes to the power transfer and comparing the monitored changes to expected changes based on the one or more parameters.

20. The wireless power system of claim 15, wherein the wireless power system is configured to verify that the first electromagnetic resonator and the second electromagnetic resonator of the wireless coupling for transfer of power are a same two resonators exchanging information on the out-of-band communication channel.

21. The wireless power system of claim 15, wherein the load is configured to power a drive system of a vehicle that is driven at least in part by electrical power.

22. The wireless power system of claim 15, wherein the load is configured to power a medical device.

* * * * *

UNITED STATES PATENT AND TRADEMARK OFFICE
CERTIFICATE OF CORRECTION

PATENT NO.        : 9,698,607 B2                                          Page 1 of 1
APPLICATION NO.   : 14/546055
DATED             : July 4, 2017
INVENTOR(S)       : Morris P. Kesler et al.

It is certified that error appears in the above-identified patent and that said Letters Patent is hereby corrected as shown below:

Column 1
Line 13, delete "Oct. 20, 2010." and insert -- Aug. 20, 2010. --

Column 234
Line 38, in Claim 1, delete "-the" and insert -- the --

Column 235
Line 48, in Claim 9, delete "$Q_2 = {}_2/2\Gamma_2$" and insert -- $Q_2 = \omega_2/2\Gamma_2$ --

Signed and Sealed this
Twenty-ninth Day of August, 2017

Joseph Matal
*Performing the Functions and Duties of the*
*Under Secretary of Commerce for Intellectual Property and*
*Director of the United States Patent and Trademark Office*